US010184699B2

(12) United States Patent
Shedd et al.

(10) Patent No.: US 10,184,699 B2
(45) Date of Patent: Jan. 22, 2019

(54) FLUID DISTRIBUTION UNIT FOR TWO-PHASE COOLING SYSTEM

(71) Applicant: EBULLIENT, LLC, Madison, WI (US)

(72) Inventors: Timothy A. Shedd, Middleton, WI (US); Mark S. Meives, Waukesha, WI (US)

(73) Assignee: EBULLIENT, INC., Madison, WI (US)

( * ) Notice: Subject to any disclaimer, the term of this patent is extended or adjusted under 35 U.S.C. 154(b) by 320 days.

(21) Appl. No.: 14/846,758

(22) Filed: Sep. 5, 2015

(65) Prior Publication Data

US 2016/0120058 A1 Apr. 28, 2016

Related U.S. Application Data

(63) Continuation-in-part of application No. 14/604,727, filed on Jan. 25, 2015, now Pat. No. 9,848,509, and a
(Continued)

(51) Int. Cl.
*F25D 23/12* (2006.01)
*F25B 23/00* (2006.01)
(Continued)

(52) U.S. Cl.
CPC .......... *F25B 23/006* (2013.01); *F25B 41/003* (2013.01); *F28D 15/00* (2013.01);
(Continued)

(58) Field of Classification Search
CPC ............ H05K 7/20327; H05K 7/20345; F25B 23/006; F25B 41/003; F28D 15/00;
(Continued)

(56) References Cited

U.S. PATENT DOCUMENTS 3,406,244 A 10/1968 Sevgin
4,352,392 A 10/1982 Eastman
(Continued)

FOREIGN PATENT DOCUMENTS

EP 1519646 A2 3/2005
EP 1143778 B1 12/2006
(Continued)

OTHER PUBLICATIONS

HFC-245fa Product Stewardship Summary (Honeywell); Dec. 2007; retrieved from the Internet on Jan. 25, 2016; URL:<https://www51.honeywell.com/sm/common/documents/Public-Ris-Summary-HFC-245f.pdf>.
(Continued)

*Primary Examiner* — Joseph Trpisovsky
(74) *Attorney, Agent, or Firm* — Nicholas J. Boyarski

(57) ABSTRACT

A fluid distribution unit for a two-phase cooling system can include a reservoir configured to receive a two-phase flow of dielectric coolant. A first pump can be fluidly connected to a supply line extending from the reservoir. A heat rejection loop can be fluidly connected to the reservoir. The heat rejection loop can include a heat exchanger and a second pump. The second pump can be configured to circulate a flow of single-phase liquid coolant from the reservoir, through the heat exchanger, and back to the reservoir.

20 Claims, 101 Drawing Sheets

Related U.S. Application Data continuation-in-part of application No. 14/612,276, filed on Feb. 2, 2015, and a continuation-in-part of application No. 14/623,524, filed on Feb. 17, 2015, and a continuation-in-part of application No. 14/644,211, filed on Mar. 11, 2015, now Pat. No. 9,832,913, and a continuation-in-part of application No. 14/663,465, filed on Mar. 20, 2015, and a continuation-in-part of application No. 14/677,833, filed on Apr. 2, 2015, and a continuation-in-part of application No. 14/679,026, filed on Apr. 6, 2015, now Pat. No. 9,854,715, and a continuation-in-part of application No. 14/705,972, filed on May 7, 2015, and a continuation-in-part of application No. 14/721,532, filed on May 26, 2015, and a continuation-in-part of application No. 14/723,388, filed on May 27, 2015, now Pat. No. 9,854,714, and a continuation-in-part of application No. 14/826,822, filed on Aug. 14, 2015.

(60) Provisional application No. 62/072,421, filed on Oct. 29, 2014, provisional application No. 62/099,200, filed on Jan. 1, 2015, provisional application No. 62/069,301, filed on Oct. 27, 2014.

(51) Int. Cl.
*F28F 3/12* (2006.01)
*F25B 41/00* (2006.01)
*F28F 9/26* (2006.01)
*F28F 13/02* (2006.01)
*F28D 15/00* (2006.01)
*H05K 7/20* (2006.01)

(52) U.S. Cl.
CPC ............... *F28F 3/12* (2013.01); *F28F 9/26* (2013.01); *F28F 13/02* (2013.01); *H05K 7/20327* (2013.01)

(58) Field of Classification Search
CPC ..... F28F 9/26; F28F 13/02; F28F 3/12; H01L 23/46; H01L 23/473
USPC ............................................. 62/259.2, 62, 64
See application file for complete search history.

(56) References Cited

U.S. PATENT DOCUMENTS

| | | |
|---|---|---|
| 4,493,010 A | 1/1985 | Morrison et al. |
| 5,103,897 A | 4/1992 | Cullimore et al. |
| 5,383,340 A | 1/1995 | Larson et al. |
| 5,412,536 A | 5/1995 | Anderson et al. |
| 5,421,536 A | 6/1995 | Hertel et al. |
| 5,587,880 A | 12/1996 | Phillips et al. |
| 5,634,351 A | 6/1997 | Larson et al. |
| 5,704,416 A | 1/1998 | Larson et al. |
| 5,761,045 A | 6/1998 | Olson et al. |
| 5,924,482 A | 7/1999 | Edwards et al. |
| 5,940,270 A | 8/1999 | Puckett |
| 6,111,749 A | 8/2000 | Lamb et al. |
| 6,115,251 A | 9/2000 | Patel et al. |
| 6,222,264 B1 | 4/2001 | Liao et al. |
| 6,230,791 B1 | 5/2001 | Dine et al. |
| 6,349,554 B2 | 2/2002 | Patel et al. |
| 6,498,725 B2 | 12/2002 | Cole et al. |
| 6,519,955 B2 | 2/2003 | Marsala |
| 6,580,609 B2 | 6/2003 | Pautsch |
| 6,580,610 B2 | 6/2003 | Morris et al. |
| 6,594,149 B2 | 7/2003 | Yamada et al. |
| 6,598,911 B2 | 7/2003 | Mejean et al. |
| 6,646,879 B2 | 11/2003 | Pautsch |
| 6,662,858 B2 | 12/2003 | Wang |
| 6,679,081 B2 | 1/2004 | Marsala |
| 6,687,124 B2 | 2/2004 | Ostby |
| 6,845,625 B1 | 1/2005 | Pokharna |
| 6,866,092 B1 | 3/2005 | Molivadas |
| 6,877,327 B2 | 4/2005 | Newman et al. |
| 6,948,556 B1 | 9/2005 | Anderson et al. |
| 6,958,911 B2 | 10/2005 | Cader et al. |
| 6,981,542 B2 | 1/2006 | Lopatinsky et al. |
| 6,990,816 B1 | 1/2006 | Zuo et al. |
| 7,042,726 B2 | 5/2006 | Cader et al. |
| 7,174,738 B2 | 2/2007 | Scott |
| 7,187,549 B2 | 3/2007 | Teneketges et al. |
| 7,283,360 B2 | 10/2007 | Chang et al. |
| 7,325,588 B2 | 2/2008 | Malone et al. |
| 7,380,409 B2* | 6/2008 | Campbell ......... H05K 7/20772 165/104.33 |
| 7,450,385 B1 | 11/2008 | Campbell et al. |
| 7,484,552 B2 | 2/2009 | Pfahnl |
| 7,522,417 B2 | 4/2009 | Pautsch et al. |
| 7,791,885 B2 | 9/2010 | Agostini et al. |
| 7,916,481 B2 | 3/2011 | Thome et al. |
| 8,000,103 B2 | 8/2011 | Lipp et al. |
| 8,141,620 B1 | 3/2012 | Zrodnikov et al. |
| 8,184,436 B2 | 5/2012 | Campbell et al. |
| 8,188,595 B2 | 5/2012 | Shuja |
| 8,240,362 B2 | 8/2012 | Eriksen |
| 8,245,764 B2 | 8/2012 | Eriksen |
| 8,274,787 B2 | 9/2012 | Alyaser et al. |
| 8,322,154 B2 | 12/2012 | Campbell et al. |
| 8,490,419 B2 | 7/2013 | Zrodnikov et al. |
| 8,550,372 B2 | 10/2013 | Shedd et al. |
| 8,646,286 B2 | 2/2014 | Scherer et al. |
| 8,724,315 B2 | 5/2014 | Branton |
| 8,746,330 B2 | 6/2014 | Lyon |
| 8,749,968 B1 | 6/2014 | Branton |
| 8,806,749 B2 | 8/2014 | Campbell et al. |
| 8,851,154 B2 | 10/2014 | Cheng et al. |
| 8,867,209 B2 | 10/2014 | Campbell et al. |
| 9,032,748 B2 | 5/2015 | Lau et al. |
| 2002/0021742 A1 | 2/2002 | Maskell et al. |
| 2002/0080584 A1 | 6/2002 | Prasher et al. |
| 2002/0135979 A1 | 9/2002 | Estes et al. |
| 2002/0152761 A1 | 10/2002 | Patel et al. |
| 2003/0037919 A1 | 2/2003 | Okada et al. |
| 2003/0037979 A1 | 2/2003 | Schwalbe |
| 2003/0205364 A1 | 11/2003 | Sauciuc et al. |
| 2004/0036161 A1 | 2/2004 | Williams et al. |
| 2004/0221604 A1 | 11/2004 | Ota et al. |
| 2005/0039889 A1 | 2/2005 | Huang |
| 2005/0068724 A1 | 3/2005 | Pokharna et al. |
| 2005/0072177 A1 | 4/2005 | Hale et al. |
| 2005/0128705 A1 | 6/2005 | Chu et al. |
| 2005/0185378 A1 | 8/2005 | Tilton et al. |
| 2005/0199372 A1 | 9/2005 | Frazer et al. |
| 2005/0219820 A1 | 10/2005 | Belady et al. |
| 2005/0279128 A1* | 12/2005 | Otake ............... F25B 1/10 62/512 |
| 2005/0284615 A1 | 12/2005 | Parish et al. |
| 2006/0002080 A1 | 1/2006 | Leija et al. |
| 2006/0026983 A1 | 2/2006 | Tilton et al. |
| 2006/0113066 A1 | 6/2006 | Mongia et al. |
| 2006/0117782 A1 | 6/2006 | Rini et al. |
| 2006/0187638 A1 | 8/2006 | Vinson et al. |
| 2006/0196627 A1 | 9/2006 | Shedd et al. |
| 2006/0250773 A1 | 11/2006 | Campbell et al. |
| 2006/0258209 A1 | 11/2006 | Hall |
| 2006/0289987 A1 | 12/2006 | Chiu |
| 2007/0070604 A1 | 3/2007 | Tomioka et al. |
| 2007/0119568 A1 | 5/2007 | Weber et al. |
| 2007/0230126 A1 | 10/2007 | Pautsch et al. |
| 2007/0256810 A1 | 11/2007 | Stefano et al. |
| 2007/0289317 A1 | 12/2007 | Minor et al. |
| 2007/0295480 A1 | 12/2007 | Campbell et al. |
| 2008/0041574 A1 | 2/2008 | Arik et al. |
| 2008/0093054 A1 | 4/2008 | Tilton et al. |
| 2008/0141691 A1 | 6/2008 | Hirota |
| 2008/0158818 A1 | 7/2008 | Clidaras et al. |
| 2008/0170368 A1 | 7/2008 | Chen et al. |
| 2008/0186670 A1 | 8/2008 | Lyon et al. |
| 2008/0295535 A1 | 12/2008 | Robinet et al. |

(56) References Cited

U.S. PATENT DOCUMENTS

| | | |
|---|---|---|
| 2009/0020266 A1 | 1/2009 | Weber et al. |
| 2009/0032937 A1 | 2/2009 | Mann et al. |
| 2009/0034184 A1 | 2/2009 | Atallah |
| 2009/0113905 A1 | 5/2009 | Ericsson |
| 2009/0272144 A1 | 11/2009 | Lin |
| 2010/0012294 A1 | 1/2010 | Bezama et al. |
| 2010/0101765 A1 | 4/2010 | Campbell et al. |
| 2010/0252238 A1 | 10/2010 | Batty et al. |
| 2010/0254758 A1 | 10/2010 | Campbell et al. |
| 2010/0326628 A1 | 12/2010 | Campbell et al. |
| 2011/0085301 A1 | 4/2011 | Dunn |
| 2011/0277491 A1 | 11/2011 | Wu et al. |
| 2011/0290448 A1 | 12/2011 | Campbell et al. |
| 2011/0313576 A1 | 12/2011 | Nicewonger |
| 2012/0020022 A1 | 1/2012 | Peterson et al. |
| 2012/0026745 A1 | 2/2012 | Cheng et al. |
| 2012/0032436 A1 | 2/2012 | Zantout et al. |
| 2012/0175094 A1 | 7/2012 | Rice |
| 2012/0227429 A1 | 9/2012 | Louvar et al. |
| 2012/0267077 A1 | 10/2012 | Dede |
| 2012/0324911 A1* | 12/2012 | Shedd ............... F25B 25/00 62/62 |
| 2012/0324933 A1 | 12/2012 | Louvar et al. |
| 2012/0325436 A1 | 12/2012 | Shedd |
| 2013/0008628 A1 | 1/2013 | Tiengtum et al. |
| 2013/0027884 A1 | 1/2013 | Campbell et al. |
| 2013/0077247 A1 | 3/2013 | Campbell et al. |
| 2013/0138253 A1 | 5/2013 | Chainer et al. |
| 2013/0139998 A1 | 6/2013 | Hayashi et al. |
| 2013/0308271 A1 | 11/2013 | Pal |
| 2013/0340995 A1 | 12/2013 | David et al. |
| 2014/0076523 A1 | 3/2014 | Pritzker et al. |
| 2014/0124163 A1 | 5/2014 | Campbell et al. |
| 2014/0137582 A1 | 5/2014 | Louvar et al. |
| 2014/0144608 A1 | 5/2014 | Zeng et al. |
| 2014/0190665 A1 | 7/2014 | Joshi et al. |
| 2014/0307389 A1 | 10/2014 | Arvelo et al. |
| 2015/0013366 A1 | 1/2015 | Cowans |
| 2015/0059388 A1 | 3/2015 | Hirano et al. |
| 2015/0135746 A1 | 5/2015 | Louvar |
| 2015/0230366 A1 | 8/2015 | Shedd et al. |
| 2016/0120058 A1 | 4/2016 | Shedd et al. |

FOREIGN PATENT DOCUMENTS

| | | |
|---|---|---|
| EP | 1298975 B1 | 7/2009 |
| GB | 977090 | 12/1964 |
| GB | 980413 | 1/1965 |
| WO | 3839955 A | 9/1998 |
| WO | 2005099888 A1 | 10/2005 |

OTHER PUBLICATIONS

Honeywell Refrigerants: Genetron 245fa; Dec. 22, 2013; retrieved from the Internet on Jan. 25, 2016; URL <https://web.archive.org/web/20131222085005/http:www.honeywell-refrigerants.com/americas/product/genetron-245fa>.

International Search Report and Written Opinion in PCT/US15/55379 dated Jan. 6, 2016.

International Search Report and Written Opinion in PCT/US15/55616 dated Feb. 5, 2016.

International Search Report and Written Opinion in PCT/US15/55841 dated Feb. 12, 2016.

International Search Report and Written Opinion in PCT/US15/56025 dated Feb. 4, 2016.

International Search Report and Written Opinion in PCT/US15/56129 dated Jan. 12, 2016.

International Search Report and Written Opinion in PCT/US15/56280 dated Jan. 19, 2016.

International Search Report and Written Opinion in PCT/US15/57252 dated Jan. 14, 2016.

International Search Report and Written Opinion in PCT/US15/57262 dated Jan. 14, 2016.

Jekel et al., Liquid Refrigerant Pumping in Industrial Refrigeration Systems, ASHRAE Journal, Aug. 2011, p. 36-44.

Zhou et al, Visualization of Bubble Behavior for Jet Impingement Cooling with Phase Change, 14th IEEE ITHERM Conference, 2014.

Bar-Cohen, Thermal Management of Electronic Components with Dielectric Liquids, JSME International Journal, 1993, Series B, vol. 36, No. 1, The Japan Society of Mechanical Engineers, Japan.

Horacek et al, Spray Cooling Using Multiple Nozzles: Visualization and Wall Heat Transfer Measurements, IEEE Transactions on Device and Materials Reliability, Dec. 2004, Vol. 4, No. 4.

Horacek et al., Effects of Noncondensable Gas and Subcooling on the Spray Cooling of an Isothermal Surface, Proceedings of ASME International Mechanical Engineering Congress and Exposition 2003, Washington, D.C., Paper No. IMECE2003-41680. Heat Transfer, vol. 4 Washington, DC.

Horacek et al., Single Nozzle Spray Cooling Heat Transfer Mechanisms, International Journal of Heat and Mass Transfer, 2005, p. 1425-1438, vol. 48, Elsevier Ltd.

Ghajar, Journal of the Brazilian Society of Mechanical Sciences, Non-Boiling Heat Transfer in Gas-Liquid Flow in Pipes—A Tutorial, vol. 27, No. 1, Rio de Janeiro, Jan./Mar. 2005.

Parker-Hannifin Precision Cooling Systems (Parker-Hannifin, "Two-Phase Evaporative Cooling Systems," https://www.parker.com/literature/Precision%20Cooling/Two_Phase_Evaporative_Precision_Cooling_Systems.pdf), 2011.

* cited by examiner

SECTION B-B

SECTION A-A

SECTION B-B

SECTION A-A

SECTION B-B

SECTION C-C

SECTION D-D

SECTION B-B

SECTION E-E (a) Bubbly Flow
(b) Bubbly Flow
(c) Slug Flow
(d) Churn Flow
(e) Annular Flow

FLUID DISTRIBUTION UNIT FOR TWO-PHASE COOLING SYSTEM

CROSS-REFERENCE TO RELATED APPLICATIONS

This application is a continuation-in-part of U.S. patent application Ser. No. 14/604,727 filed Jan. 25, 2015; U.S. patent application Ser. No. 14/612,276 filed on Feb. 2, 2015; U.S. patent application Ser. No. 14/623,524 filed Feb. 17, 2015; U.S. patent application Ser. No. 14/644,211 filed Mar. 11, 2015; U.S. patent application Ser. No. 14/663,465 filed on Mar. 20, 2015; U.S. patent application Ser. No. 14/677,833 filed Apr. 2, 2015; U.S. patent application Ser. No. 14/679,026 filed on Apr. 6, 2015; U.S. patent application Ser. No. 14/705,972 filed on May 7, 2015; U.S. patent application Ser. No. 14/721,532 filed on May 26, 2015; U.S. patent application Ser. No. 14/723,388 filed May 27, 2015; U.S. patent application Ser. No. 14/826,822 filed on Aug. 14, 2015 and claims the benefit of U.S. Provisional Patent Application No. 62/069,301 filed Oct. 27, 2014; U.S. Provisional Patent Application No. 62/072,421 filed Oct. 29, 2014; and U.S. Provisional Patent Application No. 62/099,200 filed Jan. 1, 2015, each of which is hereby incorporated by reference in its entirety as if fully set forth in this description.

FIELD

This disclosure relates to cooling systems and subsystems for cooling one or more heat sources, such as one or more heat sources associated with an electrical, mechanical, chemical, or electromechanical device or process.

BACKGROUND

Modern data centers house thousands of servers, each having two or more heat-generating microprocessors. Microprocessors can easily produce more than 40 thermal watts per square centimeter, and future microprocessors are expected to produce even higher heat fluxes as semiconductor technology continues to progress. Collectively, the amount of heat generated by all servers in a data center is substantial. Unfortunately, removing this heat from the data center using conventional air conditioning systems is costly and inefficient. Installing air conditioning in a data center requires significant upfront capital expenditures on large computer room air conditioning (CRAC) units, air handling equipment, and related ducting, as well as ongoing operating expenditures to service and maintain the CRAC units. Moreover, CRAC units suffer from poor thermodynamic efficiency, which translates to high monthly utility costs for data center operators. To reduce the cost of operating data centers, and thereby reduce the cost of cloud computing services reliant on data centers, there is a strong need to cool servers within data centers more efficiently.

According to the U.S. Department of Energy, nearly three percent of all electricity used in the United States is devoted to powering data centers and computer facilities. Approximately half of this electricity goes toward power conditioning and cooling. Increasing the efficiency of cooling systems for data centers and computer facilities would lead to dramatic savings in energy nationwide. More efficient cooling systems are also needed in transportation systems due to increasing adoption of hybrid and electric vehicles that rely on complex electrical components, including batteries, inverters, and electric motors, which produce significant amounts of heat that must be effectively dissipated. Cooling systems capable of more efficiently cooling these electrical components would translate to increased range and utility for these vehicles.

Presently, the majority of computers (e.g. servers and personal computers) in residential and commercial settings are cooled using forced air cooling systems in which room air is forced, by one or more fans, over finned heat sinks mounted on microprocessors, power supplies, or other electronic devices. The heat sinks add mass and cost to the computers and place mechanical stress on electronic components to which they are mounted. If a computer is subject to vibration, such as vibration caused by a fan mounted in the computer, a heat sink mounted on top of a microprocessor can oscillate in response to the vibration and can fatigue the electrical connections that attach the microprocessor to the motherboard of the computer.

Another downside of air cooling systems is that cooling fans commonly operate at high speeds and can be quite noisy. When many computers are collocated, such as in a data center or computer room, the collective noise produced by the computer fans can require service personnel to wear hearing protection. As air passes over electronic devices in the computers, the air, which is at a lower temperature than the hot surfaces of the electronic devices, absorbs heat from the electronic devices, thereby cooling the devices. These air cooling systems are inherently limited in terms of performance and efficiency due to the low specific heat of air, which is much lower than the specific heat of water and other coolants. For example, dry air at 20° C. and 1 bar, has a specific heat of about 1,007 J/(kg-K), whereas water at 20° C. has a specific heat of about 4,181 J/(kg-K). Due to air's low specific heat and low density, high flow rates are required to ensure adequate cooling of even relatively small heat loads.

Electronic components within a typical server chassis can produce a thermal load of about 500 watts. The amount of airflow required to cool the components can be calculated with the following equation:

$$\dot{flow}_{air} = \frac{Q}{c_p \times r \times \Delta T}$$

where $\dot{flow}_{air}$ is air flow rate, Q is heat transferred, $c_p$ is the specific heat of air, r is density of the air, and $\Delta T$ is the change in temperature between the air entering the server chassis and air exiting the server chassis. Where the thermal load of the server is 500 W and the maximum allowable $\Delta T$ is about 30 degrees, the server chassis will require about 53 cubic feet per minute (cfm) of air flow. For an installation of 20 servers, which is common in computer rooms of small businesses and academic institutions, over 1,000 cfm of air flow is required to cool the servers. Achieving adequate cooling capacity in this scenario requires two air conditioning units sized for a typical U.S. home as well as an appropriately sized air handler and ducting to deliver cool air to the room.

Modern data centers, which can have tens of thousands of servers, must be equipped with many CRAC units designed to cool and circulate large amounts of air. The CRAC units are large and expensive and must be professionally installed and often require substantial modifications to the facility, including installation of structural supports, custom air ducting, custom plumbing, and electrical wiring. After installation, CRAC units require frequent preventative maintenance in an attempt to avoid unplanned downtime. And simply delivering large amounts of cool air to the data center will not ensure adequate cooling of the servers. Special care must be taken to deliver cool air to the servers without the cool air first mixing with warm air exhausting from the servers. This can require installation of special airflow management products, such a raised floors, air curtains, and specially designed server enclosures, to assist with air containment. These products can significantly increase the build-out cost of a data center per square foot. Inevitably, these products do not succeed at isolating cold air from warm air, they simply reduce mixing of hot and cold air and thereby provide marginal efficiency improvements. Therefore, to ensure that sensitive components within the servers do not overheat, most data centers are forced to increase flow rates of cool air well above theoretical values as well as decrease the set point temperature of the room. The result is higher power consumption by the CRAC units and air handlers, leading to higher cooling costs for the data center.

Many electronic devices operate less efficiently as their temperature increases. As one example, a typical microprocessor operates less efficiently as its junction temperature increases. FIG. 64 shows a plot of power consumption in watts versus junction temperature. The bottom curve shows static power consumption of a microprocessor and the top curves show total power consumption for switching speeds of 1.6 GHz and 2.4 GHz, respectively. Total power consumption includes both static power consumption and dynamic power consumption, which varies with switching frequency. As shown in FIG. 64, as the temperature of the microprocessor increases, it consumes more power to provide the same performance. In air cooling systems, it is common for fully utilized microprocessors to operate at or near their maximum rated temperature, resulting in poor operating efficiency. In the example shown in FIG. 64, the microprocessor uses over 35% more power when operating at 95 degrees C. than when operating at 45 degrees C. To conserve energy, it is therefore desirable to provide a cooling system that will allow the microprocessor to operate consistently at lower temperatures. Providing a consistently lower operating temperature for the microprocessor can also extend its useful life and can avoid unnecessary throttling (dynamic frequency scaling) or downtime of the computer due to an unsafe junction temperature.

Operating speeds of next generation microprocessors will continue to increase, as will heat fluxes (defined as heat load per unit area) produced by those next generation microprocessors. Conventional air cooling systems will soon be incapable of effectively and efficiently cooling these next generation microprocessors. Therefore, it is desirable to provide a new cooling system that is significantly more effective and efficient than existing air cooling systems and is capable of managing high heat fluxes that will be produced by next generation microprocessors.

Pumped liquid cooling systems can provide improved thermal performance over conventional air cooling systems. Pumped liquid cooling systems typically include the following items connected by tubing: a heat sink attached to the microprocessor, a liquid-to-air heat exchanger, and a pump that circulates liquid coolant through the system. As the liquid coolant passes through channels in the heat sink, heat from the microprocessor is transferred through the thermally conductive heat sink to the coolant, thereby increasing the temperature of the coolant and transferring heat away from the microprocessor. The heat sink is typically designed to maximize heat transfer by maximizing the surface area of the channels through which the liquid passes. In some examples, the heat sink can be a micro-channel heat sink that utilizes fine fin channels through which the liquid coolant flows. The heated liquid coolant exiting the heat sink is then circulated through a liquid-to-air heat exchanger where the heat is expelled to the surrounding air to the reduce the temperature of the liquid coolant before it circulates back to the pump for another cycle.

Use of closed liquid cooling systems is beginning to migrate from high performance computers to personal computers. Unfortunately, existing liquid cooling systems have performance constraints that will prevent them from effectively cooling next generation microprocessors. This is because liquid cooling systems rely solely on transferring sensible heat by increasing the temperature of a liquid coolant as it passes through a heat sink. The amount of heat that can be transferred is a function of, among other factors, the thermal conductivity of the fluid and the flow rate of the fluid. Dielectric fluids do not have sufficient thermal conductivities to be used in liquid cooling systems. Instead, water or a water-glycol mixture is commonly used due its significantly higher thermal conductivity. Unfortunately, if a leak develops in a liquid cooling system that uses water or a water-glycol mixture, the water will destroy the server and potentially an entire rack of servers. With the price of a single server being thousands of dollars or even tens of thousands of dollars, many data center operators are simply unwilling to accept the risk of loss presented by water-based liquid cooling systems.

While more effective than air cooling, transferring heat by sensible heating requires significant flow rates of liquid coolant, and achieving high flow rates often necessitates high fluid pressures. Consequently, a liquid cooling system designed to cool a modern microprocessor can require a large pump, or a series of small pumps positioned throughout the liquid cooling system, to ensure an adequate liquid coolant pressure and flow rate. Operating large pumps, or a series of small pumps, uses a significant amount of energy and diminishes the efficiency of the cooling system. Moreover, using a series of small pumps increases the probability of the cooling system experiencing a mechanical failure, which translates to unwanted facility downtime.

Although liquid cooling systems have proven adequate at cooling modern microprocessors, they will be unable to adequately cool next generation microprocessors while maintaining practical physical dimensions and specifications. For instance, to cool a next generation microprocessor, liquid cooling systems will require very high flow rates (e.g. of water), which will require large, heavy duty cooling lines (e.g. greater than ¾" outer diameter), such as reinforced rubber cooling lines or sweated copper tubing, that will be difficult to route in any practical manner into and out of a server housing. If installed in a server, these large plumbing lines will block access to electrical components within the server, thereby frustrating maintenance of the server. These large plumbing lines will also prevent drawers on a server rack from opening and closing as intended, thereby preventing the server from being easily accessed and further frustrating maintenance of the server. As mentioned above, water poses a catastrophic risk to servers, and increasing the pressure and flow rates of water into and out of servers only increases this risk. Consequently, increasing the capabilities of existing liquid cooling systems to meet the cooling requirements of next generation microprocessors is simply not a practical or viable option. Without further innovation in the area of cooling systems, the implementation of next-generation microprocessors will be hampered.

As noted above, liquid cooling systems commonly rely on flowing liquid water through channels in finned heat sinks. The heat sinks are often indirectly coupled to a heat source via a metal base plate that is mounted on the heat source using thermal paste, such as solder thermal interface material (STIM) or polymer thermal interface material (PTIM), and/or a direct bond adhesive. While this approach can be more effective than air cooling, the intervening materials between the water and the heat source induce significant thermal resistance, which reduces heat transfer rates and the overall efficiency of the cooling system. The intervening materials also add cost and time to manufacturing and installation processes, constitute additional points of failure, and create potential disposal issues. Finally, the intervening materials render the system unable to adapt to local hot spots on a heat source. The net effect of these performance limitations is that the liquid cooling system must be designed to accommodate the maximum anticipated heat load of one or more localized hot spots on the surface of the heat source (e.g. to adequately cool one hot core of a multicore processor), resulting in additional cost and complexity of the entire liquid cooling system.

Unlike water, dielectric coolants can be placed in direct contact with electronic devices and not harm them. Unfortunately, dielectric coolants can have a lower specific heat than water, so they are not well suited for use in single-phase pumped liquid cooling systems. For instance, some dielectric coolants, such as certain hydrofluoroethers have a specific heat of about 1,300 J/(kg-K), whereas water has a specific heat of about 4,181 J/(kg-K). This means that that cooling a microprocessor by sensibly warming a flow of dielectric coolant will require a flow rate about four times higher than a flow rate of water used to cool an identical microprocessor by sensibly warming the flow of water. This higher flow rate requires more pump power, which translates to lower cooling system efficiency.

As an alternative to pumped liquid systems, dielectric coolants can be used in immersion cooling systems. Immersion cooling is an aggressive form of liquid cooling where an entire electronic device (e.g. a server) is submerged in a vat of dielectric coolant (e.g. HFE-7000 or mineral oil). Unfortunately, immersion cooling vats are large, costly, and heavy, especially when filled with dielectric coolant, which can have a density significantly higher than water. Existing vats hold upwards of 250 gallons of coolant and can weigh more than 8,000 pounds when filled with coolant. Typically, a room must be specially engineered to accommodate the immersion cooling vat, and containment systems need to be specially designed and installed in the room as a precaution against vat failure. When using 250 gallons of coolant, the cost of the coolant becomes a significant capital expenditure. Certain coolants, such as mineral oil, can act as solvents and over time can remove certain identifying information from motherboards and from other server components. For instance, product labels (e.g. stickers containing serial numbers and bar codes) and other markings (e.g. screen printed values and model numbers on capacitors and other devices) are prone to dissolve and wash off due to a continuous flow of coolant over all surfaces of the server. As the labels and dyes wash off the servers, the coolant in the vat can become contaminated and may need to be replaced, resulting in an additional expense and downtime. Another downside of immersion cooling is that servers cannot be serviced immediately after being withdrawn from the vat. Typically, the server must be removed from the vat and permitted to drip dry for a period of time (e.g. 24 hours) before a professional can service the server. During this drying period, the server is exposed to contaminants in the air, and the presence of mineral oil on the server may attract and trap contaminants on sensitive circuitry of the server, which is undesirable.

Another cooling approach, known as spray cooling or spray evaporative cooling, relies on atomized sprays. In this approach, atomized liquid coolant is sprayed, through air or vapor, directly onto an electronic device. As a result, small droplets impinge a heated surface of the device and coalesce to form a thin liquid film on the heated surface. Heat is then transferred from the heated surface to the liquid film either by sensible heating of the bulk liquid or by latent heating, as a fraction of the liquid film transitions to vapor. Spray cooling is a very efficient way to remove high heat fluxes from small surfaces. Unfortunately, the margin for error in spray cooling is very narrow, and the onset of dry out and critical heat flux is a constant concern that can have catastrophic consequences. Critical heat flux is a condition where evaporation of coolant from the heated surface forms a vapor layer that prevents atomized liquid from reaching and cooling the surface, often resulting in run-away device temperatures and rapid failure. Great care must be taken to ensure uniform coverage of the spray on the heated surface and adequate drainage of fluid from the heated surface. Although achievable in static laboratory settings, mainstream adoption of spray cooling has been hampered by several factors. First, spray cooling requires a significant working volume to enable atomized sprays to form, which results in non-compact cooling components, making it impractical for packaging in most commercial products. Second, atomizing liquid coolant requires a significant amount of pressure upstream of the atomizer to generate an appropriate pressure drop at the atomizer-air interface to enable atomized sprays to form. Maintaining this amount of pressure within the system consumes a significant amount of pump or compressor energy. Third, high flow rates of atomized sprays are required to prevent dry out or critical heat flux from occurring. In the end, it has proven difficult to design a practical, reliable, and compact spray cooling system, despite a large amount of time and effort that has been expended to do so.

In view of the foregoing discussion, efficient, scalable, high-performing methods and apparatuses are needed for cooling electronic devices that produce high heat fluxes, such as processors and power electronics.

SUMMARY

This disclosure presents fluid distribution units for cooling systems capable of cooling one or more heat sources, such as one or more heat sources associated with an electrical, mechanical, chemical, or electromechanical device or process.

In one example, a fluid distribution unit for a two-phase cooling system can include a reservoir configured to receive a two-phase flow of dielectric coolant including liquid coolant and vapor coolant. The fluid distribution unit can include a supply line having a first end and a second end. The first end of the supply line can be fluidly connected to the reservoir, and the second end of the supply line can include a first fitting. The fluid distribution unit can include a first pump fluidly connected between the first end of the supply line and the second end of the supply line. The fluid distribution unit can include a return line having a first end and a second end. The first end of the return line can include a second fitting, and the second end of the return line can be fluidly connected to the reservoir. The fluid distribution unit can include a heat rejection loop having a first end and a second end. The first end of the heat rejection loop can be fluidly connected to the reservoir, and the second end of the heat rejection loop can be fluidly connected to the reservoir. A heat exchanger can be fluidly connected to the heat rejection loop between the first end of the heat rejection loop and the second end of the heat rejection loop. A second pump can be fluidly connected to the heat rejection loop between the first end of the heat rejection loop and the second end of the heat rejection loop. The second pump can be located upstream of the heat exchanger and can be configured to circulate a flow of single-phase liquid coolant from the reservoir, through the heat exchanger, and back to the reservoir.

The first end of the supply line can be fluidly connected to the reservoir at a first location, and the second end of the return line can be fluidly connected to the reservoir at a second location. The first location can be at least one inch lower on the reservoir than the second location, where the distance is measured vertically between midpoints of the first location and the second location. The first end of the heat rejection loop can be fluidly connected to the reservoir at a third location, and the second end of the heat rejection loop can be fluidly connected to the reservoir at a fourth location. The third location can be at least one inch lower on the reservoir than the fourth location, where the distance is measured vertically between midpoints of the third location and the fourth location.

The heat exchanger can be a liquid-to-liquid heat exchanger having a first isolated fluid pathway configured to transport dielectric coolant received from the heat rejection loop and a second isolated fluid pathway configured to transport chilled water or a water-glycol mixture. An inner volume of the first isolated fluid pathway can be about 0.25-1.5, 1.0-3.5, 2.0-4.5, 4.0-8.0, 6.0-12, or 10-15 gallons.

The reservoir can have an inner volume of about 0.25-1.5, 1.0-3.5, 2.0-4.5, 4.0-8.0, 6.0-12, or 10-15 gallons. The reservoir can include a baffle in its inner volume. The baffle can establish only non-linear flow pathways between reservoir flow inlets and reservoir flow outlets. Reservoir flow inlets include the second end of the return line and the first end of the heat rejection loop, and reservoir flow outlets include the first end of the supply line and the second end of the heat rejection loop.

In another example, a rack-mountable fluid distribution unit for a two-phase cooling system for cooling servers can include a reservoir. The reservoir can have an inner volume configured to receive a flow of two-phase dielectric coolant including liquid coolant and vapor coolant. The fluid distribution unit can include a supply line having a first end and a second end. The first end of the supply line can be fluidly connected to the reservoir, and the second end of the supply line can include a first quick-connect fitting. A first pump can be fluidly connected between the first end of the supply line and the second end of the supply line. A return line can include a first end and a second end. The first end of the return line can include a second quick-connect fitting, and the second end of the return line can be fluidly connected to the reservoir. The fluid distribution unit can include a heat rejection loop having a first end and a second end. The first end of the heat rejection loop can be fluidly connected to the reservoir, and the second end of the heat rejection loop can be fluidly connected to the reservoir. A heat exchanger can be fluidly connected to the heat rejection loop between the first end of the heat exchanger loop and the second end of the heat rejection loop. A second pump can be fluidly connected to the heat rejection loop between the first end of the heat exchanger loop and the second end of the heat rejection loop and configured to circulate coolant from the reservoir, through the heat exchanger, and back to the reservoir.

The fluid distribution unit can include a support structure configured to mount within a server rack. The reservoir, the first pump, and the second pump can be mounted to the support structure. The support structure can be configured to slidably engage with a server rack to permit rapid installation of the fluid distribution unit. The first quick-connect fitting can be a blind-mate coupler having a first non-spill valve, and the second quick-connect fitting can be a blind-mate quick-connect coupler having a second non-spill valve.

The fluid distribution unit can include a flow quality sensor attached to the return line and configured to provide an output signal based on a flow quality of two-phase flow passing through the return line to the reservoir. The fluid distribution unit can include an electronic control unit mounted to the support structure. The flow quality sensor can be electrically connected to the electronic control unit to permit the output signal from the flow quality sensor to be received by the electronic control unit.

The first pump can include a first variable speed drive electrically connected to the electronic control unit. The electronic control unit can be configured to increase a speed of the first variable speed drive when the output signal from the flow quality sensor indicates a flow quality greater than about 0.3, 0.4, or 0.5. The electronic control unit can be configured to decrease a speed of the first variable speed drive when the output signal from the flow quality sensor indicates a flow quality less than 0.1, 0.2, or 0.3.

The second pump can include a second variable speed drive electrically connected to the electronic control unit. The electronic control unit can be configured to increase a speed of the second variable speed drive when the output signal from the flow quality sensor indicates a flow quality greater than 0.3, 0.4, or 0.5. The electronic control unit can be configured to decrease a speed of the second variable speed drive when the output signal from the flow quality sensor indicates a flow quality less than 0.1, 0.2, or 0.3.

In yet another example, a fluid distribution unit for a two-phase cooling apparatus can include a reservoir having an inner volume configured to receive an amount of two-phase dielectric coolant. The fluid distribution unit can include a supply line having a first end and a second end. A first pump can be fluidly connected between the first end of the supply line and the second end of the supply line. The first end of the supply line can be fluidly connected to the reservoir, and the second end of the supply line can be fluidly connected to an inlet chamber of a manifold assembly. The fluid distribution unit can include a return line having a first end and a second end. The first end of the return line can be fluidly connected to an outlet chamber of the manifold assembly, and the second end of the return line can be fluidly connected to the reservoir. The fluid distribution unit can include a heat rejection loop having a first end and a second end. The first end of the heat rejection loop can be fluidly connected to the reservoir, and the second end of the heat rejection loop can be fluidly connected to the reservoir. A heat exchanger can be fluidly connected to the heat rejection loop between the first end of the heat rejection loop and the second end of the heat rejection loop. A second pump can be fluidly connected to the heat rejection loop between the first end of the heat rejection loop and the second end of the heat rejection loop and configured to circulate coolant from the reservoir, through the heat exchanger, and back to the reservoir.

The inlet chamber of the manifold assembly can include a first inlet chamber end, a second inlet chamber end opposite the first inlet chamber end, a first flow inlet proximate the first inlet chamber end, and a first flow outlet proximate the second inlet chamber end. The manifold assembly can include a first plurality of quick-connect fittings installed in a first plurality of openings passing through a bounding surface of the inlet chamber. The outlet chamber of the manifold assembly can include a first outlet chamber end, a second outlet chamber end opposite the first outlet chamber end, a second flow inlet proximate the first outlet chamber end, and a second flow outlet proximate the second outlet chamber end. The manifold assembly can include a second plurality of quick-connect fittings installed in a second plurality of openings extending through a bounding surface of the outlet chamber. One or more of the first plurality of quick-connect fittings can be non-spill valves including a silicone-based grease and a butyl rubber sealing member to ensure compatibility with the dielectric coolant.

The manifold assembly can include a bypass fluidly connecting the first flow outlet of the inlet chamber to the second flow inlet of the outlet chamber. The manifold assembly can include a differential pressure bypass valve positioned in the bypass and configured to control a flow of pressurized coolant from the inlet chamber to the outlet chamber through the bypass to maintain a pressure differential between the inlet chamber and the outlet chamber. The differential pressure bypass valve can include a valve inlet and a valve outlet and can be configured to control a flow of pressurized coolant through the bypass of the manifold assembly by establishing the pressure differential of about 1-5, 2-10, 5-12, 10-15, or 10-25 psi between the valve inlet and the valve outlet. The differential pressure bypass valve can include a bypass circuit fluidly connecting the valve inlet to the valve outlet, a valve plug disposed in the bypass circuit, and a spring. The valve plug can be configured to restrict flow of pressurized coolant though the bypass circuit. The spring can be disposed between the valve plug and a control knob. Tightening the control knob can compress the spring against the valve plug and increase a differential pressure setting of the differential pressure bypass valve.

The manifold assembly can include a manifold body. The inlet chamber, the outlet chamber, the first plurality of openings, the second plurality of openings, and the bypass can be fluid passageways formed in a manifold body. The valve plug and the spring of the differential pressure bypass valve can be installed within a bore of the bypass formed in the manifold body.

Additional objects and features of the invention are introduced below in the Detailed Description and shown in the drawings. While multiple embodiments are disclosed, still other embodiments will become apparent to those skilled in the art from the following Detailed Description, which shows and describes illustrative embodiments. As will be realized, the disclosed embodiments are susceptible to modifications in various aspects, all without departing from the scope of the present disclosure. Accordingly, the drawings and detailed description are to be regarded as illustrative in nature and not restrictive.

This Summary is provided to introduce a selection of concepts in a simplified form that are further described in the Detailed Description below. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTIONS OF DRAWINGS

Figure 5:
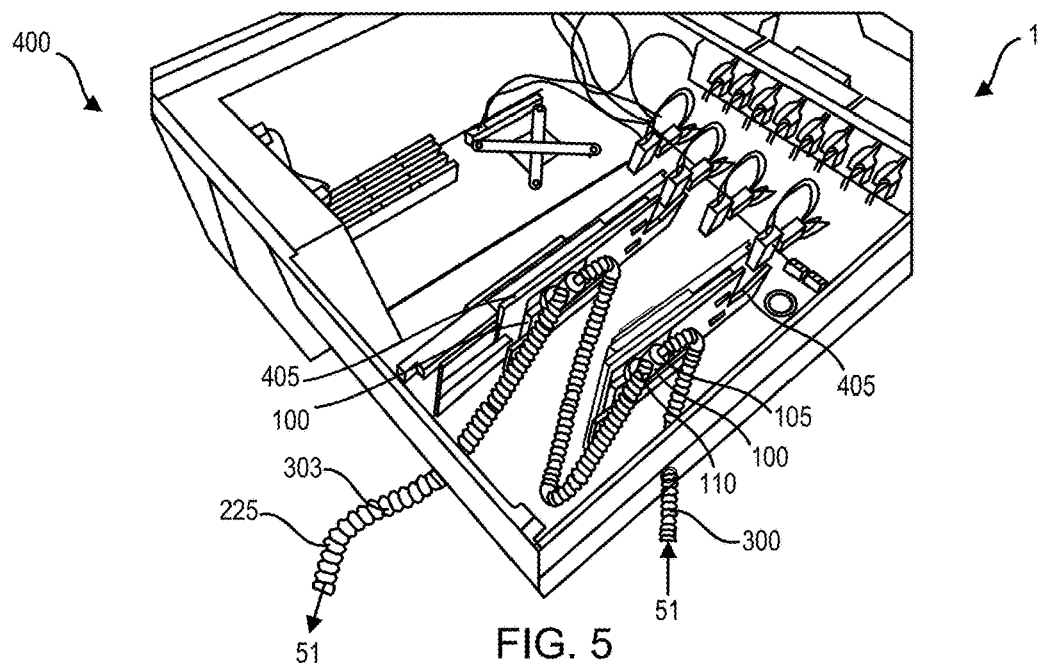

FIG. 5 shows a top perspective view of a server with its lid removed and a portion of a cooling apparatus installed within the server, the cooling apparatus having two heat sink modules mounted on vertically-oriented processors within the server, the heat sink modules arranged in a series configuration and fluidly connected with sections of flexible tubing to transport coolant from an outlet port of a first heat sink module to an inlet port of a second heat sink module.

Figure 6:
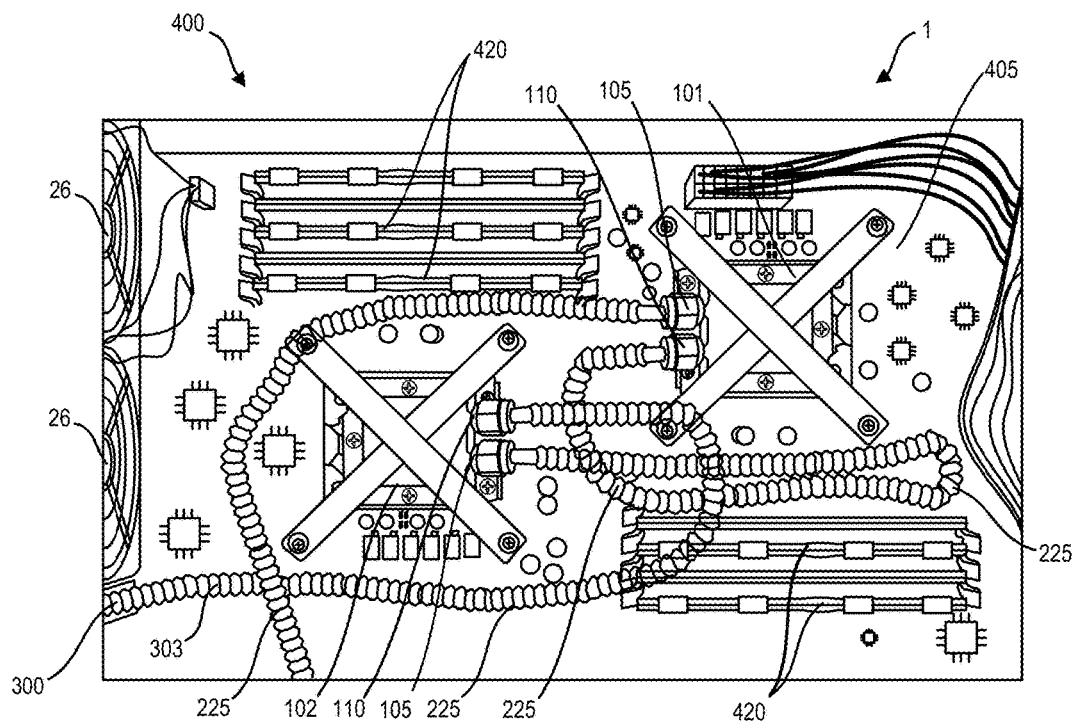

FIG. 6 shows a top view of a server with its lid removed and a portion of a cooling apparatus installed within the server, the cooling apparatus including two heat sink modules mounted on horizontally-oriented processors within the server, the heat sink modules arranged in a series configuration and held down with mounting brackets and fluidly connected with a section of flexible tubing to transport coolant from an outlet port of a first heat sink module to an inlet port of a second heat sink module.

Figure 7:
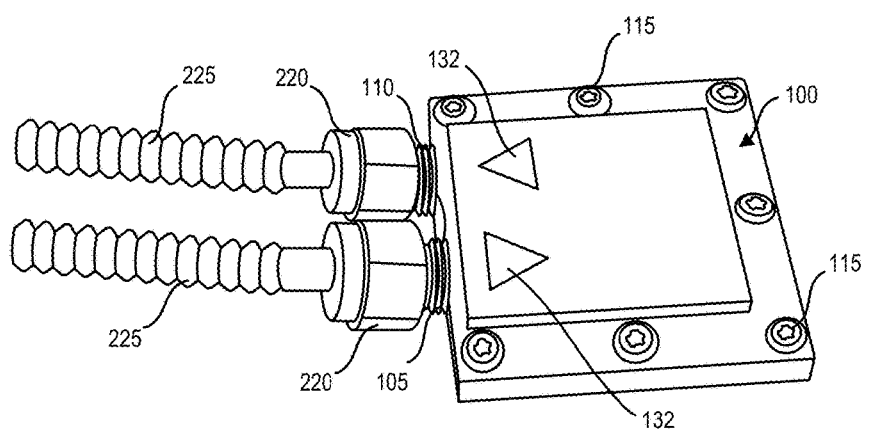

FIG. 7 shows a cooling assembly including a heat sink module, a first section of flexible tubing fluidly connected to an inlet port of the heat sink module, and a second section of flexible tubing fluidly connected to an outlet port of the heat sink module.

Figure 8:
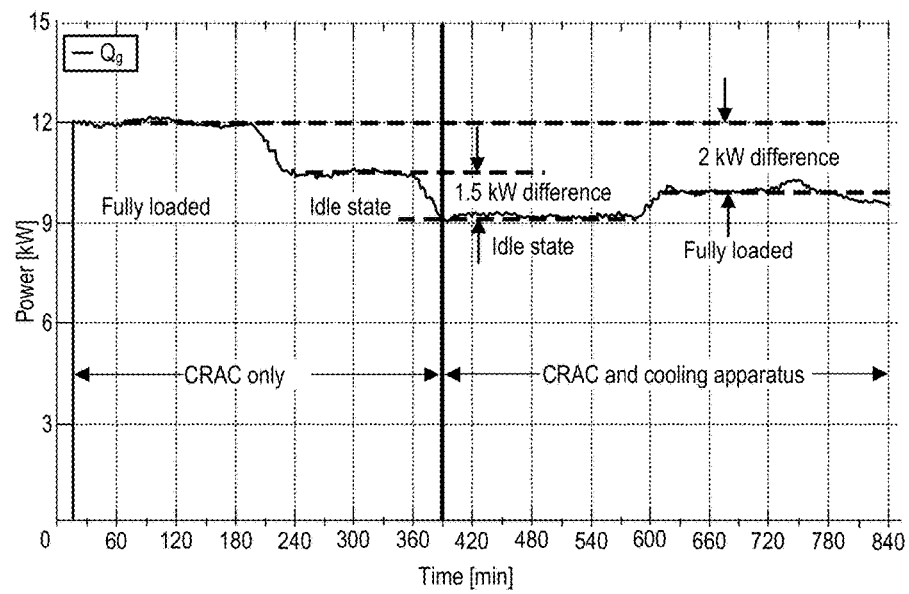

FIG. 8 shows a plot of power consumption versus time for a computer room with forty active dual-processor servers initially cooled by a CRAC and then cooled by the CRAC and a cooling apparatus as described herein, where the cooling apparatus provides substantial reductions in overall power consumption despite being installed on just ten of the forty servers in the computer room.

Figure 1:
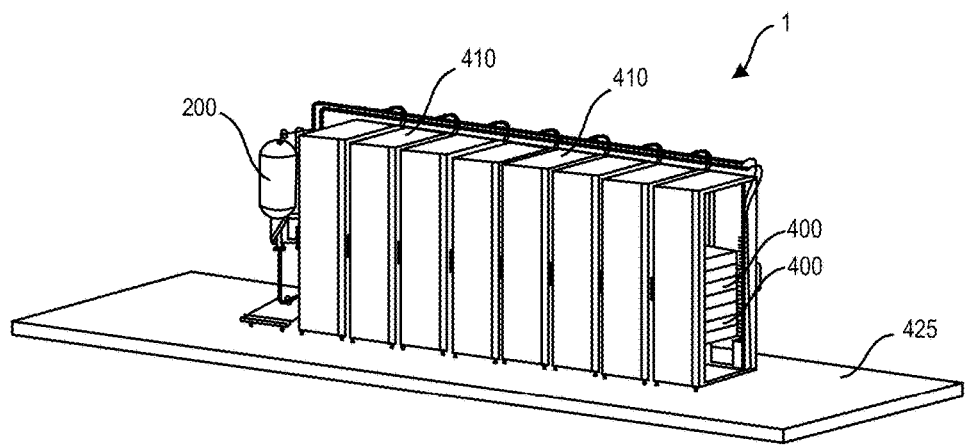
FIG. 1 shows a front perspective view of a cooling apparatus installed on a plurality of servers arranged in eight racks in a data center.
Figure 9:
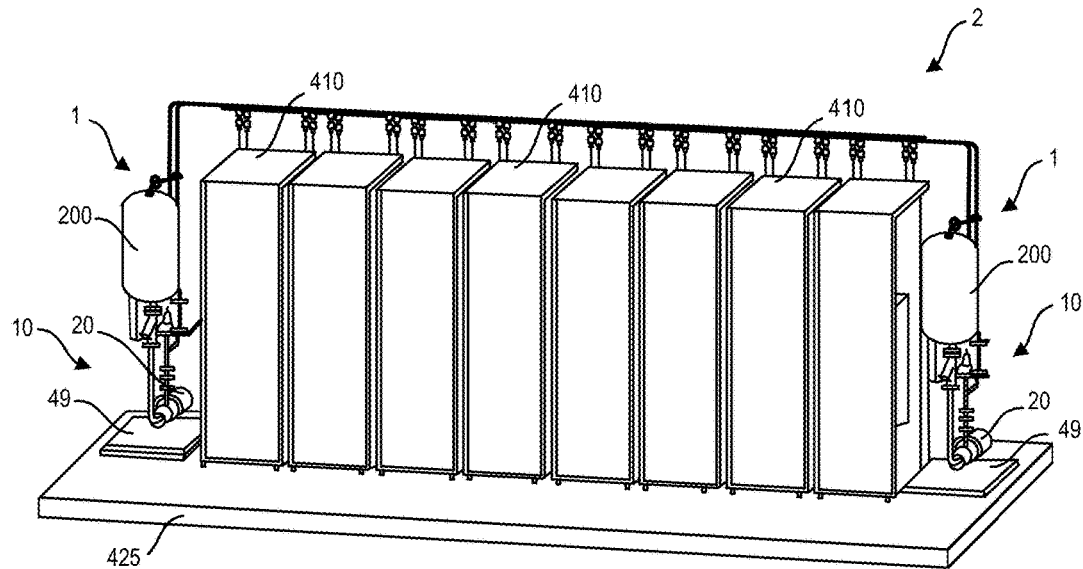

FIG. 9 shows a front perspective view of a redundant cooling apparatus installed on eight racks of servers in a data center where the redundant cooling apparatus includes a first independent cooling system as shown in FIG. 1 and a second independent cooling system as shown in FIG. 1.

Figure 10:
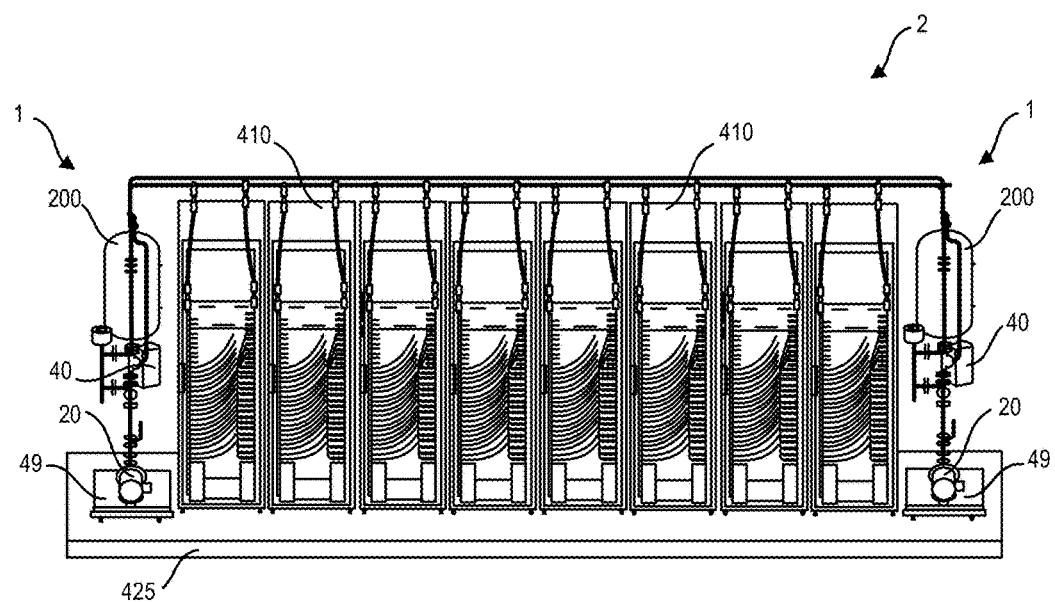

FIG. 10 shows a rear view of the redundant cooling apparatus of FIG. 9.

Figure 11A:
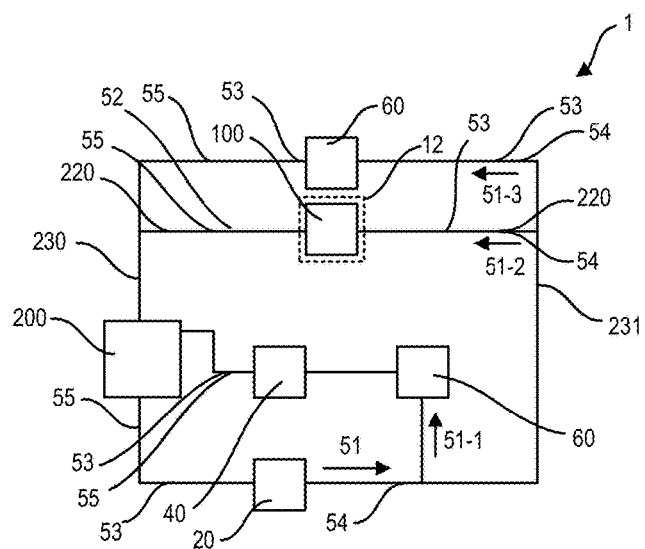

FIG. 11A shows a schematic of a cooling apparatus having a primary cooling loop, a first bypass, and a second bypass, where the primary cooling loop includes a reservoir, a pump, and a heat sink module mounted on a heat-generating surface, the first bypass including a first valve upstream of a heat exchanger, and a second bypass including a second valve configured to control a pressure differential between an inlet port and an outlet port of the heat sink module.

Figure 11B:
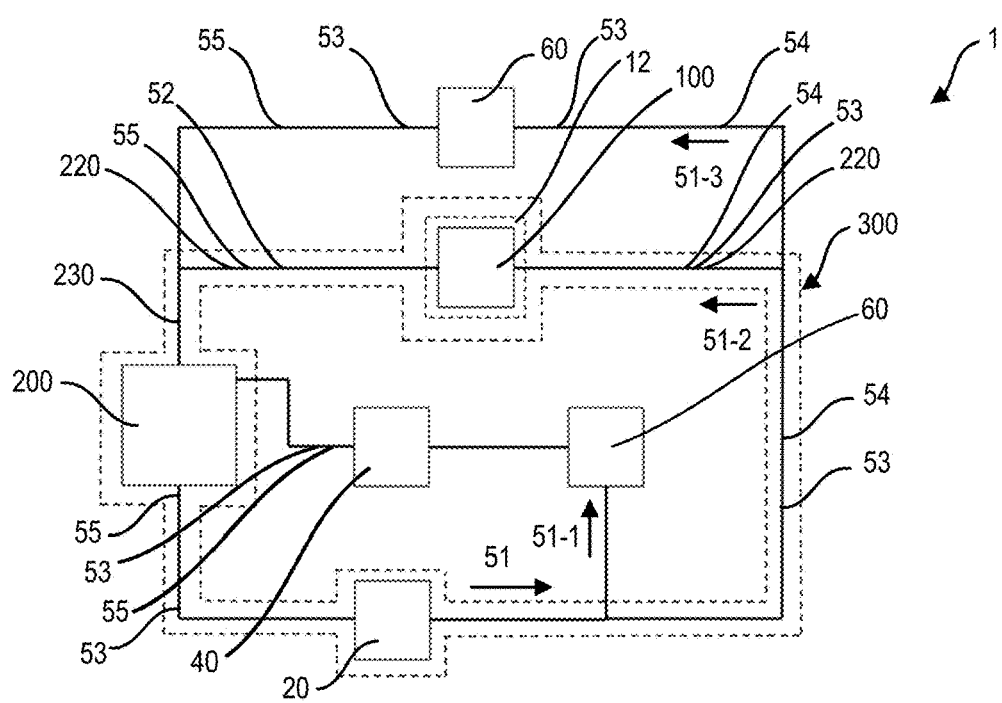

FIG. 11B shows the schematic of FIG. 11A with the primary cooling loop identified by dashed lines, the primary cooling loop including a reservoir, a pump, and a heat sink module mounted on a heat source.

Figure 11C:
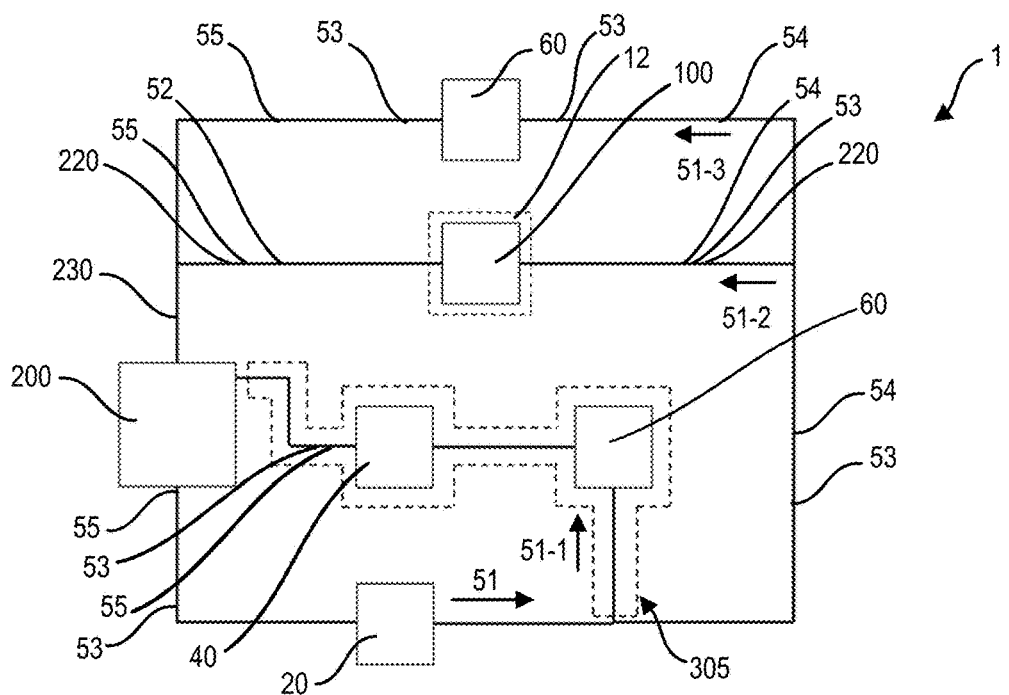

FIG. 11C shows the schematic of FIG. 11A with the first bypass identified by dashed lines, the first bypass including a valve and a heat exchanger.

Figure 11D:
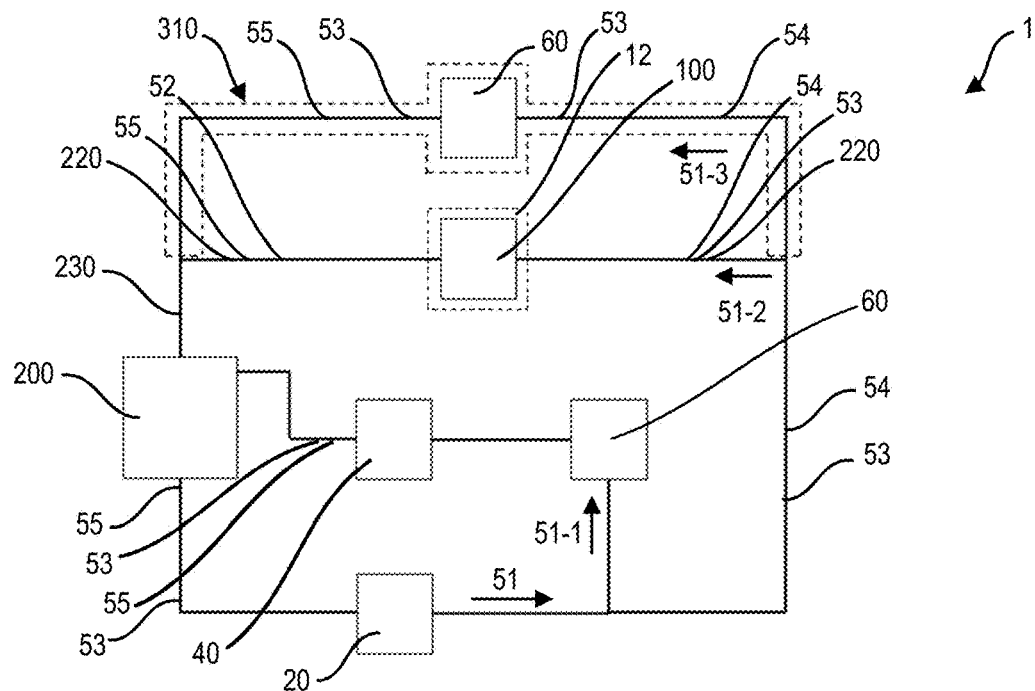

FIG. 11D shows the schematic of FIG. 11A with the second bypass identified by dashed lines, the second bypass including a valve.

Figure 12A:
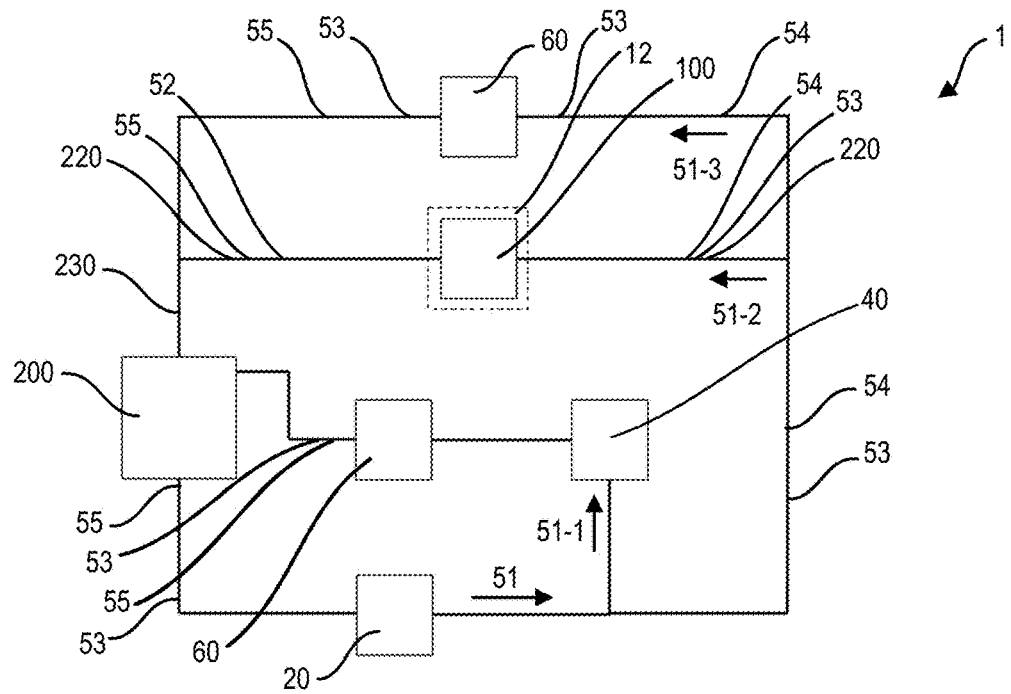

FIG. 12A shows a schematic of a cooling apparatus having a primary cooling loop, a first bypass, and a second bypass, the primary cooling loop including a reservoir, a pump, and one heat sink module mounted on a heat source, the first bypass including a first valve located downstream of a heat exchanger, and the second bypass including a second valve.

Figure 12B:
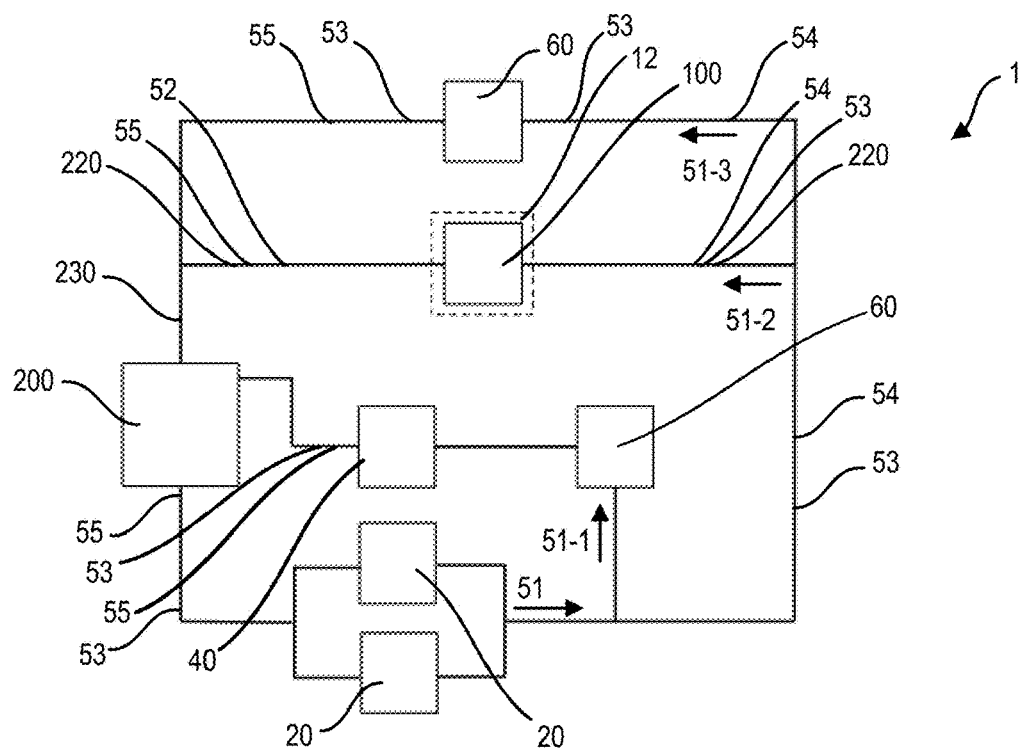

FIG. 12B shows a schematic of a cooling apparatus having primary cooling loop, a first bypass, and a second bypass, the primary cooling loop including two pumps arranged in parallel for redundancy in case one pump fails, the first bypass including a first valve located upstream of a heat exchanger, and the second bypass including a second valve.

Figure 12C:
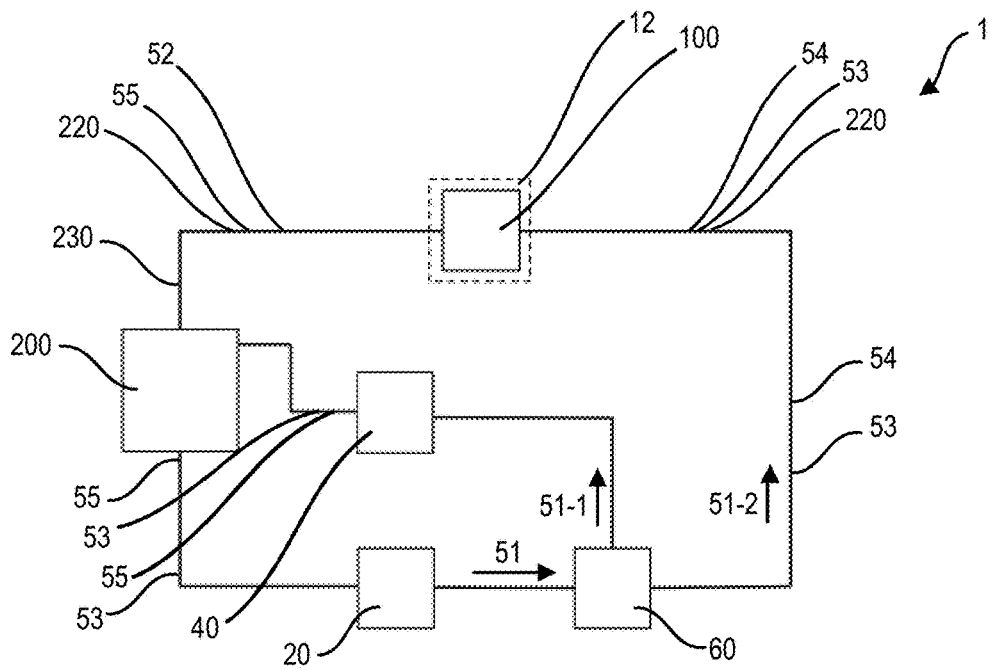

FIG. 12C shows a schematic of a cooling apparatus having a three-way valve at a junction between a primary cooling loop and a bypass, the primary cooling loop including a reservoir, a pump, a heat sink module mounted on a heat source, and the three-way valve, and the bypass including a heat exchanger.

Figure 12D:
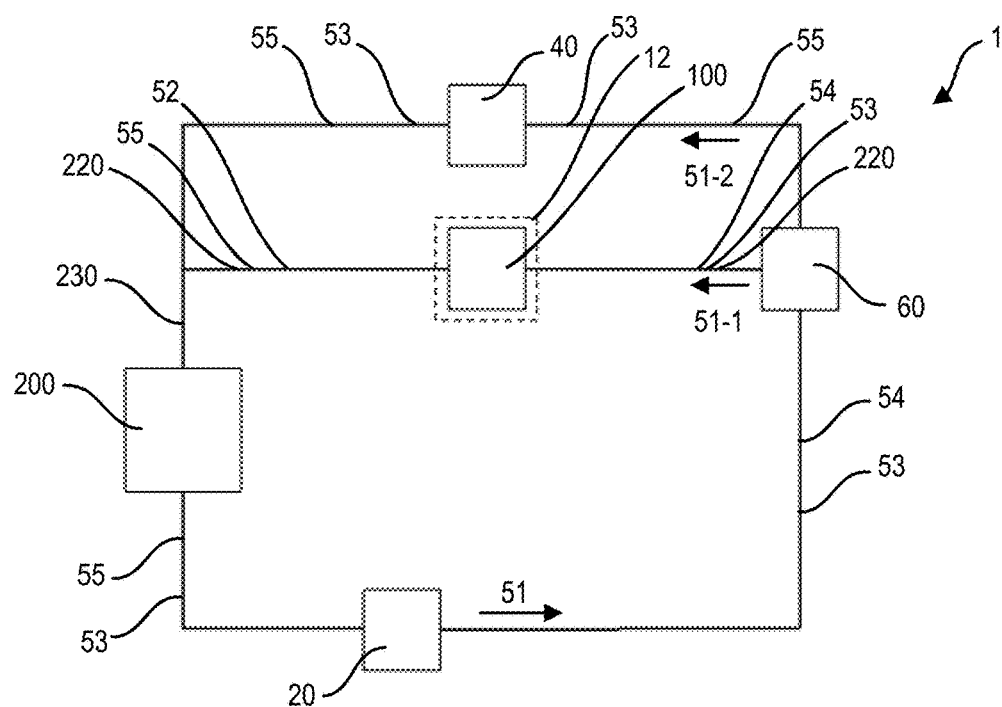

FIG. 12D shows a schematic of a cooling apparatus having a three-way valve at a junction between a primary cooling loop and a bypass, the primary cooling loop including a reservoir, a pump, and a heat sink module on a heat source, and the bypass including a heat exchanger.

Figure 12E:
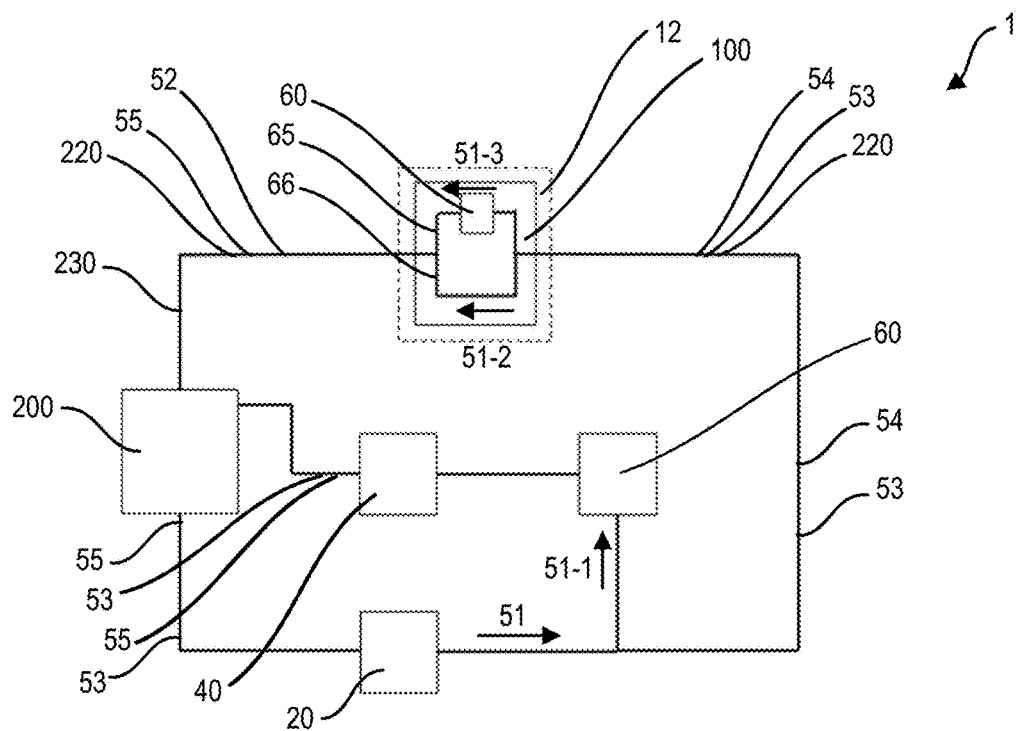

FIG. 12E shows a schematic of a cooling apparatus including a bypass and a primary cooling loop, the bypass including a heat exchanger and a valve, and the primary cooling loop including a reservoir, a pump, and a heat sink module with an internal bypass containing a valve.

Figure 12F:
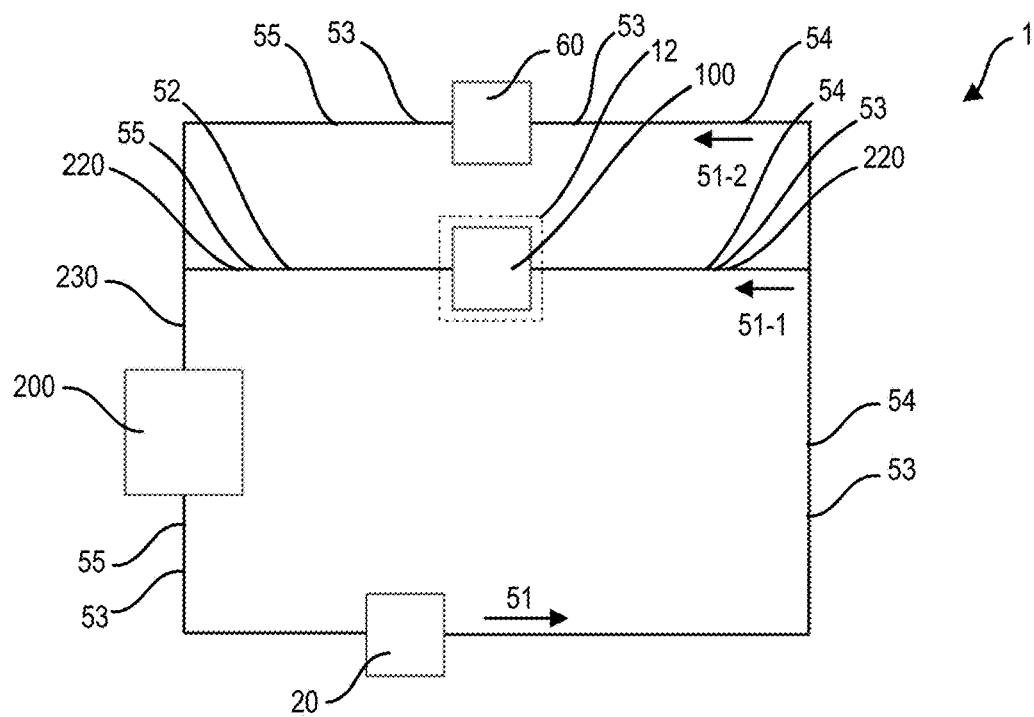

FIG. 12F shows a schematic of a cooling apparatus having a primary cooling loop and a bypass, the primary cooling loop including a reservoir, pump, and heat sink module, and the bypass including a valve.

Figure 12G:
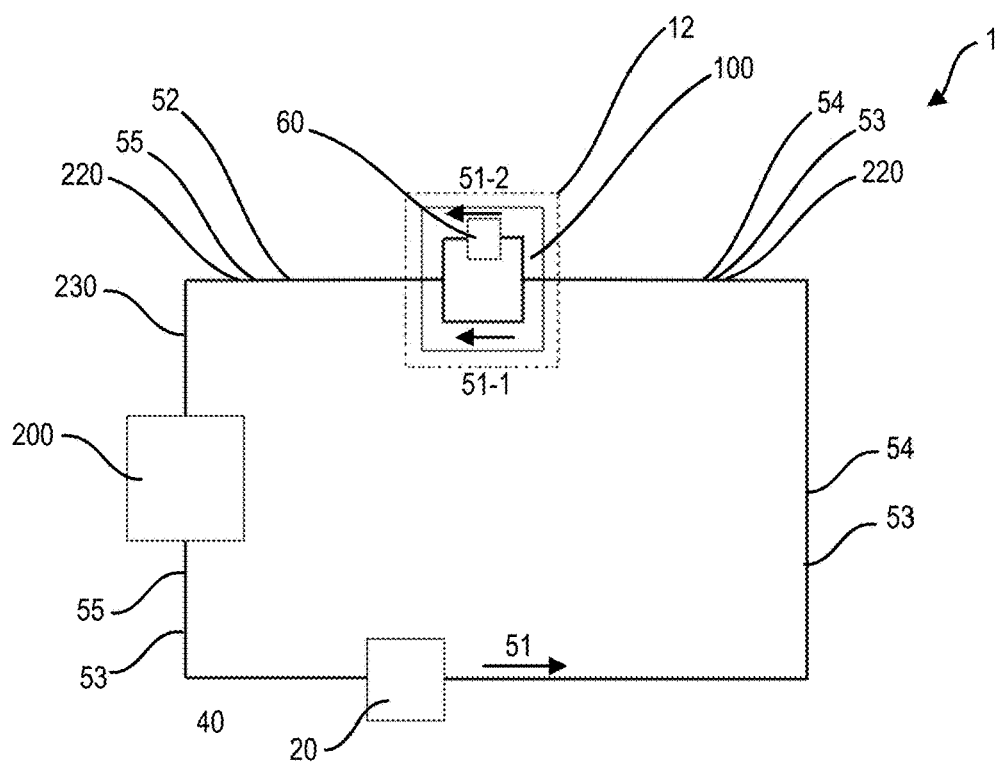

FIG. 12G shows a schematic of a cooling apparatus with a primary cooling loop including a reservoir, a pump, and a heat sink module with an internal bypass containing a valve.

Figure 12H:
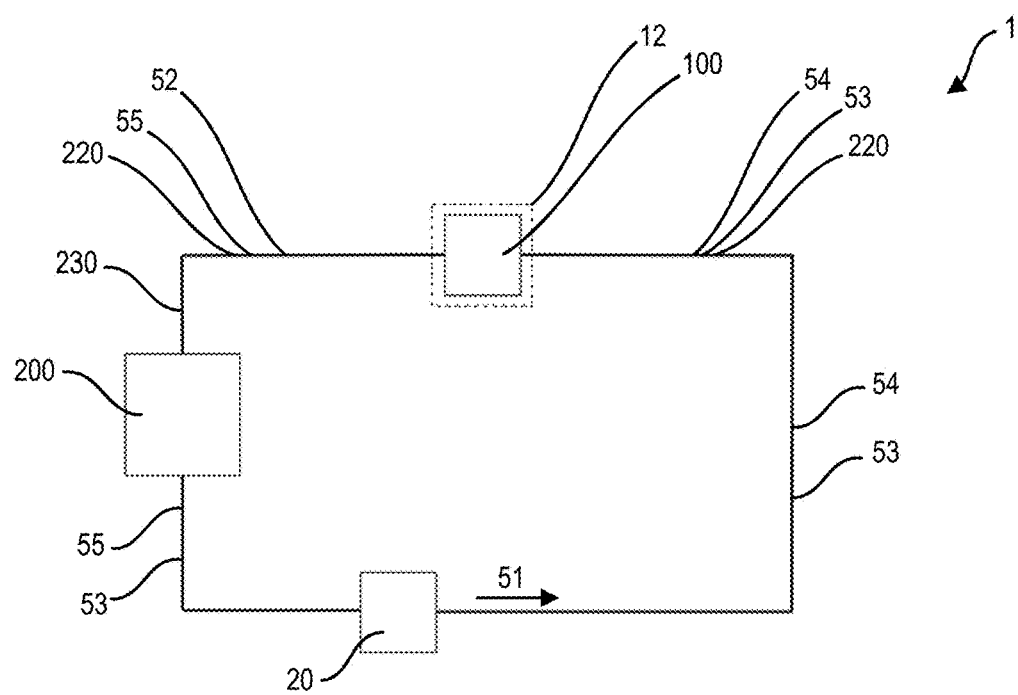

FIG. 12H shows a schematic of a cooling apparatus including a pump, a reservoir, and a heat sink module that is configured to mount on a heat source or be mounted in thermal communication with a heat source.

Figure 12I:
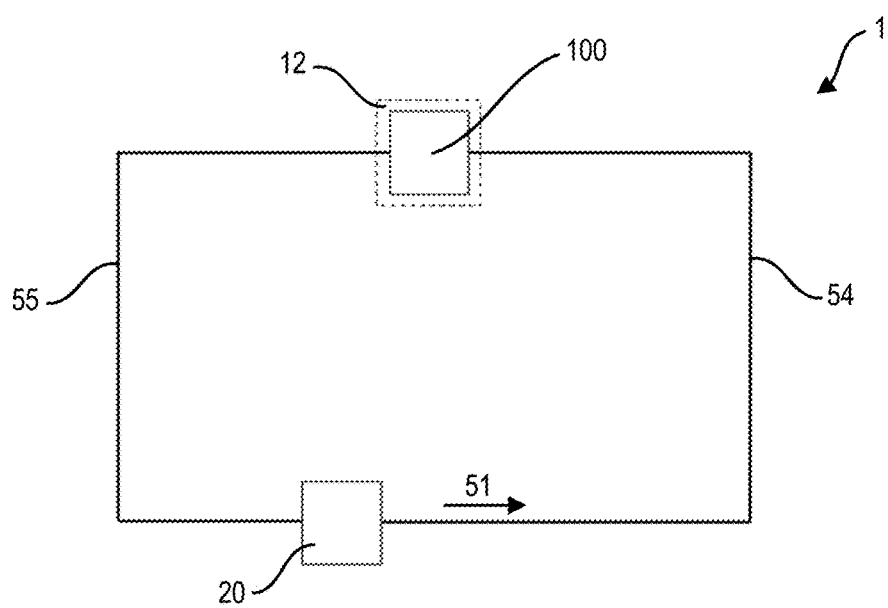

FIG. 12I shows a schematic of a cooling apparatus including a pump, such as a variable speed pump, and a heat sink module configured to mount on a heat source or be mounted in thermal communication with a heat source.

Figure 12J:
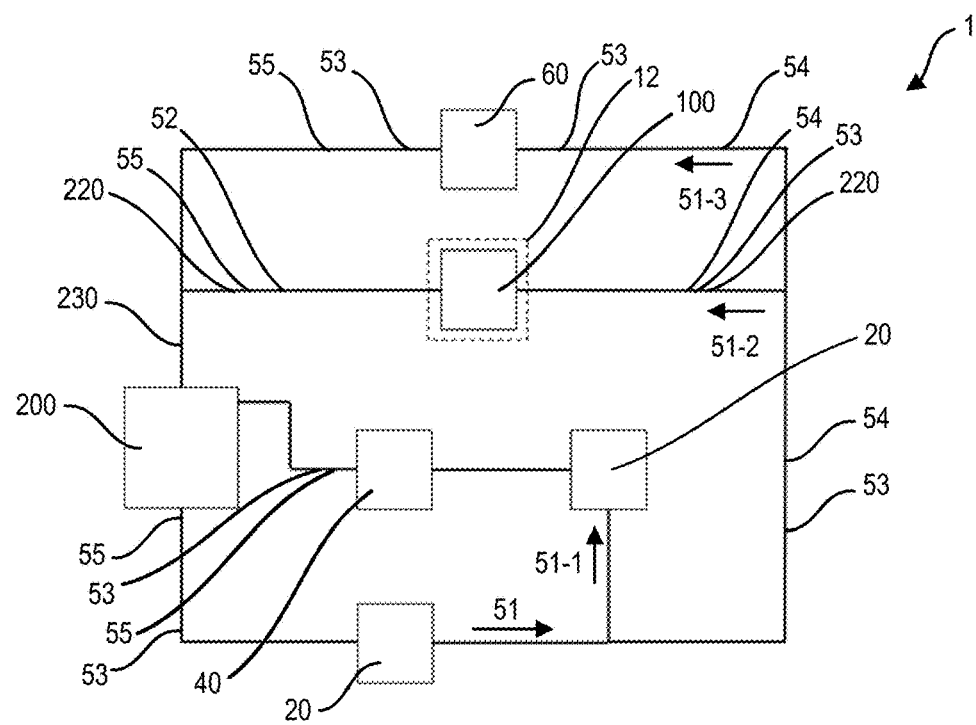

FIG. 12J shows a schematic of a cooling apparatus with a primary cooling loop, a first bypass, and a second bypass, where the primary cooling loop includes a first pump, a reservoir, and a heat sink module mounted on a heat source, the first bypass including a second pump and a heat exchanger, and the second bypass including a valve.

Figure 12K:
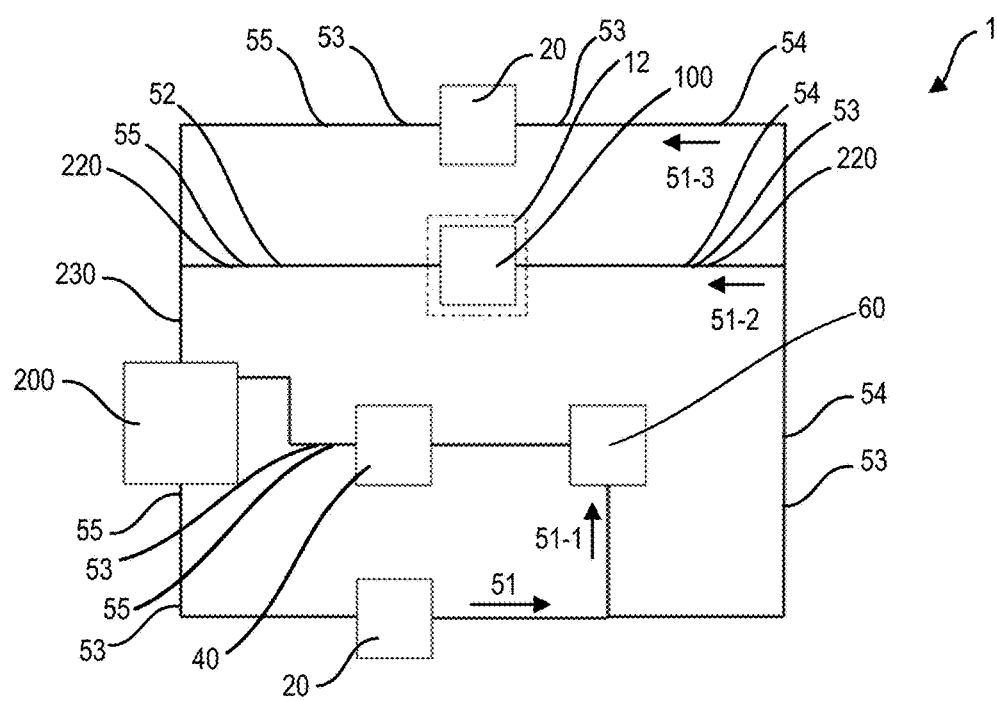

FIG. 12K shows a schematic of a cooling apparatus with a primary cooling loop, a first bypass, and a second bypass, where the primary cooling loop includes a first pump, a reservoir, and a heat sink module mounted on a heat source, the first bypass includes a valve and a heat exchanger, and the second bypass includes a second pump.

Figure 12L:
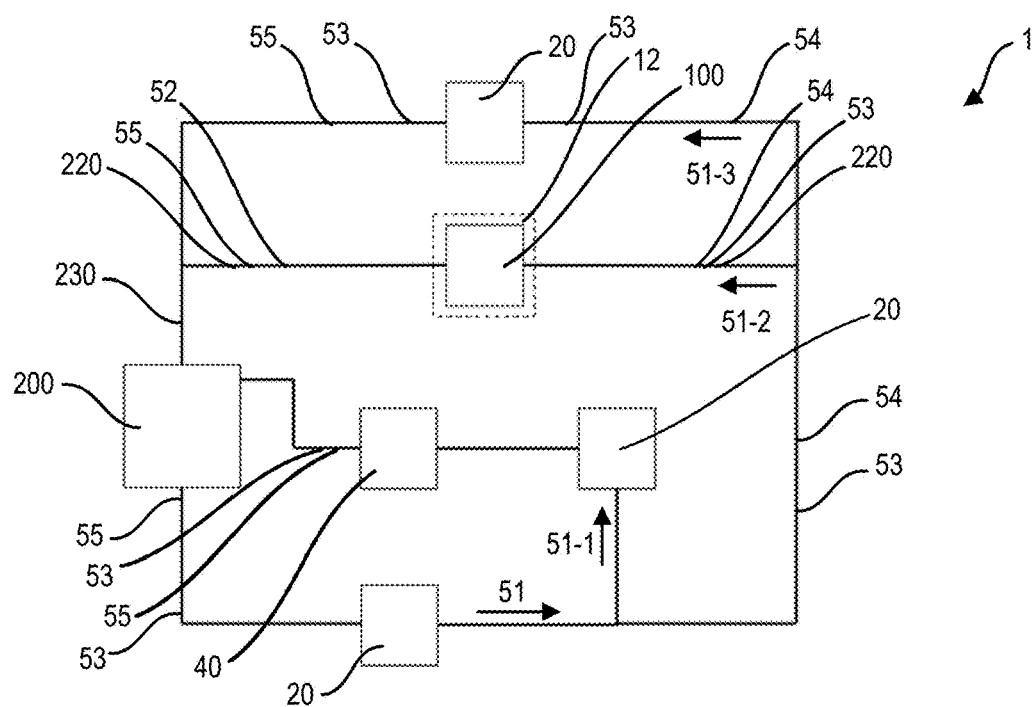

FIG. 12L shows a schematic of a cooling apparatus with a primary cooling loop, a first bypass, and a second bypass, where the primary cooling loop includes a first pump, a reservoir, and a heat sink module mounted on a heat source, the first bypass including a second pump and a heat exchanger, and the second bypass including a third pump.

Figure 12M:
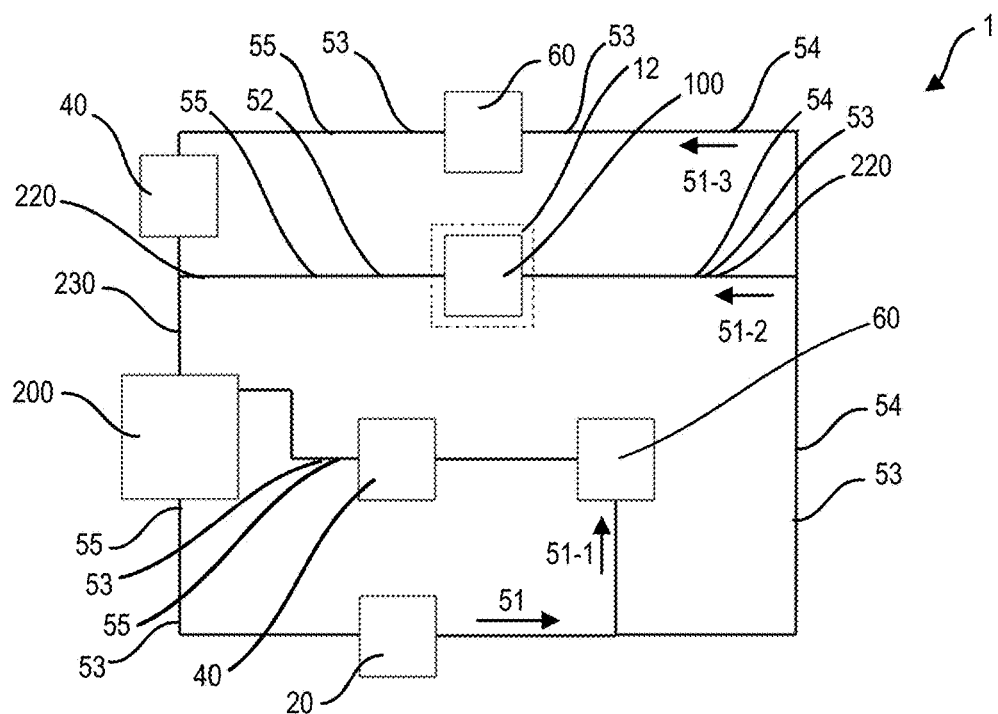

FIG. 12M shows a schematic of a cooling apparatus with a primary cooling loop, a first bypass, and a second bypass, where the primary cooling loop includes a reservoir, a pump, and a heat sink module mounted on a heat source, the first bypass includes a first heat exchanger and a first valve, and the second bypass includes a second heat exchanger and a second valve.

Figure 12N:
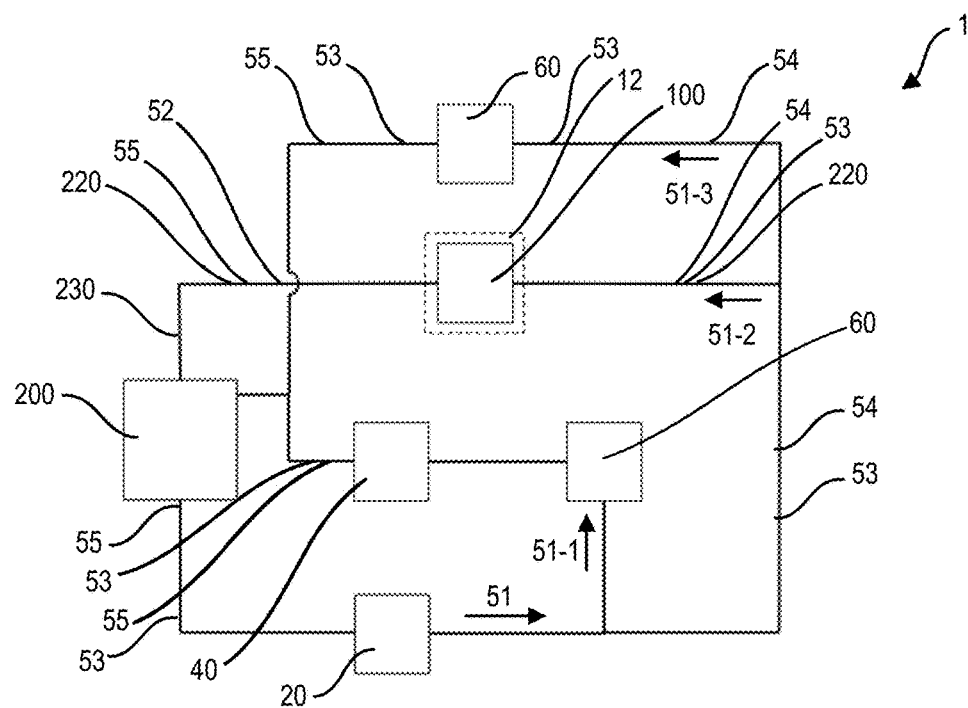

FIG. 12N shows a schematic of a cooling apparatus having a primary cooling loop, a first bypass, and a second bypass, where the primary cooling loop includes a reservoir, a pump, and heat sink module mounted on a heat, source, the first bypass includes first valve and a heat exchanger, the second bypass includes a second vale, and the first bypass and second bypass merge upstream of the reservoir.

Figure 12O:
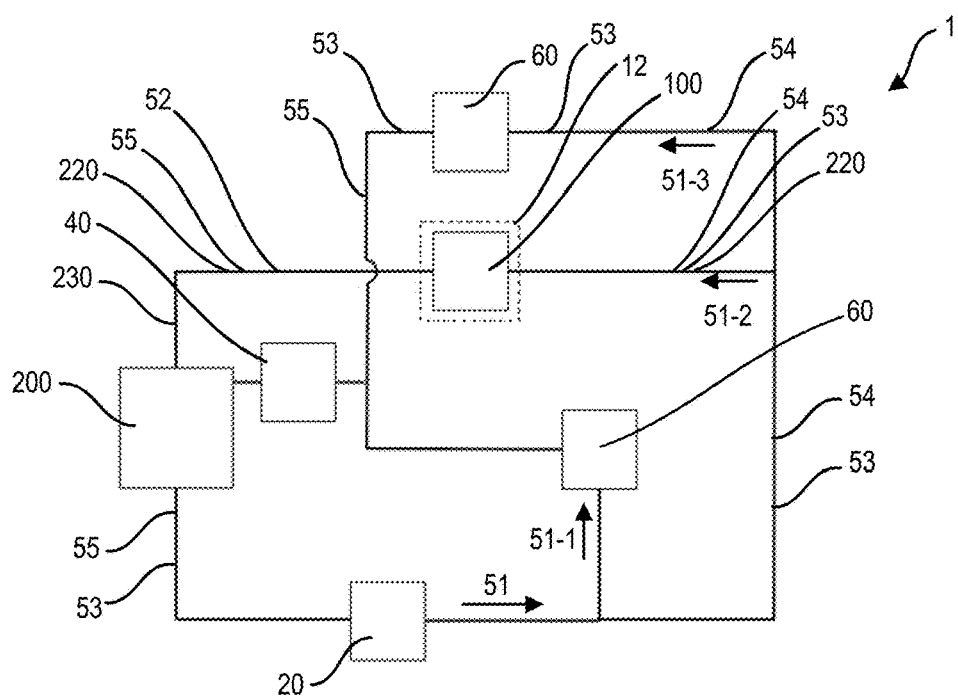

FIG. 12O shows a schematic of a cooling apparatus having a primary cooling loop, a first bypass, and a second bypass, where the primary cooling loop includes a reservoir, a pump, and a heat sink module mounted on a heat source, the first bypass includes a first valve and a heat exchanger, and the second bypass includes a second valve, where the first bypass and second bypass merge upstream of the heat exchanger in the first bypass.

Figure 12P:
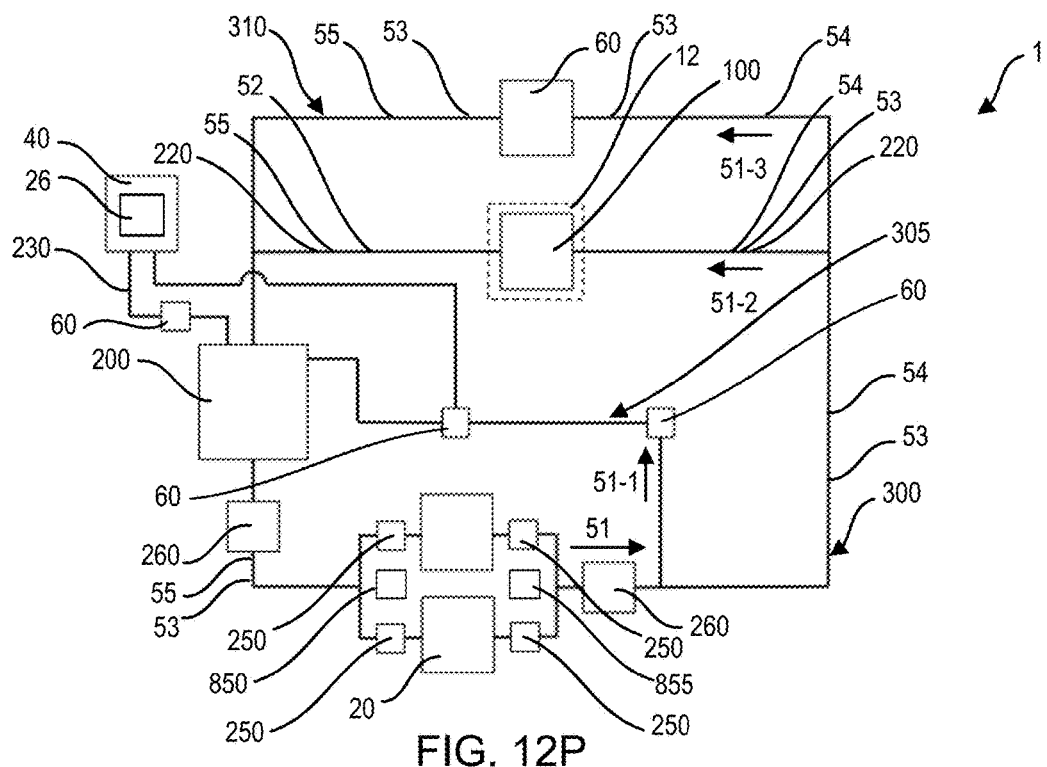

FIG. 12P shows a schematic of a cooling apparatus having a primary cooling loop, a first bypass, and a second bypass, where the primary cooling loop includes a reservoir, redundant parallel pumps with shut-off valves, and a heat sink module mounted on a heat source, the second bypass includes a valve, and the first bypass includes a heat exchanger that can be a dry cooler.

Figure 12Q:
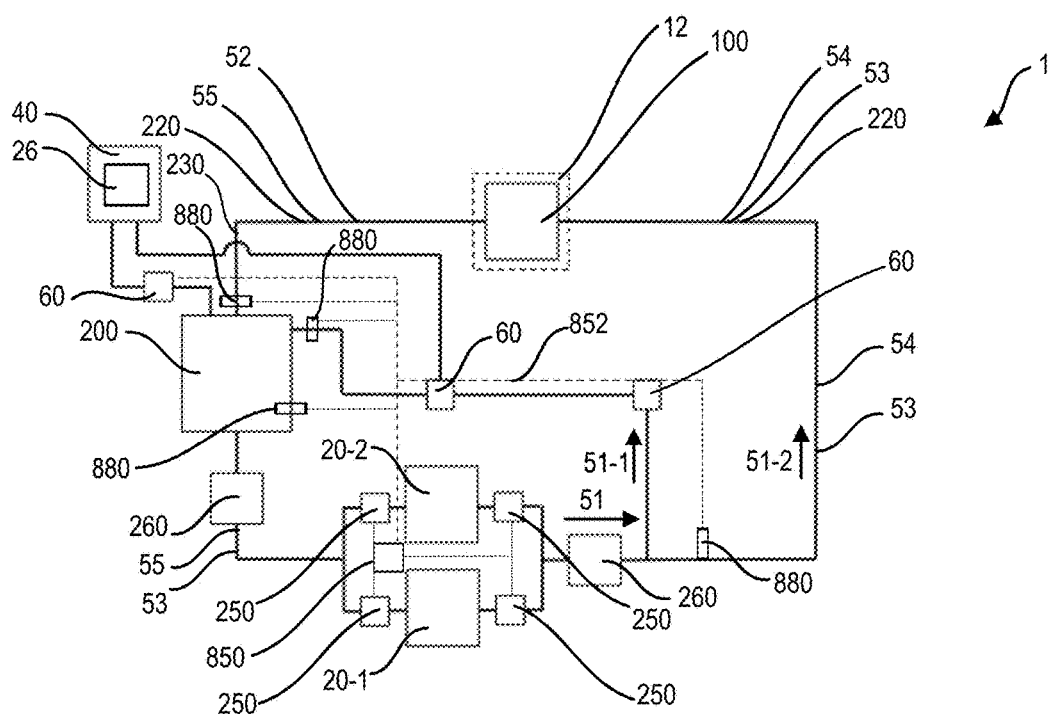

FIG. 12Q shows a schematic of a cooling apparatus having a primary cooling loop, a first bypass, and a second bypass, where the primary cooling loop includes a reservoir, redundant parallel pumps with shut-off valves, and a heat sink module mounted on a heat source, and the first bypass includes a heat exchanger that can be a dry cooler.

Figure 12R:
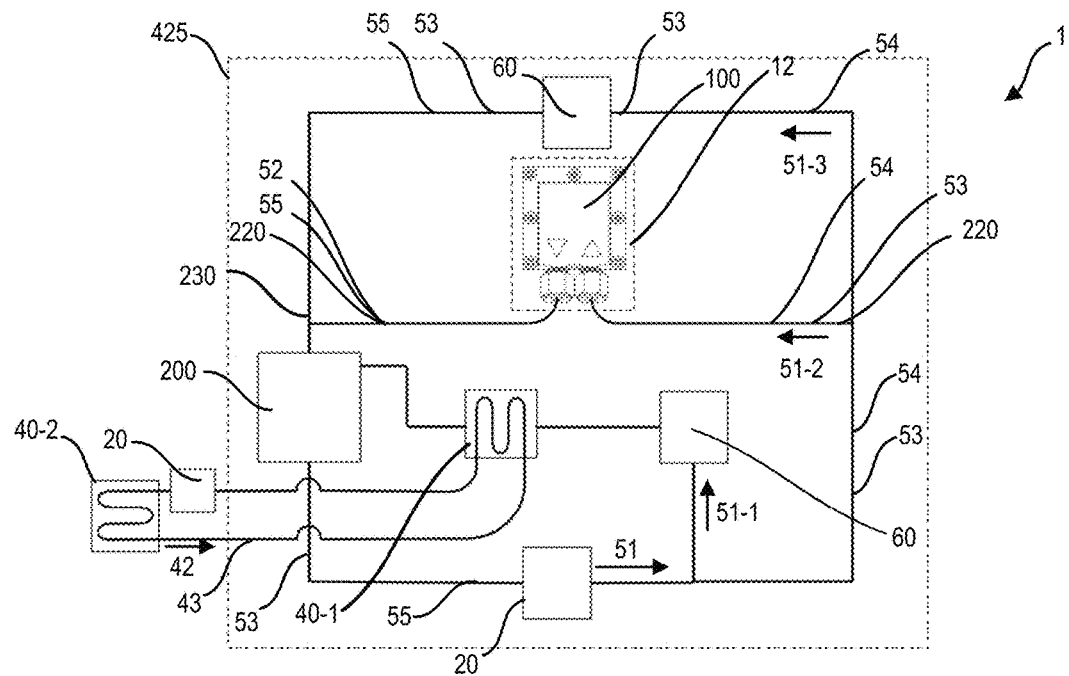

FIG. 12R shows a schematic of a preferred cooling apparatus having a primary cooling loop, a first bypass, and a second bypass, where the first bypass includes a liquid-to-liquid heat exchanger fluidly connected to an external heat exchanger located outside of a room where the cooling apparatus is located, the external heat exchanger being connected to the heat exchanger by an external heat rejection loop having a pump configured to circulate external cooling fluid, such as a water-glycol mixture, through the external heat rejection loop.

Figure 12S:
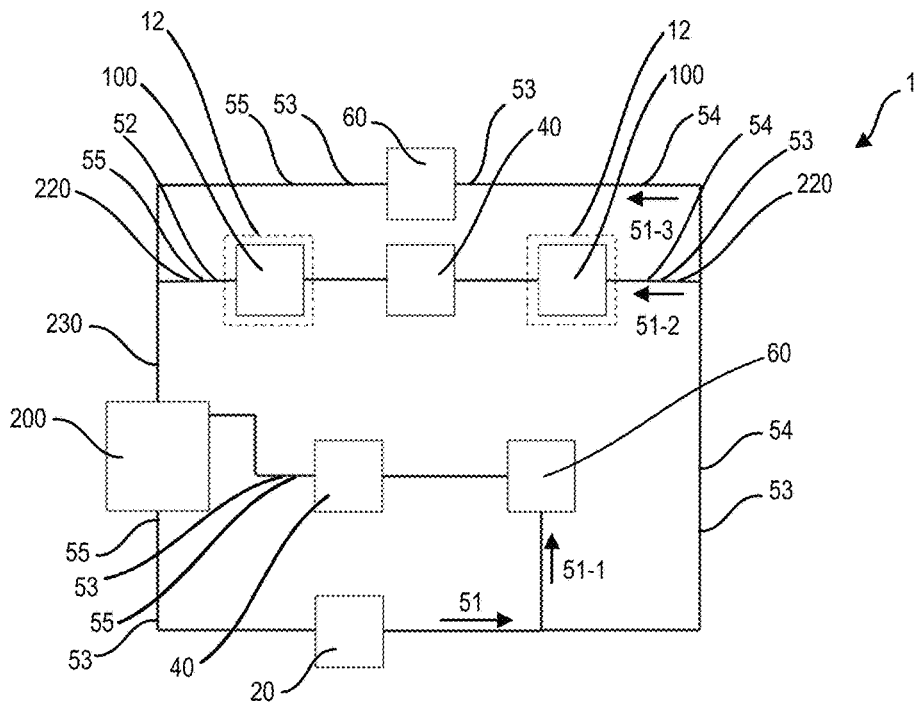

FIG. 12S shows a schematic of a cooling apparatus having a primary cooling loop, a first bypass, and a second bypass, where the first bypass includes a first heat exchanger, and where the primary cooling loop includes two series-connected heat sink modules with a second heat exchanger fluidly connected between the heat sink modules to reduce quality of the flow to avoid formation of slug flow in the primary cooling loop between the series-connected heat sink modules.

Figure 12T:
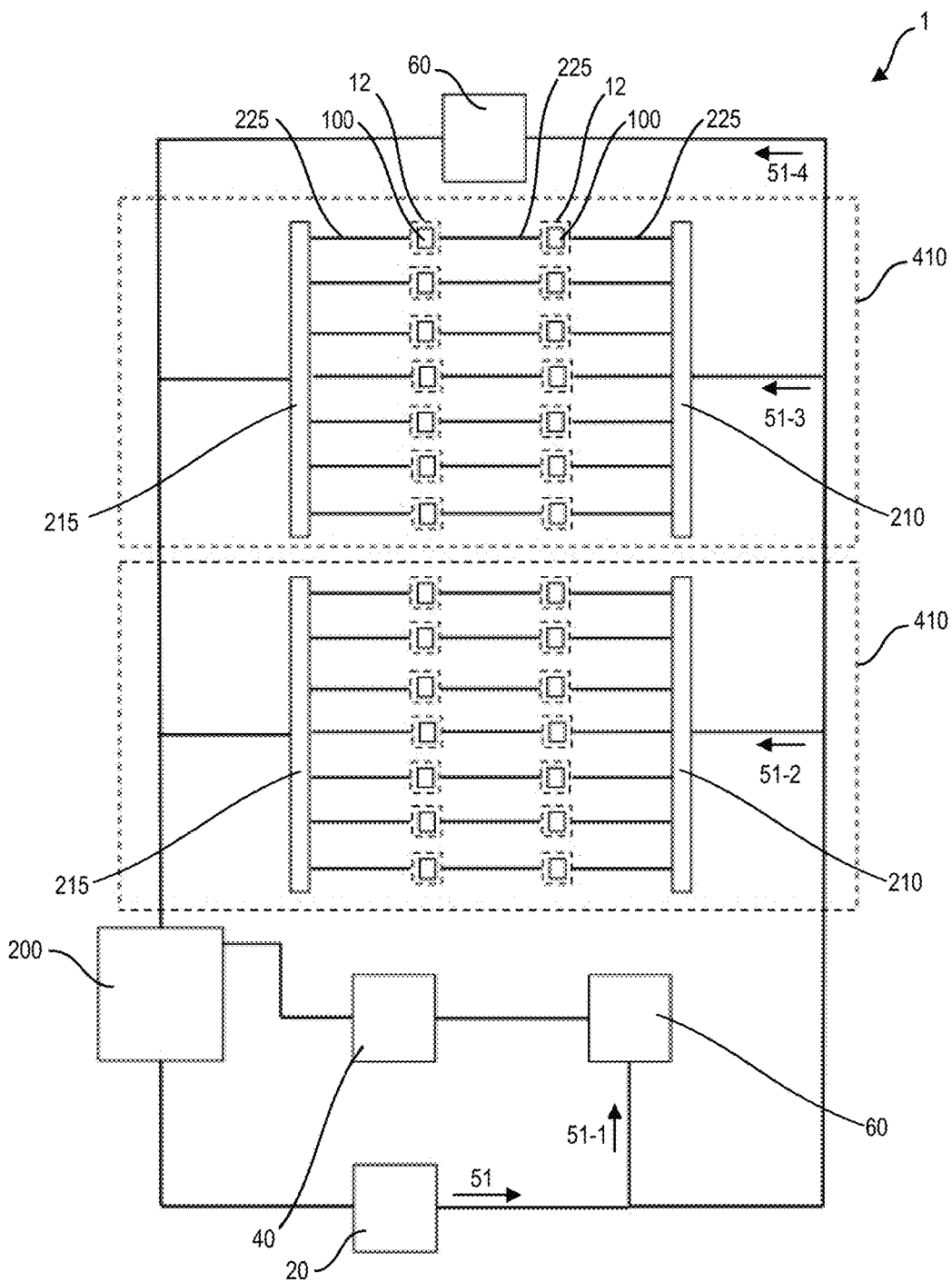

FIG. 12T shows a schematic of a cooling apparatus configured to cool two racks of servers, the cooling apparatus including an inlet manifold and an outlet manifold for each rack of servers, where a plurality of heat sink modules are fluidly connected in series and parallel arrangements between each inlet and outlet manifold to cool processors within the servers.

Figure 13:
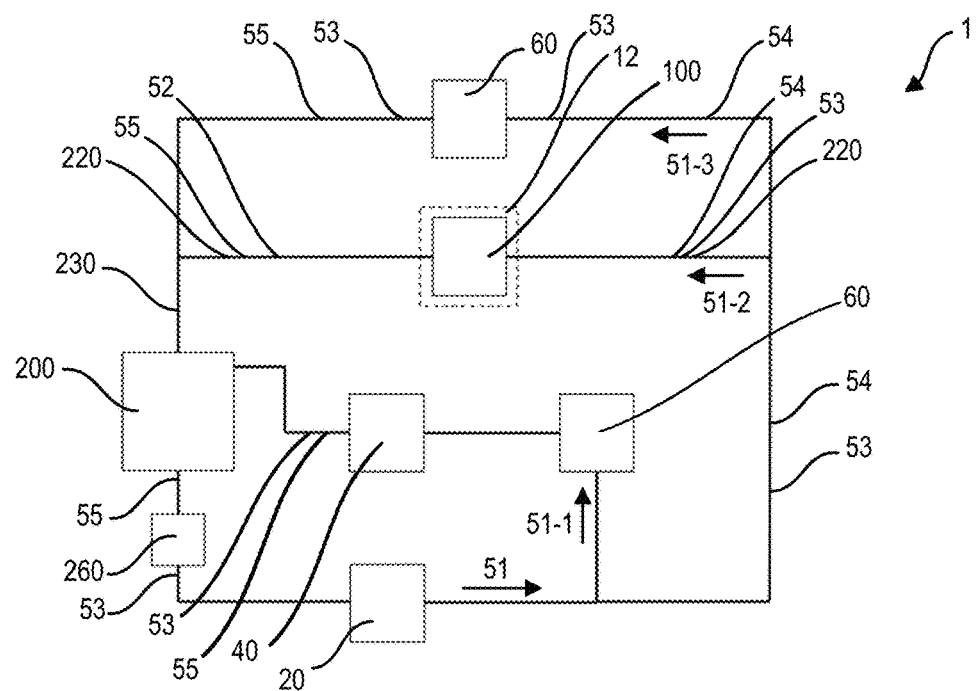

FIG. 13 shows a schematic of a cooling apparatus including a filter located between a reservoir and a pump in a primary cooling loop.

Figure 14A:
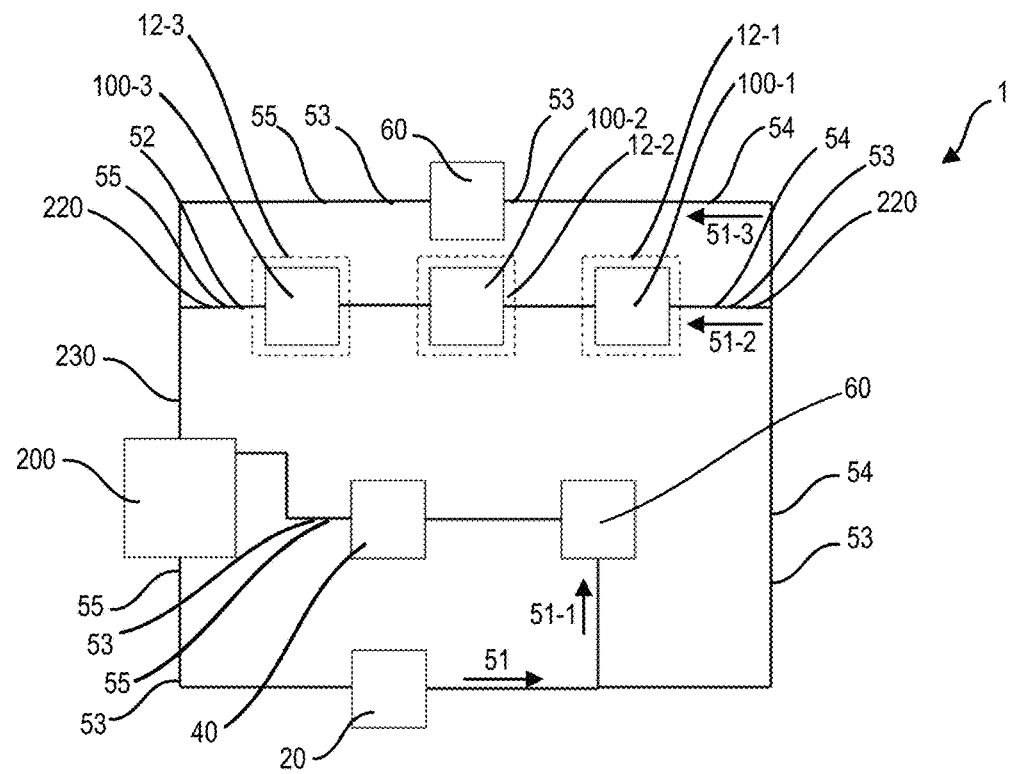

FIG. 14A shows a schematic of a cooling apparatus having a primary cooling loop, a first bypass, and a second bypass, the primary cooling loop including a reservoir, a pump, and three series-connected heat sink modules, the first bypass including a first valve and a heat exchanger, and the second bypass including a second valve.

Figure 14B:
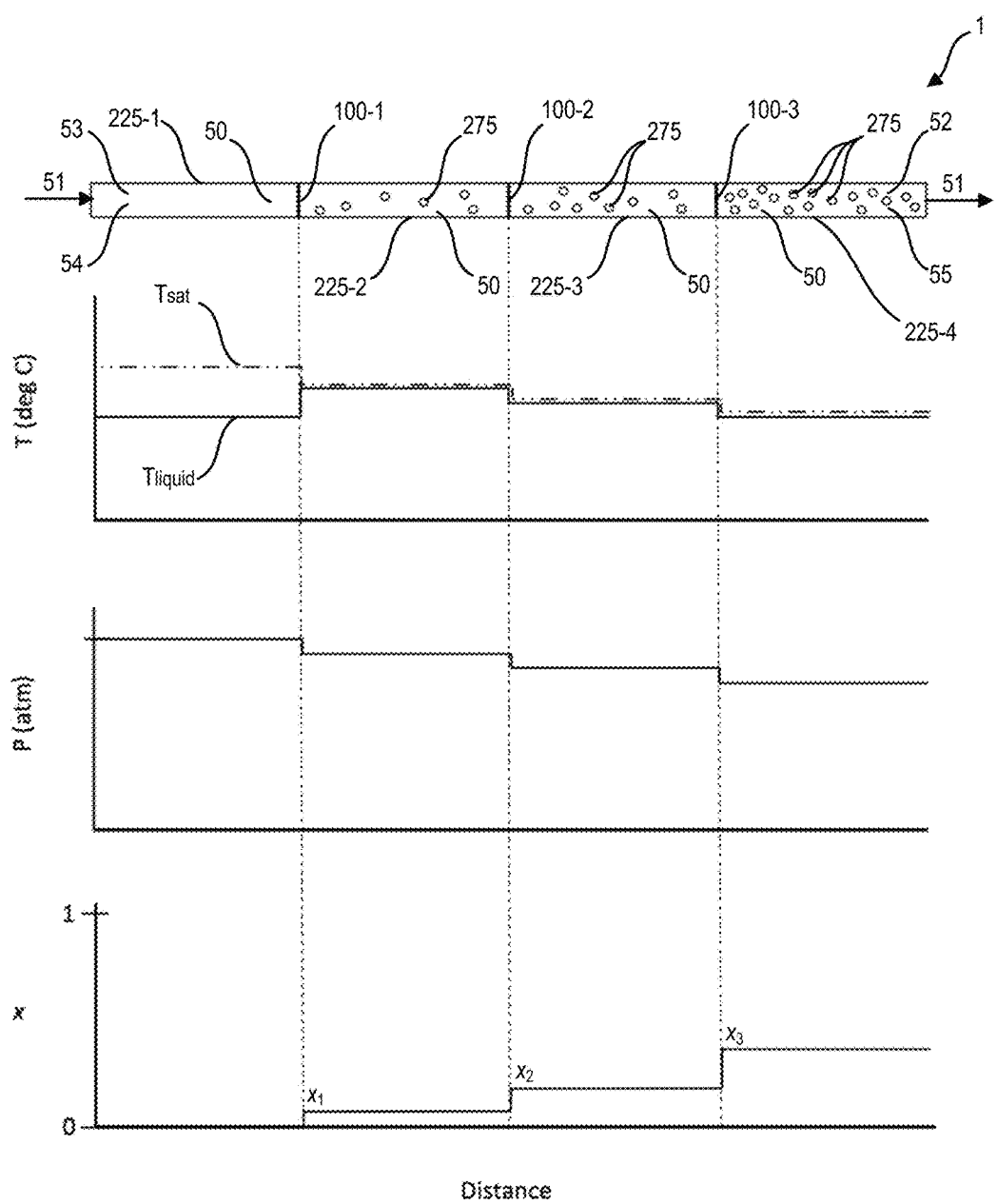
Figure 15:
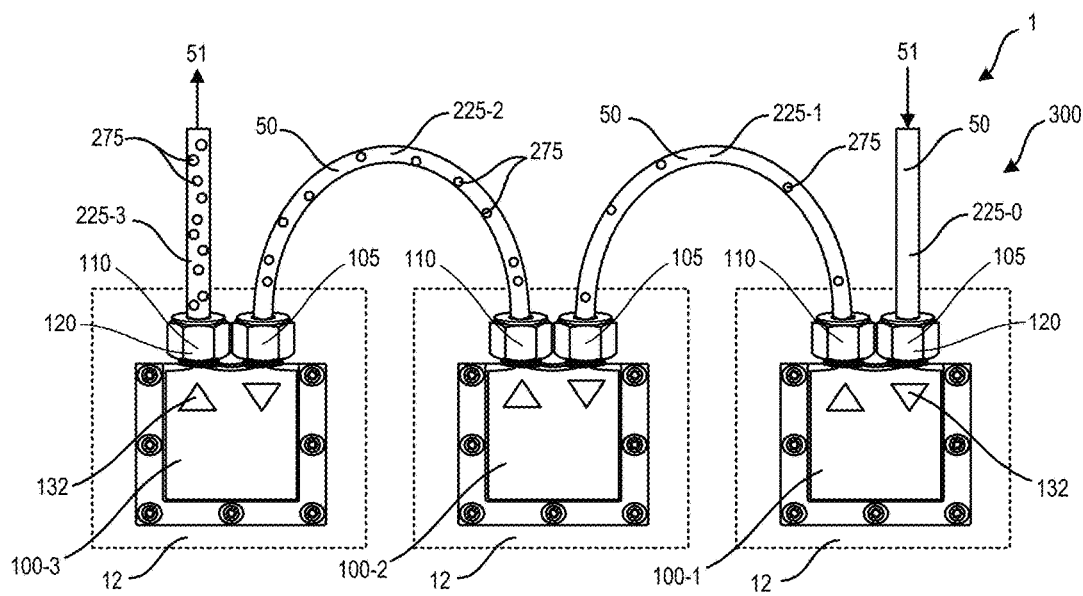

FIG. 14B shows a representation of coolant flowing through three heat sink modules connected in series by lengths of flexible tubing, similar to the configurations shown in FIGS. 14A and 15, and shows corresponding plots of saturation temperature, liquid coolant temperature, pressure, and quality (x) versus distance, where quality increases, pressure decreases, liquid coolant temperature decreases, and $T_{sat}$ decreases through the second and third series-connected heat sink modules.

Figure 14C:
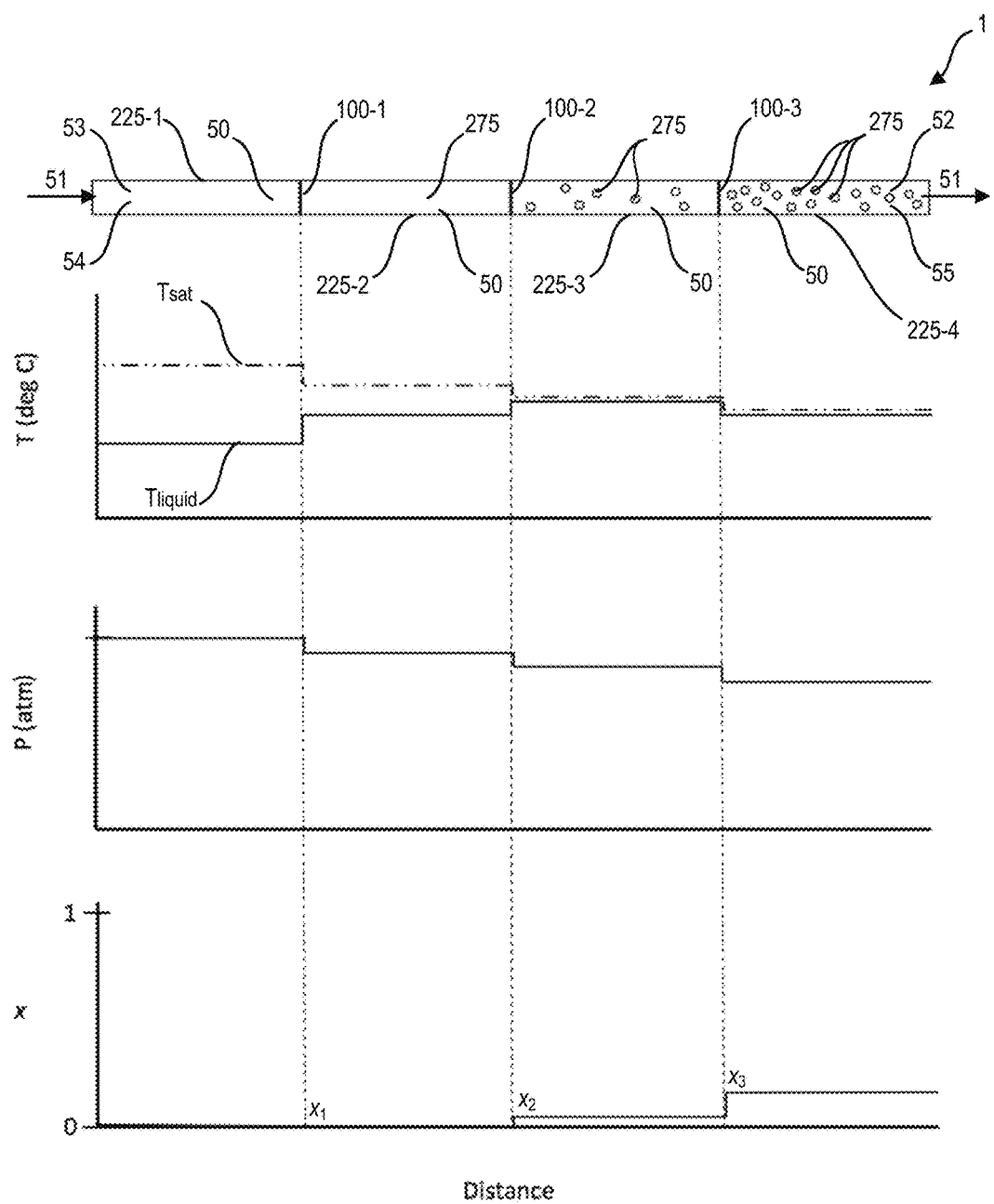

FIG. 14C shows a representation of coolant flowing through three heat sink modules connected in series by lengths of flexible tubing, similar to FIG. 14B, except that the coolant does not reach its saturation temperature until the second heat sink module and is therefore liquid coolant until it transitions to two-phase bubbly flow within the second heat sink module.

FIG. 15 shows a portion of a primary cooling loop of a cooling apparatus, where the cooling loop includes three series-connected heat sink modules mounted on three surfaces to be cooled and connected by sections of flexible, low-pressure tubing where a single-phase liquid coolant is provided to a first heat sink module, and due to heat transfer within the first module, two-phase bubbly flow is transported from the first module to the second module, and due to heat transfer within the second module, higher quality two-phase bubbly flow is transported from the second module to the third module, and due to heat transfer within the third module, even higher quality two-phase bubbly flow is transported out of the third module.

Figure 16:
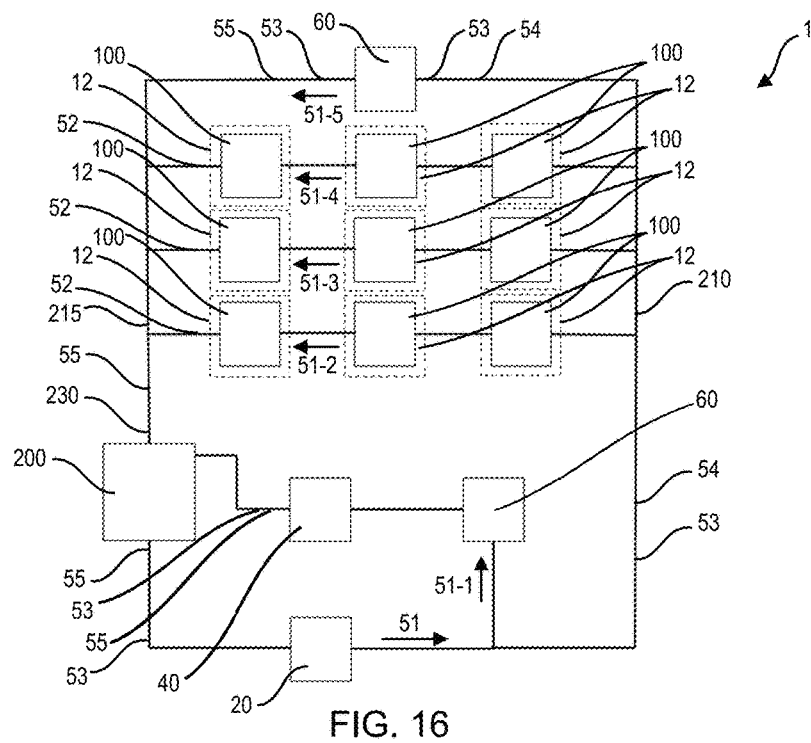

FIG. 16 shows a schematic of a cooling apparatus having a primary cooling loop, a first bypass, and a second bypass, where the primary cooling line includes a reservoir, a pump, and three parallel cooling lines each having three series-connected heat sink modules, the first bypass including a first valve and a heat exchanger, and the second bypass including a second valve.

Figure 17:
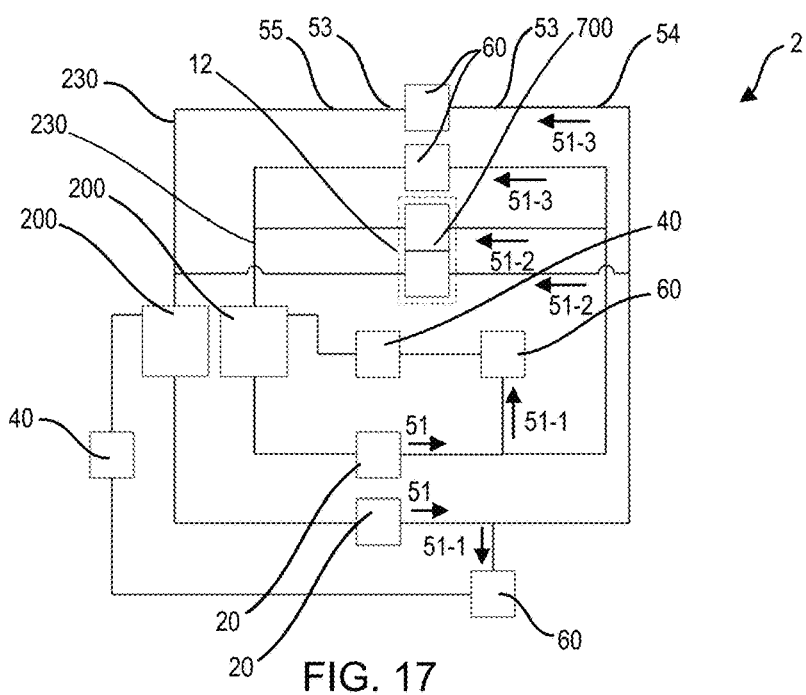

FIG. 17 shows a schematic of a redundant cooling apparatus having a redundant heat sink module mounted on a surface to be cooled, the redundant heat sink module having a first independent coolant pathway fluidly connected to a first independent cooling system similar to the cooling system shown in FIG. 11A and a second independent coolant pathway fluidly connected to a second independent cooling system similar to the cooling system shown in 11A.

Figure 18:
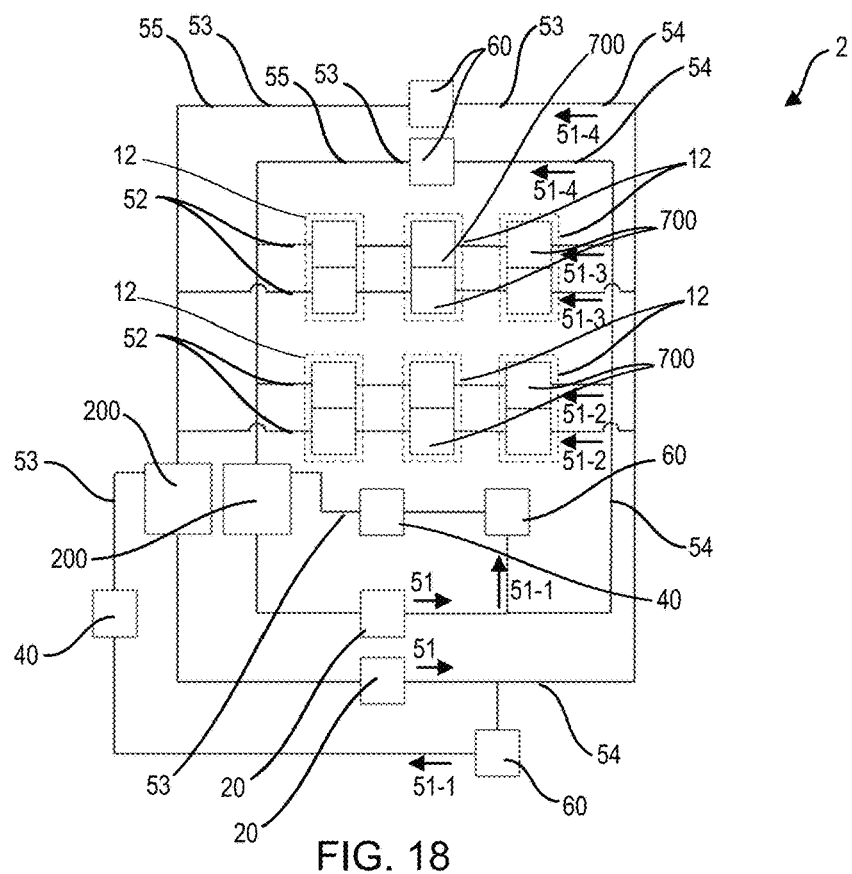

FIG. 18 shows a schematic of a redundant cooling apparatus having a first independent cooling apparatus and a second independent cooling apparatus, where each of the independent cooling apparatuses has two parallel cooling lines each fluidly connected to three series-connected redundant heat sink modules, where each redundant heat sink module has a first independent coolant pathway fluidly connected to the first independent cooling apparatus and a second independent coolant pathway fluidly connected to the second independent cooling apparatus.

Figure 19:
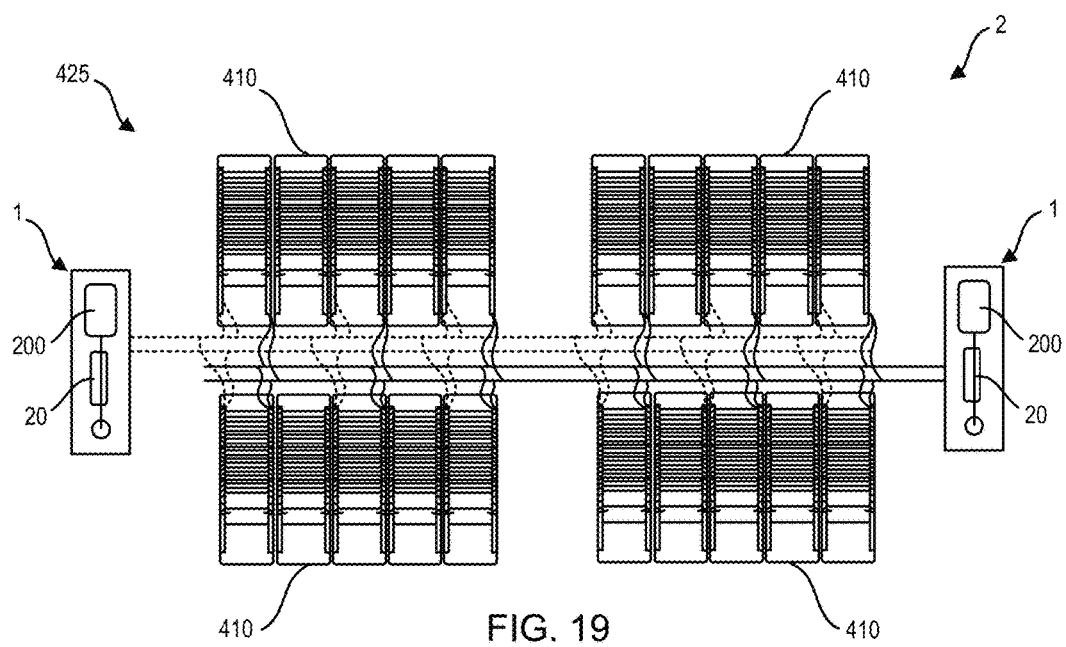

FIG. 19 shows a top view of a redundant cooling apparatus installed in a data center having twenty racks of servers, the redundant cooling system having a first independent cooling apparatus and a second independent cooling apparatus, both connected to heat exchangers located inside of the room where the servers are located, the fluid distribution tubing of the first independent cooling apparatus depicted with dashed lines and the fluid distribution tubing of the second independent cooling apparatus depicted with solid lines.

Figure 20:
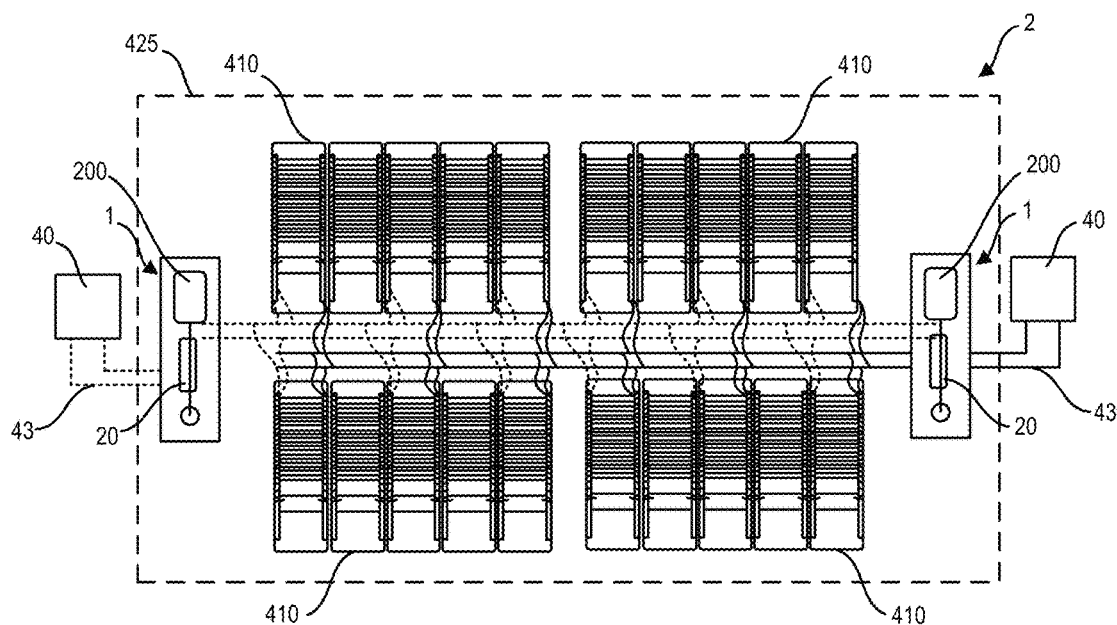

FIG. 20 shows a top view of a redundant cooling apparatus installed in a data center having twenty racks of servers, the redundant cooling system having a first independent cooling apparatus and a second independent cooling apparatus, both connected to heat exchangers located outside of the room where the data center is located, the fluid distribution tubing of the first independent cooling apparatus depicted with dashed lines and the fluid distribution tubing of the second independent cooling apparatus depicted with solid lines.

Figure 21:
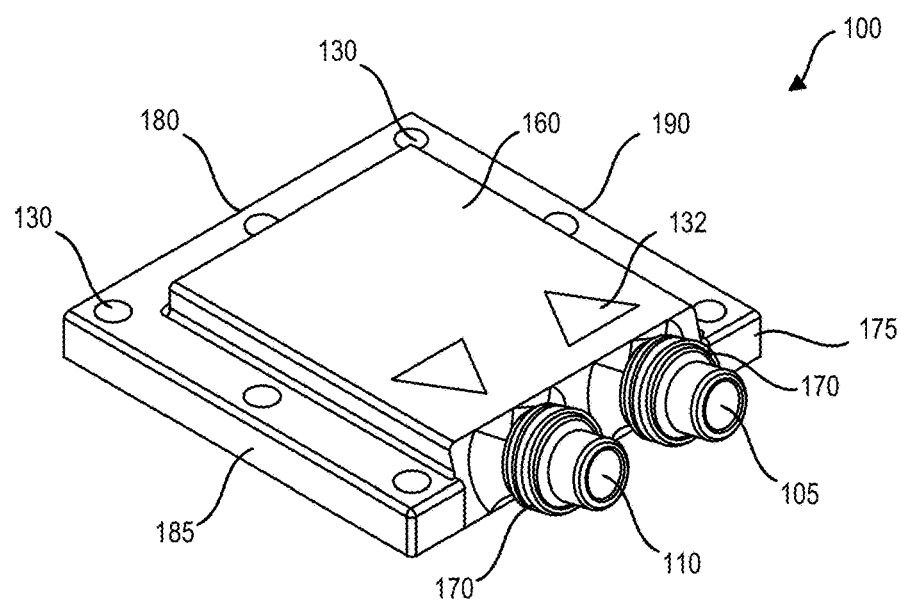

FIG. 21 shows a top perspective view of a compact heat sink module for cooling a heat source, the heat sink module having an inlet port and an outlet port.

Figure 22:
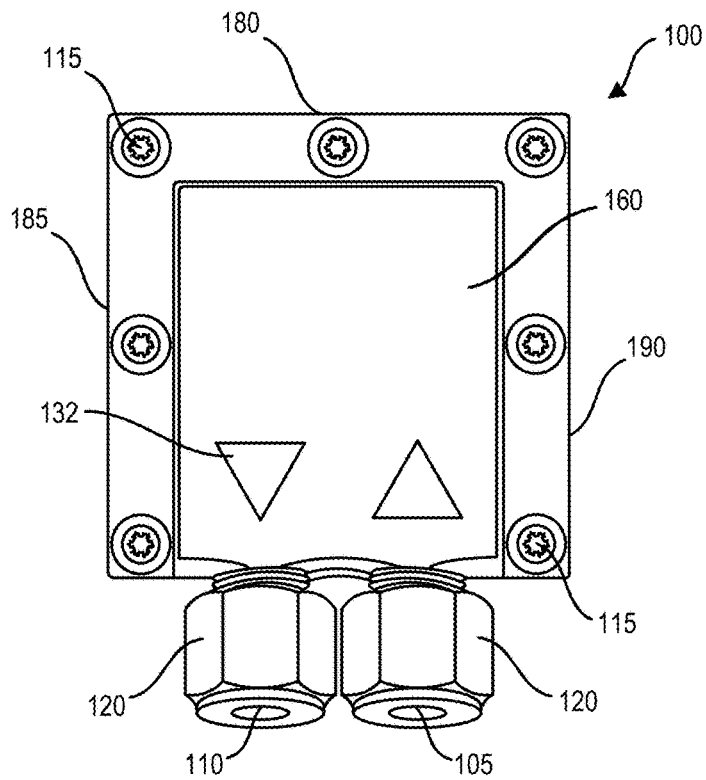

FIG. 22 shows a top view of a heat sink module in FIG. 21, the heat sink module further including a first compression fitting installed on an inlet port of the heat sink module, a second compression fitting installed on an outlet port of the heat sink module, and a plurality of fasteners arranged near a perimeter of the heat sink module according to a mounting hole pattern for affixing the heat sink module to a heat-providing surface.

Figure 23:
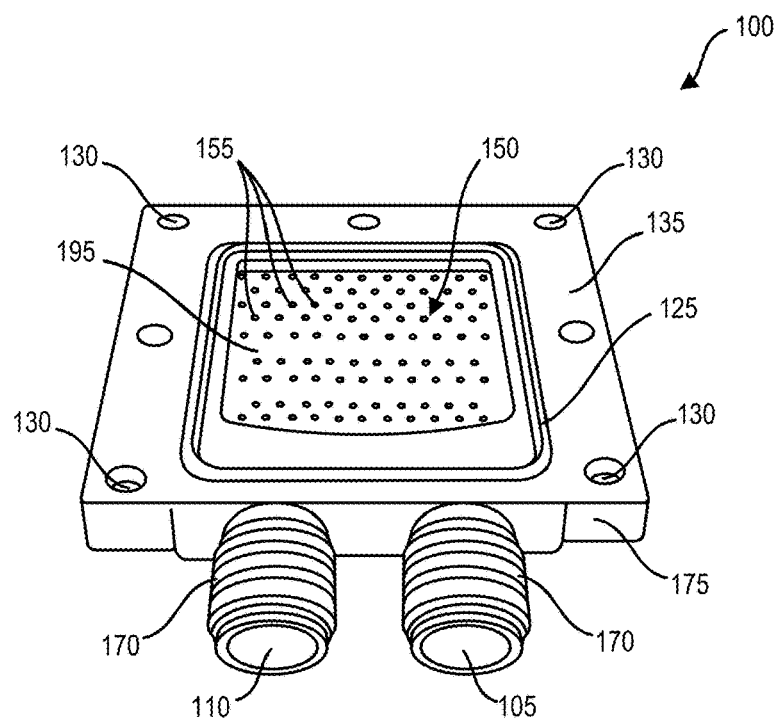

FIG. 23 shows a bottom perspective view of the heat sink module of FIG. 21 showing an inlet port, outlet port, outlet chamber, mounting holes, dividing member, and a plurality of orifices in the dividing member, as well as a sealing member installed within a continuous channel circumscribing the outlet chamber of the heat sink module.

Figure 24:
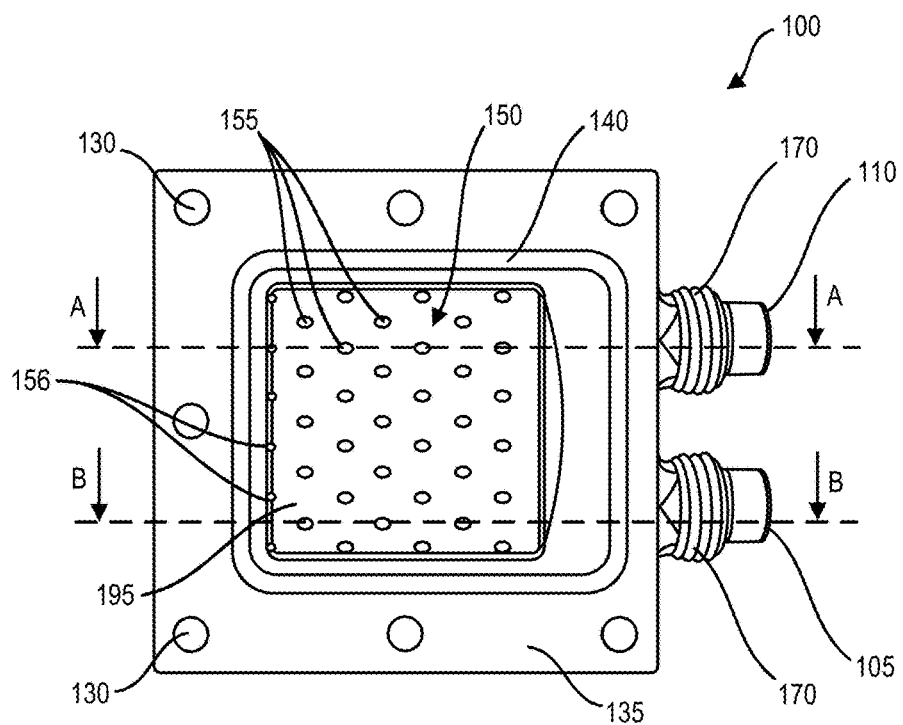

FIG. 24 shows a bottom view of the heat sink module of FIG. 21 showing an array of orifices having staggered columns and staggered rows to prevent flow stagnation regions on a surface to be cooled.

Figure 25:
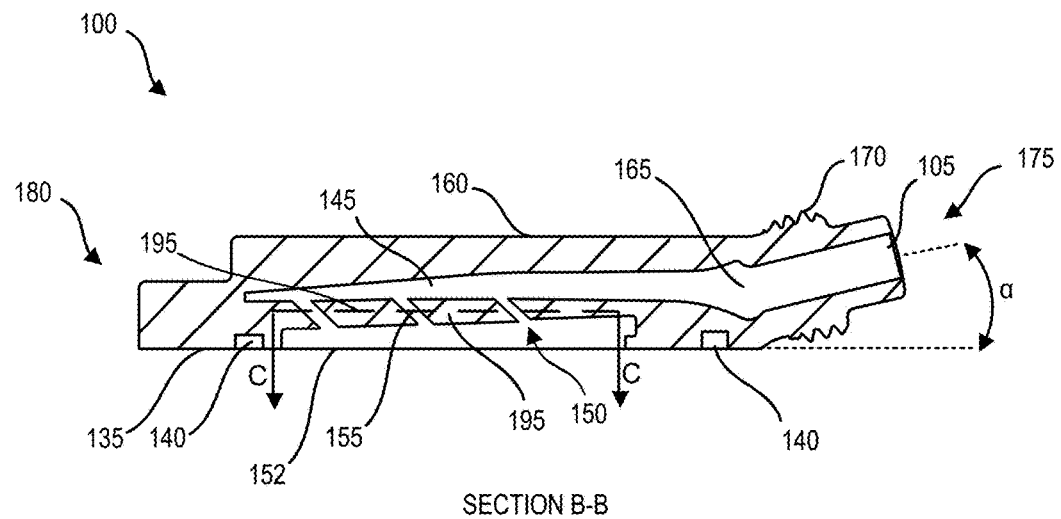

FIG. 25 shows a side cross-sectional view of the heat sink module of FIG. 24 taken along section B-B and showing an inlet port, an inlet passage, an inlet chamber, a plurality of orifices, a dividing member, and an outlet chamber within the heat sink module.

Figure 26:
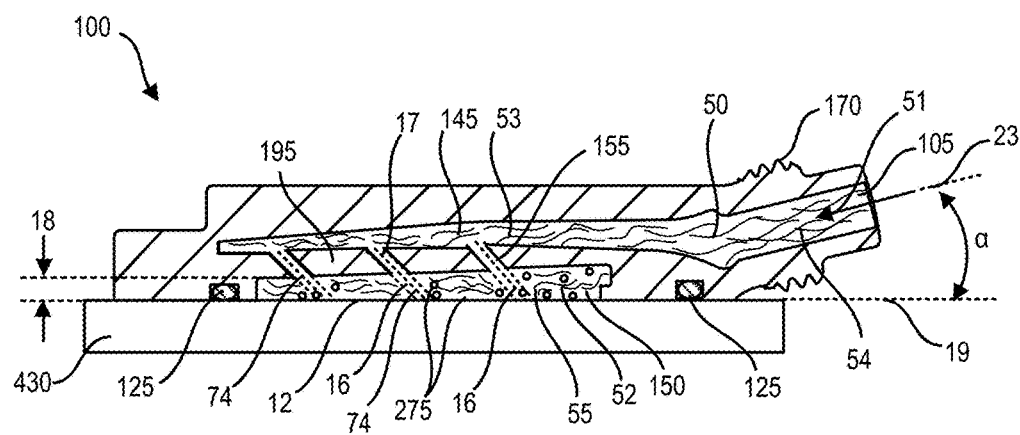

FIG. 26 shows a side cross-sectional view of the heat sink module of FIG. 24 taken along section B-B with the heat sink module mounted on a thermally conductive base member and showing central axes of several orifices, jet heights, and bubble formation within the outlet chamber proximate the surface to be cooled of the thermally conductive base member where a portion of the liquid coolant changes to vapor.

Figure 27:
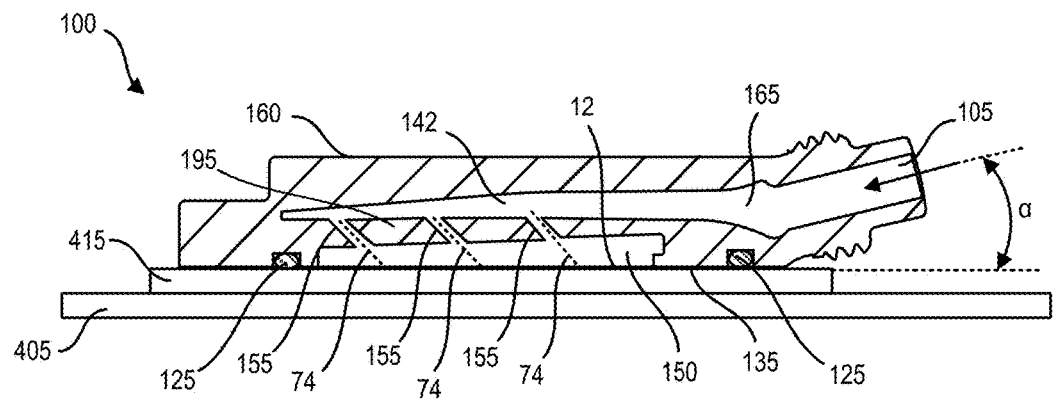

FIG. 27 shows a side cross-sectional view of the heat sink module of FIG. 24 taken along section B-B with the heat sink module mounted directly on a computer processor located on a motherboard and showing central axes of several orifices, the heat sink module capable of mounting directly on a lid of a processor and providing impinging jet streams of coolant against the lid or mounting directly on a processor without a lid and providing direct-to-silicon cooling where jet streams of coolant impinge a silicon surface of the processor.

Figure 28:
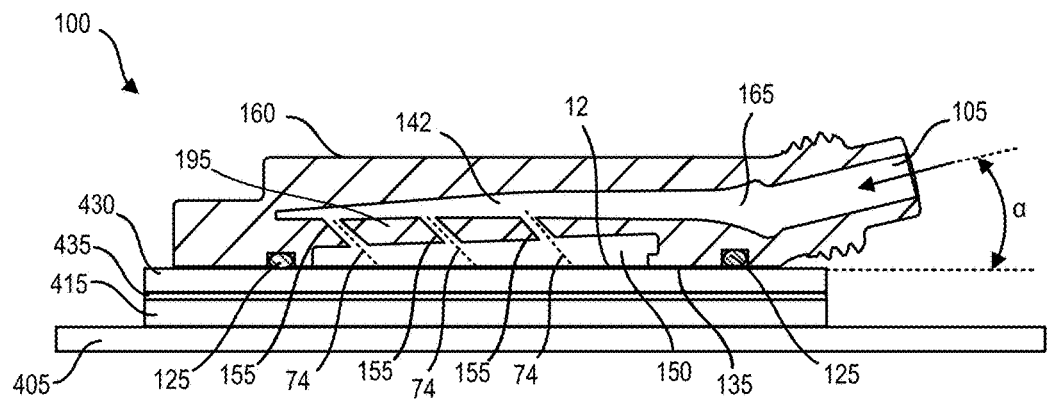

FIG. 28 shows a side cross-sectional view of the heat sink module of FIG. 24 taken along section B-B with the heat sink module mounted on a thermally conductive base member that is bonded to a processor by a layer of thermal interface material, the microprocessor being electrically connected to a motherboard.

Figure 29:
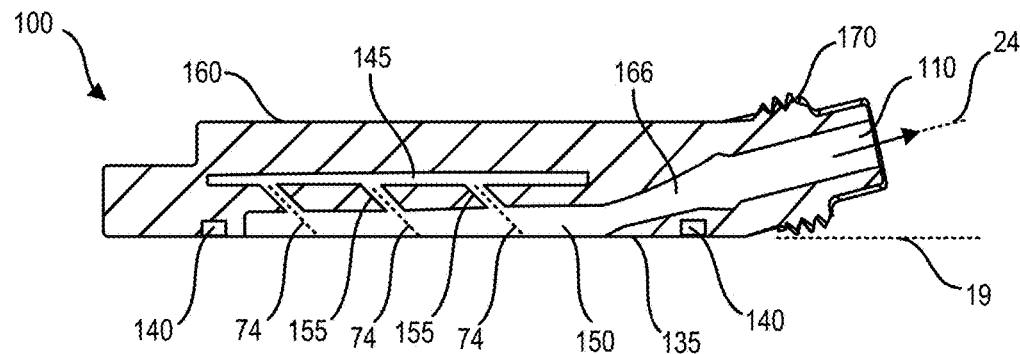

FIG. 29 shows a side cross-sectional view of the heat sink module of FIG. 24 taken along section A-A and showing an outlet port, an outlet passage, an outlet chamber, a dividing member, and a plurality of orifices within the heat sink module.

Figure 30:
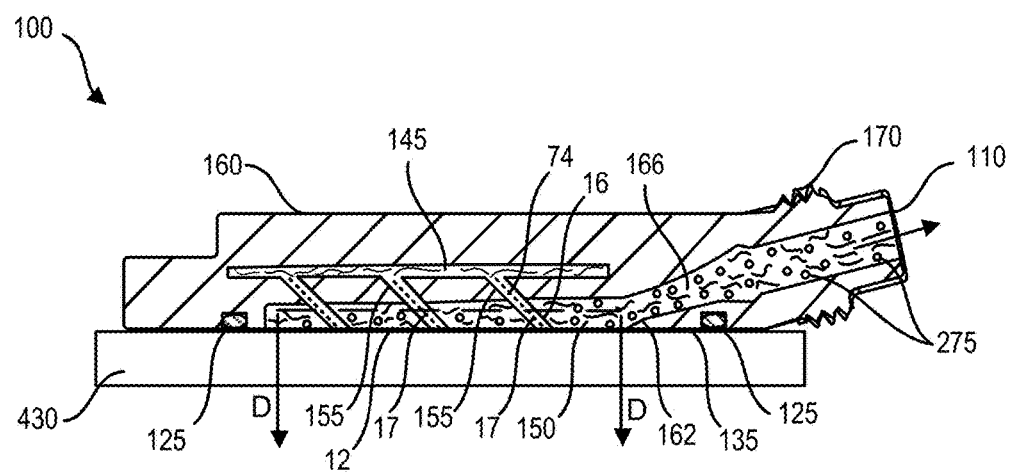

FIG. 30 shows a side cross-sectional view of the heat sink module of FIG. 24 taken along section A-A, with the heat sink module mounted on a thermally conductive base member and sealed by a sealing member, the figure showing bubbles forming within the outlet chamber proximate a heated surface of the conductive base member where a portion of the coolant changes from liquid phase to vapor phase upon interacting with the heated surface thereby forming two-phase bubbly flow, which exits the heat sink module through the outlet port.

Figure 31:
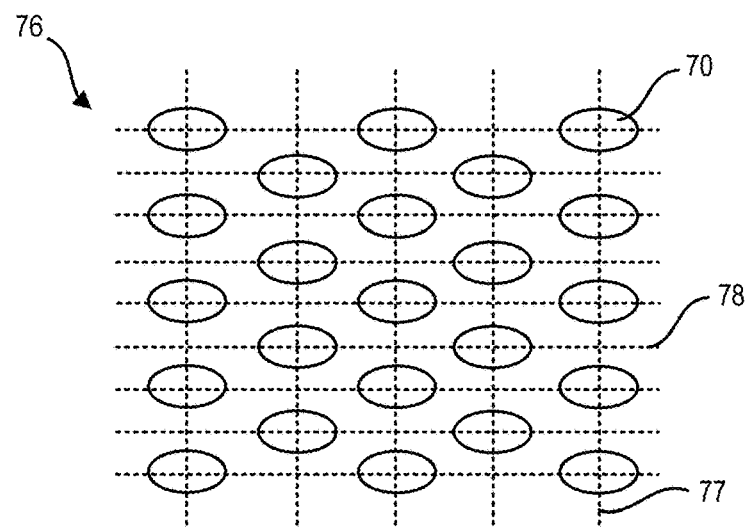

FIG. 31 shows a cross-sectional top view of the heat sink module of FIG. 21 taken along section C-C shown in FIG. 25, the cross-section passing horizontally through the dividing member of the heat sink module to expose an array of orifices within the heat sink module, the orifices in the array being arranged according to staggered columns and staggered rows to prevent flow stagnation regions on a surface to be cooled.

Figure 32:
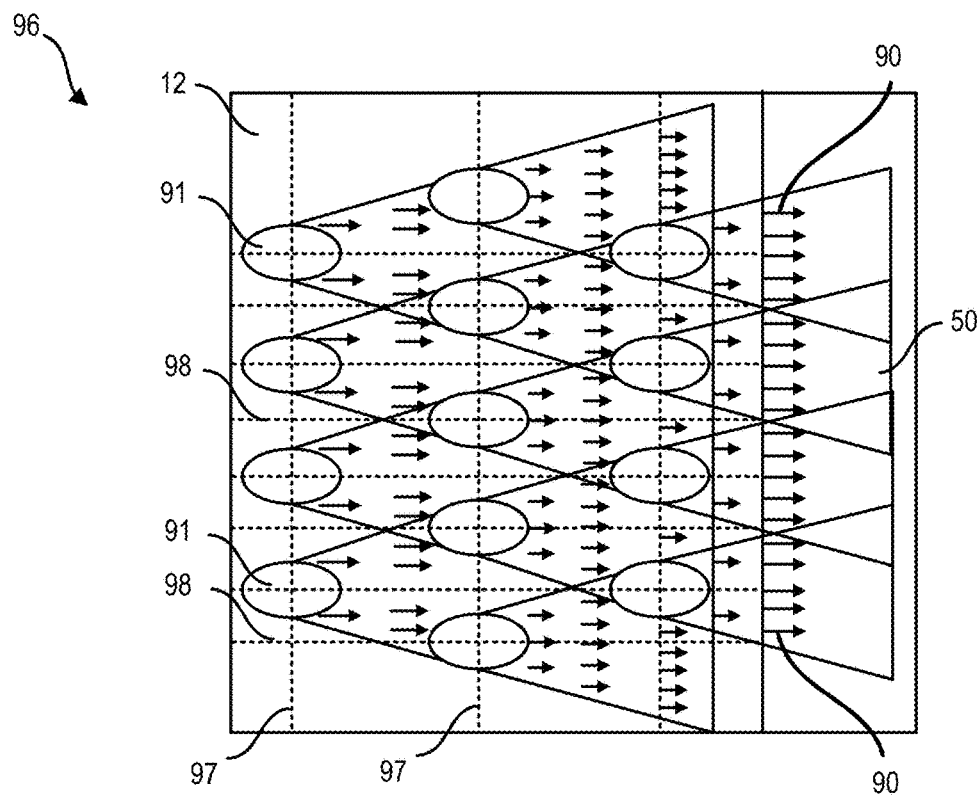

FIG. 32 shows a top view of a surface to be cooled within an outlet chamber of a heat sink module of FIG. 21 taken along section D-D shown in FIG. 30, where an array of jet streams originating from the array of orifices in the heat sink module are impinging non-perpendicularly on the surface to be cooled, thereby creating a directional flow of coolant from left to right across the surface to be cooled, the directional flow filling the outlet chamber and traveling toward and exiting from an outlet port of the heat sink module.

Figure 33:
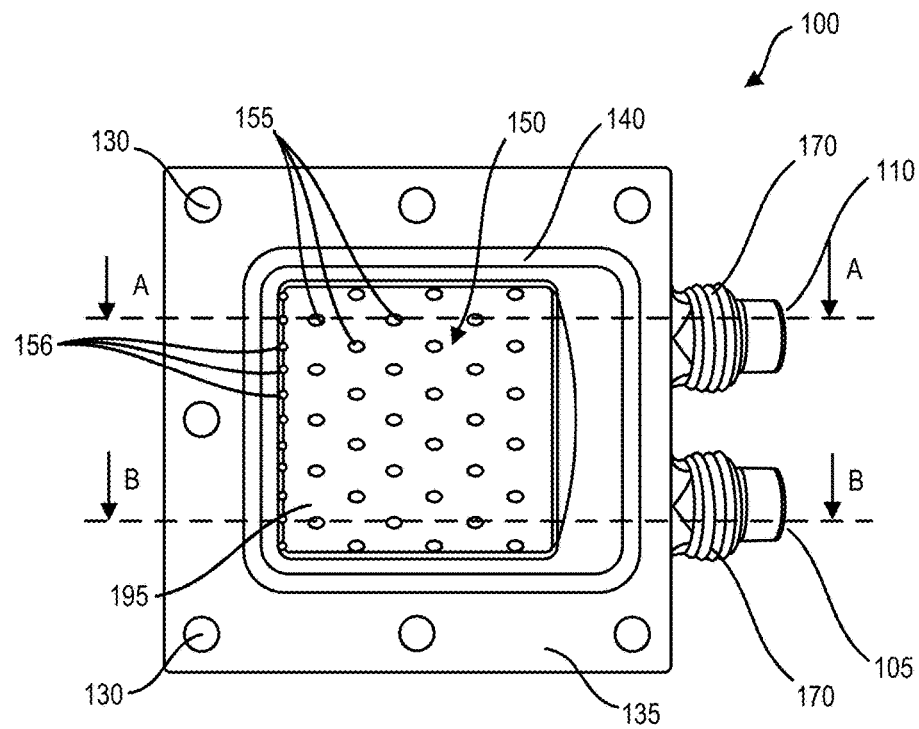

FIG. 33 shows a bottom view of a heat sink module having a first plurality of orifices and a second plurality of orifices, the second plurality of orifices being configured to deliver a plurality of anti-pooling jet streams into the outlet chamber to promote directional flow within the outlet chamber and to prevent pooling on the surface to be cooled near a rear wall of the outlet chamber.

Figure 34:
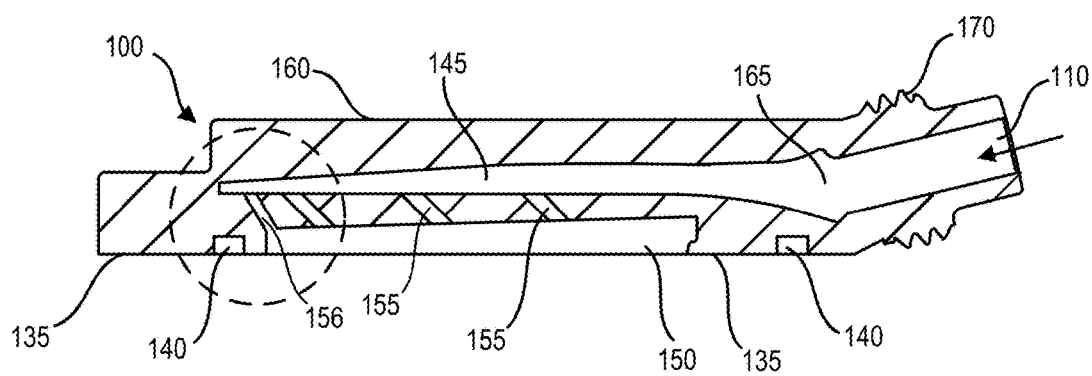

FIG. 34 shows a side cross-sectional view of the heat sink module of FIG. 33 taken along section B-B, the side view showing an inlet port, an inlet passage, an inlet chamber, a plurality of orifices, an outlet chamber, and an anti-pooling orifice within the heat sink module.

Figure 35:
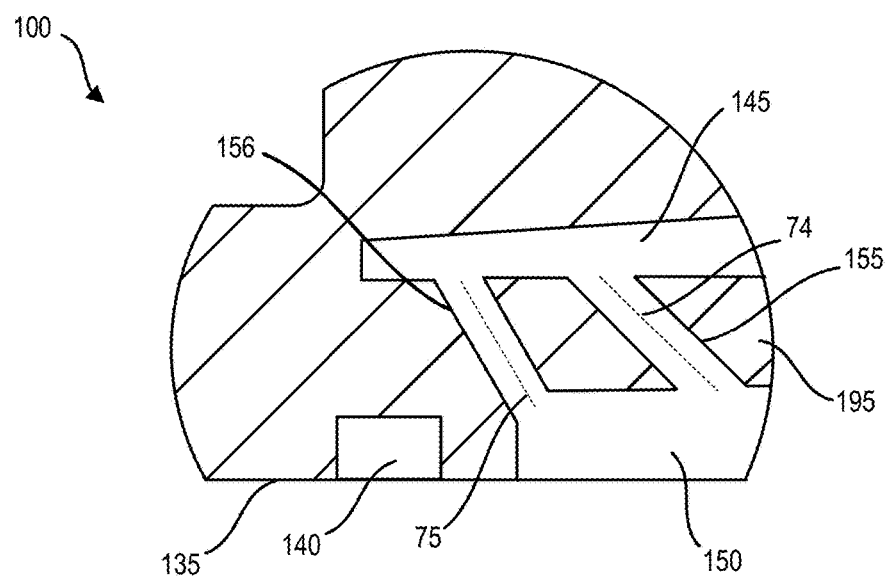

FIG. 35 shows a detailed view of a portion of the heat sink module of FIG. 34 highlighting the anti-pooling orifice that extends from the inlet chamber to a rear wall of the outlet chamber and is configured to deliver an anti-pooling jet stream proximate a rear wall of the outlet chamber to prevent pooling on the surface to be cooled.

Figure 36:
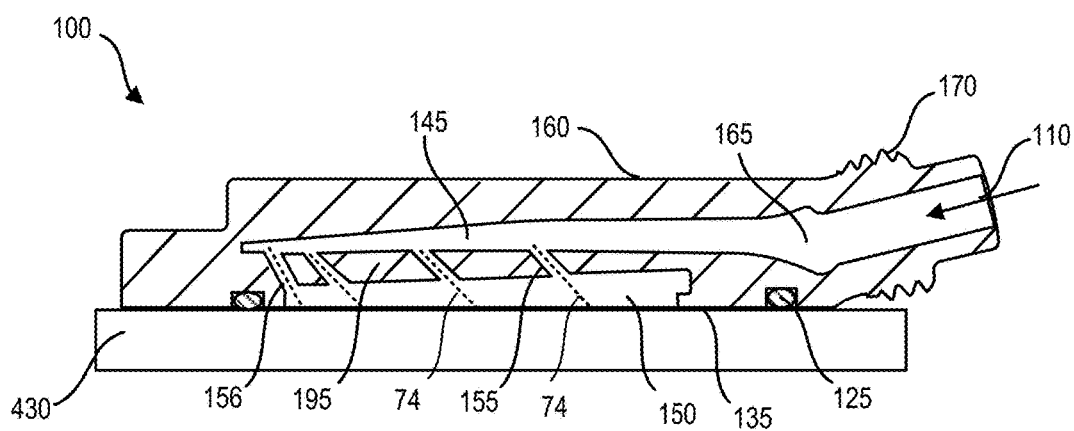

FIG. 36 shows a side cross-sectional view of the heat sink module of FIG. 33 taken along section B-B, with the heat sink module sealed against a thermally conductive base member and showing central axes of a plurality of orifices and an anti-pooling orifice located near a rear wall of the outlet chamber.

Figure 37:
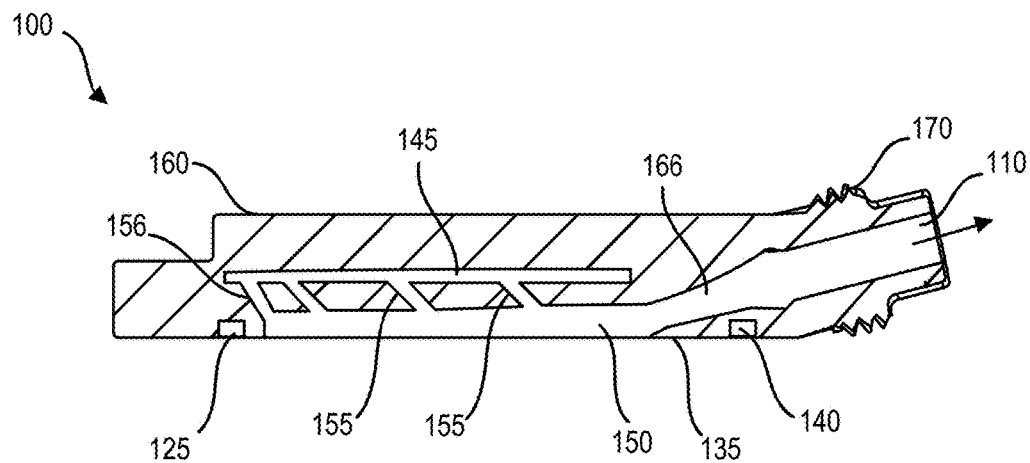

FIG. 37 shows a side cross-sectional view of the heat sink module of FIG. 33 taken along section A-A and showing an outlet port, an outlet passage, an inlet chamber, an outlet chamber, a plurality of orifices, and an anti-pooling orifice.

Figure 38:
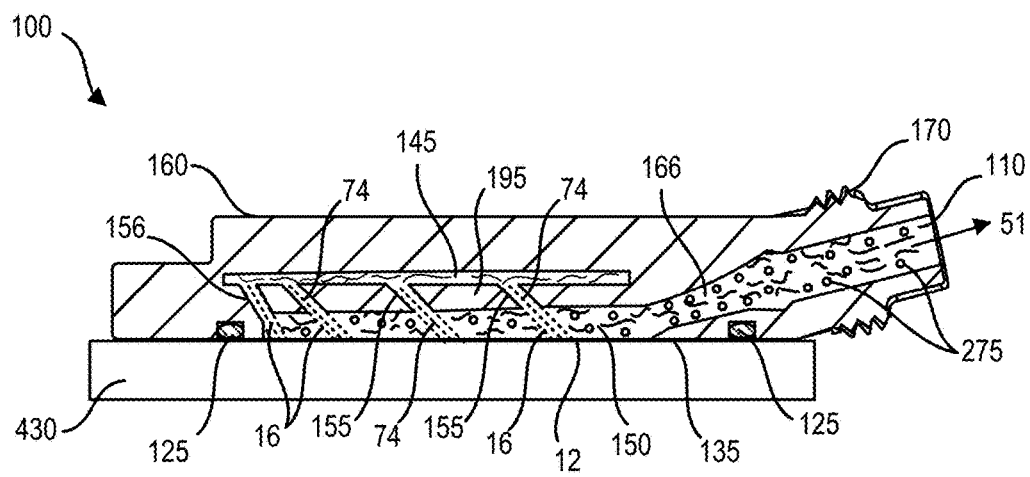

FIG. 38 shows a side cross-sectional view of the heat sink module of FIG. 33 taken along section A-A, with the heat sink module sealed against a thermally conductive base member, the figure showing coolant being introduced to an outlet chamber as a plurality of jet streams of coolant, a portion of liquid coolant changing phase upon absorbing heat from the surface to be cooled thereby forming a directional flow of two-phase bubbly flow that exits the heat sink module through an outlet port.

Figure 39:
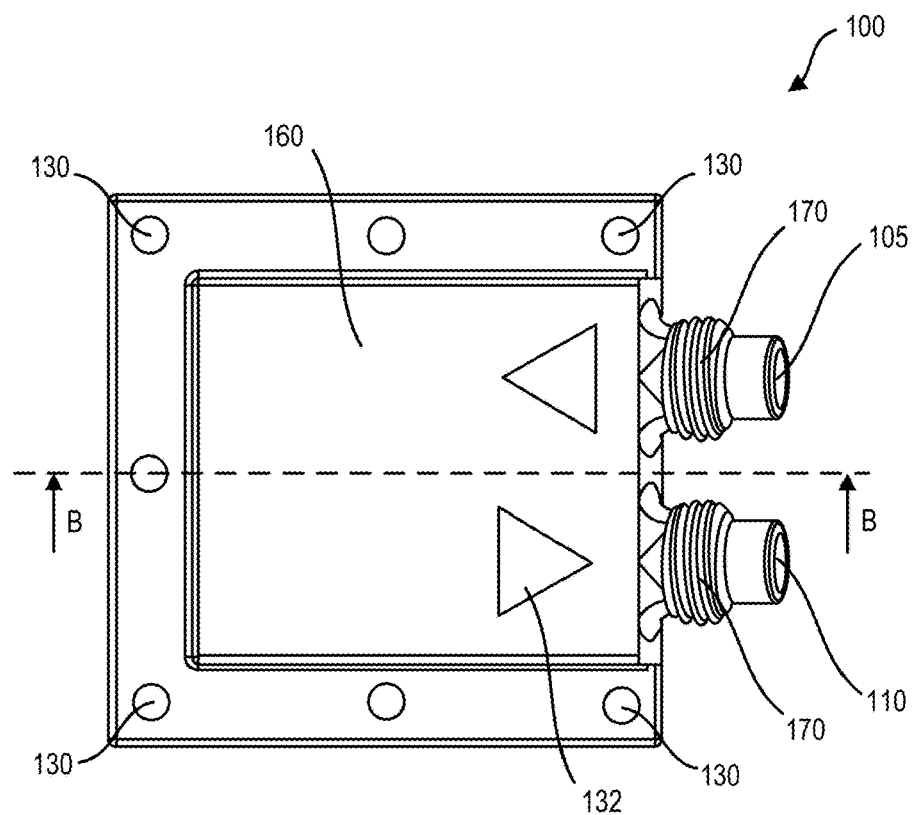

FIG. 39 shows a top view of a heat sink module of FIG. 33.

Figure 40:
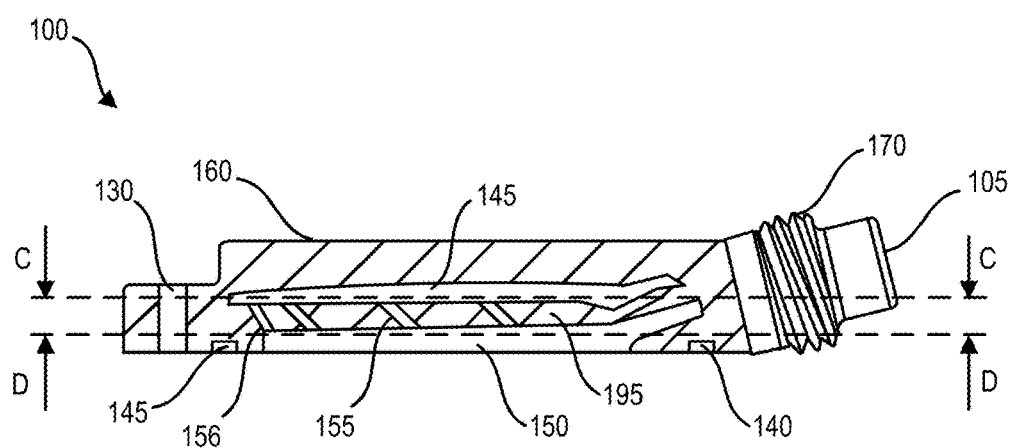

FIG. 40 shows a side cross-sectional view of the heat sink module of FIG. 39 taken along section B-B and showing the location of section C-C passing through an inlet chamber and the location of section D-D passing through an outlet chamber.

Figure 41:
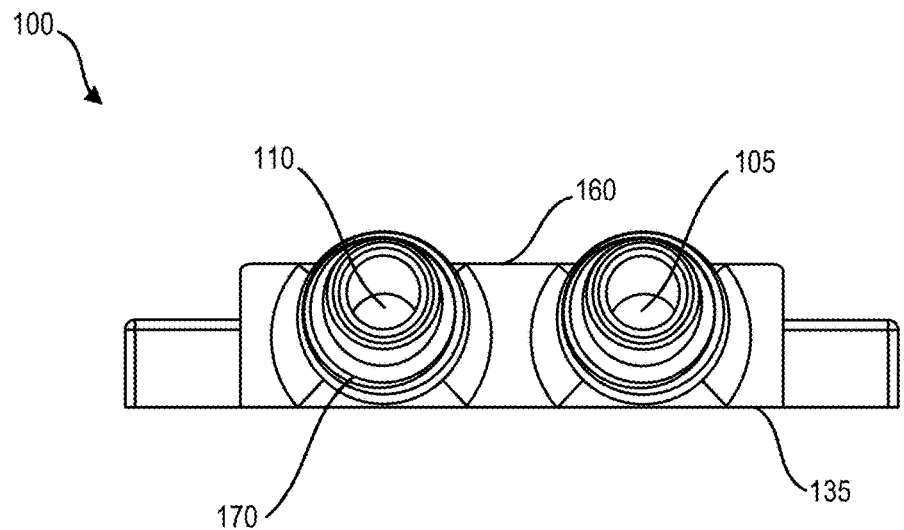

FIG. 41 shows a front view of the heat sink module of FIG. 33 showing an upwardly angled inlet port and an upwardly angle outlet port.

Figure 42:
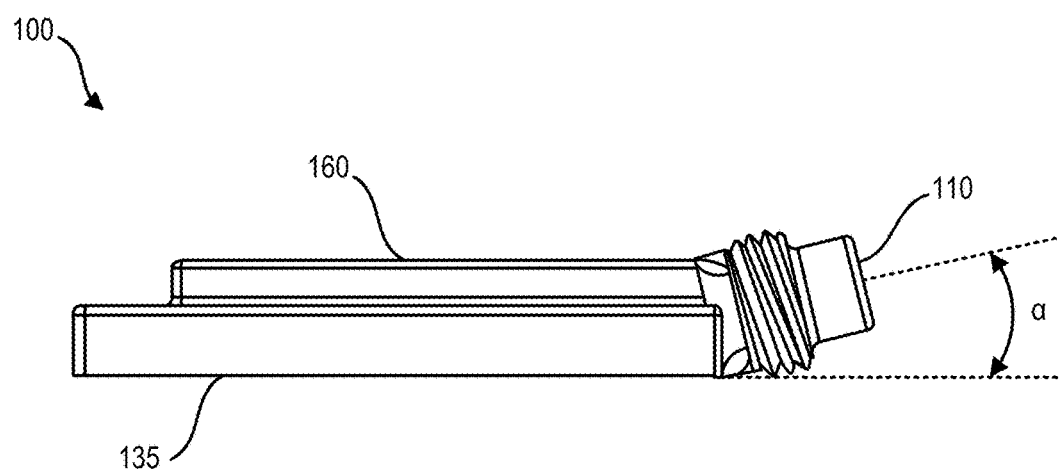

FIG. 42 shows a left side view of the heat sink module of FIG. 33 showing an outlet port and an inlet port arranged at an angle of $\alpha$ with respect to a mounting surface of the heat sink module, the angle configured to permit ease of assembly within a crowded server housing or other constrained installation.

Figure 43:
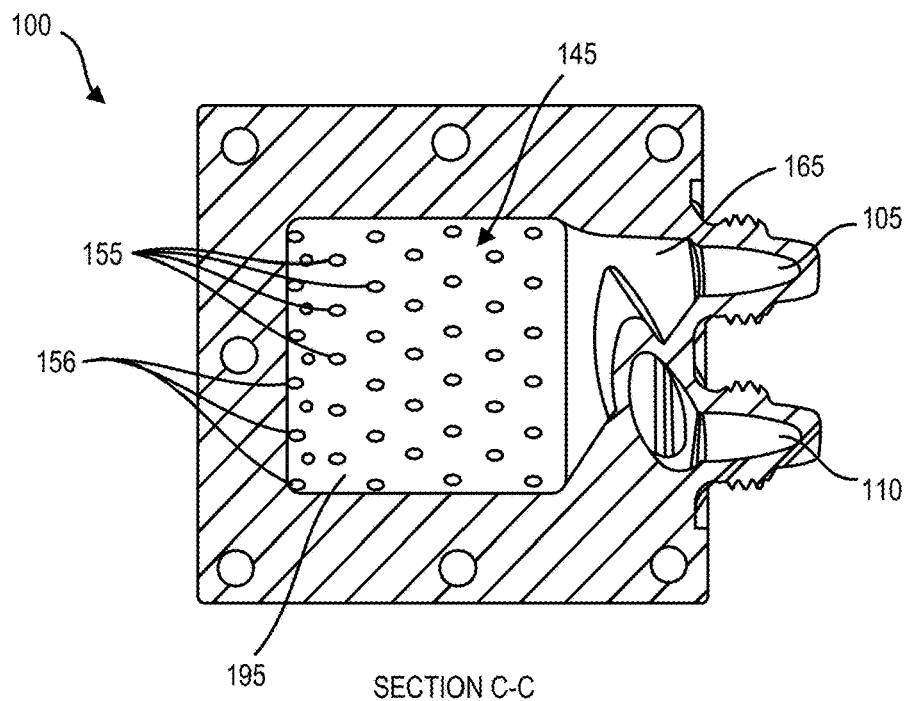

FIG. 43 shows a top cross-sectional view of the heat sink module of FIG. 39 taken along section C-C shown in FIG. 42, the top view showing the inlet port, inlet passage, inlet chamber, top surface of the dividing member, and inlets of the plurality of orifices and plurality of anti-pooling orifices.

Figure 44:
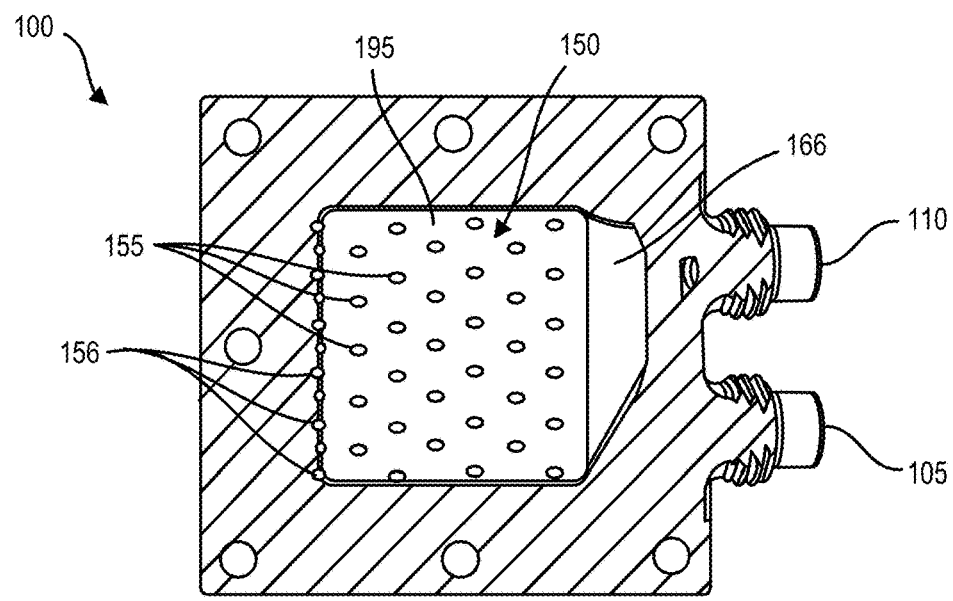

FIG. 44 shows a cross-sectional bottom view of the heat sink module of FIG. 39 taken along section D-D shown in FIG. 42, the bottom view showing the outlet port, outlet passage, outlet chamber, bottom surface of the dividing member, and outlets of the plurality of orifices and plurality of anti-pooling orifices.

Figure 45:
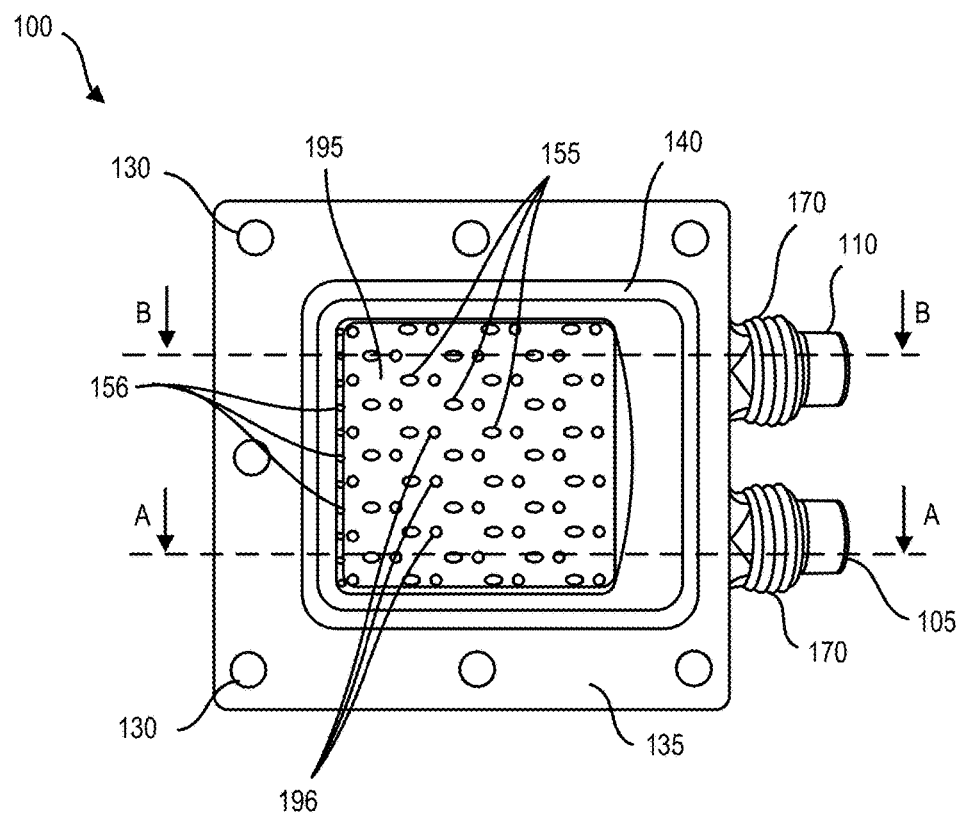

FIG. 45 shows a bottom view of a heat sink module having a plurality of boiling-inducing members extending from the dividing member into the outlet chamber.

Figure 46:
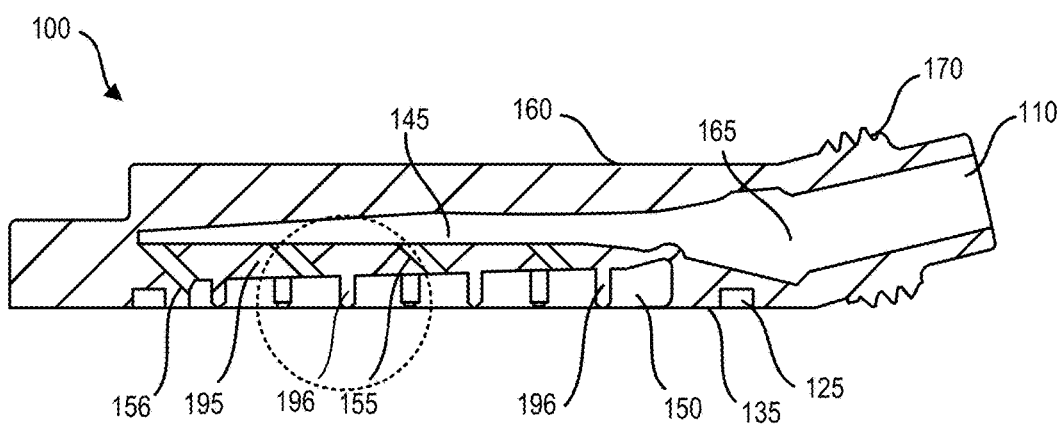

FIG. 46 shows a side cross-sectional view of the heat sink module of FIG. 45 taken along section B-B, the side view showing an inlet port, an inlet passage, an inlet chamber, a plurality of orifices, a dividing member, and a plurality of boiling-inducing members extending from the dividing member into the outlet chamber.

Figure 47:
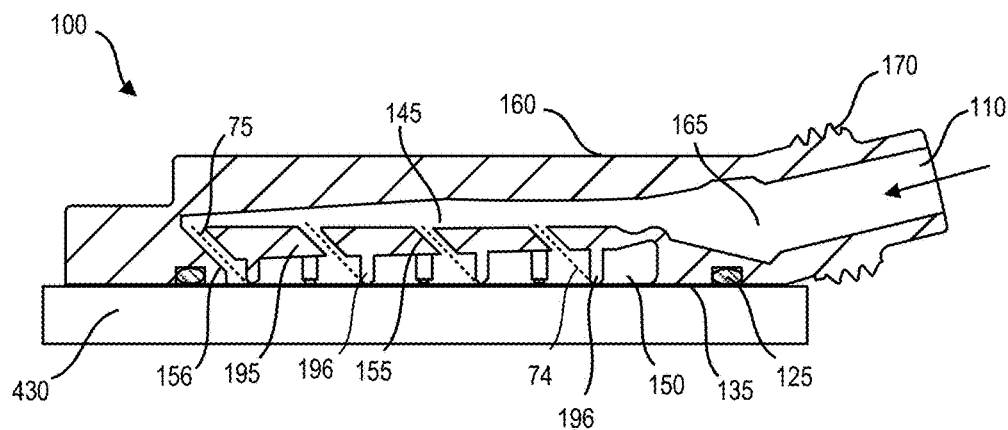

FIG. 47 shows a side cross-sectional view of the heat sink module of FIG. 45 taken along section B-B with the heat sink module mounted on a thermally conductive base member and showing central axes of the plurality of orifices.

Figure 48:
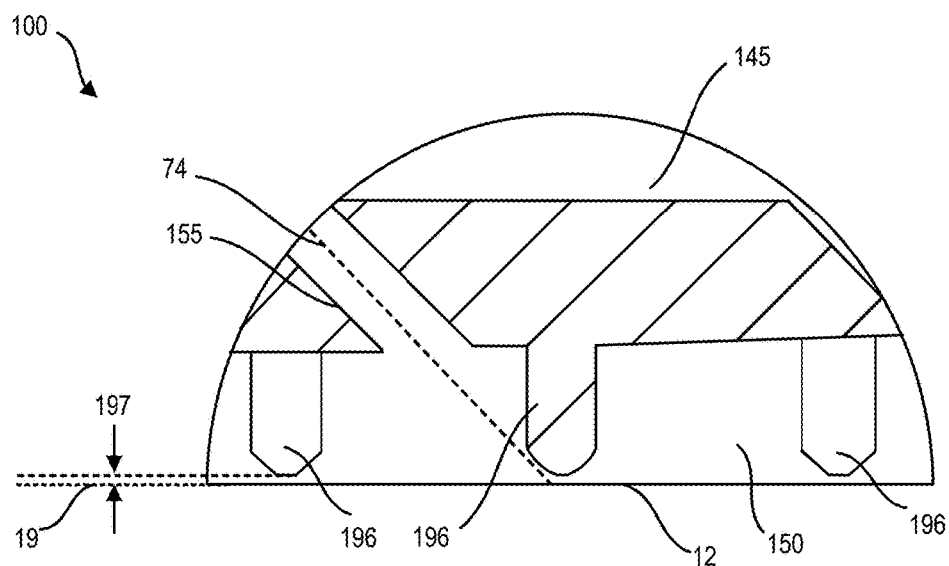

FIG. 48 shows a detailed view of a portion of the heat sink module shown in FIG. 46, the detailed view showing three boiling inducing members extending from a bottom surface of the dividing member into the outlet chamber and an orifice extending from the inlet chamber to the outlet chamber, a flow clearance being provided between a tip of each boiling-inducing member and a surface to be cooled.

Figure 49:
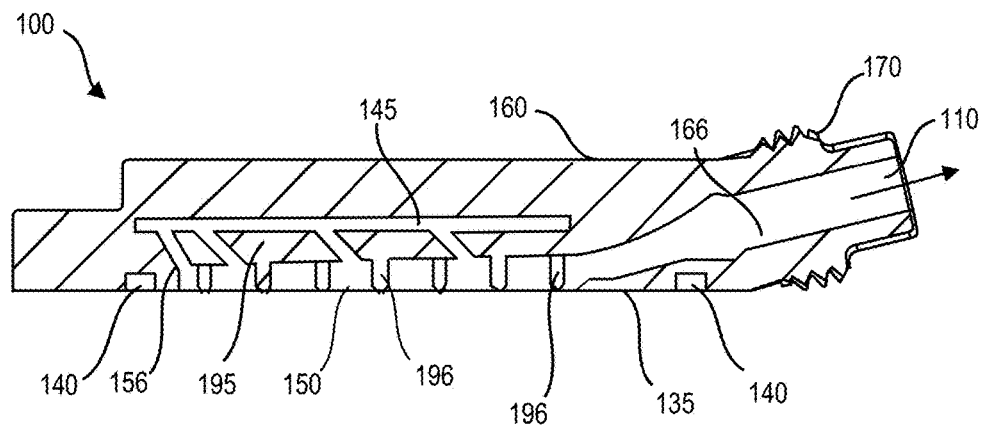

FIG. 49 shows a side cross-sectional view of the heat sink module of FIG. 45 taken along section A-A, the side view showing an outlet port, an outlet passage, an inlet chamber, an outlet chamber, a plurality of orifices, an anti-pooling orifice, a plurality of boiling-inducing members, and a dividing member.

Figure 50:
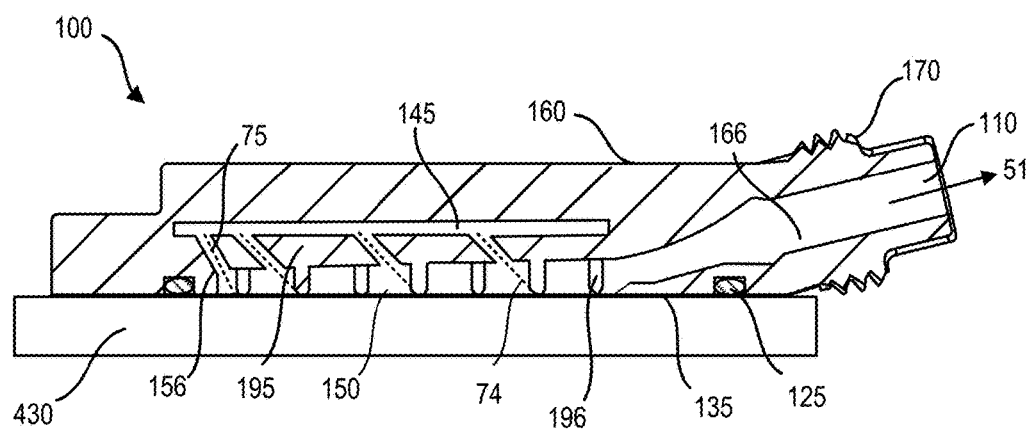

FIG. 50 shows a side cross-sectional view of the heat sink module of FIG. 45 taken along section A-A, the heat sink module being mounted on a thermally conductive base member, the figure showing central axes of the plurality of orifices and an anti-pooling orifice.

Figure 51A:
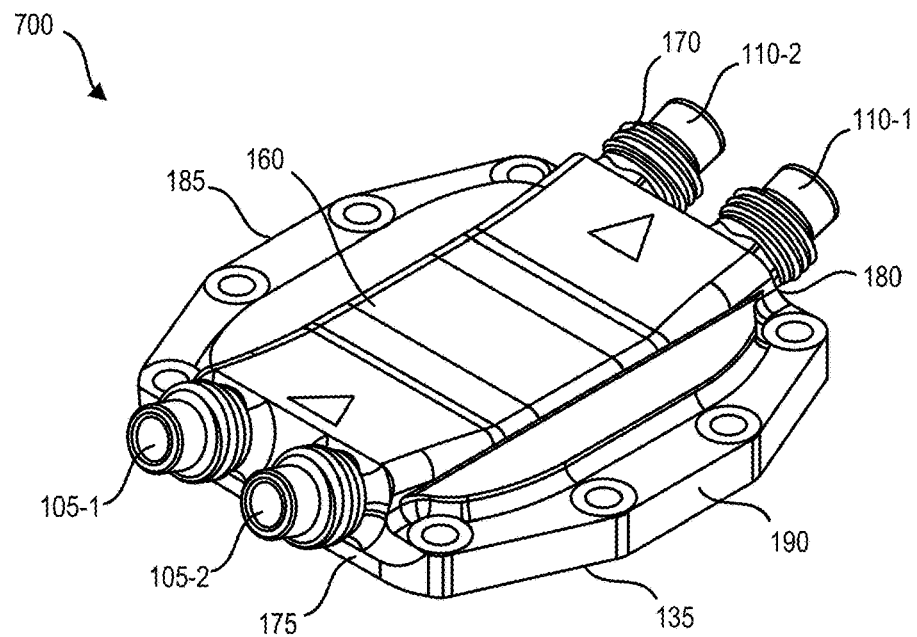

FIG. 51A shows a top perspective view of a redundant heat sink module having a first independent coolant pathway and a second independent coolant pathway.

Figure 51B:
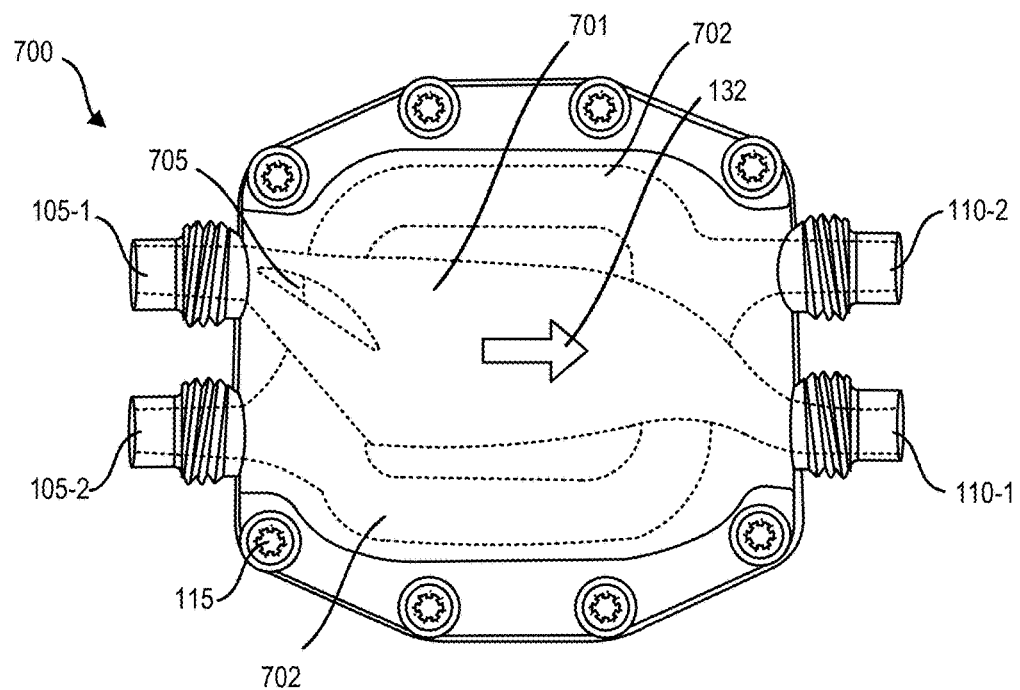

FIG. 51B shows a top view of the redundant heat sink module of FIG. 51A, where the first independent coolant pathway and the second independent coolant pathway are represented by dashed lines, where the first independent coolant pathway passes through a first region near a middle of the module, and where the second independent coolant pathway passes through a second region beyond a perimeter of the first region.

Figure 51C:
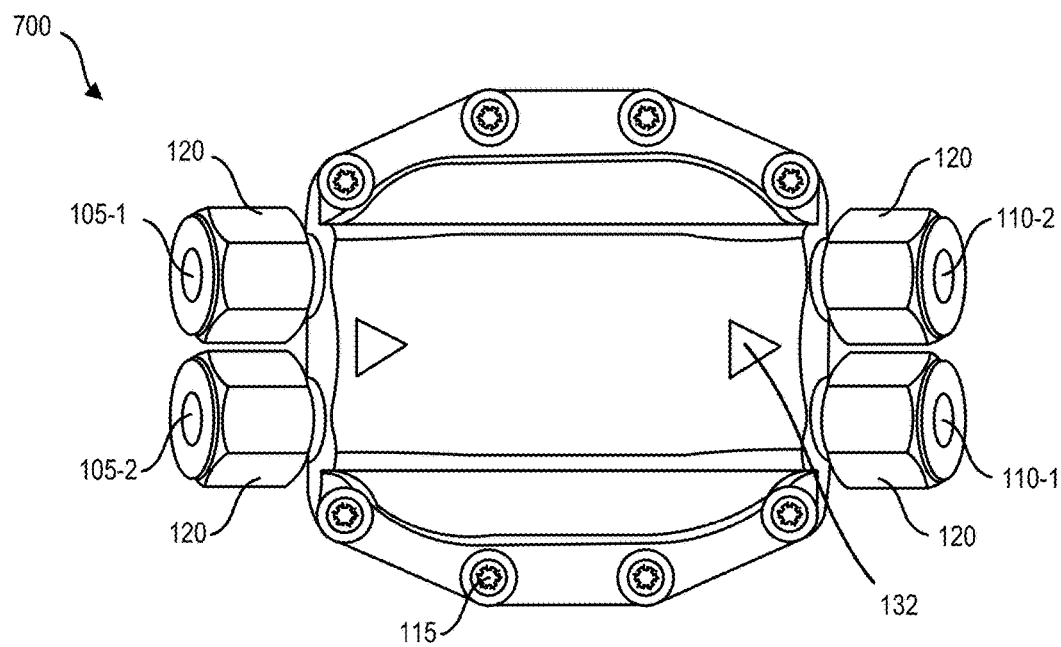

FIG. 51C shows a top view of the redundant heat sink module of FIG. 51A with compression fittings installed on the inlet and outlet ports.

Figure 51D:
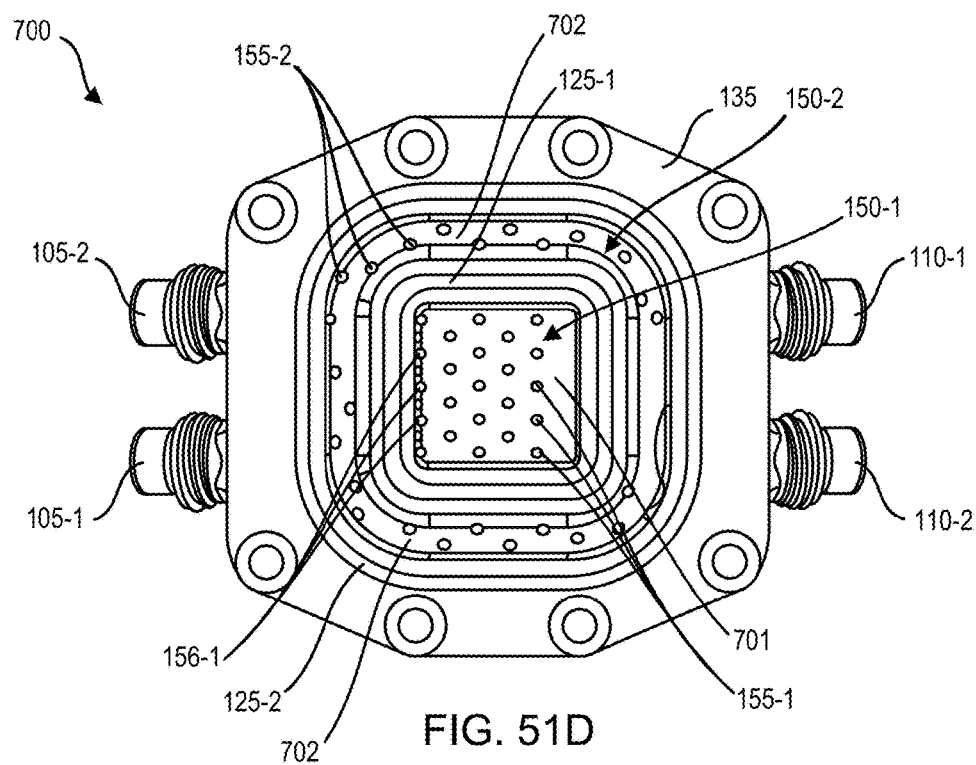

FIG. 51D shows a bottom view of the redundant heat sink module of FIG. 51A, where the first independent coolant pathway includes an array of orifices arranged in a first region located near a middle of the heat sink module, and where the second independent coolant pathway includes an array of orifices arranged in a second region circumscribing the first region, and where a first sealing member is configured to provide a liquid-tight seal between the first and second independent coolant pathways.

Figure 51E:
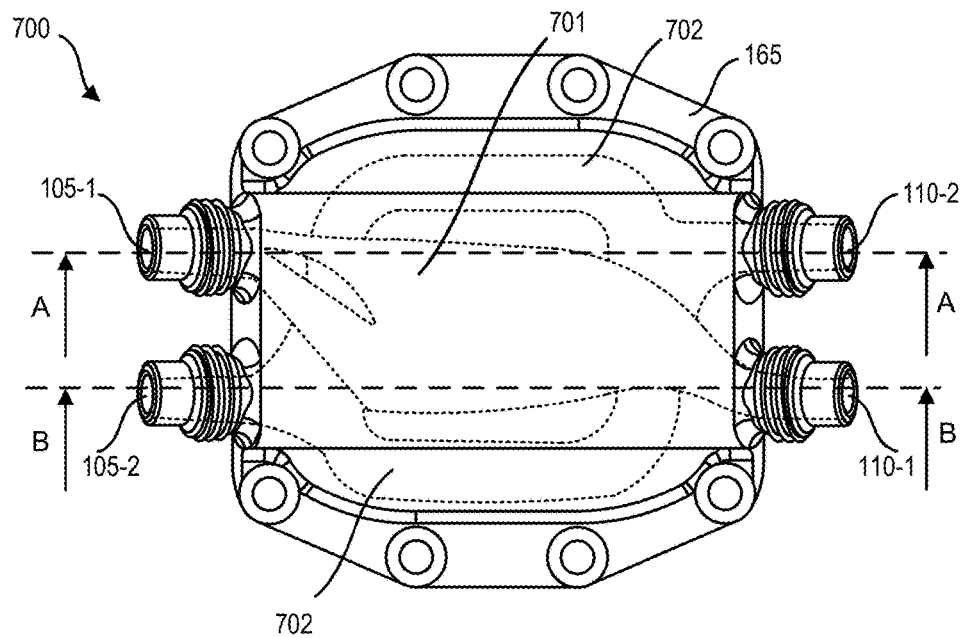

FIG. 51E shows a top view of the heat sink module of FIG. 51A.

Figure 51F:
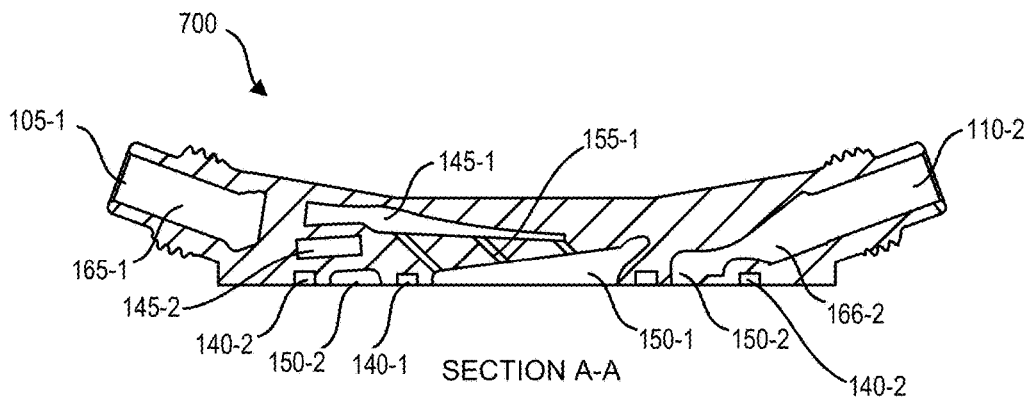

FIG. 51F shows a cross-sectional side view of the redundant heat sink module of FIG. 51A taken along section A-A shown in FIG. 51E, the figure showing a first inlet port, a first inlet passage, a first inlet chamber, a first outlet chamber, a first plurality of orifices, a portion of a second outlet chamber, and a second outlet port.

Figure 51G:
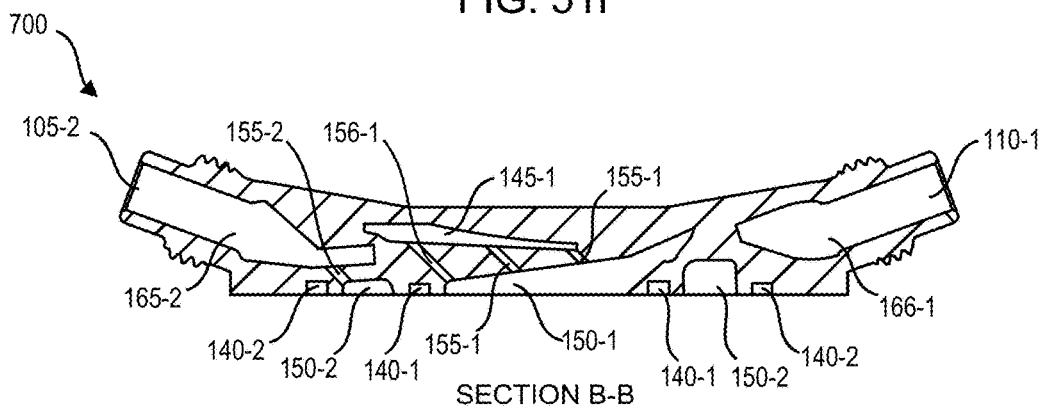

FIG. 51G shows a side cross-sectional side view of the redundant heat sink module of FIG. 51A taken along section B-B shown in FIG. 51E, the figure showing a second inlet port, a second inlet passage, one orifice of a second plurality of orifices, a first plurality of orifices, one anti-pooling orifice of a first plurality of anti-pooling orifices, a first outlet chamber, a portion of a second outlet chamber, and a first outlet port.

Figure 51H:
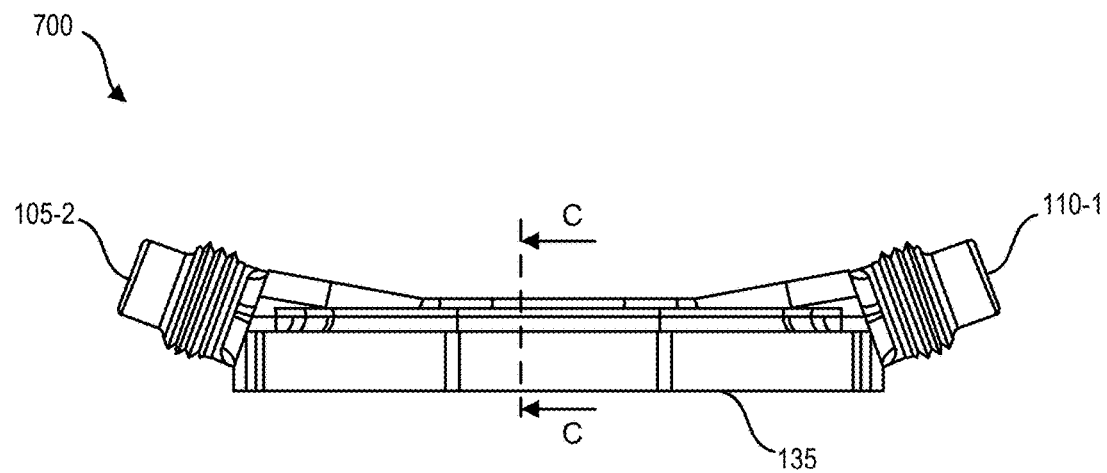

FIG. 51H shows a side view of the redundant heat sink module of FIG. 51A showing upwardly angled ports configured to ease installation in a crowded server housing or other constrained installation.

Figure 51I:
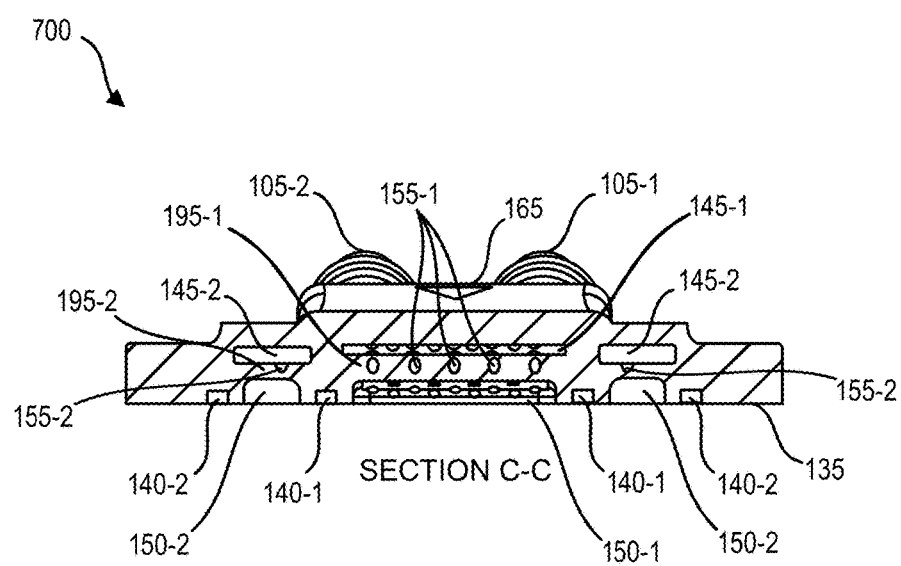

FIG. 51I shows a cross-sectional rear view of the redundant heat sink module of FIG. 51A taken along section C-C shown in FIG. 51H, the figure showing a first inlet chamber, a first outlet chamber, and a first plurality of orifices associated with a first independent coolant pathway and a second inlet chamber, a second outlet chamber, and a second plurality of orifices associated with a second independent coolant pathway.

Figure 51J:
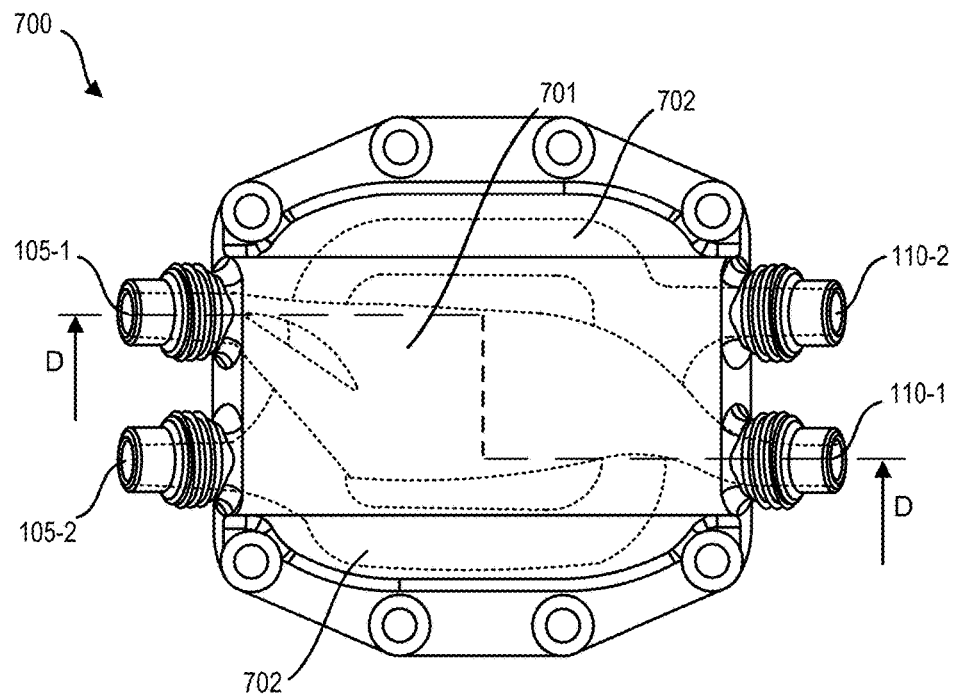

FIG. 51J shows a top view of the redundant heat sink module of FIG. 51A.

Figure 51K:
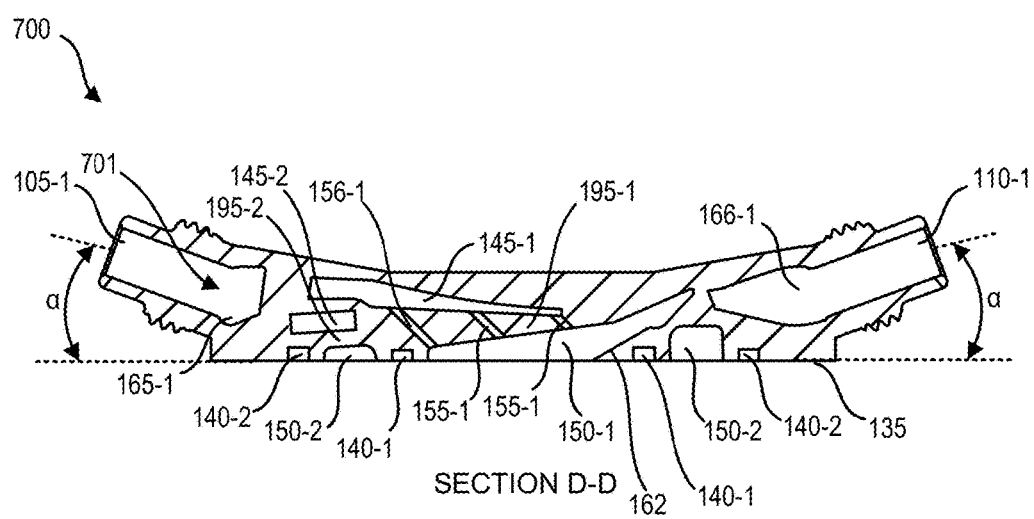

FIG. 51K shows a side cross-sectional view of the redundant heat sink module of FIG. 51A taken along section D-D shown in FIG. 51J, the figure showing a significant portion of the first independent coolant pathway.

Figure 51L:
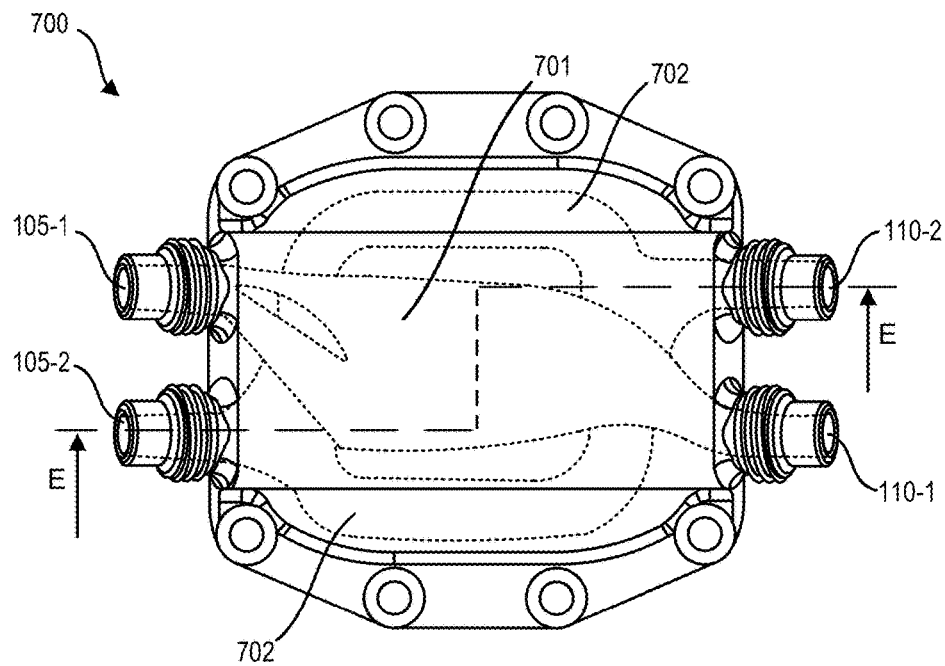

FIG. 51L shows a top view of the redundant heat sink module of FIG. 51A.

Figure 51M:
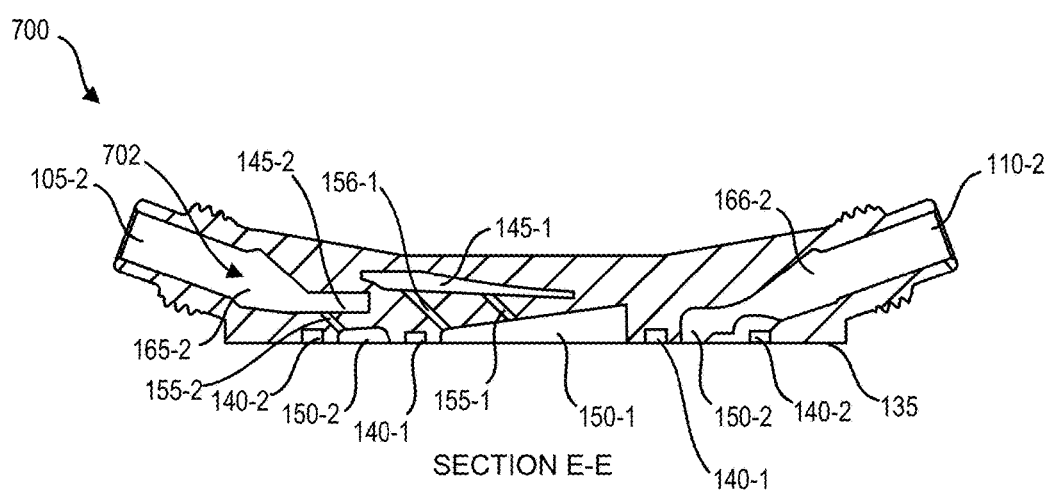

FIG. 51M shows a side cross-section view of the redundant heat sink module of FIG. 51A taken along section E-E of FIG. 51L, the figure showing a significant portion of the second independent coolant pathway.

Figure 51N:
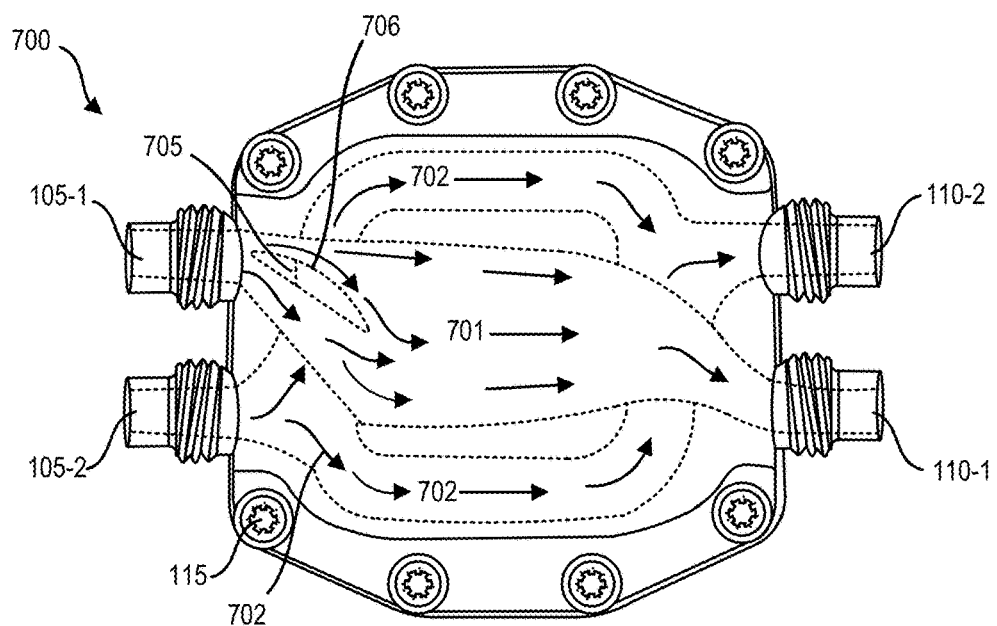

FIG. 51N is a top view of the redundant heat sink module of FIG. 51A and shows flow vectors in a first independent coolant pathway and flow vectors in a second independent coolant pathway.

Figure 51O:
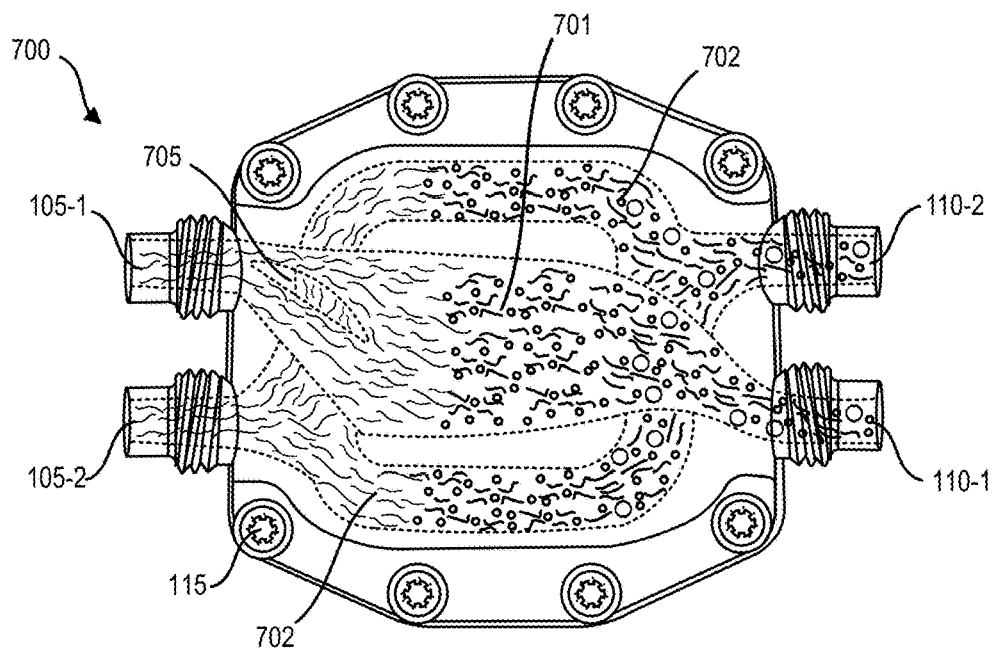

FIG. 51O is a top view of the redundant heat sink module of FIG. 51A and shows a first independent coolant pathway having a first inlet port and a first outlet port and a second independent coolant pathway having a second inlet port and a second outlet port, where coolant enters the first inlet port as liquid flow and exits the first outlet port as two-phase bubbly flow, and where coolant enters the second inlet port as liquid flow and exits the second outlet port as two-phase bubbly flow.

Figure 51P:
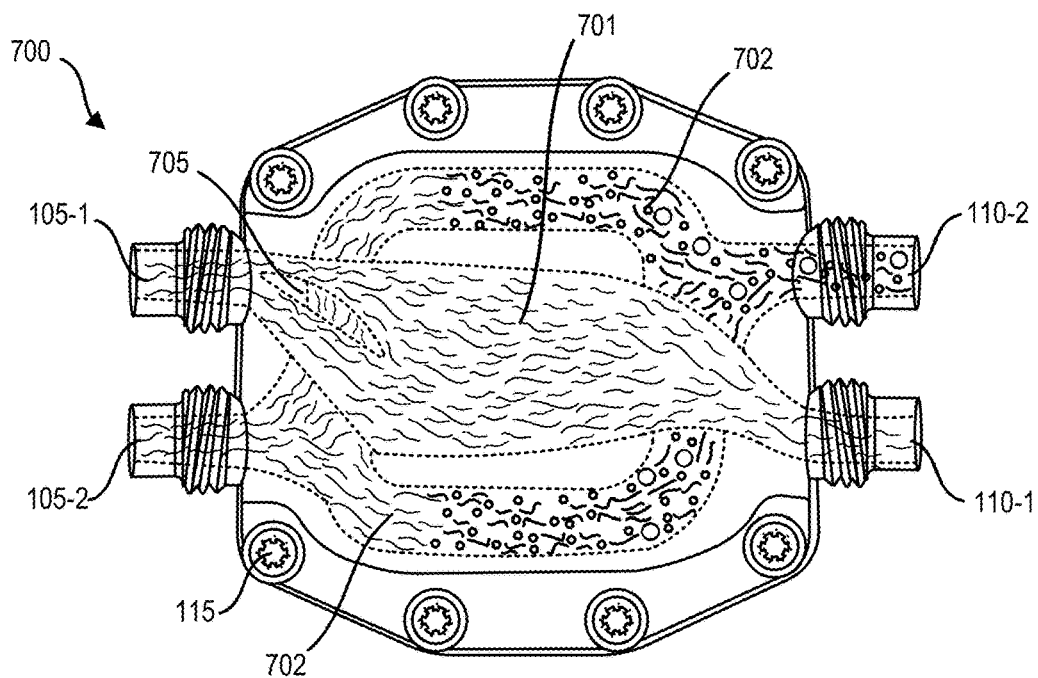

FIG. 51P is a top view of the redundant heat sink module of FIG. 51A and shows a first coolant pathway having a first inlet port and a first outlet port and a second coolant pathway having a second inlet port and a second outlet port, where coolant enters the first inlet port as liquid flow and exits the first outlet port as liquid flow, and where coolant enters the second inlet port as liquid flow and exits the second outlet port as two-phase bubbly flow.

Figure 51Q:
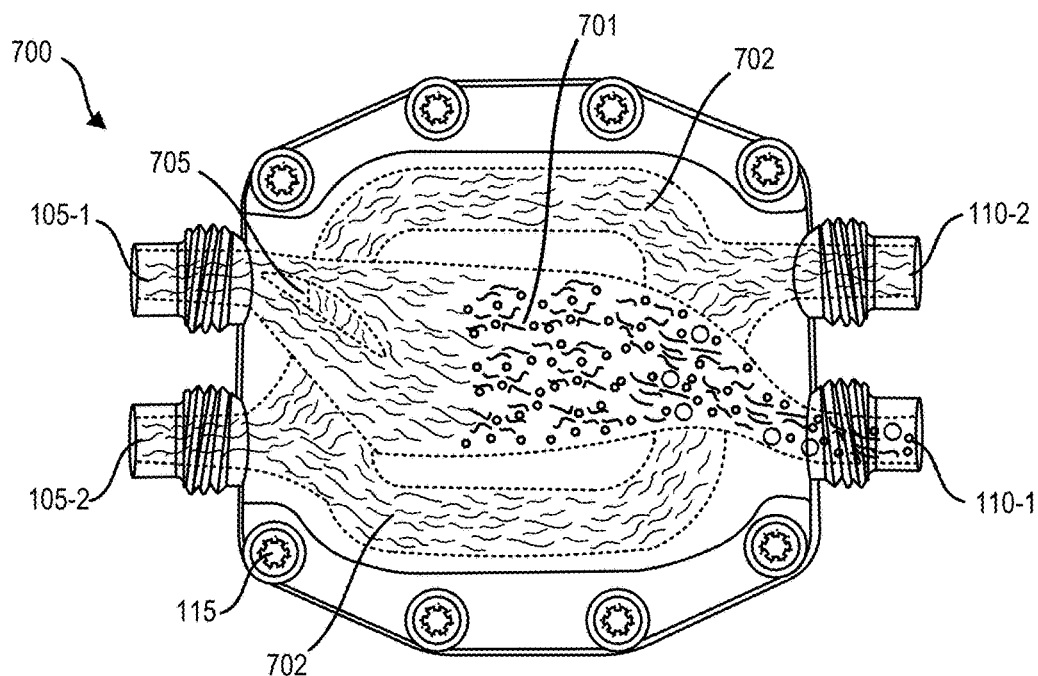

FIG. 51Q is a top view of the redundant heat sink module of FIG. 51A and shows a first coolant pathway having a first inlet port and a first outlet port and a second coolant pathway having a second inlet port and a second outlet port, where coolant enters the first inlet port as liquid flow and exits the first outlet port as two-phase bubbly flow, and where coolant enters the second inlet port as liquid flow and exits the second outlet port as liquid flow.

Figure 52A:
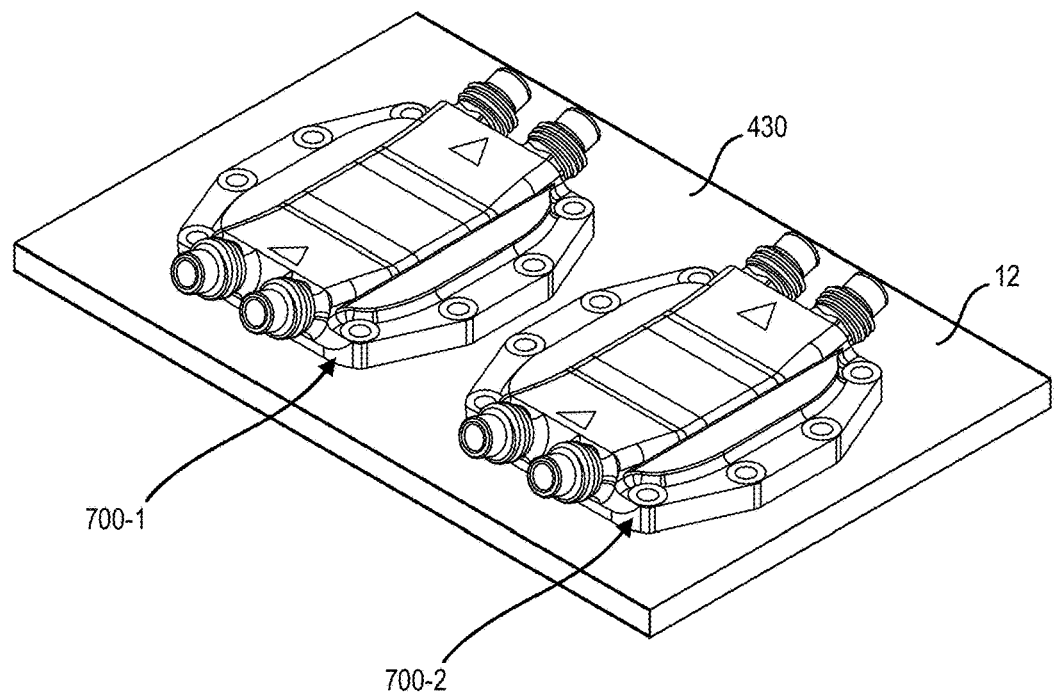

FIG. 52A shows two redundant heat sink modules mounted on a thermally conductive base member, where two sink modules are provided for redundancy and/or increased heat transfer capability.

Figure 52B:
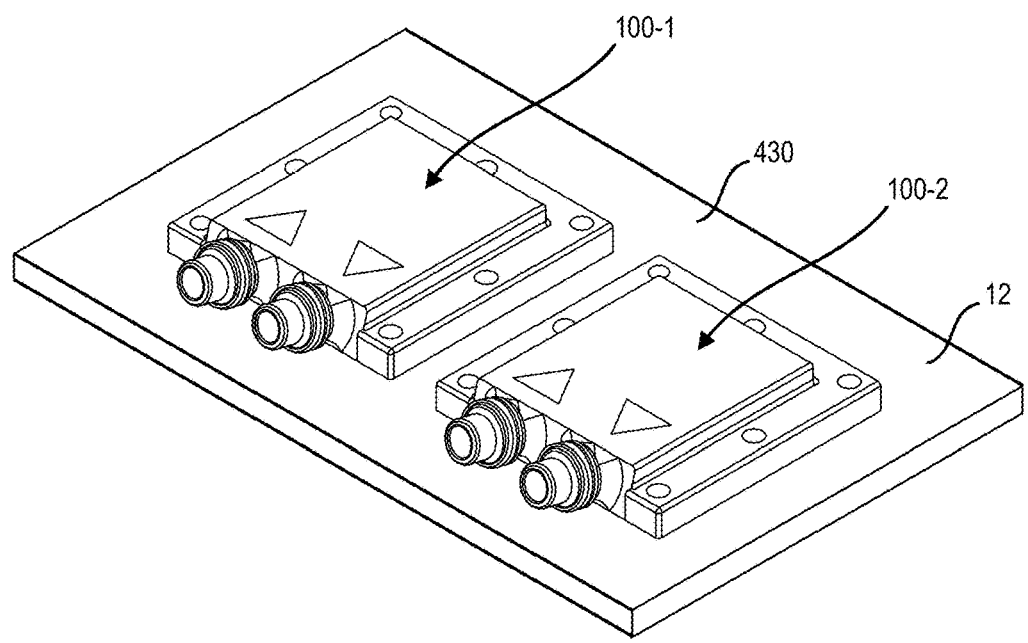

FIG. 52B shows two heat sink modules mounted on a thermally conductive base member, where two sink modules are provided for redundancy and/or increased heat transfer capability.

Figure 53:
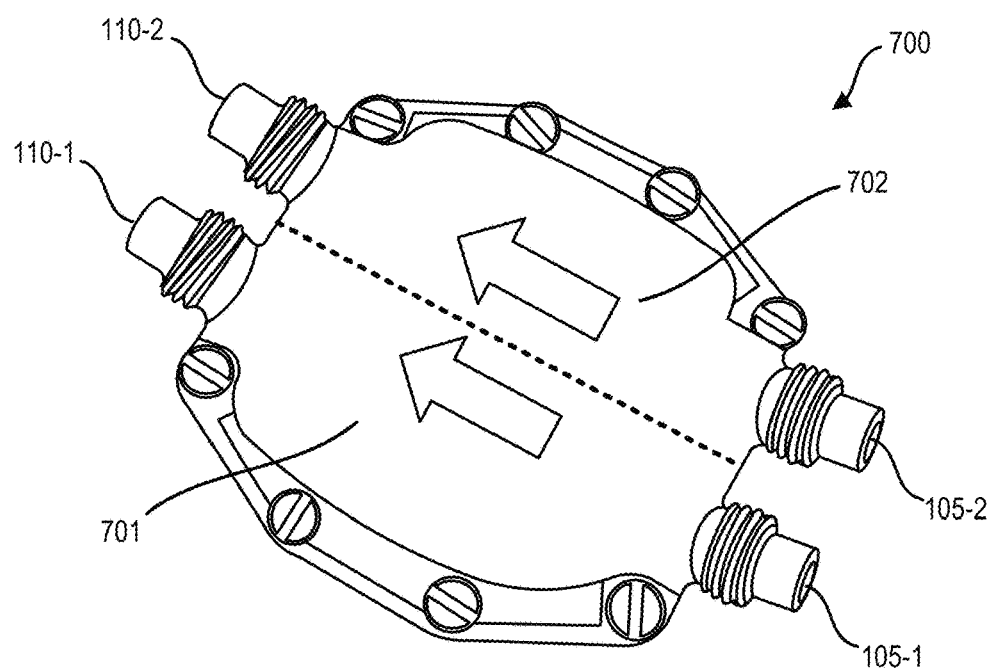

FIG. 53 shows a top perspective view of a redundant heat sink module having side-by-side independent coolant pathways.

Figure 54:
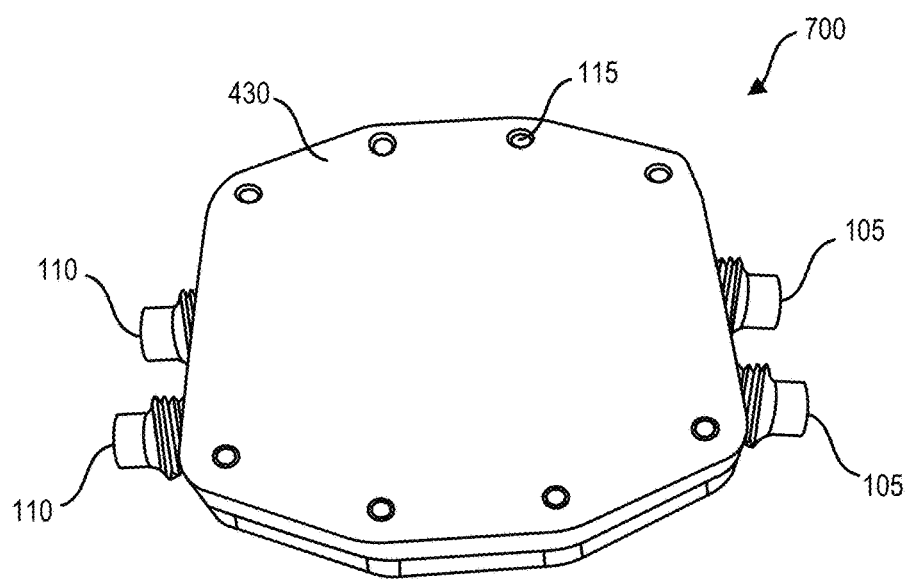

FIG. 54 shows a bottom perspective view of a redundant heat sink module mounted to a planar, thermally conductive base member with fasteners.

Figure 55:
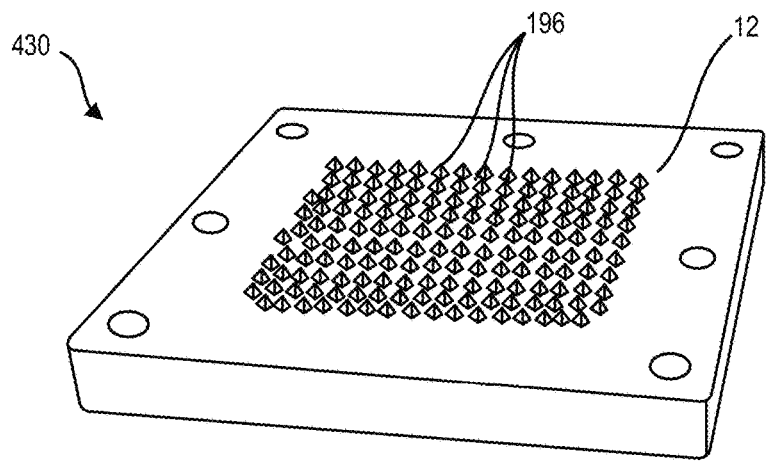

FIG. 55 shows a top perspective view of a thermally conductive base member having a surface to be cooled and an array of boiling-inducing members extending from the surface to be cooled, the array of boiling-inducing members configured to fit within an inner perimeter of an outlet chamber of a heat sink module when the heat sink module is mounted on the thermally conductive base member.

Figure 56:
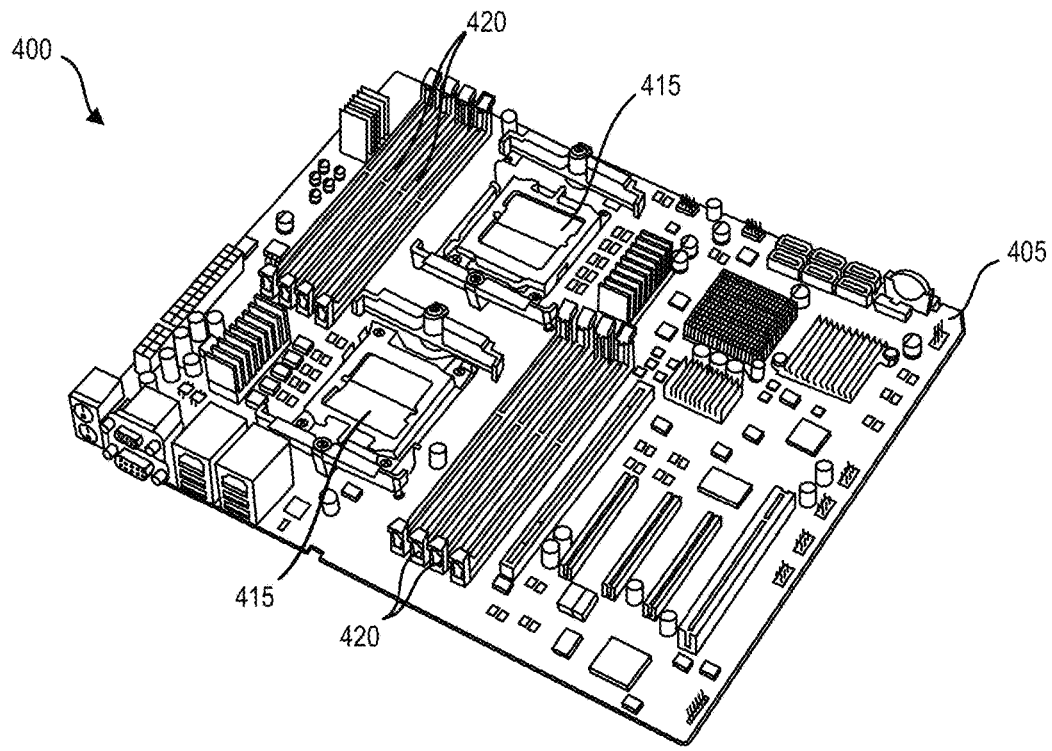

FIG. 56 shows a top perspective view of a motherboard of a server including microprocessors and a plurality of vertically arranged memory modules that are parallel and offset, where a heat sink module can be mounted on top of each microprocessor.

Figure 57:
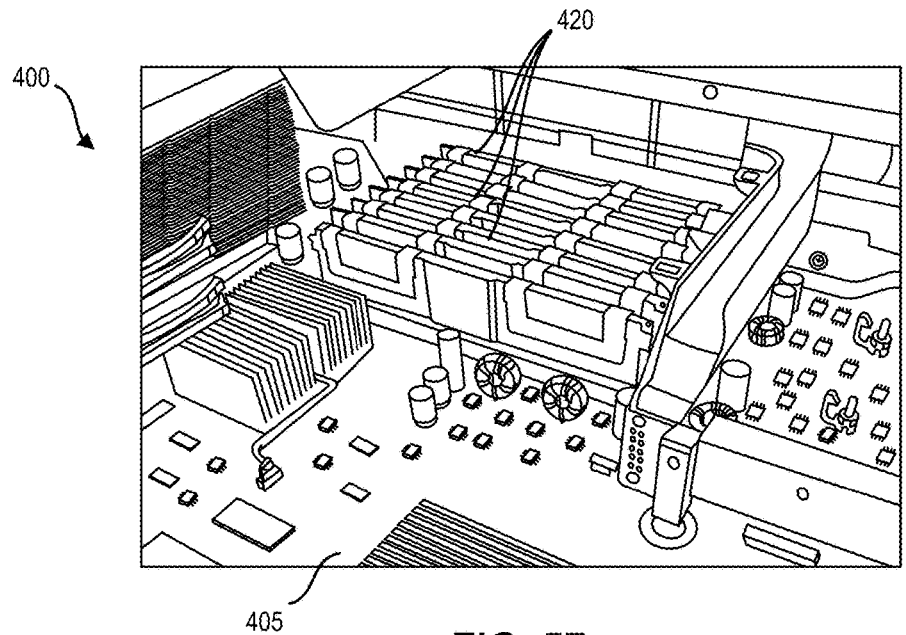

FIG. 57 shows a top perspective view of a server including a plurality of vertically arranged memory modules that are parallel and offset.

Figure 58:
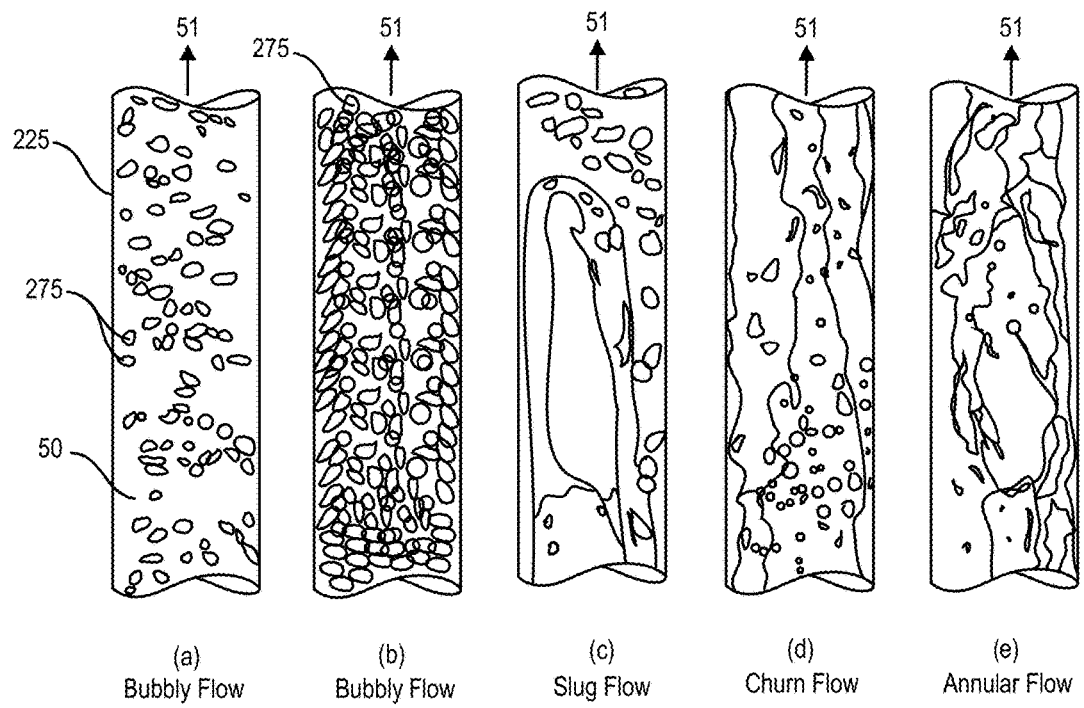

FIG. 58 shows two-phase flow regimes, including (a) bubbly flow with a first number density of bubbles, (b) bubbly flow with a second number density of bubbles that is greater than the first number density of bubbles, (c) slug flow, (d) churn flow, and (e) annular flow.

Figure 59A:
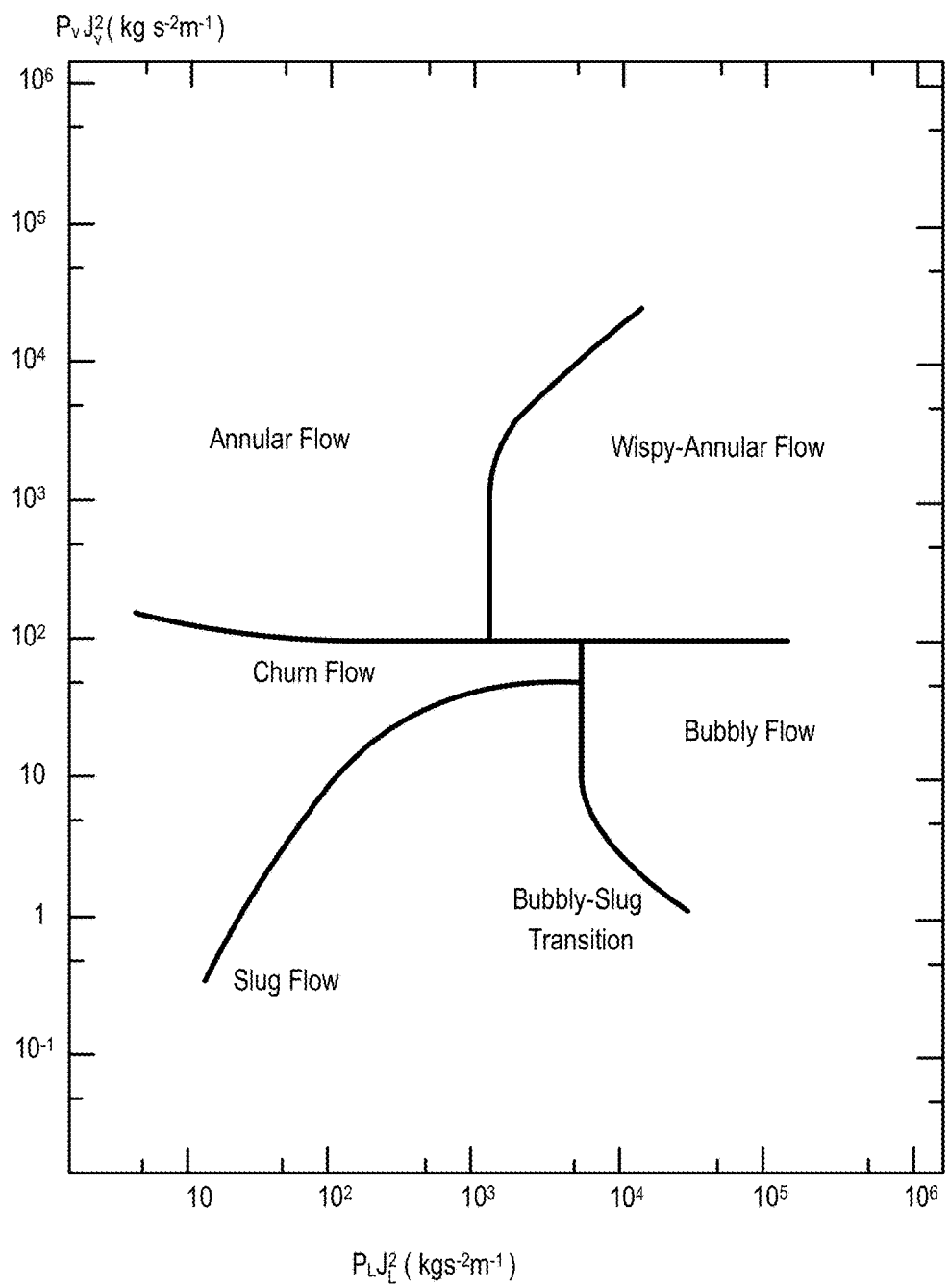

FIG. 59A shows a flow regime map for a steam-water system with $\rho_{liquid}*j_{liquid}^2$ on the x-axis and $\rho_{vapor}*j_{vapor}^2$ on the y-axis.

Figure 59B:
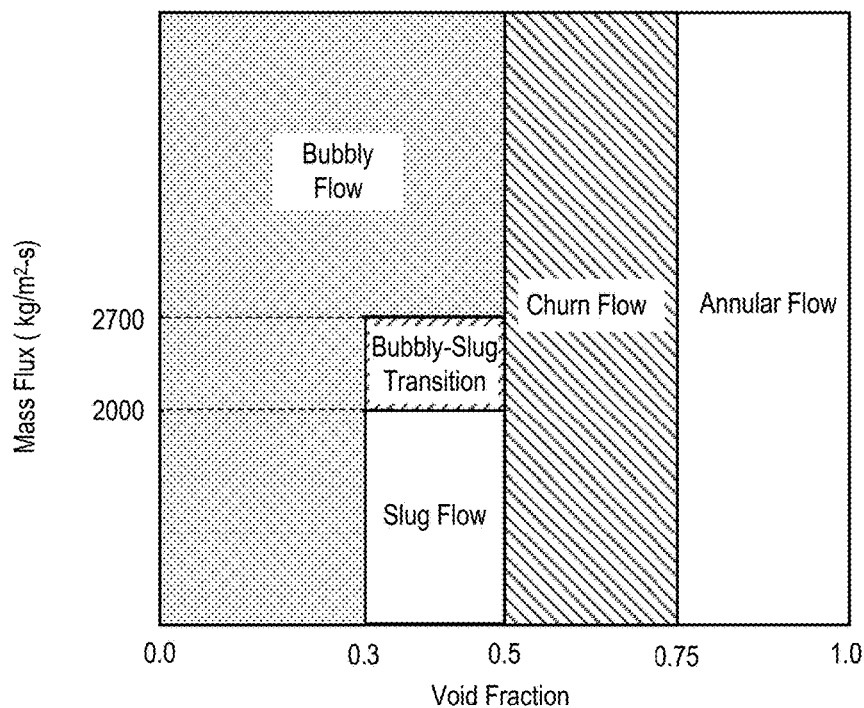

FIG. 59B shows two-phase flow regimes for coolant plotted on void fraction versus mass flux axes.

Figure 60:
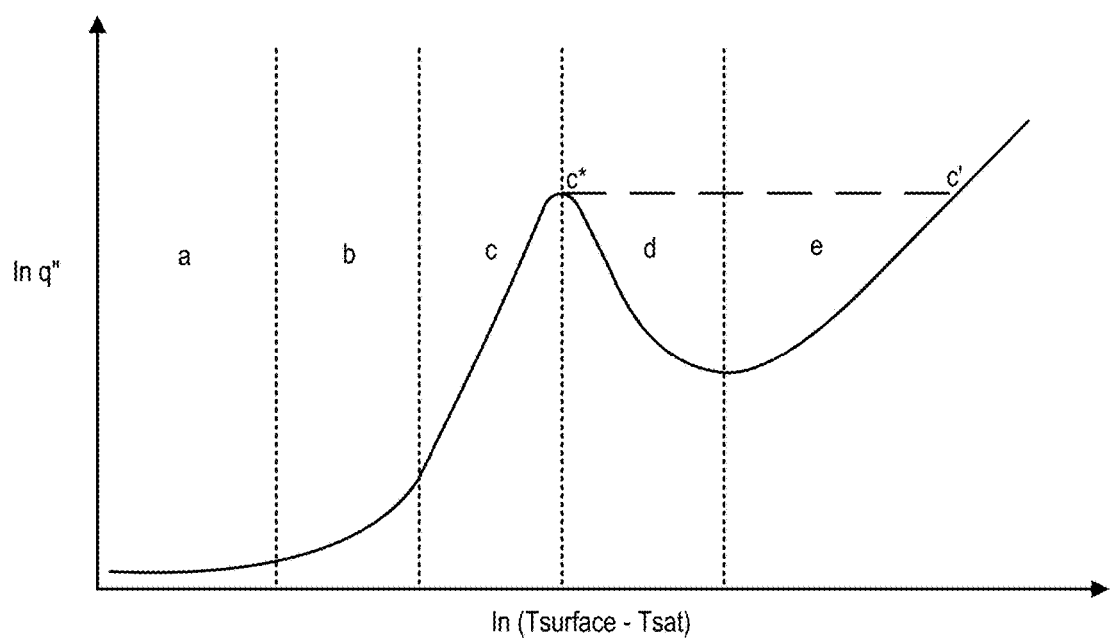

FIG. 60 shows a flow boiling curve for water where heat transfer rate is plotted as a function of excess temperature.

Figure 61:
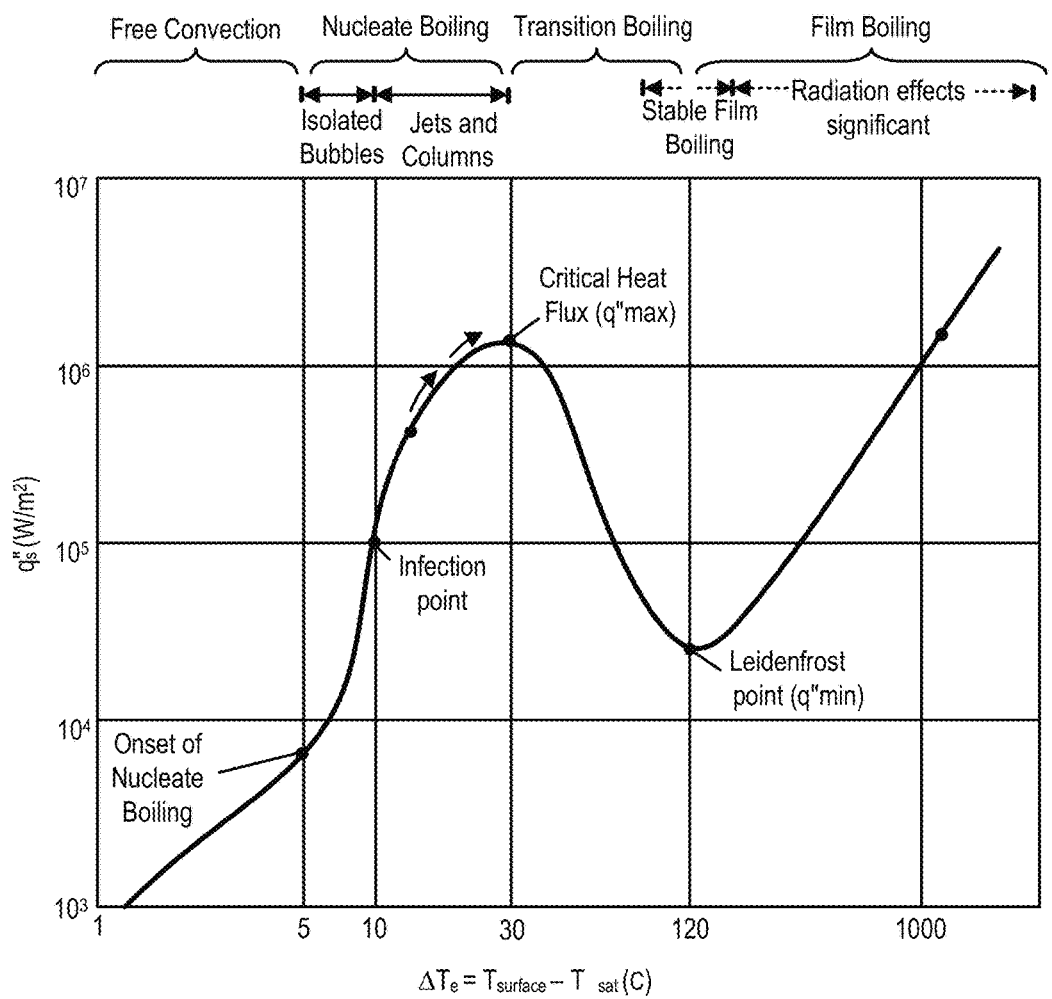

FIG. 61 shows a boiling curve for water at one atmosphere and shows an onset of nucleate boiling, an inflection point, the point of critical heat flux, and the Leidenfrost point.

Figure 62:
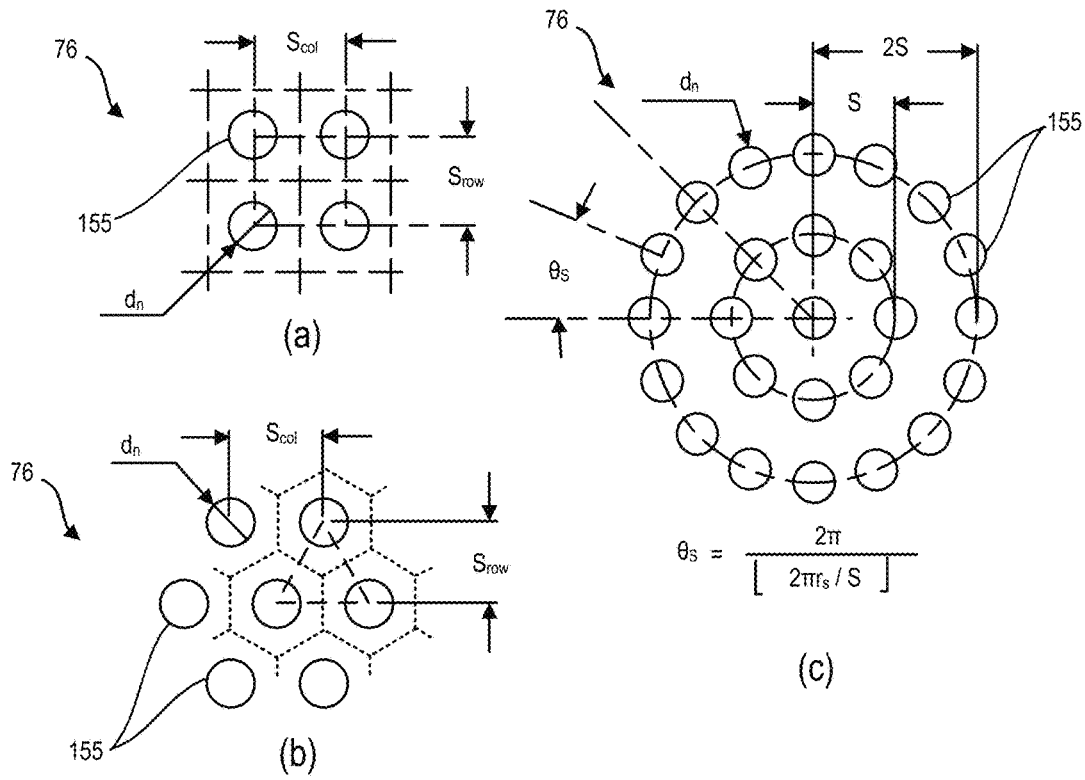

FIG. 62 shows possible orifice configurations for a heat sink module, including (a) a regular rectangular jet array, (b)

a regular hexagonal jet array with staggered columns and staggered rows, and (c) a circular jet array.

Figure 63:
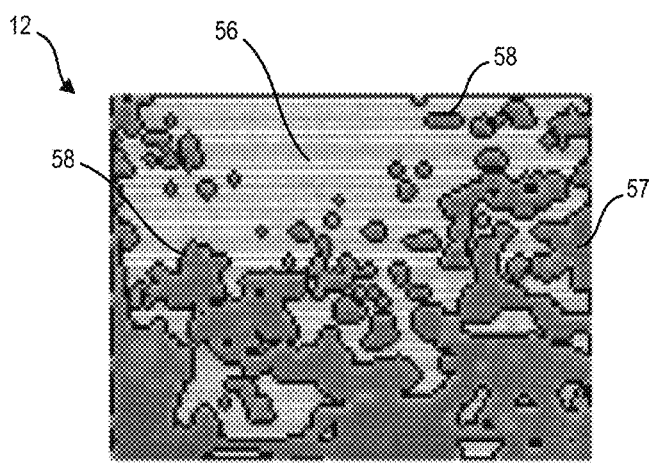

FIG. 63 shows a top view of a heated surface covered by coolant, the coolant having regions of vapor coolant and wetted regions of liquid coolant in contact with the heated surface, where a three-phase contact line length is measured as a sum of all curves where liquid coolant, vapor coolant, and the heated surface are in mutual contact on the heated surface.

Figure 64:
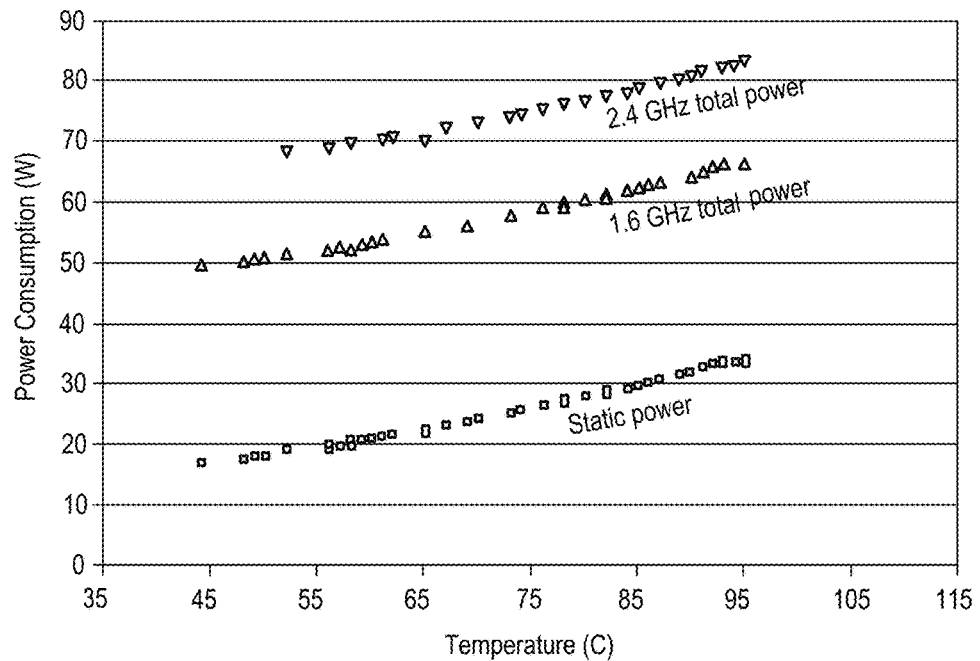

FIG. 64 shows a plot of power consumption versus junction temperature for a processor at a static condition and at dynamic conditions with switching speeds of 1.6 GHz and 2.4 GHz.

Figure 65:
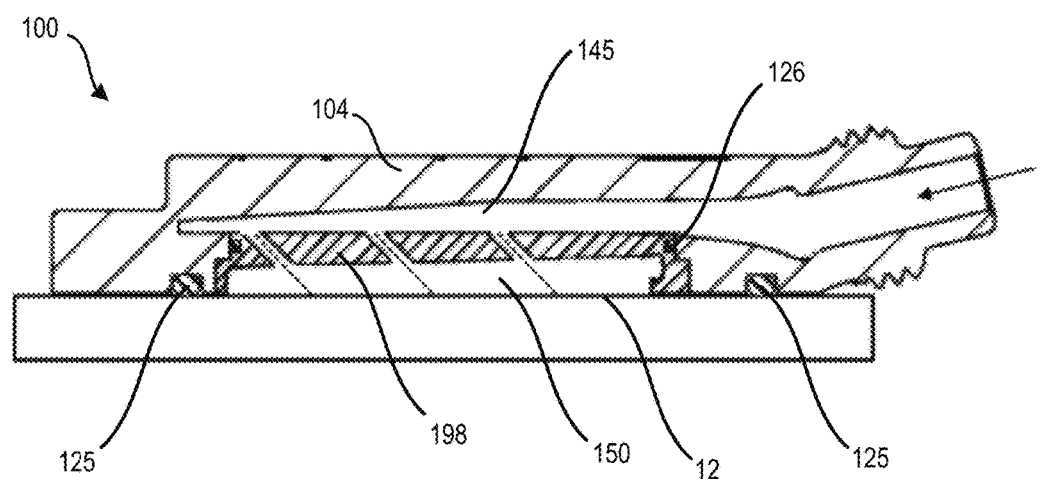

FIG. 65 shows a heat sink module with an insertable orifice plate installed within a module body, where a sealing member is provided between the insertable orifice plate and the module body.

Figure 66:
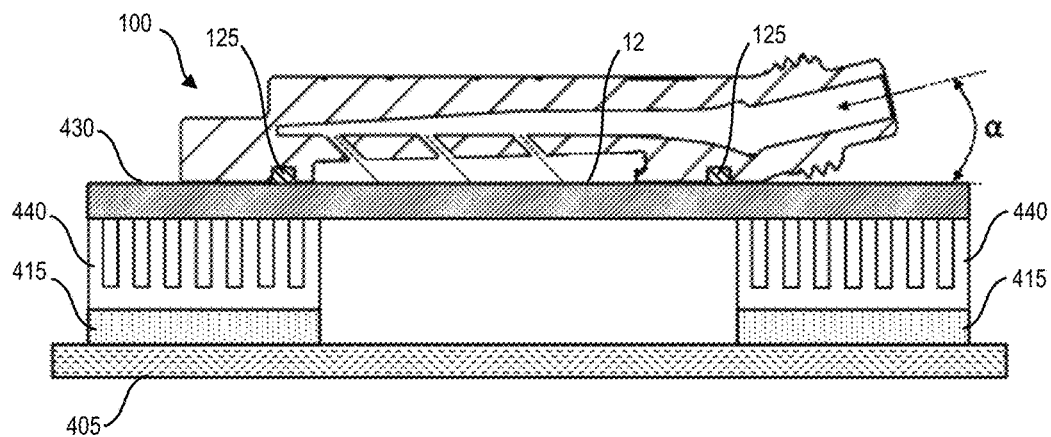

FIG. 66 shows a side cross-sectional view of a motherboard having a first microprocessor, a second microprocessor, a first finned heat sink arranged on top of the first microprocessor, a second finned heat sink arranged on top of the second microprocessor, and a cooling apparatus, where the cooling apparatus includes a heat sink module mounted on a thermally conductive member that extends from the first finned heat sink to the second heat sink module.

Figure 67:
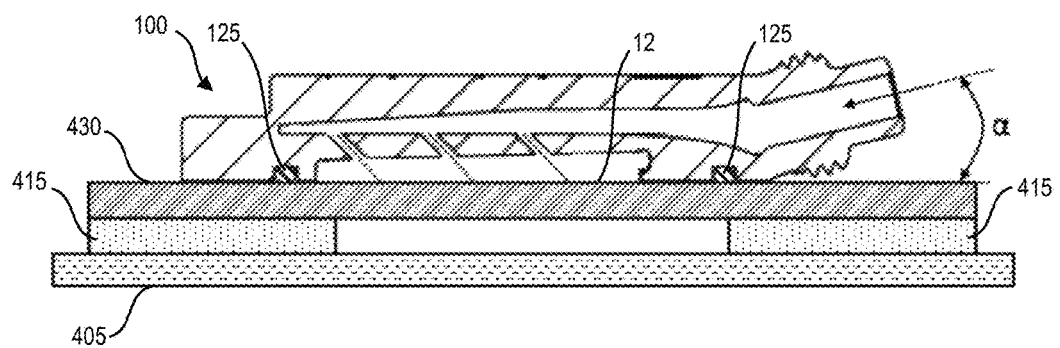

FIG. 67 shows a side cross-sectional view of a motherboard having a first microprocessor, a second microprocessor, and a cooling system, where the cooling system includes a heat sink module mounted on a thermally conductive member that extends from the first microprocessor to the second microprocessor.

Figure 68:
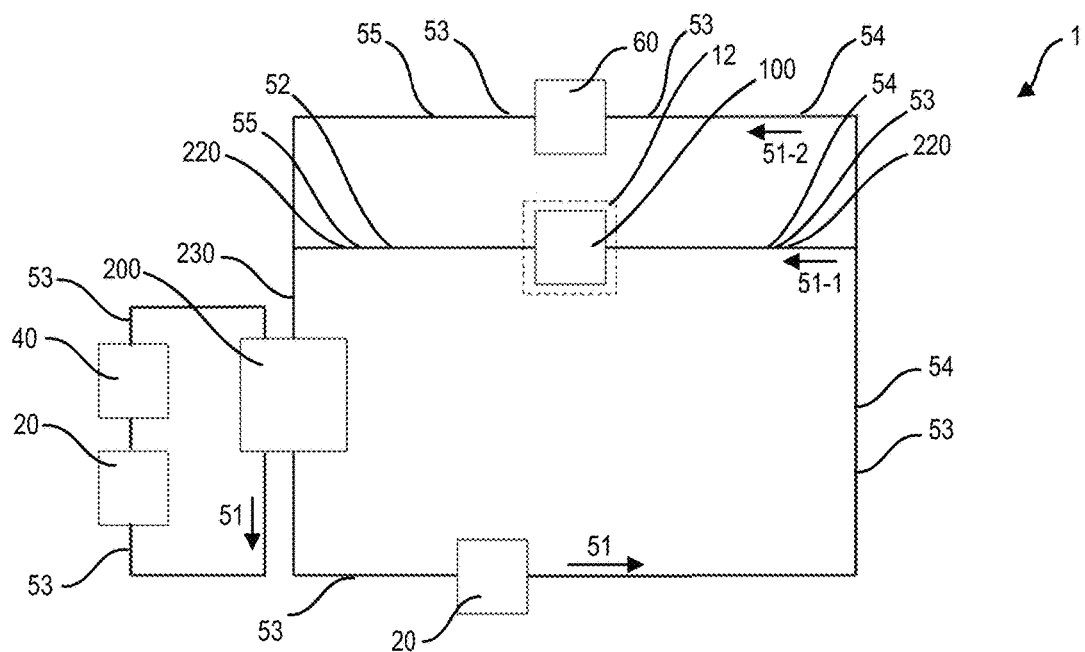

FIG. 68 shows a schematic of a preferred cooling apparatus having a primary cooling loop, a bypass, and a heat rejection loop, where the primary cooling loop includes a reservoir, a pump, and a heat sink module, the bypass includes a valve, and the heat rejection loop includes a pump and a heat exchanger connected to the reservoir.

Figure 69:
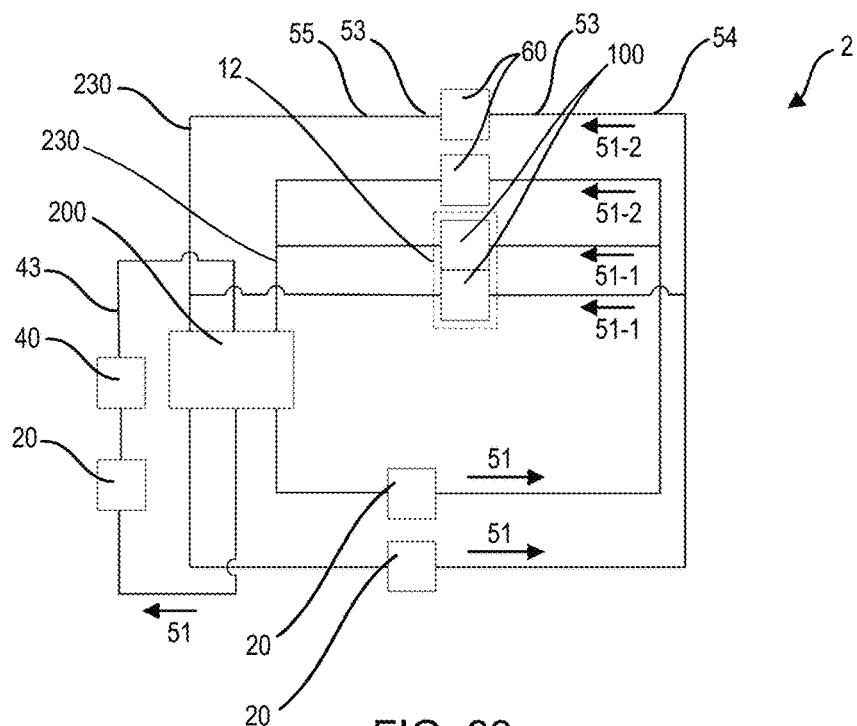

FIG. 69 shows a schematic of a redundant cooling apparatus having a first cooling apparatus, a second cooling apparatus, and a heat rejection loop having a pump and a heat exchanger, where the first cooling apparatus, the second cooling apparatus, and the heat rejection loop are fluidly connected to a common reservoir.

Figure 70:
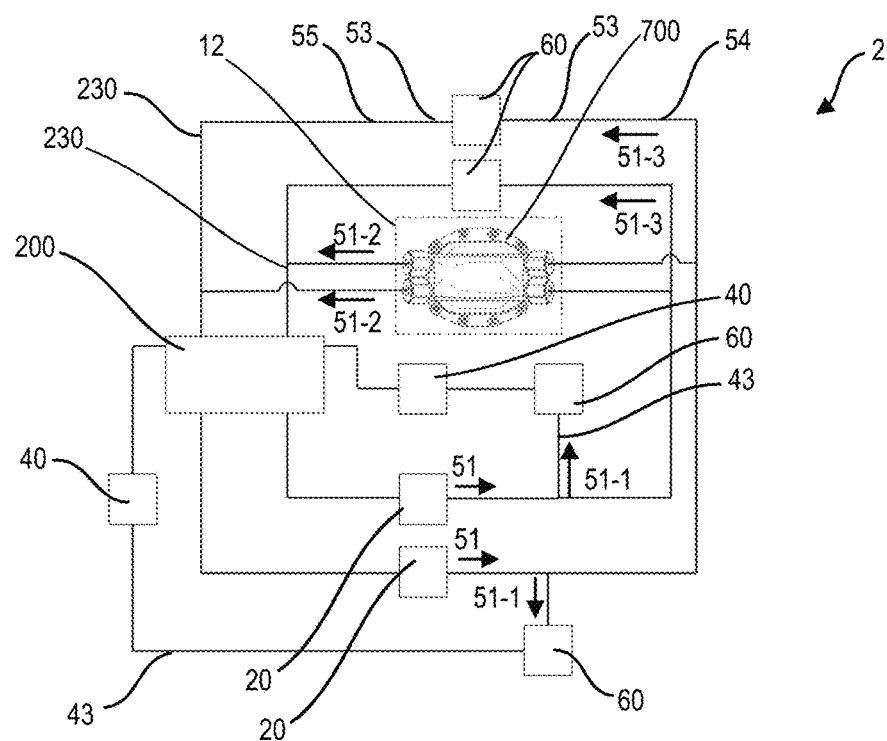

FIG. 70 shows a schematic of a redundant cooling apparatus having a redundant heat sink module mounted on a heat source, the redundant heat sink module having a first independent fluid pathway fluidly connected to a first cooling apparatus and a second independent fluid pathway fluidly connected to a second cooling apparatus, the first and second cooling apparatuses sharing a common reservoir but having independent heat exchangers.

Figure 71:
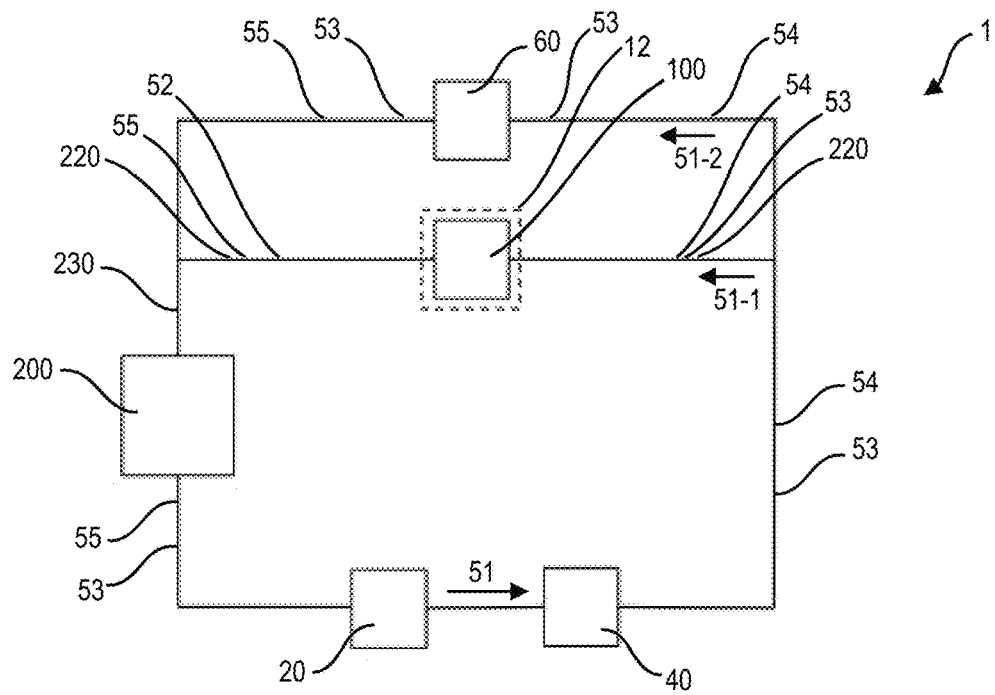

FIG. 71 shows a schematic of a cooling apparatus having a primary cooling loop and a bypass, where the primary cooling loop includes a pump, a heat exchanger, a heat sink module mounted on a heat source, and a reservoir, and the bypass includes a valve configured to control a pressure differential between an inlet port and an outlet port of the heat sink module.

Figure 72:
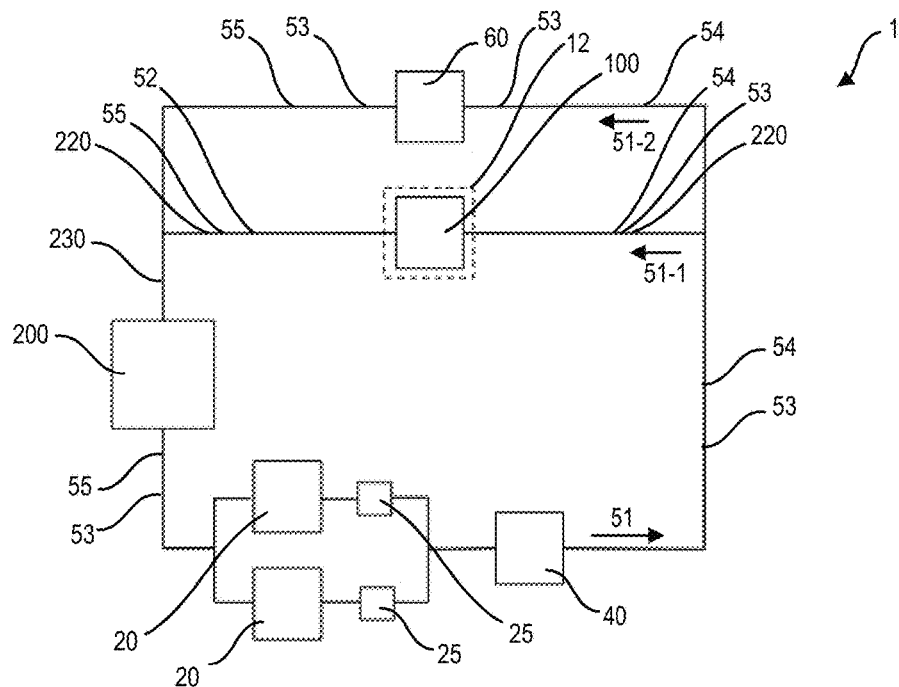

FIG. 72 shows a schematic of a cooling apparatus having a primary cooling loop and a bypass, where the primary cooling loop includes redundant, parallel pumps with check valves, a reservoir, a heat exchanger, a heat sink module mounted on a heat source, and the bypass includes a valve configured to control a pressure differential between an inlet port and an outlet port of the heat sink module.

Figure 73:
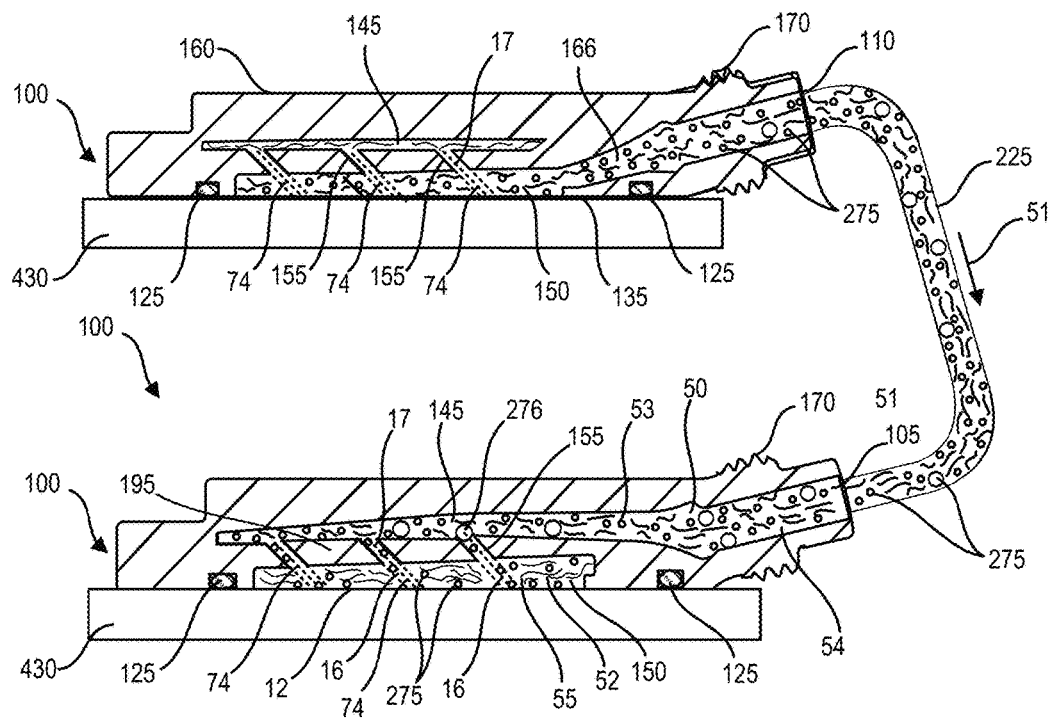

FIG. 73 shows a cross-sectional view of a first heat sink module fluidly connected to a second heat sink module by a section of flexible tubing, where single-phase flow delivered to an inlet chamber of the first heat sink module becomes two-phase bubbly flow within an outlet chamber of the first heat sink module due to heat being transferred from a first surface to be cooled to the flow, where flexible tubing transports the two-phase bubbly flow from an outlet port of the first heat sink module to an inlet port of a second heat sink module, where the two-phase bubbly flow is delivered to an inlet chamber of the second heat sink module and passes as a plurality of jet streams through a plurality of orifices within the second heat sink module, the jet streams configured to impinge against a second surface to be cooled and absorb heat from the second surface to be cooled.

Figure 74:
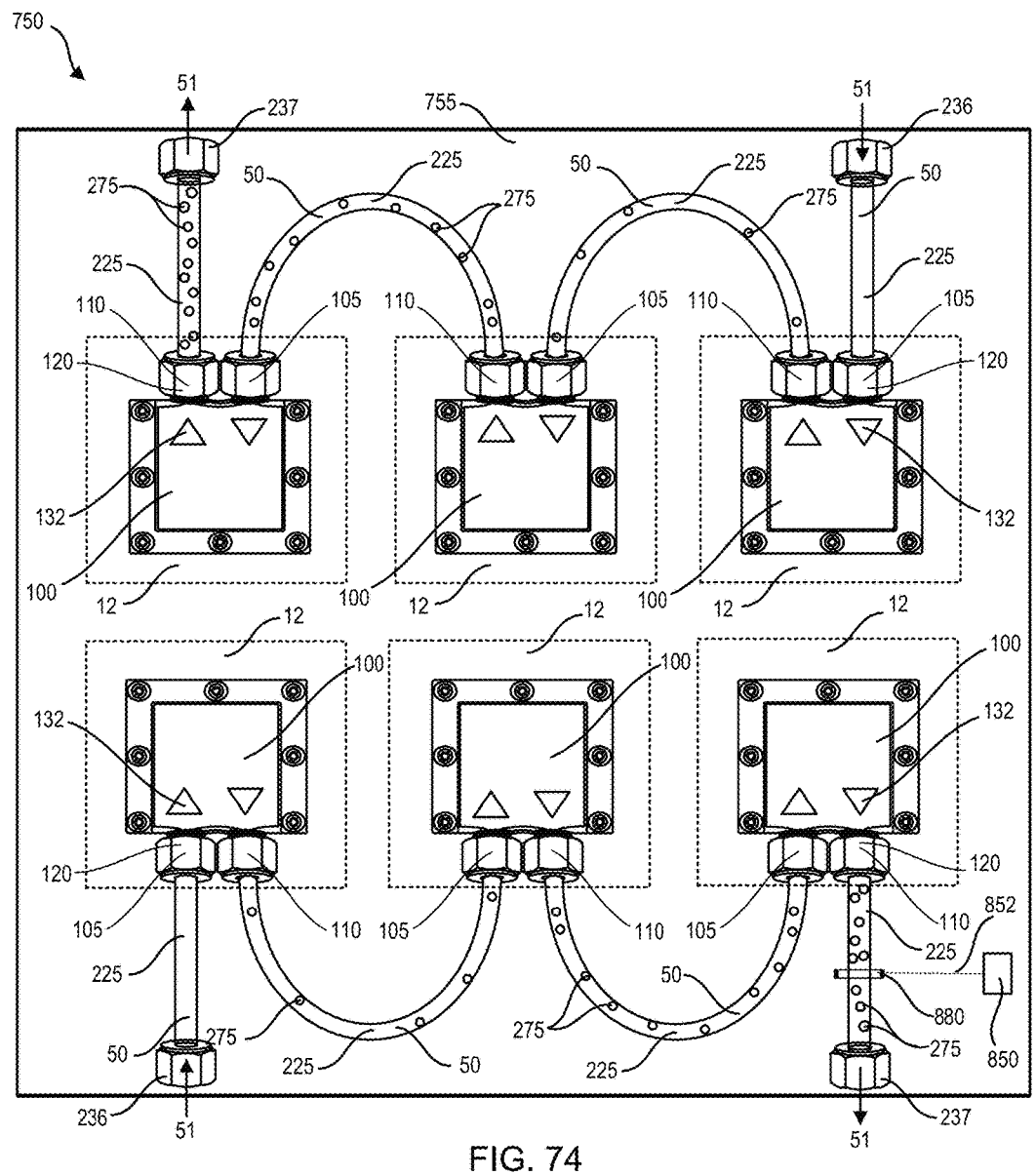

FIG. 74 shows a portable cooling device that includes a plurality of heat sink modules mounted on a portable layer, the portable layer being conformable to a contoured heated surface or rigid and including one or more inlet connections and one or more outlet connections that can be connected to a cooling apparatus that delivers a flow of pressurized coolant to the portable cooling device to permit cooling of the heated surface through latent heating of the coolant within the plurality of heat sink modules.

Figure 75:
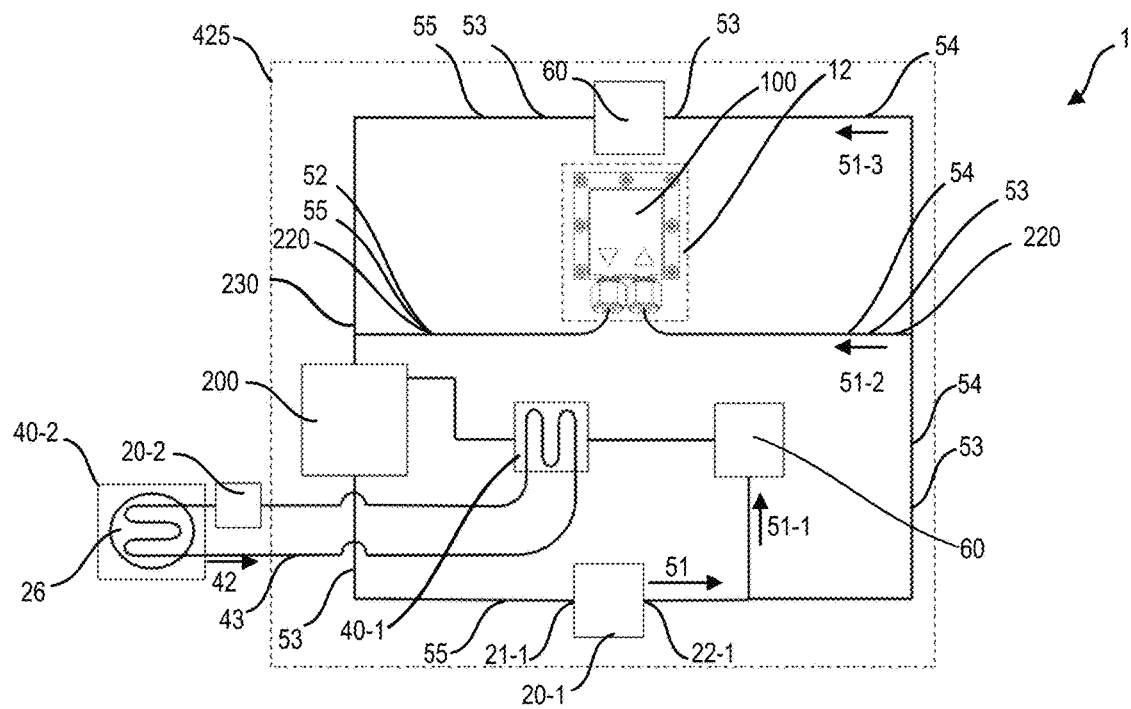

FIG. 75 shows a schematic of a preferred cooling apparatus having a primary cooling loop, a first bypass, and a second bypass, where the first bypass includes a liquid-to-liquid heat exchanger fluidly connected to an external heat exchanger located outside of a room where the cooling apparatus is located, the external heat exchanger being connected to the heat exchanger by an external heat rejection loop having a pump configured to circulate external cooling fluid, such as a water-glycol mixture, through the external heat rejection loop, the external heat exchanger being an air-to-liquid heat exchanger.

Figure 76:
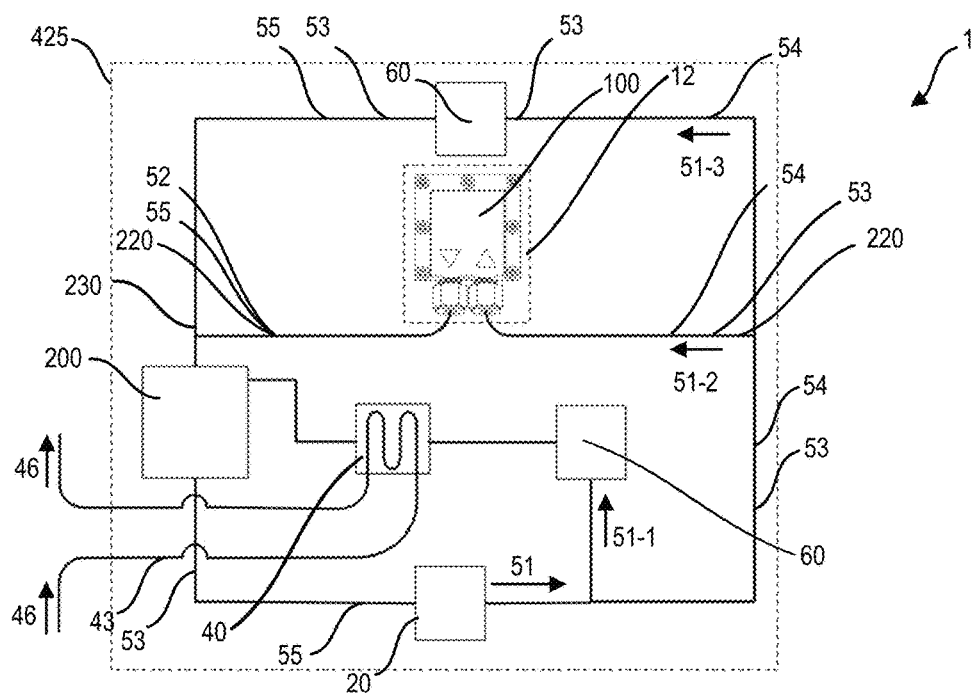

FIG. 76 shows a schematic of a cooling apparatus having a primary cooling loop, a first bypass, and a second bypass, where the first bypass includes a liquid-to-liquid heat exchanger fluidly connected to a heat rejection loop, the heat rejection loop being a supply of chilled water from a building in which the cooling apparatus is installed.

Figure 77:
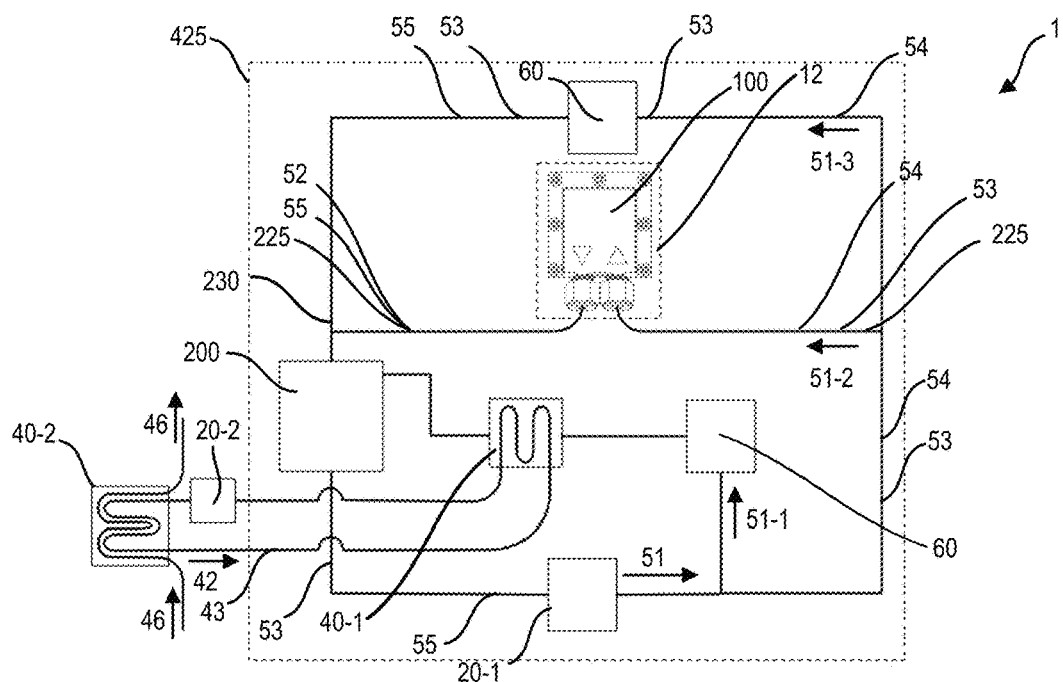

FIG. 77 shows a schematic of a preferred cooling apparatus having a primary cooling loop, a first bypass, and a second bypass, where the first bypass includes a liquid-to-liquid heat exchanger fluidly connected to an external heat exchanger located outside of a room where the cooling apparatus is located, the external heat exchanger being connected to the heat exchanger by an external heat rejection loop having a pump configured to circulate external cooling fluid, such as a water-glycol mixture, through the external heat rejection loop, the external heat exchanger being an liquid-to-liquid heat exchanger being connected to a supply of chilled water from a building in which the cooling apparatus is installed.

Figure 78:
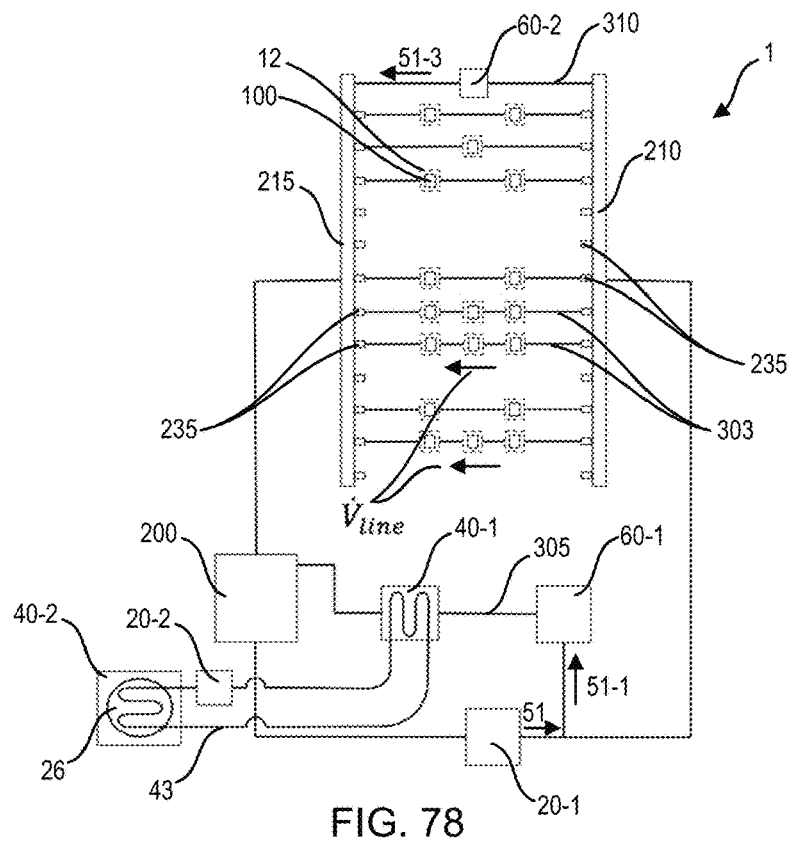

FIG. 78 shows a schematic of a cooling apparatus that is configured to allow cooling lines to be added or removed (hot-swapped) during operation of the cooling apparatus without causing unstable two-phase flow in the cooling apparatus.

Figure 79:
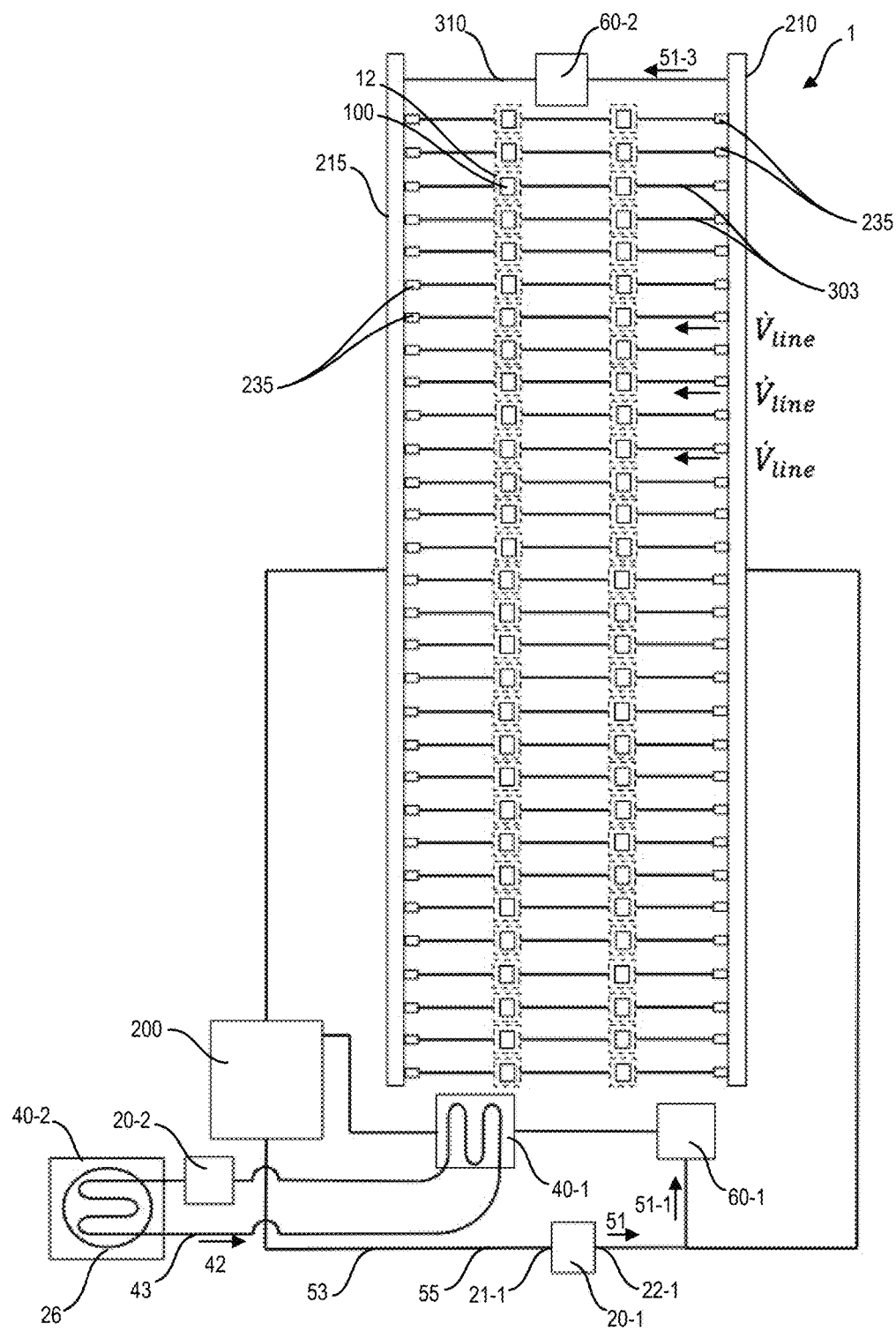

FIG. 79 shows a schematic of a cooling apparatus having an inlet manifold, an outlet manifold, a valve fluidly connected between the inlet manifold and the outlet manifold, and thirty cooling lines extending from the inlet manifold to the outlet manifold.

Figure 80:
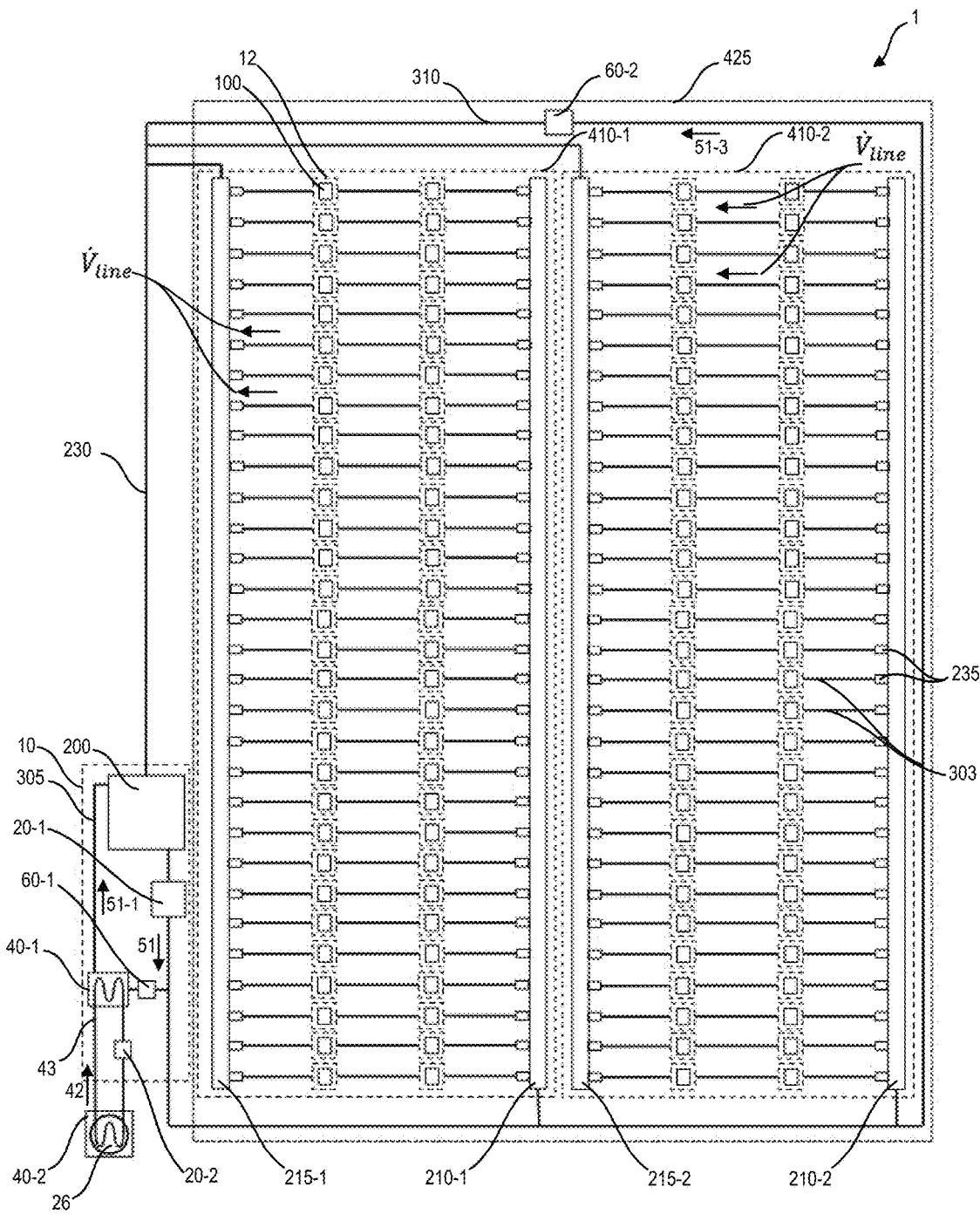

FIG. 80 shows a schematic of a cooling apparatus having a first inlet manifold, a first outlet manifold, and a first set of thirty cooling lines associated with a first server rack, the cooling apparatus also having a second inlet manifold, a second outlet manifold, and a second set of thirty cooling lines associated with a second server rack, where a fluid distribution unit provides a flow of coolant to the first and second inlet manifolds, the fluid distribution unit including a pump and a reservoir.

Figure 81:
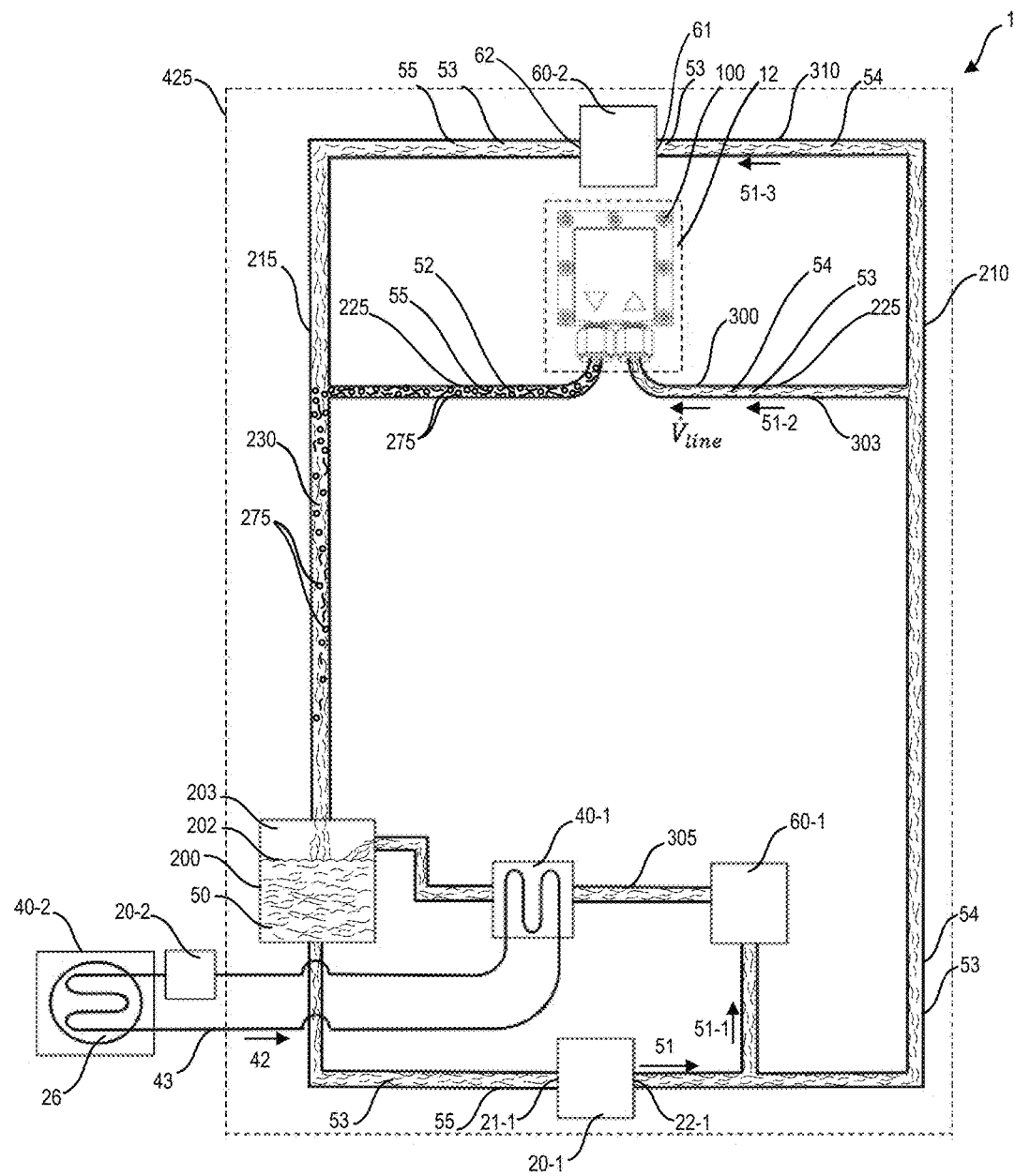

FIG. 81 shows a representation of a preferred cooling apparatus having a flow of single-phase liquid coolant being pumped from a pump outlet, a flow of subcooled single-phase liquid coolant passing through a first bypass containing a heat exchanger and a first valve, a flow of single-phase liquid coolant passing through a second bypass containing a second valve, a flow of single-phase liquid coolant passing through a cooling line into a heat sink module and exiting the heat sink module as two-phase bubbly flow due to heat transfer from a heat-providing surface to the coolant, a mixed flow of single-phase liquid coolant and two-phase bubbly flow passing through a return line to a reservoir, where vapor in the two-phase bubbly flow is condensed back to liquid in the return line due to heat transfer from the two-phase bubbly flow to the single-phase liquid coolant resulting in sensible heating of the single-phase liquid coolant.

Figure 82:
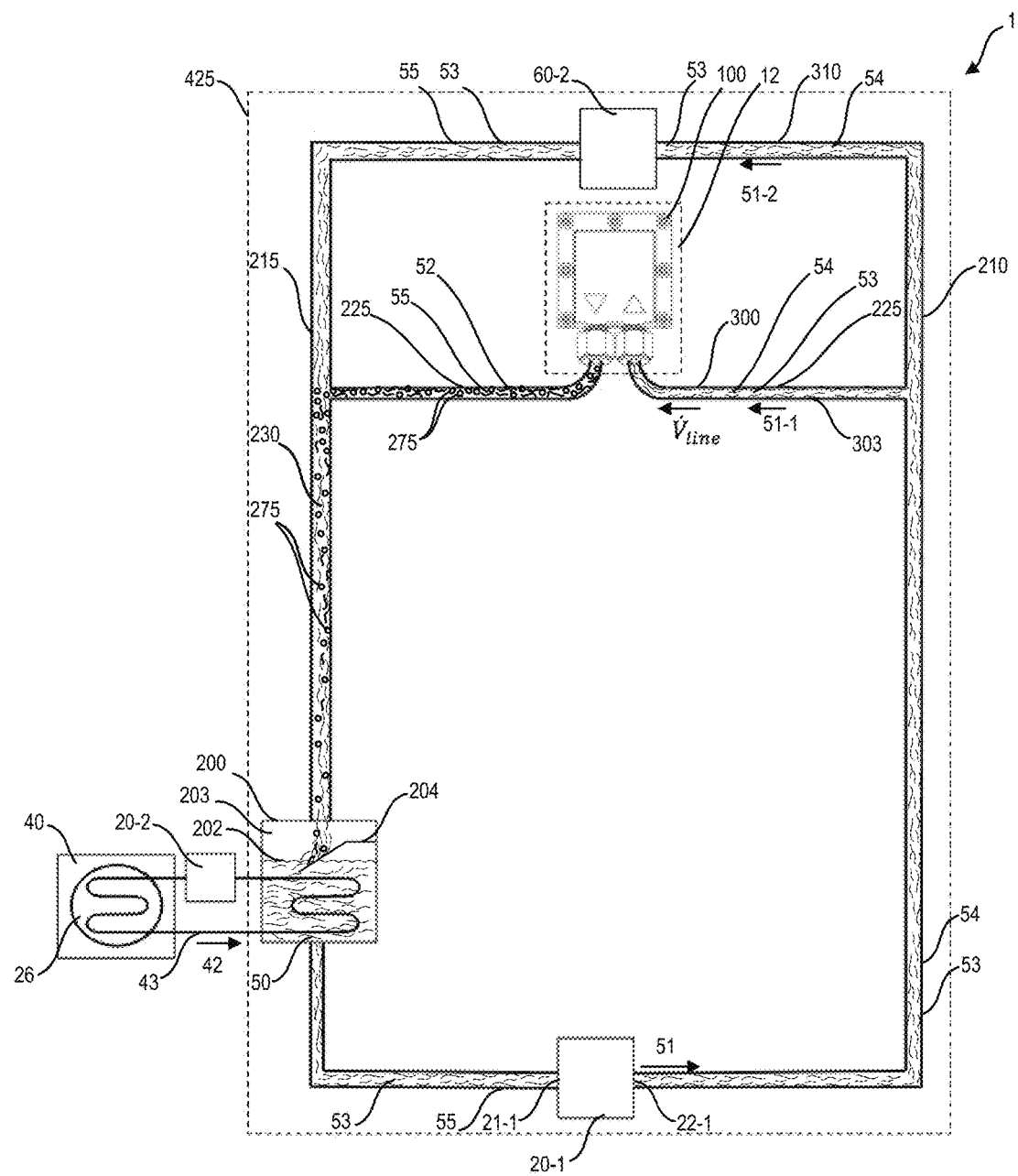

FIG. 82 shows a representation of a cooling apparatus having a flow of single-phase liquid coolant being withdrawn from a reservoir and pumped from a pump outlet, a flow of single-phase liquid coolant passing through a bypass containing a valve, a flow of single-phase liquid coolant passing through a cooling line into a heat sink module and exiting the heat sink module as two-phase bubbly flow due to heat transfer from a heat-providing surface to the coolant, a mixed flow of single-phase liquid coolant and two-phase bubbly flow passing through a return line to the reservoir, where vapor in the two-phase bubbly flow is condensed back to liquid in the return line and in the reservoir due to heat transfer from the two-phase bubbly flow to subcooled liquid coolant in the reservoir.

Figure 83:
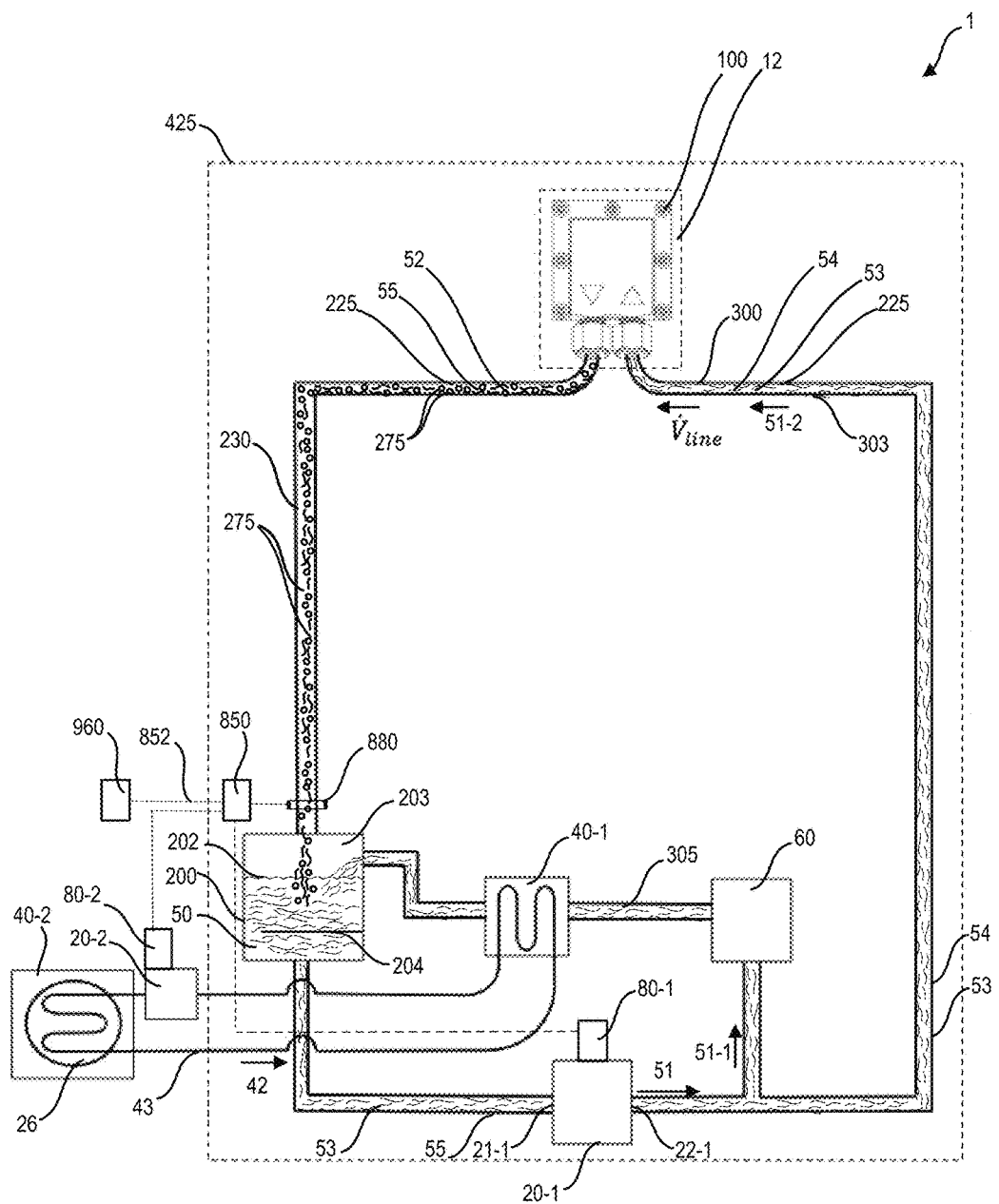

FIG. 83 shows a representation of a cooling apparatus having a flow of single-phase liquid coolant being withdrawn from a reservoir pumped from a pump outlet, a flow of subcooled single-phase liquid coolant passing through a bypass containing a heat exchanger and a first valve, a flow of single-phase liquid coolant passing through a cooling line into a heat sink module and exiting the heat sink module as two-phase bubbly flow due to heat transfer from a heat-providing surface to the coolant, mixing of the two-phase bubbly flow and the flow of subcooled single-phase liquid coolant in the reservoir, where vapor in the two-phase bubbly flow is condensed back to liquid in the reservoir due to heat transfer from the two-phase bubbly flow to the subcooled single-phase liquid coolant.

Figure 84:
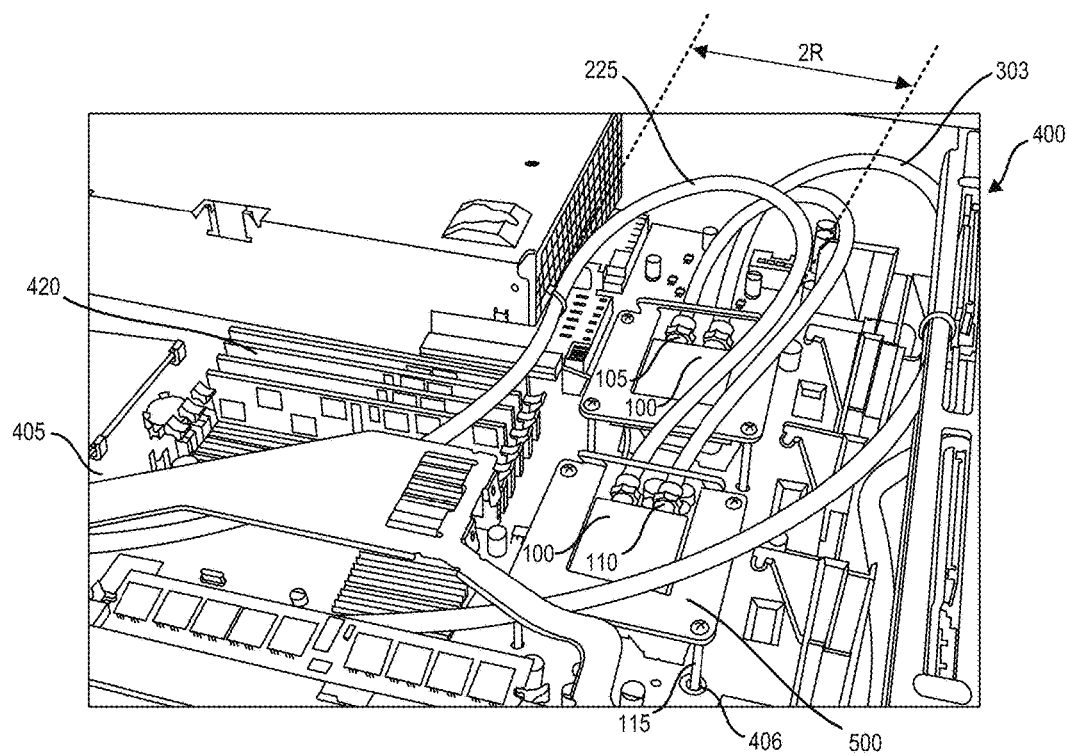

FIG. 84 shows a top perspective view of two series-connected heat sink modules installed on top of microprocessors within a server housing, each heat sink module held in place by a mounting bracket secured to mounting holes in the motherboard using threaded fasteners, the heat sink modules being fluidly connected with flexible tubing.

Figure 85:
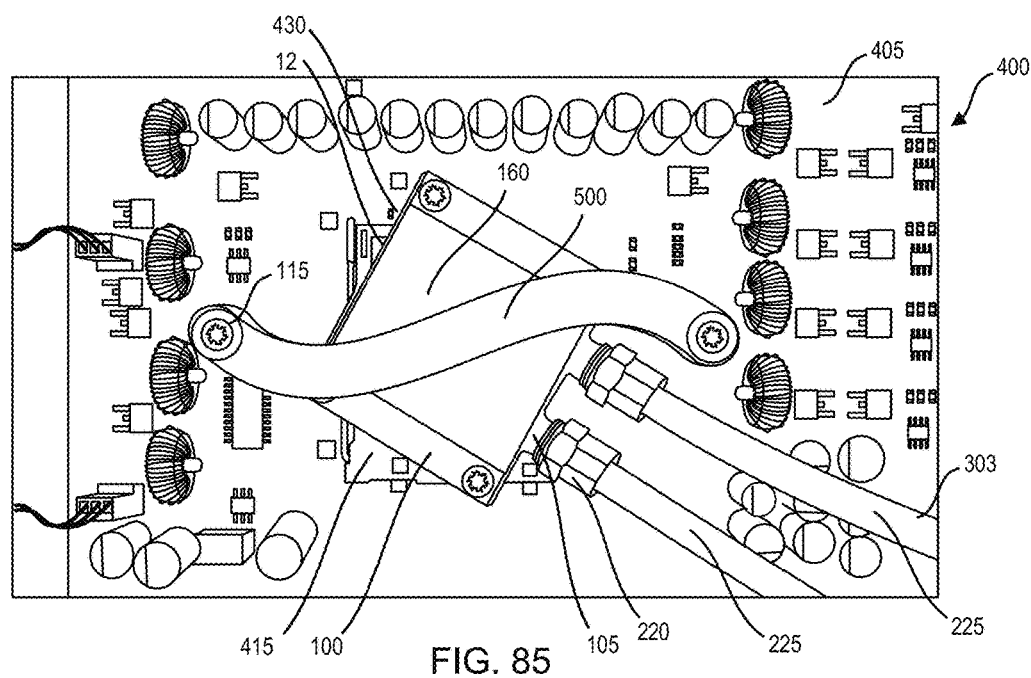

FIG. 85 shows a top view of a heat sink module mounted on a microprocessor in a server, the heat sink module being secured to a motherboard of the server by an S-shaped bracket that permits variable positioning of the heat sink module on a top surface of the microprocessor for ease of routing sections of flexible tubing that transport coolant to and from the heat sink module.

Figure 86:
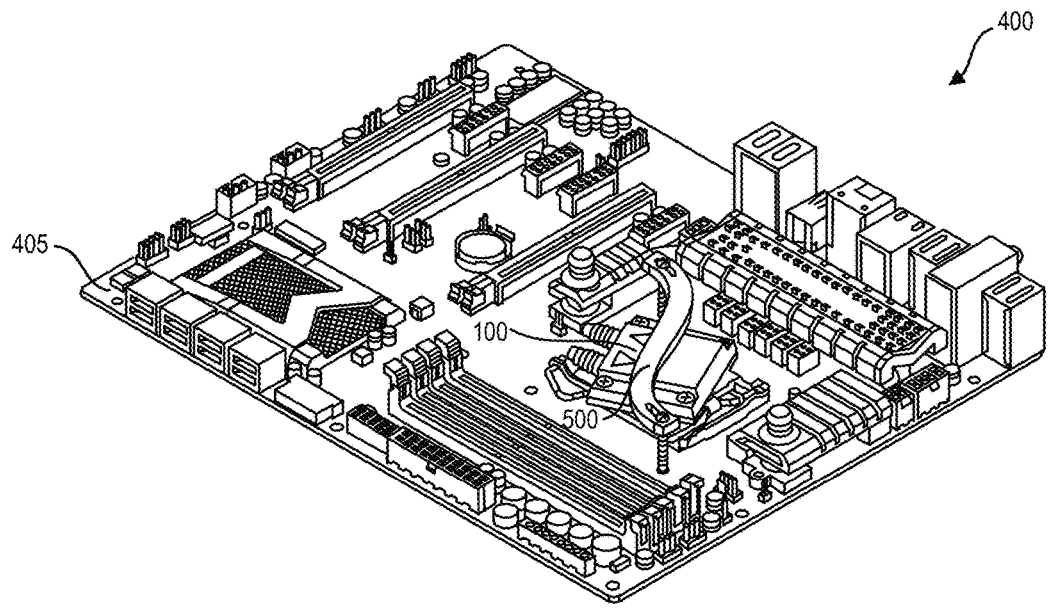

FIG. 86 shows a top perspective view of a heat sink module mounted on top of a microprocessor of a motherboard with an S-shaped bracket prior to installation of flexible cooling lines to and from an inlet port and an outlet port, respectively, of the heat sink module.

Figure 87:
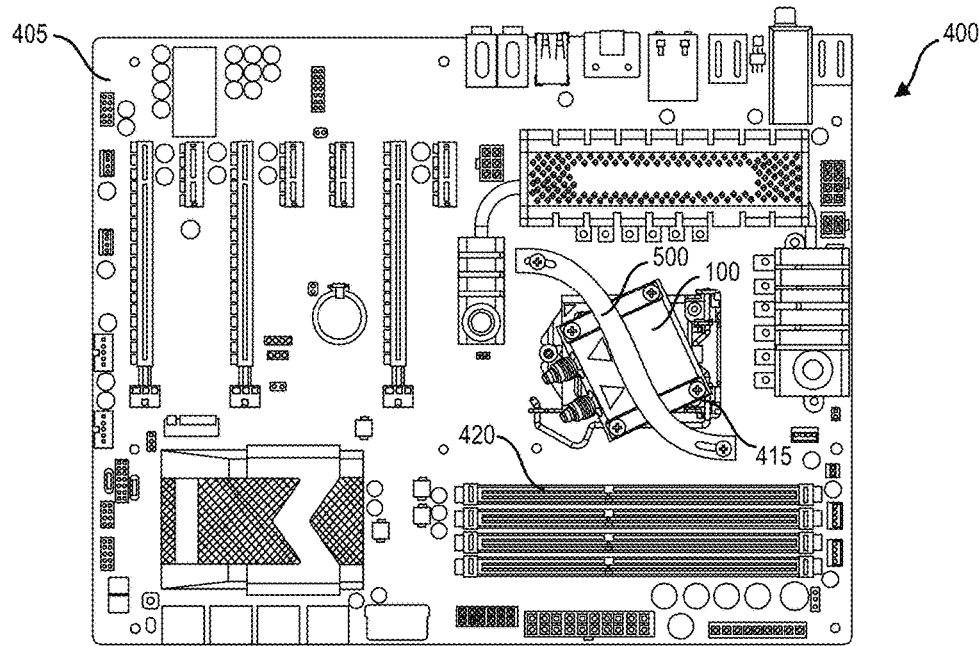

FIG. 87 shows a top view of the motherboard of FIG. 86.

Figure 88:
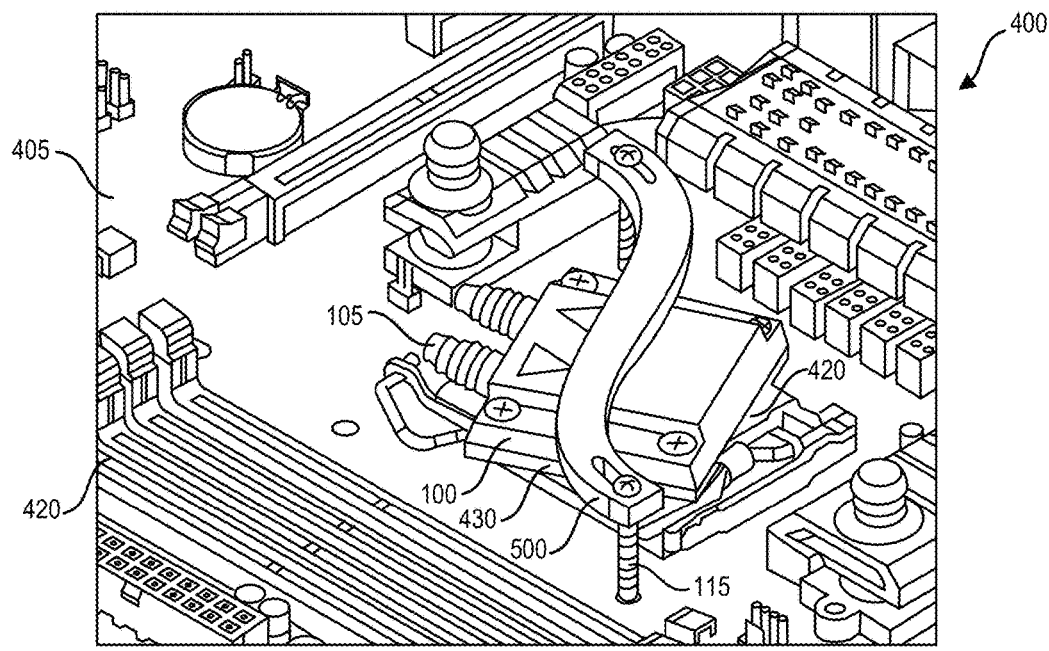

FIG. 88 shows an enlarged top perspective view of the motherboard of FIG. 86 showing the heat sink module mounted on top of the microprocessor.

Figure 89:
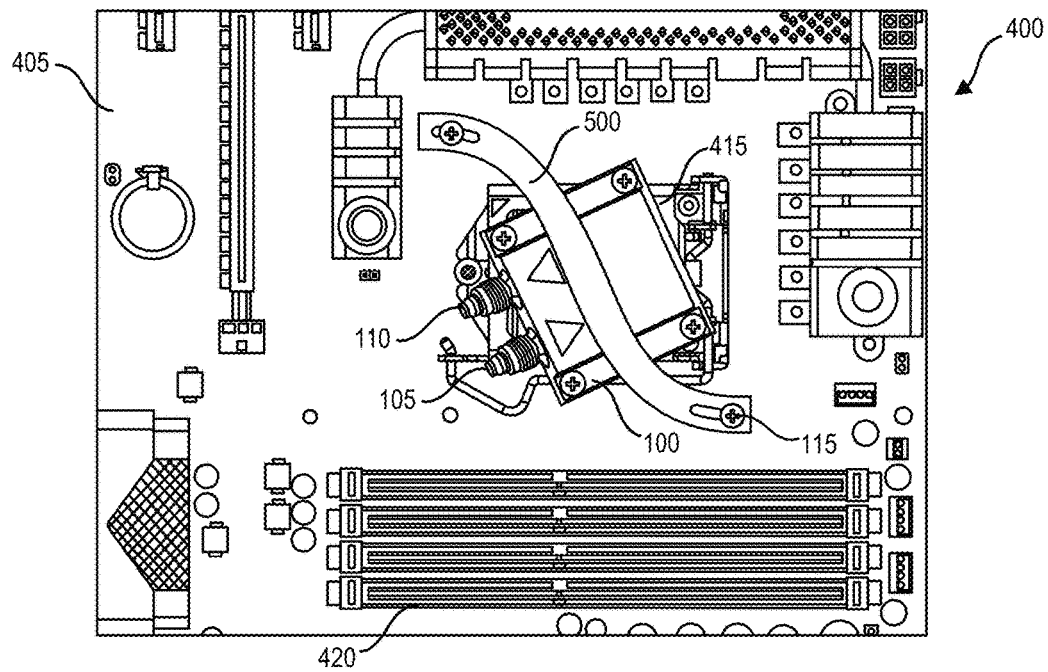

FIG. 89 shows an enlarged top view of the motherboard of FIG. 86 showing the heat sink module mounted on top of the processor.

Figure 90:
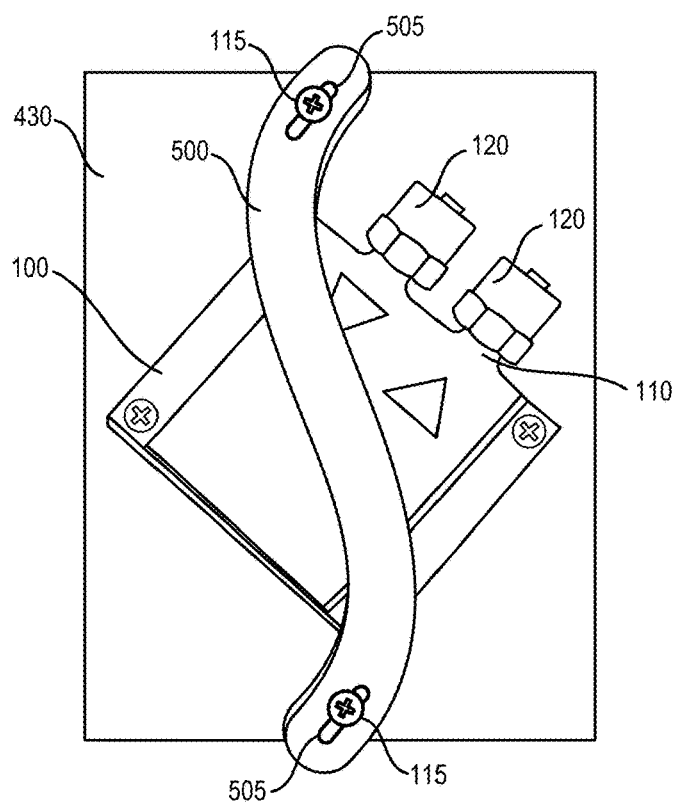

FIG. 90 shows a top view of a heat sink module mounted on a thermally conductive base member with an S-shaped mounting bracket with slotted mounting holes.

Figure 91:
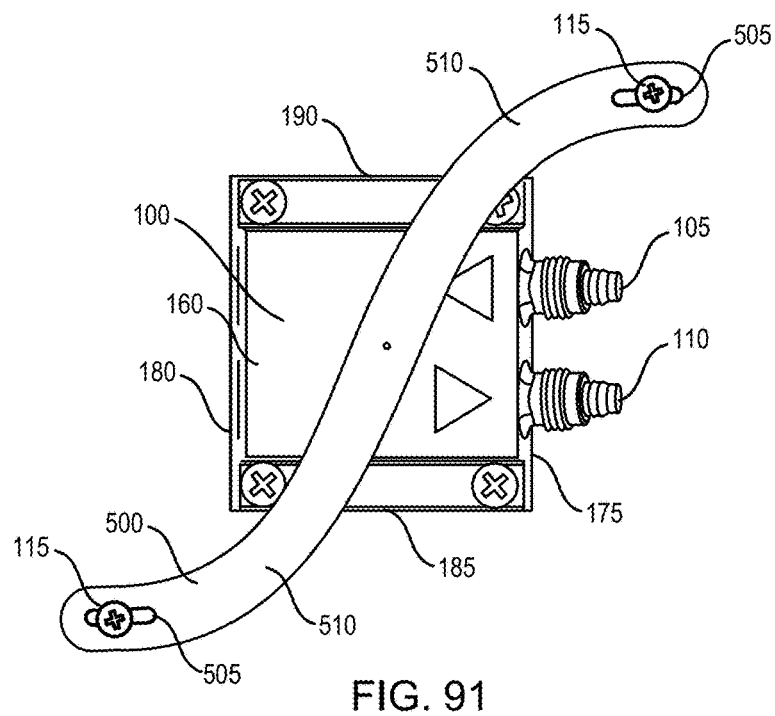

FIG. 91 shows a top view of a heat sink module with an S-shaped mounting bracket with slotted mounting holes.

Figure 92:
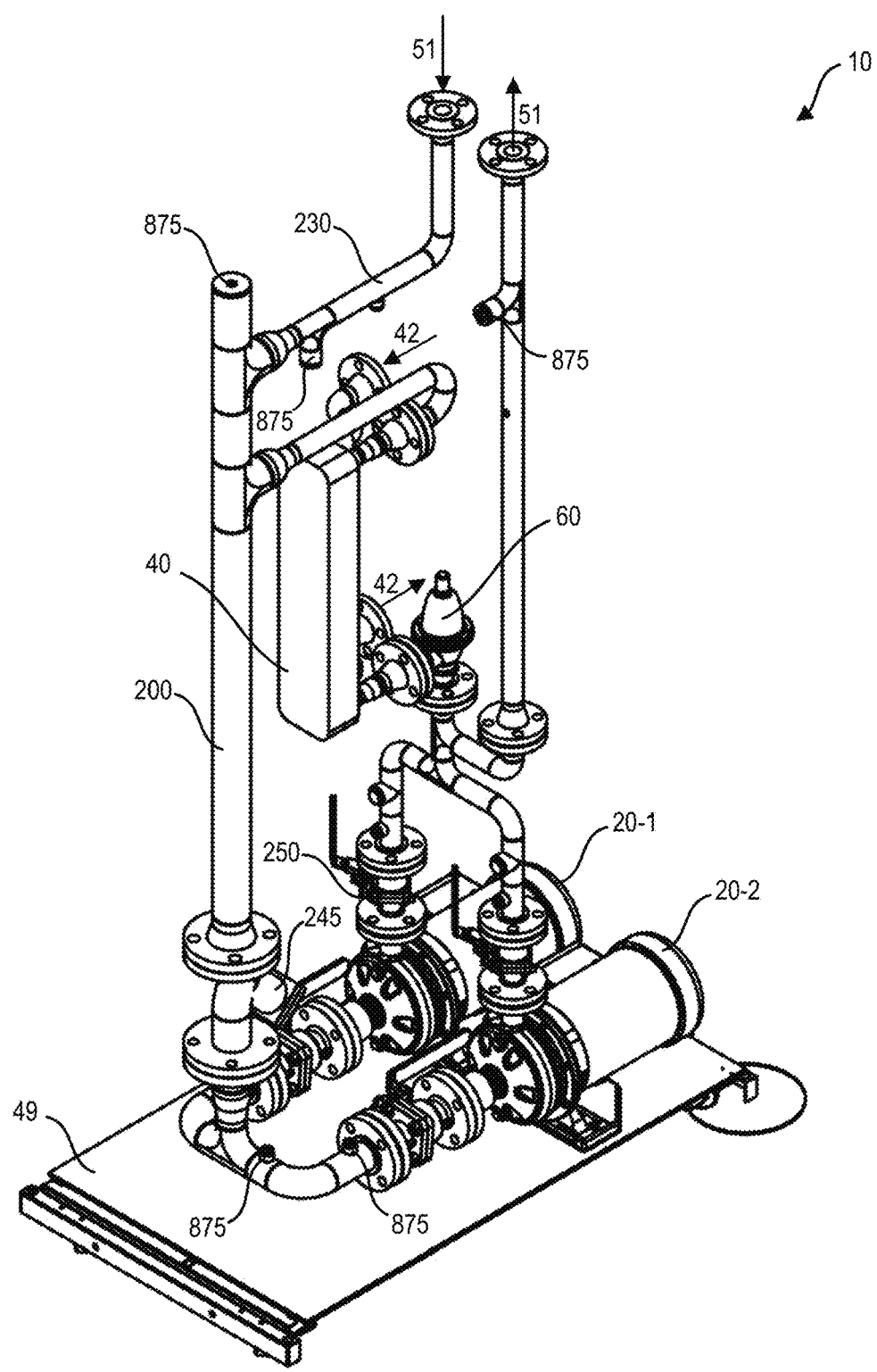

FIG. 92 shows a front perspective view of a fluid distribution unit of a cooling apparatus, the fluid distribution unit having redundant pumps with automatic failover circuitry, a reservoir, and a bypass with a valve and a heat exchanger, the heat exchanger configured to connect to an external heat rejection loop.

Figure 93:
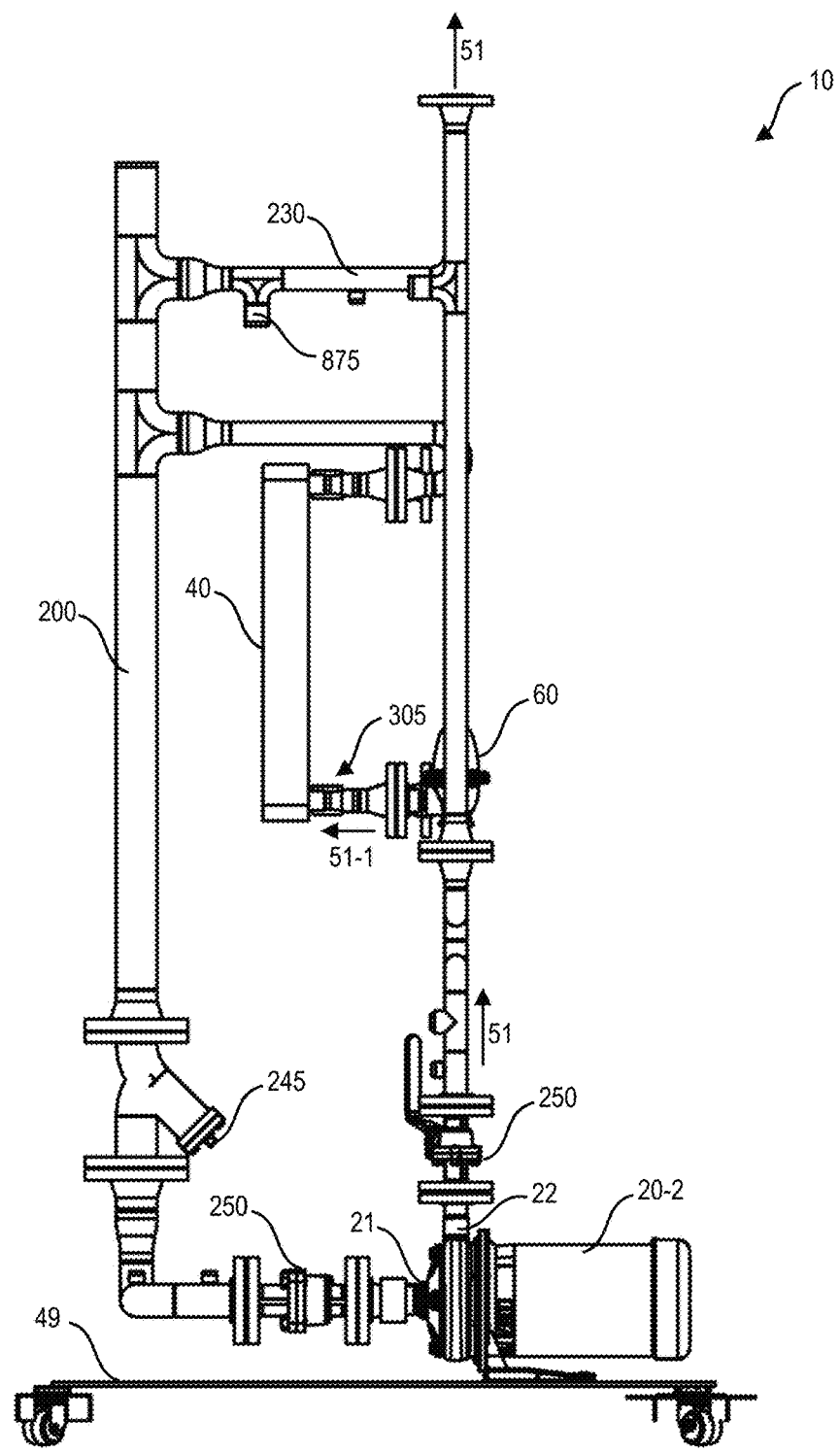

FIG. 93 shows a right side view of the fluid distribution unit of FIG. 92.

Figure 94:
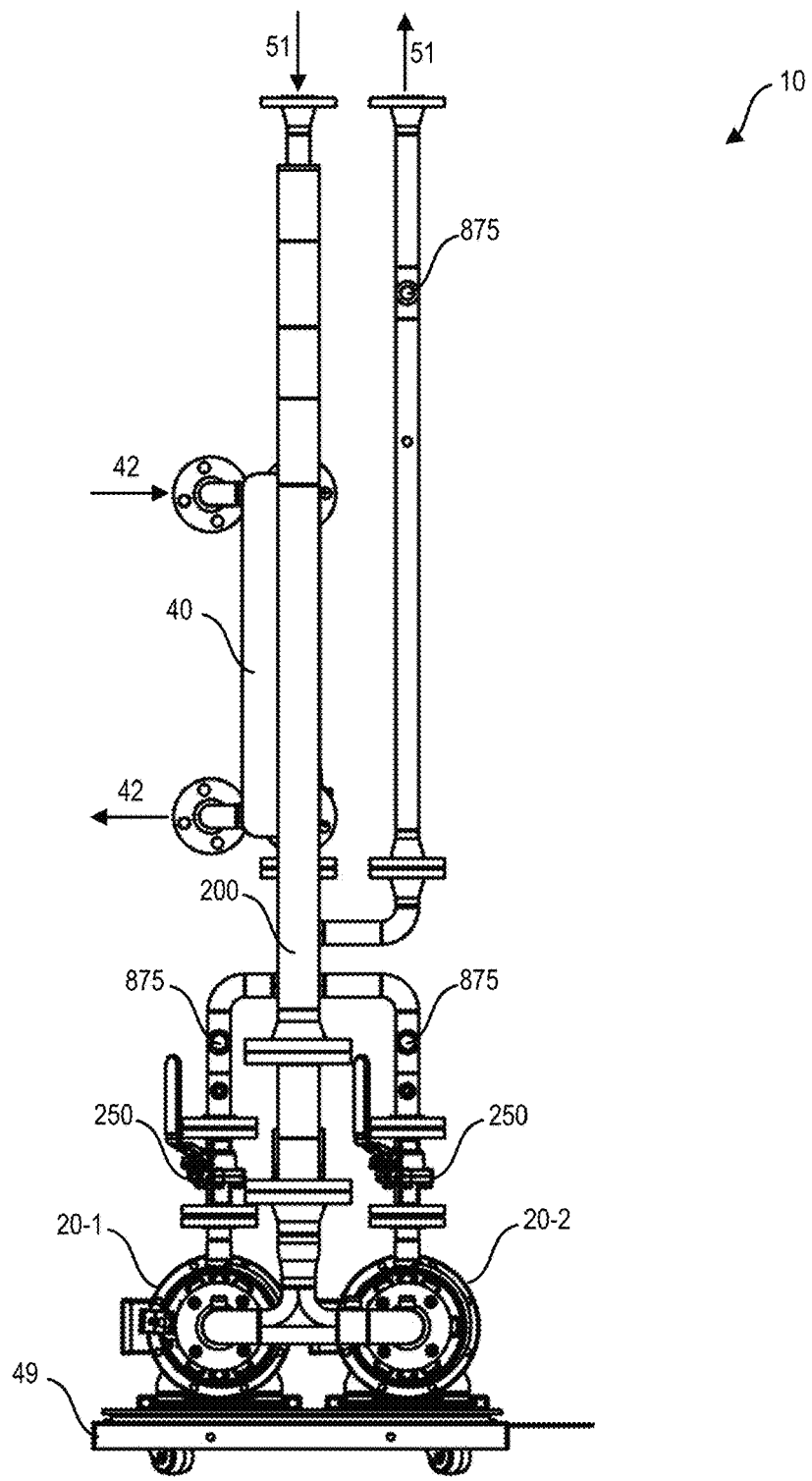

FIG. 94 shows a front view of the fluid distribution unit of FIG. 92.

Figure 95:
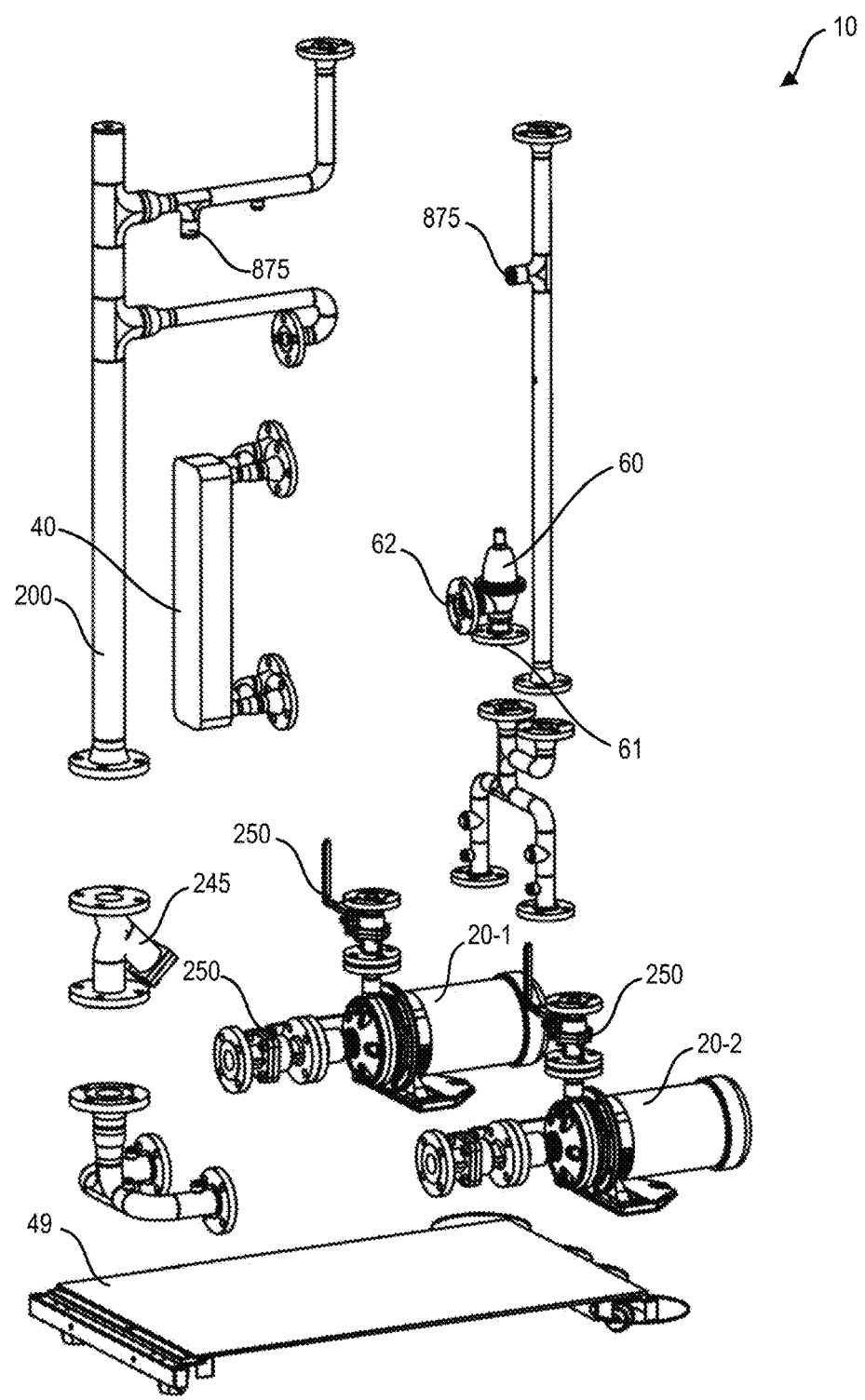

FIG. 95 shows an exploded view of the fluid distribution unit of FIG. 92.

Figure 96:
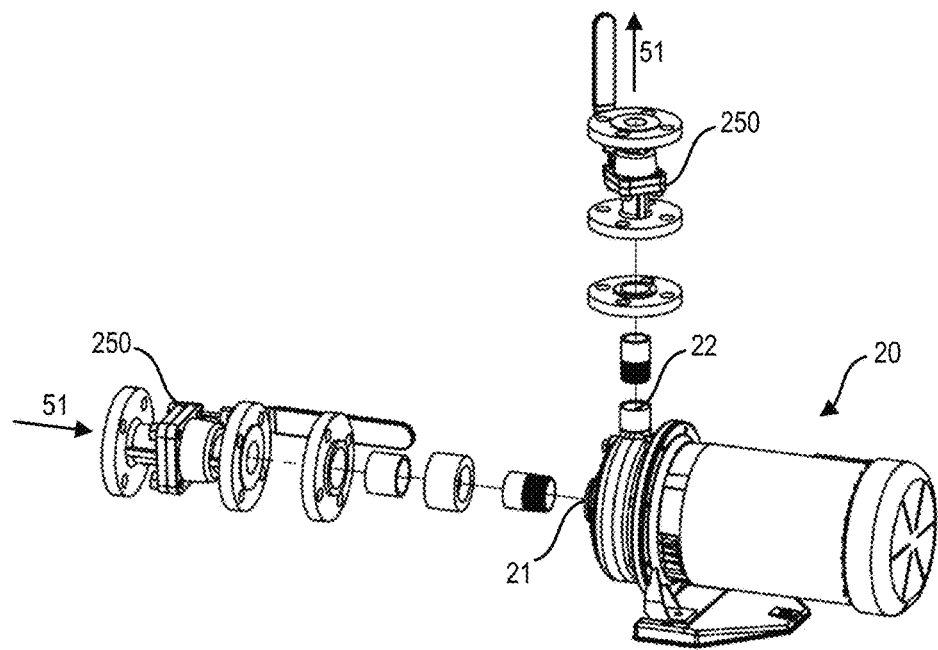

FIG. 96 shows an exploded view of the pump and shut-off valves of the fluid distribution unit of FIG. 92.

Figure 97:
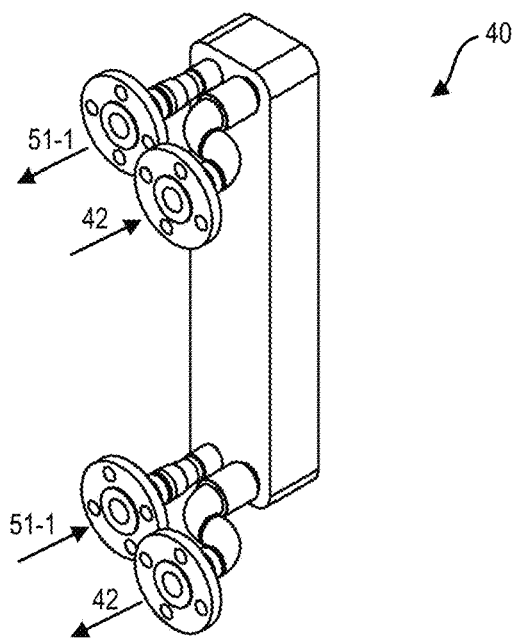

FIG. 97 shows the heat exchanger from the fluid distribution unit of FIG. 92, the heat exchanger having a first isolated fluid pathway for transporting a dielectric coolant from a first bypass of the cooling apparatus and a second isolated fluid pathway for transporting a glycol-water mixture from an external heat rejection loop, the first and second isolated fluid pathways being in thermal communication within the heat exchanger.

Figure 98:
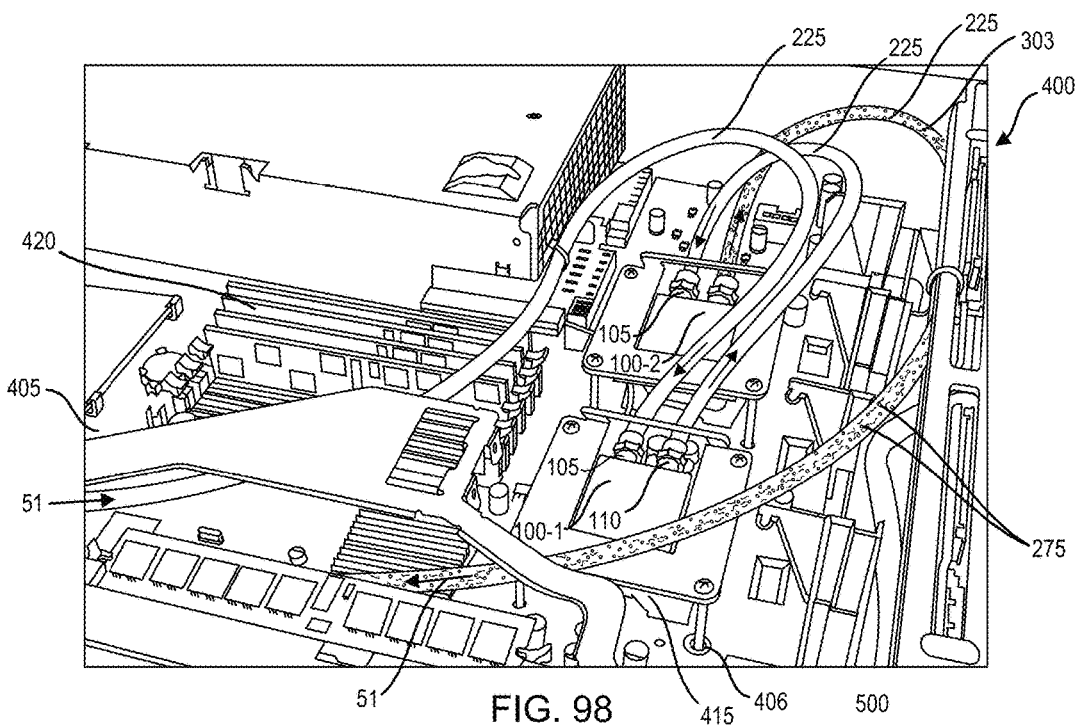

FIG. 98 shows a top perspective view of two series-connected heat sink modules installed on top of operating processors within a server, where subcooled single-phase liquid coolant is delivered to a first heat sink module wherein it absorbs sensible heat causing the temperature of the coolant to rise, and where the single-phase liquid coolant is then transported from the first module to the second heat sink module where it absorbs additional sensible heat unit it reaches its saturation temperature and thereafter absorbs latent heat resulting in formation of two-phase bubbly flow that can be transported out of the server.

Figure 99:
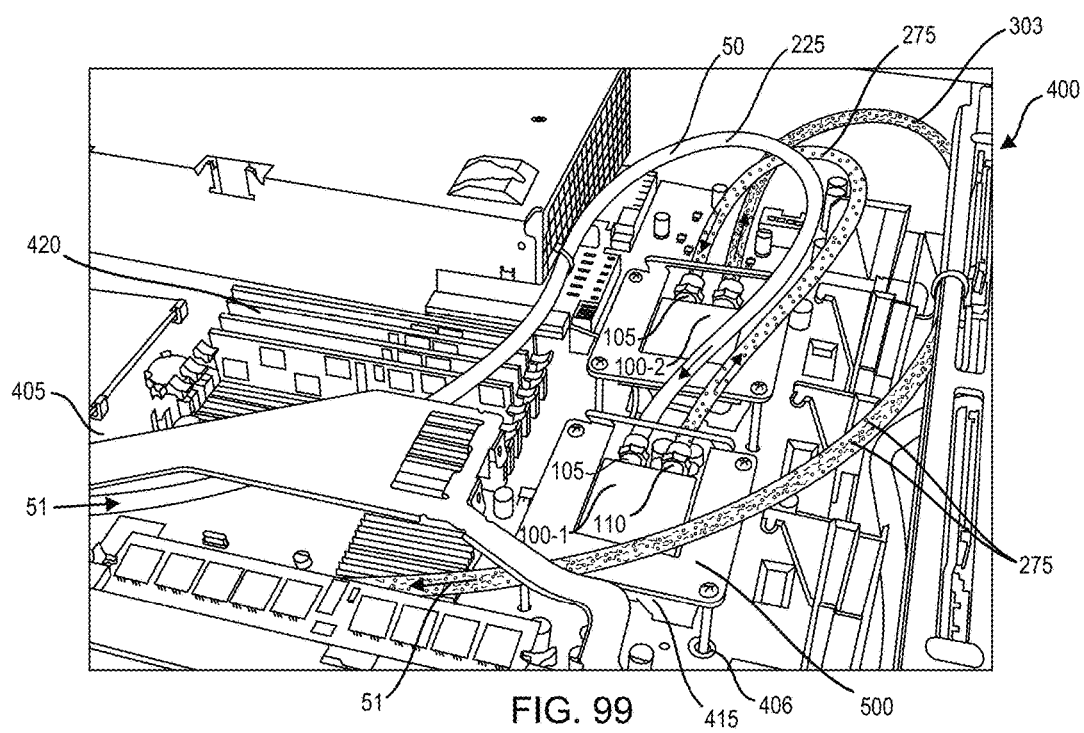

FIG. 99 shows a top perspective view of two series-connected heat sink modules installed on top of operating processors within a server, where single-phase liquid coolant is delivered to the first heat sink module where it absorbs sensible heat until it reaches its saturation temperature and thereafter absorbs latent heat resulting in formation of two-phase bubbly flow having a first quality, and where the two-phase bubbly flow having a first quality is then transported to a second heat sink module where it absorbs additional latent heat resulting in additional bubble formation, thereby changing the two-phase bubbly flow to a second quality greater than the first quality.

Figure 100:
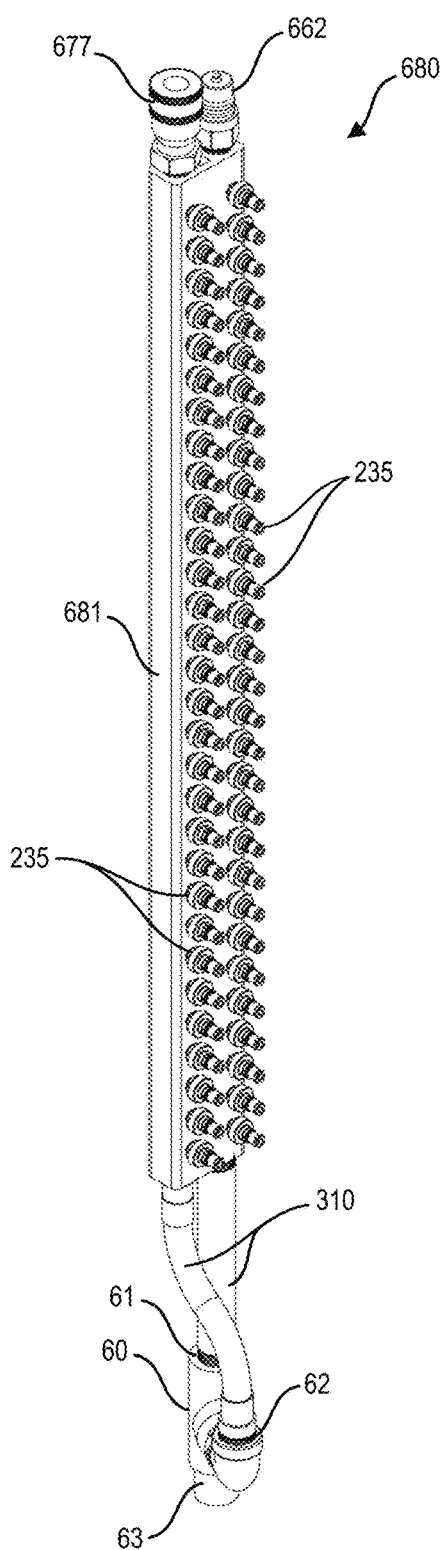

FIG. 100 shows a front perspective view of a manifold assembly for use with a cooling apparatus, the manifold assembling including an inlet chamber, an outlet chamber, thirty quick-connect fittings fluidly connected to the inlet chamber, thirty quick-connect fittings fluidly connected to the outlet chamber, a bypass fluidly connecting the inlet chamber to the outlet chamber, and a valve disposed in the bypass.

Figure 101:
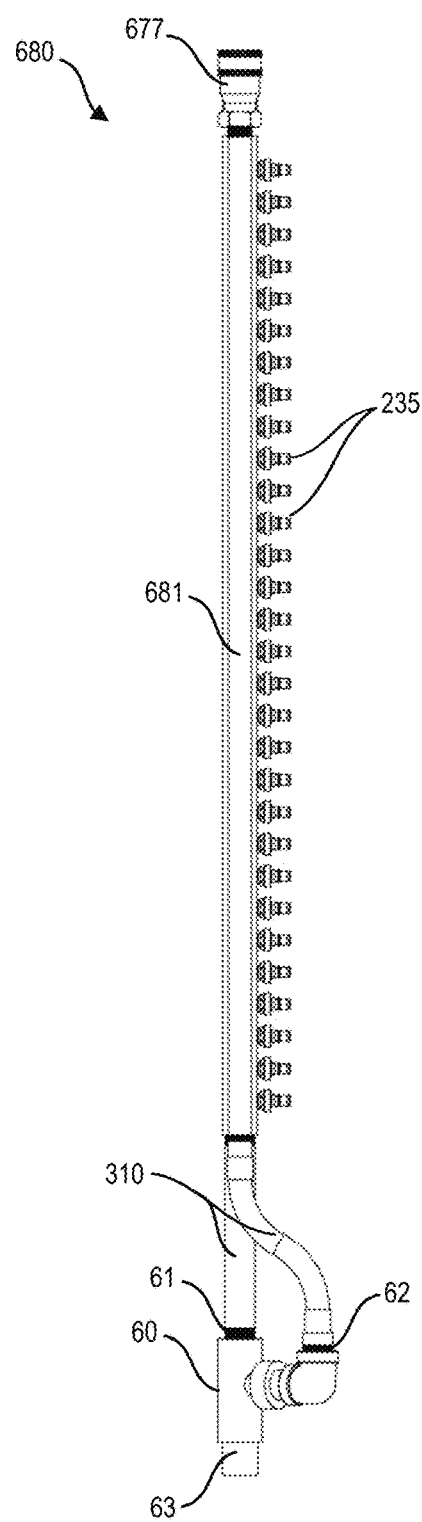

FIG. 101 shows a left side view of the manifold assembly of FIG. 100.

Figure 102:
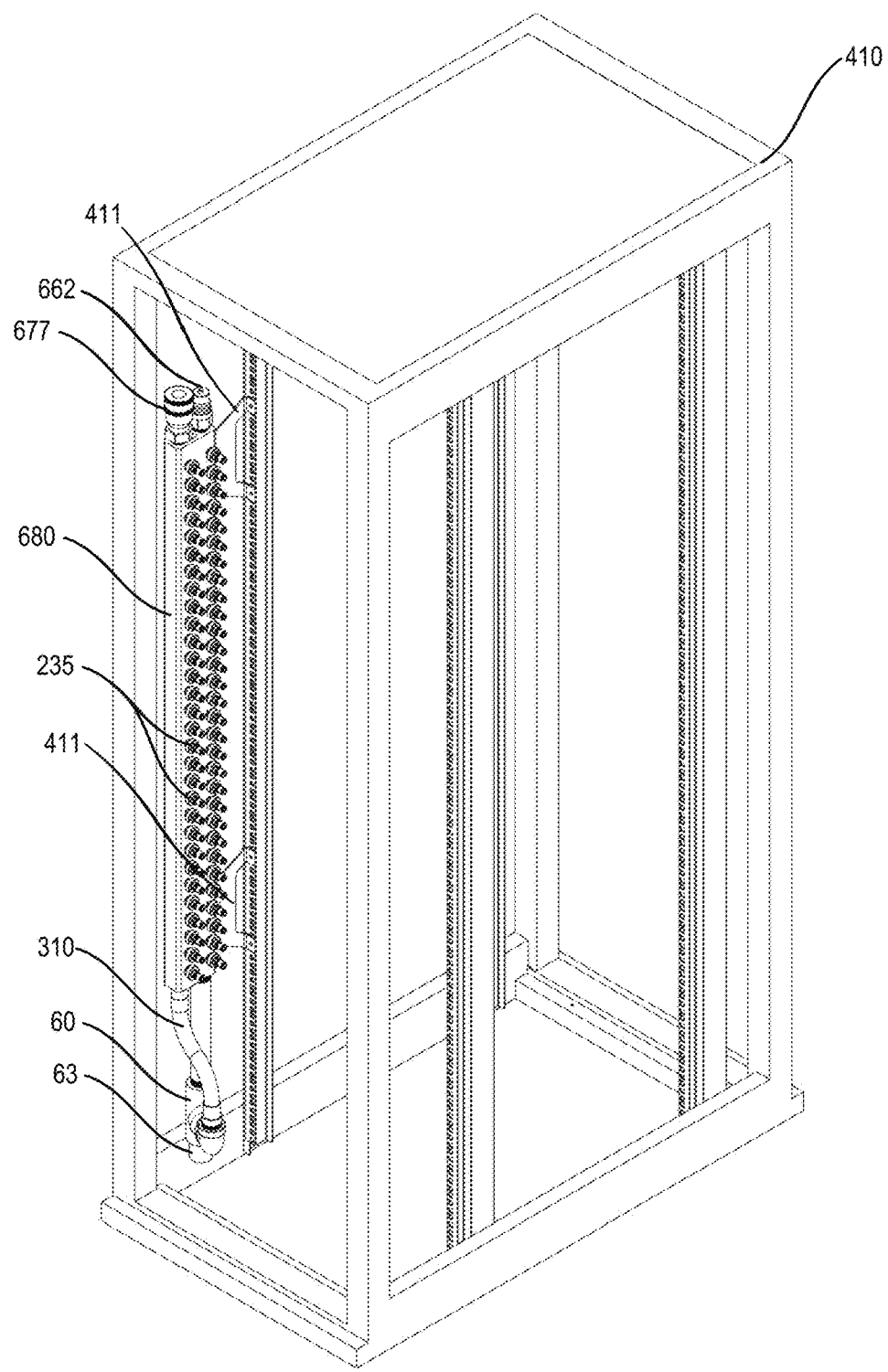

FIG. 102 shows the manifold assembly of FIG. 100 mounted to a server rack with two mounting brackets.

Figure 103:
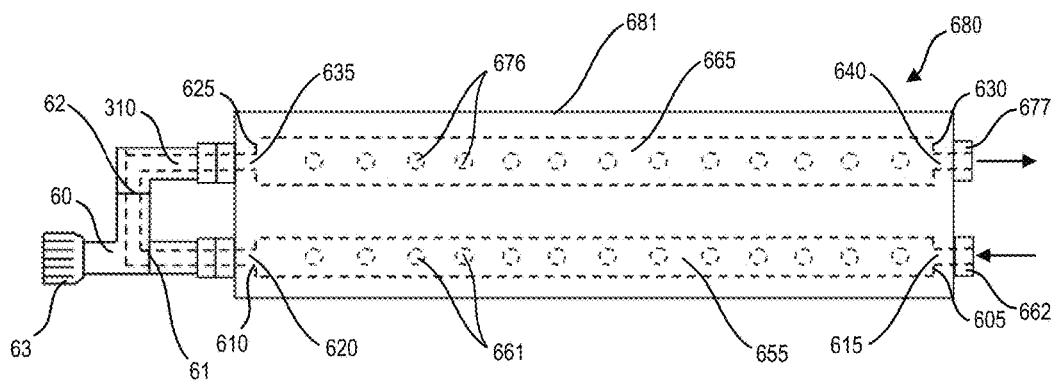

FIG. 103 shows a rear view of a manifold assembly with a valve, where fluid passageways are depicted with dashed lines.

Figure 104:
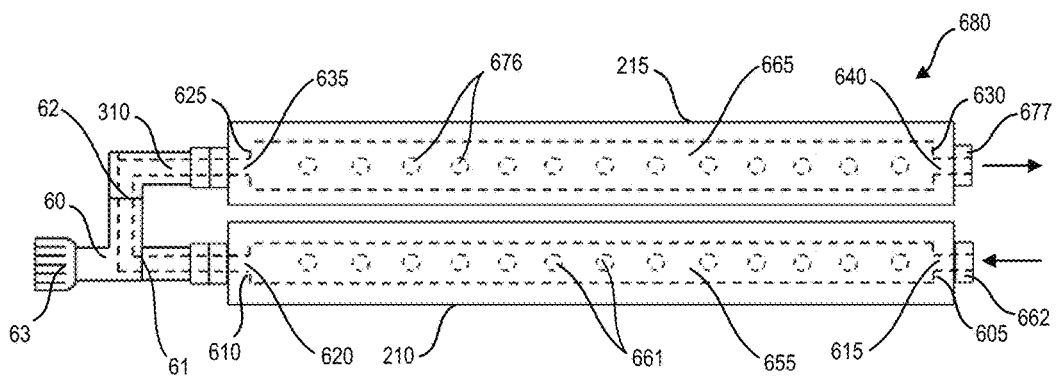

FIG. 104 shows a rear view of a manifold assembly having a valve and separate inlet and outlet manifolds, where fluid passageways are depicted with dashed lines.

Figure 105:
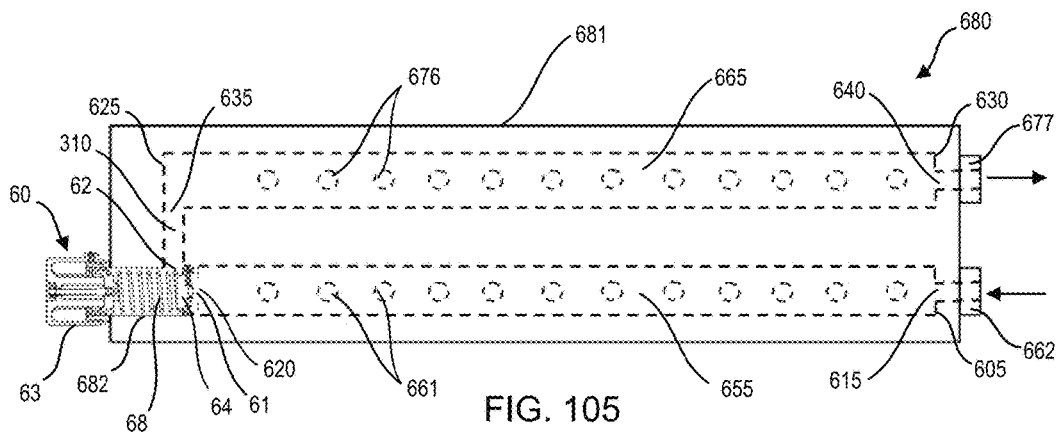

FIG. 105 shows a rear view of a manifold assembly including an integrated valve in an internal bypass of a manifold, where fluid passageways are depicted with dashed lines.

Figure 106:
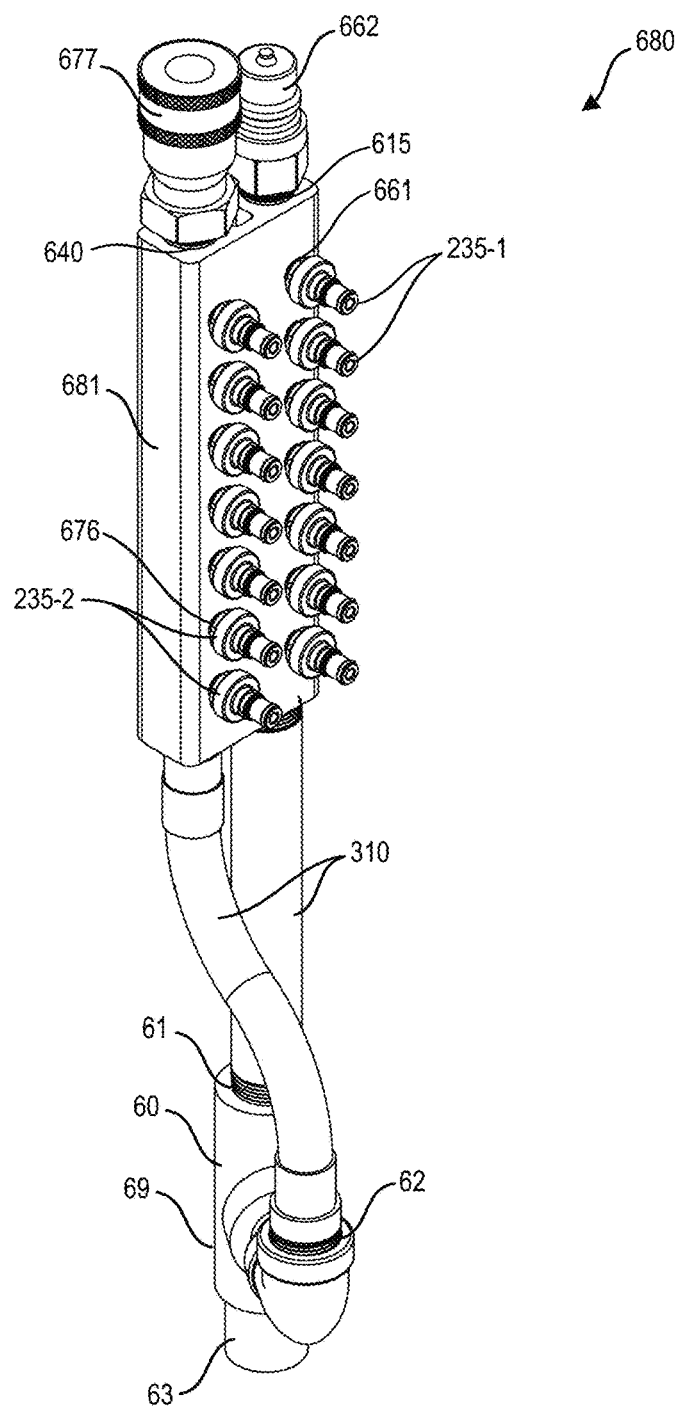

FIG. 106 shows a front perspective view of a manifold assembly for use with a cooling apparatus, the manifold assembling including an inlet chamber, an outlet chamber, seven quick-connect fittings fluidly connected to the inlet chamber, seven quick-connect fittings fluidly connected to the outlet chamber, a bypass fluidly connecting the inlet chamber to the outlet chamber, and a valve disposed in the bypass.

Figure 107:
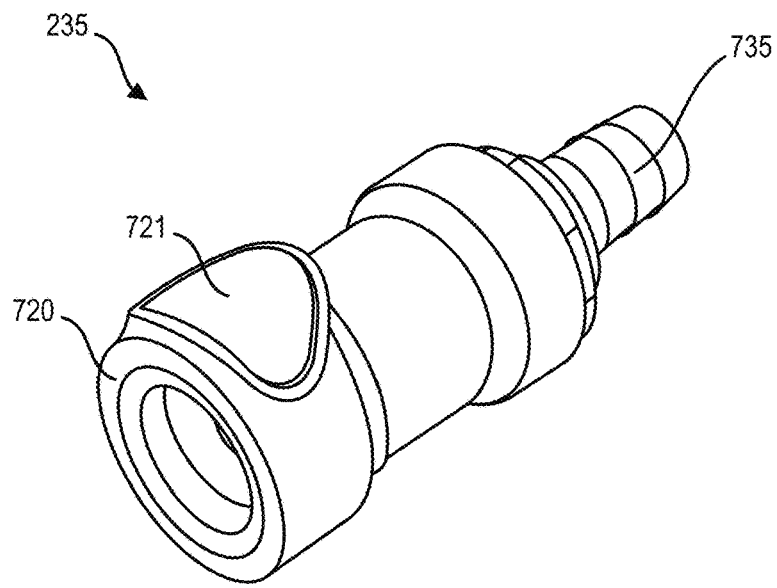

FIG. 107 shows a quick connect fitting having a barbed end and a coupler body configured to receive a coupler insert.

Figure 108:
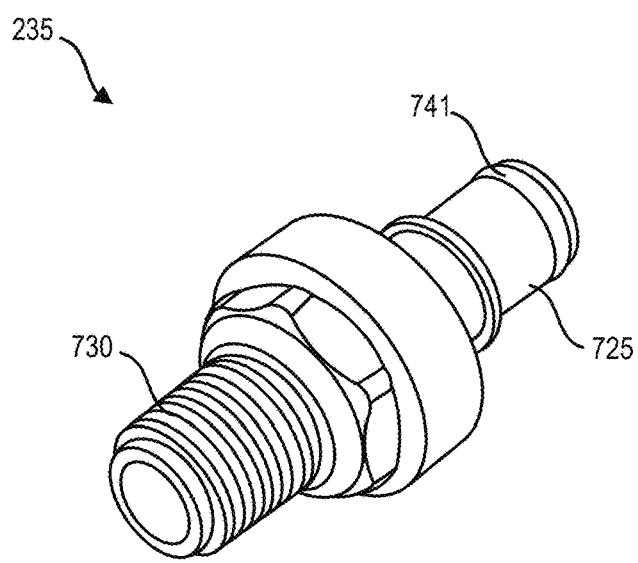

FIG. 108 shows a quick connect fitting having a threaded end and a coupler insert configured to mate with the coupler body shown in FIG. 107.

Figure 109:
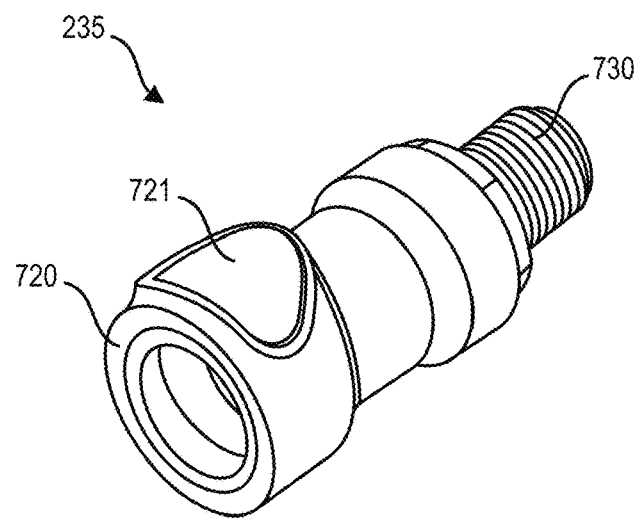

FIG. 109 shows a quick connect fitting having a threaded end and a coupler body configured to receive a coupler insert.

Figure 110:
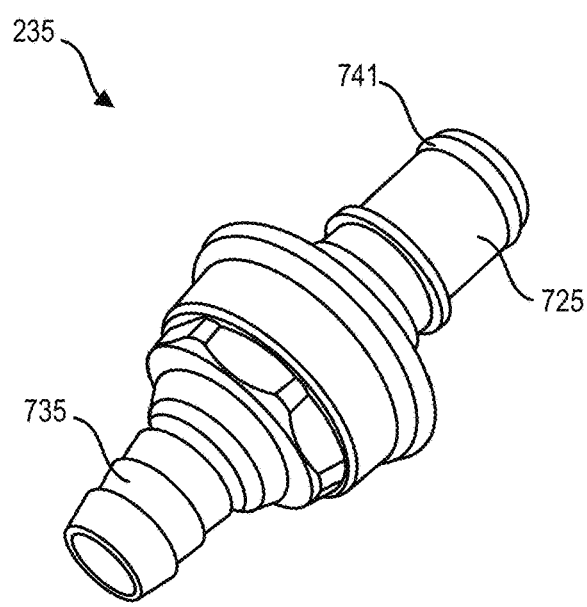

FIG. 110 shows a quick connect fitting having a barbed end and a coupler insert configured to mate with the coupler body shown in FIG. 109, the coupler insert having an O-ring seal.

Figure 111:
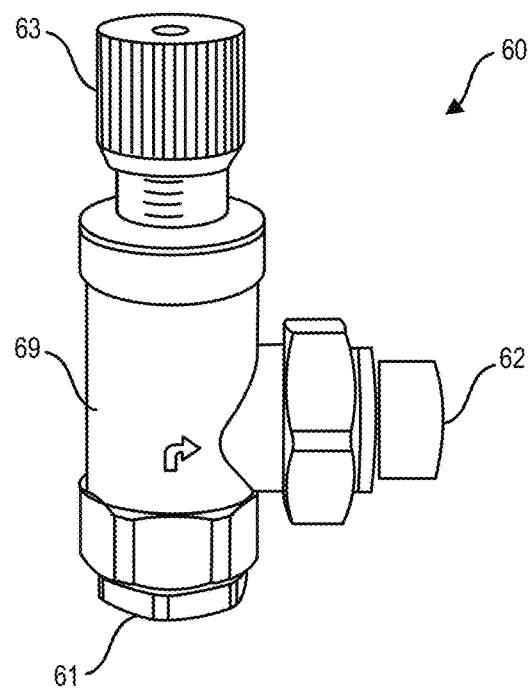

FIG. 111 shows front perspective view of a differential pressure bypass valve.

Figure 112:
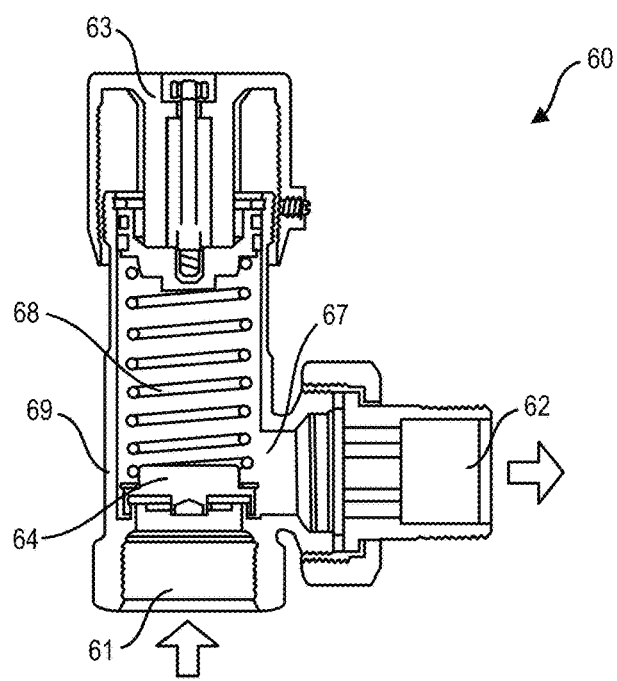

FIG. 112 shows a front cross-sectional view of the differential pressure bypass valve of FIG. 111 exposing a valve inlet, a valve outlet, a bypass circuit fluidly connecting the valve inlet to the valve outlet, a valve plug, a spring, and a control knob.

Figure 113:
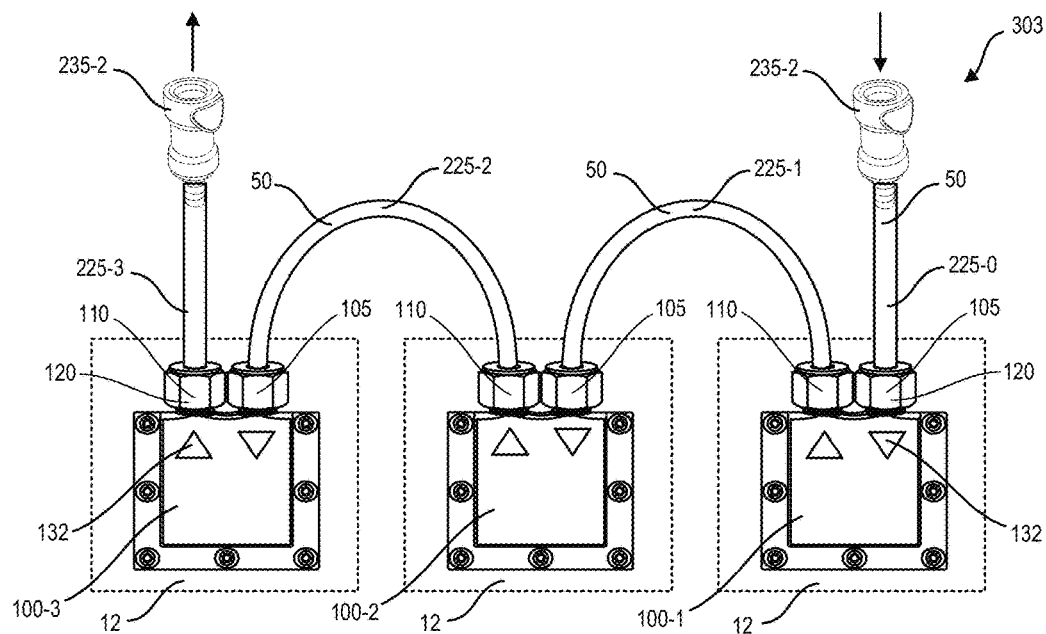

FIG. 113 shows a quick-connect cooling line assembly for a cooling apparatus, where the cooling line assembly include three heat sink modules fluidly connected in series by sections of flexible tubing, where an inlet section of tubing and an outlet section of tubing each include a quick-connect fitting as shown in FIG. 107 to allow the cooling line assembly to be rapidly connected to and disconnected from the manifold assembly as shown in FIG. 100 or 106.

Figure 114:
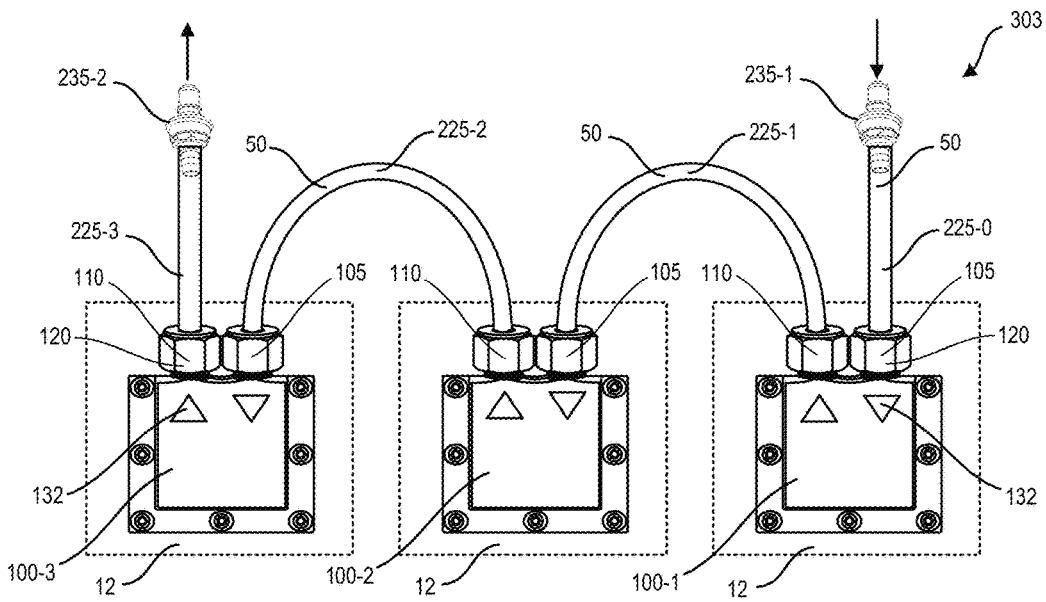

FIG. 114 shows a quick-connect cooling line assembly for a cooling apparatus, where the cooling line assembly includes three heat sink modules fluidly connected in series by sections of flexible tubing, where an inlet section of tubing and an outlet section of tubing each include a quick-connect fitting as shown in FIG. 107 to allow the cooling line assembly to be rapidly connected to and disconnected from a manifold assembly.

Figure 115:
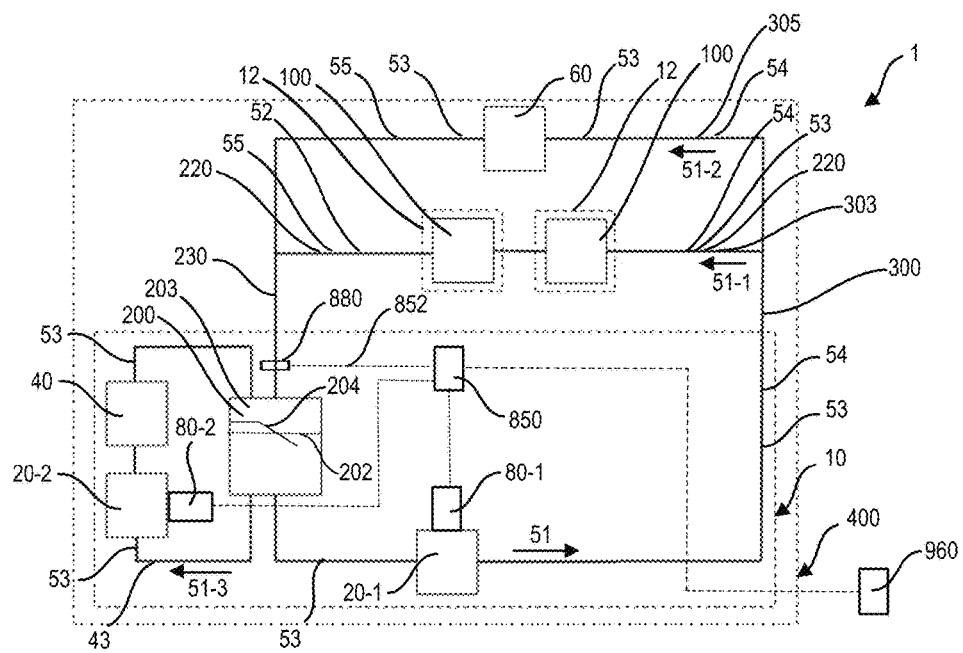

FIG. 115 shows a schematic of a cooling apparatus having a primary cooling loop and a heat rejection loop, where the primary cooling loop includes a first pump and a bypass, where the heat rejection loop includes a second pump and a heat exchanger, where the primary cooling loop and the heat rejection loop are both fluidly connected to a common reservoir that resides in a fluid distribution unit housed within a computer, such as a server or personal computer.

Figure 116:
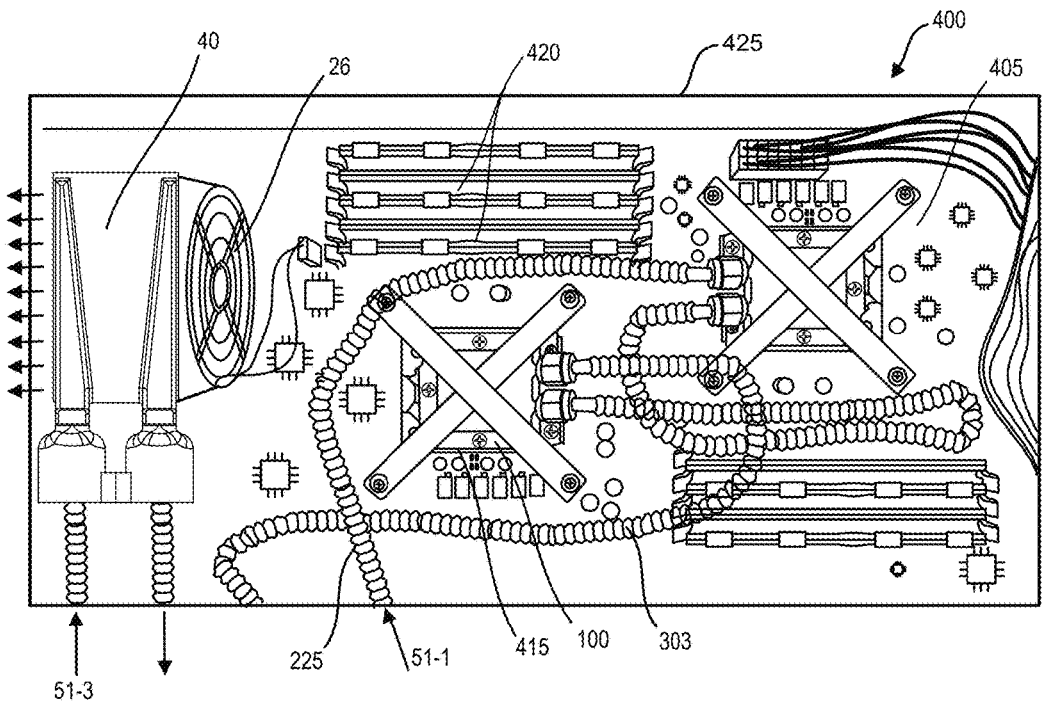

FIG. 116 shows a portion of the cooling apparatus of FIG. 115 installed in a computer with two processors, where heat sink modules are mounted on the processors and heat from the processors is absorbed into a pumped coolant and rejected via a liquid-to-air heat exchanger fluidly connected to the cooling apparatus.

Figure 117:
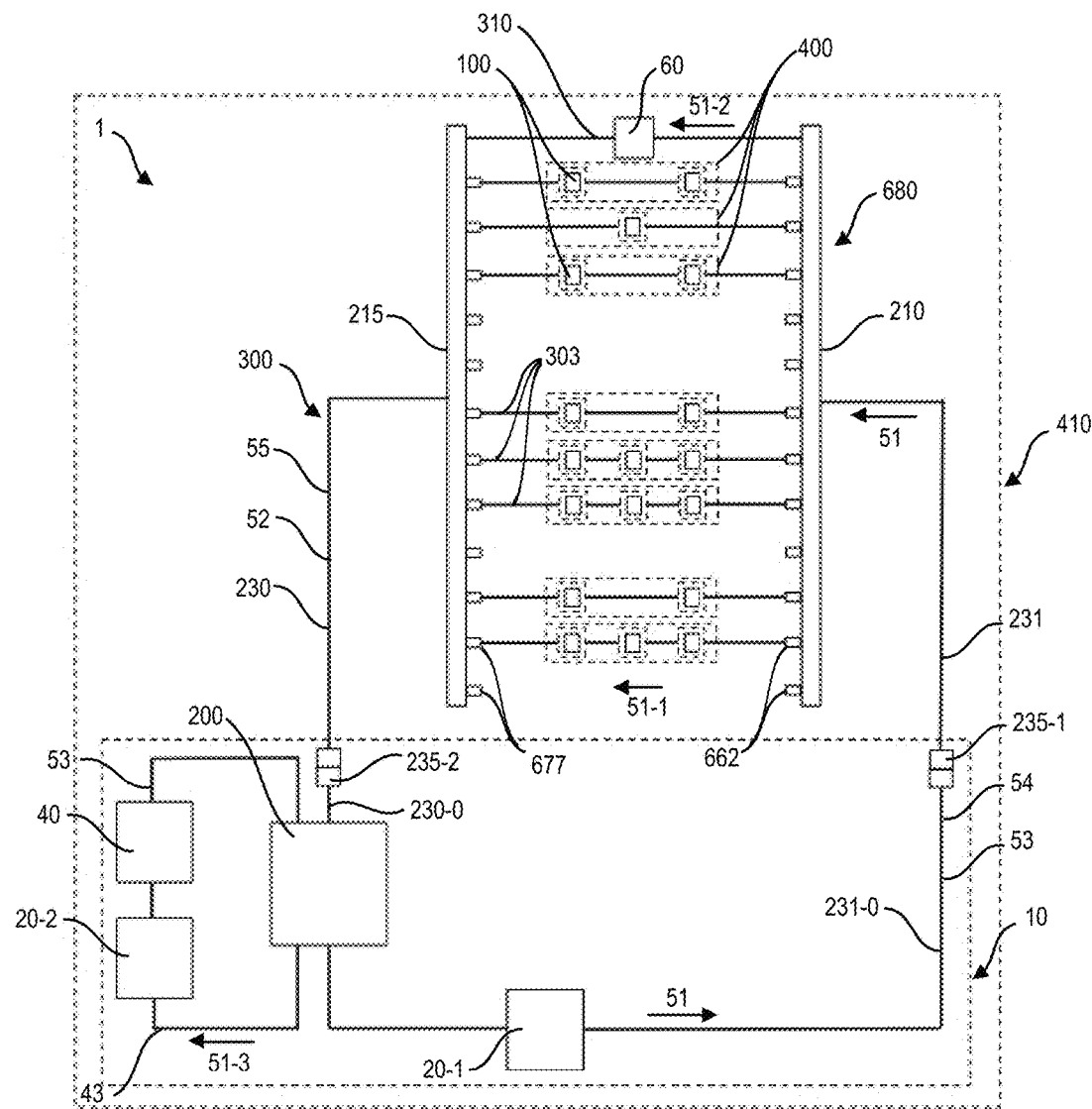

FIG. 117 shows a schematic of a preferred cooling apparatus having a primary cooling loop and a heat rejection loop, where the primary cooling loop includes a first pump, a manifold, a bypass, and a plurality of cooling line assemblies each routed through one server, where the heat rejection loop includes a second pump and a heat exchanger, where the primary cooling loop and the heat rejection loop are both fluidly connected to a common reservoir that resides in a fluid distribution unit housed within a server rack.

Figure 118:
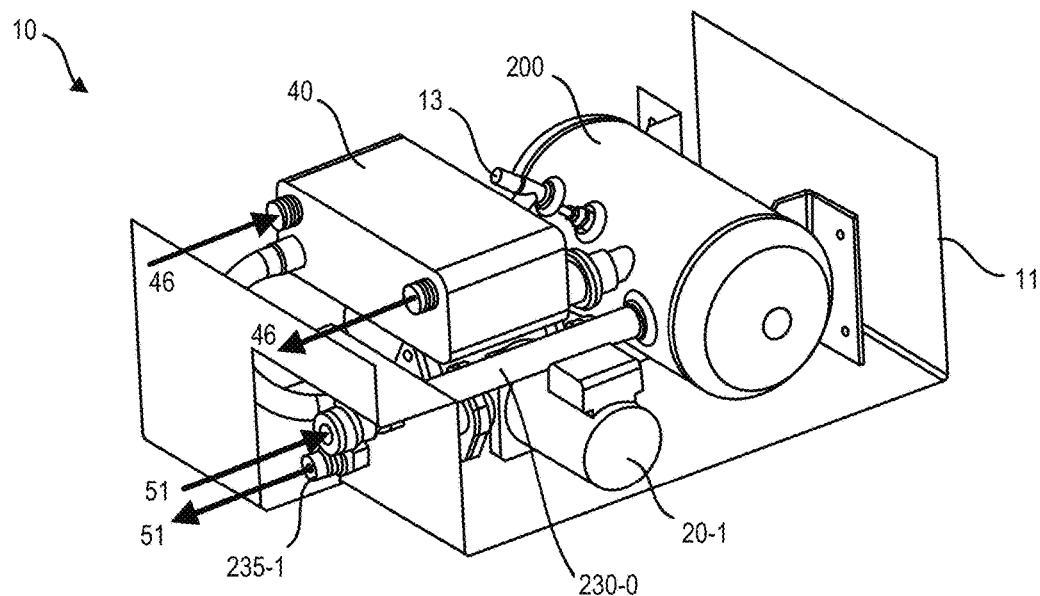

FIG. 118 shows a top, front perspective view of a rack-mountable fluid distribution unit, suitable for use with the cooling apparatus of FIG. 117, the fluid distribution unit having a primary cooling loop and a heat rejection loop, where the primary cooling loop includes a first pump fluidly connected to a reservoir, where the heat rejection loop includes a second pump and a heat exchanger fluidly connected to the reservoir, and where the pumps and the reservoir are mounted to a support structure.

Figure 119:
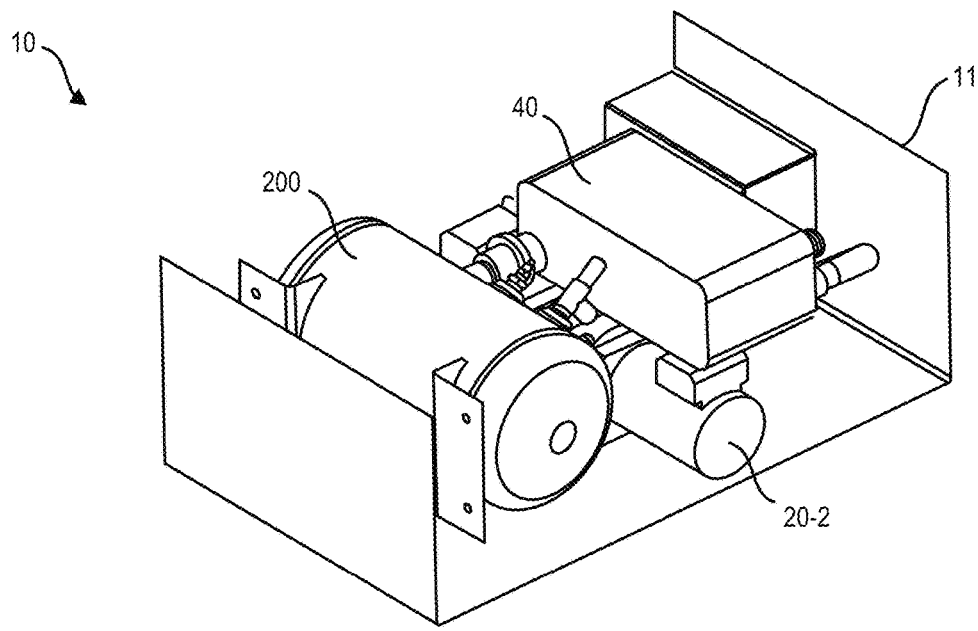

FIG. 119 shows a top, rear perspective view of the fluid distribution unit of FIG. 118.

Figure 120:
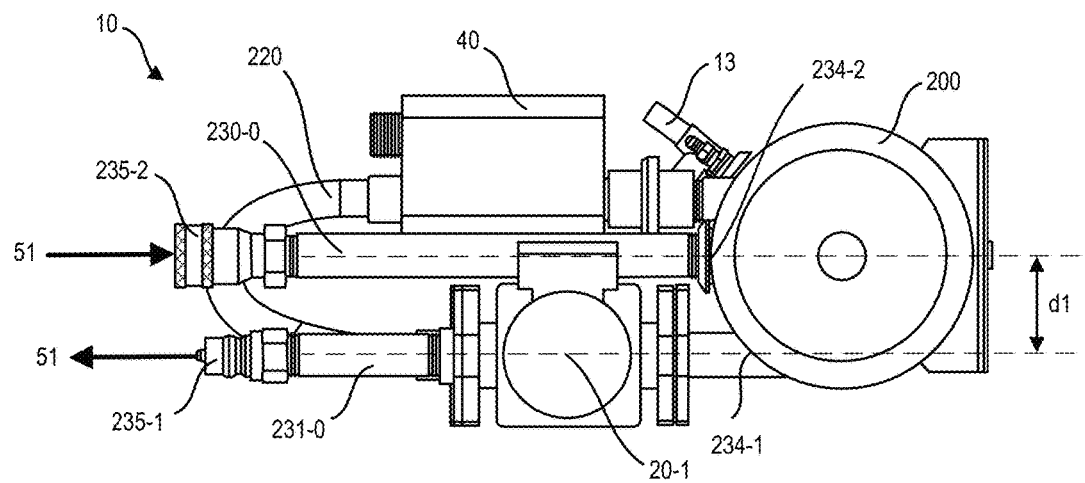

FIG. 120 shows a right side view of the fluid distribution unit of FIG. 118 without the support structure.

Figure 121:
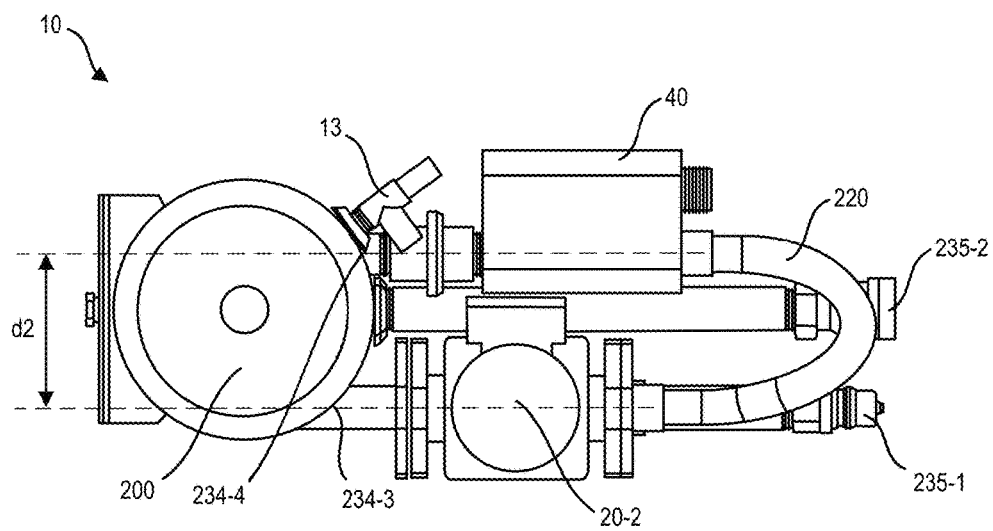

FIG. 121 shows a left side view of the fluid distribution unit of FIG. 118 without the support structure.

Figure 122:
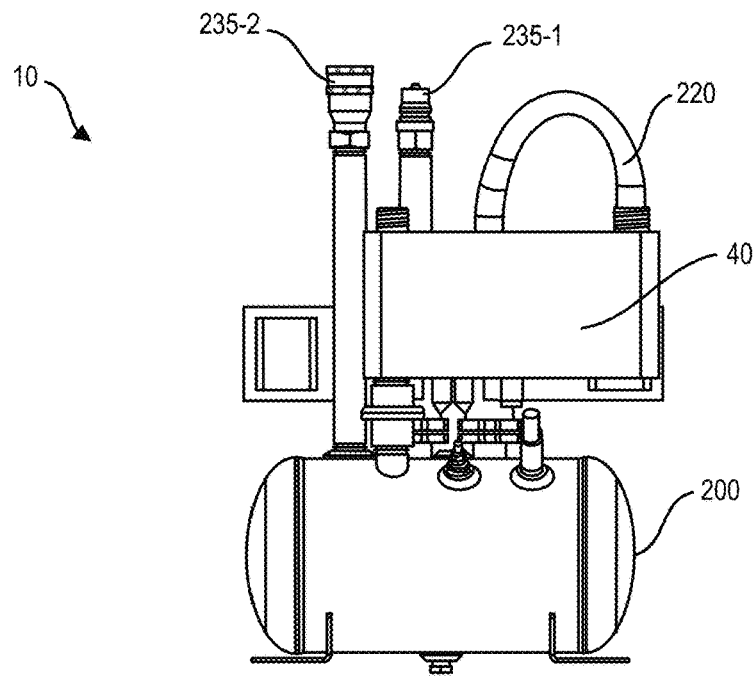

FIG. 122 shows a top view of the fluid distribution unit of FIG. 118 without the support structure.

Figure 123:
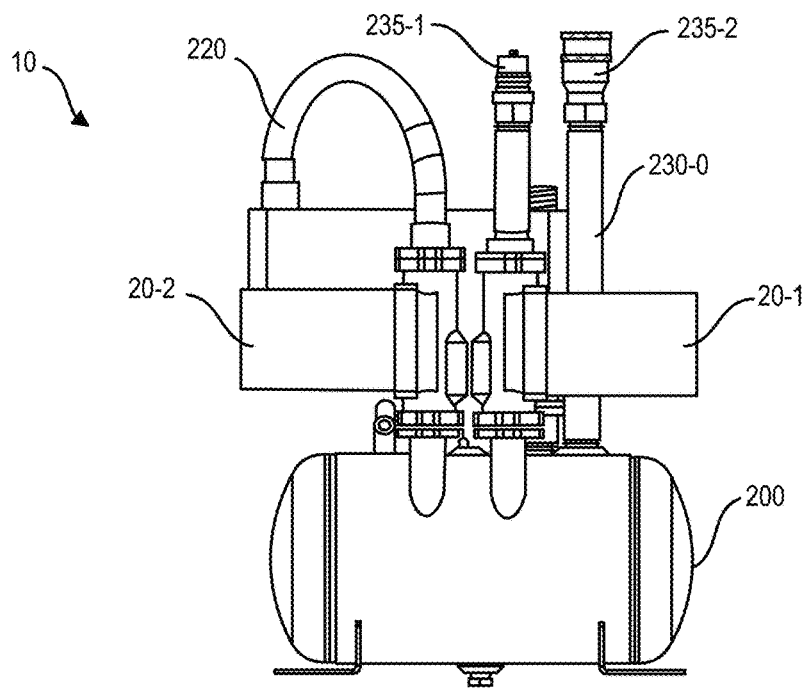

FIG. 123 shows a bottom view of the fluid distribution unit of FIG. 118 without the support structure.

Figure 124:
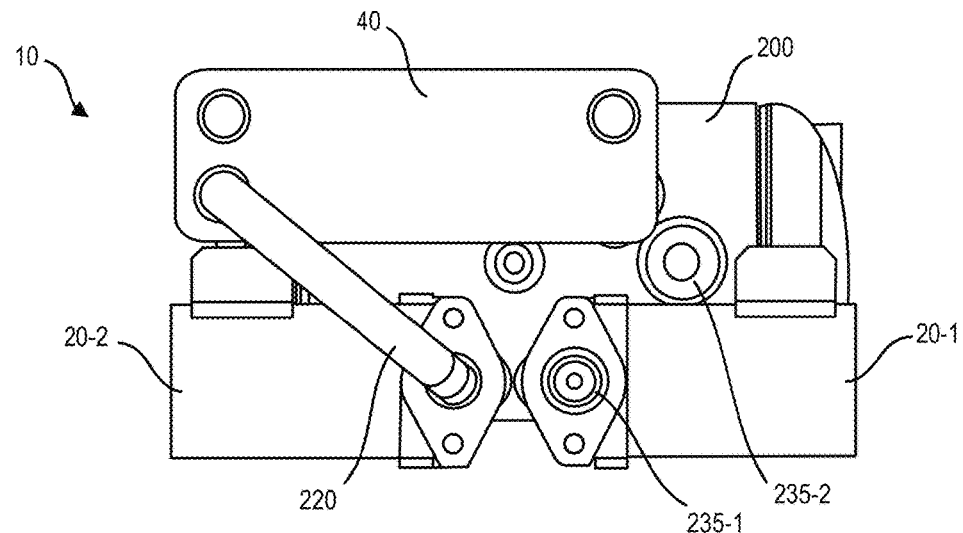

FIG. 124 shows a front view of the fluid distribution unit of FIG. 118 without the support structure.

Figure 125:
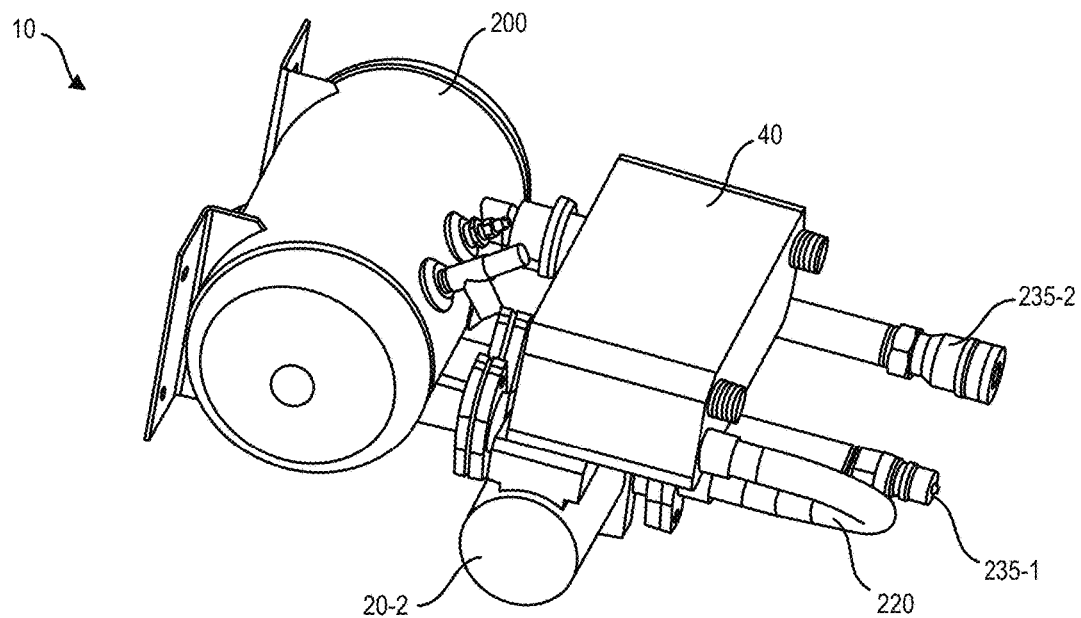

FIG. 125 shows a left side perspective view of the fluid distribution unit of FIG. 118 without the support structure.

Figure 126:
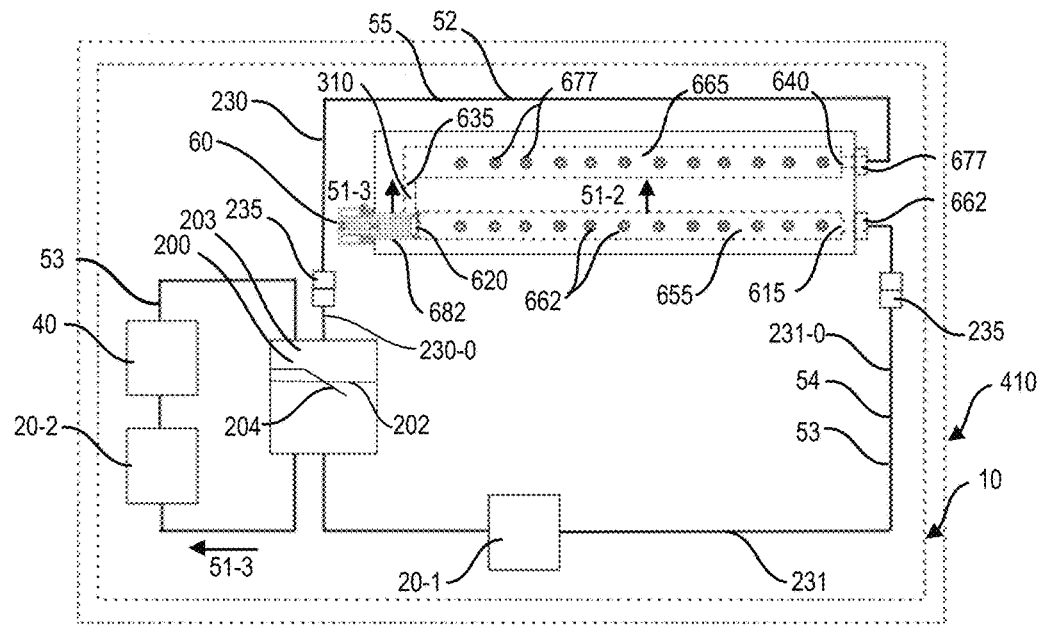

FIG. 126 shows a fluid distribution unit having a primary cooling loop and a heat rejection loop, the primary cooling loop including a first pump and a manifold assembly of FIG. 105, the heat rejection loop including a second pump upstream of a heat exchanger.

Figure 127:
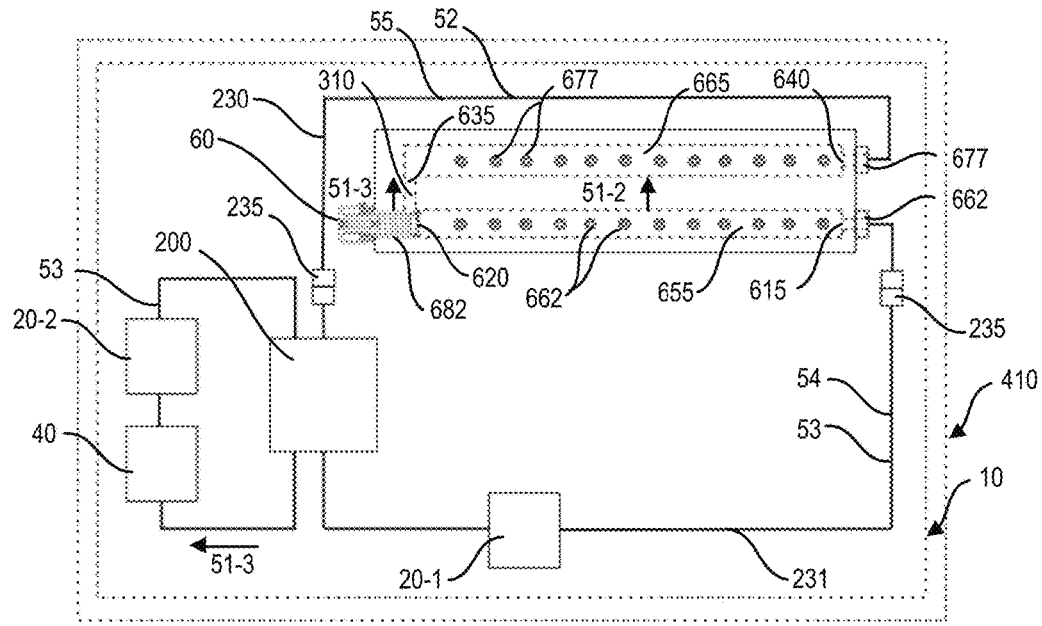

FIG. 127 shows a fluid distribution unit having a primary cooling loop and a heat rejection loop, the primary cooling loop including a first pump and a manifold assembly of FIG. 105, the heat rejection loop including a second pump downstream of a heat exchanger.

Figure 128:
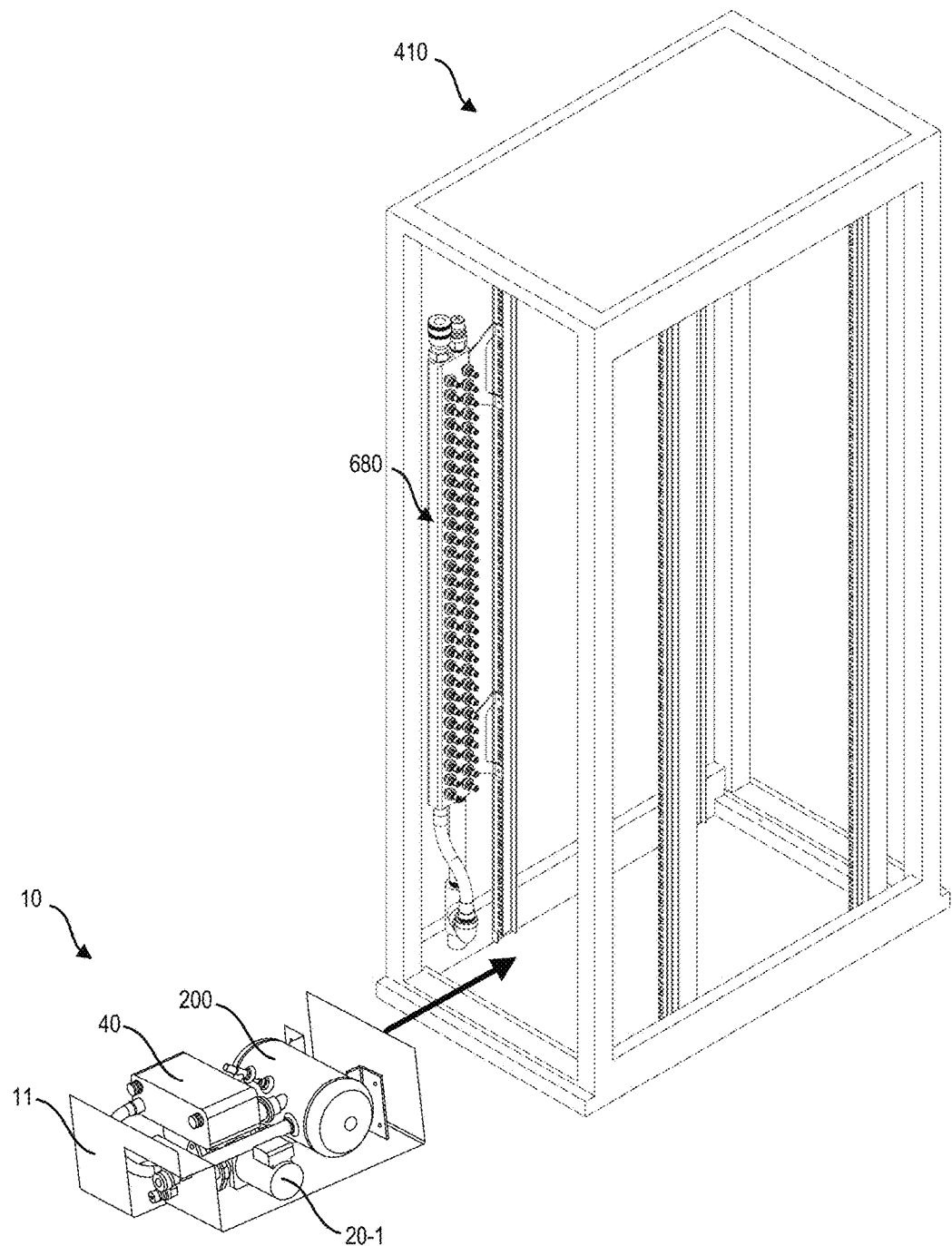

FIG. 128 shows the fluid distribution unit of FIG. 118 being installed into the server rack with manifold assembly of FIG. 102.

Figure 129:
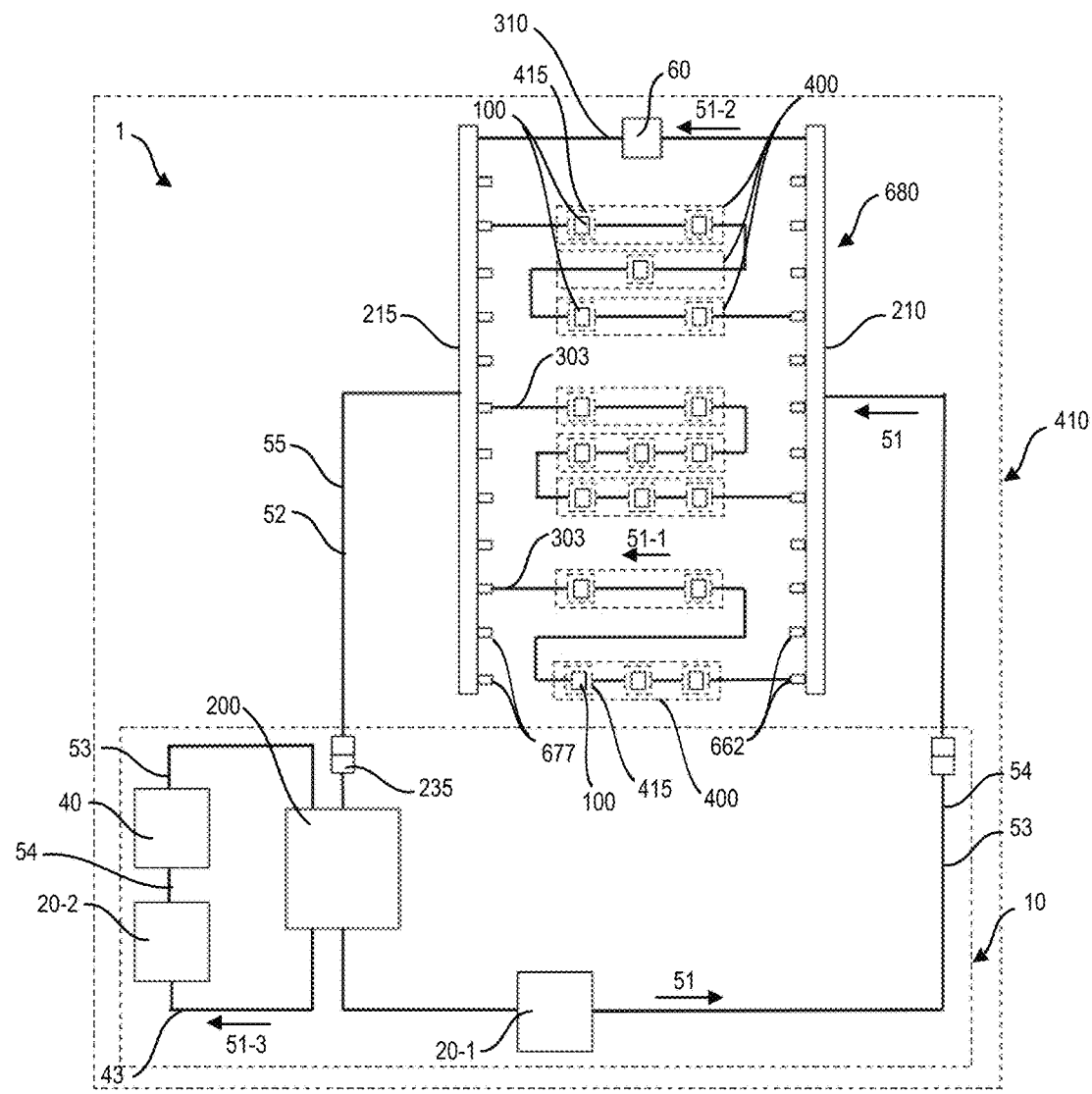

FIG. 129 shows a schematic of a cooling apparatus having a primary cooling loop and a heat rejection loop, where the primary cooling loop includes a first pump, a manifold, a bypass, and a plurality of cooling line assemblies each routed through one or more servers, where the heat rejection loop includes a second pump and a heat exchanger, where the primary cooling loop and the heat rejection loop are both fluidly connected to a common reservoir that resides in a fluid distribution unit housed within a server rack.

Figure 130:
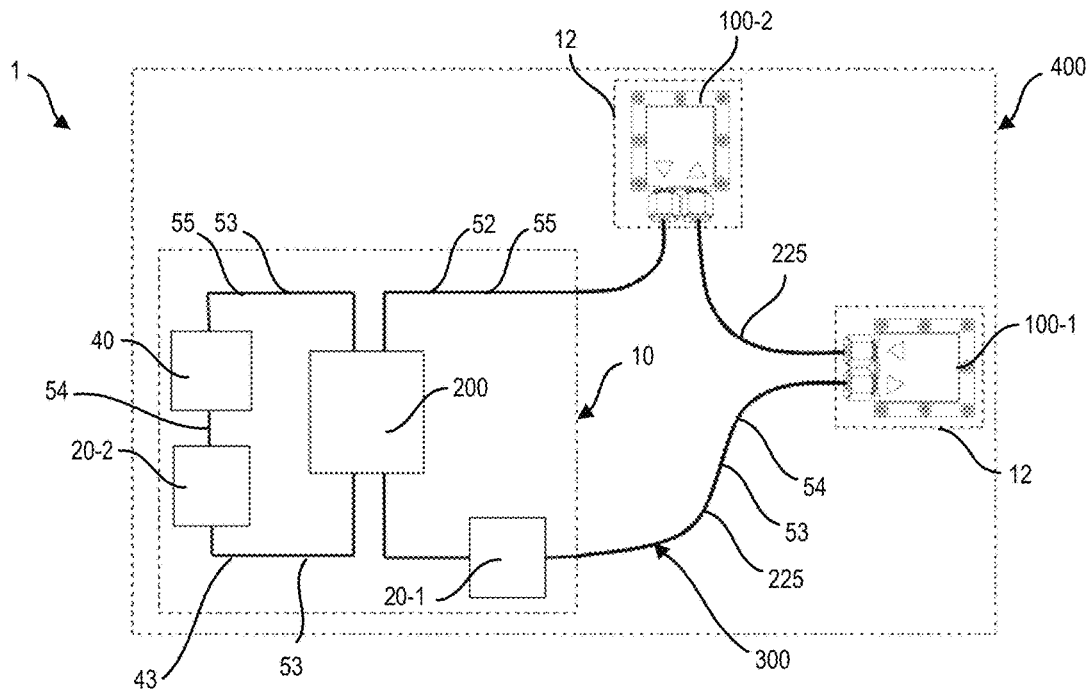

FIG. 130 shows a schematic of a cooling apparatus having a primary cooling loop and a heat rejection loop, the primary cooling loop including a first pump fluidly connected to a reservoir and fluidly connected to one or more heat sink modules, the heat rejection loop including a second pump fluidly connected to a heat exchanger and the reservoir.

Figure 131:
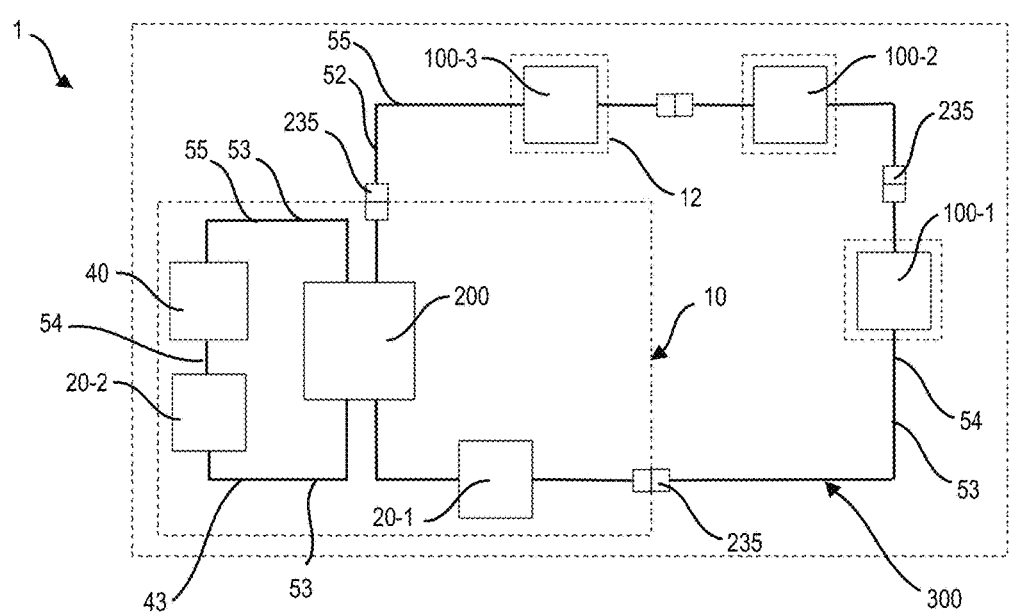
Figure 132:
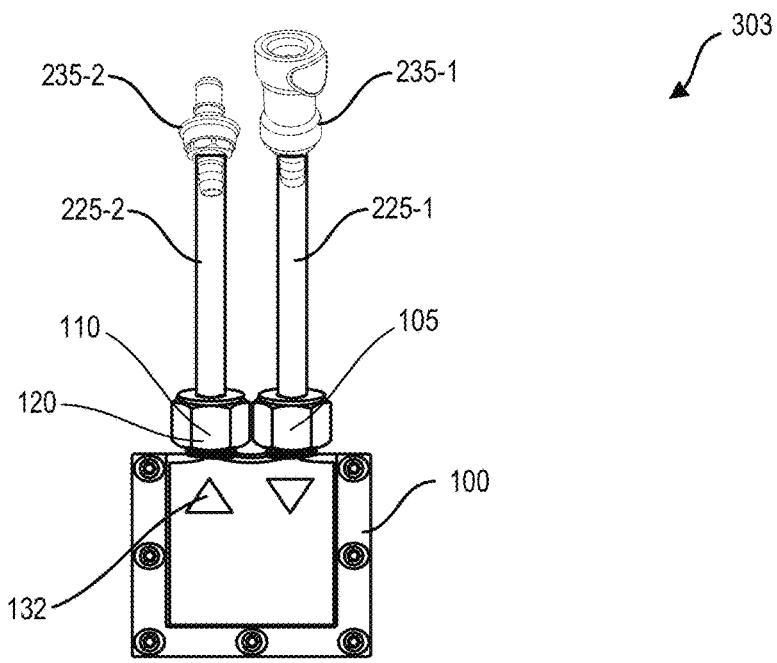

FIG. 131 shows a schematic of a modular cooling apparatus having a primary cooling loop and a heat rejection loop, the primary cooling loop including a first pump fluidly connected to a reservoir and fluidly connected three modular cooling line assemblies similar to the one shown in FIG. 132, the heat rejection loop including a second pump and a heat exchanger fluidly connected to the reservoir.

FIG. 132 shows a modular cooling line assembly including a heat sink module with an inlet port and an outlet port, a first section of flexible tubing having a first end connected to an inlet fitting and a second end connected to the inlet port, and a second section of flexible tubing having a first end connected to the outlet port and a second end connected to an outlet fitting.

Figure 133:
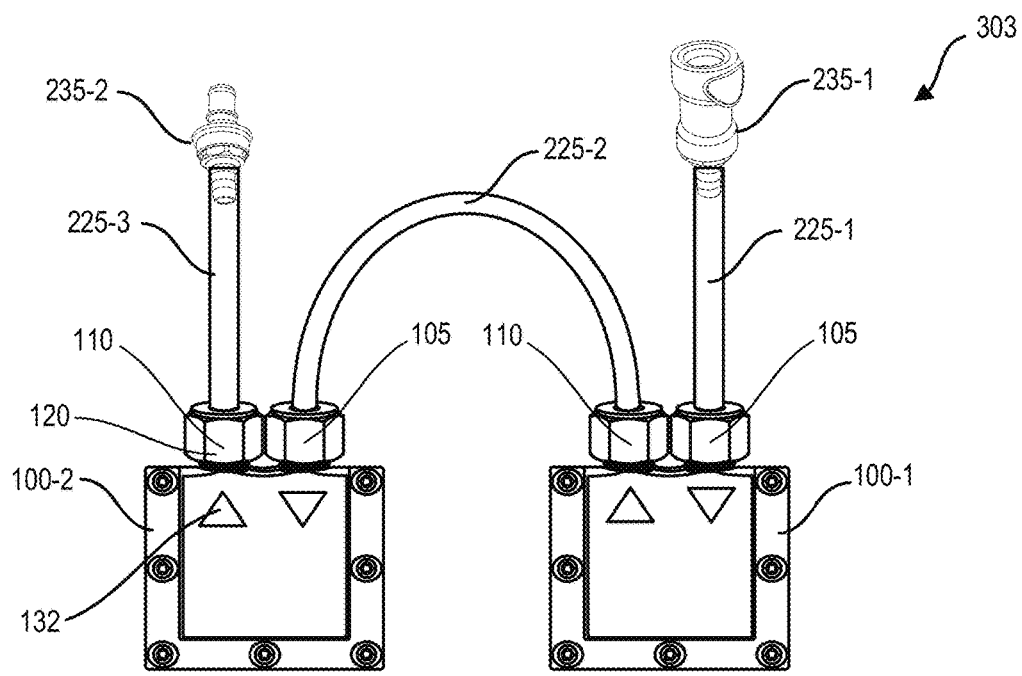

FIG. 133 shows a modular cooling line assembly including a first heat sink module with an inlet port and an outlet port, a first section of flexible tubing having a first end connected to an inlet fitting and a second end connected to the inlet port of the first heat sink module, a second heat sink module with an inlet port and an outlet port, a second section of flexible tubing connecting the outlet port of the first heat sink module to the inlet port of the second heat sink module, and a third section of flexible tubing having a first end connected to the outlet port of the second heat sink module and a second end connected to an outlet fitting.

Figure 134:
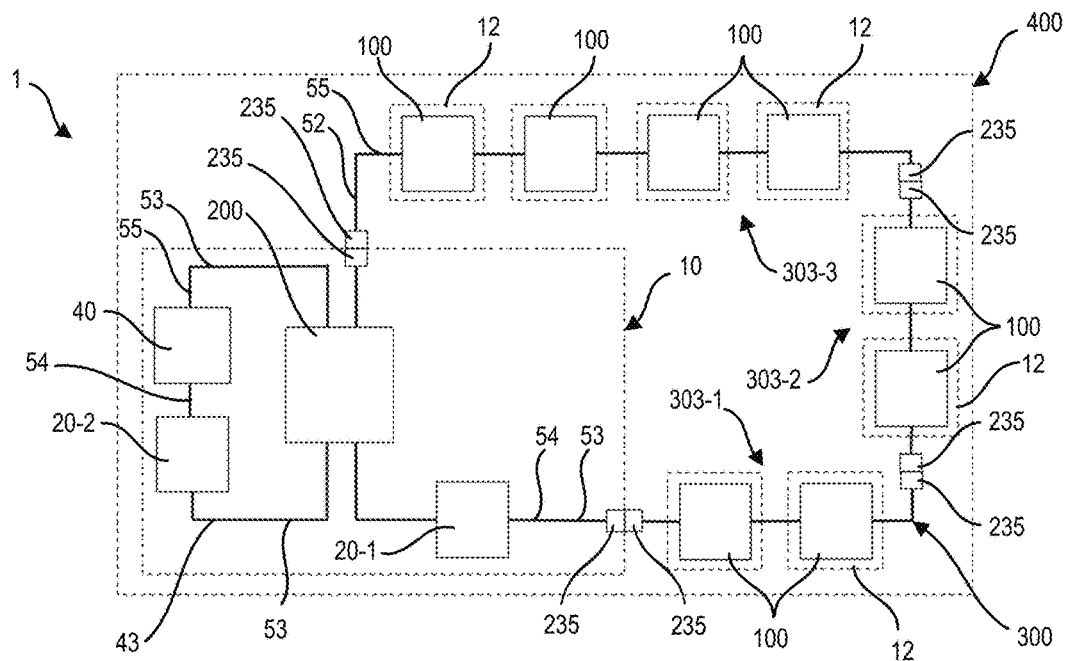

FIG. 134 shows a schematic of a modular cooling apparatus having a primary cooling loop and a heat rejection loop, the primary cooling loop including a first pump fluidly connected to a reservoir and fluidly connected to three series-connected modular cooling line assemblies, the first modular cooling line assembly having two heat sink modules, the second modular cooling line assembly having two heat sink modules, and the third modular cooling line assembly having four heat sink modules, the heat rejection loop including a second pump and a heat exchanger fluidly connected to the reservoir.

Figure 135:
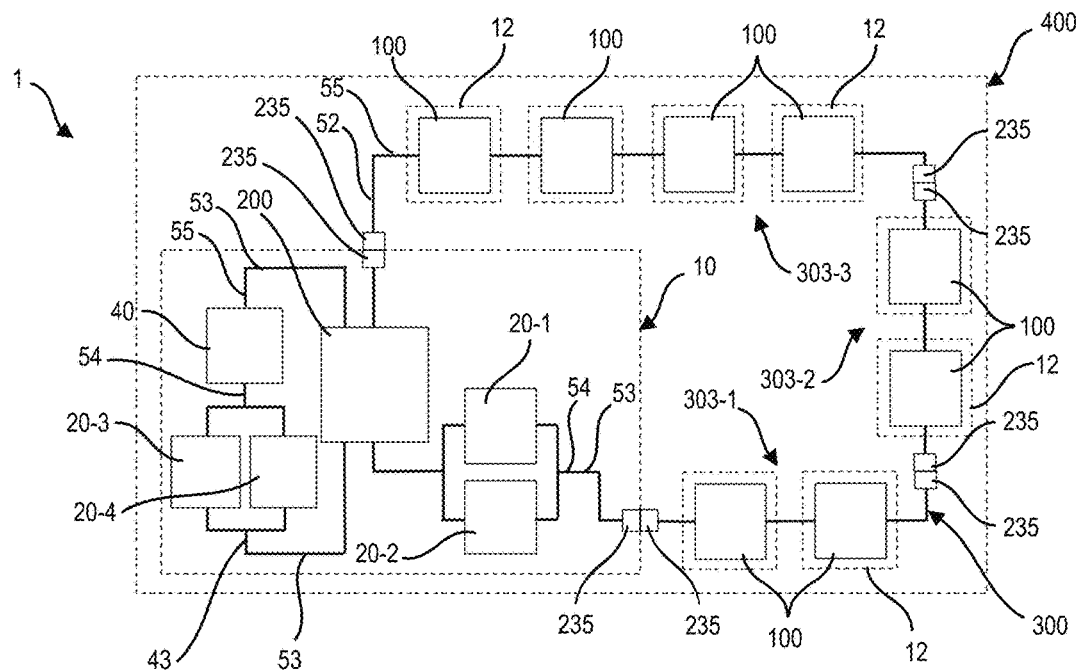

FIG. 135 shows a schematic of a modular cooling apparatus having a primary cooling loop and a heat rejection loop, the primary cooling loop including a first pair of redundant pumps fluidly connected to a reservoir and fluidly connected to three series-connected modular cooling line assemblies, the first modular cooling line assembly having two heat sink modules, the second modular cooling line assembly having two heat sink modules, and the third modular cooling line assembly having four heat sink modules, the heat rejection loop including a second pair of redundant pumps and a heat exchanger fluidly connected to the reservoir.

Figure 136:
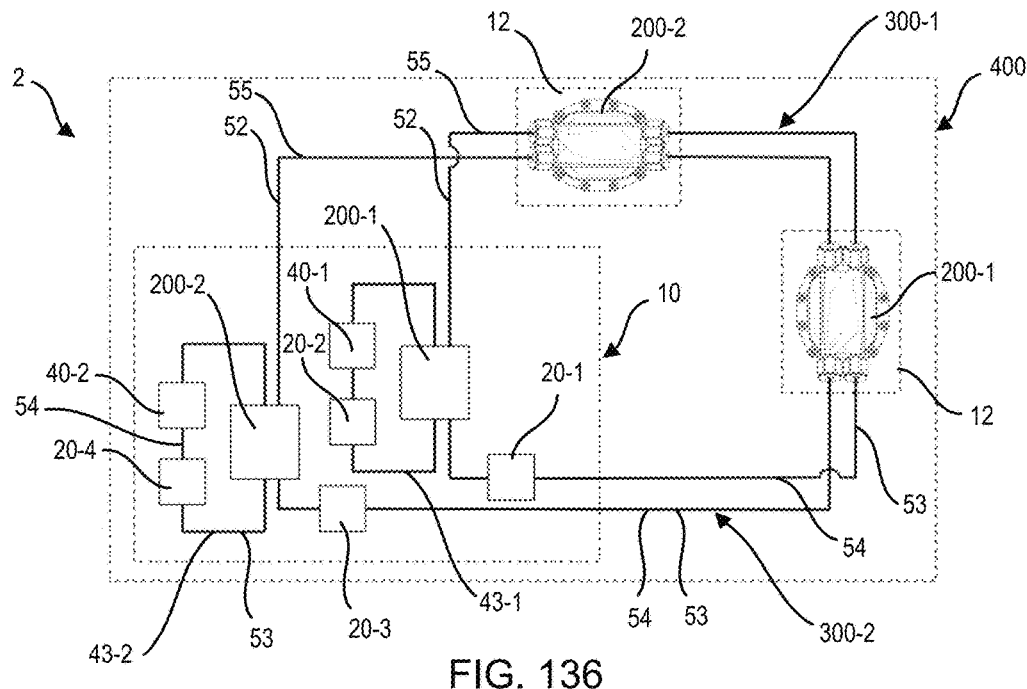

FIG. 136 shows a schematic of a redundant cooling apparatus having a first cooling apparatus and a second cooling apparatus, the first cooling apparatus including a first primary cooling loop and a first heat rejection loop, the first primary cooling loop including a first pump fluidly connected to a first reservoir and two series-connected redundant heat sink modules, the first heat rejection loop including a second pump fluidly connected to a first heat exchanger and the first reservoir, the second cooling apparatus having a second cooling loop and a second heat rejection loop, the second primary cooling loop including a third pump fluidly connected to a second reservoir and the two series-connected heat sink modules, the second heat rejection loop including a fourth pump fluidly connected to a second heat exchanger and the second reservoir.

Figure 137:
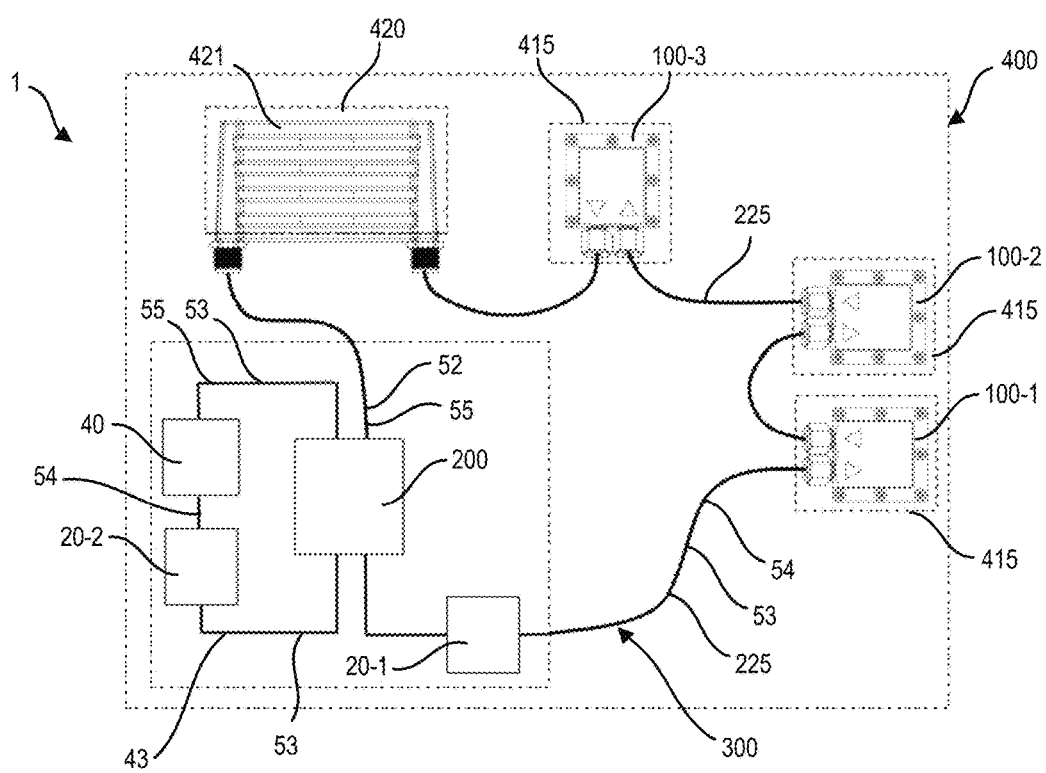

FIG. 137 shows a schematic of a cooling apparatus having a primary cooling loop and a heat rejection loop, the primary cooling loop including a first pump fluidly connected to a reservoir and fluidly connected to three series-connected heat sink modules and a series-connected memory cooler, the heat rejection loop including a second pump fluidly connected to a heat exchanger and the reservoir.

Figure 138:
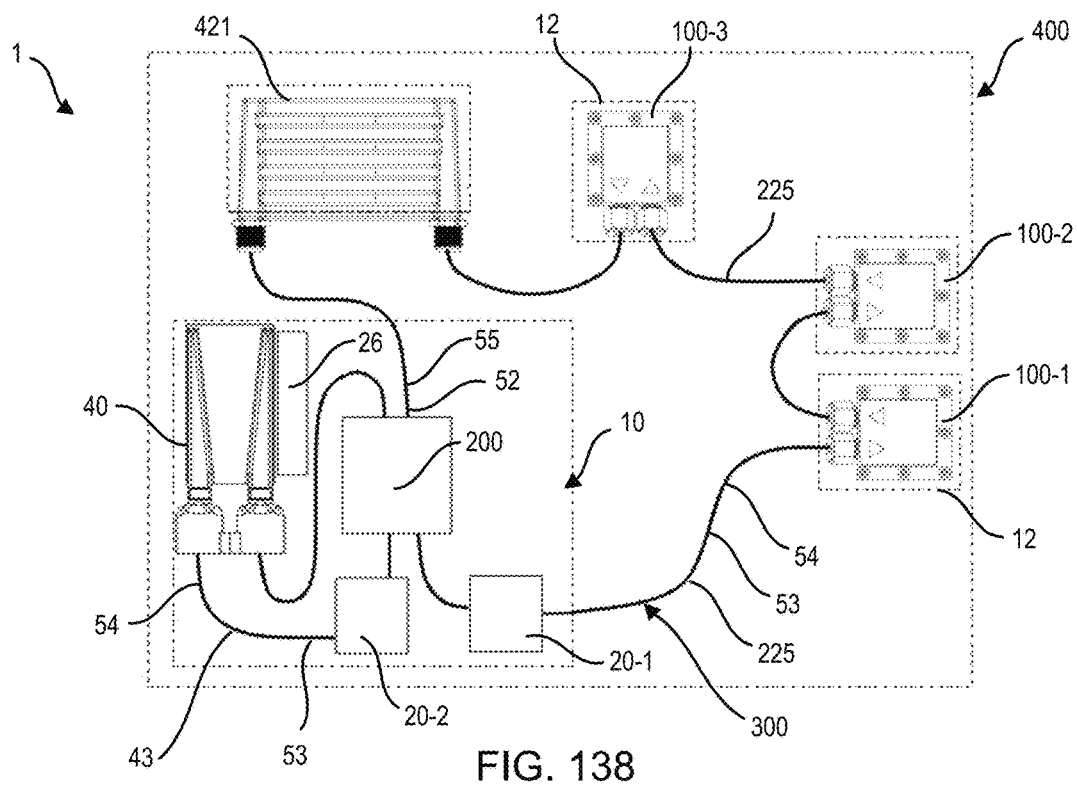

FIG. 138 shows a schematic of a cooling apparatus having a primary cooling loop and a heat rejection loop, the primary cooling loop including a first pump fluidly connected to a reservoir and fluidly connected to three series-connected heat sink modules and a series-connected memory cooler, the heat rejection loop including a second pump fluidly connected to a heat exchanger and the reservoir.

Figure 139:
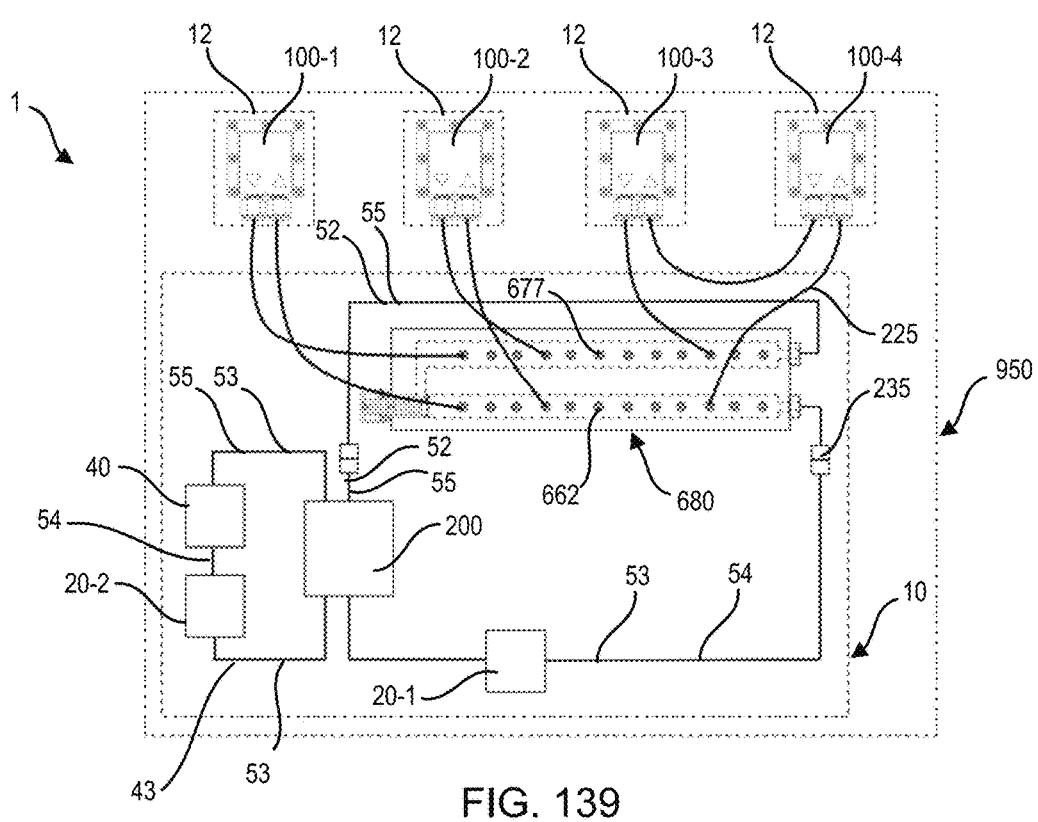

FIG. 139 shows a cooling apparatus with a fluid distribution unit having a primary cooling loop and a heat rejection loop, the primary cooling loop including a first pump and the manifold assembly of FIG. 105 fluidly connected to a reservoir, the heat rejection loop including a second pump upstream of a heat exchanger fluidly connected to the reservoir, the cooling apparatus including a plurality of cooling line assemblies fluidly attached to the manifold assembly, each cooling line assembly including sections of flexible tubing fluidly connected to at least one heat sink module on a surface to be cooled.

DETAILED DESCRIPTION

The cooling apparatuses 1 (cooling systems) and methods described herein are suitable for a wide variety of applications, ranging from cooling electrical devices to cooling mechanical devices to cooling chemical reactions and/or related devices and processes. Examples of electrical devices that can be effectively cooled with the cooling apparatuses 1 and methods include densely packed servers in data centers, computers in distributed computing clusters, workstations in office buildings, medical imaging devices, electronic communications equipment in cellular networks, solar panels, gaming consoles, personal computers, home appliances, high-power diode laser arrays, light emitting diode (LED) arrays, theater lighting systems, video projectors, directed-energy weapons, solar panels, current sources, and electric vehicle components (e.g. battery packs, inverters, electric motors, display screens, and power electronics). Examples of mechanical devices that can be effectively cooled with the cooling apparatuses 1 and methods include turbines, internal combustion engines, turbochargers, aftertreatment components, and braking systems. Examples of chemical processes that can be effectively cooled with the cooling apparatuses 1 include condensation processes involving rotary evaporators or reflux distillation condensers.

Compared to competing air or single-phase liquid cooling systems, the cooling apparatuses 1 and methods described herein are more efficient, more reliable, safer, less expensive, and have lower operating noise. The cooling apparatuses 1 described herein are suitable for retrofit on existing server designs and can be incorporated into new server or processor designs. Due to their high efficiency, modularity, flexibility, quick-connections, small size, and hot-swappability, the cooling apparatuses 1 described herein redefine design constraints that have until now hampered the development of new electronic devices. By replacing traditional cooling methods with a more compact and higher performing solution, the cooling apparatuses 1 described herein allow the size of electronic device housings to be significantly reduced while maintaining or even improving device performance by maintaining the device at consistent operating temperatures.

Figure 2A:
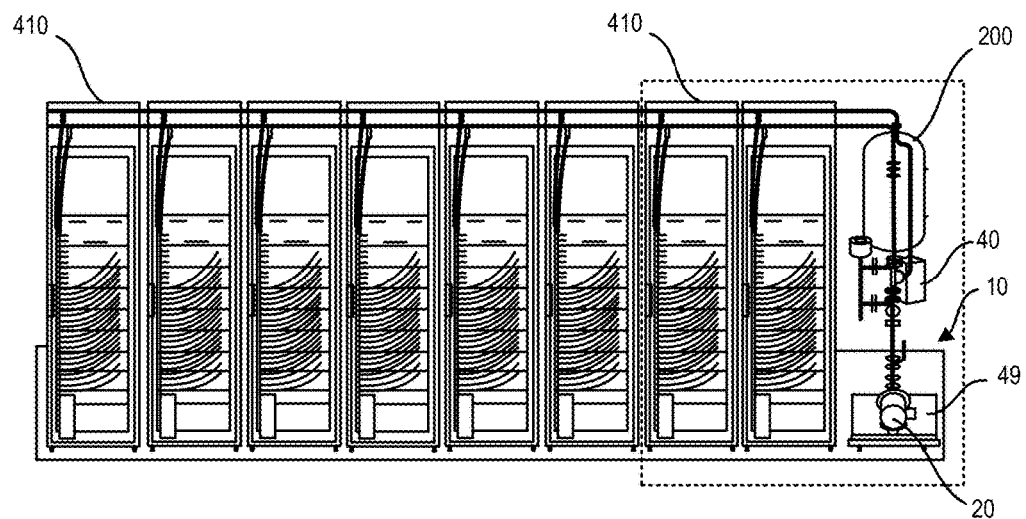
FIG. 2A shows a rear view of the cooling apparatus of FIG. 1.
Figure 2B:
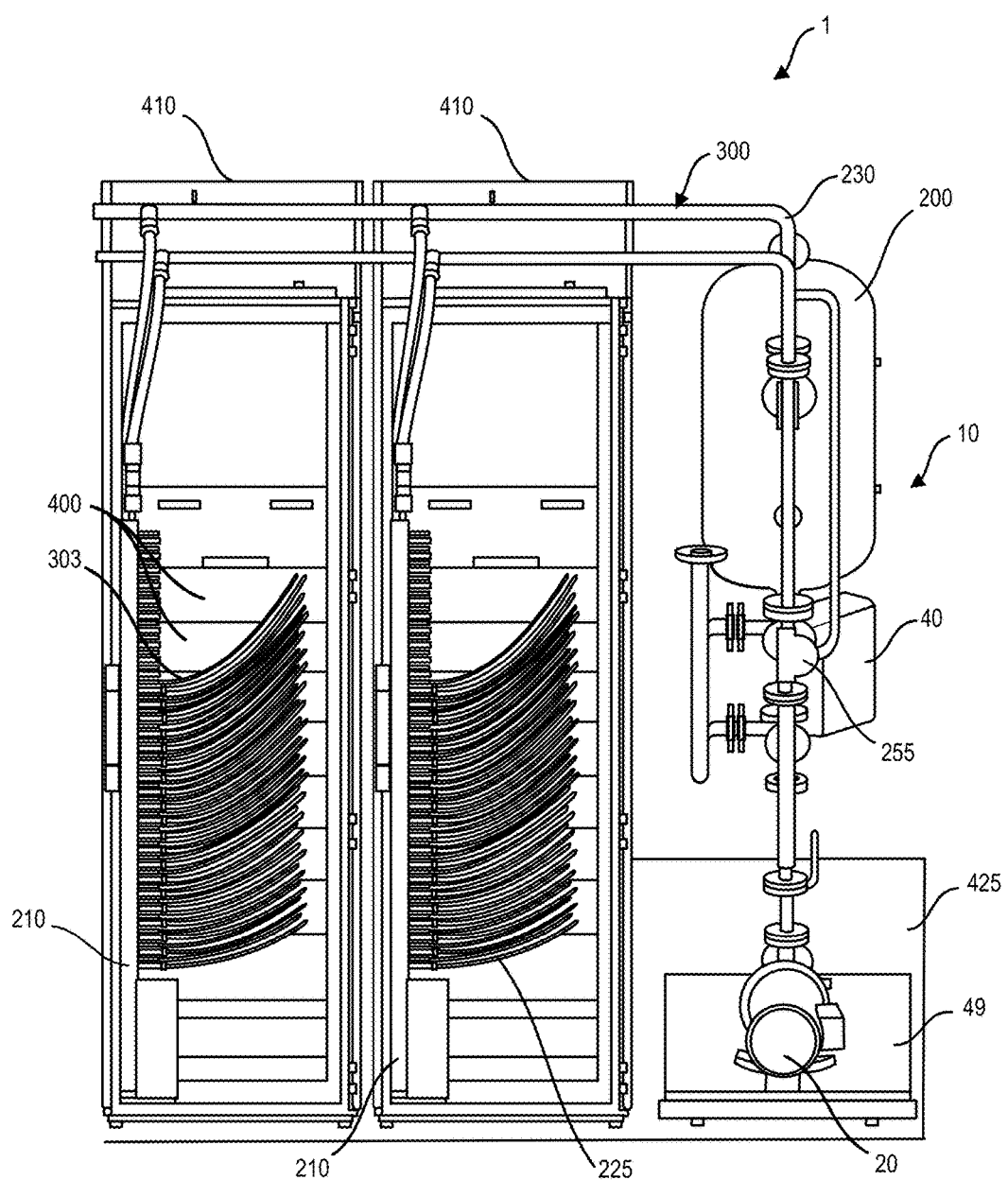
FIG. 2B shows a detailed view of a portion of the cooling apparatus of FIG. 2A, where the pump, reservoir, heat exchanger, manifolds of the primary cooling loop, and sections of flexible tubing connecting parallel cooling lines to the manifolds are visible.
Figure 3:
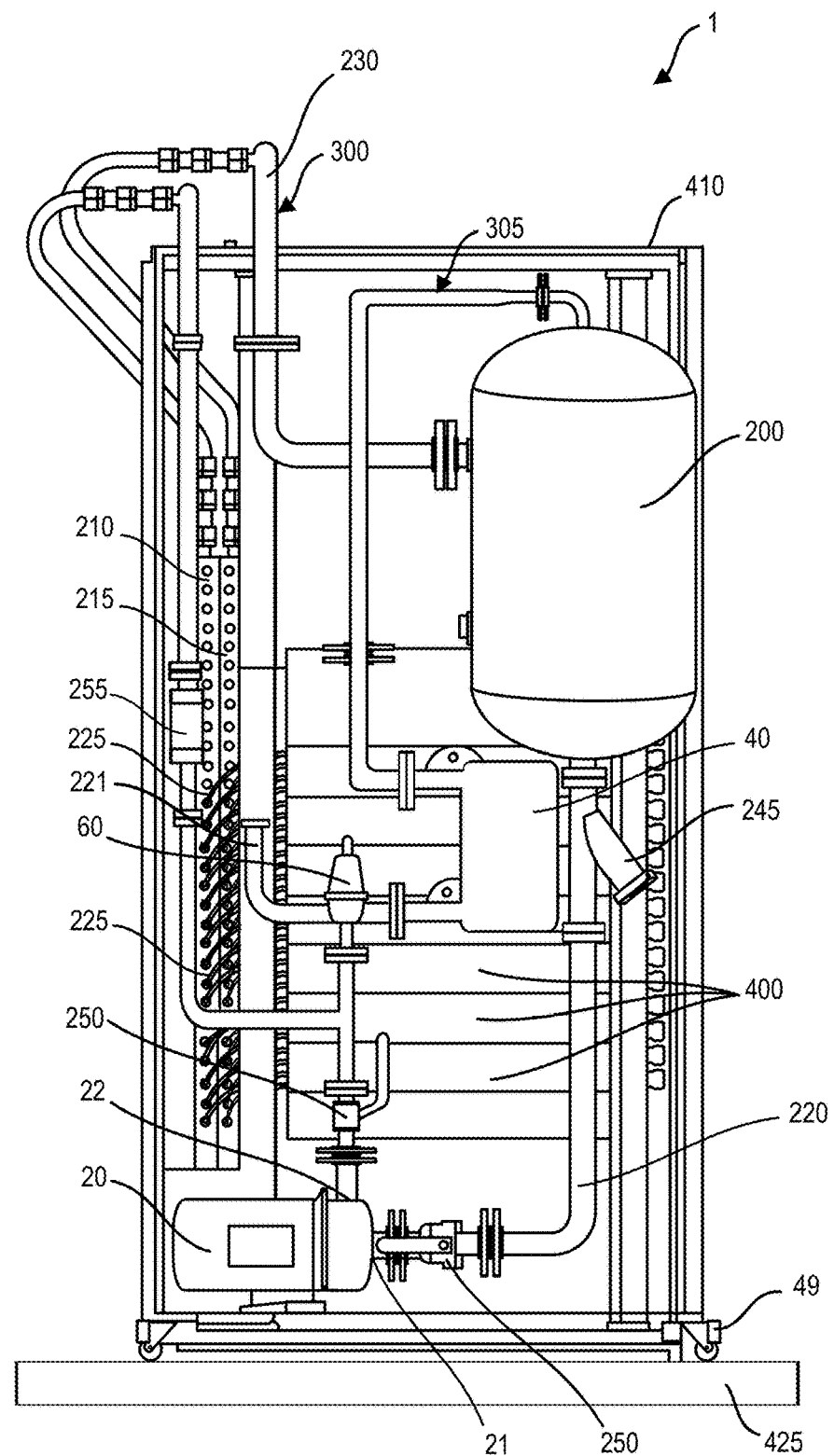
FIG. 3 shows a left side view of the cooling apparatus of FIG. 1, where the pump, reservoir, heat exchanger, valve, first bypass, a portion of the primary cooling loop, and sections of flexible tubing connecting parallel cooling lines to the inlet and outlet manifolds are visible.

In the case of servers 400 arranged in server racks 410, the cooling apparatus 1 described herein allows servers 400 to be arranged in close proximity to neighboring servers in the same rack 410, as shown in FIGS. 1-3, thereby allowing more servers to be installed and cooled per square foot of floor space in a data center 425. In addition, a fluid distribution unit 10 of the cooling apparatus 1 has a small footprint of about 7 square feet, whereas a CRAC unit that it displaces may have a footprint of over 42 square feet. Consequently, installing the cooling apparatus 1 described herein instead of a CRAC unit frees up enough floor space to accommodate at least five additional racks 410 of densely packed servers 400.

The cooling apparatus 1 described herein can be deployed in computer rooms and in large-scale data center applications. In other applications, the cooling apparatus 1 can be made in smaller sizes suitable for incorporation in automobiles, aircraft, and other vehicles, which may require cooling of batteries, inverters, and other electronic devices. In still other applications, the cooling apparatus 1 can be miniaturized for use in laptop and tablet computers and in handheld mobile electronic devices. In such examples, coolant passageways for transporting dielectric coolant 50 to a heat sink module 100 can be formed directly on a circuit board of the mobile device by any suitable manufacturing process, such as 3D printing. Similarly, heat sink modules 100 can be formed directly on a processor, memory module, or other electronic component of the mobile device by, for example, 3D printing.

Using the methods described herein, a high-efficiency cooling apparatus 1 for a wide variety of applications can be rapidly designed, optimized, manufactured, and installed. In some examples, additive-manufacturing processes can be used to rapidly manufacture heat sink modules 100 that permit consistent cooling of multiple device surfaces 12, even when those devices have non-uniform heat distributions on their surfaces, such as surfaces of multi-core microprocessors.

Due to their small size and flexible connections, the components described herein can be discretely packaged in many existing machines and devices that require efficient and reliable cooling of surfaces that produce high heat fluxes. For example, the cooling apparatuses 1 described herein can be discretely packaged in personal computers, servers, mobile electronic devices, or other electronic devices to cool memory modules and processors, such as computer processing units (CPUs), graphic processing units (GPUs), application-specific integrated circuits (ASICs), application-specific instruction set processor (ASIPs), physics processing unit (PPUs), digital signal processor (DSPs), image processors, coprocessors, network processors, audio processors, multi-core processors, and front end processors. The cooling apparatuses 1 described herein can also be packaged in vehicles to cool battery packs, inverters, electric motors, in-dash entertainment and navigation systems, display screens, and power electronics and in medical imaging devices to cool power supplies and other electronic components.

In some applications, heat rejected from the cooling apparatus 1 can be used to provide comfort heating or preheating of other fluids. In buildings, heat rejected from the cooling apparatus 1 can be used to preheat water to offset or eliminate the need for separate facility water heaters or to heat office space. Rejected heat can also be used for deicing of adjacent sidewalks and parking lots. In vehicles, heat rejected from the cooling apparatus can be used to warm occupant seats and steering wheels and can preheat mechanical components, such as cylinder heads and engine blocks to reduce cold start emissions. In vehicles, heat rejected from the cooling apparatus 1 can be used to warm vehicle transmission fluid and engine oil to decrease fluid viscosity and improve mechanical efficiency.

In data center applications, the cooling apparatuses 1 and methods described herein can provide local, efficient cooling of critical system components and, where the data center 425 is located in an office building, can allow the ambient temperature of the office building to remain at a temperature that is comfortable for human occupants, while still permitting effective cooling of critical system components. Presently, competing air cooling systems use room air within an office building to cool critical system components by employing small fans to blow air across finned surfaces of system components. As the system components (e.g. microprocessors) are more highly utilized, they begin to generate more heat. To provide additional cooling, there are only two options in an air cooling system. First, the mass flow rate of air across the components can be increased to increase the heat transfer rate, or second, the temperature of the room air can be reduced to provide a larger temperature differential between the room air and the component temperature, thereby increasing the heat transfer rate. Initially, fans speeds can be increased to provide higher flow rates of room air, which in turn provides higher heat transfer rates. However, at some point, maximum fan speeds will be attained, at which point the flow rate of room air can no longer be increased. At this point, if critical system components demand additional cooling (e.g. to prevent overheating or failure), the only option in competing air cooling systems is to decrease the temperature of the room air by delivering larger volumetric flow rates of cool air from an air conditioning unit to the room to reduce the room temperature. This approach is highly inefficient and ultimately results in discomfort for human occupants of the office building, since larger volumetric flow rates of cool air eventually cause the air temperature within the building to reach an uncomfortably cool temperature, which can diminish worker productivity.

Experimental Data

FIG. 8 shows a plot of experimental data showing power consumed versus time to cool a computer room 425 having forty active dual-processor servers 400. The left portion of the plot, extending from about 15 to 390 minutes, shows power consumed by a CRAC tasked with cooling the computer room 425. From about 15 to 190 minutes, the servers 400 were fully utilized, and from about 240 to 360 minutes, the servers were at idle state. At about 390 minutes, the cooling apparatus 1 was activated to assist the CRAC with cooling the servers 400. However, the heat sink modules 100 connected to the cooling apparatus 1 were only installed on microprocessors in 25% of the servers (ten of forty servers). Nevertheless, a dramatic reduction in power consumption was recorded. From 390 to 590 minutes, the cooling apparatus 1 conserved about 1.5 kW of power compared to the baseline idle state cooled by the CRAC only, and from about 625 to 840 minutes, the cooling apparatus 1 conserved about 2 kW of power compared to the baseline fully utilized state cooled by the CRAC only. The reduction in power consumption measured in this experiment is expected to scale as more servers in the computer room are connected to the cooling apparatus 1. Consequently, if heat sink modules 100 of the cooling apparatus 1 were installed on microprocessors 415 of all forty servers 400, reductions in power consumption of about 6 kW (i.e. 55%) and 8 kW (i.e. 67%) compared to the baseline idle and baseline fully utilized states, respectively, are expected. Reductions in power consumption of this magnitude can translate to significant savings in annual operating expenses for computer room and data center operators.

Experimental tests have demonstrated that significantly higher heat transfer rates are achievable with the cooling apparatus 1 than with existing single-phase pumped liquid systems. This higher heat transfer rate can be attributed, at least in part, to establishing conditions in an outlet chamber 150 of the heat sink module 100 that promote boiling of the coolant proximate the surface to be cooled 12. Experimental tests have confirmed that the heat sink module 100 shown in FIG. 21 is capable of dissipating a heat load of about 500 thermal watts, and the redundant heat sink module 700 shown in FIG. 51A is capable of dissipating a heat load of about 800 thermal watts.

During testing, a heat sink module 100 was provided that contained a plurality of orifices 155 configured to provide impinging jets streams 16 of coolant 50 directed against a surface to be cooled 12, as shown in FIG. 26. In a first test, the pressure in the outlet chamber 150 of the heat sink module 100 was set to establish a saturation temperature of about 95° C. for the coolant. In a second test, the pressure in the outlet chamber 150 of the heat sink module 100 was set to establish a saturation temperature of about 74° C. for the coolant. The saturation temperature of about 74° C. was chosen to substantially match the mean temperature of the heated surface (i.e. surface to be cooled 12) in the test. The same flow rate of coolant was used for each test. During the second test, bubbles 275 were generated in the outlet chamber 150 with the coolant having the lower saturation temperature. Such a phase change did not occur in the outlet chamber 150 with coolant having the higher saturation temperature in the first test. Overall, the heat transfer performance increased by 80% with the lower saturation temperature (i.e. the second test) where bubbles were generated compared to the higher saturation temperature (i.e. the first test) where bubbles were not generated.

One benefit of the cooling technology described herein is the ability to efficiently cool local hot spots on a heat-generating device 12 (e.g. hot spots on microprocessors 415). For example, if just one core of a given microprocessor 415 is more heavily utilized than other cores in the same processor, and a plurality of jet streams of coolant are directed at the surface of the microprocessor, more evaporation will occur proximate the hot core, thereby increasing the local heat transfer rate proximate the hot core relative to the cooler cores, and thereby self-regulating to maintain the entire surface 12 of the microprocessor at a more uniform temperature than is possible with purely single-phase cooling systems that are incapable of self-regulating. Because the cooling apparatus 1 is capable of self-regulating to cool local hot spots (e.g. by providing local increases in heat transfer rates through evaporation), the entire cooling system can be operated at lower flow rate and pressure, which conserves energy, and still handle fluctuations in processor temperature caused by variations in utilization. This is in sharp contrast to existing liquid cooling systems that are not capable of self-regulating to cool local hot spots and must therefore be operated at much higher flow rates and pressures to ensure adequate cooling of hot spots, for example, on microprocessors. In other words, existing liquid cooling systems must operate continuously at a setting that is designed to handle a peak heat load to ensure the system is capable of handling the peak heat load if it occurs. As a result, when the microprocessor is not being heavily utilized, which is quite often, existing systems operate at a pressure and flow rate that are considerably above where they would otherwise need to operate to handle a non-peak heat load. This approach needlessly consumes a significant amount of excess energy, and is therefore undesirable.

Two-Phase Flow

In some aspects, the cooling apparatuses 1 described herein can be configured to cool a heat-generating surface 12 by directing jet streams 16 of coolant against the surface 12 and by flowing coolant 50 over the surface 12, as shown in FIGS. 26 and 30. The terms "heat-generating surface," "surface to be cooled," "surface of the device," "heat source," "heated surface," "heat providing surface," "device surface," "component surface," and "heat-producing surface" are used herein to describe any surface 12 of a component or device that is at a temperature above ambient temperature, whether due to heat produced by or within the component or device or due to heat transferred to the component or device from some other component or device that is in thermal communication with the surface 12. Within some components of the cooling apparatus 1, at least a portion of the coolant 50 can undergo a phase change from a liquid to a vapor in response to absorbing heat from the surface 12 of the device. The phase change can result in the coolant 50 transitioning from a single-phase liquid flow to two-phase bubbly flow or from a two-phase bubbly flow having a first number density of vapor bubbles to two-phase bubbly flow having a second number density of vapor bubbles, where the second number density is higher than the first number density. By initiating boiling proximate the surface 12 being cooled, and taking advantage of the highly-effective heat transfer mechanisms associated therewith, the cooling apparatuses 1 and methods described herein can deliver heat transfer rates that far exceed heat transfer rates attainable with traditional single-phase liquid cooling or air cooling systems. By providing dramatically increased heat transfer rates, the cooling apparatus 1 described herein is able to cool devices far more efficiently than any other existing cooling apparatus, which translates to significantly lower power consumption by the cooling apparatus 1 and lower utility bills. Where the cooling apparatus 1 is used in a large scale cooling application, such as a data center, and replaces a conventional air conditioning system, the cooling apparatus can result in significant savings on utility bills for a data center operator.

When a heat-generating surface 12 exceeds the saturation temperature of the coolant 50, boiling of the coolant proximate (i.e. at or near) the heat-generating surface occurs. This can occur whether the bulk fluid temperature of the coolant 50 is at or below its saturation temperature. If the bulk fluid temperature is below the saturation temperature of the coolant 50, boiling is referred to as "local boiling" or "subcooled boiling." If the bulk fluid temperature of the coolant is equal to the saturation temperature, then "bulk boiling" is said to occur. Bubbles formed proximate the heat-generating surface 12 depart the surface 12 and are transported by the bulk fluid, creating a flow of liquid fluid with bubbles distributed therein, known as two-phase bubbly flow. Depending on the degree of subcooling, as the bubbly flow passes through tubing, some or all of the bubbles in the bubbly flow may condense and collapse as mixing of the fluid and bubbles occurs. As bubbles collapse back to liquid, the bulk fluid temperature rises. In saturated or bulk boiling, where the bulk fluid temperature is near the saturation temperature, the bubbles 275 distributed in the fluid may not collapse as the bubbly flow passes through tubing and as mixing of the fluid and bubbles occurs.

Two-phase flow can be defined based on a volume fraction of vapor present in the flow, where the volume fraction of vapor in the flow ($\alpha_{vapor}$) plus the volume fraction of liquid ($\alpha_{liquid}$) in the flow is equal to one ($\alpha_{vapor}+\alpha_{liquid}=1$). The volume fraction of vapor ($\alpha_{vapor}$) is commonly referred to as "void fraction" even though the vapor volume is filled with low density gas and no true voids exist in the flow. The volume fraction within a tube, such as a section of flexible tubing 225 between two series-connected heat sink modules 100, can be calculated using the following equation:

$$\alpha_{vapor} = A_{vapor}/A_x$$

where $A_x$ is the total cross-sectional flow area at point x in the tube, and $A_{vapor}$ is the cross-sectional area occupied by vapor at point x in the tube. The volumetric flux of vapor ($j_{vapor}$) in a flow 51, also known as the "superficial velocity" of the vapor, can be calculated using the following equation:

$$j_{vapor} = (v_{vapor} \times A_{vapor})/A_x = \alpha_{vapor} \times v_{vapor}$$

where $v_{vapor}$ is the velocity of vapor in the tube. In some instances, the velocity of vapor ($v_{vapor}$) and the velocity of the liquid ($v_{liquid}$) in the flow may not be equal. This inequality in velocities can be described as a slip ratio and calculated using the following equation:

$$S = v_{vapor}/v_{liquid}$$

Where the vapor velocity ($v_{vapor}$) and the liquid velocity ($v_{liquid}$) in the flow are equal, the slip ratio (S) is one. The flow quality is the flow fraction of vapor and is always between zero and one. Flow quality (x) is defined as:

$$x = \dot{m}_{vapor}/\dot{m} = \dot{m}_{vapor}/(\dot{m}_{vapor} + \dot{m}_{liquid})$$

where $\dot{m}_{vapor}$ is the mass flow rate of vapor in the tube, $\dot{m}_{liquid}$ is the mass flow rate of liquid in the tube, and m is the total mass flow rate in the tube ($\dot{m} = \dot{m}_{vapor} + \dot{m}_{liquid}$). The mass flow rate of liquid is defined as:

$$\dot{m}_{liquid} = \rho_{liquid} \times v_{liquid} \times A_{liquid}$$

where $\rho_{liquid}$ is the density of the liquid, and $A_{liquid}$ is the cross-sectional area occupied by liquid at point x in the tube. Similarly, the mass flow rate of vapor is defined as:

$$\dot{m}_{vapor} = \rho_{vapor} \times v_{vapor} \times A_{vapor}$$

where $\rho_{vapor}$ is the density of the vapor. The distribution of vapor in a two-phase flow of coolant 50, such as a two-phase flow of coolant within a heat sink module 100 mounted on a heat-generating surface 12, affects both the heat transfer properties and the flow properties of the coolant 50. These properties are discussed in greater detail below.

A number of flow patterns or "flow regimes" have been observed experimentally by viewing flows of two-phase liquid-vapor mixtures passing through transparent tubes. While the number and characteristics of specific flow regimes are somewhat subjective, four principal flow regimes are almost universally accepted. These flow regimes are shown in FIG. 58 and include (1) bubbly flow, (2) slug flow, (3) churn flow, and (4) annular flow. FIG. 58(a) shows bubbly flow having a first number density of bubbles, and FIG. 58(b) shows bubbly flow having a second number density of bubbles where the second number density is greater than the first number density of FIG. 58(a). FIG. 58(c) shows slug flow. FIG. 58(d) shows churn or churn-turbulent flow. FIG. 58(e) shows annular flow. Beyond annular flow, the flow will transition through wispy-annular flow before eventually reaching single-phase vapor flow.

Bubbly flow is generally characterized as individually dispersed bubbles 275 transported in a continuous liquid phase. Slug flow is generally characterized as large bullet-shaped bubbles separated by liquid plugs. Churn flow is generally characterized as vapor flowing in a chaotic manner through liquid, where the vapor is generally concentrated near the center of the tube, and the liquid is displaced toward the wall of the tube. Annular flow is generally characterized as vapor forming a continuous core down the center of the tube and a liquid film flowing along the wall of the tube.

To predict existence of a particular flow regime, or a transition from one flow regime to another, requires the above-mentioned visually observed flow regimes to be quantified in terms of measurable (or computed) quantities. This is normally accomplished through the use of a flow regime map. An example of a flow regime map is provided in FIG. 59A. The flow regime map shown in FIG. 59A is valid for steam-water systems and shows $\rho_{vapor} * j_{vapor}^2$ on the x-axis and $\rho_{vapor} * j_{vapor}^2$ on the y-axis. A similar flow regime map can be created for a dielectric coolant 50, such as a hydrofluorocarbon or hydrofluoroether, flowing over a heat-generating surface 12 within a heat sink module 100 or flowing within a flexible section of tubing 225, as described herein.

FIG. 59B shows the four two-phase flow regimes, including bubbly flow, slug flow, churn flow, and annular flow, plotted on void fraction versus mass flux axes. To maintain stability within the cooling apparatus during operation, it can be desirable to maintain single-phase liquid flow, bubbly flow, or a combination thereof throughout the apparatus. Experimental testing confirmed that bubbly flow does not result in flow instabilities within the cooling apparatus 1. To remain comfortably within the bubbly flow regime, it can be desirable to maintain the coolant below a predetermined void fraction and/or above a predetermined mass flux. The desired predetermined void fraction and predetermined mass flux can depend on several factors, including the configuration of the cooling apparatus 1 (e.g. components and layout), the type of coolant 50 being used, the coolant pressure within the apparatus, and the temperature of the surface to be cooled 12. In some examples, the void fraction of the coolant exiting the heat sink module 100 can be about 0-0.5, 0-0.4, 0-0.3, 0-0.2, or 0-0.1. In some examples, the mass flux of the coolant flowing through a heat sink module 100 can be about 10-2,000, 500-1,000, 750-1,500, 1,000-2,500, 2,250-2,500, 2,000-2,700, or greater than 2,700 kg/m2-s. As shown in FIG. 59B, as the void fraction increases (e.g. from about 0.3-0.5), the mass flux of the coolant 50 must also increase to avoid transitioning from bubbly flow to slug or churn flow at an outlet of the heat sink module 100 in the flexible tubing 225.

FIG. 60 shows a flow boiling curve where heat transfer rate is plotted as a function of "excess temperature" ($T_e$). Excess temperature is the difference between the actual temperature of the surface to be cooled 12 and the fluid saturation temperature ($T_e = T_{surface} - T_{sat}$). The curve is divided into 5 regions (a, b, c, d, and e), each corresponding to certain heat transfer mechanisms.

In region (a) of FIG. 60, a minimum criterion for boiling is that the temperature of the heat-generating surface 12 exceeds the local saturation temperature of the coolant $T_{sat}$). In other words, some degree of excess temperature ($T_e$) is required for boiling to occur. In region (a), the excess temperature may be insufficient to support bubble formation and growth. Therefore, heat transfer may occur primarily by single-phase convection in region (a).

In region (b) of FIG. 60, bubbles begin forming at nucleation sites on the heat-generating surface 12. These nucleation sites are generally associated with crevices or pits on the heat-generating surface 12 in which non-dissolved gas or vapor accumulates and results in bubble formation. As the bubbles grow and depart from the surface 12, they carry latent heat away from the surface and produce turbulence and mixing that increases the heat transfer rate. Boiling under these conditions is referred to as nucleate boiling. In region (b), heat transfer is a complicated mixture of single-phase forced convection and nucleate boiling. This region is often called the mixed boiling or "partial nucleate boiling region." As the temperature of the heat-generating surface 12 increases, the percentage of surface area that is subject to nucleate boiling also increases until bubble formation occupies the entire heat-generating surface 12.

In region (c) of FIG. 60, bubble density increases rapidly as the surface temperature increases further beyond the saturation temperature ($T_{sat}$). In this region, heat transfer can be dominated by bubble growth and departure from the surface 12. Formation and departure of these bubbles 275 can transport large amounts of latent heat away from the surface 12 and greatly increase fluid turbulence and mixing in the vicinity of the heat-generating surface 12. As a result, heat transfer can become independent of bulk fluid conditions such as flow velocity and temperature. Heat transfer in this region is know as "fully developed nucleate boiling" and is characterized by a substantial increase in heat transfer rate in response to only moderate increases in surface 12 temperature. However, there is a limit to the maximum rate of heat transfer that is attainable with fully developed nucleate boiling. At some point, the bubble density in the heat generating surface 12 cannot be increased any further. This point is know as the critical heat flux ("CHF") and is denoted as c* in FIG. 60. One theory is that at point c*, the bubble density becomes so high that the bubbles 275 actually impede the flow of liquid back to the surface 12, since bubbles in close proximity tend to coalesce, forming insulating vapor patches that effectively block the liquid coolant from reaching the heat-generating surface 12 and thereby prevent the liquid coolant from extracting latent heat, for example, by undergoing a phase change (i.e. boiling) at the surface 12.

It may be possible to delay the onset of critical heat flux by employing the cooling apparatuses 1 and methods described herein (e.g. heat sink modules capable of providing jet stream 16 impingement) that increase the heat transfer rate from the heated surface 12, thereby allowing the cooling apparatus 1 to safely and effectively cool a heat generating surface 12 that is at a temperature well above the saturation temperature of the coolant (e.g. about 20-30 degrees C. above $T_{sat}$) without reaching or exceeding critical heat flux. In some examples, delaying the onset of critical heat flux, and thereby increasing the heat transfer rate of the cooling apparatus 1 to previously unattainable rates, can be achieved by increasing the three-phase contact line 58 length, as described herein (see e.g. FIG. 63 and related description), by using the methods and components (e.g. heat sink modules 100) described herein, which can provide a plurality of jet stream 16 impinging against a heated surface 12 where the jets are positioned at a predetermined jet height 18 away from the heated surface 12. To delay the onset of critical heat flux (and thereby allow the cooling apparatus 1 to operate safely and effectively in region (c) shown in FIG. 60), a mass flow rate 51, jet height 18, orifice 155 diameter, coolant temperature, and coolant pressure can be selected from the ranges described herein to provide a plurality of jet streams 16 that impinge the surface to be cooled 12 and effectively increase the three-phase contact line 58 length proximate the surface to be cooled 12. Although the cooling apparatus 1 can operate extremely well in regions (a) and (b), the efficiency of the cooling apparatus 1 may be highest when operating in region (c).

As the temperature of the surface 12 increases beyond the temperature associated with critical heat flux, the heat transfer rate actually begins to decrease, as shown in region (d) of FIG. 60. Further increases in the surface 12 temperature simply result in a higher percentage of the surface 12 being covered by insulating vapor patches. These insulating vapor patches reduce the area available for liquid to vapor phase change (i.e. boiling). Therefore, despite the surface temperature ($T_{surface}$) continuing to increase, the overall heat transfer rate actually decreases, as shown in region (d) of FIG. 60. This region is referred to as the partial film or "transition film boiling region." Reaching or exceeding the temperature associated with critical heat flux can be undesirable, since performance can decrease and become unpredictable. Moreover, due to rapid production of vapor proximate the surface to be cooled 12, the two-phase flow in the cooling apparatus 1 can increase in quality and transition from bubbly flow to slug, churn, or annular flow, which can result in undesirable pressure surges within the system due to a volume fraction of vapor exceeding a stable working range. It is therefore desirable to operate in regions (a), (b), or (c), below the onset of critical heat flux at point c*. Where the cooling apparatus 1 includes a vapor quality sensor 880 near an outlet port 110 of the heat sink module 100, as shown in FIG. 74, the cooling apparatus is capable of operating beyond the onset of critical heat flux at point c*, and even up to the Leidenfrost point. In this arrangement, the vapor quality sensor 880 provides feedback to an electronic control unit 850 that can rapidly control the pressure and flow rate of coolant 50 though the heat sink module 100. For instance, if the vapor quality sensor 880 provides a signal to the electronic control unit 850 that is above a predetermined threshold, indicating a vapor quality that is beyond a maximum allowable vapor quality, the electronic control unit can instruct the pump 20 to increase mass flow rate of coolant through the heat sink module, either by increasing the pressure, velocity, or both of the flowing coolant. In some examples, the flow quality (x) sensor 880 can be an annular shaped sensor that fits over an outer circumference of the flexible tubing 225 (see FIG. 74) and provides a signal to the electronic control unit 850 wirelessly or through a cable 852. In some examples, the flow quality (x) sensor 880 can be an ultrasonic sensor capable of detecting density variations between vapor coolant and liquid coolant.

In region (e) of FIG. 60, a vapor layer covers the heat-generating surface 12. In this region, heat transfer occurs by conduction and convection through the vapor layer with evaporation occurring at the interface between the vapor layer and the liquid coolant. This region is known as the "stable film boiling region." Similar to region (d), region (e) is may not be suitable for stable operation of the cooling apparatus 1 due to significant vapor formation resulting in slug, churn, or annular flow.

FIG. 61 shows a flow boiling curve for water at 1 atm, where heat flux is plotted as a function of excess temperature. As noted above, excess temperature is the difference between the actual temperature of the surface to be cooled 12 and the fluid saturation temperature ($T_e = T_{surface} - T_{sat}$). The curve of FIG. 61 shows the onset of nucleate boiling, the point of critical heat flux, and the Leidenfrost point. Between the critical heat flux point and the Leidenfrost point is a transition boiling region where the coolant vaporizes almost immediately on contact with the heated surface 12. The resulting vapor suspends the liquid coolant on a layer of vapor within the outlet chamber 150 and prevents any further direct contact between the liquid coolant and the heated surface 12. Since vapor coolant has a much lower thermal conductivity than liquid coolant, further heat transfer between the heated surface 12 and the liquid coolant is slowed down dramatically, as shown by the downward slope of the plot between CHF and the Leidenfrost point. Beyond the Leidenfrost point, radiation effects become significant, as radiation from the heated surface 12 transfers heat through the vapor layer to the liquid coolant suspended above the vapor layer, and the heat flux again increases.

Coolant

As used herein, the general term "coolant" refers to any fluid capable of undergoing a phase change from liquid to vapor or vice versa at or near the operating temperatures and pressures of the cooling apparatuses 1. The term "coolant" can refer to fluid in liquid phase, vapor phase, or mixtures thereof (e.g. two-phase bubbly flow). A variety of coolants 50 can be selected for use in the cooling apparatus 1 based on cost, level of optimization desired, desired operating pressure, boiling point, and existing safety regulations that govern installation (e.g. such as regulations set forth in ASHRAE Standard 15 relating to permissible quantities of coolant per volume of occupied building space).

Selection of the coolant 50 for the cooling apparatus 1 can be influenced by desired dielectric properties of the coolant, a desired boiling point of the coolant, and compatibility with polymer materials used to manufacture the heat sink module 100 and the flexible tubing 225 of the apparatus 1. For instance, the coolant 50 may be selected to ensure little or no permeability through system components (e.g. heat sink modules 100 and flexible tubing 225) and no damage to any system components (e.g. to ensure that pump 20 or quick-connect seals are not damaged or compromised by the coolant 50).

Water is readily abundant and inexpensive. Although the cooling apparatuses 1 described herein can be configured to operate with water as a coolant, water has certain traits that make it less desirable than other coolant options. For instance, water does not change phase at a low temperature (such as 40-50° C.) without operating at very low pressures, which can be difficult to maintain in a relatively inexpensive cooling apparatus that includes at least some standard fittings and system components (e.g. gear pumps, valves, valves, and flexible tubing). In addition, water as a coolant requires a number of additives (e.g. corrosion inhibitors and mold inhibitors) and can absorb a range of materials from surfaces of system components it contacts. As water changes phase, these materials can precipitate out of solution, causing fouling or other issues within system components. Fouling is undesirable, since it can reduce system performance by effectively increasing the thermal resistance of certain components that are tasked with expelling heat from the system (e.g. heat exchanger 40) or tasked with absorbing heat into the system from devices being cooled by the system (e.g. copper base plate 430). The above-mentioned challenges can be overcome with appropriate filtration and fittings, which adds cost to the system. However, water is a highly effective heat transfer medium, so where increased heat transfer rates are required, and where the risk of failure of the electronic components is acceptable if a leak develops, the additional cost and complexity associated with using water as the coolant may be justified. But in most practical situations, such as cooling servers 400 in data centers, the risk of loss is not acceptable due to the high cost of servers, so water should be avoided as a coolant.

In some examples, it can be preferable to use a dielectric fluid, such as a hydrofluorocarbon (HFC) or a hydrofluoroether (HFE) instead of water as a coolant 50 in the cooling apparatus 1. Unlike water, dielectric coolants 50 can be used in direct contact with electronic devices, such as CPUs, memory modules, and power inverters without shorting electrical connections of the devices. Therefore, if a leak develops in the cooling apparatus and coolant drips onto an electrical device, there is no risk of damage to the electrical device. In some examples of the cooling apparatus 1, the dielectric coolant 50 can be delivered directly (e.g. by way of one or more jet streams 16) onto one or more surfaces of the electronic device (e.g. one or more surfaces of a microprocessor 415), thereby eliminating the need for commonly-used thermal interface materials (e.g. copper base plates 430 and thermal bonding materials) between the flowing coolant 50 and the electronic device and can thereby eliminate thermal resistances associated with those thermal interface materials, thereby enhancing performance and overall efficiency of the cooling apparatus 1.

Non-limiting examples of dielectric coolants 50 include 1,1,1,3,3-pentafluoropropane (known as R-245fa), hydrofluoroether (HFE), 1-methoxyheptafluoropropane (known as HFE-7000), methoxy-nonafluorobutane (known as HFE-7100). One version of R-245fa is commercially available as GENETRON 245fa from Honeywell International Inc. headquartered in Morristown, N.J. HFE-7000 and HFE-7100 (as well as HFE-7200, HFE-7300, HFE-7500, HFE-7500, and HFE-7600) are commercially available as NOVEC Engineered Fluids from 3M Company headquartered in Mapleton, Minn. FC-40, FC-43, FC-72, FC-84, FC-770, FC-3283, and FC-3284 are commercially available as FLUOROINERT Electronic Liquids also from 3M Company.

GENETRON 245fa is a pentafluoropropane and has a boiling point of 58.8 degrees F. (~14.9 degrees C.) at 1 atm, a molecular weight of 134.0, a critical temperature of 309.3 degrees F., a critical pressure of 529.5 psia, a saturated liquid density of 82.7 lb/ft3 at 86 degrees F., a specific heat of liquid of 0.32 Btu/lb-deg F. at 86 degrees F., and a specific heat of vapor of 0.22 btu/lb-deg F. at 1 atm and 86 degrees F. GENETRON 245fa has a Safety Group Classification of A1 under ANSI/ASHRAE Standard 36-1992. For cooling a processor 415 that has a preferred operating core temperature of about 60-70 degrees C., GENETRON 245fa can be provided at a pressure greater than atmospheric pressure to increase its saturation temperature to about 25-35, 30-40, or 35-50 degrees C. to ensure the bulk of the coolant remains in liquid phase at it passes through the heat sink module 100. For flow rates of about 0.25-1.25 liters per minute of subcooled GENETRON 245fa through the heat sink module 100, the rate of boiling can depend on the processor utilization level. For instance, when the processor 415 is idling, the subcooled GENETRON 245fa may experience no local boiling, and when the processor is fully utilized, the subcooled GENETRON 245fa may experience vigorous local boiling and bubble 275 generation.

NOVEC 7000 has a boiling point of 34 degrees C., a molecular weight of 200 g/mol, a critical temperature of 165 degrees C., a critical pressure of 2.48 MPa, a vapor pressure of 65 kPa, a heat of vaporization of 142 kJ/kg, a liquid density of 1400 kg/m3, a specific heat of 1300 J/kg-K, a thermal conductivity of 0.075 W/m-K, and a dielectric strength of about 40 kV for a 0.1 inch gap. For cooling a processor 415 that has a preferred operating core temperature of about 60-70 degrees C., NOVEC 7000 works well. For flow rates of about 0.25-1.25 liters per minute of subcooled NOVEC 7000 through the cooling line, where the subcooled NOVEC 7000 is delivered to the heat sink module 100 at a pressure of about 15 psi and a temperature of about 25 degrees C., local boiling of the coolant may occur proximate the surface to be cooled. The rate of boiling can depend on the processor utilization level. For instance, when the processor is idling, the NOVEC 7000 may experience no local boiling, and when the processor is fully utilized, the NOVEC may experience vigorous local boiling and bubble 275 generation.

NOVEC 7100 has a boiling point of 61 degrees C., a molecular weight of 250 g/mol, a critical temperature of 195 degrees C., a critical pressure of 2.23 MPa, a vapor pressure of 27 kPa, a heat of vaporization of 112 kJ/kg, a liquid density of 1510 kg/m3, a specific heat of 1183 J/kg-K, a thermal conductivity of 0.069 W/m-K, and a dielectric strength of about 40 kV for a 0.1 inch gap. NOVEC 7100 works well for certain electronic devices, such as power electronic devices that produce high heat loads and can operate safely at temperatures above about 80 degrees C.

NOVEC 649 Engineered Fluid is also available from 3M Company. It is a fluoroketone fluid ($C_6$-fluoroketone) with a low Global Warming Potential (GWP). It has a boiling point of 49 degrees C., a thermal conductivity of 0.059, a molecular weight of 316 g/mol, a critical temperature of 169 degrees C., a critical pressure of 1.88 MPa, a vapor pressure of 40 kPa, a heat of vaporization of 88 kJ/kg, and a liquid density of 1600 kg/m3.

In some examples, the coolant 50 can be a combination of dielectric fluids described above. For instance, the coolant 50 can include a combination of R-245fa and HFE-7000 or a combination of R-245fa and HFE-7100. In one example, the coolant 50 can include about 1-5, 1-10, 5-20, 10-20, 15-30, or 25-50 percent R-245fa by volume with the remainder being HFE-7000. In another example, the coolant 50 can include about 1-5, 1-10, 5-20, 10-20, 15-30, or 25-50 percent R-245fa by volume with the remainder being HFE-7100.

Combining two or more types of dielectric fluids to form a coolant mixture for use in the cooling apparatus 1 can be desirable for several reasons. First, certain fluids, such a R-245fa may be regulated in ways that restrict the volume of fluid that can be used in an occupied building, such as an office building. Since R-245fa has been shown to perform well in the cooling apparatus 1, it may be desirable to use as much R-245fa as legally permitted in the cooling apparatus 1, and if additional coolant volume is required, to use an unregulated coolant, such as HFE-7000 or HFE-7100, to increase the total coolant volume within the cooling apparatus 1 to reach a desired coolant volume.

Second, combining dielectric coolants can allow a coolant mixture with a desired boiling point to be formulated. R-245fa has a boiling point of about 15 degrees C. at 1 atm, and HFE-7000 has a boiling point of about 34 degrees C. at 1 atm. In some examples, neither of these boiling points may be optimal for use in a particular application. By combining R-245fa and HFE-7000, a coolant mixture can be created that behaves as if its boiling point were somewhere between 15 and 34 degrees C., depending on the mixture ratio. The ability to create a coolant mixture with a specific boiling point can be highly desirable for custom tailoring the coolant mixture for a specific application depending on a desired operating temperature of the surface to be cooled 12.

Cooling Apparatus

FIG. 1 shows a front perspective view of a cooling apparatus 1 installed on a plurality of racks 410 of servers 400 in a data center or computer room 425. The racks 410 of servers 400 are arranged in a row with a pump 20, reservoir 200, and other system components arranged near the left side of the row of racks 410. One or more tubes extend along the length of the row of racks 410 and fluidly connect servers 400 within each rack 410 to the cooling apparatus 1, thereby allowing heat-generating components 12 (e.g. processors) within each server to be cooled by the cooling apparatus 1. As used herein, the term "fluidly connected" refers to two components that are arranged in such a manner that a fluid can travel from a first component to a second component either directly or indirectly (e.g., through one or more other components, such as piping or fittings).

In addition to cooling microprocessors in servers, the cooling apparatus can be configured to cool a wide variety of other devices. In some examples, the cooling apparatus 1 can be configured to cool one or more heat-producing surfaces 12 associated with batteries, electric motors, control systems, power electronics, chemistry equipment (e.g. rotary evaporators or reflux distillation condensers), or machines or mechanical devices (e.g. turbines, internal combustion engines, radiators, braking components, turbochargers, engine intake manifolds, plasma cutters, drills, oil and gas exploratory and recovery equipment, water jet cutters, welding systems, or computer numerical control (CNC) mills or lathes).

FIG. 2A shows a rear view of the cooling apparatus 1, and FIG. 2B shows a detailed rear view of a right portion of the cooling apparatus shown in FIG. 2A. In this example, the cooling apparatus 1 can include a plurality of components and sub-assemblies fluidly connected to provide a cooling apparatus 1 that is capable of locally cooling one or more heat-producing surfaces 12 (e.g. flat surfaces, curved surfaces, or complex surfaces), such as surfaces associated with CPUs, memory modules, and motherboards located within the server housings.

FIG. 3 shows a left side view of the cooling apparatus 1 of FIG. 1. Portions of a primary cooling loop 300 are visible in FIG. 3, including a pump 20, reservoir 200, drain/fill location 245, shut-off valve 250, pressure gauge 255, inlet manifold 210, and return line 230. Portions of a first bypass 305 are also visible in FIG. 3, including a valve 60 and heat exchanger 40. As shown in FIG. 3, the primary cooling loop 300 and the first bypass 305 can be fluidly connected to the reservoir 200.

FIGS. 92-95 show a cooling apparatus 1 with redundant pumps (20-1, 20-2), shut-off valves 250, a tubular reservoir 200, and a first bypass 305. The first bypass 305 can include a valve 60 and a heat exchanger 40, as shown in FIG. 93. The valve 60 can be a differential pressure bypass valve as shown in FIGS. 111-112. The heat exchanger 40 can include two independent fluid pathways, as shown in FIG. 97. A first independent fluid pathway can transport a first bypass flow 51-1 of coolant 50, and a second independent fluid pathway can transport a flow 42 of external cooling fluid, such as a water-glycol mixture from an external heat rejection loop 43. The coolant 50 in the first independent pathway can be at a higher temperature than the external cooling fluid in the second independent pathway. Heat transfer from the coolant 50 to the external cooling fluid can cause a decrease in the coolant temperature and an increase in the external cooling fluid temperature. The external heat rejection loop 43 can reject heat absorbed from the coolant 50 to a location outside of the data center 425 or distributed computing facility where the cooling apparatus 1 is located.

In some examples, the heat exchanger 40 can be a heat liquid-to-air heat exchanger as described in U.S. patent application Ser. No. 14/833,087, titled "Heat Exchanger with Helical Passageways" and filed on Aug. 22, 2015; and U.S. patent application Ser. No. 14/833,092, titled "Heat Exchanger with Interconnected Fluid Transfer Members" and filed on Aug. 22, 2015, each of which is hereby incorporated by reference in its entirety.

FIG. 115 shows a variation of the cooling apparatus 1 presented in FIG. 68. The schematic in FIG. 115 shows a cooling apparatus 1 with a primary cooling loop 300 and a heat rejection loop 43 that are both fluidly connected to a common reservoir 200. The primary cooling loop 300 includes a first pump 20-1 that circulates coolant from the reservoir 200, through the primary cooling loop, and back to the reservoir. Of the coolant flow 51 provided by the first pump 20-1, a first portion 51-1 of the coolant flow passes through a cooling line 303 and a second portion 51-2 of the coolant flow passes through a bypass 305 containing a valve 60, such as a differential pressure bypass valve. The valve 60 can control a differential pressure between an inlet and an outlet of the cooling line 303, thereby allowing a pressure differential between an inlet and outlet chambers (145, 150) of the heat sink module 100 to be established and controlled to promote formation of two-phase flow within the heat sink modules 100 and thereby achieve significantly higher heat absorption rates than would be possible with only sensible heating of a single-phase liquid. The cooling apparatus 1 in FIG. 115 includes a heat rejection loop 43 that serves to reject heat from the coolant. Heat rejection is accomplished by pumping coolant from the reservoir 200 using a second pump 20-2, flowing the coolant through a heat exchanger 40 to reject heat, and returning the coolant to the reservoir at a lower temperature than when it entered the heat rejection loop 43. In FIG. 115, the primary cooling loop 300 includes one cooling line 303 fluidly connecting two heat sink modules 100. In other examples, as shown in FIG. 117, the cooling apparatus 1 can have more than one cooling line 303, each having one or more heat sink modules.

FIG. 116 shows an example of the cooling apparatus 1 of FIG. 115 installed in a computer, such as a personal computer, high-performance gaming computer, or server. In the example shown in FIG. 116, the heat exchanger is located within the computer housing and is connected to a computer fan 26. The computer in FIG. 116 includes two processors 415, each with a heat sink module 100 mounted thereon. In other examples, additional heat sink modules 100 can be fluidly connected in series with the two heat sink modules to provide cooling of other components, such as one or more CPUs, GPUs, or memory modules 420. In this example, the heat exchanger 40 can be a traditional liquid-to-air heat exchanger or can be the heat exchanger presented in U.S. patent application Ser. Nos. 14/833,087 and 14/833,092.

FIG. 117 shows a schematic for a compact cooling apparatus 1 integrated with a server rack 410. The cooling apparatus 1 includes a fluid distribution unit 10 that is fluidly connected to a manifold assembly 680. The fluid distribution unit 10 can be housed in an enclosure and can slide into the server rack 410 similar to the way a server 400 slides into the server rack. The fluid distribution unit 10 can be housed in an enclosure to protect components of the fluid distribution unit and to reduce noise. For instance, the enclosure can include acoustic foam or other sound deadening materials on inner surfaces of the enclosure to reduce noise resulting from operating pumps (20-1, 20-2). To improve serviceability of the cooling system and to reduce the duration of downtime if a pump or other component fails, the fluid distribution unit can be swappable without tools. As shown in FIG. 117, the fluid distribution can fluidly connect to the remainder of the cooling apparatus by a pair of quick-connect couplers. In the event of a component failure, the couplers can be disconnected by hand and the fluid distribution unit 10 can be withdrawn from the rack 410 and replaced with a functional unit. This ease of serviceability allows an IT professional to service the cooling apparatus instead of requiring a facility professional.

As shown in FIGS. 92-95, the fluid distribution unit 10 of the cooling apparatus 1 can be mounted on a moveable stand 49 that allows the unit to be easily moved in a data center 425 when, for example, the layout of the data center changes to accommodate an increase or a decrease in the number of server racks 410. The fluid distribution unit 10 can include the pump or pumps 20, reservoir 200, and heat exchanger 40. The moveable stand 49 of the fluid distribution unit 10 can have a width and a depth similar to a server rack 410, thereby allowing the moveable stand 49 to fit in any area suitable for a server rack. For example, the moveable stand 49 can have a width of about 20-36 inches and a depth of about 35-45 inches. In some examples, the fluid distribution unit 10 can be mounted within a server rack 411, which can be moveable. For larger cooling systems 1 (e.g. systems capable of cooling about 125-1,000 servers or more), the fluid distribution unit 10 may take up all or most of an inner volume of the server rack 411. For smaller cooling systems 1, (e.g. system capable of cooling 5-36 servers), the fluid distribution unit 10 may occupy a 4U or 6U slot within a 42U server rack, where U stands for units that can be installed in the server rack. The size of electronic equipment, such as servers and network switches, can vary, but servers commonly have a 1U form factor, meaning they occupy one unit slot in the rack 411. For a fluid distribution unit 10 that has a 4U or 6U form factor, meaning it occupies 4 or 6 unit slots, respectively, it can be desirable to enclose the fluid distribution unit in a housing that easily slides into and out of the server rack 411 chassis. This can allow the fluid distribution unit 10 to be compatible with a wide variety of commercially available server racks 411 and can allow for easy servicing or adjustment of components within the fluid distribution unit, such as the pump 20 or valve 60. In many instances, it can be desirable for data center operators to maintain one or more spare fluid distribution units 10 onsite. If an issue is encountered with an operating fluid distribution unit 10, it can simple be removed and replaced with a properly operating fluid distribution unit by a robot or unskilled worker. This approach can greatly reduce downtime and can eliminate the expense of having a skilled service professional constantly onsite at the data center to handle urgent maintenance issues. Rather, the faulty fluid distribution unit 10 can be serviced during a regularly scheduled service visit to the data center by the skilled service professional, or the faulty fluid distribution unit 10 can be shipped to a service shop to eliminate travel expenses for the skilled service professional to personally visit the data center.

In some data centers, it can be desirable to minimize noise from cooling systems so that employees do not have to wear hearing protection. In the cooling apparatus 1 described herein, the pump 20 is the only component of the cooling apparatus that produces noise. In some instances, it may be desirable to place the fluid distribution unit 10 in a separate room to isolate pump noise from the data center floor where the racks 410 of servers 400 are located. The fluid distribution unit 10 can be located up to 50 feet away from servers it is actively cooling, so locating the fluid distribution unit in a separate room is feasible. Where a data center has a large number of servers that requires multiple cooling apparatuses to provide cooling, the fluid distribution units 10 for all of the cooling apparatuses may be located in the same room or gallery to isolate pump noise.

FIGS. 11A-14, 16-20, 68-72, and 75-83 present a variety of configurations for the cooling apparatus 1. Depending on its configuration, the cooling apparatus 1 can include a plurality of fluidly connected components, including one or more pumps 20, one or more reservoirs 200, one or more heat exchangers 40, one or more inlet manifolds 205, one or more outlet manifolds 210, one or more valves 60, one or more sections of flexible tubing 225, and one or more heat sink modules 100 mounted on, or placed in thermal communication with, one or more surfaces to be cooled 12.

FIG. 11A shows an exemplary schematic of a cooling apparatus 1 having one heat sink module 100 mounted on a heat generating surface 12. The heat-generating surface 12 can be any surface having a temperature above ambient temperature that requires cooling. For instance, the heat-generating surface 12 can be a surface of a mechanical or electrical device, such as a surface of a processor 415, such as a CPU or GPU. As identified by dashed lines in FIG. 11B, the cooling apparatus 1 can include a primary cooling loop 300 fluidly connecting a pump 20, at least one heat sink module 100, a return line 230, and a reservoir 200. The pump 20 can be configured to draw single-phase liquid coolant from the reservoir 200 and deliver a flow 51 of pressurized single-phase liquid coolant 50 to an inlet port 105 of a heat sink module 100. The heat sink module 100, being mounted on the heat-generating surface 12, can be configured to direct a flow of pressurized coolant 51 at the surface of the heat-generating surface 12 in the form of a plurality of jet streams 16 of coolant impinging the heat-generating surface 12, thereby facilitating heat transfer from the heat-generating surface to the flow of coolant. The return line 230 can be configured to transport the flow of coolant 51, which may include two-phase bubbly flow, from the outlet port 110 of the heat sink module 100 back to the reservoir 200 where it can be mixed with single-phase liquid coolant to promote condensation of vapor bubbles within the two-phase bubbly flow, thereby resulting in transition of the two-phase bubbly flow back to single-phase liquid coolant that can once again be delivered to the pump 20 without risk of cavitation or vapor lock. FIG. 81 shows a preferred variation of the schematic shown in FIG. 11A, where single-phase and two-phase flow are visually represented in sections of tubing fluidly connecting components of the system. Specifically, two-phase bubbly flow is shown exiting an outlet port 110 of the heat sink module 100. FIG. 81 also includes an external heat rejection loop that is fluidly connected to an external dry cooler 40-2, which can be placed outside of the data center 425 or on a roof of the data center, thereby allowing heat from the cooling apparatus 1 to be rejected outside of the data center and avoiding heating air within the data center.

As identified by dashed lines in FIG. 11C, the cooling apparatus 1 can include a first bypass 305 including a valve 60 and a heat exchanger 40. The purpose of the first bypass 305 can be to divert a portion of the flow 51 away from the primary cooling loop 300 and through the heat exchanger 40 where the fluid can be further subcooled and returned to the reservoir 200 to assist in condensing vapor in the reservoir by further reducing the bulk fluid temperature of the liquid coolant in the reservoir 200. As a result, when the two-phase bubbly flow is delivered to the reservoir via the return line 230, it immediately mixes in the reservoir 200 with a large volume of coolant 50 that is well below the saturation temperature of the liquid, thereby promoting condensing of all vapor bubbles entering the reservoir via the return line. The portion of flow 51 that is diverted through the first bypass 305 can be controlled, at least in part, by adjusting the valve 60 located in the first bypass 305. The preferred amount of flow 51-1 that is diverted through the first bypass 305 may depend on the reservoir temperature and/or the quality (x) of the flow returning to the reservoir via the return line 230. For example, if the temperature of the fluid in the reservoir 200 reaches a predetermined threshold value (e.g. if the temperature of the coolant in the reservoir increases to about 10-15 degrees below the saturation temperature of the coolant), or if the quality of the flow in the return line 230 reaches a predetermined threshold value (e.g. if the quality of the flow in the return line 230 reaches a value of about 0.25-0.35, 0.3-0.4, 0.35-0.5), it can be desirable to increase the amount of flow through the first bypass 305 to reject heat from the coolant using the heat exchanger so that cool liquid coolant can be circulated back to the reservoir 200 to ensure that vapor bubbles 275 entering via the return line 230 rapidly condense within the reservoir 200 and are not permitted to reach the pump 20. Through this approach, a supply of single-phase liquid coolant can be provided from the reservoir 200 to the pump to ensure stable pump operation.

In the schematic shown in FIG. 11A, the heat exchanger 40 is positioned downstream of the valve 60, but this is not limiting. In other examples, the valve 60 can be positioned downstream of the heat exchanger 40, as shown in FIG. 12A, where the cooling apparatus 1 has one heat sink module 100 mounted on a heat source 12 and a valve 60 located downstream of the heat exchanger 40 in the first bypass 305.

As identified by dashed lines in FIG. 11D, the cooling apparatus 1 can include a second bypass 310 including a valve 60. The second bypass 310 can route a portion of the pressurized single-phase liquid flow around the heat sink module 100 and can be fluidly connect to the primary cooling loop 300 downstream of the heat sink module 100. Depending on the surface temperature of the heat-generating surface 12 and settings of the cooling apparatus (e.g. pressure, flow rate, coolant type, bulk coolant temperature at the module inlet 105, coolant saturation temperature, etc.), the primary cooling loop 300 may be transporting two-phase bubbly flow downstream of the outlet port 110 of the heat sink module 100. To encourage condensing of bubbles 275 within the two-phase bubbly flow before the coolant reaches the reservoir (and thereby reducing the likelihood of vapor being introduced to the pump 20), the second bypass 310 can route single-phase liquid coolant around the heat sink module 100 and deliver the single-phase liquid coolant to the primary cooling loop 300 that is carrying two-phase bubbly flow, effectively mixing the two flows upstream of the reservoir 200. This mixing encourages condensing of all or a portion of the bubbles in the two-phase bubbly flow before the flow is delivered back to the reservoir 200 via the return line 230, thereby further reducing the likelihood that any bubbles 275 will be drawn from the reservoir 200 and fed to the pump, where they could cause unwanted cavitation.

Because the bubbles 275 formed in the two-phase bubbly flow are relatively small and are distributed (i.e. dispersed) throughout the liquid coolant 50, the bubbles are carried through the primary cooling loop 300 by the momentum of the liquid coolant and do not travel vertically within the system due to gravitational effects. Consequently, the cooling apparatus 1 does not require a condenser mounted at a high point in the system to collect and condense vapor bubbles back to liquid, as competing systems do. Since no condenser is required, the cooling apparatus 1 can be much smaller in size and less expensive than competing systems that require a condenser. Also, the heat sink modules 100 and sections of flexible tubing 225 described herein can be installed in any orientation without concerns of vapor lock. To the contrary, in competing systems, the orientation of system components can be critical to ensure that all vapor is transported to a condenser located at a high point in the system by way of gravity to ensure that vapor does not make its way to the pump, where it could result in vapor lock and/or pump cavitation and system failure.

As used herein, "fluid communication" between two or more elements refers to a configuration in which fluid can be communicated between or among the elements and does not preclude the possibility of having a filter, flow meter, temperature or pressure sensor, or other devices disposed between such elements. The elements of the cooling apparatus 1 are preferably configured in a closed fluidic system, as shown in FIG. 11A, thereby permitting containment of the coolant 50 which could otherwise evaporate into the environment.

Valve

The valve 60 can be any suitable type of valve that is capable of maintaining suitable working pressure ranges and flow rates within the cooling apparatus as described herein to ensure smooth operation of the cooling apparatus 1. The valve 60 can provide a differential pressure of about 1-100, 1-50, 5-25 psi, or more preferably 1-5, 2-10, 5-12, 10-15, or 10-25 psi between an inlet chamber 655 and an outlet chamber 665 of the manifold assembly 680, as shown in FIGS. 103-105. In some examples, the valve 60 can be a differential pressure bypass valve, as shown in FIGS. 111 and 112. In other examples, the valve can be a ball valve, gate valve, globe valve, needle valve, Tesla Valve, diaphragm valve, or pressure regulator.

A differential pressure bypass valve 60 can include a valve inlet 61 and a valve outlet 62, as shown in FIGS. 111 and 112. The differential pressure bypass valve 60 can be configured to control a flow of pressurized coolant through the bypass 310 of the cooling apparatus 1 by establishing a pressure differential of about 1-5, 2-10, 5-12, 10-15, or 10-25 psi between the valve inlet 61 and the valve outlet 62. The differential pressure bypass valve 60 can include a bypass circuit 67 fluidly connecting the valve inlet 61 to the valve outlet 62 and a valve plug 64 disposed in the bypass circuit, as shown in FIG. 112. The valve plug 64 can be configured to restrict flow of pressurized coolant though the bypass circuit 67. The differential pressure bypass valve 60 can include a spring 68 disposed between the valve plug 64 and a control knob 63. Tightening the control knob 63 can compress the spring 68 against the valve plug 69 and increase a differential pressure setting of the differential pressure bypass valve 60. The differential pressure setting can be manually controlled or electronically controlled and actuated by adjusting the control knob 63 with a stepper motor or other suitable electromechanical device. In some examples, the valve 60 can be a 519 Series differential pressure bypass valve from Caleffi S.p.a of Italy.

In some examples, the differential pressure bypass valve 60 can be a two-way, self-contained proportional valve with an integral differential pressure adjustment setting, as shown in FIGS. 111 and 112. The valve 60 can have a valve inlet 61 and a valve outlet 62. The valve 60 can be installed in the first bypass 305 and/or the second bypass 310, as shown, for example, in FIGS. 11D, 79, and 82. When installed in the second bypass 310, the valve inlet 61 can be fluidly connected to the inlet chamber 655, and the valve outlet 62 can be fluidly connected to the outlet chamber 665. The differential pressure bypass valve 60 can prevent excessive head pressure from occurring in the inlet chamber 655 by allowing a flow of pressurized coolant to flow from the inlet chamber to the outlet chamber 665 without passing through the flexible cooling lines 300 and heat sink modules 100. The differential pressure bypass valve 60 can open and begin bypassing flow when the differential pressure reaches an adjustment setting, such as 1-100, 1-50, 5-25, or more preferably 1-5, 2-10, 5-12, 10-15, or 10-25 psi. In some examples, the second bypass 310 can be formed within the manifold assembly 680, and the differential pressure bypass valve 60 can be installed in the second bypass, as shown in FIG. 105, to provide an integrated valve manifold assembly. This integrated valve manifold assembly 680 can reduce the number of manifold assembly components and thereby reduce cost and assembly time of the manifold assembly.

The size of the valve 60 can be selected based upon an anticipated flow rate through the bypass (305, 310), which can depend on, among other factors, the number of cooling lines 303 present in the cooling apparatus 1, the heat capacity of the coolant 50 being used, and the heat load of the surfaces to be cooled 12. In one example, the valve 60 can have a bypass circuit 67 with an inner diameter of about 0.75 inch and can flow up to 9 gpm. In another example, the valve 60 can have a bypass circuit 67 with an inner diameter of about 1 inch and can flow up to 40 gpm. In yet another example, the bypass circuit 67 can have an inner diameter of about 1.25 inches and can flow up to 45 gpm.

As shown in FIGS. 11A and 11D, the valve 60 can be located in the second bypass 310 of the cooling apparatus 1 and can be used to control the pressure differential between the inlet port 105 and the outlet port 110 of the heat sink module (i.e. the pressure differential between the high-pressure coolant 54 at the inlet port 105 and the low-pressure coolant 55 at the outlet port 110). By doing so, the valve 60 can be used to adjust the flow rate through the heat sink module 100. Where the cooling apparatus 1 has a plurality of heat sink modules 100 fluidly connected in parallel to the inlet manifold 210 and outlet manifold 215, as shown in FIG. 16, the valve 60 in the second bypass 310 can be used to control the pressure differential between the inlet manifold 210 and the outlet manifold 215, and thereby control flow through the heat sink modules 100.

In the cooling apparatus 1 shown in FIG. 11A, by adjusting the valve 60 located in the second bypass 310, the pressure differential between the inlet port 105 and outlet port 110 can be controlled. In the cooling apparatus 1 shown in FIG. 16, the valve 60 can be adjusted to provide a pressure differential between the inlet manifold 210 and the outlet manifold 215. In one example, the valve 60 can be adjusted to provide a pressure differential of about 5-15 or 10-15 psi between the inlet manifold 210 and the outlet manifold 215. For instance, if the high-pressure coolant 54 in the inlet manifold 210 is at a pressure of about 60 psi, the valve 60 can be adjusted to maintain low-pressure coolant 55 in the outlet manifold 215 at a pressure of about 45-55 or 45-50 psi. In another example, if the high-pressure coolant 54 in the inlet manifold 210 is at a pressure of about 30 psi, the valve 60 can be adjusted to maintain low-pressure coolant 55 in the outlet manifold 215 at a pressure of about 15-25 or 15-20 psi. In yet another example (where the contents of the cooling apparatus 1 are evacuated using a vacuum pump prior to adding the coolant, such that the resting pressure of the coolant is near or below atmospheric pressure), if the high-pressure coolant 54 in the inlet manifold 210 is at a pressure of about 15 psi, the valve 60 can be adjusted to maintain low-pressure coolant 55 in the outlet manifold 215 at a pressure of about 0-10 or 0-5 psi.

The valve 60 located in the second bypass 310 of the cooling apparatus 1, as shown in FIG. 16, can be adjusted to control the coolant flow rate through the second bypass 310, and by doing so, can simultaneously adjust the coolant flow rate through the heat sink modules 100. For instance, as the pressure differential between the inlet manifold 210 and the outlet manifold 215 shown in FIG. 16 is decreased by adjusting the valve 60 located in the second bypass 310, a higher percentage of coolant flow 51 will pass through the valve 60, effectively bypassing the heat sink modules 100 and resulting in a reduced coolant flow rate through the heat sink modules. Conversely, as the pressure differential between the inlet manifold 210 and outlet manifold 215 is increased by adjusting the valve 60 located in the second bypass 310, a lower percentage of coolant flow 51 will pass through the valve 60, resulting in an increased coolant flow rate through the heat sink modules 100.

As shown in FIG. 16, the valve 60 can be arranged in parallel with a plurality of cooling lines extending between the inlet and outlet manifolds (210, 215). Coolant flow through the valve 60 and the cooling lines can be similar to the way current flows in a circuit with resistors arranged in parallel. Increasing the flow resistance of the regulator 60 will decrease the flow through the second bypass 310 and increase the flow rate through the cooling lines. Conversely, decreasing the flow resistance of the regulator 60 will increase the flow through the second bypass 310 and decrease the flow rate through the cooling lines. Similarly, increasing the flow resistance of the regulator 60 in the first bypass will decrease the flow rate through the heat exchanger 40, and decreasing the flow resistance of the regulator 60 in the first bypass will increase the flow rate through the heat exchanger 40.

In some examples, the valve 60 can be a relief valve, such as a Series 69 relief valve manufactured by Aquatrol, Inc. of Elburn, Ill. One suitable relief valve has an adjustment range of about 0-15 psi and a maximum flow rate of about 6.9 gallons per minute. The valve 60 can be suitable for a cooling apparatus 1 configured to cool multiple racks 410 of servers 400, as shown in FIG. 3. For applications where a larger or smaller number of racks of servers must be cooled, a valve with a larger or smaller maximum flow rate can be selected, respectively.

Flow Control Based on Two-Phase Flow Sensor

In some examples, the quality (x) of the two-phase bubbly flow exiting the heat sink module(s) 100 can be monitored with a sensor 880, and an output signal from the sensor can be input to an electronic control unit 850 capable of changing one or more operating conditions of the cooling apparatus 1. For instance, when the flow quality (x) exiting the heat sink module 100 reaches a predetermined threshold value (e.g. about 0.25, 0.3, 0.35, or 0.4), the flow resistance of the valve 60 in the second bypass 310 can be increased to reduce the flow rate through the valve and increase the flow rate through the heat sink module(s) 100, thereby reducing the quality (x) of the flow exiting the heat sink module(s) to ensure the bubbly-flow does not transition to slug flow or churn flow (see FIG. 59B) within the flexible tubing 225, which could result in flow instabilities.

In another example, when the flow quality (x) exiting the heat sink module 100 reaches a predetermined threshold value, the pump 20 speed can be increased to increase the mass flow rate of coolant 50 (e.g. by increasing coolant pressure, velocity, or both) through the cooling line(s) 303 and heat sink module(s) 100, thereby reducing the quality (x) of the flow exiting the heat sink module(s) to ensure the two-phase bubbly-flow does not transition to slug flow or churn flow (see FIG. 59B) within the flexible tubing 225, which could result in flow instabilities.

The flow sensor 880 can be any suitable sensor capable of detecting flow quality, flow patterns, or void fraction identification. The sensor can employ high-speed photography, x-ray, or other suitable imaging techniques. In some examples, the sensor 880 can employ ultrasonic sensing. The sensor 880 can include one ultrasonic sensor or an array of ultrasonic sensors. The sensor 880 can include integrated signal conditioning software. The sensor 880 can be noninvasive to the cooling lines 303. The output from the flow sensor 880 can be delivered as input to the electronic control unit 850 wirelessly or through a wired connection. In some examples, the electronic control unit 850 can be connected to an intranet system, thereby allowing the output from the flow sensor to be viewed on a remote terminal, such as a computer in an adjacent office building. The output signal of the flow sensor can be stored on a computer readable medium, and the output versus time can be analyzed against CPU utilization to identify unexpected variations in flow quality that may predict when maintenance of the cooling apparatus, such as maintenance of pump seals, is required.

Pump

The pump 20 can be any pump capable of generating a positive coolant pressure that forces coolant 50 to circulate through the cooling apparatus 1. In some examples, the pump 20 can generate a positive coolant pressure that forces coolant through the primary cooling loop 300, into an inlet port of a heat sink module 100, and through a plurality of orifices 155 within the heat sink module, thereby transforming the flow of coolant into a plurality of jet streams 16 of coolant that impinge against the surface to be cooled 12, as shown in FIG. 26. In some examples, it can be desirable to select a pump 20 that is capable of pumping single-phase liquid coolant and increasing the pressure of the coolant to about 5-20, 15-30, 25-45, 30-50 40-65, 50-75, 60-85, 75-150, 5-200, 5-150, or 100-200 psi. Lower pressures can be desirable for reducing power consumption by the pump and thereby increasing overall efficiency of the cooling apparatus 1. A desired coolant pressure can depend on the type of coolant selected, the boiling point of that coolant, and the temperatures of the one or more surfaces to be cooled 12.

To allow the cooling apparatus 1 to operate at a relatively low pump outlet pressure, and thereby consume minimal power and allow for the use of lightweight, inexpensive, flexible tubing 225, it can be desirable to select a coolant 50 that has a boiling point that is a predetermined number of degrees below the temperature of the surface to be cooled 12 at the system operating pressure. In some examples, a coolant 50 with a boiling point about 10-20, 15-25, 20-30, 25-35, 30-45, 40-60, or 50-75 degrees C. below the temperature of the surface to be cooled 12 can be selected, where the boiling point of the coolant is determined at a pressure coinciding with an inlet pressure at the heat sink module 100. Experiments show that providing coolant to a first heat sink module 100 at about 10-20 degrees C. below the temperature of the surface to be cooled 12 provides effective cooling and formation of bubbly flow in subsequent series-connected heat sink modules 100.

When adapting the cooling apparatus 1 to cool microprocessors 415 that operate with junction temperatures of about 50-90 degrees C., it can be desirable to select a dielectric coolant such as HFE-7000 that has a boiling point of about 34 degrees C. at 1 atm. In this arrangement, the pump outlet pressure can be set to about 5-35 or 15-25 psia to achieve suitable operation, and the valve 60 in the first bypass 305 can be adjusted to divert about 30-60% of the flow 51 from the pump outlet 22 through the first bypass 305 and through the heat exchanger 40 to ensure a volume of adequately subcooled coolant in the reservoir 200. In FIG. 75, this first bypass flow is identified as 51-1. When adapting the cooling apparatus 1 to cool power electronic devices that operate at temperatures of about 90-120 degrees C., it can be desirable to select a dielectric coolant with a higher boiling point, such as HFE-7100 that has boiling point of about 61 degrees C. at 1 atm. When adapting the cooling apparatus 1 to cool an electrical device having a temperature of about 45-100 degrees C., it can be desirable to select a dielectric coolant such as HFE-7000 that has a boiling point of about 34 degrees C. at 1 atm or R-245fa that has a boiling point of about 15 degrees C. at 1 atm.

The pump outlet pressure and valves 60 can be adjusted to provide a suitable flow of coolant though the heat sink module 100 whereby a portion of the liquid coolant changes to vapor and a portion of the coolant remains liquid to produce a two-phase bubbly flow having a quality below a predetermined threshold to ensure stable flow within the cooling apparatus 1.

In some examples, the contents of the cooling apparatus 1 can be evacuated using a vacuum pump prior to adding the coolant 50, thereby resulting in a sub-atmospheric pressure within the cooling apparatus 1. The coolant can then be added to the system from a container that has been degassed and is also at a sub-atmospheric pressure. Once inside the system, the coolant will remain at a sub-atmospheric pressure. When the pump 20 is activated, it pumps single-phase liquid coolant and increases the pressure of the coolant to about 5-20, 10-25, or 15-30 psi at the pump outlet 22. In this example, the coolant 50 can be HFE-7000, and the pump pressure can be set at a suitable value to provide a flow rate of about 0.25-1.75, 0.7-1.3, 0.8-1.2, or 0.9-1.1 liters per minute or about 1.0 liter per minute through each heat sink module 100 in the cooling apparatus 1.

In other examples, the coolant can be HFE-7000, HFE-7100, R-245fa, or a mixture thereof. In some examples, the coolant can be 100% HFE-7000, 100% HFE-7100, or about 60-95, 70-95, or 85-95% HFE-7000 by volume and the remainder can include R-245fa. In any of these examples, the pump pressure can be set at a suitable value to provide a flow rate of about 0.25-1.75, 0.7-1.3, 0.8-1.2, or 0.9-1.1 liters per minute through each heat sink module 100 in the cooling apparatus 1. Where multiple (i.e. two or more) heat sink modules 100 are connected in series along a cooling line 303, the pump pressure can be set a suitable value to provide a flow rate of about 0.25-1.75, 0.7-1.3, 0.8-1.2, or 0.9-1.1 liters per minute through the cooling line 303 in the cooling apparatus 1.

In one example, the pump 20 can be a variable speed positive displacement pump, such as a MICROPUMP gear pump by Cole-Parmer of Vernon Hills, Ill. In another example, where the cooling apparatus 1 is configured to cool several racks 410 of servers 400, as shown in FIGS. 1-3, the pump 20 can be a 1.5 HP vertical, multistage, in-line, centrifugal pump, such as Model No. A96084444P115030745 from Grundfos headquartered in Denmark. In a redundant configuration, as shown in FIGS. 9 and 10, the redundant cooling apparatus 2 can have two Grundfos pumps 20 operating simultaneously or with one pump operating and an automatic failover circuit that activates the second pump if the first pump fails. FIG. 96 shows an exploded view of a horizontal, in-line, centrifugal pump 20 with a first shut-off valve 250 located near a pump inlet 21 and a second shut-off valve 250 located near a pump outlet 22.

In one configuration shown in FIGS. 92-95, the cooling apparatus 1 can have two parallel redundant pumps (20-1, 20-2) that supply pressurized coolant to a common cooling apparatus 1. In this configuration, each pump 20 can be sized to independently provide an adequate flow 51 of pressurized coolant 50 to the cooling apparatus 1, thereby requiring operation of only one pump at a time, while the other pump remains on standby. The cooling apparatus 1 can include a failover circuit that, in case of failure of a first pump 20-1, automatically detects the failure and activates a second pump 20-2 to provide a nearly uninterrupted flow 51 of pressurized coolant 50 through the system 1. In one example, pump failure can be detected by monitoring a signal from a pressure sensor 880 mounted at a sensor mounting location 875 near a pump outlet 22 and identifying a failure when the signal decreases below a predetermined lower threshold value. For instance, if the pressure decreases more than 20 percent below a target value, the microcontroller 850 may identify a pump failure, deactivate the first pump 20-1, and activate the second pump 20-2. Deactivating the first pump 20-1 can include commanding shut-off valves 250 at in inlet and an outlet of the first pump to close, and activating the second pump 20-2 can include commanding shut-off valves 250 at an inlet and an outlet of the second pump to open. Closing shut-off valves 250 associated with the first pump 20-1 can minimize flow restrictions in the primary cooling loop 300 and thereby reduce pumping losses and improve system efficiency.

Although a constant speed pump 20 can be used for simplicity, a variable speed pump (e.g. a pump 20 having a variable speed drive 80) can provide greater flexibility for cooling dynamic heat loads, such as microprocessors 415 with varying utilization rates and temperatures, since the variable speed pump can enable the flow 51 of coolant 50 to be adjusted to meet a flow rate required to cool the estimated (e.g. theoretical) or actual (e.g. measured) heat load at the one or more surfaces to be cooled 12, and then adjusted in real-time if the heat load is greater or less than the estimated heat load. More specifically, increasing the flow rate of coolant 50 may be required where the heat load is greater than the estimated heat load to avoid reaching critical heat flux at the surface to be cooled 12. Alternately, decreasing the flow rate of coolant 50 may be required where the heat load is less than the estimated heat load to reduce unnecessary power consumption by the pump 20. The variable speed drive 80 can be controlled by an electronic control unit 850 of the cooling apparatus 1.

A variable speed pump 20 can also be used to automatically adjust pump speed to compensate for changes in the number of servers 400 connected to the cooling apparatus 1. For instance, where quick-connect fittings are provided on the inlet and outlet manifolds, a service technician may need to connect or disconnect several servers 400 (or an entire rack 410 of servers) from the cooling apparatus 1 without the facility experiencing downtime. In these instances, the servers 400 can be added or removed without requiring the service technician to make any adjustments to the pump pressure. In many data center facilities, a clear division exists between information technology (IT) departments and facilities departments. Servers are maintained by the IT department, and mechanical systems, such as pumps 20, are maintained by the facilities department. Allowing the IT department to add and remove servers without requiring assistance from the facilities department is desirable and saves both departments time. Therefore, having a variable speed drive on the pump 20 is desirable, since it allows the cooling apparatus 1 to automatically adjust the pump outlet pressure to accommodate a change to the number of servers. This allows an IT professional to change the number of servers without requiring a facilities professional to adjust the pump or regulator settings immediately thereafter.

In some examples, a pressurizer can be used in place of or in addition to the pump 20. The pressurizer can be pressurized by any suitable method or device, such as a pneumatic or hydraulic device that coverts mechanical motion to fluid pressure to provide a volume of pressurized coolant within the pressurizer that is then used to circulate coolant 50 through the cooling apparatus 1.

Reservoir

In the cooling system 1, the pump 20 can be in fluid communication with a coolant reservoir 200. In some examples, the reservoir 200 can be a metal tank, such as a steel or aluminum tank (see, e.g. FIG. 3), or a plastic tank with a suitable pressure rating and made of a polymer that is compatible with the coolant 50. In other examples, the reservoir 200 can be any suitable vessel that is capable of receiving a volume of coolant and safely housing the volume of coolant in compliance with governing regulations. For instance, as shown in FIGS. 92-95, the reservoir 200 can be a section of pipe having a suitable interior volume to hold an adequate supply of coolant, where the interior volume of the pipe is defined by a length and inner diameter of the pipe. The reservoir 200 shown in FIGS. 92-95 can have an inner diameter of about 1.5-3.0 inches and a length of about 4-6 feet. In some examples, it can be desirable for the reservoir 200 to have an interior volume capable of holding at least 15, 20, or 25 percent of the total volume of coolant in the cooling apparatus 1. The reservoir 200 can supply subcooled liquid coolant to the pump 20 for stable pump operation. The reservoir 200 can be located above the pump 20, as shown in FIGS. 92-95, to provide adequate head pressure to ensure a continuous supply of coolant 50 from the reservoir 200 to the pump inlet 21.

As described herein, with respect to certain embodiments of the cooling apparatus 1, such as embodiments shown in FIGS. 11A-D, the reservoir 200 can be configured to receive a variety of fluid flows, including two-phase bubbly flow via a primary cooling loop 300 and single-phase liquid flow via a first bypass loop 305. However, despite receiving two-phase bubbly flow via the return line 230 of the primary cooling loop 300, the cooling apparatus 1 can be configured to provide exclusively single-phase liquid coolant from a reservoir outlet to an inlet 21 of the pump 20. As vapor bubbles 275 are introduced to the reservoir by bubbly flow from the return line 230, the bubbles 275 tend to migrate to the top of the reservoir 200, and single-phase liquid tends to settle in the lower portion of the reservoir due to gravitational effects. A section of tubing 220, such as rigid or flexible section of tubing, can connect the reservoir 200 to the inlet 21 of the pump 20. In some examples, the section of tubing 220 can connect to a reservoir outlet located along a lower portion of the reservoir 200, and preferably at or near a bottom portion of the reservoir, to ensure that only single-phase liquid coolant, and not two-phase coolant, is drawn from the reservoir and provided to the inlet 21 of the pump 22. Providing only single-phase liquid coolant to the pump 20 can ensure that cavitation within the pump is avoided. Cavitation can occur if two-phase flow is provided to the pump, and is undesirable, since it can damage pump components, resulting in diminished pump capacity or pump failure.

To ensure that only single-phase liquid coolant is provided to the pump 20, and thereby avoiding pump cavitation, the volume of coolant in the reservoir 200 can be selected to be a certain volume ratio of the total volume of coolant in the cooling apparatus 1. Increasing the volume ratio can increase the likelihood that any vapor bubbles 275 within the two-phase bubbly flow being delivered to the reservoir 200 from the one or more heat sink modules 100 will have an opportunity to condense back to liquid before that quantity of coolant is drawn from the reservoir 200 and delivered back to the pump inlet 21 for recirculation through the cooling apparatus 1. The preferred volume ratio can depend on a variety of factors, including, for example, the heat load associated with the surface being cooled 12, the properties of the coolant 50 being used, the flow rate of coolant in the system, the flow quality (x) of coolant being returned to the reservoir 200, the percentage of coolant flow 51 being diverted through the first and second bypasses (305, 310), the operating pressure of the coolant, and the performance of the heat exchanger 40. In some examples, the volume ratio can be about 0.2-0.5, 0.4-1.0, 0.6-1.5, 1.0-2.0, or greater than 2.0. It can be desirable to encourage condensing of any bubbles that may be delivered to the reservoir 200 as two-phase bubbly flow from the one or more heat sink modules 100. Experiments have shown that maintaining the reservoir 200 at a fill level of about 30-90%, 40-80%, or 50-70%, (where fill level is defined as the percent volume of the reservoir 200 occupied by liquid coolant 50) results in effective condensing of bubbles 275 that are delivered to the reservoir by the return line 230. A liquid-vapor interface is established at the fill level of the reservoir 200, and this liquid-vapor interface may encourage condensation of the bubbles 275 due to hydrodynamic effects acting on the two-phase bubbly flow as it is delivered to (e.g. poured or sprayed into) the reservoir 200 and passes through the liquid-vapor interface within the reservoir and mixes with the sub-cooled single-phase liquid coolant residing in the reservoir. As shown in FIG. 3, the return line 230 carrying the two-phase bubbly flow can deliver the two-phase bubbly flow near an upper portion of the reservoir 200. In some examples, the delivery point of two-phase bubbly flow to the reservoir 200 can be located above the fill level of the reservoir to ensure the two-phase bubbly flow is delivered into the head space (i.e. vapor region) of the reservoir, such that gravity draws the two-phase bubbly flow downward through the liquid-vapor interface.

In some examples, the reservoir 200 can include a baffle 204 positioned in the head space of the reservoir; partially in the head space filled with coolant vapor 203 and partially below the fill level (i.e. passing through the liquid-vapor interface 202), as shown in FIGS. 82 and 115; or beneath the liquid-vapor interface 202, as shown in FIG. 83. The baffle 204 can promote condensing of vapor bubbles 275 in two-phase bubbly flow entering the reservoir 200. The baffle 204 can span all or a portion of the reservoir 200 and can be positioned horizontally, vertically, or obliquely within the reservoir. The baffle can ensure that no direct (i.e. linear) flow pathway exists in the reservoir 200 between a flow inlet and a flow outlet, thereby establishing only non-linear flow pathways that provide longer average residence times for coolant returning to the reservoir, which increases the likelihood that all vapor bubbles 275 in the coolant will condense (through interactions with subcooled liquid coolant in the reservoir) prior to exiting the reservoir through the flow outlet and reaching the pump inlet 21.

The baffle 204 can be made of a thermally conductive material, such as steel, aluminum, or copper. When two-phase bubbly flow 51 is delivered to the reservoir 200, the flow can pass through openings (e.g. a plurality of slots or holes) in the baffle, and heat can transfer from the two-phase bubbly flow to the baffle and, in some cases, to the walls of the reservoir 200 to which the baffle is mounted or in contact with. As heat is transferred away from the two-phase bubbly flow, bubbles 275 within the coolant 50 can condense, either due to decreases in the bulk fluid temperature in the reservoir or due to local decreases in fluid temperature proximate the condensing bubbles. The openings in the baffle can have any suitable shape. Non-limiting examples of baffle opening shapes include triangular, round, oval, rectangular, or hexagonal, or polygonal.

Manifold Assembly

Figure 4:
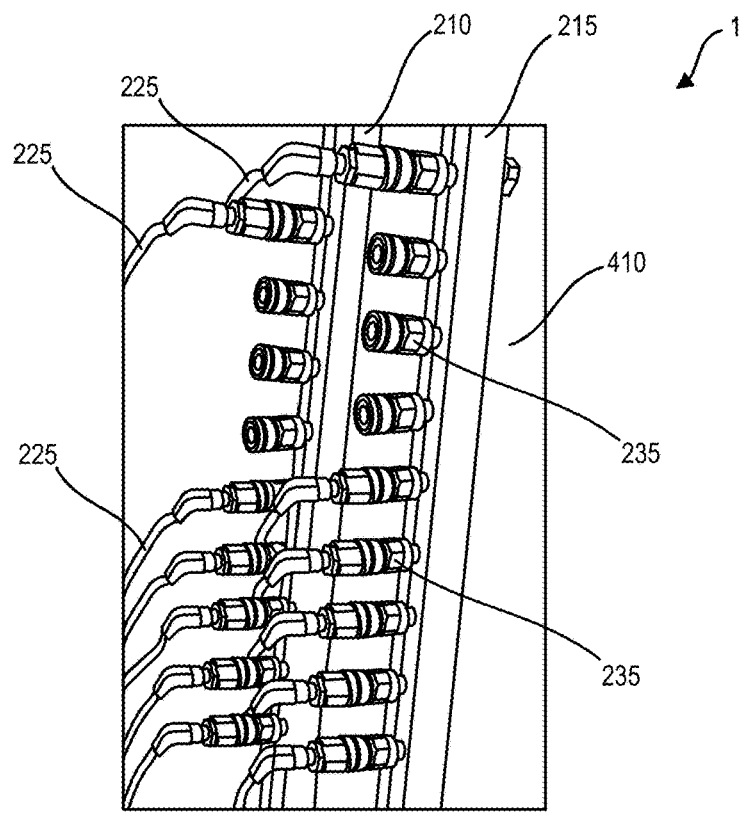
FIG. 4 shows an inlet manifold and an outlet manifold of the cooling apparatus and sections of flexible tubing with quick-connect fittings connecting parallel cooling lines to the inlet and outlet manifolds.

The cooling apparatus 1 can include a manifold assembly 680 for conveying and distributing coolant within the cooling apparatus. The manifold assembly 680 can deliver coolant to the cooling lines 300 connected to the heat sink modules 100 and receive coolant from the cooling lines 300. The manifold assembly 680 can include a separate inlet manifold 210 and a separate outlet manifold 215, as shown in FIGS. 4, 82, and 104, where the inlet manifold 210 includes an inlet chamber 655 and the outlet manifold 215 includes an outlet chamber 665. Alternately, the manifold assembly 680 can be a single manifold body 681, as shown in FIGS. 101-103, 105, and 106, with an inlet chamber 655, an outlet chamber 665, and a bypass 310, formed within the manifold body 680.

As shown in FIG. 12T, an inlet manifold 210 can receive coolant 50 and can deliver the coolant to one or more flexible tubes 225 that deliver the coolant to one or more heat sink modules 100 fluidly connected between the inlet manifold 210 and an outlet manifold 215. The inlet manifold 210 can have an inlet chamber 655 with an inner volume that serves as an in-line reservoir for the coolant and effectively dampens pressure pulsations in the flow 51 of coolant that may be transmitted from the pump 20. In some examples, the proper size of the inner volume of the inlet manifold 210 can be determined by the flow rate of coolant 50 through the inlet manifold. For instance, the inner volume of the inlet manifold 210 can be configured to hold a volume of coolant that is greater than or equal to a volume equivalent to at least 5 seconds of coolant flow through the manifold. So for a coolant flow rate of about 1 liter/minute, the inlet manifold 210 can have an inner volume of about 0.083 liters. For smoother operation, and greater damping of pressure pulsations, the inlet manifold 210 can have an inner volume capable of storing at least 10, 15, 20, 60 or more seconds of coolant flow 51. The outlet manifold 215 can be configured to have an outlet chamber 665 with a similar internal volume as the inlet manifold 210 to provide similar damping of pressure pulsations between the heat sink modules 100 and the return line 230.

The manifold assembly 680 shown in FIGS. 100-102 and 128 can support up to 30 cooling lines 303. The inlet chamber 655 and outlet chamber 665 of the manifold assembly 680 shown in FIGS. 100-102 and 128 can each have an inner diameter of about 0.5-1.5, 0.75-1.25, or preferably about 0.9 in. The inlet and outlet chamber (655, 665) of the manifold assembly 680 can each have a length of about 45-80, 50-70, or preferably about 60 inches. The inlet and outlet chamber (655, 665) of the manifold assembly 680 can each have an inner volume of about 20-60 or 30-50 in$^3$ or preferably about 38 in$^3$ and can each hold about 0.08-0.25, 0.12-0.21, or preferably about 0.17 gallons of coolant 50.

The manifold assembly 680 shown in FIG. 106 can support up to 7 cooling lines 303. The inlet chamber 655 and outlet chamber 665 of the manifold assembly 680 shown in FIG. 106 can each have an inner diameter of about 0.5-1.5, 0.75-1.25, or preferably about 0.9 in. The inlet and outlet chamber (655, 665) of the manifold assembly 680 can each have a length of about 10-20, 12-16, or preferably about 13.8 inches. The inlet and outlet chamber (655, 665) of the manifold assembly 680 can each have an inner volume of about 4-14 or 7-12 in$^3$ or preferably about 9 in$^3$ and can each hold about 0.02-0.06, 0.03-0.05, or preferably about 0.04 gallons of coolant 50.

FIG. 12T shows a schematic of a cooling apparatus 1 configured to cool two racks 410 of servers 400. The cooling apparatus 1 in FIG. 12T has a similar configuration as the cooling apparatus 1 shown in FIGS. 1-3, but the cooling apparatus 1 in FIG. 12T only shows two server racks 410, whereas the cooling apparatus in FIGS. 1-3 shows eight server racks 410. Also, the cooling apparatus 1 in FIG. 12T shows fewer parallel cooling lines extending between each inlet and outlet manifold (210, 215). Nevertheless, the concept is similar. The cooling apparatus 1 in FIG. 12T includes a dedicated inlet manifold 210 and outlet manifold 215 for each server rack 410. This configuration provides a modular cooling system 1 that can be increased in size to accommodate additional server racks 410, for example, as a data center 425 increases its server count. Therefore, the configuration in FIG. 12T can easily be modified to resemble the configuration shown in FIGS. 1-3 by adding six additional server racks 410 and by increasing the number of cooling lines extending between each inlet and outlet manifold (210, 215).

FIG. 4 shows a rear side view of a server rack 410 with an inlet manifold 210 and outlet manifold 215 mounted vertically to the server rack 410. The inlet manifold 210 and the outlet manifold 215 can be fitted with a plurality of fittings 235, such as quick-connect fittings, that permit individual cooling loops 300 to be hot swapped without interrupting coolant flow through other cooling loops 300 of the apparatus 1. As shown in FIG. 4, the inlet and outlet manifolds (210, 215) can each include a plurality of fittings to permit a plurality of cooling lines 300 to be connected to each manifold. In some examples, the inlet and outlet manifolds (210, 215) can include extra, unutilized fittings 235, as shown in FIG. 4, to permit future expansion of the number of servers 400 cooled by the cooling apparatus 1.

Although the inlet and outlet manifolds (210, 215) are shown in a vertical orientation in FIG. 4, this is not limiting. As discussed herein, because the vapor bubbles 275 within the two-phase bubbly flow are effectively dispersed and suspended in the coolant flow and do not seek a high point in the cooling apparatus 1 in response to gravitational effects, the system components (such as the outlet manifold 215) do not need to be vertically oriented to ensure collection of vapor, as competing systems do. Consequently, the outlet manifold 215 can be oriented horizontally or at any other suitable orientation that is preferable for a particular installation in view of space constraints and manifold size and shape.

FIG. 100 shows a front perspective view of a manifold assembly 680 for use with a cooling apparatus 1. The manifold assembling 1 includes an inlet chamber 655, an outlet chamber 665, thirty quick-connect fittings 235 fluidly connected to the inlet chamber, thirty quick-connect fittings 235 fluidly connected to the outlet chamber, a bypass 310 fluidly connecting the inlet chamber to the outlet chamber, and a valve 60 disposed in the bypass. FIG. 101 shows a left side view of the manifold assembly 680 of FIG. 100. FIG. 102 shows the manifold assembly 680 of FIG. 100 mounted to a server rack 410.

FIG. 103 shows a rear view of a manifold assembly 680 with a valve 60. Fluid passageways through the manifold assembly 680 are depicted with dashed lines. FIG. 104 shows a rear view of a manifold assembly 680 having a valve 60 and separate inlet and outlet manifolds (210, 215).

Fluid passageways through the manifold assembly 680 are depicted with dashed lines. FIG. 105 shows a rear view of a manifold assembly 680 including an integrated valve 60. Fluid passageways through the manifold body 681 are depicted with dashed lines.

FIG. 106 shows a front perspective view of a manifold assembly 680 for use with a cooling apparatus 1. The manifold assembling includes an inlet chamber 655, an outlet chamber 665, seven quick-connect fittings 235 fluidly connected to the inlet chamber, seven quick-connect fittings 235 fluidly connected to the outlet chamber, a bypass 310 fluidly connecting the inlet chamber to the outlet chamber, and a valve 60, such as a differential pressure bypass valve, disposed in the bypass.

A manifold assembly 680 for a two-phase cooling system 1 can include an inlet chamber 655, as shown in FIGS. 103-105. The inlet chamber 655 can include a first inlet chamber end 605, a second inlet chamber end 610 opposite the first inlet chamber end, a first flow inlet 615 proximate the first inlet chamber end, and a first flow outlet 620 proximate the second inlet chamber end. A first plurality of quick-connect fittings 235 can be installed in a first plurality of openings 661. The first plurality of openings 661 are shown in FIGS. 103-105. The first plurality of openings 661 can pass through a bounding surface, such as a wall, of the inlet chamber 655. Quick connect fittings 235 are shown installed in the first plurality of openings 661 in the manifold body 681 in FIGS. 100-102 and 106. The manifold assembly 680 can include an outlet chamber 665 having a first outlet chamber end 625, a second outlet chamber end 630 opposite the first outlet chamber end, a second flow inlet 635 proximate the first outlet chamber end, and a second flow outlet 640 proximate the second outlet chamber end. A second plurality of quick-connect fittings 235 can be installed in a second plurality of openings 676 that extend through a bounding surface, such as a wall, of the outlet chamber 665. The manifold assembly 680 can include a bypass 310 fluidly connecting the first flow outlet 620 of the inlet chamber 655 to the second flow inlet 635 of the outlet chamber. A differential pressure bypass valve 60 can be positioned in the bypass 310 and configured to control a flow of pressurized coolant from the inlet chamber 655 to the outlet chamber 665 through the bypass to maintain a pressure differential between the inlet chamber and the outlet chamber.

The differential pressure bypass valve 60 can include a valve inlet 61 and a valve outlet 62, as shown in FIGS. 111 and 112. The differential pressure bypass valve 60 can be configured to control a flow of pressurized coolant through the bypass 310 of the cooling apparatus 1 by establishing a pressure differential of about 1-5, 2-10, 5-12, 10-15, or 10-25 psi between the valve inlet 61 and the valve outlet 62. The differential pressure bypass valve 60 can include a bypass circuit 67 fluidly connecting the valve inlet 61 to the valve outlet 62 and a valve plug 64 disposed in the bypass circuit, as shown in FIG. 112. The valve plug 64 can be configured to restrict flow of pressurized coolant though the bypass circuit 67. The differential pressure bypass valve 60 can include a spring 68 disposed between the valve plug 64 and a control knob 63. Tightening the control knob 63 can compress the spring 68 against the valve plug 69 and increase a differential pressure setting of the differential pressure bypass valve 60. The differential pressure setting can be manually controlled or electronically controlled and actuated by adjusting the control knob 63 with a stepper motor or other suitable electromechanical device.

The first plurality of quick-connect fittings 235, as shown in FIGS. 107-110, can each include an internal non-spill valve (not shown). The non-spill valve can be formed within a body of the quick-connect fitting. The non-spill valves can prevent coolant from spilling on a facility floor when servers are being hot swapped and a coupler insert 725 is engaged with or disengaged from a coupler body 720. To ensure compatibility with a hydrofluoroether coolant, each non-spill valve can be lubricated with silicone-based grease to prevent the non-spill valve from sticking. Similarly, the quick-connect fittings 235 can each include a butyl rubber sealing member 741, as shown in FIGS. 108 and 110, that is compatible with hydrofluoroether coolant.

FIGS. 107-110 show a variety of fittings that can be used in the manifold assembly 680. FIG. 107 shows a quick connect fitting 235 having a barbed end 735 and a coupler body 721 configured to receive a coupler insert 725. The barbed end 735 can be configured to insert within in an inner diameter of flexible tubing 225 of a cooling line 303. The fitting 235 shown in FIG. 107 also includes a release button 721 that disengages the coupler body 720 from the coupler insert 725. FIG. 108 shows a quick connect fitting 235 with a threaded end 730 and a coupler insert 725 configured to mate with the coupler body 720 shown in FIG. 107. FIG. 109 shows a quick connect fitting 235 having a threaded end 730 and a coupler body 720 configured to receive a coupler insert 725, as shown in FIG. 110. FIG. 110 shows a quick connect fitting 235 with a barbed end 735 and a coupler insert 725 configured to mate with the coupler body 720 shown in FIG. 109. The coupler insert 725 of FIG. 110 has a sealing member 741, such as a butyl rubber O-ring, to provide a fluid-tight seal against an inner surface of the coupler body 720 of FIG. 109.

A manifold assembly 680 for a cooling system 1 can include an inlet chamber 655 having a first inlet chamber end 605, a second inlet chamber end 610 opposite the first inlet chamber end, a first flow inlet 615 proximate the first inlet chamber end, and a first flow outlet 620 proximate the second inlet chamber end, as shown in FIGS. 103-105. The manifold assembly 680 can include a first plurality of openings 661 extending through a bounding wall of the inlet chamber 655. The first plurality of openings 661 can include two or more openings each configured to receive a quick-connect fitting 235, such as a threaded fitting shown in FIG. 108 or FIG. 109. The manifold assembly 680 can include an outlet chamber 665 including a first outlet chamber end 625, a second outlet chamber end 630 opposite the first outlet chamber end, a second flow inlet 635 proximate the first outlet chamber end, and a second flow outlet 640 proximate the second outlet chamber end. A second plurality of openings 661 can extend through a bounding wall of the outlet chamber 655. The second plurality of openings 676 can include two or more openings each configured to receive a quick-connect fitting 235, such as a threaded fitting shown in FIG. 108 or FIG. 109. The manifold assembly 680 can include a bypass 310 fluidly connecting the first flow outlet 620 of the inlet chamber 655 to the second flow inlet 635 of the outlet chamber 665. A differential pressure bypass valve 60 can be positioned in the bypass 310 and configured to regulate a flow of pressurized coolant from the inlet chamber 655 to the outlet chamber 665 through the bypass 310.

As shown in FIG. 105, a manifold 681 for a cooling system can include an inlet chamber 655 and an outlet chamber 665. The inlet chamber 655 can have a first flow inlet 615 and a first flow outlet 620. A first plurality of openings 661 can extend through a wall of the inlet chamber. The first plurality of openings 661 can include two or more openings each configured to receive a quick-connect fitting 235. The outlet chamber 665 can include a second flow inlet 635 and a second flow outlet 640. A second plurality of openings 676 can extend through a wall of the outlet chamber. The second plurality of openings 676 can include two or more openings each configured to receive a quick-connect fitting 235. The manifold 681 can include a bypass 310 fluidly connecting the first outlet 620 of the inlet chamber 655 to the second inlet 635 of the outlet chamber 665. A valve 60 can be integrated into the bypass 310 and configured to control a flow of pressurized coolant from the inlet chamber 655 to the outlet chamber 665 through the bypass 310. By doing so, the valve 60 can maintain a pressure differential between the inlet chamber 655 and the outlet chamber 665 of the manifold assembly 680. The valve 60 can be a differential pressure bypass valve. The differential pressure bypass valve may not include a valve body 69 like the one shown in FIGS. 112 and 113. Instead, the inner components of the valve 60 can be installed directly in the bypass, and the inner walls of the bypass can have dimensions that replicate the inner surfaces of the valve body 69. For instance, the bypass 310 can include a bore 682 configured to receive the valve plug 64 and spring 68 of the valve 60, as shown in FIG. 105.

The manifold body 681 shown in FIGS. 100 and 106 can be an extruded member, such as an extruded aluminum member. The openings (661, 676) for the quick-connect fittings 235 can be machined into the manifold body and subsequently threaded to allow threaded ends 730 of the quick-connect fittings 235, such as those shown in FIGS. 108 and 109, to be threaded into the openings. The bore 682 shown in FIG. 105 can be machined into the manifold body 681 to provide a bore with a smooth surface finish that can be easily sealed with a sealing member associated with the valve 60. In some examples, the manifold body 681 can be formed from one or more injection molded plastic members where internal fluid passages, bores, and threads are formed in the plastic members during the injection molding process to eliminate the need for post-processing, thereby reducing manufacturing time and expense.

The differential pressure bypass valve 60 can include an integral differential pressure adjustment setting. The differential pressure bypass valve 60 can be configured to control, regulate, or otherwise restrict a flow of pressurized coolant through the bypass to establish and maintain a pressure differential of about 1-5, 2-10, 5-12, 10-15, or 10-25 psi between a valve inlet 61 and a valve outlet 62.

As shown in FIG. 105, the inlet chamber 655, the outlet chamber 665, the first plurality of openings 661, the second plurality of openings 676, and the bypass 310 can be fluid passageways formed in the manifold body 681. In this example, the internal components of the valve can be removed from the valve body and installed directly in the bypass 310. For instance, a valve plug 64 and a spring 68 can be installed in a bore 682 of the bypass 310 to effectively integrate the functionality of the valve 60 into the manifold body 681 without need for external components, such as external bypass piping shown in FIG. 106.

The differential pressure setting of the valve 60 can be manually controlled or electronically controlled. If electronically controlled, the differential pressure setting can be actuated by adjusting the control knob 63, or related mechanical adjustment feature, with a stepper motor or other suitable electromechanical device. In this example, the microcontroller 850 can be electrically connected to the stepper motor and can dynamically adjust the differential pressure setting of the valve 60 during operation of the cooling apparatus 1 to enhance heat removal capacity and/or reduce overall power consumption. The microcontroller 850 can adjust the differential pressure setting based on feedback from one or more sensors of the cooling apparatus 1, such as a pressure sensor, flow rate sensor, temperature sensor, fluid level sensor, and/or vapor quality sensor.

The manifold 681 can include a first quick-connect fitting 662 proximate the first flow inlet 615 of the inlet chamber 665, as shown in FIG. 106. The first quick connect fitting 662 can permit the manifold 681 to be fluidly connected to a fluid supply line 231 of the cooling system 1. The manifold can include a second quick-connect fitting 677 proximate the second flow outlet 640 of the outlet chamber 665. The second quick connect fitting 677 can be configured to allow the manifold 681 to be fluidly connected to a return line 230 of the cooling system 1.

Fluid Distribution Unit

The cooling apparatus 1 can include a fluid distribution unit 10. The fluid distribution unit 10 can deliver fluid to one or more heat sink modules 100 fluidly connected to the fluid distribution unit. A variety of configurations of fluid distribution units 10 are presenting herein, ranging from small fluid distribution units 10 suitable for cooling CPUs, GPUs, and memory modules in personal computers (see, e.g., FIGS. 130, 131, and 134-138), gaming consoles, LED arrays, and mobile electronic devices; mid-sized fluid distribution units 10 (see, e.g., FIGS. 118-128) suitable for cooling CPUs, GPUs, and memory modules in multiple servers in computer rooms and small data centers or batteries and power electronics in electric or hybrid vehicles; and large fluid distribution units 10 (see, e.g., FIGS. 1-3, 9, and 10) suitable for cooling CPUs, GPUs, and memory modules in hundreds or even thousands of servers in mid-size, large, and mega-scale datacenters.

FIG. 128 shows a rack-mountable fluid distribution unit 10. The fluid distribution unit 10 can install in a standard server rack 410 and can be secured to the rack with suitable fasteners. The fluid distribution unit 10 can have quick connect fluid couplers that allow the unit to be rapidly uninstalled and removed from the server rack 410 without tools, thereby allowing an IT professional to remove the fluid distribution unit in the event of a component failure and install a functioning fluid distribution unit rapidly to minimize server downtime.

FIGS. 118-125 show a fluid distribution unit 10 for a cooling apparatus 1. The fluid distribution can include a reservoir 200. The reservoir 200 shown in FIGS. 118-125 is a cylindrical reservoir oriented on its side to reduce the height of the cooling apparatus. Where the height of the unit 10 is not a concern, the reservoir can be oriented upright as shown in FIG. 3. A first pump 20-1 can be fluidly connected to the reservoir 200 along a lower portion of the reservoir (i.e. below a centerline of the reservoir) to ensure the first pump will only draw single-phase liquid coolant from the reservoir. A supply tube 230-0 can extend from an outlet of the first pump 20-1 and can include a first quick-connect coupler 235-1 that allows the fluid distribution unit 100 to fluidly connect to a supply line 230 of a cooling apparatus, as shown in FIG. 117. The fluid distribution can include a return tube 231-0 with a second quick connect coupler 235-2 that allows the fluid distribution unit 10 to fluidly connect to a return line 231-0 of the cooling apparatus, as shown in FIG. 117. The return tube 231-0 can be fluidly connected to an upper portion of the reservoir above a liquid-gas interface within the reservoir. Returning two-phase bubbly flow to a location in the reservoir 200 above the liquid-vapor interface can promote condensing of vapor bubbles 275 dispersed in the saturated liquid coolant, which is desirable. The direction of coolant flow 51 to and from the reservoir 200 is shown with arrows in FIGS. 118 and 120.

The fluid distribution unit 10 can include a heat rejection loop 43 that draws fluid from the reservoir, passes the fluid through a heat exchanger to subcool the fluid, and returns the fluid to the reservoir at a lower temperature, thereby promoting condensing of vapor bubbles in two-phase flow that is returning to the reservoir from the primary cooling loop 300. As shown in FIGS. 118-125, the heat rejection loop 43 can include a second pump 20-2 fluidly connected to a lower portion of the reservoir 200 (i.e. below a centerline of the reservoir). The second pump 20-2 can draw coolant from the reservoir and force the coolant through a section of tubing 220 to the heat exchanger 40 and back to the reservoir 200. The subcooled fluid can be returned to an upper portion of the reservoir 200 located above a liquid-gas interface. The heat exchanger can be any suitable heat exchanger, such as a liquid-to-liquid heat exchanger or a liquid-to-gas heat exchanger. If a liquid-to-liquid heat exchanger is used, the heat exchanger can be connected to chilled water supply from the facility where the unit 10 is installed. Heat from the coolant circulating through the heat exchanger can be rejected to the chilled water. The direction of chilled water flow 46 to and from the heat exchanger 40 is shown with arrows in FIG. 118. The heat exchanger 40 can be configured to prevent mixing of the flows of coolant and chilled water. The fluid distribution unit 10 can include a blow-off valve 13 extending from the reservoir 200, as shown in FIG. 121, for safety purposes.

The rack-mountable fluid distribution unit 10 shown in FIG. 128 is suitable for a cooling apparatus 1 configured to cool up to 35 POWEREDGE servers from Dell Inc. of Round Rock, Tex. with dual 2.4 GHz Intel XEON processors ("standard servers"). For this application, the reservoir 200 can have a volume of about 1.0-4.0, 1.5-2.5, or preferably about 2.0 gallons, where a gallon is defined as 231 cubic inches. Although a larger volume reservoir can be used, it is desirable to use the smallest suitable reservoir to reduce the amount of dielectric coolant needed. For high-performance servers with processors that generate higher heat fluxes than those of standard servers, the number of servers the cooling system can effectively cool will decrease accordingly.

As shown in FIGS. 115 and 117, a fluid distribution unit 10 for a two-phase cooling system 1 can include a reservoir 200 configured to receive a two-phase flow 51 of dielectric coolant including liquid coolant 50 and vapor coolant 203. The fluid distribution unit 10 can include a supply line 231-0 having a first end and a second end. The first end of the supply line 231-0 can be fluidly connected to the reservoir 200, and the second end of the supply line can include a first fitting 235-1. The fluid distribution unit 10 can include a first pump 20-1 fluidly connected between the first end of the supply line and the second end of the supply line. The fluid distribution unit 10 can include a return line 230-0 having a first end and a second end. The first end of the return line can include a second fitting 235-2, and the second end of the return line can be fluidly connected to the reservoir 200. The fluid distribution unit 10 can include a heat rejection loop 43 having a first end and a second end. The first end of the heat rejection loop can be fluidly connected to the reservoir 200, and the second end of the heat rejection loop can be fluidly connected to the reservoir 200. A heat exchanger 40 can be fluidly connected to the heat rejection loop 43 between the first end of the heat rejection loop and the second end of the heat rejection loop. A second pump 20-2 can be fluidly connected to the heat rejection loop between the first end of the heat rejection loop and the second end of the heat rejection loop. The second pump 20-2 can be located upstream of the heat exchanger 40 and can be configured to circulate a flow 51-3 of coolant 50 from the reservoir 200, through the heat exchanger 40, and back to the reservoir 200.

As shown in FIG. 120, the first end of the supply line 231-0 can be fluidly connected to the reservoir 200 at a first location 234-1, and the second end of the return line 230-0 can be fluidly connected to the reservoir 200 at a second location 234-2. The first location 234-1 can be at least one inch lower on the reservoir 200 than the second location 234-2, where the distance (d1) is measured vertically between midpoints of the first location 234-1 and the second location 234-1. In the example shown in FIG. 120, the centerline of the return line 230-0 is aligned with a centerline of the reservoir 200.

As shown in FIG. 121, the first end of the heat rejection loop 43 can be fluidly connected to the reservoir 200 at a third location 234-3, and the second end of the heat rejection loop can be fluidly connected to the reservoir at a fourth location 234-4. The third location 234-3 can be at least one inch lower on the reservoir 200 than the fourth location, where the distance (d2) is measured vertically between midpoints of the third location 234-3 and the fourth location 234-4.

As shown in FIG. 97, the heat exchanger 40 can be a liquid-to-liquid heat exchanger having a first isolated fluid pathway configured to transport a first flow (51-3 in FIG. 115) of dielectric coolant 50 received from the heat rejection loop 43 and a second isolated fluid pathway configured to transport a second flow 42 chilled water or a water-glycol mixture. An inner volume of the first isolated fluid pathway can be about 0.25-1.5, 1.0-3.5, 2.0-4.5, 4.0-8.0, 6.0-12, or 10-15 gallons.

The reservoir 200 can have an inner volume of about 0.25-1.5, 1.0-3.5, 2.0-4.5, 4.0-8.0, 6.0-12, or 10-15 gallons. The reservoir 200 can include a baffle 204 in its inner volume, as shown in FIG. 115. The baffle 204 can establish only non-linear flow pathways between reservoir flow inlets and reservoir flow outlets. Reservoir flow inlets include the second end of the return line 230-0 and the first end of the heat rejection loop 43, and reservoir flow outlets include the first end of the supply line 231-0 and the second end of the heat rejection loop 43, as shown in FIG. 117.

In another example, a rack-mountable fluid distribution unit 10 for a two-phase cooling system for cooling servers can include a reservoir 200, as shown in FIGS. 118-125 and 128. The reservoir 200 can have an inner volume configured to receive a flow of two-phase dielectric coolant including liquid coolant 50 and vapor coolant 203. The fluid distribution unit 10 can include a supply line 231-0 having a first end and a second end. The first end of the supply line can be fluidly connected to the reservoir 200, and the second end of the supply line can include a first quick-connect fitting 235-1. A first pump 20-1 can be fluidly connected between the first end of the supply line and the second end of the supply line. A return line 230-0 can include a first end and a second end. The first end of the return line can include a second quick-connect fitting 235-2, and the second end of the return line can be fluidly connected to the reservoir 200. The fluid distribution unit 10 can include a heat rejection loop 43 having a first end and a second end. The first end of the heat rejection loop can be fluidly connected to the reservoir 200, and the second end of the heat rejection loop can be fluidly connected to the reservoir. A heat exchanger 40 can be fluidly connected to the heat rejection loop 43 between the first end of the heat exchanger loop and the second end of the heat rejection loop. A second pump 20-2 can be fluidly connected to the heat rejection loop 43 between the first end of the heat exchanger loop and the second end of the heat rejection loop and configured to circulate a flow 51-3 of single-phase liquid coolant 50 from the reservoir, through the heat exchanger 40, and back to the reservoir 200.

The fluid distribution unit 10 can include a support structure 11 configured to mount within a server rack 410, as shown in FIG. 128. The reservoir 200, the first pump 20-1, and the second pump 20-2 can be mounted to the support structure 11. The support structure 11 can be configured to slidably engage with a server rack 410 to permit rapid installation of the fluid distribution unit 10 during service or maintenance of the unit. The first quick-connect fitting 235-1 can be a blind-mate coupler having a first non-spill valve, and the second quick-connect fitting 235 can be a blind-mate quick-connect coupler having a second non-spill valve.

As shown in FIG. 115, the fluid distribution unit 10 can include a flow quality (x) sensor 880 attached (externally or internally) to the return line 230-0. The flow quality sensor 880 can be configured to provide an output signal based on a flow quality (x) of two-phase flow passing through the return line to the reservoir 200. The fluid distribution unit 10 can include an electronic control unit 850 mounted to the support structure 11. The flow quality sensor 880 can be electrically connected to the electronic control unit 850 to permit the output signal from the flow quality sensor to be received by the electronic control unit.

The first pump 20-1 can include a first variable speed drive 80-1 electrically connected to the electronic control unit, as shown in FIG. 115. The electronic control unit 850 can be configured to increase a speed of the first variable speed drive 80-1 when the output signal from the flow quality sensor 880 indicates a flow quality (x) greater than about 0.3, 0.4, or 0.5. The electronic control unit 850 can be configured to decrease a speed of the first variable speed drive 80-1 when the output signal from the flow quality sensor 880 indicates a flow quality (x) less than 0.1, 0.2, or 0.3.

The second pump 20-2 can include a second variable speed drive 80-2 electrically connected to the electronic control unit, as shown in FIG. 115. The electronic control unit 850 can be configured to increase a speed of the second variable speed drive 80-2 when the output signal from the flow quality sensor 880 indicates a flow quality (x) greater than 0.3, 0.4, or 0.5. The electronic control unit 850 can be configured to decrease a speed of the second variable speed drive 80-2 when the output signal from the flow quality sensor 880 indicates a flow quality (x) less than 0.1, 0.2, or 0.3.

In yet another example, a fluid distribution unit 10 for a two-phase cooling apparatus can include a reservoir 200 having an inner volume configured to receive an amount of two-phase dielectric coolant, as shown in FIGS. 126, 127, and 139. The fluid distribution unit 10 can include a supply line 230-0 having a first end and a second end. A first pump 20-1 can be fluidly connected between the first end of the supply line and the second end of the supply line. The first end of the supply line can be fluidly connected to the reservoir 200, and the second end of the supply line can be fluidly connected to an inlet chamber 655 of a manifold assembly 680. The fluid distribution unit 10 can include a return line 230-0 having a first end and a second end. The first end of the return line can be fluidly connected to an outlet chamber 665 of the manifold assembly 680, and the second end of the return line can be fluidly connected to the reservoir 200. The fluid distribution unit can include a heat rejection loop 43 having a first end and a second end. The first end of the heat rejection loop can be fluidly connected to the reservoir 200, and the second end of the heat rejection loop can be fluidly connected to the reservoir 200. A heat exchanger 40 can be fluidly connected to the heat rejection loop between the first end of the heat rejection loop and the second end of the heat rejection loop. A second pump 20-2 can be fluidly connected to the heat rejection loop 43 between the first end of the heat rejection loop and the second end of the heat rejection loop and configured to circulate a flow 51-3 of single-phase dielectric coolant 50 from the reservoir 200, through the heat exchanger 40, and back to the reservoir.

A detailed example of the manifold assembly 680 is presented in FIG. 105. The inlet chamber 655 of the manifold assembly 680 can include a first inlet chamber end 605, a second inlet chamber end 610 opposite the first inlet chamber end, a first flow inlet 615 proximate the first inlet chamber end, and a first flow outlet 620 proximate the second inlet chamber end. The manifold assembly 680 can include a first plurality of quick-connect fittings 235-1 (see, e.g., FIG. 106) installed in a first plurality of openings 661 passing through a bounding surface of the inlet chamber 655. As shown in FIG. 105, the outlet chamber 665 of the manifold assembly 680 can include a first outlet chamber end 625, a second outlet chamber end 630 opposite the first outlet chamber end, a second flow inlet 635 proximate the first outlet chamber end, and a second flow outlet 640 proximate the second outlet chamber end. The manifold assembly 680 can include a second plurality of quick-connect fittings 235-2 (see, e.g., FIG. 106) installed in a second plurality of openings extending through a bounding surface of the outlet chamber 665. The first and second pluralities of quick-connect fittings (235-1, 235-2) can be non-spill valves including a silicone-based grease and a butyl rubber sealing member to ensure compatibility with the dielectric coolant 50.

The manifold assembly 680 can include a bypass 310 fluidly connecting the first flow outlet 620 of the inlet chamber 655 to the second flow inlet 635 of the outlet chamber 665, as shown in FIG. 105. The manifold assembly 680 can include a differential pressure bypass valve 60 positioned in the bypass 310 and configured to control a flow 51-3 of pressurized coolant from the inlet chamber 655 to the outlet chamber 665 through the bypass 310 to maintain a pressure differential between the inlet chamber and the outlet chamber, as shown in FIG. 126. As shown in FIG. 112, the differential pressure bypass valve 60 can include a valve inlet 61 and a valve outlet 62 and can be configured to control a flow (see, e.g., 51-3 of FIG. 126) of pressurized coolant through the bypass 310 of the manifold assembly 680 by establishing the pressure differential of about 1-5, 2-10, 5-12, 10-15, or 10-25 psi between the valve inlet 61 and the valve outlet 62. The differential pressure bypass valve 60 can include a bypass circuit 67 fluidly connecting the valve inlet 61 to the valve outlet 62, a valve plug 64 disposed in the bypass circuit 67, and a spring 68, as shown in FIG. 112. The valve plug 64 can be configured to restrict flow 51-3 of pressurized coolant though the bypass circuit 67. The spring 68 can be disposed between the valve plug 64 and a control knob 63. Tightening the control knob 63 can compress the spring 68 against the valve plug 64 and increase a differential pressure setting of the differential pressure bypass valve 60.

The manifold assembly 680 can include a manifold body 681, as shown in FIG. 105. The inlet chamber 655, the outlet chamber 665, the first plurality of openings 661, the second plurality of openings 676, and the bypass 310 can be fluid passageways formed in a manifold body. The valve plug 64 and the spring 68 of the differential pressure bypass valve can be installed within a bore 682 of the bypass 310 formed in the manifold body 681.

Server Rack with Fluid Distribution Unit

A fluid distribution unit can be integrated into a server rack to provide a compact solution for cooling servers. FIGS. 118-125 show a server rack-mountable fluid distribution unit 10 that is suitable for inclusion in the cooling apparatus of FIG. 117. The fluid distribution unit 10 can have a primary cooling loop and a heat rejection loop. The primary cooling loop can include a first pump fluidly connected to a reservoir 200. The heat rejection loop can include a second pump and a heat exchanger fluidly connected to the reservoir 200. Components of the fluid distribution unit 10, such as the pumps (20-1, 20-2) and reservoir 200, can be mounted to a support structure 11. The support structure 11 can allow the fluid distribution unit 10 to be easily transported to and installed in a server rack 410, as shown in FIG. 128. Likewise, the support structure 11 can allow the fluid distribution unit 10 to be easily uninstalled from the server rack 410 for maintenance or repair. In some examples, the support structure 11 can include a handle for carrying the fluid distribution unit or a handle for aiding in removing the fluid distribution unit from the server rack.

In some examples, the fluid distribution unit can include blind fluid connections that automatically connect the fluid distribution unit to the cooling apparatus when the fluid distribution unit 10 is inserted into the server rack. For instance, upon fully inserting the fluid distribution unit 10 into the server rack 410, the supply pipe 231-0 of the fluid distribution unit can blindly connect to a supply line 231 of the cooling apparatus, and the return pipe 230-0 of the fluid distribution unit can blindly connect to a return line of the cooling apparatus. This approach allows the fluid distribution unit to be fluidly connected to the cooling apparatus by hand (with no tools) and eliminates the need for a service person to access more than one side of the server rack 410 during installation and removal of the fluid distribution. This is desirable since more than one side of the server racks may not be accessible when racks are arranged in close proximity to each other in rows within a data center or computer room 425, as shown in FIGS. 19 and 20. In addition to blind fluid connections, the fluid distribution unit can also include blind connections for power, network communications (e.g. Ethernet), and a control system wiring harness. The control system wiring harness can allow the microcontroller to receive information from various system sensors as described herein. The network connection can allow an electronic control unit 850 installed in the fluid distribution unit 10 to report cooling system parameters and metrics (e.g. temperatures, pressures, flow rates, total heat removed) and system faults (e.g. low coolant level, low pressure, high temperature, low flow rates) to a facility monitoring computer network. Cooling system 1 performance can be monitored remotely, and if a fault occurs, a service professional can be dispatched to address the issue.

FIG. 117 shows a schematic of a preferred cooling apparatus 1 for a server rack 410 with a rack-mounted fluid distribution unit 10, as shown in FIGS. 118-125. The cooling apparatus 1 can have a primary cooling loop 300 and a heat rejection loop 43. The primary cooling loop 300 can include a first pump 20-1, a manifold assembly 680, a bypass 310, and a plurality of cooling line assemblies 303 each routed through one server 400 having one or more surfaces to be cooled 12 (e.g. CPUs, GPUs, motherboard chipset, drives, power supplies, and memory modules). The heat rejection loop 43 can include a second pump 20-2 and a heat exchanger 40. The primary cooling loop 300 and the heat rejection loop 43 are both fluidly connected to a common reservoir 200 that resides in a fluid distribution unit 10 housed within a server rack 410. The fluid distribution unit includes inlet and outlet fittings 235 that can be standard fittings or quick-connect fittings. The quick-connect fitting can be blind-mate fittings to allow the fluid distribution unit 10 to be fluidly connected to the cooling apparatus 1 blindly by simply inserting the fluid distribution unit into the server rack. Examples of quick-connect blind-mate fittings are AEROQUIP brand fittings from Eaton Corporation of Cleveland, Ohio. The fittings 235 can include non-spill valves to prevent spillage of dielectric coolant when installing or removing the fluid distribution unit 10.

To allow more servers 400 to be connected to a manifold assembly 680, one or more cooling line assemblies 303 can be routed through more than one server 400. FIG. 129 shows a schematic of a cooling apparatus 1 having a primary cooling loop 300 and a heat rejection loop 43. The primary cooling loop 300 includes a first pump 20-1, a manifold assembly 680, a bypass 310, and a plurality of cooling line assemblies 303 each routed through one or more servers 400. The heat rejection loop 43 includes a second pump 20-2 and a heat exchanger 40. The primary cooling loop 300 and the heat rejection loop 43 are both fluidly connected to a common reservoir 200 that resides in a fluid distribution unit 10 housed within a server rack 410. In this example, each cooling line assembly 303 can include up to eight series-connected heat sink modules 100 mounted on heat-generating components (e.g. CPUs, GPUs, memory modules) within two or more servers 400.

In some examples, the fluid distribution unit 10 can include a manifold assembly 680, as shown in FIGS. 126 and 127. This arrangement can eliminate the need for an externally mounted manifold, which can be preferable in some applications. For instance, if there is insufficient space on a front or rear side of a server rack 410 to mount a manifold assembly 680, it can be desirable to mount the manifold assembly 680 within the fluid distribution unit, which can be mounted within the server rack. In one example, the fluid distribution unit 10 can be centrally mounted in a server rack to minimize the length of the cooling line assemblies 303 needed to reach from an inlet manifold, to the servers, and back to an outlet manifold 215.

As shown in FIG. 139, the manifold assembly 680 can be packaged as part of the fluid distribution 10 to provide for a more compact cooling apparatus 1 for space-constrained applications. For instance, in vehicle 950 applications, space may be limited and a configuration as shown in FIG. 139 may be useful to minimize the size of the cooling system 1 to allow the system to fit within packaging constraints dictated by a vehicle manufacturer. In this example, the fluid distribution unit 10 can be installed in the vehicle 950 (e.g. under a seat, in a trunk, within a body structure, or in an engine bay) and flexible cooling line assemblies 303 can be routed from the fluid distribution unit to various surfaces to be cooled 12 throughout the vehicle, such as power electronics, battery packs, battery terminals, infotainment displays, inverters, and engine control unit (ECU). In this example, the flexible cooling line assemblies 303 can attach to the manifold via quick-connect fittings or standard fittings. In addition to automotive applications, the configuration shown in FIG. 139 is well suited to many nonautomotive applications, including any of the wide-ranging applications mentioned throughout this disclosure.

Two-Phase Cooling Apparatus for Computer

The two-phase cooling apparatuses 1 described herein can be used to safely cool any type of computer, including personal computers (PCs) (e.g. desktop computers, office workstations, and PC gaming systems), gaming consoles, video gambling machines, and servers, to name a few. In some examples, it can be desirable to provide a two-phase cooling apparatus 1 that is capable of installing within a computer housing, thereby allowing the computer to maintain its original level of mobility.

An example of a gaming console is an XBOX ONE from Microsoft Corporation of Redmond, Wash. An example of a PC gaming system is a HAILSTORM II 37047 from Digital Storm Online, Inc. of Fremont, Calif., which includes an INTEL CORE i7 Extreme Edition 4960X 3.6 GHz (six-core) processor, two NVIDIA GeForce GTX TITAN Z 12 GB graphics cards, ASUS Rampage IV Black Edition X79 (Intel X79 chipset) motherboard, and 64 GB DDR3 1866 MHz Corsair Dominator Platinum DHX memory.

Examples of two-phase cooling systems suitable for computers 400, including PC gaming systems and gaming consoles, are shown in FIGS. 130, 131, and 134-138. FIG. 130 shows a schematic of a two-phase cooling apparatus 1 having a primary cooling loop 300 and a heat rejection loop 43. The primary cooling loop 300 can include a first pump 20-1 fluidly connected to a reservoir 200 and fluidly connected to one or more heat sink modules 100 that can be fitted on components of the computer that require cooling, such as CPUs, GPUs, chipsets, memory modules, and power supplies. The heat rejection loop 43 can include a second pump 20-2 fluidly connected to a heat exchanger 40 and the reservoir 200. A suitable pump for the cooling apparatuses shown in FIGS. 130, 131, and 134-138 is a DDC Series pump from Laing Thermotech, a subsidiary of Xylem, Inc. of White Plains, N.Y. The DDC Series pump has an electronically commutated spherical motor, a maximum pressure of 21.75 psi, a rated voltage of 12 Volts DC, and a maximum operating temperature of 140 degrees F. The DDC-3.15 pump can deliver a flow rate of about 1.5 gallons per minute at a power consumption of about 11 Watts.

In many instances, owners of PC gaming systems 400 enjoy adding additional high-performance components, such as additional GPUs and memory modules, to their computers. To improve computer performance, it is desirable to provide two-phase cooling of these additional components. It is therefore desirable to provide a two-phase cooling apparatus that is modular and that can grow in size to accommodate an owner's upgrades to their gaming system. FIG. 131 shows a schematic of a modular cooling apparatus 1 having a primary cooling loop 300 and a heat rejection loop 43. The primary cooling loop 300 can include a first pump 20-1 fluidly connected to a reservoir 200 and fluidly connected to three series-connected modular cooling line assemblies 303 similar to the one shown in FIG. 132. The heat rejection loop 43 can include a second pump 20-2 and a heat exchanger 40 fluidly connected to the reservoir 200.

Modular cooling line assemblies 303 can be provided with any suitable number of heat sink modules 100 to accommodate a particular application with heat removal requirements. Common examples of modular cooling line assemblies 303 range from one heat sink module 100 up to eight series-connected modules. Other examples of modular cooling line assemblies 303 can include parallel configurations of heat sink modules 100 or combinations of parallel and series-connected modules.

FIG. 132 shows a flexible cooling line assembly 303 with one heat sink module 100. More specifically, the cooling line assembly 303 includes one heat sink module 100 with an inlet port 105 and an outlet port 110, a first section of flexible tubing 225-1 having a first end connected to an inlet fitting 235-1 and a second end connected to the inlet port 105, and a second section of flexible tubing 225-2 having a first end connected to the outlet port 110 and a second end connected to an outlet fitting 235-1.

FIG. 133 shows a modular cooling line assembly 133 with two heat sink modules 100. More specifically, the cooling line assembly 303 includes a first heat sink module 100-1 with an inlet port 105 and an outlet port 110, a first section of flexible tubing 225-1 having a first end connected to an inlet fitting 235-1 and a second end connected to the inlet port 110 of the first heat sink module, a second heat sink module 100-2 with an inlet port 105 and an outlet port 110, a second section of flexible tubing 225-2 connecting the outlet port 110 of the first heat sink module 100-1 to the inlet port 105 of the second heat sink module 100-2, and a third section of flexible tubing 225-3 having a first end connected to the outlet port 110 of the second heat sink module and a second end connected to an outlet fitting 235-2.

The modular cooling line assemblies 303 can include standard fittings or quick-connect fittings 235, as shown in FIGS. 107-110, 132, and 133, and to facilitate rapid expansion of the cooling system 1 to provide cooling of newly added computer components. To avoid spilling dielectric coolant when an additional cooling line assembly 303 is added to the cooling apparatus 1, the fittings can include internal non-spill valves.

FIG. 134 shows a schematic of a modular cooling apparatus 100 having a primary cooling loop 300 and a heat rejection loop 43. The primary cooling loop 300 includes a first pump 20-1 fluidly connected to a reservoir 200 and fluidly connected to three series-connected modular cooling line assemblies 303. The first modular cooling line assembly 303-1 includes two series-connected heat sink modules 100, the second modular cooling line assembly 303-2 includes two series-connected heat sink modules 100, and the third modular cooling line assembly 303-3 includes four series-connected heat sink modules 100. The heat rejection loop 43 includes a second pump 20-2 and a heat exchanger 40 fluidly connected to the reservoir 200.

FIG. 135 shows a schematic of a modular cooling apparatus 100 having a primary cooling loop 300 and a heat rejection loop 43. The primary cooling loop 300 includes a first pair of redundant pumps (20-1, 20-2) fluidly connected to a reservoir and fluidly connected to three series-connected modular cooling line assemblies. The first modular cooling line assembly 303-1 has two series-connected heat sink modules 100, the second modular cooling line assembly 303-2 has two series-connected heat sink modules 100, and the third modular cooling line assembly 303-3 has four series-connected heat sink modules 100. The heat rejection loop 43 includes a second pair of redundant pumps (20-3, 20-4) and a heat exchanger 40 fluidly connected to the reservoir 200.

FIG. 136 shows a schematic of a redundant cooling apparatus 2 having a first cooling apparatus 1 and a second cooling apparatus 1. The first cooling apparatus 1 includes a first primary cooling loop 300-1 and a first heat rejection loop 43-1. The first primary cooling loop 300-1 includes a first pump 20-1 fluidly connected to a first reservoir 200-1 and two series-connected redundant heat sink modules 200.

The first heat rejection loop 43-1 includes a second pump 20-2 fluidly connected to a first heat exchanger 40-1 and the first reservoir 200-1. The second cooling apparatus 1 includes a second primary cooling loop 300-2 and a second heat rejection loop 43-2. The second primary cooling loop 300-2 includes a third pump 20-3 fluidly connected to a second reservoir 200-2 and the two redundant series-connected heat sink modules 200. The second heat rejection loop 43-2 includes a fourth pump 20-4 fluidly connected to a second heat exchanger 40-2 and the second reservoir 200-2.

FIG. 137 shows a schematic of a cooling apparatus 1 having a primary cooling loop 300 and a heat rejection loop 43. The primary cooling loop 300 can include a first pump 20-1 fluidly connected to a reservoir 200 and fluidly connected to three series-connected heat sink modules 100 and a series-connected memory cooler 421. The series-connected memory cooler 421 can include cooling members that extend downward into channels located between adjacent vertically-arranged memory modules 420, thereby providing cooling of both sides of each memory module. The heat rejection loop 43 can include a second pump 20-2 fluidly connected to a heat exchanger 40 and the reservoir 200.

FIG. 138 shows a schematic of a cooling apparatus 1 having a primary cooling loop 300 and a heat rejection loop 43. The primary cooling loop 300 can include a first pump 20-1 fluidly connected to a reservoir 200 and fluidly connected to three series-connected heat sink modules 100 and a series-connected memory cooler 421. The series-connected memory cooler 421 can include cooling members that extend downward into channels located between adjacent vertically-arranged memory modules 420, thereby providing cooling of both sides of each memory module. The heat rejection loop 43 can include a second pump 20-2 fluidly connected to a heat exchanger 40 and the reservoir 200. The heat exchanger 40 can be a heat exchanger disclosed in U.S. patent application Ser. Nos. 14/833,087 and 14/833,092.

Internal Volumes of Cooling System

The total inner volume in the cooling apparatus 1 is the sum of inner volumes of all system components, including the cooling line assemblies 303 (module loops), manifold assemblies 680, distribution tubing, and fluid distribution unit 10, which includes the reservoir 200 and heat exchanger 40.

The reservoir 200 volume can be sized based on the number of servers 400 the system 1 will cool. As the dielectric coolant is heated from room temperature to its saturation temperature, the coolant volume will expand. This expansion can be calculated based on the fluid's thermal expansion coefficient, while accounting for changes in coolant temperature and pressure. The reservoir 200 can be sized to accommodate the expansion of coolant while maintaining headroom above the liquid level to ensure a liquid-vapor interface is preserved in the reservoir to aid in condensing vapor bubbles in the return flow of two phase bubbly flow via the return line 230.

In a cooling apparatus 1 designed to cool 60 standard servers arranged in six server racks 410, the cooling apparatus can include 60 cooling line assemblies 303 each made of three sections of ¼ in. flexible tubing 225 with an inner diameter of 0.18 in. The sections of flexible tubing 225 can be connected to two heat sink modules 100, similar to the cooling line assemblies 303 shown in FIGS. 113 and 114, which have three modules 100. Using rack-mounted manifold assemblies 680, the average length of each cooling line assembly 303 (extending from the inlet manifold 210 into the server 400 and back to the outlet manifold 215) can be about 70-110, 80-100, or preferably about 90 inches. Preferably, each cooling line assembly 303 is connected to a pair of inlet and outlet quick-connect fittings 235 nearest to the server 400 to be cooled, which decreases the amount of flexible tubing 225 needed as well as coolant volume. On average, each cooling line assembly 303 can have an inner volume of about 2.0-3.0, 2.2-2.6, or preferably about 2.4 in$^3$. Collectively, the 60 cooling line assemblies 303 can have an inner volume of about 0.3-0.9, 0.4-0.8, or preferably about 0.6 gallons. The reservoir 200 can have an inner volume of about 2-6, 3-4, or preferably about 3.5 gallons. The heat exchanger volume can be 0.8-1.5, 1.0-1.4, or preferably about 1.2. Sections of tubing that connect components in the fluid distribution unit 10 can have inner diameters of about 1.0 inches or 1.5 inches and, collectively, can have an inner volume of about 1.0-2.0, 1.2-1.8, or preferably about 1.5 gallons. The distribution tubing, including the supply line 230 and the return line that deliver coolant to the manifolds, can average about 1000-1400, 1100-1300, or preferably about 1200 inches and can have an inner volume of about 3-6, 4-5, or preferably about 4.5 gallons. The cooling apparatus can include a manifold assembly 680 on each of the six server racks 410. The inlet chamber 655 and outlet chamber 665 of the manifold assembly 680 can each have an inner diameter of about 0.5-1.5, 0.75-1.25, or preferably about 0.9 in. The inlet and outlet chamber (655, 665) of the manifold assembly 680 can each have a length of about 45-80, 50-70, or preferably about 60 inches. The inlet and outlet chamber (655, 665) of the manifold assembly 680 can each have an inner volume of about 20-60 or 30-50 in$^3$ or preferably about 38 in$^3$ and can each have an inner volume of about 0.08-0.25, 0.12-0.21, or preferably about 0.17 gallons. Together, the six manifold assemblies can have a total inner volume of about 1.75-2.75, 2.0-2.5, or preferably about 2.35 gallons. The total inner volume of the cooling apparatus can be about 8-18, 11-16, or preferably about 13.5 gallons. In this example where the cooling apparatus is configured to cool 60 standard servers, the inner volume of the reservoir 200 can be equal to about 15-25, 20-35, or 30-40% of the total inner volume of the cooling apparatus 1.

In a cooling apparatus 1 designed to cool 120 standard servers arranged in twelve server racks 410, the cooling apparatus can include 120 cooling line assemblies 303 each made of three sections of ¼ in. flexible tubing 225 with an inner diameter of 0.18 in. The sections of flexible tubing 225 can be connected to two heat sink modules 100, similar to the cooling line assemblies 303 shown in FIGS. 113 and 114, which have three modules 100. Using rack-mounted manifold assemblies 680, the average length of each cooling line assembly 303 (extending from the inlet manifold 210 into the server 400 and back to the outlet manifold 215) can be about 70-110, 80-100, or preferably about 90 inches. Preferably, each cooling line assembly 303 is connected to a pair of inlet and outlet quick-connect fittings 235 nearest to the server 400 to be cooled, which decreases the amount of flexible tubing 225 needed as well as coolant volume. On average, each cooling line assembly 303 can have an inner volume of about 2.0-3.0, 2.2-2.6, or preferably about 2.4 in$^3$. Collectively, the 120 cooling line assemblies 303 can have an inner volume of about 0.75-1.75, 1.0-1.5, or preferably about 1.25 gallons. The reservoir 200 can have an inner volume of about 2-6, 3-4, or preferably about 3.5 gallons. The heat exchanger volume can be 1.6-3.0, 2.0-2.8, or preferably about 2.2 gallons. Sections of tubing that connect components in the fluid distribution unit 10 can have inner diameters of about 1.5 inches or 2.0 inches and, collectively, can have an inner volume of about 1.8-3.0, 2.0-2.8, or preferably about 2.4 gallons. The distribution tubing, including the supply line 230 and the return line that deliver coolant to the manifolds, can average about 1200-2000, 1400-1800, or 1680 inches and can have an inner volume of about 10-20, 12-18, or preferably about 14.8 gallons. The cooling apparatus 1 can include a manifold assembly 680 on each of the twelve server racks 410. The inlet chamber 655 and outlet chamber 665 of the manifold assembly 680 can each have an inner diameter of about 0.5-1.5, 0.75-1.25, or preferably about 0.9 in. The inlet and outlet chamber (655, 665) of the manifold assembly 680 can each have a length of about 45-80, 50-70, or preferably about 60 inches. The inlet and outlet chamber (655, 665) of the manifold assembly 680 can each have an inner volume of about 20-60 or 30-50 $in^3$ or preferably about 38 $in^3$ and can each have an inner volume of about 0.08-0.25, 0.12-0.21, or preferably about 0.17 gallons. Together, the twelve manifold assemblies can have a total inner volume of about 3.7-5.7, 4.2-5.2, or preferably about 4.7 gallons. The total inner volume of the cooling apparatus can be about 25-35, 26-32, or preferably about 29 gallons. In this example where the cooling apparatus is configured to cool 120 standard servers, the inner volume of the reservoir 200 can be equal to about 7-15, 12-20, or 15-30% of the total inner volume of the cooling apparatus. This percentage can be lower than the percentage for the 60-server cooling system described above.

In a cooling apparatus 1 designed to cool 240 standard servers arranged in twelve server racks 410, the cooling apparatus can include 240 cooling line assemblies 303 each made of three sections of ¼ in. flexible tubing 225 with an inner diameter of 0.18 in. The sections of flexible tubing 225 can be connected to two heat sink modules 100, similar to the cooling line assemblies 303 shown in FIGS. 113 and 114, which have three modules 100. Using rack-mounted manifold assemblies 680, the average length of each cooling line assembly 303 (extending from the inlet manifold 210 into the server 400 and back to the outlet manifold 215) can be about 70-110, 80-100, or preferably about 90 inches. Preferably, each cooling line assembly 303 is connected to a pair of inlet and outlet quick-connect fittings 235 nearest to the server 400 to be cooled, which decreases the amount of flexible tubing 225 needed as well as coolant volume. On average, each cooling line assembly 303 can have an inner volume of about 2.0-3.0, 2.2-2.6, or preferably about 2.4 $in^3$. Collectively, the 240 cooling line assemblies 303 can have an inner volume of about 2.0-3.0, 2.2-2.8, or preferably about 2.5 gallons. The reservoir 200 can have an inner volume of about 2-6, 3-4, or preferably about 3.5 gallons. The heat exchanger volume can be 3.8-5.8, 4.2-5.4, or preferably about 4.8 gallons. Sections of tubing that connect components in the fluid distribution unit 10 can have inner diameters of about 2.0 inches or 2.5 inches and, collectively, can have an inner volume of about 3.0-4.4, 3.2-4.2, or preferably about 3.7 gallons. The distribution tubing, including the supply line 230 and the return line that deliver coolant to the manifolds 680, can average about 1700-2500, 1900-2300, or 2150 inches and can have an inner volume of about 25-37, 27-35, or preferably about 31 gallons. The cooling apparatus 1 can include a manifold assembly 680 on each of the twenty-four server racks 410. The inlet chamber 655 and outlet chamber 665 of the manifold assembly 680 can each have an inner diameter of about 0.5-1.5, 0.75-1.25, or preferably about 0.9 in. The inlet and outlet chamber (655, 665) of the manifold assembly 680 can each have a length of about 45-80, 50-70, or preferably about 60 inches. The inlet and outlet chamber (655, 665) of the manifold assembly 680 can each have an inner volume of about 20-60 or 30-50 $in^3$ or preferably about 38 $in^3$ and can each have an inner volume of about 0.08-0.25, 0.12-0.21, or preferably about 0.17 gallons. Together, the twenty-four manifold assemblies 680 can have a total inner volume of about 6-13, 8-11, or preferably about 9.4 gallons. The total inner volume of the cooling apparatus can be about 45-65, 50-60, or preferably about 55 gallons. In this example where the cooling apparatus is configured to cool 240 standard servers, the inner volume of the reservoir 200 can be equal to about 4-10, 8-15, or 12-20% of the total inner volume of the cooling apparatus. This percentage can be lower than the percentage for the 120-server cooling system described above.

Flexible Tubing

FIG. 5 shows a top perspective view of a server 400 with its lid removed and a portion of a cooling apparatus 1 having a primary cooling loop 300 installed within the server housing. The cooling loop 300 can include a cooling line 303 connected to two heat sink modules 100 mounted on vertically oriented heat-generating components (e.g. GPUs) within the server 400. The heat sink modules 100 are arranged in a series configuration and are fluidly connected with sections of flexible tubing 225 to transport coolant between neighboring heat sink modules, from an outlet port 105 of the first heat sink module 100 to an inlet port 105 of the second heat sink module. In some examples, others types of tubing can be used, such as smooth tubing 225, as shown in FIGS. 4, 84, and 85. More specifically, smooth nylon or fluorinated ethylene propylene (FEP) tubing 225 can be used. In one example, the flexible tubing 225 can be FEP tubing from Cole-Parmer of Vernon Hills, Ill. and can have a maximum temperature rating of about 400 degrees F., an inner diameter of about 0.25-0.375 inches, and a maximum working pressure of about 210 psi. In another example, the flexible tubing 225 of the cooling lines 303 can be fluoropolymer tubing from SMC Corporation of Tokyo, Japan and can have a maximum operating pressure of about 60-75 psi at 100 degrees C., an inner diameter of about 0.165-0.185 inches, and a minimum bend radius of about 2.0-2.5 inches. The flexible tubing 225 can be chemically inert, nontoxic, heat resistant, and have a low coefficient of friction. In addition, the flexible tubing 225 may not noticeably deteriorate with age.

Providing a cooling apparatus 1 that operates at low pressures (e.g. less than 50 psi) as described herein, allows low pressure, flexible tubing 225 to be used, which is significantly less expensive than high pressure tubing, such as braided stainless steel tubing. Moreover, operating at lower pressures reduces power consumption by the pump 20, which provides a more efficient cooling system 1. Low pressure lines 225 can have substantially smaller minimum bend radiuses R and substantially smaller outer diameters than high pressure lines, making them far easier to route within server housings 400 where space is limited and where tight bends are commonly required to route around server components, such as fans and power electronics, as shown in FIG. 84.

In some applications, corrugated, flexible tubing 225 can provide certain advantages. For instance, corrugated tubing can resist kinking when routed in space-constrained applications, such as within servers 400 as shown in FIGS. 5 and 6. Flexible, corrugated tubing can be routed in configurations where the tubing contains bends that result in 180-degree directional changes without kinking, as shown in FIG. 6. In some examples, the flexible, corrugated tubing 225 can be corrugated FEP tubing from Cole-Parmer and can have a maximum temperature rating of about 400 degrees F. and a maximum working pressure of about 250 psi.

An advantage of corrugated tubing 225 is that, when transporting two-phase bubbly flow, it may delay the onset of slug flow by causing the breakdown of larger bubbles into smaller bubbles and causing the breakdown of clusters of bubbles due to frictional effects acting on the bubbles as they pass through the corrugated tubing and contact the inner walls of the tubing. Slug flow occurs when one or more large or bullet-shaped bubbles of vapor form within the tubing 225. As shown in FIG. 58, large vapor bubbles within slug flow may be nearly as wide as the inner diameter of the tubing. Slug flow is undesirable, since it can create flow instabilities in the cooling apparatus 1, resulting in surging or chugging within the cooling loops 300, making it difficult to maintain desired pressures in certain components of the cooling system 1, such as the heat sink modules 100, and thereby making it difficult to provide consistent and predictable cooling of a heated surface 12. Slug flow can be combated by increasing the flow rate through the heat sink modules 100 to reduce flow quality (x) (due to less vapor formation), thereby restoring two-phase bubbly flow, for example, between series-connected heat sink modules 100. In some examples, the cooling apparatus 1 can be configured to detect the onset of slug flow (e.g. using a visual flow detection system) at an outlet port 110 of a heat sink module 100 or at some other point in the cooling loop 300 and to automatically increase the coolant flow rate 51 to restore two-phase bubbly flow at the outlets of the one or more heat sink modules 100.

Another advantage of corrugated tubing 225 is that it can resist collapse when vacuum pressure is applied to an inner volume of the tubing. Vacuum pressure may be applied to the tubing 225 during servicing of the cooling apparatus 1. For example, when draining coolant 50 from the system 1 to allow for repairs or maintenance to be performed, vacuum pressure can be applied to a location (e.g. a drain 245) in the cooling apparatus 1 to draw out coolant 50 from the tubes and components of the apparatus. Portions of the cooling apparatus 1 can then be safely disassembled without having to make other arrangements for containment of the coolant. Removing coolant 50 through the application of vacuum pressure can allow the coolant to be captured in a vessel and reused to fill the apparatus when servicing is complete, thereby reducing servicing costs and waste that would otherwise be associated with discarding and replacing the coolant.

FIG. 6 shows a top view of a server 400 with its lid removed and a portion of a cooling apparatus 1 visible within the server. This example of a server 400 includes a motherboard 405, two microprocessors 415, and two sets of three memory modules 420. The two microprocessors 415 are mounted parallel to the motherboard 405, and the memory modules 420 are mounted perpendicular to the motherboard 405. The cooling apparatus 1 includes two heat sink modules 100 arranged in a series configuration and fluidly connected by flexible sections of flexible tubing 225. The first heat sink module 101 is mounted on a first microprocessor, and the second heat sink module 102 is mounted on a second microprocessor. A first section of flexible tubing 225 delivers coolant the an inlet port 105 of the first heat sink module 101, and a second section of flexible tubing 225 delivers coolant from an outlet port 110 of the first heat sink module 101 to an inlet port 105 of the second heat sink module 102. As, shown, due to its flexibility, the second section of flexible tubing 225 can easily be routed around server components for ease of installation. The flexible tubing 225 can be arranged in a variety of configurations, including serpentine configurations, to allow any two heat sink modules 100 (e.g. within a server housing) to be fluidly connected regardless of the orientation or placement of the two heat sink modules.

The heat sink modules 100 can be used within the server 400 to cool electrical components that produce the most heat, such as the microprocessors 415. Other components within the server 400 may also produce heat, but the amount of heat produced may not justify installation of additional heat sink modules 100. Instead, to remove heat generated by other electrical devices within the server 400, one or more fans 26 can be used to expel warm air from the server 400 housing, as shown in FIG. 6. The fans can be configured to draw cool room air into the server housing 400 and to expel warm air from the housing.

In some examples, the length of a section of flexible tubing 225 between series-connected modules can be at least 4, 6, 12, 18, or 24 inches in length. In some applications, increasing the length of the section of tubing 225 can promote condensation of bubbles 275 within the bubbly flow between series-connected heat-sink modules due to heat transfer from the liquid to the tubing 225 and ultimately from the tubing to the ambient air, as well as heat transfer within the coolant from the vapor portion of the flow to the liquid portion of the flow, thereby elevating the bulk fluid temperature as vapor bubbles collapse. In some applications, increasing the length of the second section of flexible, corrugated tubing 225 may promote breaking apart of clusters of bubbles that may form in the two-phase flow, thereby delaying the onset of plug/slug flow and maintaining two-phase bubbly flow.

Coolant Filter

FIG. 13 shows a schematic of a cooling apparatus 1 including a filter 260 located between the reservoir 200 and the pump 20 in the primary cooling loop 300. The filter 260 can trap and prevent debris from entering and damaging the pump 20. Likewise, the filter 260 can trap and prevent debris from passing through the primary cooling loop 300 to the one or more heat sink modules 100, where the debris could potentially clog small orifices 155 in the heat sink modules. The cooling apparatus 1 can include one or more filters 260 placed upstream or downstream of the pump 20, or in any other suitable locations. The filter 260 can be connected inline using quick-connect fittings. The filter 260 can be a disposable filter or a reusable filter. The filter can have a micron rating of about 5, 10, or 20 microns.

In some examples, the heat sink module 100 can include a filter 260 to ensure that no debris is permitted to enter the heat sink module and clog orifices 155 within the heat sink module. The filter 260 can be disposed within the heat sink module (e.g. a removable filter that is inserted within the inlet port 105, inlet passage 165, or inlet chamber 145), or can be attached in-line with the heat sink module 100, such as a filter component that is threaded onto the inlet port and that contains a filtration device. By placing the filter 260 in or immediately upstream of the heat sink module 100, clogging of orifices 155 within the heat sink module can be avoided regardless of where debris originates from in the cooling apparatus 1.

Heat Sink Module

The heat sink module 100 can be configured to mount on a surface to be cooled 12 and provide a plurality of jet streams 16 (e.g. an array of jet streams 16) of coolant that impinge against the surface to be cooled 12 to effectively remove heat from the surface to be cooled. By removing heat from the surface to be cooled 12, the heat sink module 100 can effectively maintain the temperature of the surface to be cooled 12 at a suitable level so that a device associated with the surface to be cooled 12 is able to operate without overheating (i.e. operate below a threshold temperature).

The heat sink module 100 can include a top surface 160 and a bottom surface 135 opposite the top surface. The heat sink module 100 can be uniquely sized and shaped for a particular application. For instance, where the heat sink module 100 is tasked with cooling a square-shaped microprocessor, the heat sink module 100 can have a square perimeter, as shown in FIGS. 21-24. In this example, the heat sink module 100 can be defined by a front side surface 175, a rear side surface 180, a left side surface 185, a right side surface 190, the top surface 160, and the bottom surface 135. In other applications, the perimeter shape of the heat sink module 100 can be round, polygonal, or non-polygonal. In some examples, the heat sink module 100 can have dimensions that allow it to replace a traditional finned heat sink. For instance, the heat sink module 100 can have a footprint of about 91.5×91.5 mm or 50×50 mm. In other examples, the heat sink module can be sized for a specific CPU or GPU. The features of the heat sink module 100 are scalable and can be rapidly manufactured using a 3D printing process.

The heat sink module 100 can have any suitable sealing feature located on the bottom surface 135 to facilitate sealing against the surface to be cooled 12 or against an intermediary surface, such as a surface of a thermally-conductive base member (e.g. a copper plate 430) that is adhere to the surface to be cooled 12. In some examples, the heat sink module 100 can include a channel 140 along its bottom surface 135, as shown in FIG. 24. The channel 140 can be configured to receive a suitable sealing member 125, such as a gasket or O-ring, as shown in FIG. 23. In some examples, the channel 140 can be a continuous channel that circumscribes an outlet chamber 150 of the heat sink module 100, as shown in FIG. 24. In other examples, the heat sink module 100 can include alternate or additional sealing materials, such as a liquid gasket material, a die cut rubber gasket, an adhesive sealant, or a 3-D printed gasket provided on the bottom surface 135 of the heat sink module 100.

Although the bottom surface 135 of the heat sink module shown in FIG. 23 is flat, this is non-limiting. For applications involving a contoured surface to be cooled 12, the bottom surface 135 of the heat sink module 100 can have a corresponding contour that matches the contour of the surface to be cooled 12 and a thereby allows a sealing member 125 disposed therebetween to provide a liquid tight seal. In one example, the bottom surface 135 of the heat sink module can have a contour configured to match an external surface contour of a cylindrical tube or vessel (e.g. a metallic vessel) used in a chemical process, such as a condensation process or cooling wort in a brewing process. The contoured bottom surface 135 of the heat sink module 100 can allow the heat sink module to be form a liquid-tight seal against the tube or vessel and cool an external surface of the tube or vessel that is exposed within the outlet chamber 150 of the heat sink module 100. Where the contents of a large vessel must be cooled rapidly, such as when chilling wort in a brewing process, a plurality of heat sink modules 100 can be arranged on the external surface(s) of the large vessel to remove heat from the vessel rapidly, thereby allowing the cooling apparatus 1 to replace a glycol chiller system in a modern brewery or a counterflow chiller (which uses a significant amount of chilled water) in a more traditional brewery.

The heat sink module 100 can include mounting holes 130 or locating holes, as shown in FIGS. 21 and 23, located near corners of the module and/or along one or more perimeter portions of the module. Fasteners 115 can be inserted through the mounting holes 130, as shown in FIG. 22, and installed into threaded holes associated with a mounting surface to which the heat sink module 100 is mounted, such as a mounting surface of a thermally conductive base member 430 (e.g. a copper base plate) or directly to a mounting surface of an electrical device (e.g. a microprocessor 415 or a motherboard 405). In some examples, screw-type fasteners 115 can be replaced with alternate types of fastening devices that allow for faster installation and/or removal of the heat sink module 100. In one example, the heat sink module 100 can be fastened to a heat source using a buckle mechanism, similar a ski boot buckle, to allow for rapid, tool-less installation. In other examples, the heat sink module 100 can be received by a snap fitting on the surface to be cooled 12, thereby allowing the heat sink module to be installed and uninstalled with ease by hand and without tools.

During installation of the heat sink module 100 on a surface to be cooled 12, one or more fasteners 115 can be inserted through one or more 130 holes in the heat sink module, and the one or more fasteners can engage mounting holes in the surface 12 to permit secure mounting of the heat sink module 100 to the surface 12. As the fasteners 115 are tightened, the heat sink module 100 can be drawn down tightly against the surface to be cooled 12, and the sealing member 125 (e.g. o-ring or gasket) can be compressed between the surface and the channel 140. Upon compression, the sealing member 125 can provide a liquid-tight seal to ensure that coolant 50 does not leak from the outlet chamber 150 during operation of the cooling system 1 as coolant 50 flows from the inlet port 105 to the outlet port 110 of the heat sink module 100.

The heat sink module 100 can include an inlet port 105, as shown in FIG. 21. The inlet port 105 can have internal or external threads 170 that allow a connector 120 to be connected to the inlet port. Any suitable connector 120 can be used to connect the inlet section of flexible tubing 225 to the inlet port 105. In some examples, as shown in FIG. 22, a metal or polymer connector 120 from Swagelock Company of Solon, Ohio can be used to connect the flexible tubing to the inlet port 105. The top surface 160 of the heat sink module 100 can include visual markings 132 to identify a preferred flow direction through the heat sink module to ensure proper routing of tubing to and from the heat sink module 100 to ensure that coolant flow 51 is delivered to the inlet port 105 and exits from the outlet port 110 and is not accidentally reversed.

As shown in FIG. 25, the heat sink module 100 can include an inlet passage 165 that fluidly connects the inlet port 105 to an inlet chamber 145 of the heat sink module. The heat sink module 100 can include a dividing member 195 that separates the inlet chamber 145 from the outlet chamber 150. The dividing member 195 can have a top surface and a bottom surface and can include one or more orifices 155 passing from the top surface to the bottom surface of the dividing member. The orifices 155 permit jet streams 16 of coolant 50 to be emitted from the bottom surface of the dividing member 195 and into the outlet chamber 150 when pressurized coolant 54 is delivered to the inlet chamber 145, as shown in FIG. 26.

As shown in the cross-sectional view of FIG. 25, the inlet chamber 145 can have a geometry that tapers in cross-sectional area from the front side surface 175 of the heat sink module 100 toward the rear side surface 180 of the heat sink module. The tapered cross-sectional area of the inlet chamber 145 can ensure that all orifices 155 receive coolant 50 at a similar pressure. Similarly, the outlet chamber 150 can increase in cross-sectional area in a direction from the rear surface 180 of the heat sink module toward the front surface 175 of the heat sink module 100. The increase in cross-sectional area of the outlet chamber 150 can provide suitable volume for expansion of the coolant that may occur as a portion of the liquid coolant transitions to vapor, as shown in FIG. 30, and exits the outlet port 110 of the heat sink module 100.

The heat sink module 100 can include one or more inlet passages 165 to permit fluid to enter the inlet chamber 145 and one or more outlet passages 166 to permit fluid to exit the outlet chamber 150. In this manner, the heat sink module 100 can be configured to permit fluid to flow through the outlet chamber 150. A dividing member 195 can at least partially separate the inlet chamber 145 from the outlet chamber 150. A plurality of orifices 155 can be formed in the dividing member as shown in FIGS. 24 and 25. The plurality of orifices 155 can be configured to each project a stream 16 of coolant 50 against the surface to be cooled 12. In some examples, the streams 16 of fluid projected against the surface 12 can be jet streams. As used herein, a "jet" or "jet stream" refers to a substantially liquid fluid filament that is projected through a substantially liquid or fluid medium or a mixture thereof. As used herein, a "jet stream" can include a single-phase liquid fluid filament or a two-phase bubbly flow filament. "Jet" or "jet stream" is contrasted with "spray" or "spray stream," where "spray" or "spray stream" refers to a substantially atomized liquid fluid projected through a substantially vapor medium.

The inlet chamber 145 and the outlet chamber 150 can be formed within the heat sink module 100. The heat sink module 100 can be made from any suitable material and manufactured by any suitable manufacturing process. In some examples, the heat sink module 100 can be made of a polymer material and formed through a 3D printing process, such as stereolithography (SLA) using a photo-curable resin. Printers capable of producing heat sink modules as shown in FIGS. 21-54 are available from 3D Systems Corporation of Rock Hill, S.C. In other examples, a module body can be injection molded to reduce cost and manufacturing time and an insertable orifice plate can be 3-D printed and attached to the module body to complete the heat sink module 100.

The heat sink module 100 can be configured to cool a surface 12 of a heat source. The heat sink module 100 can include an inlet chamber 145 formed within the heat sink module and an outlet chamber 150 formed within the heat sink module. In some examples, the outlet chamber 150 can have an open portion along the bottom side surface 135 of the heat sink module 100, as shown in FIG. 23. The open portion of the outlet chamber 150 can be enclosed by the surface 12 of a heat source when the heat sink module 100 is installed on the surface 12 of the heat source, as shown in FIG. 26. The heat sink module 100 can include a dividing member 195 disposed between the inlet chamber 145 and the outlet chamber 150. The dividing member 195 can include a first plurality of orifices 155 formed in the dividing member. The first plurality of orifices 155 can pass from a top side of the dividing member 195 to a bottom side of the dividing member and can be configured to deliver a plurality of jet streams 16 of coolant 50 into the outlet chamber 150 when pressurized coolant 54 is provided to the inlet chamber 145, as shown in FIG. 26.

The first plurality of orifices 155 can have any suitable diameter that allows the orifices to provide well-formed jets streams 16 of coolant 50 when pressurized coolant 54 is delivered to the inlet chamber 145 of the heat sink module 100. In some examples, the orifices 155 may all have uniform diameters, and in other examples, the orifices may not all have uniform diameters. In either case, the average diameter of the orifices 155 can be about 0.001-0.020, 0.001-0.2, 0.001-0.150, 0.001-0.120, 0.001-0.005, 0.020-0.045, 0.030-0.050 in, or 0.040 in. An orifice 155 diameter of about 0.040 in. can be preferable to ensure that orifice clogging does not occur.

In some examples, to ensure that well-formed jet streams 16 of coolant 50 are provided by the orifices 155, the length of the orifice can be selected based on the diameter of the orifice. For instance, where the first plurality of orifices 155 are defined by a diameter D and an average length L, in some cases L divided by D can be greater than or equal to one, about 1-10, 1-8, 1-6, 1-4, 1-3, or 2. In the configuration shown in FIG. 26, the length of each orifice 155 can be determined based on an angle of the orifice with respect to the surface to be cooled 12 and based on the thickness of the dividing member 195. In some examples the dividing member 195 can have a thickness of about 0.005-0.25, 0.020-0.1, 0.025-0.08, 0.025-0.075, 0.040-0.070, 0.1-0.25, 0.040-0.070, or 0.080 in. The thickness of the dividing member 195 can be selected to provide a desired length for the orifices 155 to ensure columnar jet streams 16 of coolant. The thickness of the dividing member can also be selected to ensure structural integrity of the heat sink module 100 when receiving pressurized coolant 54 in the inlet chamber 145 and to withstand vacuum pressure when coolant 50 is purged from the cooling system 1. To minimize the height of the heat sink module 100 (e.g. to provide greater freedom when dealing with tight packaging constraints), it can be desirable to select a minimal dividing member thickness that still provides well-formed columnar jet streams 16 and adequate structural integrity.

The heat sink module 100 can be made of any suitable material or process (e.g. a three-dimensional printing process) and can have any suitable color or can be colorless. In some examples, it may be desirable to visually inspect the operation of the heat sink module 100 to ensure that boiling is occurring within the heat sink module proximate the surface to be cooled 12. To permit visual inspection, at least a portion of the heat sink module 100 can be made of a transparent or translucent material. In some examples, the transparent or translucent material can form the entire heat sink module 100, and in other examples, the transparent or translucent material can form only a portion of the heat sink module, such as a window into the outlet chamber 150 of the heat sink module or a side wall of the heat sink module. In these examples, the window or side wall can permit boiling coolant within the outlet chamber 150 to be observed when the heat sink module 100 is installed on the surface to be cooled 12.

Orifices within Heat Sink Module

Each orifice 155 within the heat sink module 100 can include a central axis 74, as shown in FIG. 30. The central axis 74 of the orifice 155 may either be angled perpendicularly with respect to the surface to be cooled 12 or angled non-perpendicularly with respect to the surface to be cooled 12, the latter of which is shown in FIG. 30. FIG. 20 shows a cross-sectional view of a heat sink module with orifices 155 arranged at a 45-degree angle with respect to the surface to be cooled 12. If angled non-perpendicularly with respect to the surface to be cooled 12, the central axis 74 of the orifice 155 may define any angle between 0° and 90° with respect to the surface 12, such as about 5°, about 10°, about 15°, about 20°, about 25°, about 30°, about 35°, about 40°, about 45°, about 50°, about 55°, about 60°, about 65°, about 70°, about 75°, about 80° or about 85° or any range therebetween (e.g. 5-15°, 10-20°, 15-25°, 20-30°, 25-35°, 30-40°, 35-45°, 40-50°, 45-55°, 50-60°, 55-65°, 60-70°, 65-75°, 70-80°, or 75-85°). The orifice 155 can have any cross-sectional shape when viewed along its central axis 74. Various examples include a circular shape, an oval shape (to generate a fan-shaped jet stream), a polygonal shape, or any other suitable cross-sectional shape.

FIG. 31 shows a top cross-sectional view of the heat sink module of FIG. 21 taken along section C-C shown in FIG. 25. Section C-C passes through the dividing member 195 and exposes the array 76 of orifices 155 within the heat sink module 100. In this example, because the central axes 74 of the plurality of orifices are arranged at a 45-degree angle with respect to the dividing member 195, the orifices appear as ovals in FIG. 31 despite the orifice being cylindrical coolant passageways through the dividing member.

The heat sink module 100 preferably includes an array 76 of orifices 155. The central axes 74 of the orifices 155 in the array 76 may define different angles with respect to the surface to be cooled 12. Alternately, the central axis 74 of each orifice 155 in the array 76 may have the same angle with respect to surface 12, as shown in FIG. 30. In some examples, providing neighboring orifices with central axes 74 with the same angle with respect to the surface to be cooled 12 can be preferable to avoid interaction (i.e. interference) of the jet streams 16 prior to impingement on the surface to be cooled 12. By providing jet streams 16 of coolant that do not interfere with each other prior to impingement, the heat sink module 100 can provide jet streams 16 with sufficient momentum to disrupt vapor formation on the surface to be cooled 12, thereby increasing the three-phase contact line 58 length on the surface to be cooled 12 and allowing higher heat fluxes to be effectively dissipated without reaching critical heat flux (see, e.g. FIG. 63).

The array 76 of orifices 155 may be arranged in any configuration suitable for cooling the surface to be cooled 12. FIG. 62 shows possible orifice 155 configurations including (a) a regular rectangular jet array 76, (b) a regular hexagonal jet array 76, and (c) a circular jet array 76. In the regular hexagonal array 76, shown in FIGS. 23, 31 and 62(b), the arrays 76 can be organized into staggered columns 77 and rows 78. The staggering of orifices 155 in the array 76 is such that a given orifice 155 in a given column 77 and row 78 does not have a corresponding orifice in a neighboring row 78 in the given column 77 or a corresponding orifice 155 in a neighboring column 77 in the given row 78. If the orifices 155 are configured to induce a substantially same direction of flow 90 along the surface to be cooled 12 (as shown in FIGS. 30 and 32), the columns 77 and the rows 78 are preferably oriented substantially parallel and perpendicular, respectively, to the substantially same direction of flow 90. Arrays of orifices 155 in non-staggered arrangements can be used in other examples of the heat sink module 100.

The orifice 155 can be configured to project a jet stream 16 having any of a variety of shapes and any of a variety of trajectories. With regard to shape, the stream 16 is preferably a symmetrical stream. As used herein, "symmetrical stream," refers to a jet stream 16 that is symmetrical in cross section. Examples of symmetrical streams include linear streams, fan-shaped streams, and conical streams. Linear streams have a substantially constant cross section along their length. Conical streams have a round cross section that increases along their length. Fan-shaped streams have a cross section along their length with a first cross-sectional axis being significantly longer than a second, perpendicular cross-sectional axis. In some versions of the conical jet streams 16, at least one and possibly both of the cross-sectional axes increase in length along the length of the stream. With regard to trajectory, the jet stream 16 preferably includes a central axis 17. For the purposes herein, the "central axis 17 of the stream 16" is the line formed by center points of a series of transverse planes taken along the length of the stream 16, where each transverse plane is oriented to overlap with the smallest possible surface area of the stream 16, and each center point is the point on the transverse plane that is equidistant from opposing edges of the stream 16 along the transverse plane. In preferred versions, the orifice 155 projects a jet stream 16 having a central axis 17 that is substantially collinear with the central axis 74 of the orifice 155. However, the orifice 155 may also project a stream 16 having a central axis 17 that is angled with respect to the central axis 74 of the orifice 155. The angle of the central axis 17 of the stream 16 with respect to the central axis 74 of the orifice 155 may be any angle between 0° and 90°, such as about 1°, about 2°, about 3°, about 4°, about 5°, about 7°, about 10°, about 15°, about 20°, about 25°, about 30°, about 35°, about 40°, about 45°, about 50°, about 55°, about 60°, about 65°, about 70°, about 75°, or about 80° or any range therebetween. In such versions, the orifice 155 preferably projects a jet stream 16 where at least one portion of the jet stream 16 is projected along the central axis 74 of the orifice 155. However, the orifice 155 may also project a jet stream 16 where no portions of the jet stream 16 are projected along the central axis 74 of the orifices 155.

Similarly, the orifice 155 may be configured to project a jet stream 16 that impinges on the surface 12 at any of a variety of angles. In some versions, the orifice 155 projects a stream 16 at the surface 12 such that the entire stream (in the case of a linear stream), or at least the central axis 17 of the stream 16 (in the case of conical or fan-shaped streams), impinges perpendicularly on the surface 12 (i.e., at a 90° angle with respect to the surface). Perpendicular impingement upon a surface 12 induces radial flow of coolant 50 from contact points along the surface 12. While arrays 96 of perpendicularly impinging streams 16 are suitable for some applications, they are not optimal in efficiency. This is because opposing coolant flow from neighboring contact points interacts to form stagnant regions. Heat transfer performance in these stagnant regions can fall to nearly zero, which in high heat flux applications (e.g. cooling high performance microprocessors or power electronics) can pose risks associated with critical heat flux.

In a preferred examples shown in FIGS. 30 and 32, the orifices 155 are configured to project jet streams 16 of coolant that impinge the surface to be cooled 12 such that at least the central axis 17 of each jet stream 16, and more preferably the entire jet stream 16, impinges non-perpendicularly on the surface to be cooled 12 (i.e. at an angle other than 90° with respect to the surface), as shown in FIGS. 30-32. As a non-limiting example, the central axis 17 of the jet stream 16 may impinge on the surface 12 at any angle between 0° and 90°, such as about 1°, about 2°, about 3°, about 4°, about 5°, about 7°, about 10°, about 15°, about 20°, about 25°, about 30°, about 35°, about 40°, about 45°, about 50°, about 55°, about 60°, about 65°, about 70°, about 75°, or about 80° or any range there between.

FIG. 32 depicts a top view of a surface 12 on which jet streams 16 of an array 76 of jet streams impinges non-perpendicularly on the surface 12. The non-perpendicular impingement creates a flow pattern 90 to the right in which all the coolant 50 flows along the surface 12 in substantially the same direction 90. In some versions of patterns flowing in substantially the same direction 90, flow of coolant 50 at each portion of the surface 12 has a common directional vector component along a plane defined by the surface to be cooled 12. In other versions, coolant 50 at no two points on the surface 12 flows in opposite directions. In yet other versions, coolant 50 at no two points on the surface 12 flows in opposite directions or flows in perpendicular directions. Flowing coolant 50 in the substantially same direction eliminates stagnant regions on the surface being cooled 12, which helps avoid the onset of critical heat flux.

The plurality of orifices 155 in the array 76 are preferably configured to provide impinging jet streams 16 of coolant on the surface 12 in an array 96 of contact points 91 (i.e. where each contact point 91 is a jet stream 16 impingement location on the surface to be cooled 12) having staggered columns 97 and rows 98, as shown in FIG. 32. The staggering is such that a given contact point 91 in a given column 97 and row 98 does not have a corresponding contact point 91 in a neighboring column 97 in the given row 98 or a corresponding contact point 91 in a neighboring row 98 in the given column 97. If the coolant 50 is induced to flow across the surface 12 in substantially the same direction 90, as shown in FIG. 32, either the columns 97 or the rows 98 are preferably oriented substantially perpendicularly to the substantially same direction 90 of flow. Arrays 96 of contact points 91 arranged in this manner permit coolant 50 emanating from each contact point 91 in a given column 97 or row 98 to flow substantially between contact points 91 in a neighboring column 97 or row 98, respectively, as shown in FIG. 32. The heat sink module 100 shown in FIGS. 21 and 30 provides even, consistent flow of coolant 50 over the surface to be cooled 12, without formation of stagnation regions, and thereby encourages bubble 275 generation and evaporation, which dramatically increases the heat transfer rate from the surface to be cooled 12.

The heat sink module 100 can include an array 76 of orifices 155 with each orifice 155 having a central axis 74 angled non-perpendicularly with respect to the surface 12, where each orifice 155 projects a jet stream 16 of coolant 50 having a central axis 17 collinear with the central axis 74 of the orifice 155. In some examples, all the orifices 155 can have central axes 74 oriented at about the same angle and can project jet streams 16 of coolant having about the same trajectory and shape and can impinge against the surface 12 at about the same angle of impingement.

The array 76 of orifices 155 can be provided within the heat sink module 100 as illustrated and described with respect to FIGS. 23-31. The plurality of jet streams 16 emitted from the plurality of orifices 155 can promote bubble generation and evaporation at the surface to be cooled 12, thereby achieving higher heat transfer performance than conventional single-phase liquid cooling systems. Other implementations may promote bubble 275 generation using structures within the orifices 155, such as structures that encourage cavitation or degassing of non-condensable gasses absorbed in the liquid. Similarly boiling-inducing members 196 can be included in the heat sink module 100, as shown in FIGS. 45-50, or can be included on the surface to be cooled 12, as shown in FIG. 55.

Jet Streams with Entrained Bubbles

In some examples, it can be desirable provide jet streams 16 that contain entrained bubbles 275 to seed nucleation sites on the surface to be cooled 12. Seeding nucleation sites on the surface to be cooled 12 can promote vapor formation and can increase a heat transfer rate from the surface to be cooled 12 to the coolant 50. FIG. 73 shows a first heat sink module 100 fluidly connected to a second heat sink module 100. A section of flexible tubing 225 transports coolant from an outlet port 110 of the first heat sink module 100 to an inlet port 105 of the second heat sink module 100. Within the first heat sink module 100, a plurality of jet streams 16 of coolant are shown impinging a first surface to be cooled 12. Due to heat transferring from the first surface to be cooled 12 to the coolant 50 within in the outlet chamber 150 of the first heat sink module 100, vapor bubbles 275 form in the coolant 50. The bubbles 275 can be dispersed within the liquid coolant as it exits the outlet port 110 of the heat sink module 100. As the coolant 50 flows within the tubing 225 toward the inlet port 105 of the second heat sink module, some of the bubbles 275 may coalesce and form larger bubbles. The small and large bubbles 275 can be transported to an inlet chamber 145 of the second heat sink module. The small bubbles may be sufficiently small to travel through the orifices 155 and become entrained in a jet stream that impinges against the surface to be cooled. When the small bubbles impinge the surface to be cooled 12, they may seed nucleation sites on the surface to be cooled 12 and promote vapor formation, which can provide higher heat transfer rates. In some examples, as shown in FIG. 73, the larger bubbles 276 may be too large to pass through the orifices 155. But pressure and flow forces may draw the larger bubbles 276 toward the orifices 155, where upon contacting the orifice inlets, the larger bubbles 276 break into smaller bubbles that can pass through the orifices 155 and be entrained in the jet streams 16. In this way, the size of the orifice 155 determines the maximum bubble size that will be entrained in the jet stream 16 and will impinge the surface to be cooled 12. To provide jet streams 16 with entrained bubbles 275 that provide desirable seeding of nucleation sites on the surface to be cooled 12, the orifice 155 diameters within the heat sink module 100 can be about 0.001-0.020, 0.001-0.2, 0.001-0.150, 0.001-0.120, 0.001-0.005, or 0.030-0.050 in.

Anti-Pooling Orifices

Pooling of coolant 50 within the outlet chamber 150 of the heat sink module 100 is undesirable, since it can create stagnation regions or other undesirable flow patterns that result in non-uniform cooling of the surface to be cooled 12, which can lead to critical heat flux issues. To avoid pooling of coolant 50 in the outlet chamber 150, the heat sink module 100 can include a second plurality of orifices 156 extending from the inlet chamber 145 to a rear wall (or proximate the rear wall) of the outlet chamber 150, as shown in FIGS. 33-38. The second plurality of orifices 156 can be configured to deliver a plurality of anti-pooling jet streams 16 of coolant to a rear portion of the outlet chamber 150 when pressurized coolant 54 is provided to the inlet chamber 145. As shown in FIG. 33, the second plurality of orifices 156 can be arranged in a column along the rear wall of the outlet chamber 150 thereby preventing coolant from pooling near the rear wall of the outlet chamber 150.

FIG. 35 shows a detailed view of one anti-pooling orifice 156 taken from the cross-sectional view of FIG. 34. The anti-pooling orifice 156 can be configured to deliver an anti-pooling jet stream 16 of coolant to a rear region of the outlet chamber 150 to prevent coolant from pooling or stagnating near the rear wall of the outlet chamber 150. The central axes 75 of the anti-pooling orifice 156 can be arranged at an angle of about 0-90, 40-80, 50-70, or 60 degrees respect to the surface to be cooled 12. In some examples, the central axes 75 of the anti-pooling orifice 156 can be at a larger angle than the central axes 74 of the plurality of orifices 155, as shown in FIG. 35. This arrangement can prevent interaction of the anti-pooling jet stream with a neighboring jet stream 16 prior to impingement on the surface to be cooled 12, thereby decreasing the likelihood of stagnation points on the surface to be cooled 12 near the rear wall of the outlet chamber 150.

Boiling-Inducing Features

As described above, achieving boiling of coolant 50 proximate the surface to be cooled 12 can dramatically increase the heat transfer rate and overall performance of the cooling apparatus 1. To encourage boiling of coolant 50 within the outlet chamber 150, the heat sink module 100 can include one or more boiling-inducing members 196 extending from the bottom surface of the dividing member 195 toward the surface to be cooled 12, as shown in FIG. 46. The one or more boiling-inducing members 196 can be slender members extending from the bottom surface of the dividing member 195. In some examples, the one or more boiling-inducing members 196 can be configured to contact the surface to be cooled 12. In other examples, the one or more boiling-inducing members 196 can be configured to extend toward the surface to be cooled but not contact the surface to be cooled. Rather, a clearance can be provided between the one or more boiling-inducing members 196 and the surface to be cooled 196, such that coolant 50 can flow between the surface to be cooled 12 and the tips of the boiling-inducing members, thereby ensuring that no hot spots or stagnation regions are created on the surface to be cooled 12. The clearance distance can be any suitable distance, and in some examples can be 0.001-0.0125, 0.001-0.05, 0.001-0.02, 0.001-0.01, or 0.005-0.010 in.

Angled Inlet and Outlet Ports

The inlet port 105 and outlet port 110 of the heat sink module 100 can be angled to provide ease of installation in a wide variety of applications. For instance, when installing the heat sink module 100 on a microprocessor 415 that is mounted on a motherboard 405, as shown in FIG. 27, if the inlet port 105 of the heat sink module is arranged at an angle (a) that is greater than zero, a clearance distance is provided between a bottom surface of the inlet port 105 and the microprocessor 415 and motherboard 405. This clearance distance can allow a connector 120, such as a compression fitting, to be easily installed (e.g. threaded) on the inlet port 105) without interfering with or contacting the microprocessor or motherboard. In addition, angling the port upwards at a moderate angle reduces the likelihood that the heat sink module 100 (and flexible tubing 225 connected to the inlet port 105) will interfere with any motherboard devices (e.g. capacitors, resistors, inductors), while still maintaining a compact height that allows the heat sink module 100 to be used between two expansion cards. In the example shown in FIG. 21, a height measured from the bottom surface 135 to the top surface 160 of the heat sink module 100 can be about 0.36 inches, and a height measured from the bottom surface 135 to the highest surface of the angled inlet and outlet ports (105, 110) can be about 0.42 inches. As shown in FIGS. 5, 6, 56, and 57, free space can be limited on a motherboard 405 and in a server 400, and experimental installations have shown that angled inlet and outlet ports (105, 110) and compact external dimensions can be very helpful in making heat sink modules 100 fit in tight spaces where competing heat sinks are unable to fit.

The heat sink module 100 can include an inlet port 105 that is fluidly connected to the inlet chamber 145 by an inlet passage 165. The heat sink module 100 can include a bottom plane 19 associated with the bottom surface 135, as shown in FIG. 26. The inlet port 105 can be defined by a central axis 23. The central axis 23 of the inlet port 105 can be non-parallel and non-perpendicular to the bottom plane 19 of the heat sink module 100. For instance, the central axis 23 of the inlet port 105 can define an angle of about 10-80, 20-70, 30-60, or 40-50 degrees with respect to the bottom plane 19 of the heat sink module 100.

The heat sink module 100 can include an outlet port 110 that is fluidly connected to the outlet chamber 150 by an outlet passage 166. The outlet port 110 can be defined by a central axis 24, as shown in FIG. 29. The central axis 24 of the outlet port 110 can be non-parallel and non-perpendicular to the bottom plane 19 of the heat sink module 100. For instance, the central axis 24 of the outlet port 110 can define an angle of about 10-80, 20-70, 30-60, or 40-50 degrees with respect to the bottom plane 19 of the heat sink module 100.

Insertable Orifice Plate

In some instances, the heat sink module 100 can include two or more components that are assembled to construct the heat sink module. Since the plurality of orifices 155 disposed in the dividing member 195 can be the most intricate and costly portion of the heat sink module 100 to manufacture (due to the relatively small diameters of the orifices 155 requiring a tighter tolerance manufacturing process than the rest of the module), it may be desirable to manufacture an orifice plate 198 (e.g. that includes a dividing member 195 and a plurality of orifices 155) separately from the rest of the heat sink module (i.e. the module body 104) and subsequently assemble the module body 104 and the orifice plate 198. FIG. 65 shows an insertable orifice plate 198 attached to a module body 104 to form heat sink module 100.

In some examples, the orifice plate 198 can be manufactured by a first manufacturing method and the module body 104 can be manufactured by a second manufacturing method where the second manufacturing method is, for example, a lower cost and/or lower precision manufacturing method than the first manufacturing method. In some examples, the orifice plate 198 can be manufactured using a 3-D printing process, and the module body 104 can be manufactured by an injection molding process. In other examples, the orifice plate 198 can be manufactured by an injection molding process, a casting process, or a machining or drilling process, and the module body 104 can be manufactured by any other suitable process.

FIG. 65 shows a heat sink module 100 with a module body 104 and an insertable orifice plate 198 installed therein. The insertable orifice plate 198 can be attached to the heat sink module 100 by any suitable method of assembly (e.g. fasteners, press fit, or snap fit). As shown in FIG. 65, the insertable orifice plate 198 can be pressed into the body 104 of the heat sink module 100 and can include a sealing member 126 that is configured to form a liquid-tight seal between the inlet chamber 145 and the outlet chamber 150. In some examples, the insertable orifice plate 198 can be removable, and in other examples the insertable orifice plate 198 may not be easily removable once installed in the body of the heat sink module 100. The plurality of orifice 155 in the orifice plate 198 can be optimized to cool a certain device, such as a certain brand and model of microprocessor 415 having a particular non-uniform heat distribution. When the microprocessor 415, motherboard 405, or entire server 400 is upgraded to a newer model, a first insertable orifice plate 198 in the heat sink module 100 can be replaced by a second insertable orifice plate 198 that has been optimized to cool the newer model processor that will replace the older one. Consequently, instead of needing to replace the entire heat sink module 100, only the insertable orifice plate 198 needs to be replaced to ensure adequate cooling of the newer model processor. This approach can significantly reduce costs associated with upgrading servers 400 in data centers 425. It can also significantly reduce the cost of optimizing the cooling apparatus 1 when replacing servers 400 in a datacenter 425, since the original cooling apparatus 1, including the pump 20, manifolds (210, 215), heat exchangers 40, flexible tubing 225, and fittings 235, can continue to be used.

A heat sink module 100 can be configured to cool a heat source, such as a surface 12 of a heat source. The heat sink module 100 can include an inlet chamber 145 formed within the heat sink module. The heat sink module 100 can include an insertable orifice plate 198 and a module body 104, as shown in FIG. 65, where the insertable orifice plate is configured to attach within the module body 104. The insertable orifice plate 198 can separate the inlet chamber 145 from an outlet chamber 150. The insertable orifice plate 198 can include a first plurality of orifices 155 passing from a top side of the insertable orifice plate 198 to a bottom side of the insertable orifice plate 198. The first plurality of orifices 155 can be configured to deliver a plurality of jet streams 16 of coolant 50 into the outlet chamber 150 when pressurized coolant 54 is provided to the inlet chamber 145 of the heat sink module 100. The outlet chamber 150 can have an open portion proximate a bottom surface of the heat sink module 100, and the open portion can be configured to be enclosed by a surface 12 of a heat source when the heat sink module is installed on the surface of the heat source. In this example, the first plurality of orifices 155 can have an average diameter of about 0.001-0.020, 0.001-0.2, 0.001-0.150, 0.001-0.120, 0.001-0.005, or 0.030-0.050 in. The insertable orifice plate 198 can have a thickness of about 0.005-0.25, 0.020-0.1, 0.025-0.08, 0.025-0.075, 0.040-0.070, 0.1-0.25, or 0.040-0.070 in.

Jet Height

The heat sink module 100 can have a bottom plane 19 associated with the bottom surface 135 of the heat sink module, as shown in FIG. 26. The distance between the bottom plane 19 of the heat sink module and the bottom side of the insertable orifice plate 198 (i.e. where orifice 155 outlets are located) defines a "jet height" 18, which can be an important factor affecting heat transfer rates attainable from the surface to be cooled 12 in response to impinging jets 16 of coolant 50 being delivered from the plurality of orifices 155. In some examples, the distance between the orifice 155 outlets and the surface to be cooled 12 can be about 0.01-0.75, 0.05-0.5, 0.05-0.25, 0.020-0.25, 0.03-0.125, 0.04-0.08, or about 0.050 in. In some examples, the jet height 18 can define the height of the outlet chamber 150 of the heat sink module 100.

As shown in FIG. 26, the outlet chamber 150 can have a tapered profile that permits for expansion of the coolant 50 as the coolant flows towards the outlet port 110 and as the quality (x) of the coolant increases in response to vapor formation proximate the surface to be cooled 12. To provide this tapered volume, the bottom surface of the dividing member may be arranged at an angle with respect to the surface to be cooled. Consequently, a jet height 18 of a first orifice 155 located near a front side of the heat sink module 100 may be less than a jet height 18 of a second orifice 155 located near a rear side of the heat sink module. In these examples, a non-uniform jet height 18 may be defined as falling within a suitable range, such as about 0.01-0.75, 0.05-0.5, 0.05-0.25, 0.020-0.25, 0.03-0.125, or 0.04-0.08 in. In other examples, an average jet height can be calculated based on the non-uniform jet height values, and the average jet height can be about 0.01-0.75, 0.05-0.5, 0.05-0.25, 0.020-0.25, 0.03-0.125, or 0.04-0.08 in.

In some examples, the distance between the bottom surface of the insertable orifice plate 198 (or dividing member 195) and the bottom surface 135 of the heat sink module 100 can define the jet height 18. The jet height (H) can be selected based on the average diameter ($d_n$) of the plurality of orifices 155. The relationship between the jet height 18 and the average diameter of the plurality of orifices 155 can be expressed as a ratio ($H/d_n$). Examples of suitable values for $H/d_n$ can be about 0.25-30, 0.25-10, 5-20, 15-25, or 20-30 for the heat sink module 100 described herein.

Jet Spacing

The orifices 155 within the heat sink module 100 can have any suitable configuration forming an array 76. FIGS. 62(*a*), (*b*), and (*c*) show configurations of orifices 155 having a rectangular jet array, a hexagonal jet array, and a circular jet array, respectively. Spacing (S) of the orifices 155 can be selected based on the average diameter ($d_n$) of the plurality of orifices 155. As shown in FIG. 62(*b*), for a hexagonal jet array 76, spacing between jets from left to right (i.e. in a streamwise direction for oblique jet impingement as shown in FIG. 32) is identified as $S_{col}$, and spacing between jets from top to bottom (i.e. cross-stream direction for oblique impingement as shown in FIG. 32) is identified as $S_{row}$. Where $S_{col}$ is set equal to S, and $S_{row}$ is set equal to ($2_{col}/\sqrt{3}$), a relationship between jet spacing S and the average diameter of the plurality of orifices 155 can be expressed as $S/d_n$. Suitable values for $S/d_n$ can be about 1.8-330, 1.8-50, 25-125, 100-200, 150-250, 200-300, or 275-330 for the rectangular, hexagonal, and circular jet arrays 76 shown in FIGS. 62(*a*), (*b*), and (*c*), respectively.

Jet Stream Momentum Flux

In some examples, coolant pressure, coolant temperature, coolant mass, and/or orifice diameter can be selected to provide a jet stream 16 with sufficient momentum flux to penetrate through the coolant 50 in the outlet chamber 150 and to impinge the surface to be cooled 12, as shown in FIG. 26. By impinging the surface to be cooled 12, the jet stream 16 can disrupt vapor bubbles or pockets forming on the surface to be cooled 12, thereby increasing the length of the three-phase contact line 58 (see, e.g. FIG. 63) and thereby increasing the heat transfer rate from the surface to be cooled 12 to the coolant 50 and delaying the onset of critical heat flux.

To provide desirable heat transfer from the surface to be cooled 12, experimental testing demonstrated that jet stream 16 momentum flux should be at least 23 kg/m-s$^2$ when using R245fa as the coolant 50 and should be at least 24 kg/m-s$^2$ when using HFE-7000 as the coolant 50. Suitable values of jet stream 16 momentum flux from each orifice include 24-220, 98-390, 220-611, 390-880, 611-1200, 880-1566, and greater than 1566 kg/m-s$^2$. Although a high jet stream 16 momentum flux can be desirable to increase heat transfer rates, reducing the jet stream momentum flux can be desirable to reduce power consumption by the pump 20, and thereby increase efficiency of the cooling apparatus 1. Experimental tests showed that jet stream 16 momentum fluxes of about 95-880, 220-615, and about 390 kg/m-s$^2$ produced a desirable balance of high heat transfer rates and low power consumption by the pump 20.

Internal Threads on Inlet and Outlet Ports

In some examples, corrugated, flexible tubing 225 can be used to fluidly connect heat sink modules 100 to the cooling apparatus. The corrugated, flexible tubing 225 can include spiral corrugations extending along the length of the tubing 225, similar to course threads on a screw. To facilitate fast connection of a section of flexible tubing 225 to the heat sink module 100, corresponding corrugation-mating features can be provided on the interior surfaces of the inlet and outlet ports (105, 110) of the heat sink module. The corresponding corrugation-mating features can be molded into the inlet and outlet ports (105, 110) thereby serving as internal threads. As a result, fluidly connecting a section of flexible corrugated tubing 225 to a port (105 or 110) of the heat sink module 100 can be as simple as threading the section of tubing 225 into the port. In some examples the diameter of the port (105, 110) can taper inward, thereby ensuring a liquid-tight fit as the section of tubing 225 is threaded into the port. To further ensure a liquid-tight seal, a thread sealant, such as a Teflon tape or a spreadable thread sealant can be provided between the interior surface of the port (105, 110) and the outer surface of the section of flexible tubing 225. In other examples, an adhesive, such as epoxy, can be provided between the interior surface of the port (105, 110) and the outer surface of the section of flexible tubing 225 to further ensure a liquid-tight seal and to prevent inadvertent disconnection of the section of tubing from the port.

Non-Threaded Connections

To speed installation of the heat sink module 100, for example, into a server 400, the threaded ports 105, 110 of the heat sink module 100 can be replaced with non-threaded ports. In one example, the non-threaded ports can be quick-connect ports are configured to mate with a corresponding quick connect coupler, such as a corresponding quick connect coupler attached to a section of flexible tubing 225. In this example, the quick-connect features of the quick-connect ports can be manufactured using a 3D printer. In another example, the non-threaded ports can be configured to receive smooth, flexible tubing 225 within in inner diameter of each port or over an outer diameter of each port. An epoxy or other suitable adhesive can be used to bond the flexible tubing 225 to the port (105, 110) of the heat sink module 100 to form a connector-less fluid coupling.

Leakproof Coating

The heat sink module 100 can be manufactured from a plastic material through, for example, an injection molding process or an additive manufacturing process. Depending of the properties of the plastic material used to manufacture the heat sink module 100, and the type of coolant 50 used with the cooling apparatus 1 (and the molecular size of the coolant), leakage of coolant through the walls of the heat sink module 100 may occur. To avoid leakage, the heat sink module 100 can be coated with a leakproof coating. In some examples, the leakproof coating can be a metalized coating, such as a nickel coating deposited on an outer surface of the heat sink module 100 or along the inner surfaces of the heat sink module (e.g. inner surfaces of the inlet and outlet ports, inlet and outlet passages, and inlet and outlet chambers). The leakproof coating can be made of a suitable material and can have a suitable thickness to ensure that coolant does not migrate through the walls of the heat sink module 100 and into the environment. The leakproof coating can be applied to surfaces of the heat sink module 100 by any suitable application method, such as arc or flame spray coating, electroplating, physical vapor deposition, or chemical vapor deposition.

Internal Bypass in Heat Sink Module

To promote condensing of two-phase bubbly flow upstream of the reservoir 200, and thereby reduce the likelihood of vapor being drawn into the pump 20 from the reservoir, the heat sink module 100 can include an internal bypass that routes a portion of the coolant 50 flow delivered to the inlet port 105 of the module around the heated surface 12. The internal bypass can be formed within the heat sink module 100. For instance, the internal bypass can be a, injection molded, cast, or 3D printed internal bypass formed within the heat sink module 100 and configured to transport coolant from the inlet port 105 to the outlet port 110 without bringing the fluid in contact with the surface to be cooled 12. The coolant that flows through the internal bypass can remain single-phase liquid coolant that is below the saturation temperature of the coolant. Near the outlet port 110 of the heat sink module 100, the single-phase liquid coolant that is diverted through the internal bypass can be mixed with two-phase bubbly flow (i.e. two-phase bubbly flow generated by jet stream impingement against the surface to be cooled 12) that was not diverted. Mixing of the single-phase liquid coolant with the two-phase bubbly flow can result in condensation and collapse of vapor bubbles 275 within the mixed flow 50, thereby reducing the void fraction of the coolant 50 flow delivered to the reservoir 200 and, in turn, reducing the likelihood of vapor bubbles being delivered to the pump 20.

In some examples, as shown in FIG. 12E, the internal bypass 65 in the heat sink module can include a valve 60. The valve 60 can be disposed at least partially within the internal bypass 65 and can serve to restrict flow through the internal bypass 65, thereby controlling the proportion of coolant flow through the internal bypass, and as a result, the proportion of coolant flow through the plurality of orifices 155 along a standard flow path 66 through the heat sink module. The internal valve 60 can be an active or passive regulator. In some examples, the valve can be a thermostatic valve that increases flow through the internal bypass 65 as the temperature of the coolant increases or decreases. In other examples, the valve 60 can be computer controlled valve where flow is adjusted based on a temperature and/or a pressure of the coolant upstream or downstream of the heat sink module 100. In other examples, the valve 60 can be a simple flow constriction (e.g. a physical neck) in the internal bypass that effectively restricts flow by providing flow resistance.

Flow-Guiding Lip

The heat sink module 100 can include a flow-guiding lip 162, as shown in FIG. 30. The flow-guiding lip 162 can guide a directional flow 51 of coolant from the outlet chamber 150 to the outlet passage 166. Preferably, the flow-guiding lip 162 can have an angle of less than about 45 or less than about 30 degrees with respect to the surface to be cooled 12 to avoid creating a flow restriction or stagnation region proximate the exit of the outlet chamber 150. By avoiding formation of a stagnation region, the flow-guiding lip 162 can prevent onset of critical heat flux near the exit of the outlet chamber 150.

Heat Sink Assembly

FIG. 7 shows a heat sink assembly including a heat sink module 100 fluidly connected to two sections of flexible tubing 225. The heat sink module 100 has an inlet port 105 and an outlet port 110. One end of the first section of flexible tubing 225 is fluidly connected to the inlet port 105 by a first connector 120, and one end of the second section of flexible tubing 225 is fluidly connected to the outlet port 110 by a second connector 120. In some examples, the connectors 120 can be liquid-tight fittings, such as compression fittings.

The heat sink assembly can be used to cool any heat generating surface associated with a device, such as an electrical or mechanical device.

Series-Connected Heat Sink Modules

FIG. 14A shows a schematic of a cooling apparatus 1 having three heat sink modules 100 arranged in a series configuration on three surfaces to be cooled 12. As shown by way of example in FIG. 15, the three heat sink modules 100 can be fluidly connected with tubing, such as flexible tubing 225. The three surfaces to be cooled 12 can be three separate surfaces to be cooled or can be three different locations on the same surface to be cooled 12.

FIG. 15 shows a portion of a primary cooling loop 300 of a cooling apparatus 1 where the cooling loop 300 includes three series-connected heat sink modules 100 mounted on three heat-providing surfaces 12 (see, e.g. FIG. 14A). The heat sink module 100 can be connected by sections of flexible tubing 225. A single-phase liquid coolant 50 can be provided to a first heat sink module 100 by a section of tubing 225-0, and due to heat transfer occurring within the first heat sink module 100-1 (i.e. heat being transferred from the first heat-generating surface 12 to the flow of coolant), two-phase bubbly flow can be generated and transported in a first section of flexible tubing 225-1 extending from the first heat sink module 100-1 to the second heat sink module 100-2. The two-phase bubbly flow contains a plurality of bubbles 275 having a first number density. Due to heat transfer occurring within the second heat sink module 100-2 (i.e. heat being transferred from the second heat-generating surface 12 to the flow of coolant), higher quality (x) two-phase bubbly flow can be generated and transported from the second module 100-2 to the third heat sink module 100-3 through a second section of flexible tubing 225-2. In the second section of flexible tubing 225, the two-phase bubbly flow contains a plurality of bubbles 275 having a second number density, where the second number density is higher than the first number density. Due to heat transfer occurring within the third heat sink module 100 (i.e. heat being transferred from the third heat-generating surface 12 to the flow of coolant), even higher quality (x) two-phase bubbly flow can be generated and transported out of the third heat sink module 100-3 through a third section of tubing 225-3. In the third section of tubing 225-3, the two-phase bubbly flow contains a plurality of bubbles 275 having a third number density, where the third number density is higher than the second number density.

FIG. 14B shows a representation of coolant flowing through three heat sink modules (100-1, 100-2, 100-3) connected in series by four lengths of tubing (225-1, 225-2, 225-3, 225-4), similar to the configurations shown in FIGS. 14A and 15. FIG. 14B also shows corresponding plots of saturation temperature ($T_{sat}$), liquid coolant temperature ($T_{liquid}$), pressure (P), and quality (x) of the coolant versus distance along a flow path through the series-connected heat sink modules. In the example, a flow 51 of single-phase liquid coolant 50 enters the first heat sink module 100-1 through a first section of tubing 225-1 at a temperature that is slightly below the saturation temperature of the liquid coolant 50. Within the first heat sink module 100-1, the single-phase liquid coolant 50 is projected against a first surface to be cooled 12-1 by way of a plurality of jet streams 16 of coolant. A first portion of the liquid coolant 50 changes phase and becomes vapor bubbles 275 dispersed in the liquid coolant 50, thereby producing two-phase bubbly flow having a first quality ($x_1$). The two-phase bubbly flow having the first quality is transported from the first heat sink module 100-1 to a second heat sink module 100-2 by a second section of tubing 225-2. Within the second heat sink module 100-2, the two-phase bubbly flow having a first quality is projected against a second surface to be cooled 12-2 by way of a plurality of jet streams 16 of coolant. A second portion of the liquid coolant 50 changes phase and becomes vapor bubbles 275 dispersed in the liquid coolant 50, thereby producing two-phase bubbly flow having a second quality ($x_2$) that is greater than the first quality (i.e. $x_2 > x_1$). The two-phase bubbly flow having the second quality is transported from the second heat sink module 100-2 to a third heat sink module 100-3 by a third section of tubing 225-3. Within the third heat sink module 100-3, the two-phase bubbly flow having a second quality is projected against a third surface to be cooled 12-3 by way of a plurality of jet streams 16 of coolant. A third portion of the liquid coolant 50 changes phase and becomes vapor bubbles 275 dispersed in the liquid coolant 50, thereby producing two-phase bubbly flow having a third quality ($x_3$) that is greater than the second quality (i.e. $x_3 > x_2$). As shown in FIG. 14B, along the distance of the flow path, quality of the coolant increases, pressure decreases, liquid coolant temperature ($T_{liquid}$) decreases, and $T_{sat}$ decreases through successive series-connected heat sink modules.

Through each successive heat sink module 100, the flow of coolant 51 experiences a pressure drop, as shown in FIG. 14B. In some examples, the pressure drop across each heat sink module 100 can be about 0.5-5.0, 0.5-3, 1-3, or 1.5 psi. The pressure drop across each heat sink module 100 causes a corresponding decrease in saturation temperature (Tsat) of the coolant. Accordingly, the temperature of the liquid coolant component of the two-phase bubbly flow also decreases in response to decreasing saturation temperature at each pressure drop at each module. Consequently, the third heat sink module 100-3 receives two-phase bubbly flow containing liquid coolant 50 that is cooler than liquid coolant 50 in the two-phase bubbly flow received by the second heat sink module 100-2. As a result of this phenomenon, the cooling apparatus 1 is able to maintain the third surface to be cooled 12-3 at a temperature below the temperature of a second surface to be cooled 12-2 when the second and third surfaces to be cooled have equal heat fluxes. Because of this behavior, additional series connected heat sink modules 100 can be added to the series configuration. In some examples four, six, or eight or more heat sink modules 100 can be connected in series with each successive module receiving two-phase bubbly flow containing liquid coolant 50 that is slightly cooler than the liquid coolant received by the previous module connected in series. The only limitation on the number of series-connected modules that can be used a threshold quality (x) value, which if exceeded, could result in unstable flow. However, if the cooling system 1 is on the verge of exceeding the threshold quality (x) value, the coolant flow rate can be increased to decrease the flow quality.

HFE-7000 can be used as coolant 50 in the cooling apparatus 1. HFE-7000 has a boiling temperature of about 34 degrees Celsius at a pressure of 1 atm. In the example shown in FIGS. 14A, 14B, and 15, HFE-7000 can be introduced to the series configuration as single-phase liquid coolant at a pressure of about 1 atmosphere and a temperature slightly below 34 degrees Celsius. A flow rate of about 0.1-10, 0.2-5, 0.3-2.5, 0.6-1.2, or 0.8-1.1 liters per minute of single-phase coolant can be provided. As the coolant flows through the first, second, and third heat sink modules, the coolant may experience a total pressure drop of about 5-10, 8-12, or 10-15 psi. At each heat sink module, the coolant may experience a pressure drop of about 0.5-5.0, 0.5-3, 1-3, or 1.5 psi. As shown in FIG. 14B, a drop in saturation temperature accompanies each pressure drop, and a drop in liquid temperature follows each decrease in saturation temperature. Consequently, the temperature of the liquid component 50 of the two-phase bubbly flow continues to decrease through the series connection and exits the third heat sink module 100-3 at a temperature below 34 degrees Celsius, where the temperature depends on pressure and quality of the exiting flow 51. In this example, through the first heat sink module 100-1, heat transfer occurs via sensible and latent heating of the coolant, and through the second and third heat sink modules (100-2, 100-3), heat transfer occurs primarily by latent heating of the coolant.

In competing pumped liquid cooling systems, such as those that use pumped single-phase water as a coolant, the coolant becomes progressively warmer (due to sensible heating) as it passes through each successive series-connected heat sink module. For this reason, competing single-phase cooling systems typically cannot support more than two series connected heat sink modules, because the coolant temperature at the outlet of the second heat sink module is too hot to properly cool a third heat sink module. Where competing pumped liquid cooling systems include multiple series-connected heat sink modules, the cooling system is unable to maintain sensitive devices, such as microprocessors, at uniform temperatures, and the last device in series may experience sub-optimal performance or premature failure in response to operating at elevated temperatures.

FIG. 14C shows a representation of coolant flowing through three heat sink modules (100-1, 100-2, 100-3) connected in series by lengths of tubing (225-1, 225-2, 225-3, 225-4), similar to FIG. 14B, except that the coolant does not reach its saturation temperature until the second heat sink module 100-2. Consequently, single-phase liquid coolant 50 flows through the first heat sink module 100-1 (where no vapor is formed) and travels to the second heat-sink module 100-2 at an elevated temperature due to sensible heating. Within the second heat sink-module 100-2, a pressure drop occurs, as does a corresponding drop in saturation temperature. Heat transfer from the second surface to be cooled 12-2 to the single-phase liquid coolant 50 causes a portion of the coolant to vaporize. Consequently, heat transfer within the second heat sink module 100-2 can be a combination of latent heating and sensible heating. Two-phase bubbly flow can then be transported from the second heat sink module 100-2 to the third heat sink module 100-3 in a third section of tubing 225-3. Within the third heat sink module 100-3, since the temperature of the liquid component 50 of the coolant is at or nearly at its saturation temperature, heat transfer may occur primarily by latent heating, as evidenced by an increase in quality (x), as shown in FIG. 14C.

The method shown in FIG. 14C can be less efficient than the method shown in FIG. 14B, since it does not employ latent heating within the first heat sink module 100-1 and may therefore require higher flow rates and more pump work to adequately cool the first surface to be cooled 12-1. However, the method in FIG. 14C can be easier to achieve and maintain, since the temperature of the incoming single-phase liquid coolant 50 does not need to be controlled as carefully as the method shown in FIG. 14B (e.g. with respect to providing a temperature that is slightly below the saturation temperature). In some examples, an operating method can alternate between the methods shown in FIGS. 14B and 14C depending on the temperature of the incoming single-phase coolant 50. For instance, where the system is undergoing transient operation, due to changing heat loads or changing chiller loop conditions, the operating method can alternate from the method shown in FIG. 14B to the method shown in FIG. 14C for safety until the transient condition subsides. Once the transient condition is over, the microcontroller 850 of the cooling apparatus 1 can begin to ramp up the temperature of the incoming single-phase liquid coolant 50 to a temperature that is slightly below its saturation temperature. By employing this control strategy, the cooling system 1 can avoid instabilities caused by excess vapor formation during transient conditions. One strategy for decreasing the temperature of the incoming single-phase liquid coolant 50 can include increasing the flow rate through the heat exchanger 40 to reduce the temperature of the coolant in the reservoir 200, which is then delivered to the series-configuration by the pump 20.

In one example, a method of cooling two or more processors 415 of a server 400 can include providing a cooling apparatus 1 having two or more series-connected heat sink modules 100, as shown in FIG. 15, and in FIGS. 14A, 14B, 14C, 16, 74, and 78-80. The method can include providing a flow 51 of dielectric single-phase liquid coolant 50 to an inlet port 105 of a first heat sink module 100-1 in thermal communication with a first processor 415 of a server 400. A first amount of heat can be transferred from the first processor (12, 415) to the dielectric single-phase liquid coolant 50 resulting in vaporization of a portion of the dielectric single-phase liquid coolant thereby changing the flow of dielectric single-phase liquid coolant to two-phase bubbly flow made of dielectric liquid coolant with dielectric vapor coolant dispersed as bubbles 275 in the dielectric liquid coolant 50. Consequently, heat from the processor 415 is absorbed to the coolant across the coolant's heat of vaporization, which is a far more efficient method for absorbing heat. For a dielectric coolant, such as NOVEC 7000, the latent heat of vaporization is 142,000 J/kg, whereas the specific heat for sensible warming the coolant is only 1,300 J/(kg-K). Therefore, by vaporizing a portion of the liquid coolant 50 within the heat sink module 100-1, that portion of coolant is able to absorb significantly more heat (on an order of 100 times more heat) from the processor (12, 415) than if the liquid coolant 50 were simply warmed inside the heat sink module 100-1 by one or two degrees without experiencing any vaporization. The two-phase bubbly flow that is formed within the first heat sink module 100-1 can have a first quality ($x_1$). The method can include transporting the two-phase bubbly flow from an outlet port 110 of the first heat sink module 100 to an inlet port 105 of a second heat sink module 100-2 connected in series with the first heat sink module 100-1. The second heat sink module 100-2 can be in thermal communication with a second processor (12, 415) of the server 400. A second amount of heat can be transferred from the second processor (12, 415) to the two-phase bubbly flow resulting in vaporization of a portion of the dielectric liquid coolant within the two-phase bubbly flow thereby resulting in a change from the first quality ($x_1$) to a second quality ($x_2$). The second quality ($x_2$) can be greater than the first quality ($x_1$). The first quality ($x_1$) can be about 0-0.1, 0.05-0.15, 0.1-0.2, 0.15-0.25, 0.2-0.3, 0.25-0.35, 0.3-0.4, 0.35-0.45, 0.4-0.5, 0.45-0.55, and the second quality ($x_2$) can be about 0-0.1, 0.05-0.15, 0.1-0.2, 0.15-0.25, 0.2-0.3, 0.25-0.35, 0.3-0.4, or 0.4-0.45 greater than the first quality.

Energy from the first amount of heat and the second amount of heat can be stored, at least in part, as latent heat in the two-phase bubbly flow and transported out of the server through a flexible cooling line. The liquid coolant in the two-phase bubbly flow 51 that is transported between the first heat sink module 100-1 and the second heat sink module 100-2 can have a temperature at or slightly below its saturation temperature. The pressure of the two-phase bubbly flow can be about 0.5-5.0, 0.5-3, or 1-3 psi less than the predetermined pressure of the flow of dielectric single-phase liquid coolant provided to the inlet port of the first heat sink module, as shown in the pressure versus distance plots of FIGS. 14B and 14C.

A saturation temperature of the two-phase flow 51 having the second quality ($x_2$) can be less than a saturation temperature of the two-phase flow having the first quality ($x_1$), thereby allowing the second processor (12, 415) to remain at a slightly lower temperature than the first processor (12, 415) when a first heat flux from the first processor is approximately equal to a second heat flux from the second processor, as shown in the temperature versus distance plots of FIGS. 14B and 14C. Providing the flow 51 of dielectric single-phase liquid coolant to the inlet port 105 of the first heat sink module 100-1 can include providing a flow rate of about 0.1-10, 0.2-5, 0.3-2.5, 0.6-1.2, or 0.8-1.1 liters per minute of dielectric single-phase liquid coolant to the first inlet port of the first heat sink module. The flow of single-phase liquid coolant can have a boiling point of about 15-35, 20-45, 30-55, or 40-65 degrees C. determined at a pressure of 1 atm. The dielectric coolant can be a hydrofluoroether, a hydrofluorocarbon, or a combination thereof. Providing the flow of dielectric single-phase liquid coolant to the first heat sink module 100-1 can include providing the flow 51 of dielectric single-phase liquid coolant at a predetermined temperature and a predetermined pressure, where the predetermined temperature is slightly below the saturation temperature ($T_{sat}$) of the flow of dielectric single-phase liquid coolant at the predetermined pressure. The predetermined temperature can about 0.5-20, 0.5-15, 0.5-10, 0.5-7, 0.5-5, 0.5-3, 0.5-1, 1-20, 1-15, 1-10, 1-7, 1-5, 1-3, 3-20, 3-15, 3-10, 3-7, 3-5, 5-20, 5-15, 5-10, 5-7, 7-20, 7-15, 7-10, 10-20, 10-15, or 15-20 degrees C. below the saturation temperature ($T_{sat}$) of the flow of dielectric single-phase liquid coolant at the predetermined pressure.

The method can include providing a pressure differential of about 0.5-5.0, 0.5-3, or 1-3 psi between the inlet port 105 of the first heat sink module 100-1 and the outlet port 110 of the first heat sink module. The pressure differential can be suitable to promote the flow 51 of coolant to advance from the inlet port 105 of the first heat sink module 100-1 to the outlet port 110 of the first heat sink module. The method can include transporting the two-phase bubbly flow 51 from an outlet port 110 of the second heat sink module 100-2 to an inlet port of a third heat sink module 100-3 connected in series with the first and second heat sink modules. The third heat sink module 100-3 can be in thermal communication with a third processor (12, 415) of the server 400. A third amount of heat can be transferred from the third processor (12, 415) to the two-phase bubbly flow 51 resulting in vaporization of a portion of the dielectric liquid coolant 50 within the two-phase bubbly flow thereby resulting in a change from the second quality ($x_2$) to a third quality ($x_3$). The third quality ($x_3$) can be greater than the second quality ($x_2$).

In another example, a method of cooling two or more processors 415 in an electronic device can include providing a cooling apparatus 1 with two or more fluidly connected heat sink modules arranged in a series configuration, as shown in FIG. 15. The method can include providing a flow 51 of dielectric single-phase liquid coolant to a first heat sink module 100-1. The first heat sink module 100-1 can include a first thermally conductive base member 430 in thermal communication with a first processor 415 in an electronic device. The dielectric single-phase liquid coolant can have a predetermined pressure and a predetermined temperature at a first inlet 105 of the first heat sink module 100-1. The predetermined temperature can be slightly below a saturation temperature ($T_{sat}$) of the dielectric single-phase liquid coolant at the predetermined pressure. The method can include projecting the flow of dielectric single-phase liquid coolant against the thermally conductive member (e.g. in the form of impinging jet streams 16 of coolant) within the first heat sink module 100-1. A first amount of heat can be transferred from the processor 415 through the thermally conductive base member 430 and to the flow 51 of dielectric single-phase liquid coolant thereby inducing phase change in a portion of the flow of dielectric single-phase liquid coolant and thereby changing the flow of dielectric single-phase liquid coolant to two-phase bubbly flow having a dielectric liquid coolant 50 and a plurality of vapor bubbles 275 dispersed in the dielectric liquid coolant. Consequently, heat from the processor 415 is absorbed to the coolant 50 across the coolant's heat of vaporization, which is a far more efficient method for absorbing heat. For a dielectric coolant, such as NOVEC 7000, the latent heat of vaporization is 142,000 J/kg, whereas the specific heat for sensible warming the coolant is only 1,300 J/(kg-K). Therefore, by vaporizing a portion of the liquid coolant 50 within the heat sink module 100-1, that portion of coolant is able to absorb significantly more heat (on an order of 100 times more heat) from the processor 415 than if the liquid coolant 50 were simply warmed inside the heat sink module 100-1 by one or two degrees without experiencing any vaporization. The plurality of vapor bubbles 275 in the two-phase bubbly flow can have a first number density.

The method can include providing a second heat sink module 100-2 having a second thermally conductive base member 430 in thermal communication with a second processor 415. The second heat sink module 100-2 can have a second inlet 105. The method can include providing a first section of tubing 225-1 having a first end connected to the first outlet 110 of the first heat sink module 100-1 and a second end connected to the second inlet 105 of the second heat sink module 100-2. The first section of tubing 225-1 can transport the two-phase bubbly flow 51 having the first number density from the first outlet 105 of the first heat sink module 100-1 to the second inlet 110 of the second heat sink module 100-2. The method can include projecting the two-phase bubbly flow having the first number density against the second thermally conductive base member (e.g. in the form of impinging jet streams 16 of coolant) within the second heat sink module 100-2. A second amount of heat can be transferred from the second processor 415 through the second thermally conductive base member 430 and to the two-phase bubbly flow having a first number density thereby changing two-phase bubbly flow having a first number density to a two-phase bubbly flow having a second number density greater than the first number density.

A saturation temperature ($T_{sat}$) and pressure of the two-phase flow having a second number density can be less than a saturation temperature and pressure of the two-phase flow having a first number density, thereby allowing the second processor 415 to be maintained at a slightly lower temperature than the first processor when a first heat flux from the first processor is approximately equal to a second heat flux from the second processor, as shown in the temperature versus distance plots of FIGS. 14b and 14C. The predetermined temperature of the flow 51 of dielectric single-phase liquid coolant at the first inlet 105 of the first heat sink module 100-1 can be about 0.5-20, 0.5-15, 0.5-10, 0.5-7, 0.5-5, 0.5-3, 0.5-1, 1-20, 1-15, 1-10, 1-7, 1-5, 1-3, 3-20, 3-15, 3-10, 3-7, 3-5, 5-20, 5-15, 5-10, 5-7, 7-20, 7-15, 7-10, 10-20, 10-15, or 15-20 degrees C. below the theoretical saturation temperature ($T_{sat}$) of the flow of dielectric single-phase liquid coolant at the predetermined pressure of the flow of dielectric single-phase liquid coolant at the first inlet 105 of the first heat sink module 100-1. Providing the flow 51 of dielectric single-phase liquid coolant to the inlet of the first heat sink module includes providing a flow rate of about 0.1-10, 0.2-5, 0.3-2.5, 0.6-1.2, or 0.8-1.1 liters per minute of single-phase liquid coolant to the first inlet 105 of the first heat sink module 100-1. The liquid in the two-phase bubbly flow 51 being transported between the first heat sink module 100-1 and the second heat sink module 100-2 can have a temperature at or slightly below its saturation temperature ($T_{sat}$), where a pressure of the two-phase bubbly flow having a first number density can be about 0.5-5.0, 0.5-3, or 1-3 psi less than the predetermined pressure of the flow of single-phase liquid coolant provided to the first heat sink module 100-1.

The electronic device can be a server 400, a personal computer, a tablet computer, a power electronics device, a smartphone, a network switch, a telecommunications system, an automotive electronic control unit, a battery management device, a progressive gaming device for a casino, a high performance computing (HPC) system, a server-based gaming device, an avionics system, or a home automation control unit. The first processor can be a central processing unit (CPU) or a graphics processing unit (GPU). Likewise, the second processor can be a CPU or a GPU.

In yet another example, a method of cooling three or more processors 415 on a motherboard 405 can employ a two-phase cooling apparatus having three or more fluidly-connected and series-connected heat sink modules, as shown in FIG. 15. The method can include providing a flow 51 of dielectric single-phase liquid coolant to an inlet port 105 of a first heat sink module 100-1 mounted on a first thermally conductive base member 430. The first thermally conductive base member 430 can be mounted on a first processor 415 on a motherboard 405, as shown in FIGS. 84-89. Heat can be transferred from the first processor 415 through the first thermally conductive base member 430 and to the flow of dielectric single-phase liquid coolant resulting in boiling of a first portion of the dielectric single-phase liquid coolant, thereby changing the flow of dielectric single-phase liquid coolant to two-phase bubbly flow having a first quality, as shown in FIG. 99. Consequently, heat from the first processor 415 is absorbed to the coolant across the coolant's heat of vaporization, which is a far more efficient method for absorbing heat than sensible heating. For a dielectric coolant, such as NOVEC 7000, the latent heat of vaporization is 142,000 J/kg, whereas the specific heat for sensible warming the coolant is only 1,300 J/(kg-K). Therefore, by vaporizing a portion of the liquid coolant 50 within the heat sink module 100-1, that portion of coolant is able to absorb significantly more heat (on an order of 100 times more heat) from the processor 415 than if the liquid coolant 50 were simply warmed inside the heat sink module 100-1 by one or two degrees without experiencing any vaporization.

The method can include transporting the two-phase bubbly flow 51 from an outlet port of 110 the first heat sink module 100-1 to an inlet port 105 of a second heat sink module 100-2 through a first section of flexible tubing 225-1, as shown in FIG. 99. The second heat sink module 100-2 can be mounted on a second thermally conductive base member 430. The second thermally conductive base member 430 can be mounted on a second processor 415 on the motherboard 405. Heat can be transferred from the second processor 415 through the second thermally conductive base member 430 and to the two-phase bubbly flow 51 resulting in vaporization of a portion of dielectric liquid coolant 50 within the two-phase bubbly flow, thereby resulting in a change from the first quality ($x_1$) to a second quality ($x_2$), where the second quality is higher than the first quality. The method can include transporting the two-phase bubbly flow 51 from an outlet port 110 of the second heat sink module 100-2 to an inlet port 105 of a third heat sink module 100-3 through a second section of flexible tubing 225-2. The third heat sink module 100-3 can be mounted on a third thermally conductive base member 430. The third thermally conductive base member 430 can be mounted on a third processor 415 on the motherboard 405. Heat can be transferred from the third processor 415 through the third thermally conductive base member 430 and to the two-phase bubbly flow 51 resulting in vaporization of a portion of dielectric liquid coolant within the two-phase bubbly flow, thereby resulting in a change from the second quality ($x_2$) to a third quality ($x_3$), where the third quality is higher than the second quality. The motherboard 405 can be associated with a server 400, a personal computer, a tablet computer, a power electronics device, a smartphone, an automotive electronic control unit, a battery management device, a high performance computing system, a progressive gaming device, a server-based gaming device, a telecommunications system, an avionics system, or a home automation control unit.

In one example, a method of cooling two or more processors 415 of a server 400 can involve absorbing sensible heat and latent heat in coolant 50 flowing through two or more series-connected heat sink modules 100. The method can include providing a flow 51 of subcooled single-phase liquid coolant to an inlet 105 of a first heat sink module 100-1 in thermal communication with a first processor 415 of a server 400, as shown in FIG. 98. The subcooled single-phase liquid coolant can absorb a first amount of heat from the first processor 415 as sensible heat. The method can include transporting the flow 51 of subcooled single-phase liquid coolant from an outlet 110 of the first heat sink module 100-1 to an inlet 105 of a second heat sink module 100-2 in thermal communication with a second processor 415 of the server 400. The subcooled single-phase liquid can absorb a second amount of heat from the second processor 415 as sensible heat resulting in the flow of subcooled single-phase liquid coolant reaching its saturation temperature and becoming a flow of saturated single-phase liquid coolant. The flow of saturated single-phase liquid coolant can absorb a third amount of heat from the second processor as latent heat resulting in vaporization of a first portion of the flow of saturated single-phase liquid coolant thereby changing the flow of saturated single-phase liquid coolant to two-phase bubbly flow including saturated liquid coolant 50 with vapor coolant dispersed as bubbles 275 in the saturated liquid coolant, as shown in FIG. 98.

The method can include transporting the flow 51 of two-phase bubbly flow containing the first amount of heat, the second amount of heat, and the third amount of heat out of the server through a flexible cooling line 303, as shown in FIG. 98. The method can include rejecting the first amount of heat, the second amount of heat, and the third amount of heat from the flow of two-phase bubbly flow by directing the flow of two-phase bubbly flow through a heat exchanger 40 fluidly connected to an external heat rejection loop 43. The external heat rejection loop 43 can then reject the first, second, and third amounts of heat to a chilled water supply or to ambient air outside of a data center facility 425 where the server 400 is located.

The method can include projecting the flow 51 of subcooled single-phase liquid coolant 50, in the form of impinging jet streams 16, against a first surface to be cooled 12 within the first heat sink module 100-1, as shown in FIGS. 26 and 27. Similarly, the method can include projecting the flow 51 of subcooled single-phase liquid coolant 50, in the form of impinging jet streams 16, against a second surface to be cooled 12 within the second heat sink module 100-2.

Providing the flow of subcooled single-phase liquid coolant to the inlet 105 of the first heat sink module 100-1 can include providing a flow rate of about 0.1-10, 0.2-5, 0.3-2.5, 0.6-1.2, or 0.8-1.1 liters per minute of subcooled single-phase liquid coolant to the first inlet 105 of the first heat sink module 100-1. Providing the flow 51 of subcooled single-phase liquid coolant 50 to the inlet 105 of the first heat sink module 100-1 can include providing a subcooled single-phase liquid coolant with a boiling point of about 15-35, 20-45, 30-55, or 40-65 degrees C. determined at a pressure of 1 atm. Providing the flow 51 of subcooled single-phase liquid coolant to the inlet 105 of the first heat sink module 100-1 can include providing a dielectric coolant 50 including a hydrofluoroether, a hydrofluorocarbon, or a combination thereof. Providing the flow 51 of subcooled single-phase liquid coolant 50 to the first heat sink module 100-1 can include providing a flow 51 of subcooled single-phase liquid coolant at a predetermined temperature and a predetermined pressure. The predetermined temperature can be below the saturation temperature of the flow of subcooled single-phase liquid coolant at the predetermined pressure. The predetermined temperature can be about 0.5-20, 0.5-15, 0.5-10, 0.5-7, 0.5-5, 0.5-3, 0.5-1, 1-20, 1-15, 1-10, 1-7, 1-5, 1-3, 3-20, 3-15, 3-10, 3-7, 3-5, 5-20, 5-15, 5-10, 5-7, 7-20, 7-15, 7-10, 10-20, 10-15, or 15-20 degrees C. below the saturation temperature of the flow of subcooled single-phase liquid coolant at the predetermined pressure. The method can include providing a pressure differential of about 0.5-5.0, 0.5-3, or 1-3 psi between the inlet 105 of the first heat sink module 100-1 and the outlet 110 of the first heat sink module. The pressure differential can be suitable to promote the flow 51 of subcooled single-phase liquid coolant to advance from the inlet 105 of the first heat sink module 100-1 to the outlet 110 of the first heat sink module.

The method can include transporting the two-phase bubbly flow having a first quality ($x_1$) from an outlet 110 of the second heat sink module 100-2 to an inlet 105 of a third heat sink module 100-3 connected in series with the first and second heat sink modules. The third heat sink module 100-3 can be in thermal communication with a third processor 415 of the server 400. The two-phase bubbly flow having the first quality ($x_1$) can absorb a fourth amount of heat from the third processor 415 as latent heat resulting in vaporization of a second portion of the saturated single-phase liquid coolant thereby changing the flow from two-phase bubbly flow with a first quality to two-phase bubbly flow with a second quality ($x_2$) greater than the first quality.

The method can include directing the flow 51 of subcooled single-phase liquid coolant 50 through one or more series-connected heat sink modules prior to providing the flow of subcooled single-phase liquid coolant to the inlet 105 of the first heat sink module 100-1. This arrangement can allow the coolant 50 to absorb sensible heat as it flows through the one or more heat sink modules 100 before reaching the first heat sink module 100-1. The one or more heat sink modules 100 can effectively serve as preheaters, thereby allowing the cooling apparatus 1 to achieve vaporization in subsequent heat sink modules in the series connection without requiring sophisticated temperature control system to deliver the coolant at a specific number of degrees below its saturation temperature. This allows the range of suitable temperatures for coolant stored in the reservoir 200 to be wider than if vaporization were required within the first heat sink module. This arrangement can allow a lower cost and potentially more reliable control system to be used, which can be desirable in many applications.

In another example, a method of absorbing heat from two or more processors 415 in an electronic device can involve flowing coolant 50 through two or more fluidly connected heat sink modules 100 arranged in a series configuration. The method can include providing a flow 51 of subcooled single-phase liquid coolant 50 to a first heat sink module 100-1, as shown in FIG. 98. The first heat sink module 100-1 can include a first thermally conductive base member 430 in thermal communication with a first processor in an electronic device. The subcooled single-phase liquid coolant 50 can have a predetermined pressure and a predetermined temperature at a first inlet 105 of the first heat sink module 100-1. The predetermined temperature can be below a saturation temperature of the subcooled single-phase liquid coolant at the predetermined pressure. The method can include projecting the flow 51 of subcooled single-phase liquid coolant 50 against the thermally conductive base member 430 within the first heat sink module 100-1. The flow of subcooled single-phase liquid coolant can absorb a first amount of heat from the first processor 415 through the thermally conductive base member 430 as sensible heat. Despite absorbing the first amount of heat, the flow can remain subcooled single-phase liquid coolant 50 at a temperature below the coolant's saturation temperature. The method can include providing a second heat sink module 100-2 including a second thermally conductive base member 430 in thermal communication with a second processor 415. The second heat sink module 100-2 can include a second inlet 105. The method can include providing a first section of tubing 225 having a first end connected to the first outlet 110 of the first heat sink module 100-1 and a second end connected to the second inlet 105 of the second heat sink module 100-2, as shown in FIG. 98. The method can include transporting through the first section of tubing 225 the flow of subcooled single-phase liquid coolant from the first outlet 110 of the first heat sink module 100-1 to the second inlet 105 of the second heat sink module 100-2. The method can include projecting the flow 51 of subcooled single-phase liquid coolant 50 against the second thermally conductive base member 430 within the second heat sink module 100-2. The subcooled single-phase liquid coolant can absorb a second amount of heat from the second processor 415 through the second thermally conductive base member 430 as sensible heat resulting in the subcooled single-phase liquid coolant reaching its saturation temperature and becoming saturated single-phase liquid coolant. The saturated single-phase liquid coolant can absorb a third amount of heat from the second processor 415 through the second thermally conductive base member 430 as latent heat resulting in vaporization of a first portion of the saturated single-phase liquid coolant thereby changing the flow 51 of saturated single-phase liquid coolant to two-phase bubbly flow comprising saturated liquid coolant with vapor coolant dispersed as bubbles 275 in the saturated liquid coolant 50.

The method can include directing the flow 51 of subcooled single-phase liquid coolant through one or more series-connected heat sink modules 100 prior to providing the flow of subcooled single-phase liquid coolant to the inlet 105 of the first heat sink module 100-1. The method can include transporting the flow 51 of two-phase bubbly flow containing the first amount of heat, the second amount of heat, and the third amount of heat out of the electronic device through a flexible cooling line 225 where it can be rejected to an external heat rejection loop 43. Providing a first section of tubing 225 can include providing a section of flexible tubing having a minimum bend radius of less than 3, 2.5, or 2 inches to permit routing within the electronic device. Likewise, providing a flexible cooling line 303 can include providing a flexible cooling line having a minimum bend radius of less than 3, 2.5, or 2 inches to permit routing within the electronic device.

The electronic device can be a server 400, a personal computer, a tablet computer, a power electronics device, a smartphone, an automotive electronic control unit, a battery management device, a progressive gaming device, a telecommunications system, a high performance computing system, a server-based gaming device, an avionics system, or a home automation control unit. The first processor 415 can be a central processing unit (CPU) or a graphics processing unit (GPU). Likewise, the second processor 415 can be a CPU or GPU.

In yet another example, a method of absorbing heat from two or more devices can involve using a two-phase cooling apparatus configured to pump low-pressure coolant 50 through two or more fluidly-connected and series-connected heat sink modules 100. The method can include providing a flow 51 of subcooled single-phase liquid coolant 50 to an inlet 105 of a first heat sink module 100-1 in thermal communication with a first device. The flow 51 of subcooled single-phase liquid coolant 50 can absorb a first amount of heat from the first device as sensible heat within the first heat sink module 100-1. The method can include transporting the flow 51 of subcooled single-phase liquid coolant 50 from an outlet 110 of the first heat sink module 100-1 to an inlet 110 of a second heat sink module 100-2. The flow 51 of subcooled single-phase liquid coolant 50 absorbs a second amount of heat from the second device partially as sensible heat and partially as latent heat within the second heat sink module 100-2. As a result, the flow 51 of subcooled single-phase liquid coolant can become two-phase bubbly flow having saturated liquid coolant with vapor bubbles 275 of coolant dispersed in the saturated liquid coolant. The method can include transporting the two-phase bubbly flow including the first amount of heat and the second amount of heat away from the first and second devices. The first and second amounts of heat can be rejected to an external heat rejection loop 43 by directing the two-phase bubbly flow through a heat exchanger 40 in thermal communication with the external heat rejection loop 43.

FIG. 113 shows a quick-connect cooling line assembly 303 for a cooling apparatus 1. The cooling line assembly 303 includes three heat sink modules 100 fluidly connected in series by sections of flexible tubing 225. Specifically, a first inlet section of flexible tubing 225-0 has a first end connected to a first quick-connect fitting 235-1, similar to the female fitting shown in FIG. 107, and a second end of the inlet section of flexible tubing 225-0 can be connected to an inlet port 105 of a first heat sink module 100-1. A first section of flexible tubing 225-1 fluidly connects an outlet port 110 of the first heat sink module 100-1 to an inlet port 105 of a second heat sink module 100-2. Similarly, a second section of flexible tubing 225-2 fluidly connects an outlet port 105 of the second heat sink module 100-2 to an inlet port of a third heat sink module 100-3. An outlet section of flexible tubing 225-3 fluidly connects an outlet port 110 of the third heat sink module 100-3 to a second quick-connect fitting 235-2, similar to the female fitting show in FIG. 107. The quick-connect fittings 235 can allow the cooling line assembly 303 to be rapidly connected to or disconnected the manifold assemblies 680 shown in FIG. 100 or 106 or any other suitable manifold assemblies with mating quick-connect fittings 235. The quick-connect fittings 235 allow a server 400 to which the heat sink modules 100 are mounted to be hot-swapped (i.e. rapidly connected to or disconnected from a manifold assembly 680 of an operating cooling apparatus 1). Although three heat sink modules are shown in FIG. 113, this is not limiting. The cooling line assembly 303 can include one, two, three, four, five, six, or more than six heat sink modules 100 fluidly connected in series. The number of heat sink modules can be selected based upon, among other factors, the number of surfaces to be cooled 12, the heat load of the surfaces to be cooled, and the heat removal capacity of the cooling system 1.

FIG. 114 shows a quick-connect cooling line assembly 303 for a cooling apparatus 1. The cooling line assembly 303 includes three heat sink modules 100 fluidly connected in series by sections of flexible tubing 225. Specifically, a first inlet section of flexible tubing 225-0 has a first end connected to a first quick-connect fitting 235-1, similar to the male fitting shown in FIG. 110, and a second end of the inlet section of flexible tubing 225-0 can be connected to an inlet port 105 of a first heat sink module 100-1. A first section of flexible tubing 225-1 fluidly connects an outlet port 110 of the first heat sink module 100-1 to an inlet port 105 of a second heat sink module 100-2. Similarly, a second section of flexible tubing 225-2 fluidly connects an outlet port 105 of the second heat sink module 100-2 to an inlet port 105 of a third heat sink module 100-3. An outlet section of flexible tubing 225-3 fluidly connects an outlet port 110 of the third heat sink module 100-3 to a second quick-connect fitting 235-2, similar to the male fitting show in FIG. 110. The quick-connect fittings 235 can allow the cooling line assembly 303 to be rapidly connected to or disconnected from the manifold assemblies 680 that are shown in FIG. 100 or 106 or any other suitable manifold assemblies with mating quick-connect fittings 235. The quick-connect fittings 235 allow a server 400 to which the heat sink modules 100 are mounted to be hot-swapped (i.e. rapidly connected to or disconnected from a manifold assembly 680 of an operating cooling apparatus 1). Although three heat sink modules are shown in FIG. 114, this is not limiting. The cooling line assembly 303 can include one, two, three, four, five, six, or more than six heat sink modules 100 fluidly connected in series. The number of heat sink modules 100 can be selected based upon, among other factors, the number of surfaces to be cooled 12, the heat load of the surfaces to be cooled, and the heat removal capacity of the cooling system 1.

Parallel-Connected Heat Sink Modules

FIG. 16 shows a schematic of a cooling apparatus 1 having a primary cooling loop 300 that includes three parallel cooling lines where each parallel cooling line includes three heat sink modules 100 fluidly connected in series. The cooling apparatus shown in FIG. 16 can be configured to cool nine independent heat-generating surfaces 12, such as nine microprocessors 415. Other variations of the cooling apparatus 1 shown in FIG. 16 can include more than three parallel cooling lines, and each cooling line can include more than three series-connected modules 100.

As shown in the schematic of FIG. 16, additional heat sink modules 100 can be added to the cooling apparatus 1 in parallel cooling loops 300 that they are serviced by, for example, the same pump 20, reservoir 200, and heat exchanger 40. Alternatively, as shown in FIG. 17, the cooling apparatus 1 can include additional reservoirs 200, pumps 20, and/or heat exchangers 40 in parallel for the purpose of redundancy and reliability. As used herein, an additional component "in parallel" refers to a component in fluid communication with the other components in a manner that bypasses only components of the same type without bypassing different types of components. An example of an additional component added in parallel is shown with the additional heat sink modules 100 in FIG. 16, where three parallel cooling loops 300 are provided that each are serviced by the same reservoir 200 and pump 20.

Mounting Bracket for Heat Sink Module

In some examples, it can be desirable to secure the heat sink module 100 to a device using a mounting bracket 500. For instance, it can be desirable to secure the sink module 100 tightly to a heat-providing surface 12 to reduce thermal resistance and improve heat transfer rates. More specifically, when installing a heat sink module 100 on a microprocessor 415, it can be desirable to use a mounting bracket 500 to secure the heat sink module 100 firmly in place, as shown in FIGS. 84-89. FIG. 84 shows a top perspective view of two series-connected heat sink modules 100 installed on top of microprocessors 415 in a server 400. The mounting bracket 500 can attach to existing mounting holes 406 in the motherboard 405 originally intended for an air-cooled heat sink, as shown in FIG. 84. Threaded fasteners 115 can secure the mounting bracket 500 to the threaded holes 406 in the motherboard 405. When the threaded fasteners 115 are secured in the mounting holes 406, the mounting bracket 500 can contact and apply a clamping force to a top surface 160 of the heat sink module 100, thereby preventing the heat sink module 100 from shifting out of place during use.

The mounting brackets 500 shown in FIG. 84 are suitable for installations where the heat sink modules 100 can be aligned with the microprocessor 415 and where there is ample room to route flexible cooling lines 303 that transport coolant (i.e. working fluid) 50 to and from the heat sink modules. However, in many instances, routing the flexible cooling lines 303 can be difficult due to space constraints. In some installations, greater mounting flexibility may be required. FIG. 85 shows a top view of an S-shaped mounting bracket 500 that can connect to two holes in a motherboard 405 and can permit the heat sink module 100 to be mounted in any suitable orientation, independent of the orientation of the microprocessor 415. By reducing mounting constraints and the number of fasteners required, the S-shaped mounting bracket 500 can allow for much shorter installation times and can alleviate stress on flexible cooling lines 303 and the potential for kinking by reducing the need for tight bend radiuses that may be otherwise be required. Having greater options for orienting the heat sink module 100 can also allow significantly less flexible tubing 225 to be used in an installation, since routing options can be more direct than the configuration shown in FIG. 84 where the heat sink module 100 is aligned with the microprocessor 415.

The S-shaped bracket 500 can include an S-shaped bracket member having a first end and a second end, as shown in FIGS. 86-91. The S-shaped bracket member can include a first curvilinear portion 510 located between the first end and a midpoint. The S-shaped bracket can include a second curvilinear portion 510 located between the midpoint and the second end. The first curvilinear portion can have a radius of curvature of about 1.0-4.0, 1.0-2.5, or 1.5-2.0 inches. Similarly, the second curvilinear portion can have a radius of curvature of about 1.0-4.0, 1.0-2.5, or 1.5-2.0 inches.

The bracket 500 can include a first slot 505 proximate the first end and a second slot 505 proximate a second end. The first and second slots 505 can be elongated openings that allow for imperfect alignment with the mounting holes in the motherboard 405. In some examples, the fasteners 115 that mount the S-shaped bracket 500 to the mounting holes in the motherboard 405 can each include a washer to distribute a clamping load across a larger surface area of the bracket near the first and second slots 505.

In some examples, the first slot 505 can be substantially parallel to the second slot 505. The first slot 505 can have a first midpoint located a first distance from the midpoint of the bracket 500. Similarly, the second slot can have a second midpoint located a second distance from the midpoint of the bracket 500. The first distance and the second distance can be about equal, thereby providing a bracket that is symmetrical so that an installer does not have to be concerned with properly orienting the bracket during assembly.

The S-shaped bracket can provide a larger contact area against the top surface 160 of the heat sink module 100 than a linear mounting bracket, thereby allowing the clamping force to be distributed over a greater percentage of the top surface 160 of the heat sink module 100 and thereby mitigating risks of cracking or crushing the polymer heat sink module 100 during installation if the fasteners are over-tightened.

Single Heat Sink Module for Multiple Heat Sources

To reduce installation costs, it can be desirable to cool more than one heat source 12 using a single heat sink module 100. Example installations are shown in FIGS. 66 and 67. FIG. 66 shows an example of an existing server 400 with a heat sink module retrofitted thereon. The server 400 includes a motherboard 405, two microprocessors 415 mounted on the motherboard, and a finned heat sink 440 mounted on each microprocessor 415. Rather than spend time and effort removing the finned heat sink modules 440 already installed on the microprocessors 415, instead, a thermally conductive base member 430 can be placed in thermal contact with both finned heat sinks 440, as shown in FIG. 66. The thermally conductive base member 430 can extend from a first finned heat sink 440 to a second finned heat sink 440. A heat sink module 100 can be mounted on a surface 12 of the thermally conductive base member 430. By directing a plurality of jet streams 16 of coolant at the surface to be cooled 12 of the thermally conductive base member 430, the configuration shown in FIG. 66 can cool two microprocessors simultaneously at a lower cost than installing two heat sink modules and without having to uninstall any factory-installed components of the server (e.g. the finned heat sinks 440). By not uninstalling factory-installed hardware, this cooling method can avoid potentially voiding a factory warranty on the server 400 or computer.

FIG. 67 shows an arrangement where a thermally conductive base member 430 extends from a first microprocessor 415 to a second microprocessor 415 mounted on a motherboard 405. A heat sink module 100 can be mounted on a surface 12 of the thermally conductive base member 430. By directing a plurality of jet streams 16 of coolant at the surface to be cooled 12 of the thermally conductive base member 430, the configuration shown in FIG. 67 can cool two microprocessors 415 simultaneously at a lower cost than using two heat sink modules. To ensure even cooling of each microprocessor, it can be desirable for the thermally conductive base member 430 to make contact with an entire, or substantially the entire, top surface of each microprocessor, as shown in FIG. 67.

Surface to be Cooled

The surface to be cooled 12 can be exposed within the outlet chamber 150 of the heat sink module 100, such that the jet streams 16 of coolant 50 impinge directly on the surface to be cooled 12 without thermal interference materials disposed between the surface 12 and the coolant 50. As used herein, "surface to be cooled" refers to any electronic or other device having a surface that generates or transfers heat and requires cooling. Non-limiting, examples of surfaces to be cooled 12 include microprocessors 415 (e.g. CPUs, GPUs), batteries (e.g. lithium ion batteries and battery terminals), memory modules 420, LED arrays, diode laser arrays, microelectronic circuit chips in supercomputers, diode laser packages, weapons systems, power electronics, mechanical components, process containers, or any electronic circuits or devices requiring cooling. The surface to be cooled 12 can be exposed within the outlet chamber 150 of the heat sink module 100 by constructing the outlet chamber to include the surface 12 within the chamber 150 or by constructing the outlet chamber such that the surface to be cooled 12 serves as a bounding wall of the outlet chamber 150, as shown in FIG. 26. In some examples, the heat sink module 100 can form an enclosure, such as a sealed liquid-tight enclosure, against the surface to be cooled 12 using one or more sealing members (e.g. o-rings, gaskets, or adhesives). In some examples, the heat sink module 100 can be permanently or semi-permanently to the surface to be cooled 12. For instance, to provide direct-to-silicon cooling of a microprocessor 415, a microprocessor lid can be removed and replaced with an appropriately-sized heat sink module to provide jet streams 16 of coolant 50 directly against the silicon surface of the microprocessor. Removing the lid of the microprocessor 415 can significantly reduce the thermal resistance associated with cooling the microprocessor, thereby allowing the cooling apparatus 1 to maintain lower processor temperatures for a given processor utilization rate. In this example, the heat sink module 100 can be permanently or semi-permanently affixed to the processor using a suitable adhesive, such as a layer of epoxy applied around a perimeter of the heat sink module.

In some examples of the cooling apparatus 1, coolant 50 can be delivered to a heat sink module 100 that is mounted directly on a surface to be cooled, such as a surface of a microprocessor 415 that is electrically connected to a motherboard 405. FIG. 27 shows a side cross-sectional view of the heat sink module 100 of FIG. 24 taken along section B-B with the heat sink module mounted directly on a computer processor located on a motherboard 405 and showing central axes of several orifices 155. The heat sink module 100 is capable of mounting directly on a lid of a processor 415 and providing impinging jet streams 16 of coolant 50 against the lid or, in another example, mounting directly on a processor without a lid and providing direct-to-silicon cooling where jet streams 16 of coolant 50 directly impinge a silicon surface of the processor. Providing direct-to-silicon cooling eliminates thermal resistance associated with the processor lid, thereby increasing heat transfer rates and allowing the processor 415 to be maintained at a lower operating temperate. In addition, hot spots on the processor 415 can be addressed by modifying the impingement pattern of the heat sink module 100. For example, if thermal characterization of the microprocessor 415 reveals hot spots, or if the processor has certain cores that statistically are more heavily utilized than other cores, orifices 155 of the heat sink module 100 can be arranged to direct additional jet streams 16 of coolant 50 at or near the hot spots to enhance heat transfer proximate the hot spots and thereby achieve more consistent temperatures across the processor.

In other examples, the heat sink module 100 can be mounted on a thermally conductive intermediary object, such as a thermally conductive base member 430, as shown in FIG. 26. The assembly of the heat sink module 100 and the thermally conductive base member 430 can then be mounted on a heat source, such as a microprocessor 415 electrically connected to a motherboard 405, as show in FIG. 28. A layer of thermal interface material (e.g. solder thermal interface material or polymer thermal interface material) can be applied between a top surface of the heat source (e.g. microprocessor) and a bottom surface of the thermally conductive base member 430. The thermally conductive base member 430 can be made of a material with a high thermal conductivity, such as copper, silver, gold, aluminum, or tungsten.

The thermally conductive member 430 can be placed in thermal communication with an electronic device, or other type of device, that has a surface 12 that generates heat and requires cooling, such as a microprocessor 415, microelectronic circuit chip in a supercomputer, or any other electronic circuit or device requiring cooling, such as diode laser packages.

Three-Phase Contact Line Length

FIG. 63 shows a top view of a heated surface 12 covered by coolant 50, where the coolant has regions of vapor coolant 56 and wetted regions of liquid coolant 57 in contact with the heated surface 12. The dark areas in FIG. 63 show the vapor coolant regions 56, and the light areas show the liquid coolant regions 57. A length of a three-phase contact line 58 is measured as a sum of all curves where liquid coolant 57, vapor coolant 56, and the solid heated surface 12 are in mutual contact on the heated surface 12. The three-phase contact line 58 length can be determined using suitable image processing techniques.

The heat transfer rate from the surface to be cooled 12 to the coolant 50 has been shown to strongly correlate with the length of the three-phase contact line 58 on the surface to be cooled 12. Consequently, increasing the length of the three-phase contact line 58 can be desirable when attempting to increase the heat transfer rate from the surface to be cooled. Increasing the heat transfer rate is desirable, since it increases the efficiency of the cooling apparatus 1 and allows higher heat flux surfaces to be cooled by the cooling apparatus.

By providing jet streams 16 of coolant that impinge the surface to be cooled 12 from a suitable jet height 18, the heat sink modules 100 described herein effectively increase the length of the three-phase contact line 58. Consequently, the heat sink modules 100 described herein provide much higher heat transfer rates than competing cooling systems. By selecting orifice 155 diameters, jet heights 18, coolant pressures, and orifice orientations from the ranges provided herein, the heat sink module 100 can provide jet streams 16 with sufficient momentum to disrupt vapor formation on the surface to be cooled 12, thereby increasing the length of the three-phase contact line 58 on the surface to be cooled 12 and allowing higher heat fluxes to be effectively dissipated without reaching critical heat flux.

Redundant Cooling Apparatus

In some examples, it can be desirable to have a fully redundant cooling apparatus 2 where each heat-generating surface 12 is cooled by at least two completely independent cooling apparatuses 1. In the event of failure of a first independent cooling apparatus 1, a second independent cooling apparatus 1 can be configured to provide sufficient cooling capacity to adequately cool the heat-generating surface 12 and thereby avoid any downtime or reduction in performance when the heat-generating surface 12 is, for example, a microprocessor 415 or other critical system component. In a fully redundant cooling apparatus 2, the heat-generating component 12 can be adequately cooled by a first cooling apparatus 1 (and can continue to operate normally) while repairs are made on a failed component within a second cooling apparatus 1 of the redundant cooling apparatus 2.

FIG. 9 shows a front perspective view of a fully redundant cooling apparatus 2 installed on eight racks 410 of servers 400 in a data center 425. The redundant cooling apparatus 2 includes a first independent cooling apparatus 1 and a second independent cooling apparatus, each similar to the cooling apparatus 1 described with respect to FIGS. 1-3. FIG. 10 shows a rear view of the redundant cooling apparatus 2 of FIG. 9. In FIGS. 9 and 10, the redundant cooling apparatus 2 has a first pump 20, a first reservoir 200, a first set of inlet and outlet manifolds, and a first heat exchanger 40 associated with the first independent cooling apparatus 1. Likewise, the redundant cooling apparatus 2 has a second pump, a second reservoir, a second set of inlet and outlet manifolds, and a second heat exchanger 40 associated with the second independent cooling apparatus 1.

In some examples, the first and second cooling apparatuses 1 may not be fully independent and may share components that have a very low likelihood of failure, such as a common reservoir 200 and/or a common heat exchanger 40. FIGS. 69 and 70 shows schematics of redundant cooling apparatuses 2 that have a common reservoir 200. Such an arrangement may be useful where a redundant cooling apparatus 2 is desired but where safety regulations restrict the volume of coolant that can be used in a confined space. The configuration shown in FIGS. 69 and 70 may also reduce system cost by reducing the total number of components and by reducing the volume of coolant used.

FIG. 17 shows a schematic of a redundant cooling apparatus 2 having a redundant heat sink module 700 mounted on a heat source 12. The redundant heat sink module 700 is connected to two a first independent cooling apparatus 1 and a second independent cooling apparatus 1. The first independent cooling apparatus includes a primary cooling loop 300, a first bypass, and a second bypass 310. Similarly, the second independent cooling apparatus includes a primary cooling loop 300, a first bypass 305, and second bypass 310. As a result of this configuration, failure of a single component in the first independent cooling apparatus 1 will not disrupt operation of the second independent cooling apparatus 1. The redundant cooling apparatus 2 is configured to provide adequate cooling of the surface to be cooled 12 even if the first or second independent cooling apparatus 1 fails.

Although the redundant cooling apparatus 2 shown in FIG. 17 incorporates two cooling apparatuses 1 like the one presented in FIG. 11A, this is not limiting. Any of the non-redundant cooling apparatuses 1 presented in FIGS. 11A, 12A-12T, 13, 14A, and 16 can be used, in any combination, to provide a redundant cooling apparatus 2 to cool one or more heat generating surfaces 12.

In any of the schematics described herein or shown in the accompanying figures, each redundant heat sink module 700 can be a combination of two heat sink modules 100 of the type shown in FIG. 21, or a redundant heat sink module 700 with integrated independent coolant pathways, as shown in FIGS. 51A-51M. Therefore, the redundant heat sink module(s) 700 in FIGS. 17 and 18 can be exchanged for two heat sink modules 100 of the type shown in FIG. 21. In some examples, two non-redundant heat sink modules 100 can be mounted to a thermally conductive base member 430 to provide a redundant heat sink assembly, as shown in FIG. 52B.

FIG. 18 shows a schematic of a redundant cooling apparatus 2 that is more complex than the schematic shown in FIG. 17. The redundant cooling apparatus 2 in FIG. 18 includes a first independent cooling apparatus 1 and a second independent cooling apparatus 1. Each independent cooling apparatus 1 includes two parallel cooling lines where each parallel cooling line is fluidly connected to three redundant heat sink modules 700 arranged in a series configuration. As a result, the redundant cooling apparatus 2 shown in FIG. 17 is capable of redundantly cooling six surfaces to be cooled 12. The redundant cooling apparatus 2 is scalable, and additional parallel and series connected heat sink modules 700 can be added to cool additional surfaces 12.

FIG. 19 shows a top view of a redundant cooling apparatus 2 installed in a data center or computer room 425 having twenty racks 410 of servers 400. Each independent cooling apparatus 1 of the redundant cooling apparatus 2 can be fluidly connected to a heat exchanger 40 located inside of the room 425 where the servers are located. In some examples, the heat exchanger 40 can reject heat into the room 425, and a CRAC can be used to remove the rejected heat from the room.

FIG. 20 shows a top view of a redundant cooling apparatus 2 installed in a data center or computer room 425 having twenty racks 410 of servers 400. Each independent cooling apparatus 1 of the redundant cooling apparatus 2 can be fluidly connected to any suitable external heat exchanger 40 located outside of the room 425 where the servers are located. Each independent cooling apparatus 1 can be fluidly connected to the external heat exchanger 40 by an external heat rejection loop 43 that circulates an external cooling fluid, such as water or a water-glycol mixture. In some examples the heat exchanger 40 can be connected to a chilled water system of a building where the room 425 is located. In other examples, the heat exchanger 40 can be an air-to-liquid dry cooler or a liquid-to-liquid heat exchanger located outside of the room 425 (e.g. located outside of the building).

As noted above, FIGS. 69 and 70 shows schematics of redundant cooling apparatuses 2 having a first and second cooling apparatus where the first and second cooling apparatuses are not fully independent, since they share a common reservoir. In FIG. 69, the first and second cooling apparatuses 1 also share a common heat rejection loop 43. The heat rejection loop 43 is fluidly connected to the common reservoir 200 and includes a pump 20 and a heat exchanger 40. The pump 20 is configured to circulate a flow 51 of coolant from the reservoir 200 through the heat exchanger 40, where heat is removed from the flow of coolant, thereby reducing the temperature of the flow of coolant. The heat exchanger can be located outside of a room 425 where the redundant cooling apparatus 2 is installed so that heat rejected from the flow of coolant is not discharged back into the room 425. For instance, the heat exchanger 40 can be located on a rooftop of a building where the redundant cooling apparatus 2 is installed.

In FIG. 70, the first and second cooling apparatuses 1 share a common reservoir 200, but have separate heat rejection loops 43, also known as second bypasses 310. Each heat rejection loop 43 includes a valve 60 and a heat exchanger 40. In some examples, each valve 60 can be adjusted (manually or automatically) to allow about 30-60 or 45-55% of the flow 51 leaving each pump 20 to circulate through each heat rejection loop 43. This configuration can ensure that the coolant stored in the reservoir 200 remains sufficiently sub-cooled to allow for rapid condensing of any vapor delivered to the reservoir form a first or second return line 230 carrying bubbly flow. By rapidly condensing vapor within the reservoir 200 through direct interaction with a relatively large volume of sub-cooled liquid, the redundant cooling apparatus 2 prevents vapor from being delivered from the reservoir 200 outlets to either pump.

Redundant Heat Sink Module

FIG. 51A shows a top perspective view of a redundant heat sink module 700. The heat sink module 700 can be defined by a front side surface 175, a rear side surface 180, a left side surface 185, a right side surface 190, a top surface 160, and a bottom surface 135. FIG. 51B shows a top view of the redundant heat sink module of FIG. 51A, where a first independent coolant pathway 701 and the second independent coolant pathway 702 are represented by dashed lines. In the example shown in FIG. 51B, the first independent coolant pathway 701 passes through a first region near a middle of the redundant heat sink module 700, and the second independent coolant pathway 702 passes through a second region outside of the perimeter of the first region. The first and second independent coolant pathways (701, 702) can be completely independent, meaning that no amount (or no substantial amount) of coolant 51 is transferred from the first independent coolant pathway 701 to the second independent coolant pathway 702 or vice versa. The first independent coolant pathway can extend from a first inlet port 105-1 to a first outlet port 110-1 of the redundant heat sink module 700. Similarly, a second independent coolant pathway 702 can extend from a second inlet port 105-2 to a second outlet port 110-2 of the redundant heat sink module 700.

The first independent coolant pathway 701 can include a first inlet passage 165-1 extending from the first inlet port 105-1 to a first inlet chamber 145-1, as shown in FIG. 51F, which shows a cross-sectional view of FIG. 51 E taken along section A-A. The first inlet chamber 145-1 can have a tapered geometry to provide an even distribution of coolant to the plurality of orifices 155-1. For a redundant heat sink module 700 configured to cool a microprocessor 415, the first inlet chamber 145-1 can taper from a maximum height of about 0.040-0.120 in. to a minimum height of about 0.020-0.040 in. The first inlet chamber 145-1 can have a width of about 0.75-1.5 in. and a length of about 0.75-1.5 in. The volume of the first inlet chamber 145-1 can be about 0.01-0.02, 0.01-0.05, 0.04-0.08, 0.07-0.15, 0.1-0.2, 0.15-0.25, 0.2-0.4, 0.3-0.5 in$^3$, or preferably about 0.15 in$^3$. The first outlet chamber 150-1 can be slightly larger than the first inlet chamber 145-1 to accommodate expansion of a portion of the coolant 50 as it changes phase from liquid to vapor. For example, the first outlet chamber 15 can have a volume of about 0.02-0.05, 0.04-0.08, 0.07-0.15, 0.1-0.2, 0.15-0.25, 0.2-0.4, 0.3-0.5, 0.4-0.75 in$^3$, or preferably about 0.25 in$^3$. Although the first inlet and outlet chambers (145-1, 150-1) can be made larger, the dimensions provided above provide a high-performing, compact heat sink module 700.

As shown in the top view of the FIG. 51E, the second independent coolant pathway 702 is bifurcated and circumscribes the first independent coolant pathway 701. Consequently, the second inlet chamber 145-2 and the second outlet chamber 150-2 are also bifurcated, as shown in FIG. 51I. Despite having a different geometry than the first inlet chamber 145-1, the bifurcated second inlet chamber 145-2 can have about the same total volume as the first inlet chamber 145-1. For example, the volume of the first inlet chamber 145-1 can be about 0.01-0.02, 0.01-0.05, 0.04-0.08, 0.07-0.15, 0.1-0.2, 0.15-0.25, 0.2-0.4, 0.3-0.5 in$^3$, or preferably about 0.15 in$^3$. Likewise, despite having a different geometry than the first outlet chamber 150-1, the bifurcated second outlet chamber 150-2 can have about the same total volume as the first outlet chamber 150-1. For example, the volume of the second outlet chamber 150-2 can be about 0.02-0.05, 0.04-0.08, 0.07-0.15, 0.1-0.2, 0.15-0.25, 0.2-0.4, 0.3-0.5, 0.4-0.75 in$^3$, or preferably about 0.25 in$^3$.

As shown in FIG. 51F, a first plurality of orifices 155-1 can extend from the first inlet chamber 145-1 to a first outlet chamber 150-1 and can be configured to provide a plurality of jet streams 16 of coolant into the first outlet chamber 150-1 when pressurized coolant is provided to the first inlet chamber 145-1. A first outlet passage 166-1 can extend from the first outlet chamber 150-1 to the first outlet port 110-1, as shown in FIG. 51G, which is a cross-sectional view of FIG. 51E taken along section B-B.

A first plurality of anti-pooling orifices 156-1 can extend from the first inlet chamber 145-1 to a location proximate a rear wall of the first outlet chamber 150-1 and can be configured to provide a plurality of jet streams 16 of coolant proximate a rear wall of the first outlet chamber 150-1 when pressurized coolant is provided to the first inlet chamber 145-1. The anti-pooling jet streams 16 can be configured to impinge the surface to be cooled 12 at an angle near the rear wall and to prevent pooling of coolant near a rear wall of the first outlet chamber 150-1 by promoting directional flow away from the rear wall. By preventing pooling, the anti-pooling jet streams can prevent the onset of critical heat flux near the rear wall of the first outlet chamber 150-1, thereby increasing a maximum thermal load the heat sink module is capable of safely dissipating.

The second independent coolant pathway 702 can include a second inlet passage 165-2 extending from the second inlet port 105-2 to a second inlet chamber 145-2, as shown in FIG. 51G. A second plurality of orifices 155-2 can extend from the second inlet chamber 145-2 to a second outlet chamber 150-2 and can be configured to provide a plurality of jet streams 16 of coolant into the second outlet chamber 150-2 when pressurized coolant is provided to the second inlet chamber 145-2. A second outlet passage 166-2 can extend from the second outlet chamber 150-2 to the second outlet port 110-2, as shown in FIG. 51 F. A second plurality of anti-pooling orifices 156-2 can extend from the second inlet chamber 145-2 to a location proximate a rear wall of the second outlet chamber 150-2 and can be configured to provide a plurality of jet streams 16 of coolant proximate the rear wall of the second outlet chamber 150-2 when pressurized coolant is provided to the second inlet chamber 145-2.

FIG. 51D shows a bottom view of the redundant heat sink module 700 of FIG. 51A. The first independent coolant pathway 701 includes an array of orifices 155 arranged in a first region located near a middle portion of the module 700. The second independent coolant pathway 702 includes an array of orifices 155 arranged in a second region located beyond (e.g. outside of or circumscribing) the perimeter of the first region. In other examples, the first region can be located near a first half of the module 700 and the second region can be located near a second half of the module 700, as shown in the side-by-side coolant pathway example of FIG. 53.

The first outlet chamber 150-1 of the redundant heat sink module 700 can have an open portion that can be enclosed by a surface to be cooled 12 when the redundant heat sink module 700 is installed on the surface to be cooled 12. Similarly, the second outlet chamber 150-2 of the redundant heat sink module 700 can have an open portion that can be enclosed by a surface to be cooled 12 when the redundant heat sink module 700 is installed on the surface to be cooled 12.

To facilitate sealing against the surface to be cooled 12, the redundant heat sink module 700 can include a first sealing member 125-1 and a second sealing member 125-2, as shown in FIG. 51D. The first sealing member 125-1 (e.g. o-ring, gasket, sealant) can be disposed within a first channel 140-1 formed in a bottom surface 135 of the redundant heat sink module 700. The first channel 140-1 can circumscribe the first outlet chamber 150-1, and the first sealing member 125-1 can be compressed between the first channel 140-1 and the surface to be cooled 12 to provide a liquid-tight seal therebetween. The redundant heat sink module 700 can include a second sealing member 125-2, as shown in FIG. 51D. The second sealing member 125-2 (e.g. o-ring, gasket, sealant) can be disposed within a second channel 140-2 formed in the bottom surface 135 of the redundant heat sink module 700. The second channel 140-2 can circumscribe the second outlet chamber 150-2, and the second sealing member 125-2 can be compressed between the second channel 140-2 and the surface to be cooled 12 to provide a liquid-tight seal therebetween. In this example the first sealing member 125-1 can provide a liquid-tight seal between the first outlet chamber 150-1 and the second outlet chamber 150-2. The first sealing member 125-1 can bound an inner perimeter of the second outlet chamber 150-2, and the second sealing member 125-2 can bound an outer perimeter of the second outlet chamber 150-2.

FIG. 51I shows a cross-sectional view of the redundant heat sink module 700 taken along section C-C shown in FIG. 51H. FIG. 51I shows relative positioning of a first inlet chamber 145-1, a first outlet chamber 150-1, a bifurcated second inlet chamber 145-2, and a bifurcated second outlet chamber 150-2. A first dividing member 195-1 separates the first inlet chamber 145-1 from the first outlet chamber 150-1. The first plurality of orifices 155-1 extend from the first inlet chamber 145-1 to the first outlet chamber 150-1 and through the first dividing member 195-1. Similarly, the second inlet chamber 145-2 is separated from the second outlet chamber 150-2 by a second dividing member 195-2. The second plurality of orifices 155-2 extend from the second inlet chamber 145-2 to the second outlet chamber 150-2 and through the second dividing member 195-2. The thickness of the first and second dividing members (195-1, 195-2) can be selected to ensure that the orifices have sufficient L/D ratios and that the heat sink module 700 is structurally sound (i.e. capable of handling a flow 51 of pressurized coolant).

FIG. 51K shows a side cross-sectional view of the redundant heat sink module 700 of FIG. 51J taken along section D-D. The nonlinear sectional view exposes a substantial portion of the first independent coolant pathway 701, including the first inlet port 105-1, first inlet passage 165-1, first inlet chamber 145-1, the first plurality of orifices 155-1, the first anti-pooling orifice 156-1, the first outlet chamber 150-1, the first outlet passage 166-1, and the first outlet port 110-1. The apparent blockages between the first inlet passage 165-1 and the first inlet chamber 145-1 and between the first outlet chamber 150-1 and the first outlet passage 166-1 are simply artifacts of the location of section D-D. No such blockages exist in the first coolant pathway 701. The first coolant pathway 701 is designed to be free flowing such that only a small pressure drop (e.g. about 1.5 psi) is observed between the first inlet port 105-1 and the first outlet port 110-1 when pressurized coolant is delivered to the first coolant pathway 701.

As shown in FIG. 51K, the first inlet chamber 145-1 can have a tapered geometry that ensures substantially similar flow through each orifice 155. The first outlet chamber 150-1 can have an expanding geometry that allows for expansion of the coolant as a portion of the coolant changes phase from a liquid to a vapor as heat is transferred from the surface to be cooled 12 to the flow of coolant 50. The redundant heat sink module 700 can include a flow-guiding lip 162, as shown in FIG. 51K. The flow-guiding lip 162 can guide the directional flow 51 from the outlet chamber 150-1 to the outlet passage 166-1. Preferably, the flow-guiding lip can have an angle of less than about 45 degrees with respect to the surface to be cooled 12 to avoid creating a flow restriction or stagnation region proximate the exit of the outlet chamber 150-1.

FIG. 51M shows a side cross-section view of the redundant heat sink module 700 of FIG. 51L taken along section E-E. The nonlinear sectional view exposes a substantial portion of the second independent coolant pathway 702, including the second inlet port 105-2, second inlet passage 165-2, second inlet chamber 145-2, the second plurality of orifices 155-2, the second anti-pooling orifice 156-2, the second outlet chamber 150-2, the second outlet passage 166-2, and the second outlet port 110-2.

The apparent discontinuity between the second outlet chamber 150-2 on the left and the second outlet chamber 150-2 on the right is simply an artifact of the location of section E-E. No such discontinuity exists in the second coolant pathway 702. The second coolant pathway 702 is designed to be free flowing such that only a small pressure drop (e.g. about 1.5 psi) is observed between the second inlet port 105-2 and the second outlet port 110-2 when pressurized coolant is delivered to the second coolant pathway 702.

FIG. 51 N shows flow vectors associated with the first coolant pathway 701 and flow vectors associated with the second coolant pathway 702. To provide an even flow distribution across the inlets of the plurality of orifices 155-1 in the first inlet chamber 145-1, the first coolant pathway 701 can include a flow diverter 706, as shown in FIG. 51N. The flow diverter 706 can have a shape similar to an airfoil with a curved surface 706. As a result of fluid dynamics, the curved surface 706 causes incoming coolant to flow in close proximity to the curvature of the curved surface 706, similar to the way air flow follows the curvature of a wing. Without the flow diverter 706, the incoming flow would hug a left perimeter of the first coolant pathway 701 and potentially starve orifices 155 located near a center or right perimeter of the array of orifices.

FIG. 51O is a top view of the redundant heat sink module 700. The first coolant pathway 701 has a first inlet port 105-1 and a first outlet port 110-1, and the second coolant pathway 702 has a second inlet port 105-2 and a second outlet port 110-2. In some examples, coolant can enter the first inlet port 105-1 as liquid flow and exit the first outlet port 110-1 as two-phase bubbly flow. Likewise, coolant can enter the second inlet port 105-2 as liquid flow and exit the second outlet port 110-2 as two-phase bubbly flow.

When cooling a heated surface 12 that experiences rapid increases in heat flux, such as an electric motor of an electric vehicle, it can be desirable to configure the redundant cooling apparatus 2 to manage transient heat loads without experiencing critical heat flux. In one example, the redundant heat sink module 700 can be operated as shown in FIG. 51Q. In this example, during normal operation, when the heated surface is producing a moderate heat flux, a first coolant pathway 701 can be operated so that two-phase bubbly flow is formed therein, and a second coolant pathway 702 can be operated so that little or no vapor is formed therein. If the heat load increases rapidly, it will cause phase change within the second coolant pathway 702, which will provide additional cooling capacity for the increased heat load. Achieving parallel flows of bubbly flow and liquid flow can be achieved in several possible ways. Where both coolant pathways are transporting the same type of coolant (e.g. HFE-7000), the flow rate of coolant 50 in the second cooling pathway 702 can be increased until no vapor forms therein. Due to its higher flow rate, the second cooling pathway 702 will have greater cooling capacity than the first coolant pathway 701, and will be able to safely manage rapid increases in heat flux and thereby avoid onset of critical heat flux. In this example, the pressure of the flow 51 of coolant in the second coolant pathway 702 can be set higher than the pressure of the flow of coolant in the first coolant pathway 701 to provide a higher saturation temperature in the second coolant pathway 702 than in the first coolant pathway 701. In another example, the first coolant pathway 701 can transport a first coolant having a first boiling point, and the second coolant pathway 702 can transport a second coolant having a second boiling point, where the second boiling point is higher than the first boiling point. In one specific example, the first coolant can be HFE-7000 with a boiling point of 34 degrees C. at one atmosphere, and the second coolant can be HFE-7100 with a boiling point of 61 degrees C. at one atmosphere. The flow rate and/or pressure of the second coolant can be increased to provide excess cooling capacity in the second coolant pathway to safely manage rapid increases in heat flux and thereby avoid onset of critical heat flux.

FIG. 51P shows a top view of the redundant heat sink module similar to FIG. 51Q, except that the first coolant pathway 701 is transporting a flow of liquid coolant, and the second coolant pathway 702 is transporting two-phase bubbly flow. For heat sources that have non-uniform heat distributions, such as multi-core processors, it can be desirable to select a configuration where the coolant pathway with excess cooling capacity (i.e. the coolant pathway that is transporting a flow of liquid coolant) is situated over the portion of the heat source that is likely to experience a rapid increase in heat flux.

Dimensions, volumes, and/or ratios associated with orifices (155, 156), chambers (145, 150), ports (105, 110), passages (165, 166), jet heights 18, boiling inducing members 196, and dividing members 195 described herein with respect to the non-redundant heat sink modules 100 also apply to corresponding features of the redundant heat sink modules 700. Coolant pressures and flow rates described herein with respect to non-redundant heat sink modules 100 also apply to each independent coolant pathway (701, 702) in the redundant heat sink modules 700.

Portable Servicing Unit

A portable servicing unit can be provided to aid in draining the cooling apparatus 1, for example, when servicing or repairing the cooling apparatus. The portable servicing unit can include a vacuum pump. The portable servicing unit can include a hose, such as a flexible hose, having a first end a second end. A first end of the hose can be configured to fluidly connect to an inlet of the vacuum pump of the portable servicing unit. A second end of the hose can be configured to fluidly connect to a connection point (e.g. a drain 245) of the cooling apparatus 1 through, for example, a threaded fitting or a quick-connect fitting. The portable machine can include a portable reservoir fluidly connected to an outlet of the vacuum pump. When connected to the cooling apparatus 1 and activated, the vacuum pump of the portable servicing unit can apply vacuum pressure to the cooling apparatus 1 by way of the hose, which results in coolant flowing from the cooling apparatus, through the hose and vacuum pump, and into the portable reservoir. When servicing is complete, fluid from the portable reservoir can be pumped back into the cooling system or transported to an appropriate disposal or recycling facility. In some examples, the portable servicing unit can include one or more thermoelectric heaters. The thermoelectric heaters can be placed in thermal communication with components of the cooling apparatus 1, and by transferring heat to coolant within the apparatus, the thermoelectric heaters can promote evacuation of fluid from the apparatus through a drain 245 or other access point in the apparatus.

3D Printing

One or more components of the cooling apparatus 1 can be manufactured by a three-dimensional printing process. The heat sink module 100, redundant heat sink module 700, or portions of either heat sink module, such as an insertable orifice plate 198 or module body 104, can be manufactured by a three-dimensional printing process. One example of a suitable 3D printer is a Form 1+ SLA 3D Printer from Formlabs Inc. of Somerville, Mass. One example of a suitable material for SLA 3D printing is Accura Bluestone Plastic from 3D Systems.

In some examples, a three-dimensional manufacturing process can be used to create tubing 225 used to fluidly connect a first heat sink module 100 to a second heat sink module, such as the section of tubing shown in FIG. 73. In some examples, a three-dimensional printing process can be used to form a combined heat sink module 100 and section of tubing 225 to eliminate connectors 120 and potential leak points. In some examples, a three-dimensional printing process can be used to form two heat sink modules 100 fluidly connected by a section of tubing 225, similar to the configuration shown in FIG. 73. This approach can eliminate potential leak points that would typically exist, for example, at threaded connections where fittings attach a section of tubing 225 to an inlet or outlet port (105, 110) of the heat sink modules. This approach can also reduce installation time and avoid installation errors.

In some examples, components of the cooling apparatus 1 can be formed by a stereolithography process that involves forming layers of material curable in response to synergistic stimulation adjacent to previously formed layers of material and successively curing the layers of material by exposing the layers of material to a pattern of synergistic stimulation corresponding to successive cross-sections of the heat sink module. The material curable in response to synergistic stimulation can be a liquid photopolymer.

Coolant Temperature, Pressure, and Flow Rate

In some examples, it can be desirable to maintain coolant surrounding a surface to be cooled 12 at a pressure that results in the saturation temperature of the coolant being slightly above the temperature of jet streams of coolant being projected at the surface to be cooled 12. As used herein, "maintain" can mean holding at a relatively constant value over a period of time. "Coolant surrounding a surface" refers to a steady state volume of coolant immediately surrounding and in contact with the surface to be cooled 12, excluding jet streams 16 of coolant projected directly at the surface to be cooled 12. "Saturation temperature" is used herein as is it commonly used in the art. The saturation temperature is the temperature for a given pressure at which a liquid is in equilibrium with its vapor phase. If the pressure in a system remains constant (i.e. isobaric), a liquid at saturation temperature evaporates into its vapor phase as additional thermal energy (i.e. heat) is applied. Similarly, if the pressure in a system remains constant, a vapor at saturation temperature condenses into its liquid phase as thermal energy is removed. The saturation temperature can be increased by increasing the pressure in the system. Conversely, the saturation temperature can be decreased by decreasing the pressure in the system. In specific versions of the invention, a saturation temperature "slightly above" the temperature of jet streams 16 of coolant projected at the surface to be cooled 12 refers to a saturation temperature of about 0.5° C., about 1° C., about 3° C., about 5° C., about 7° C., about 10° C., about 15° C., about 20° C., or about 30° C. above the temperature of coolant 50 projected against the surface. Establishing a saturation temperature of coolant 50 surrounding a surface 12 slightly above the temperature of the jet stream 16 of coolant projected at the surface provides for at least a portion of the coolant projected at the surface to heat and evaporate after contacting the surface, thereby greatly increasing the heat transfer rate and efficiency of the cooling apparatus 1.

The appropriate pressure at which to maintain the coolant to achieve the preferred saturation temperatures can be determined theoretically by rearranging the following Clausius-Clapeyron equation to solve for $P_O$:

$$T_B = \left( \frac{R \ln(P_0)}{\Delta H_{vaporization}} + \frac{1}{T_0} \right)^{-1}$$

where: $T_B$=normal boiling point (K), R=ideal gas constant (J-K$^{-1}$mol$^{-1}$), $P_O$=vapor pressure at a given temperature (atm), $\Delta H_{vaporization}$=heat of vaporization of the coolant (J/mol), $T_O$=given temperature (K), and ln=natural log to the base e.

In the above equation, the given temperature ($T_O$) is the temperature of coolant 50 in contact with, and heated by, the surface to be cooled 12. The normal boiling point ($T_B$) is the boiling point of the coolant at a pressure of one atmosphere. The heat of vaporization ($\Delta H_{vaporization}$) is the amount of energy required to convert or vaporize a given quantity of a saturated liquid (i.e., a liquid at its boiling point) into a vapor. As an alternative to determining the appropriate pressure theoretically, the appropriate pressure can be determined empirically by adjusting the pressure and detecting evaporation or bubble generation at a surface to be cooled 12, as shown in FIG. 30. Bubble generation can be visually detected with a human eye when transparent components, such as a transparent heat sink module 100 or transparent flexible tubing 225, is used to construct the cooling apparatus 1. In some examples, the heat sink module 100 or the flexible tubing 225 can be transparent throughout, and in other examples, at least a portion of the heat sink module 100 or flexible tubing 225 can be transparent to provide a transparent window portion that permits a system operator or electronic eye to visually detect the presence of bubbles 275 within the coolant 50 flow and to make system adjustments based on that visual detection. For instance, if no bubbles 275 are visually detected exiting the outlet chamber 150 of the heat sink module 100, the coolant flow rate can be reduced by reducing the pump 20 speed, thereby reducing energy consumed by the pump 20 and reducing overall energy consumption and operating cost. Conversely, if slug or churn flow is detected (see, e.g. FIGS. 58 and 59B), the coolant flow rate 51 can be increased to eliminate the presence of those unwanted flow regimes and restore the system to two-phase bubbly flow.

During operation of the cooling apparatus 1, coolant 50 can be flowed into an outlet chamber 150 of the heat sink module 100. The surface to be cooled 12 can be exposed within the outlet chamber 150 or, as shown in FIG. 30, the surface to be cooled 12 can serve as a bounding surface of the outlet chamber 150 when the heat sink module 100 is installed on the surface to be cooled 12. The coolant 50 can be introduced to the outlet chamber 150 at a predetermined pressure that promotes a phase change upon the liquid coolant 50 contacting, and being heated by, the surface to be cooled 12. One example of such a cooling apparatus 1 for performing various cooling methods described herein is shown in FIG. 11A. The cooling apparatus 1 can include a heat sink module 100, as shown in FIGS. 26 and 30. The heat sink module 100 can include an outlet chamber 150 with a surface 12 to be cooled exposed within the outlet chamber 150. The pump 20, as shown in FIG. 11A, can provide coolant 50 at a predetermined pressure to an inlet 21 of the heat sink module 100.

The cooling apparatus 1 as described above and as shown in FIG. 11A can include several steady-state zones having either liquid flow or two-phase bubbly flow. The nature of the coolant 50 in each zone can depend on the temperature and pressure of the coolant in each zone. In the example in FIG. 11A, a zone having high-temperature coolant 52 includes the coolant 50 surrounding the surface to be cooled 12 within the outlet chamber 150 (excluding the jet streams 16 of coolant 50 projected into the outlet chamber 150 through the orifices 155 of the heat sink module 100) of the heat sink module 100 and extends downstream to the heat exchanger 40 (see FIG. 11A for direction of flow 51). Portions of the high-temperature coolant 52 within the outlet chamber 150 are preferably at a temperature approximately equal to or above the saturation temperature. A zone of low-temperature coolant 53 extends from downstream of the reservoir 200 to at least the inlet port 105 of the first heat sink module 100 and includes the jet streams 16 of coolant 50 injected into the outlet chamber 150 of the first heat sink module 100. The low-temperature coolant 53 is preferably at a temperature slightly below the saturation temperature of the coolant 50 surrounding the surface 12, wherein "slightly below" can include 0.5-1, 0.5-3, 1-3, 1-5, 3-7, 5-10, 7-10, 7-15, 10-15, 15-20, 15-30, about 0.5, about 1, about 3, about 5, about 7, about 10, about 15, about 20, or about 30° C. or more below the saturation temperature of coolant 50 surrounding the surface to be cooled 12. Heat transfer from the surface to be cooled 12 to the coolant 50 with the outlet chamber 150 of the heat sink module 100 serves to transition the low-temperature coolant 53 to high-temperature coolant 52. In some examples, the surface to be cooled 12 heats a portion of the coolant 50 contacting the surface 12 to its saturation temperature, thereby promoting evaporation and formation of two-phase bubbly flow, which exits the heat sink module through the outlet port 110.

A zone of low-pressure coolant 55 includes the coolant 50 surrounding the surface to be cooled 12 within the outlet chamber 150 (which excludes the jet streams 16 of coolant 50 projecting into the outlet chamber 150 through the orifices 155 of the heat sink module) and extends downstream to an inlet 21 of the pump 20. The low-pressure coolant 55 is preferably at a pressure that promotes evaporation of coolant 50 when heated at the surface 12. Therefore, the pressure of the low-pressure coolant 55 preferably determines a saturation temperature to be about equal to the temperature of the high-temperature coolant 52. A zone of high-pressure coolant 54 includes a portion downstream of the pump outlet 22 and extends to at least the inlet port 105 of the first heat sink module 100. The high-pressure coolant 54 is preferably at a pressure suitable for generating jet streams 16 of coolant that are capable of penetrating liquid present in the outlet chamber 150 and impinging the surface to be cooled 12. In some examples, the pump 20 can provide high-pressure coolant 54 at a pressure of about 1-20, 10-30, 25-50, 40-60, or 50-75, 60-80, or 75-100 psi. In other examples, the pump 20 can provide high-pressure coolant 54 at a pressure of about 85-120, 100-140, 130-160, 150-175, 160-185, 175-200, or greater than 200 psi.

The pump 20 serves to transition low-pressure coolant 55 to high-pressure coolant 54 as the coolant passes from the pump inlet 21 to the pump outlet 22. In some examples, the pump 20 can provide high-pressure coolant 54 at a pressure that is about 10-20, 15-30, 20-40, 30-45, or 40-60 psi or greater above the pressure of the low-pressure coolant 55. The high-pressure coolant 54 in the cooling apparatus 1 applies a positive pressure against the plurality of orifices 155 in the heat sink module 100, and the plurality of orifices 155 serve to transition the high-pressure coolant 54 to low-pressure coolant 55, as the coolant 50 equilibrates to the pressure of the low-pressure coolant 55 after passing through the plurality of orifices as jet streams 16 and mixing with the coolant in the outlet chamber 150 of the heat sink module 100.

With the apparatus 1 described above, a flow rate is set by the pump 20 to handle the expected heat load produced by the surface to be cooled 12. A specific pressure for the low-pressure coolant 55 is set and maintained by one or more pumps 20 and by one or more valves 60, as shown in the various schematics presented in FIGS. 11A-14, 16-18, and 68-72 to establish a saturation temperature for the coolant 50 surrounding the surface to be cooled 12 to be slightly above the saturation temperature of the low-temperature coolant 53. Relatively high-pressure 54 low-temperature 53 coolant 50 is projected as jet streams 16 from the plurality of orifices 155 against the surface to be cooled 12, whereby the coolant 50 undergoes a pressure drop upon equilibrating with fluid present in the outlet chamber 150 and a portion of the fluid may heat to its saturation temperature upon contacting the surface 12 and absorbing heat from the surface. A portion of the heated coolant 50 undergoes a phase transition at the surface to be cooled 12, which causes highly efficient cooling of the surface 12. Downstream of the heat sink module 100, the relatively low-pressure 55, high-temperature 52 coolant flow is then mixed with low-pressure 55, low-temperature 54 coolant from the second bypass 310 to promote condensing of vapor bubbles 275 within the low-pressure 55, high temperature 52 coolant by cooling it below its saturation temperature, which produces a flow of low-pressure 55, low-temperature 53 coolant in the return line 230 that returns the coolant 50 to the reservoir 200. Upon being drawn form the lower portion of the reservoir 200 to the pump inlet 21, the low-pressure 55, low-temperature 53 coolant is then transitioned to high-pressure 54, low-temperature 53 coolant as it passes through the pump 20. The high-pressure 54, low-temperature 53 coolant is then circulated back to the inlet port 105 of the first heat sink module 100 and the above-described process is repeated.

Cooling System Preparation and Operation

In some applications, it can be desirable to fill the cooling apparatus 1 with a dielectric coolant 50 that is at a pressure below atmospheric pressure (e.g. less than about 14.7 psi). For example, when cooling microprocessors 415, it can be desirable fill the cooling apparatus 1 with HFE-7000 (or a coolant mixture containing HFE-7000 and, for example, R-245fa) that is at a pressure below atmospheric pressure to reduce the boiling point of the dielectric fluid. To accomplish this, the portable servicing unit (or other vacuum source) can be used to apply a vacuum to the cooling apparatus 1 to purge the contents of the cooling apparatus. Upon reducing the pressure within the cooling apparatus 1 to about 0-3, 0-5, 1-5, 4-8, 5-10, or 8-14.5 psi, the dielectric coolant 50 can be added to the cooling apparatus 1. In some examples, operation of the pump 20 may only increase the pressure of the dielectric coolant about 1-15, 5-20, or 10-25 psi above the baseline sub-atmospheric pressure. Consequently, the operating pressure of the high pressure coolant 54 within the cooling apparatus 1 may be about equal to atmospheric pressure (e.g. about 8-14, 10-16, 12-18, or 14-20 psi), thereby ensuring that that saturation temperature of the dielectric coolant remains low enough to ensure that boiling can be achieved when jet streams 16 of coolant impinge the surface to be cooled 12 associated with a microprocessor 415. Providing high-pressure coolant 54 at a pressure near atmospheric pressure has other added benefits. First, low pressure tubing 225 can be used, which is lightweight, flexible, and low cost. Second, because of the minimal pressure difference between the high-pressure coolant 54 and the surrounding atmosphere, fluid leakage from fittings and other joints of the cooling apparatus 1 may be less likely.

Temperature Conditioning of Coolant

The cooling apparatus 1 can include any suitable heat exchanger 40 configured to promote heat rejection from the flow 51 of coolant to effectively sub-cool the coolant. By enabling heat rejection from the coolant 50, the heat exchanger 40 can ensure the reservoir 200 maintains a volume of subcooled liquid that can be safely supplied to the pump 20 without risk of vapor lock or instability. Any heat exchanger 40 capable of reducing the temperature of the coolant 50 below its saturation temperature is acceptable. For instance, the heat exchanger 40 can be any suitable air-to-liquid heat exchanger or liquid-to-liquid heat exchanger. Non-limiting types of suitable heat exchangers include shell-and-tube, fin-and-tube, micro-channel, plate, adiabatic-wheel, plate-fin, pillow-plate, fluid, dynamic-scraped-surface, phase-change, direct contact, and spiral type heat exchangers. The heat exchanger 40 can operate using parallel flow, counter flow, or a combination thereof. In one example, a liquid-to-liquid heat exchanger 40 can be a Standard Xchange Brazepak brazed plate heat exchanger from Xylem, Inc. of Rye Brook, N.Y.

A first liquid-to-liquid heat exchanger 40, as shown in FIGS. 92-95 and 97, can be connected to an external heat rejection loop 43, as shown in FIG. 77. The external heat rejection loop 43 can carry a flow of external cooling fluid 42, such as water or a water-glycol mixture. A second pump 20 can circulate the flow of external cooling fluid 42 through the heat rejection loop 43, as shown in FIG. 77. As the flow of external cooling fluid 42 is circulated through the first liquid-to-liquid heat exchanger 40, heat can be transferred from the flow 51 of dielectric coolant 50 to the flow of external cooling fluid 42, thereby subcooling the flow 51 of dielectric coolant 50 in the first bypass 305 and heating the flow of external cooling fluid 42. The heated external cooling fluid 42 is then circulated through a second liquid-to-liquid heat exchanger 40 located outside of the room 425 where the cooling apparatus 1 is installed. The second liquid-to-liquid heat exchanger 40 can be connected to a flow of chilled water 46, such as a chilled water supply from a building. As the heated external cooling fluid 42 circulates through the second liquid-to-liquid heat exchanger 40, heat is transferred from the flow of external cooling fluid 42 to the flow of chilled water, thereby completing heat rejection from the cooling apparatus 1 to the flow of chilled water by way of the heat rejection loop 43.

A cooling apparatus 1 as shown in FIG. 77 can use HFE-7000 as a primary coolant 50 circulating through one or more heat sink modules 100, a heat rejection loop 43 circulating a flow of a water-glycol mixture 42 as an external cooling fluid to transfer heat from a first heat exchanger 40-1 to a second heat exchanger 40-2, and a flow of chilled water 46 from a building supply line as a third heat exchange medium to carry heat away from the second heat exchanger 40-2. In one example, during operation, the flow 51-1 of subcooled liquid coolant 50 can be about 25-30 degrees C. and about 10-20 psia at an inlet of the first liquid-to-liquid heat exchanger 40-1 and about 20-25 degrees C. at an outlet of the first liquid-to-liquid heat exchanger. The liquid in the reservoir 200, which can be a subcooled liquid with an average temperature of about 25-30 degrees C., which is about 5-10 degrees below the saturation temperature of HFE-7000 at the operating pressure. Where a high heat load from heated surface 12 is expected, it can be desirable to further subcool the flow 51-2 of liquid coolant delivered to the inlet of the heat sink module 100. For instance, it can be desirable to deliver a flow 51-2 of subcooled coolant to the heat sink module that is about 15-25 degrees C., which is about 10-15 degrees below the saturation temperature of HFE-7000 at the operating pressure. The flow of external cooling fluid 42 can be about 10-15 degrees C. at an inlet of the first liquid-to-liquid heat exchanger 40-1 and about 15-20 degrees C. at an outlet of the first liquid-to-liquid heat exchanger 40-1. The flow of chilled water 46 can be about 4-7 degrees C. at an inlet of the second liquid-to-liquid heat exchanger 40-2 and about 9-12 degrees C. at an outlet of the second liquid-to-liquid heat exchanger. The flow of external cooling fluid 42 can be about 15-20 degrees at an inlet of the second liquid-to-liquid heat exchanger and about 10-15 degrees at an outlet of the second liquid-to-liquid heat exchanger. These values are provided as an example of one suitable operating condition and are non-limiting. The temperatures can vary as flow rates, pressures, and heat loads change or when different coolants 50, external cooling fluids 42, heat rejection loop 43 configurations, or system configurations are used.

In another example, a liquid-to-liquid heat exchanger 40 can be connected to an external heat rejection loop 43, as shown in FIG. 75. The external heat rejection loop 43 can carry a flow of external cooling fluid 42, such as water or a water-glycol mixture. A second pump 20-2 can circulate the flow of external cooling fluid 42 through the heat rejection loop 43. As the flow of external cooling fluid 42 is circulated through the first liquid-to-liquid heat exchanger 40-1, heat can be transferred from the flow 51-1 of dielectric coolant 50 to the flow of external cooling fluid 42, thereby subcooling the flow 51-1 of dielectric coolant 50 in the first bypass 305 and heating the flow of external cooling fluid 42. The heated external cooling fluid 42 is then circulated through an air-to-liquid heat exchanger 40-2 located outside of the room 425 where the cooling apparatus 1 is installed. The air-to-liquid heat exchanger 40-2 can be a radiator or a dry cooler having one or more fans 26 configured to provide airflow across a structure of the heat exchanger. As the heated external cooling fluid 42 circulates through the air-to-liquid heat exchanger 40-2, heat is transferred from the flow of external cooling fluid 42 to the flow of air, thereby completing heat rejection from the cooling apparatus 1 to ambient air by way of the heat rejection loop 43. As shown in FIG. 75, the air-to-liquid heat exchanger 40-2 can be located outside the room 425 where the surface to be cooled 12 is located to avoid rejecting the heat to the ambient air in the room 425 and thereby increasing the air temperature in the room 425.

In some examples, the heat exchanger 40 can be a liquid-to-liquid heat exchanger 40 that is directly connected to a flow of external cooling fluid 46, such as chilled water from a building supply line, as shown in FIG. 76. This configuration can allow heat rejected from the cooling apparatus 1 to be removed from the room 425 where the cooling apparatus 1 is installed and transferred directly to a flow of chilled water 46 instead of being rejected into the room air or through an intermediate heat rejection loop 43, as shown in FIG. 77. In this example, care should be taken to regulate the flow rate of chilled water 46 through the heat exchanger 40 to avoid cooling the dielectric coolant 50 to a temperature at or below its dew point.

In any of the cooling apparatuses 1 described herein, the flow rate of coolant 50-1 through the heat exchanger 40 can be monitored and controlled to avoid reducing the temperature of the low-temperature 53 coolant to or below the dew point of ambient air in the room 425 where the surface to be cooled 12 is located. Reaching or dropping below the dew point of the ambient air is undesirable, since it can cause condensation to form on an outer surface of the flexible tubing 225 or other components of the cooling apparatus 1. If this occurs, water droplets can form on and fall from the outer surface of the tubing 225 onto sensitive electrical components within the server 400, such as the microprocessor 415 or memory modules 420, which is undesirable. Consequently, the low-temperature 53 coolant should be maintained at a temperature above the dew point of ambient air in the room 425 to ensure that condensation will not form on any components of the cooling apparatus 1 that are in close proximity to sensitive electrical devices being cooled.

In some examples, if the low-temperature 53 coolant is cooled below the dew point of ambient air in the room by the heat exchanger 40, a preheater can be provided in line with, or upstream of, the line (e.g. flexible tubing 225) that transports coolant 50 flow into the server 400 housing and into the heat sink module 100. The preheater can be used to heat the flow of coolant 51 to bring the coolant temperature above its dew point temperature, thereby avoiding potential complications caused by condensation forming on the lines within the server housing. In some examples, the preheater can be configured to operate only when needed, such as when the temperature of the low-temperature coolant drops below its dew point.

The temperature of the low-temperature coolant 52 can be monitored with one or more temperature sensors positioned in the cooling lines, and data from the sensors can be input to the controller. For instance, a first temperature sensor can be positioned upstream of the preheater, and a second temperature sensor can be positioned downstream of the preheater. When the first temperature sensor detects a coolant temperature that is below the dew point of ambient air in the room 425, the controller can be configured to activate the preheater to heat the low-temperature coolant 52 to bring the temperature of the low-temperature coolant above the dew point of the ambient air in the room 425. In some examples, the rate of heat addition can be ramped up gradually, and once the temperature detected by the second temperature sensor is above the dew point of the ambient air, the controller can be configured to stop ramping the rate of heat addition and instead hold the heat addition constant. The controller can continue instructing the preheater to heat the low-temperature coolant 52 until preheating is no longer needed. For instance, the controller can continue instructing the preheater to heat the low-temperature coolant 52 until the temperature detected by the first temperature sensor is above the dew point of the ambient air.

Although the preheating process described above includes measuring the temperature of the low-temperature coolant 52 directly, in other examples the surface temperature of the outer surface of the tubing (e.g. 225) can be measured instead of measuring the coolant temperature directly. For instance, temperature sensors can be affixed directly to the outer surface of the tubing (e.g. 225) upstream and downstream of the preheater. In some instances, this approach can permit faster installation of the temperature sensors and can reduce the number of potential leak points in the cooling apparatus 1. In other examples, a contactless temperature-sensing device, such as an infrared temperature sensor, can be used to detect the temperature of the coolant or the temperature of the tubing 225 transporting the coolant.

To ensure the temperature of the low temperature coolant 52 remains above the dew point temperature of the ambient air, the flow rate through the heat exchanger 40 can be decreased and/or the fan speed of a fan 26 mounted on the heat exchanger 40 can be reduced to lower the heat rejection rate from the heat exchanger 40 if a low temperature threshold is detected in the low-temperature coolant. This step can be taken instead of, or in conjunction with, using the preheater to avoid dew formation on any components of the cooling apparatus 1.

In some examples, the heat exchanger 40 can be upstream of the valve 60 in the first bypass 305 (see, e.g. FIG. 12A) and in other examples, the heat exchanger 40 can be downstream of the valve 60 in the first bypass 305 (see, e.g. FIG. 11A). "Downstream" and "upstream" are used herein in relation to the direction of flow 51 of coolant 50 within the cooling apparatus 1. In other examples, the heat exchanger 40 can be located in the second bypass 310 or in the primary cooling loop 300.

The cooling apparatuses (1, 2) shown in FIGS. 11A-11D, 12A-12Q, 12S, 13, 14A, 16-18, and 68-72 may show heat exchangers 40 that appear to be stand-alone heat exchangers. However, in each of these examples, the heat exchanger 40 can be connected to an external heat rejection loop 43 that circulates a flow of external cooling fluid 42, such as water or a water-glycol mixture, as shown in FIGS. 75 and 77. The external heat rejection loop 43 can be fluidly connected to the heat exchanger 40 of the cooling apparatus (1, 2) and can be configured to transfer heat from the dielectric coolant 50 and reject the heat to air or an other fluid outside the room 425 where the cooling system 1 is installed. This allows the cooling apparatus 1 to avoid rejecting the heat into the room 425 where the cooling apparatus is installed, which would increase the temperature of the room air and place a higher load on the room air conditioner. In each example, the external heat rejection loop 43 can be any suitable heat rejection loop 43, such as the heat rejection loops shown in FIGS. 12R and 75-77. The external heat rejection loop 43 can include any suitable external heat exchanger 40, such as a liquid-to-liquid heat exchanger 40-2 as shown in FIG. 77 or an air-to-liquid heat exchanger 40-2 as shown in FIG. 75. Alternately, the heat rejection loop 43 may not include an external heat exchanger, such as in FIG. 76, where a flow of chilled water 46 from a building is connected directly to the heat exchanger 40 of the cooling apparatus 1.

Flow within Cooling Apparatus

Flow rates in the cooling apparatus 1 can be adjusted to ensure stable two-phase flow within the cooling apparatus 1. More specifically, flow rates within the cooling apparatus 1 can be adjusted to promote reliable condensing of vapor within a two-phase flow in the cooling apparatus by mixing the two-phase flow (e.g. 51-2) exiting the one or more heat sink modules 100 with subcooled liquid flow from the first and/or second bypass (e.g. 51-1, 51-3), either within the outlet manifold 215, the return line 230, and/or the reservoir 200. This approach achieves reliable condensing of vapor upstream of the pump 20 to ensure that only single-phase liquid coolant is provided to the pump inlet 21 and, therefore, the pump 20 is only tasked with pumping single-phase liquid coolant, which can be pumped more efficiently and reliably than two-phase flow.

In some examples, the flow rate 51 of coolant 50 provided by the pump 20 in the cooling apparatus 1 can be selected based, at least in part, on the number of heat sink modules 100 fluidly connected to the primary cooling loop 300. In many instances, a flow rate of about 0.25-5, 0.5-1.5, 0.8-1.2, 0.9-1.1, or about 1 liter per minute through each heat sink module 100 can be desirable. For a configuration as shown in FIG. 75, where only one heat sink module 100 is provided, the flow of coolant 51-2 through the primary cooling loop 300 can be about 1.0 liter per minute in one specific example. The flow rate 51-3 delivered to the second bypass 310 can be about equal to the flow rate 51-2 in the primary cooling loop 300 (i.e. 1.0 liter per minute). The flow rate 51-1 in the first bypass 305, which is passed through the heat exchanger 40-1, can be about equal to the sum of the flow rate 51-2 in the primary cooling loop and the flow rate 51-3 in the second bypass 310 (i.e. 51-1=51-2+51-3), or about 2.0 liters per minute. Consequently, the total flow rate 51 provided by the pump 20-1 can be about four times the flow rate 51-2 in the primary cooling loop 300 (i.e. 51=4*51-2). Therefore, the total flow rate 51 provided by the pump 20-1 can be about 4 liters per minute in this specific example. When higher heat loads are encountered, the total flow rate 51 can be increased to ensure flow stability within the cooling apparatus 1.

FIG. 75 shows a basic cooling apparatus 1 having a primary cooling loop 300 with a single heat sink module 100. In more complicated cooling apparatuses 1, such as the cooling apparatus 1 shown in FIG. 78, the flow 51-2 delivered to the primary cooling loop 300 can be distributed among one or more cooling lines 303 extending between an inlet manifold 210 and an outlet manifold 215. Consequently, a portion of the primary cooling loop 300 can include a plurality of cooling lines 303 extending from an inlet manifold 210 to an outlet manifold 215.

In FIG. 78, the inlet and outlet manifolds (210, 215) are configured to accommodate up to twelve cooling lines 303, but only eight cooling lines are shown connected. Consequently, the cooling apparatus 1 in FIG. 78 can be expanded during operation of the cooling apparatus 1 to include four additional cooling lines 303 as additional cooling is required (e.g. as additional servers 400 are added to a rack 410 of servers). Each cooling line 303 can be fluidly connected to the inlet and outlet manifolds (210, 215) using, for example, quick-connect fittings 235. Each cooling line 303 can include one or more heat sink modules 100 arranged on heat-providing surfaces 12, such as on microprocessors 415 in servers 400. When a new server 400 is added to the server rack 405, a new cooling line 303 can be rapidly connected to the inlet and outlet manifolds (210, 215) using quick-connect fittings 235, and each heat sink module 100 that is fluidly connected to the cooling line 303 can be mounted on a heat-providing surface 12 (e.g. microprocessor, RAM, or power supply) within the new server 400 to provide efficient, local cooling. This flexible configuration allows the cooling apparatus 1 to be easily modified to meet the cooling requirements of a growing collection of servers 400 (e.g. in a computer room 425) by simply adding additional cooling lines 303 to the existing cooling apparatus 1. The use of quick-connect fittings 235 can allow additional cooling lines 303 to be added while the cooling apparatus 1 is operating without risking coolant leakage or pressure loss. One example of a suitable quick-connect fitting is a NS4 Series coupling available from Colder Products Company of St. Paul, Minn. The quick-connect fitting 235 can include a non-spill valve and can be made of a glass-filled polypropylene or medical-grade ABS material. The non-spill valve can allow the quick-connect fitting 235 to be disconnected under pressure without spilling any coolant 50. When Novec 7000 is used as the coolant, the quick-connect fitting 235 can include silicone-based grease in the non-spill valve to ensure compatibility with the coolant. Likewise, seals (e.g. o-rings) in the quick-connect fitting 235 can be made of butyl rubber to ensure compatibility with Novec 7000. Silicon-based grease and butyl rubber seals are low cost and easy to obtain. Other compatible materials can also be used.

The quick-connect fitting 235 can include a coupler body and a coupler insert. The coupler body can be the female coupler component, and the coupler insert can be the male coupler component. The coupler body can receive the coupler insert to form a fluid-tight seal. The quick-connect fitting 235 can include one or more seals to provide the fluid-tight seal between the coupler body and the coupler insert.

In some examples, the flow rate 51 provided by the pump 20-1 can be selected based, at least in part, on the number of cooling lines 303 (i.e. maximum number of cooling lines or the actual number of cooling lines 303) extending between the inlet manifold 210 and the outlet manifold 215. For instance, in FIG. 78, the flow rate 51 provided by the pump 20-1 can be selected to accommodate eight cooling lines 303 extending between the inlet manifold 210 and the outlet manifold 215, or the flow rate 51 provided by the pump 20-1 can be selected to accommodate twelve cooling lines 303 extending between the inlet manifold 210 and the outlet manifold 215. Selecting the flow rate 51 to accommodate the actual number of cooling lines 303 (i.e. eight) can provide more efficient operation by reducing the flow rate 51 required from the pump 20-1. Selecting the flow rate 51 to accommodate the maximum number of cooling lines 303 can ensure adequate flow to allow an operator to connect additional cooling lines 303 without resulting in unstable operation of the cooling apparatus 1. The electronic control unit 850 can allow a system operator to input a number of cooling lines 303 through a graphical user interface (GUI). This approach can be useful for cooling apparatuses 1 that are not equipped with sensors 880.

In some examples, the electronic control unit 850 can determine how many cooling lines 303 are connected and automatically adjust the flow 51 if cooling lines are added or removed. For cooling apparatuses 1 that are equipped with sensors that allow the electronic control unit 850 to determine how many cooling lines 303 are connected between the manifolds, the pump 20-1 speed can be adjusted to provide a flow rate 51 based on the number of detected cooling lines 303. In some examples, the sensors can be flow sensors that detect the presence of flow passing through quick connect fitting 235 connected to the manifold. In another example, the sensors 880 can be proximity sensors that detect the presence of quick connect couplers connected to the manifold and output a signal to the electronic control unit 850.

In FIG. 79, the flow rate 51 provided by the pump 20-1 can be selected to accommodate thirty cooling lines 303 extending between the inlet manifold 210 and the outlet manifold 215. This configuration can be suitable for cooling thirty servers 400 arranged in close proximity in a server rack 405. A flow rate of about 1.0 liter per minute can be selected as a suitable flow rate through each cooling line 303. Since there are thirty cooling lines 303, a total flow rate through the primary cooling loop 300 of about 30 liters per minute can be provided. A similar flow rate 51-2 of about 30 liters per minute can be delivered through the second bypass 305, which in the example of FIG. 79 is arranged between the inlet and outlet manifolds (210, 215). The flow rate 51-1 through the first bypass 305 can be about equal to a sum of the flow through the primary cooling loop 300 and the flow through the second bypass 310 (i.e. 51-1=51-2+51-3). Therefore, the flow rate 51-1 through the first bypass can be about 60 liters per minute in this example, and the total flow rate 51 provided by the pump 20-1 can be about 120 liters per minute (51=51-1+51-2+51-3).

In the example shown in FIG. 79, a flow of subcooled liquid coolant 50 can be provided to the inlet manifold 210 by the pump 20-1. In some instances, about half of the flow delivered to the inlet manifold 210 can be routed through the valve 60 in the second bypass 310, and the other half of the flow can be routed through the thirty cooling lines 303. To ensure stable operation of the cooling apparatus 1, it is preferable to condense the two-phase bubbly flow in the outlet manifold 215 or return line 230 before it returns to the reservoir 200. This reduces the chance of vapor being introduced to the pump 20-1 and causing vapor lock or flow instabilities. The amount of heat that can be removed by the cooling apparatus 1 can be defined by the following equation:

$$Q_{sensible} = \dot{m}_{liquid} \times c_p \times \Delta T_{subcooled}$$

where $Q_{sensible}$ is the amount of heat in Watts, $\dot{m}_{liquid}$ is the mass flow rate through the cooling lines 303 and the second bypass 310 (i.e. $\dot{m}_{liquid} = m_{coolant} \times (51\text{-}2+51\text{-}3)$), 51-2 is the flow rate through all cooling lines 303 in the primary cooling loop 300, 51-3 is the flow rate through the second bypass 310, $c_p$ is the specific heat of the coolant in J/(kg-K), and $\Delta T_{subcooled}$ is the difference in degrees C. between the saturation temperature ($T_{sat}$) of the coolant in the inlet manifold 210 and the actual temperature of the coolant in the inlet manifold (i.e. $\Delta T_{subcooled} = T_{sat} - T_{inlet\ manifold}$). In one example of the apparatus 1 shown in FIG. 79, where the coolant is HFE-7000, the specific heat is about 1300 J/(kg-K) and the mass is about 1.4 kg/liter. Altogether, about 30 liters per minute of coolant 50 can be pumped through the cooling lines 303, resulting in 51-2 equaling 30 liters per minute. The flow rate 51-3 being pumped through the second bypass 310 can be about 30 liters per minute. The total flow rate (51-2+51-3) delivered to the inlet manifold 210 can be about 60 liters per minute, which is equal to about 1.4 kg/sec when the coolant is HFE-7000. The coolant 50 delivered to the inlet manifold 210 can be subcooled about 10 degrees C. below its saturation temperature at the inlet manifold pressure. Based on these conditions, the amount of heat Q that can be removed by the cooling apparatus in FIG. 79 is about 18,200 W. Adding 18,200 watts of heat to the coolant 50 will increase the bulk coolant temperature to its saturation temperature. It can be desirable not to exceed this amount of heat, since doing so would not allow for complete condensing of the vapor in the outlet manifold 215 or return line 230 upstream of the reservoir 200. Although condensing can also be accomplished in the reservoir 200, to provide greater stability, it can be desirable to achieve condensing upstream of the reservoir 200 to reduce the chance of vapor being drawn from the reservoir into the pump 20-1.

Within the cooling apparatus 1, heat can be removed from the plurality of heated surfaces 12 by vaporizing the coolant 50 within the heat sink modules 100. In the example discussed above relating to FIG. 79, before vaporization can occur, the subcooled coolant that is delivered to the cooling lines 303 must first heat to its saturation temperature via sensible heating. To simplify this calculation, we assume that all of the flow 51-2 in the cooling lines 303 is heated to its saturation temperature before any vaporization occurs. A flow rate of 30 liters per minute corresponds to a mass flow rate ($\dot{m}_{liquid}$) of about 0.7 kg/sec when using HFE-7000 as the coolant 50. Using the equation above, the heat ($Q_{sensible}$) required to sensibly heat the subcooled liquid to its saturation temperature is about 9,100 W, where $\dot{m}_{liquid}$ is 0.7 kg/sec, $\Delta T_{subcooled}$ is 10 degrees C., and $c_p$ is 1300 J/(kg-K). Since the total amount of heat that can be removed is 18,200 W, and 9,100 W is removed through sensible heating, this leaves 9,100 W to be removed through latent heating. Assuming a heat of vaporization ($\Delta h_{vaporization}$) of about 140 kJ/kg for HFE-7000, we can use the following equation to determine the mass flow rate of vapor that is generated by absorbing 9,100 W of heat:

$$Q_{latent} = \dot{m}_{vapor} \times \Delta h_{vaporization}$$

Where the heat of vaporization is about 140 kJ/kg, providing 9,100 W of heat to coolant that is already at its saturation temperature will produce about 0.065 kg/sec of vapor. Where the mass flow rate of vapor is about 0.065 kg/sec and the mass flow rate of liquid is about 0.7 kg/sec, an average flow quality (x) of about 9% is established. This is safe and stable flow quality (x) corresponding to bubbly flow and is well below the transition to slug flow described in FIG. 59B.

In one example, a method of providing stable operation of a cooling apparatus 1 containing two-phase bubbly flow can include providing a cooling apparatus having a primary cooling loop 300. The primary cooling loop 300 can include a pump 20-1 configured to provide a flow 51 of single-phase liquid coolant 50 at a pump outlet 22-1, as shown in FIG. 81. The flow 51 of single-phase liquid coolant can be a dielectric coolant 50 such as, for example, HFE-7000, HFE-7100, or R-245fa. The dielectric coolant 51 can have a boiling point of about 15-35 or 30-65 degrees C. at a pressure of 1 atmosphere. The primary cooling loop 300 can include a reservoir 200 fluidly connected to the primary cooling loop 300 and located upstream of the pump 20-1 and configured to store a supply of single-phase liquid coolant 50 that can be supplied to an inlet 21-1 of the pump 20-1. The primary cooling loop 300 can include one or more heat sink modules 100 fluidly connected to the primary cooling loop. Each heat sink module 100 can be configured to mount on and remove heat from a heat-providing surface 12, such as a surface associated with a microprocessor 415 in a personal computer or server 400.

The cooling apparatus 1 can include a first bypass 305 having a first end and a second end, as shown in FIG. 81. The first end of the first bypass 305 can be fluidly connected to the primary cooling loop 300 downstream of the pump outlet 22-1. The second end of the first bypass 305 can be fluidly connected to the primary cooling loop 300 at the reservoir 200. The first bypass 305 can include a first heat exchanger 40-1 and a first valve 60-1. The first valve 60-1 can be configured to regulate a first bypass flow 51-1 of the flow 51 of single-phase liquid coolant through the first heat exchanger 40-1. The first heat exchanger 40-1 can be configured to subcool the first bypass flow 51-1 of coolant 50 below a saturation temperature of the coolant.

The cooling apparatus 1 can include a second bypass 310 having a first end and a second end, as shown in FIG. 81. The first end of the second bypass 310 can be fluidly connected to the primary cooling loop 300 downstream of the pump outlet 22-1 and downstream of the first end of the first bypass 305 and upstream of the one or more heat sink modules 100. The second end of the second bypass 310 can be fluidly connected to the primary cooling loop 300 downstream of the one or more heat sink modules 100 and upstream of the reservoir 200. The second bypass 310 can include a second valve 60-2 configured to regulate a second bypass flow 51-3 of the flow 51 of single-phase liquid coolant through the second bypass 310. The second end of the second bypass 310 can be fluidly connected to the primary cooling loop 300 upstream of a return line 230 that transports coolant 50 back to the reservoir 200.

The method can include setting the first valve 60-1 in the first bypass 305 to allow about 30-70% of the flow 51 from the pump outlet 22-1 to be pumped through the first bypass as the first bypass flow 51-1. The method can include setting the second valve 60-2 in the second bypass 310 to allow 15-50% of the flow 51 from the pump outlet 22-1 to be pumped through the second bypass 310 as the second bypass flow 51-3. A remaining portion 51-2 of the flow 51 of single-phase liquid coolant 50 from the pump outlet 22-1 can be pumped through the one or more heat sink modules 100 and transformed into two-phase bubbly flow within the one or more heat sink modules as heat is transferred to the remaining portion 51-2 of the flow from the one or more heat providing surfaces 12. The method can include mixing the two-phase bubbly flow 51-2 with the second bypass flow 51-3 upstream of the reservoir 200 to condense vapor bubbles 275 within the two-phase bubbly flow 51-2.

Setting the first valve 60-1 in the first bypass 305 to allow about 30-70% of the flow 51 from the pump outlet 22-1 to be pumped through the first bypass 305 as the first bypass flow 51-1 can include setting the first valve 60-1 in the first bypass 305 to allow about 30-40, 35-45, 40-50, 45-55, 50-60, 55-65, or 60-70% of the flow 51 from the pump outlet 22-1 to be pumped through the first bypass 305 as the first bypass flow 51-1. Setting the second valve 60-2 in the second bypass 310 to allow 15-50% of the flow 51 from the pump outlet 22-1 to be pumped through the second bypass 310 as the second bypass flow 51-3 can include setting the second valve 60-2 in the second bypass 310 to allow 15-25, 20-30, 25-35, 30-40, or 45-50% of the flow 51 from the pump outlet 22-1 to be pumped through the second bypass 310 as the second bypass flow 51-3.

The primary cooling loop 300 can include an inlet manifold 210 and an outlet manifold 215 and one or more cooling lines 303 extending between the inlet manifold and the outlet manifold, as shown in FIGS. 79 and 81. The one or more heat sink modules 100 can be fluidly connected to the one or more cooling lines 303. Setting the second valve 60-2 can include setting the second valve 60-2 to provide a flow rate of about 0.25-1.5, 0.7-1.3, 0.8-1.2, 0.9-1.1, or 1.0 liters per minute of coolant 50 through each of the one or more cooling lines 303. Setting the first valve 60-1 can include establishing a pressure differential of about 5-15 psi between an inlet and an outlet of the first valve 60-1. Likewise, setting the second valve 60-2 can include establishing a pressure differential of about 5-15 psi between an inlet and an outlet of the second valve 60-2.

In another example, a method can allow cooling lines 303 extending from an inlet manifold 210 to an outlet manifold 215 of an operating cooling apparatus 1, as shown in FIG. 78, to be safely added or removed without causing unstable two-phase flow to develop within the cooling apparatus 1. The method can include providing a cooling apparatus 1 with an inlet manifold 210, an outlet manifold 215, a bypass 310 extending from the inlet manifold 210 to the outlet manifold 215, and M connection ports 235 on each of the inlet manifold and the outlet manifold to accommodate up to M cooling lines 303 extending between the inlet manifold and the outlet manifold, where M is a variable. The bypass 310 can include a valve 60-2. The method can include providing a flow rate 51 of single-phase liquid coolant 50 to the inlet manifold 210 and setting the valve 60-2 in the bypass 310 to provide a flow rate through the bypass ($\dot{V}_{bypass}$) 51-3 of about $(M \times \dot{V}_{line}) + (M-L) \times \dot{V}_{line}$, where $\dot{V}_{line}$ is an average flow rate through each of the cooling lines, where L is the actual number of cooling lines 303 installed between the inlet manifold and the outlet manifold, and L is equal to or less than M. In FIG. 78, M is twelve, and L is eight. In some examples, $\dot{V}_{line}$ can be about equal to 0.25-1.5, 0.7-1.3, 0.8-1.2, 0.9-1.1, or 1.0 liters per minute of coolant, and M can be 1-10, 5-15, 10-30, 20-40, 30-60, 50-100, 75-150, or 120-240. Where more than one set of manifolds are used, M can represent the total number of cooling lines that can be accommodated. For example, in FIG. 80, M is equal to 60 where two sets of manifolds are used and each set can accommodate 30 cooling lines 303.

Providing the flow rate of single-phase liquid coolant 50 to the inlet manifold 210 can include providing a flow rate of single-phase, dielectric coolant including HFE-7000, HFE-7100, or R-245fa. The boiling point of the dielectric coolant can be about 15-35 or 30-65 degrees C. at a pressure of 1 atmosphere. Providing the flow rate of single-phase liquid coolant to the inlet manifold 210 can include providing a flow of single-phase liquid coolant 50 that is subcooled below a saturation temperature ($T_{sat}$) of the single-phase liquid coolant. Providing the flow rate of single-phase liquid coolant that is subcooled below a saturation temperature of the single-phase liquid coolant can include providing a flow of single-phase liquid coolant 50 that is subcooled about 2-8, 5-10, or 12-15 degrees C. below the saturation temperature ($T_{sat}$) of the single-phase liquid coolant. Providing the flow rate of single-phase liquid coolant to the inlet manifold 210 can include providing a flow rate of single-phase liquid coolant at a pressure of about 5-20, 15-25, or 20-35 psia.

In yet another example, a method of selecting flow rates to provide stable operation within a cooling apparatus 1 in which two-phase bubbly flow is present can include providing a cooling apparatus having a primary cooling loop 300. The primary cooling loop can include a pump 20-1 configured to provide a flow rate 51 of single-phase liquid coolant at a pump outlet. The flow rate of single-phase liquid coolant at the pump outlet can be a dielectric coolant such as, for example, HFE-7000, HFE-7100, or R-245fa with a boiling point of about 15-35 or 30-65 degrees C. at a pressure of 1 atmosphere. The primary cooling loop 300 can include a reservoir 200 fluidly connected to the primary cooling loop 300 and located upstream of the pump 20 and configured to store a supply of single-phase liquid coolant 50 for the pump 20. The primary cooling loop 300 can include one or more cooling lines 303 fluidly connected to the primary cooling loop 300 and extending between an inlet manifold 210 and an outlet manifold 215, as shown in FIGS. 75, 79, 80, and 81. Each cooling line 303 can be fluidly connected to one or more heat sink modules 100, and each heat sink module 100 can be mounted on a heat-providing surface 12, such as a surface associated with a microprocessor 415, memory module 420, or power supply of a personal computer or server 12.

The cooling apparatus 1 can include a first bypass 305 having a first end and a second end. The first end of the first bypass 305 can be fluidly connected to the primary cooling loop 300 downstream of the pump outlet 22-1. The second end of the first bypass 305 can be fluidly connected to the primary cooling loop 300 upstream of the reservoir 200 and downstream of the heat sink modules 100. The first bypass 305 can include a first heat exchanger 40-1 and a first valve 60-1. The first valve 60-1 can be configured to regulate a first bypass flow rate 51-1 of the flow rate 51 of single-phase liquid coolant 50 through the first heat exchanger 40-1. The first heat exchanger 40-1 can be configured to subcool the first bypass flow rate 51-1 of coolant 50 below a saturation temperature of the coolant 50.

The cooling apparatus 1 can include a second bypass 310 having a first end and a second end. The first end of the second bypass 310 can be fluidly connected to the primary cooling loop 300 downstream of the pump 20, downstream of the first end of the first bypass 305, and upstream of the one or more heat sink modules 100. The second end of the second bypass 310 can be fluidly connected to the primary cooling loop 300 downstream of the one or more heat sink modules 100 and upstream of the reservoir 200. The second bypass 310 can include a second valve 60-2 configured to regulate a second bypass flow rate 51-3 of the single-phase liquid coolant 50 through the second bypass 310.

The method can include setting the second valve 60-2 to provide a flow rate of about $\dot{V}_{line}$ through each of the cooling lines 303 and to provide the second bypass flow rate 51-3 about equal to $L \times \dot{V}_{line}$, where L is the number of cooling lines 303 extending between the inlet manifold 210 and the outlet manifold 215. The method can include setting the first valve 60-1 to provide the first bypass flow rate 51-1 about equal to $2L \times \dot{V}_{line}$. The average flow rate ($\dot{V}_{line}$) of coolant through each cooling line 303 can be about equal to 0.25-5, 0.25-1.5, 0.7-1.3, 0.8-1.2, 0.9-1.1, or 1.0 liter per minute.

In one example, a method of condensing vapor present in two-phase bubbly flow within a cooling apparatus 1 can include providing a first flow (e.g. 51-2) of coolant including two-phase bubbly flow. The two-phase bubbly flow can include vapor bubbles 275 dispersed in liquid coolant 50. The first flow of coolant can have a first flow quality greater than zero. The method can include providing a second flow (e.g. 51-3) of coolant including single-phase liquid flow. The second flow of coolant can have a second flow quality of about zero. The method can include mixing the first flow of coolant and the second flow of coolant to form a third flow of coolant, as shown in the return line 230 in FIG. 81. Mixing the first flow of coolant and the second flow of coolant can cause heat transfer from the first flow of coolant to the second flow of coolant and can cause vapor bubbles 275 within first flow of coolant to condense (e.g. within the return line 230 and/or in the reservoir 200). The third flow of coolant can have a third flow quality less than the first flow quality of the first flow of coolant.

Providing the first flow (e.g. 51-2) of coolant can include providing a first predetermined flow rate (e.g. $\dot{V}_{line}$) of two-phase bubbly flow. Providing the second flow (see, e.g. 51-3 and/or 51-1 in FIG. 81) can include providing a second predetermined flow rate of single-phase liquid flow. The second predetermined flow rate can be greater than or equal to the first predetermined flow rate. The second predetermined flow rate can be at least two times greater than the first predetermined flow rate. The second predetermined flow rate can be at least four times greater than the first predetermined flow rate. The first flow quality can be about 0.05-0.10, 0.07-0.15, 0.10-0.20, 0.15-0.25, 0.2-0.4, or 0.3-0.45. The second flow quality can be about zero. The third flow quality can be about 0-0.05, 0.04-0.1, 0.08-0.15, or 0.1-0.2. The first predetermined flow rate can be about 0.1-10, 0.2-5, 0.3-2.5, 0.6-1.2, or 0.8-1.1 liters per minute. Providing the first flow of coolant can include providing the first flow of coolant from a primary cooling line 303 including a heat sink module 100 fluidly connected to the primary cooling line 303. The heat sink module 100 can be configured to mount on a heat-providing surface 12. Providing the second flow of coolant can include providing the second flow of coolant from a bypass. The bypass (e.g. 310) can include a valve 60 configured to control a flow rate of the second flow of coolant through the bypass.

In another example, a method of condensing vapor in two-phase bubbly flow in a cooling apparatus 1 can include providing a first flow (e.g. 51-2) of coolant including two-phase bubbly flow, as shown in the section of tubing 225 connected to the outlet port 110 of the heat sink module 100 in FIG. 81. The two-phase bubbly flow can include liquid coolant and a plurality of vapor bubbles 275 of coolant suspended in the liquid coolant. The first flow can have a first flow quality. The first flow can have a first predetermined pressure of about 10-20, 15-25, or 20-30 psia and a first temperature about equal to a saturation temperature of the first flow of coolant at the first predetermined pressure. The method can include providing a second flow (e.g. 51-3) of coolant including single-phase liquid flow having a second flow quality. The second flow can have a second predetermined pressure of about 10-20, 15-25, or 20-30 psia and a temperature below the saturation temperature of the second flow of coolant at the second predetermined pressure. The method can include mixing the first flow and the second flow to form a third flow of coolant having a third flow quality. The third flow quality can be less than the first flow quality of the first flow.

Providing the first flow (e.g. 51-2) can include providing a first predetermined flow rate (e.g. $\dot{V}_{line}$) of two-phase bubbly flow. Providing the second flow (e.g. 51-3) can include providing a second predetermined flow rate of single-phase flow. The second predetermined flow rate can be greater than or equal to the first predetermined flow rate. The second predetermined flow rate can be at least two times greater than the first predetermined flow rate. The second predetermined flow rate can be at least four times greater than the first predetermined flow rate. The first flow quality can be about 0.05-0.10, 0.07-0.15, 0.10-0.20, 0.15-0.25, 0.2-0.4, or 0.3-0.45. The second flow quality can be about zero. The third flow quality can be about 0-1, 0-0.5, 0-0.25, 0-0.2, 0-0.05, 0-0.02, or 0-0.1. The first predetermined flow rate (e.g. $\dot{V}_{line}$) can be about 0.1-10, 0.2-5, 0.3-2.5, 0.6-1.2, or 0.8-1.1 liters per minute. Mixing the first flow with the second flow to form the third flow can result in condensing of at least a portion of the plurality of vapor bubbles 275 from the first flow as heat is transferred from the first flow to the second flow. The first flow can include a dielectric coolant including R-245fa, HFE-7000, or HFE-7100.

In yet another example, a method of condensing vapor in two-phase bubbly flow in a cooling apparatus 1 can include providing a cooling apparatus having an inlet manifold 210, an outlet manifold 215, a cooling line 303 extending from the inlet manifold to the outlet manifold, and a bypass 310 extending from the inlet manifold to the outlet manifold, as shown in FIG. 79. The cooling line 303 can be fluidly connected to a heat sink module 100 that is mounted on a heat-providing surface 12. The method can include providing a flow of single-phase liquid coolant to the inlet manifold. The method can include flowing a first flow portion of the flow of single-phase liquid coolant through the cooling line 303 from the inlet manifold 210 to the outlet manifold 215. The first flow portion can pass through the heat sink module 100 and can absorb a sufficient amount of heat from the heat-providing surface 12 to cause a fraction of the first flow portion to change phase from liquid to a vapor thereby forming a two-phase bubbly flow of coolant. The method can include flowing a second flow portion of the flow of single-phase liquid coolant through the bypass line 310 from the inlet manifold 210 to the outlet manifold 215. The method can include mixing the first flow portion and the second flow portion in the outlet manifold 215 to form a mixed flow. Mixing the first and second flow portions can cause heat transfer from the first flow portion to the second flow portion thereby condensing at least a portion of the vapor from the first flow portion. Flowing the first flow portion of the flow of single-phase liquid coolant through the cooling line 303 can include flowing a first flow rate of about 0.1-10, 0.2-5, 0.3-2.5, 0.6-1.2, or 0.8-1.1 liters per minute of coolant through the first cooling line 303. Flowing the second flow portion of the flow of single-phase liquid coolant through the bypass line 310 can include flowing a second flow rate through the bypass. The second flow rate can be greater than or equal to the first flow rate.

In one example, a method of providing a continuous flow of single-phase liquid to a pump 20 in a cooling apparatus 1, in which two-phase flow is present but is condensed upstream of the pump 20 to provide stable pump operation, can include providing a cooling apparatus 1 having a reservoir 200 fluidly connected to a pump 20. The reservoir 200 can be configured to store an amount of coolant 50, such as a dielectric coolant. The reservoir 200 can have a liquid-vapor interface 202 in an upper portion of the reservoir when partially filled with liquid coolant. The liquid-vapor interface 202 can be an interface located between an amount of substantially liquid coolant 50 and an amount of substantially vapor coolant, as shown in FIGS. 81-83. The method can include delivering an inlet flow of single-phase liquid coolant to the reservoir 200. The method can include delivering two-phase bubbly flow to an upper portion of the reservoir 200 above the liquid-vapor interface 202. The two-phase bubbly flow of coolant can include vapor bubbles of coolant dispersed in liquid coolant. The vapor bubbles 275 can condense upon interacting with and transferring heat to the amount of liquid coolant 50 in the reservoir 200. The method can include delivering a continuous outlet flow of single-phase liquid from a lower portion of the reservoir 200 to a pump 20 to provide stable pump operation. The lower portion can be located below a midpoint of the reservoir 200, and in some cases can be located at a bottom surface of the reservoir 200 as shown in FIGS. 81-83.

The inlet flow of single-phase liquid coolant can have a first flow rate, and the two-phase bubbly flow can have a second flow rate. The first flow rate can be equal to or greater than the second flow rate. The amount of liquid coolant in the reservoir 200 can occupy about 50-90, 60-80, or 65-75 percent of an interior volume of the reservoir. The flow of single-phase liquid coolant to reservoir can include providing a flow of single-phase liquid coolant that is subcooled below its saturation temperature. Providing the flow of single-phase liquid coolant that is subcooled below its saturation temperature can include providing a flow of single-phase liquid coolant that is subcooled about 2-8, 5-12, or 10-15 degrees C. below its saturation temperature. Providing the flow of single-phase liquid coolant to the reservoir can include providing a flow of single-phase liquid coolant at a pressure of about 10-20, 15-25, 20-30, or 25-40 psia. Providing the flow of single-phase liquid coolant to the reservoir can include providing a flow of single-phase coolant including a dielectric coolant with a boiling point of about 10-35, 20-45, 30-55, or 40-65 degrees C., where the boiling point is determined at a pressure of 1 atmosphere.

In another example, a method of providing stable operation of a pump 20 in a two-phase cooling apparatus 1 by condensing a two-phase flow upstream of the pump 20 and providing substantially single-phase liquid coolant to the pump 20 to ensure stable pump operation can include providing a first flow of coolant having a two-phase bubbly flow of coolant. The two-phase bubbly flow of coolant can include vapor bubbles 275 of coolant dispersed in liquid coolant. The first flow of coolant can have a first flow quality greater than zero. The method can include providing a second flow of coolant being a single-phase flow of coolant. The second flow of coolant can have a second flow quality of about zero. The method can include mixing the first flow of coolant (e.g. 51-2) and the second flow of coolant (e.g. 51-3) to form a return flow of coolant, as shown in FIGS. 81 and 82. Mixing the first flow of coolant and the second flow of coolant can cause heat transfer from the first flow of coolant to the second flow of coolant and can cause at least a portion of the vapor bubbles 275 of coolant within first flow of coolant to condense. The return flow of coolant can have a return flow quality that is less than the first flow quality of the first flow of coolant. The method can include delivering the return flow of coolant to a reservoir 200. The reservoir 200 can contain a supply of subcooled single-phase liquid coolant. Mixing the return flow with the supply of subcooled single-phase liquid coolant can cause heat transfer from the return flow to the supply of subcooled single-phase liquid coolant thereby condensing any remaining vapor bubbles in the return flow. The method can include providing an outlet flow of subcooled single-phase liquid coolant from the reservoir 200 to a pump 20 to ensure stable pump operation. The method can include delivering a third flow (e.g. 51-1) of coolant to the reservoir 200, as shown in FIG. 81. The third flow of coolant (e.g. 51-1) can be a single-phase flow of coolant. The third flow of coolant can pass through a heat exchanger (e.g. 40-1) and be subcooled to about 10-15, 12-20, or 15-30 degrees C. below its saturation temperature before being delivered to the reservoir 200.

Providing the outlet flow of subcooled single-phase liquid coolant from the reservoir 200 to the pump 20 can include providing a flow of single-phase liquid coolant that is subcooled about 2-8, 5-12, or 10-15 degrees C. below its saturation temperature. Delivering the return flow of coolant to the reservoir 200 can include delivering the return flow of coolant to an upper portion of the reservoir 200 above a liquid-vapor interface 202 in the reservoir. The liquid-vapor interface can separate an amount of substantially liquid coolant 50 from an amount of substantially vapor coolant 203. The first flow quality of the first flow of coolant can be greater than zero and less than about 0.2, 0.25, 0.3, 0.35, 0.4, 0.45, or 0.5. The reservoir 200 can be in thermal communication with a heat exchanger 40, as shown in FIG. 82. The heat exchanger 40 can be configured to circulate a chilled fluid (e.g. a water-glycol mixture) through sealed passageways (e.g. copper tubing extending into the reservoir or in thermal contact with a sidewall of the reservoir) that serves to subcool coolant within the reservoir 200 to about 2-8, 5-12, or 10-15 degrees C. below its saturation temperature. Delivering the return flow of coolant to the reservoir can include directing the return flow of coolant against an inner surface of the reservoir 200 to promote condensing of the vapor bubbles 275 in the return flow of coolant.

In yet another example, a method of providing stable operation of a pump 20 in a two-phase cooling apparatus 1 by condensing a two-phase flow upstream of the pump 20 and providing substantially single-phase liquid coolant to the pump 20 to ensure stable pump operation can include providing a cooling apparatus 1. The cooling apparatus 1 can include an inlet manifold 210, an outlet manifold 215, a cooling line 303 extending from the inlet manifold to the outlet manifold, and a bypass 310 extending from the inlet manifold 210 to the outlet manifold 215, as shown in FIGS. 79 and 81. The cooling line 303 can be fluidly connected to a heat sink module 100 that is mounted on a heat-providing surface. The method can include providing a flow of single-phase liquid coolant to the inlet manifold. The method can include flowing a first flow portion (e.g. $\dot{V}_{line}$) of the flow of single-phase liquid coolant through the cooling line 303 from the inlet manifold 210 to the outlet manifold 215. The first flow portion (e.g. $\dot{V}_{line}$) can pass through the heat sink module 100 and absorb a sufficient amount of heat from the heat-providing surface 12 to cause a fraction of the first flow portion to change phase from a liquid to a vapor thereby forming a two-phase bubbly flow of coolant. The method can include flowing a second flow portion (e.g. 51-2) of the flow of single-phase liquid coolant through the bypass 310 from the inlet manifold 210 to the outlet manifold 215. The method can include mixing the first flow portion (e.g. $\dot{V}_{line}$) and the second flow portion (e.g. 51-2) in the outlet manifold 210 to form a mixed flow. Mixing the first and second flow portions can cause heat transfer from the first flow portion to the second flow portion thereby condensing at least a portion of the vapor 275 from the first flow portion. The method can include delivering the mixed flow to a reservoir 200 containing a supply of subcooled liquid coolant 50 where any remaining vapor 275 from the mixed flow is condensed to liquid. The method can include providing an outlet flow of substantially liquid coolant from a lower portion of the reservoir 200 to a pump 20 to provide stable pump operation.

Flowing the first flow portion of the flow of single-phase liquid coolant through the cooling line 303 can include flowing a first flow rate of about 0.1-10, 0.2-5, 0.3-2.5, 0.6-1.2, or 0.8-1.1 liters per minute of coolant through the cooling line 303. Flowing the second flow portion of the flow of single-phase liquid coolant through the bypass 310 can include flowing a second flow rate through the bypass. The second flow rate can be greater than or equal to the first flow rate. Providing the flow of single-phase liquid coolant to the inlet manifold 210 can include providing a flow of single-phase liquid coolant that is subcooled about 2-8, 5-10, or 12-15 degrees C. below its saturation temperature. Providing the flow of single-phase liquid coolant to the inlet manifold can include providing a flow of single-phase liquid coolant at a pressure of about 10-20, 15-25, 20-30, or 25-45 psia. Providing the flow of single-phase liquid coolant to the inlet manifold 210 can include providing a flow of single-phase dielectric coolant, such as HFE-7000, HFE-7100, or R-245fa. The method can include routing a third flow portion (e.g. 51-1) of the flow of single-phase liquid coolant from the reservoir 200 through a heat exchanger 40-1 and back to the reservoir 200 to provide a flow of subcooled single-phase liquid coolant to the reservoir, as shown in FIGS. 79 and 81. The third flow portion can be subcooled about 10-15, 12-20, or 15-30 degrees C. below its saturation temperature upon exiting the heat exchanger and returning to the reservoir.

Cooling with Dry Cooler

FIG. 12P shows a schematic of a cooling apparatus 1 having a primary cooling loop 300, a first bypass 305, and a second bypass 310, where the first bypass 305 is connected to a heat exchanger 40 that can be a rooftop dry cooler. The cooling apparatus 1 can include an electronic control system 850 having a microcontroller that receives inputs from sensors regarding flow rate, pressure, and temperature and determines heat removed (W), rate of heat removed (kW-h over time), and pump 20 power consumption. The cooling apparatus 1 can include two pumps 20 arranged in a parallel configuration for redundancy. Shut-off valves 250 can be provided near each pump inlet 21 and outlet 22, thereby allowing for hot-swapping of a failed pump 20. The shut-off valves 250 can be electronically controlled by the electronic control system 850 or manually controlled, depending on the complexity of the cooling apparatus 1. Where the shut-off valves 250 are electronically controlled, a motor fail-safe 855 (see, e.g. FIG. 12P) can be provided to monitor the status of the pumps 20, and in case of pump failure, can deactivate the failed pump and activate the non-failed pump to ensure continued flow of coolant through the primary cooling loop 300 to the surface to be cooled 12. In some examples, the cooling apparatus 1 can include a strainer 260 downstream of the pumps 20 and a filter 260 upstream of the pumps 20. In some examples, the valve 60 located between the heat exchanger 40 and the reservoir 200 can be a back-pressure valve, such as a liquid relief valve manufactured by Kunkle Valve and available from Pentair, Ltd. of Minneapolis, Minn. In some examples, the valve 60 positioned in the first bypass 305 can be a back pressure valve, such as a liquid relief valve manufactured by Cash Valve, also available from Pentair, Ltd.

Electronic Control Unit

The cooling apparatus 1 can include an electronic control unit 850, as shown in FIGS. 12Q, 74, 83, and 115. The electronic control unit 850 can monitor and enable remote monitoring of cooling system performance when electrically or wirelessly connected to a network 960. In FIGS. 12Q, 74, 83, and 115, dashed lines connecting the electronic control unit 850 to other components (e.g. sensors 880) indicate electrical or wireless connections.

In some examples, the electronic control unit 850 can dynamically adjust cooling system parameter based on inputs from one or more sensors 880 to improve system performance and stability and/or reduce power consumption of the cooling apparatus 1. In some examples, the electronic control unit 850 can include a microcontroller. The microcontroller can be electrically or wirelessly connected to one or more system components, such as a heat exchanger fan 26 (where a liquid-to-gas heat exchanger 40 is used), a valve 60, a shut-off valve, or a pump 20. The microcontroller can be configured to dynamically adjust settings (e.g. pump speed, valve angle, fan speed) of the one or more components within the cooling apparatus 1 during operation of the cooing apparatus to enhance performance and/or reduce overall power consumption. In one example, the microcontroller can be electrically connected to a variable speed drive (VSD) 80 of the pump 20. A variable speed drive 80 can be used to control pump speed. Pump speed can be selected from predetermined speeds or can be infinitely adjustable within an operating range to optimize system performance and/or efficiency. The variable speed drive 80 can be mechanical, electromechanical, hydraulic, or electric.

FIG. 115 shows a cooling apparatus 1 having a primary cooling loop 300 with a first pump 20-1 and a heat rejection loop 43 with a second pump 20-2. The first pump 20-1 can be connected to a first variable speed drive 80-1 capable of varying the speed of the first pump 20-1, and the second pump 20-2 can be connected to a second variable speed drive 80-2 capable of varying the speed of the second pump 20-2. The first and second variable speed drives (80-1, 80-2) can be electrically connected to the microcontroller of the electronic control unit 850. Based on inputs from one or more sensors 880 (e.g. temperature, pressure, flow quality, or flow rate), the microcontroller can instruct the variable speed drive 80 to decrease pump speed to reduce power consumption when the thermal load from the heat-providing surfaces 12 is low and/or decreasing or when the flow quality (x) of the two-phase flow in the return line 230 is less than about 0.4, 0.3, 0.2, or 0.1. By reducing pump speed, the operating pressure at the pump outlet 22 is decreased, thereby decreasing the flow rate through the cooling apparatus 1 and the heat sink modules 100, which can promote boiling in the modules leading to more vapor bubble generation and higher flow quality (x). The ability to operate the variable speed drive 80 at a lower speed conserves energy, and is therefore desirable. Where the cooling apparatus 1 includes independent redundant cooling loops, the electronic control system 850 can be configured to operate a first cooling loop while a second cooling loop remains on standby. In some examples, the electronic control system 850 can be configured to activate the second cooling loop only if the first cooling loop experiences a malfunction or is otherwise unable to effectively cool the surface to be cooled 12. In this way, the redundant cooling apparatus 1 can reduce power consumption by about 50% compared to a redundant cooling apparatus where both cooling loops operate continuously.

When a redundant cooling apparatus is provided, the apparatus may run for long periods of time (e.g. years) without experiencing any malfunctions or component failures. During these long periods of time, only one cooling loop is needed and the other cooling loop will remain on standby. To ensure that each cooling loop remains functional and ready to operate when needed, the electronic control system 850 can alternate between operating the first cooling loop and the second cooling loop when only one cooling loop is needed. For instance, the control system can be configured to activate the first cooling loop for a certain period of time (e.g. a number of hours or days) while the second cooling loop remains on standby. Once the certain period of time has passed, the electronic control system 850 can then activate the second cooling loop, and once the second cooling loop is operating as desired, can place the first cooling loop on standby. Cycling between operating the first cooling loop and operating the second cooling loop can extend the life of certain system components within each loop (e.g. pump seals) and can increase the likelihood that the standby loop is ready for operation if the other cooling loop experiences a malfunction. Cycling between the first and second cooling loops can also ensure that operating time is equally distributed between the two cooling loops, thereby potentially increasing the overall useful life of the redundant cooling apparatus 1.

The cooling apparatus 1 can include one or more sensors 880 that deliver data to the electronic control system 850 to allow a malfunction within the cooling apparatus 1 to be detected and communicated to a facility operator. The cooling apparatus 1 can include one or more sensors 880, such as temperature sensors, pressure sensors, visual flow sensors, flow quality (x) sensors, vibration sensors, smoke detectors, flow rate sensors, fluorocarbon detectors, or leak detectors that provide data to the electronic control system 850. Each sensor 880 can be electrically connected or wirelessly connected to the electronic control system 850, as shown in FIGS. 12Q, 74, 83, and 115. Upon detection of a malfunction within the cooling apparatus 1, the electronic control system 850 can be configured to notify a system operator, for example, with a visual or audible alarm. The electronic control system 850 can be configured to communicate with a network 960 and send an electronic message (e.g. an email or text message) to a system operator to alert the operator of the malfunction. The electronic message can include specific details associated with the malfunction, including data recorded from the one or more sensors 880 connected to the electronic control system 850. The electronic message can also include a part number associated with the component that has likely failed to permit the operator to immediately determine if the part exists in local inventory, and if not, to order a replacement part from a vendor as soon as possible. The electronic message, and any data relating to the malfunction, can be stored in a computer readable medium and/or transmitted to the system manufacturer for quality control, warranty, and/or recall purposes.

The electronic control unit 850 can include processing circuitry that receives measurement signals from one or more sensors 880 via cables 852. The processing circuitry can include one or more microcontrollers, microprocessors, digital signal processors (DSPs), field programmable gate arrays (FPGAs), programmable logic devices (PLDs), application specific integrated circuits (ASICs), or the like. In some cases, the functions of processing circuit may be also be performed by discrete digital components and/or discrete analog components. Cables 852 may include any type of wire, electrical conductor, conductive material, fiber optics, and/or another medium for communicating information between the sensors 880 and processing circuitry. In some cases, one or more of sensors 880 may communicate with the processing circuitry wirelessly.

The sensors 880 may provide measurement signals or data to the processing circuitry in raw or unconditioned form. The sensors 880 may also provide measurement signals or data to the processing circuitry in conditioned form. For example, measurement signals or data may be conditioned, filtered, normalized, averaged, and/or scaled by a sensor 880 prior to transmission to the processing circuitry over the cable 852. In addition, one or more of the sensors 852 may provide a digital or digitized signal to the processing circuitry. Consequently, an analog-to-digital converter (ADC) may be included in the sensor 880 or processing circuitry. It is understood by those of skill in the art that processing circuitry and/or sensors 880 may include various other electrical components, including integrated circuits (ICs) and/or discrete components.

While sensors 880 are illustrated as being interconnected to processing circuitry with individual cables 852 in a hub and spoke configuration, it should be understood that other configurations are possible. For example, sensors 880 may be connected to processing circuitry in a serially connected or daisy chain configuration.

Processing circuitry may be implemented on a single printed circuit board (PCB), multiple PCBs, a flex circuit, and/or multiple flex circuits. Distributing processing circuitry may be advantageous to place certain components in a better position for communications with external devices, to facilitate ease of replacing damaged or outdated sections, and/or to better protect certain elements of the processing circuitry from damage. The processing circuitry may be encased in a housing or sealed by other means to protect it from moisture, dirt, dust, impact, shock, and/or other environmental hazards. In some cases, the processing circuitry may include a housing or other protective element that blocks radiation at certain frequencies or frequency ranges. For example, the processing circuitry may be hardened against electromagnetic pulse, atomic radioactive radiation, cosmic rays, heat, and/or the like.

One or more of the sensors 880 may communicate with the processing circuitry through wireless communication. Wireless communication may take place using one or more wireless communication protocols such as Bluetooth, Bluetooth Low Energy, ZigBee, and/or WiFi. Alternatively, wireless communication may be implemented using known methods of optical or infrared communication.

The processing circuitry of the electronic control unit 850 can include other components, modules, or subsystems, such as processors, memory, and communication circuitry. Processors may include one or more microcontrollers, microprocessors, digital signal processors (DSPs), field programmable gate arrays (FPGAs), programmable logic devices (PLDs), application specific integrated circuits (ASICs), and/or the like. Memory may include one or more memory devices for storing computer instructions and/or data. Memory may include random access memory (RAM), dynamic RAM (DRAM), flash memory, electrically programmable read only memory (EPROM), erasable EPROM (EEPROM), a hard drive, a memory card, a tape drive, micro electro mechanical (MEMs) storage devices, and/or a combination thereof. Memory may be contained in a single device or distributed among a plurality of devices. In addition, some or all of memory may be contained in the processors or in another device in the system. The memory device may store non-transitory computer-readable instructions for execution by the processor. The memory may also store data received from other sources such as directly from the sensors 880 and/or or from external devices or systems for temporary or long-term storage.

An antenna is any device for facilitating wireless communication between the communication circuitry and an external device. The antenna may be integrated into a printed circuit board associated with the processing circuitry, may be attached to some element of the processing circuitry, or may be separate from processing circuitry. The antenna may be a single antenna or may include an array of antennas. The antenna may include a wire antenna, a dipole antenna, a monopole antenna, a travelling wave antenna, a reflector antenna, a microstrip antenna, an aperture antenna, a log-periodic antenna, and/or another type of antenna. The communication circuitry and the antenna may support unidirectional communication or bidirectional communication.

The processing circuitry can include communication circuitry. The communication circuitry may include various digital components, analog components, radio frequency (RF) components, and/or ICs configured to provide communication capabilities between elements of the cooling apparatus 1 and a facility network 960. The provided communication capabilities may include wired, wireless, and/or optical communication.

The communication circuitry may include elements for performing communications in more than one protocol, format, or standard. For example, the communication circuitry can include a Bluetooth Low Energy (BLE) module, WiFi module, general packet radio service (GPRS) module, Global System for Mobile Communications (GSM) module, ZigBee module, and/or WiMax module. The communication circuitry can include any combination or subset of these elements including configuration that includes modules for other communication protocols such as LTE, LTE-A, HSDPA, or the like. In some cases, any of the sensors 880 may interface directly with and communicate directly through the communication circuitry or may communicate through the processing circuitry.

Portable Cooling Device

FIG. 74 shows a portable cooling device 750 that includes a plurality of heat sink modules 100 mounted on a portable layer 755. In some examples, the portable layer 755 can be a rigid material, such as metal, carbon fiber composite, or plastic. In other examples, the portable layer 755 can be a conformable material, such as fabric, foam, or an insulating blanket. The portable layer 755 can be contoured to correspond to any heated surface 12. The plurality of heat sink modules (100, 700) can be attached to the portable layer 755 by any suitable method of adhesion. The heat sink modules (100, 700) can be fluidly connected in series and/or parallel configurations. The portable cooling device 750 can include one or more inlet connections 236 and one or more outlet connections 237 that can be connected to a cooling apparatus 1 that delivers a flow of pressurized coolant 50 to the portable cooling device 750 to permit cooling of the heated surface 12 through sensible and latent heating of the coolant within the plurality of heat sink modules. In some examples, each heat sink module can be mounted on a thermally conductive base member 430. Where the portable layer 755 is made from an insulated blanket or other insulating member, the portable cooling device 750 can be wrapped around a vessel to cool the vessel and its contents. In this example, the portable layer 755 can include suitable fastening devices (e.g. snaps, ties, zippers, Velcro, or magnets) to allow the portable cooling device to be removably attachable to the vessel.

Heat Pipe

A heat pipe can be used as the thermally conductive base member 430. The heat pipe can include a sealed casing and a wick, a vapor cavity, and a working fluid within the sealed casing. In some examples, the working fluid can be R134a. During a thermal cycle of the heat pipe, the working fluid evaporates to vapor as it absorbs thermal energy (e.g. from a microprocessor 415 in a server 400). The vapor then migrates along the vapor cavity from a first end of the heat pipe toward a second end of the heat pipe, where the second end is at a lower temperature than the first end. As the vapor migrates toward the second end of the heat pipe, it cools and condenses back to fluid, which is absorbed by the wick. The fluid in the wick then flows back to the first end of the heat pipe due to gravity or capillary action. The thermal cycle then repeats itself.

In some cooling applications, size, shape, or environmental constraints may prevent a heat sink module 100 from being placed directly on a component or device that requires cooling. In these examples, a heat pipe can be used to transfer heat from the component or device to the heat sink module 100 located at a distance from the component or device. For instance, a first portion of the heat pipe can be placed in thermal communication with a heat-providing surface, and the heat sink module 100 can be placed in thermal communication with a second portion of the heat pipe, where the second portion is a distance from the first portion. This approach can allow the heat sink module 100 to efficiently absorb heat from the heat-providing surface without being in direct contact or near the heat-providing surface.

By using one or more heat pipes, a single heat sink module (100, 700) can be used to cool two or more heat sources. In one example, a server 400 can have two microprocessors 415. A first heat pipe can have a first end in thermal communication with a first microprocessor 415 and a second end in thermal communication with a copper base plate 430. A second heat pipe can have a first end in thermal communication with a second microprocessor 415 and a second end in thermal communication with the same copper base plate 430. A heat sink module (100, 700) can be mounted on a surface to be cooled 12 of the copper base plate 430. By circulating a flow of coolant 50 through the heat sink module, and causing jet streams 16 of coolant to impinge the surface to be cooled of the copper base plate 430, the coolant 50 can effectively absorb heat originating from the microprocessors 415 that was transferred through the heat pipes to the thermally conductive base member 430.

The heat pipe can be any suitable heat pipe, such as a heat pipe available from Advanced Cooling Technologies, Inc. located in Lancaster, Pa.

Examples of Heat Sinks

In one example, a heat sink module 100 for cooling a heat providing surface 12 can include an inlet chamber formed 145 within the heat sink module and an outlet chamber 150 formed within the heat sink module. The outlet chamber 150 can have an open portion, such as an open surface. The open portion can be enclosed by the heat providing surface 12 to form a sealed chamber when the heat sink module 100 is installed on the heat providing surface 12, as shown in FIG. 26. The heat sink module 100 can include a dividing member 195 disposed between the inlet chamber 145 and the outlet chamber 150. The dividing member 195 can include a first plurality of orifices 155 formed in the dividing member. The first plurality of orifices 155 can extend from a top surface of the dividing member 195 to a bottom surface of the dividing member 195. The first plurality of orifices 155 can be configured to deliver a plurality of jet streams 16 of coolant 50 into the outlet chamber 150 and against the heat-providing surface 12 when the heat sink module 100 is installed on the heat providing surface 12 and when pressurized coolant 50 is delivered to the inlet chamber 145.

A distance between the bottom surface of the dividing member 195 and the heat providing surface 12 can define a jet height 18 of the plurality of orifices 155 when the heat sink module 100 is installed on the heat providing surface 12. The jet height 18 can be about 0.01-0.75, 0.05-0.5, 0.05-0.25, 0.020-0.25, 0.03-0.125, or 0.04-0.08 in.

The first plurality of orifices 155 can have an average diameter of about 0.001-0.020, 0.001-0.2, 0.001-0.150, 0.001-0.120, 0.001-0.005, or 0.030-0.050 in. The first plurality of orifices 155 can have an average diameter of D and an average length of L, and L divided by D can be greater than or equal to one or about 1-10, 1-8, 1-6, 1-4, or 1-3.

The dividing member can have a thickness of about 0.005-0.25, 0.020-0.1, 0.025-0.08, 0.025-0.075, 0.040-0.070, 0.1-0.25, or 0.040-0.070 in. Each orifice of the first plurality of orifices 155 can have a central axis, and the central axes of the first plurality of orifices 155 can be arranged at an angle of about 20-80, 30-60, 40-50, or 45 degrees with respect to the surface to be cooled 12.

The first plurality of orifices 155 can be arranged in an array 76, and the array can be organized into staggered columns 77 and staggered rows 78, as shown in FIG. 31, such that a given orifice 155 in a given column 77 and a given row 78 does not have a corresponding orifice 155 in a neighboring row 78 in the given column 77 or a corresponding orifice in a neighboring column 77 in the given row 78.

The heat sink module 100 can include a second plurality of orifices 156 extending from the inlet chamber 145 to a rear wall of the outlet chamber 150, as shown in FIG. 38. The second plurality of orifices 156 can be configured to deliver a plurality of anti-pooling jet streams of coolant 16 to a rear portion of the outlet chamber 150 when pressurized coolant is provided to the inlet chamber 145. Each orifice of the second plurality of orifices can have a central axis, where the central axes of the second plurality of orifices are arranged at an angle of about 40-80, 50-70, or 60 degrees with respect to the surface to be cooled. The second plurality of orifices 156 can be arranged in a column along the rear wall of the outlet chamber 150.

The heat sink module 100 can include one or more boiling-inducing members 196 extending from the bottom side of the dividing member 195 toward the heat providing surface, wherein the one or more boiling-inducing members 196 are slender members extending from the bottom surface of the dividing member 195. In one example, the one or more boiling-inducing members 196 can be configured to contact the heat providing surface 12. In another example, the one or more boiling-inducing members 196 can be configured to extend toward the heat providing surface 12, but not contact the heat providing surface 12. Instead, a clearance distance can be provided between the ends of the one or more boiling-inducing members 196 and heat providing surface. The clearance distance can be about 0.001-0.0125, 0.001-0.05, 0.001-0.02, 0.001-0.01, or 0.005-0.010 in.

The inlet chamber 145 of the heat sink module 100 can decrease in cross-sectional area in a direction from a front surface 175 of the heat sink module toward a rear surface 180 of the heat sink module, as shown in FIG. 26. The outlet chamber 150 of the heat sink module 100 can increase in cross-sectional area in a direction from a front surface 170 of the heat sink module toward a rear surface 180 of the heat sink module.

The heat sink module 100 can include an inlet port 105 and an inlet passage 165 fluidly connecting the inlet port 105 to the inlet chamber 145. The heat sink module 100 can include an outlet port 110 an outlet passage 166 fluidly connecting the outlet chamber 150 to the outlet port 110. The heat sink module 100 can include a bottom surface 135 and a bottom plane 19 associated with the bottom surface, as shown in FIG. 26. The inlet port 105 can have a central axis 23 that defines an angle (a) of about 10-80, 20-70, 30-60, or 40-50 degrees with respect to the bottom plane 19 of the heat sink module 100. Similarly, the outlet port 110 can have a central axis that defines an angle of about 10-80, 20-70, 30-60, or 40-50 degrees with respect to the bottom plane of the heat sink module.

An additive manufacturing process, such as stereolithography, can be used to manufacture the heat sink module 100. The stereolithography process can include forming layers of material curable in response to synergistic stimulation adjacent to previously formed layers of material and successively curing the layers of material by exposing the layers of material to a pattern of synergistic stimulation corresponding to successive cross-sections of the heat sink module. The material curable in response to synergistic stimulation can be a liquid photopolymer.

In one example, a heat sink can be configured to receive and discharge a flow of pumped coolant, such as pumped coolant 50 circulating through a cooling system. The heat sink can include a thermally conductive base member 430 configured to mount on, or be placed in thermal communication with, a heat source. The thermally conductive base member 430 can have a thermal conductivity greater than 100, 150, or 200 Btu/(hr-ft-F). The heat sink can include a heat sink module 100 having a bottom surface 135 that is mounted on a top surface of the thermally conductive base member, as shown in FIG. 38. The heat sink module 100 can include an inlet chamber 145, an outlet chamber 150, and a dividing member 195. The inlet chamber 145 can be formed within the heat sink module 100. The outlet chamber 150 can be formed at least partially within the heat sink module 100. The outlet chamber 150 can include an open portion enclosed by the top surface 12 of the thermally conductive base member 430 when the heat sink module is mounted on the top surface 12 of the thermally conductive base member 430. The dividing member 195 can be located between the inlet chamber 145 and the outlet chamber 150. The dividing member 195 can include a first plurality of orifices 155 formed in the dividing member 195 and passing from a top side of the dividing member to a bottom side of the dividing member. The first plurality of orifices 155 can be configured to deliver a plurality of jet streams 16 of coolant 50 into the outlet chamber 150 and against the top surface 12 of the thermally conductive base member 430 when pumped coolant 50 is provided to the inlet chamber 145 of the heat sink module 100, as shown in FIG. 38.

The first plurality of orifices 155 can have an average diameter of about 0.001-0.020, 0.001-0.2, 0.001-0.150, 0.001-0.120, 0.001-0.005, or 0.030-0.050 in. The first plurality of orifices 155 can have an average length of about 0.005-0.25, 0.020-0.1, 0.025-0.08, 0.025-0.075, 0.040-0.070, 0.1-0.25, or 0.040-0.070 in. Each orifice 155 of the first plurality of orifices can have a central axis 17 that is arranged at an angle of about 30-60, 40-50, or 45 degrees with respect to the top surface 12 of the thermally conductive base member 430. The first plurality of orifices 155 can be arranged in an array 76 organized into staggered columns 77 and staggered rows 78, as shown in FIG. 31, such that a given orifice 155 in a given column and a given row does not have a corresponding orifice in a neighboring row in the given column or a corresponding orifice in a neighboring column in the given row. An average jet height can be about 0.01-0.75, 0.05-0.5, 0.05-0.25, 0.020-0.25, 0.03-0.125, or 0.04-0.08, where the average jet height is an average of jet heights 18 measured between the surface 12 of the thermally conductive member 430 and each orifice outlet of each of the plurality of orifices (see, e.g. FIG. 26).

In another example, a heat sink for cooling a heat source can include a thermally conductive base member 430 configured to mount on, or be placed in thermal communication with, a heat source. The heat sink can include a heat sink module 100 having a bottom surface 135 configured to mount on a surface 12 of the thermally conductive base member 430. The heat sink module 100 can include an inlet chamber 145 formed within the heat sink module 100. The heat sink module 100 can include an outlet chamber 150 formed at least partially in the heat sink module and bounded by the surface 12 of the thermally conductive base member 430 when the heat sink module is mounted on the thermally conductive base member, as shown in FIG. 26. The heat sink module 100 can include a first plurality of orifices 155 extending from the inlet chamber 145 to the outlet chamber 150. The first plurality of orifices 155 can be configured to deliver a plurality of jet streams 16 of coolant into the outlet chamber 150 and against the surface 12 of the thermally conductive base member 430 when a flow 51 of pumped coolant 50 is provided to the inlet chamber 145.

The inlet chamber 145 can have a volume of about 0.01-0.02, 0.01-0.05, 0.04-0.08, 0.07-0.15, 0.1-0.2, 0.15-0.25, 0.2-0.4, or 0.3-0.5 in$^3$. The outlet chamber 150 can have a volume of about 0.02-0.05, 0.04-0.08, 0.07-0.15, 0.1-0.2, 0.15-0.25, 0.2-0.4, 0.3-0.5, or 0.4-0.75 in$^3$. The inlet chamber 145 can decrease in cross-sectional area in a direction aligned with the direction of coolant flow 51, as shown in FIG. 26. Conversely, the outlet chamber 150 can increase in cross-sectional area in a direction aligned with the direction of coolant flow 51, as shown in FIG. 38. The heat sink module 100 can include an inlet passage 165 fluidly connecting an inlet port 105 to the inlet chamber 145, as shown in FIG. 26. Likewise, the heat sink module 100 can include an outlet passage 166 fluidly connecting the outlet chamber 150 to an outlet port 110, as shown in FIG. 38. The inlet port 105 and outlet port 110 can each include threads 170 to facilitate connecting sections of flexible tubing 225 to the inlet and outlet ports of the module 100. The inlet port 105 can include a central axis 23 defining an angle of about 10-80, 20-70, 30-60, or 40-50 degrees with respect to a bottom plane associated with the bottom surface 135 of the heat sink module 100, as shown in FIG. 26. The outlet port 110 can include a central axis 24 defining an angle of about 10-80, 20-70, 30-60, or 40-50 degrees with respect to a bottom plane associated with the bottom surface 135 of the heat sink module 100, as shown in FIG. 38.

In yet another example, a heat sink can be configured to cool a microprocessor 415, as shown in FIGS. 28 and 84-89, by transferring heat from the microprocessor 415 to a flow 51 of pumped coolant 50 passing through the heat sink. The heat sink can include a thermally conductive base member 430 configured to mount on a surface of a microprocessor 415, a heat sink module 100 mounted on a surface 12 of the thermally conductive base member 430, and a sealing member 125 located between the heat sink module 100 and the surface 12 of the thermally conductive base member 430. The sealing member 125 can be configured to provide a liquid-tight seal between the heat sink module 430 and the surface 12 of the thermally conductive base member 430 to form an outlet chamber 150. The heat sink module 100 can include a plurality of orifices 155 configured to deliver a plurality of jet streams 16 of coolant 50 into the outlet chamber 150 and against the surface 12 of the thermally conductive base member 430 when pumped coolant is provided to inlets of the plurality of orifices 155.

The sealing member 125 can be disposed in a continuous channel 140 formed in a bottom surface 135 of the heat sink module 100. The continuous channel 140 can circumscribe the outlet chamber 150. The sealing member 125 can be at least partially compressed between the continuous channel 140 and the surface 12 of the thermally conductive base member 430 to provide the liquid-tight seal. The heat sink can include one or more fasteners 115 securing the heat sink module 100 against the surface of the thermally conductive base member 430. The one or more fasteners 115 can provide a compressive force that compresses the sealing member 125 between the continuous channel 140 and the surface 12 of the thermally conductive base member 430.

The heat sink module 100 can include a plurality of anti-pooling orifices 156 arranged in or proximate a rear wall of the outlet chamber 150, as shown in FIGS. 24, 34, and 35. The plurality of anti-pooling orifices 156 can have an average diameter of about 0.001-0.020, 0.001-0.2, 0.001-0.150, 0.001-0.120, 0.001-0.005, or 0.030-0.050 in. The plurality of anti-pooling orifices 156 can be configured to deliver a plurality of anti-pooling jet streams 16 of coolant 50 against the surface of the thermally conductive base member 430 when pumped coolant is provided to inlets of the plurality of anti-pooling orifices 156, as shown in FIG. 38. Each of the plurality of anti-pooling orifices 156 can include a central axis 75 (see, e.g. FIG. 35) arranged at an angle of about 40-80, 50-70, or 60 degrees with respect to the surface of the thermally conductive base member 430. The heat sink module 100 can include one or more boiling-inducing members 196 extending from an inner surface of the outlet chamber 150 toward the surface 12 of the thermally conductive base member 430, as shown in FIG. 47. A flow clearance 197 (see, e.g. FIG. 48) can be provided between ends of the one or more boiling-inducing members 196 and the surface 12 of the thermally conductive base member 430. The flow clearance 197 can be about 0.001-0.0125, 0.001-0.05, 0.001-0.02, 0.001-0.01, or 0.005-0.010 in.

Examples of Redundant Heat Sink Modules

In one example, a redundant heat sink module 700 can be configured to transfer heat away from a surface to be cooled 12. The redundant heat sink module 700 can include a first independent coolant pathway 701 and a second independent coolant pathway 701. The first independent coolant pathway 701 can be formed within the redundant heat sink module 700 and can include a first inlet chamber 145-1, a first outlet chamber 150-1, and a first plurality of orifices 155-1 extending from the first inlet chamber 145-1 to the first outlet chamber 150-1. The first plurality of orifices 155-1 can be configured to provide a first plurality of impinging jet streams 16 of coolant 50 against a first region of a surface to be cooled 12 when the redundant heat sink module 700 is mounted on the surface to be cooled 12 and when pressurized coolant is provided to the first inlet chamber 145-1. The second independent coolant pathway 702 can be formed within the redundant heat sink module 700 and can include a second inlet chamber 145-2, a second outlet chamber 150-2, and a second plurality of orifices 155-2 extending from the second inlet chamber 145-2 to the second outlet chamber 150-2. The second plurality of orifices 155-2 can be configured to provide a second plurality of impinging jet streams 16 of coolant against a second region of the surface to be cooled 12 when the redundant heat sink module 700 is mounted on the surface to be cooled 12 and when pressurized coolant is provided to the second inlet chamber 145-2.

The first plurality of orifices 155-1 can have an average jet height 18 of about 0.01-0.75, 0.05-0.5, 0.05-0.25, 0.020-0.25, 0.03-0.125, or 0.04-0.08 in. The first plurality of orifices 155-1 can have an average diameter of D and an average length of L, and L divided by D can be greater than or equal to one or about 1-10, 1-8, 1-6, 1-4, or 1-3. The first plurality of orifices 155-1 have an average diameter of about 0.001-0.020, 0.001-0.2, 0.001-0.150, 0.001-0.120, 0.001-0.005, 0.020-0.045, 0.030-0.050 in, or 0.040 in.

The first inlet chamber 145-1 can decrease in cross-sectional area in a direction of flow 90, and the first outlet chamber 150-1 can increase in cross-sectional area in the direction of flow 90. The second outlet chamber 150-2 can circumscribe or be adjacent to the first outlet chamber 150-1. The first independent coolant pathway 701 can include a hydrofoil 705 located upstream of the first inlet chamber 145-1. The hydrofoil 705 can have a curved surface 706 that interacts with the flow of coolant to assist in providing an even distribution of coolant to the first plurality of orifices, as shown in FIG. 51N. The redundant heat sink module 700 can include a flow-guiding lip 162 proximate an exit of the first outlet chamber, as shown in FIG. 51K. A surface of the flow-guiding lip 162 can have an angle of less than about 45 degrees with respect to a bottom plane of the redundant heat sink module 700.

In another example, a redundant apparatus for cooling a heat source (e.g. a microprocessor 415) can include a thermally conductive base member 430, a redundant heat sink module 700 mounted on the thermally conductive base member 430, and one or more sealing members (125-1, 125-2) disposed between the redundant heat sink module 700 and the thermally conductive base member 430. The thermally conductive base member 430 can be placed in thermal communication with a heat source, such as a microprocessor 415 or a power electronic device. The thermally conductive base member 430 can include a surface to be cooled 12. The redundant heat sink module 700 can include a first independent coolant pathway 701 formed within the redundant heat sink module 700. The first independent coolant pathway 701 can include a first inlet chamber 145-1, a first outlet chamber 150-1, and a first plurality of orifices 155-1 configured to provide a first plurality of impinging jet streams 16 of coolant 50 against a first region of the surface to be cooled 12 when pressurized coolant is provided to the first inlet chamber 145-1. The redundant heat sink module 700 can include a second independent coolant pathway 702 formed within the redundant heat sink module 700. The second independent coolant pathway 702 can include a second inlet chamber 145-2, a second outlet chamber 150-2, and a second plurality of orifices 155-2 configured to provide a second plurality of impinging jet streams 16 of coolant against a second region of the surface to be cooled 12 when pressurized coolant is provided to the second outlet chamber 150-2. The one or more sealing members (125-1, 125-5) can be disposed between a bottom surface 135 of the redundant heat sink module 700 and a surface of the thermally conductive base member 430 to provide a first liquid-tight seal around a perimeter of the first outlet chamber 150-1 and a second liquid-tight seal around a perimeter of the second outlet chamber 150-2.

The second region of the surface to be cooled 12 can circumscribe the first region of the surface to be cooled 12. The thermally conductive base member 430 can be a metallic base plate. The thermally conductive base member 430 can be a heat pipe having a sealed vapor cavity.

In yet another example, a redundant heat sink module 700 for cooling a heat providing surface can include a first independent coolant pathway 701 and a second independent coolant pathway 702. The first independent coolant pathway 701 can include a first inlet chamber 145-1 formed within the redundant heat sink module 700 and a first outlet chamber 150-1 formed within the redundant heat sink module 700. The first outlet chamber 150-1 can have a first open portion configured to be enclosed by the heat providing surface 12 when the redundant heat sink module 700 is sealed against the heat providing surface 12. The first independent coolant pathway 702 can include a first plurality of orifices 155-1 extending from the first inlet chamber 145-1 to the first outlet chamber 150-1. The second independent coolant pathway 702 can include a second inlet chamber 145-2 formed within the redundant heat sink module 700 and a second outlet chamber 150-2 formed within the redundant heat sink module 700. The second outlet chamber 150-2 can have a second open portion configured to be enclosed by the heat providing surface 12 when the redundant heat sink module 700 is sealed against the heat providing surface 12. The second independent coolant pathway 702 can also include a second plurality of orifices 155-2 extending from the second inlet chamber 145-2 to the second outlet chamber 150-2.

The first plurality of orifices 155-1 can be arranged at an angle of about 20-80, 30-60, 40-50, or 45 degrees with respect to a bottom plane 19 of the redundant heat sink module 700. The first plurality of orifices 155-1 can be arranged in an array 76 organized into staggered columns 77 and staggered rows 78 such that a given orifice in a given column and a given row does not have a corresponding orifice in a neighboring row in the given column or a corresponding orifice in a neighboring column in the given row.

The redundant heat sink module 700 can include a plurality of anti-pooling orifices 156-1 extending from the first inlet chamber 145-1 to a rear wall of the first outlet chamber 150-1. The plurality of anti-pooling orifices 156-1 can be configured to deliver a plurality of anti-pooling jet streams 16 of coolant 50 to a rear portion of the first outlet chamber 150-1 when pressurized coolant 50 is provided to the first inlet chamber 145-1. The first inlet chamber 145-1 can have a volume of about 0.01-0.02, 0.01-0.05, 0.04-0.08, 0.07-0.15, 0.1-0.2, 0.15-0.25, 0.2-0.4, 0.3-0.5 in$^3$.

The redundant heat sink module 700 can include one or more boiling-inducing members 196 extending into the first outlet chamber 150-1 toward the heat providing surface 12. A flow clearance 197 can be provided between end portions of the boiling-inducing members 196 and a bottom plane 19 of the redundant heat sink module 700, as shown in FIG. 48. The flow clearance 197 can be about 0.001-0.0125, 0.001-0.05, 0.001-0.02, 0.001-0.01, or 0.005-0.010 in.

The first independent coolant pathway 701 can include an upwardly angled inlet port 105-1 fluidly connected to the first inlet chamber 145-1. The upwardly angled inlet port 145-1 can have a central axis 24 that defines an angle of about 10-80, 20-70, 30-60, or 40-50 degrees with respect to a bottom plane 19 of the redundant heat sink module 700. The redundant heat sink module 700 can include additional upwardly angled ports (105-2, 110-1, 110-2), as shown in FIG. 51A.

An additive manufacturing process, such as stereolithography, can be used to manufacture the heat sink module 700. The stereolithography process can include forming layers of material curable in response to synergistic stimulation adjacent to previously formed layers of material and successively curing the layers of material by exposing the layers of material to a pattern of synergistic stimulation corresponding to successive cross-sections of the heat sink module. The material curable in response to synergistic stimulation can be a liquid photopolymer.

Examples of Methods

In one example, a method of cooling two heat-providing surfaces (12-1, 12-2) within a server 400 using a cooling apparatus 1 having two series-connected heat sink modules (100-1, 100-2) can include providing a flow 51 of single-phase liquid coolant 50 to an inlet port 105-1 of a first heat sink module 100-1 mounted on a first heat-providing surface 12-1 within a server 400. A first amount of heat can be transferred from the first heat-providing surface 12-1 to the single-phase liquid coolant 50 resulting in vaporization of a portion of the single phase liquid coolant 50 thereby changing the flow 51 of single-phase liquid coolant 50 to two-phase bubbly flow containing liquid coolant 50 with vapor coolant dispersed as bubbles 275 in the liquid coolant 50. The two-phase bubbly flow can have a first quality ($x_1$). The method can include transporting the two-phase bubbly flow from an outlet port 110-1 of the first heat sink module 100-1 to an inlet port 105-1 of a second heat sink module 100-2.

The second heat sink module 100-2 can be mounted on a second heat-providing surface 12-2 within the server 400. A second amount of heat can be transferred from the second heat-providing surface 12-2 to the two-phase bubbly flow resulting in vaporization of a portion of the liquid coolant 50 within the two-phase bubbly flow thereby resulting in a change from the first quality ($x_1$) to a second quality ($x_2$). The second quality can be higher than the first quality ($x_2 > x_1$). The energy from the first amount of heat and the second amount of heat can be stored, at least in part, as latent heat in the two-phase bubbly flow and transported out of the server 400 through the cooling apparatus 1. The amount of heat transferred out of the server 400 can be a function of the amount of vapor formed within the two-phase bubbly flow and the heat of vaporization of the coolant.

Providing the flow 51 of single-phase liquid coolant 50 to the inlet port 105-1 of the first heat sink module 100-1 can include providing a flow rate of about 0.1-10, 0.2-5, 0.25-1.5, 0.3-2.5, 0.6-1.2, or 0.8-1.1 liters per minute of single-phase liquid coolant 50 to the first inlet 105-1 of the first heat sink module 100-1. The flow 51 of single-phase liquid coolant 50 can be a dielectric coolant such as, for example, HFE-7000, R-245fa, HFE-7100 or a combination thereof.

Providing the flow 51 of single-phase liquid coolant 50 to the first heat sink module 100-1 can include providing the flow 51 of single-phase liquid coolant 50 at a predetermined temperature and a predetermined pressure, where the predetermined temperature is slightly below the saturation temperature ($T_{sat}$) of the single-phase liquid coolant 50 at the predetermined pressure. The predetermined temperature can be about 0.5-20, 0.5-15, 0.5-10, 0.5-7, 0.5-5, 0.5-3, 0.5-1, 1-20, 1-15, 1-10, 1-7, 1-5, 1-3, 3-20, 3-15, 3-10, 3-7, 3-5, 5-20, 5-15, 5-10, 5-7, 7-20, 7-15, 7-10, 10-20, 10-15, or 15-20 degrees C. below the saturation temperature of the single-phase liquid coolant 50 at the predetermined pressure.

A pressure differential of about 0.5-5.0, 0.5-3, or 1-3 psi can be maintained between the inlet port 105-1 of the first heat sink module 100-1 and the outlet port 110-1 of the first heat sink module 100-1. The pressure differential can be suitable to promote the flow 51 to advance from the inlet port 105-1 of the first heat sink module 100-1 to the outlet port 110-1 of the first heat sink module 100-1.

A saturation temperature ($T_{sat}$, $x_2$) and pressure of the two-phase bubbly flow having a second quality ($x_2$) can be less than a saturation temperature ($T_{sat}$, $x_1$) and pressure of the two-phase flow having a first quality ($x_1$) (as shown in FIG. 14B), thereby allowing the second heat-providing surface 12-2 to be maintained at a lower temperature than the first heat-providing surface 12-1 when a first heat flux from the first heat-providing surface is approximately equal to a second heat flux from the second heat-providing surface.

The first quality ($x_1$) can be about 0-0.1, 0.05-0.15, 0.1-0.2, 0.15-0.25, 0.2-0.3, 0.25-0.35, 0.3-0.4, 0.35-0.45, 0.4-0.5, 0.45-0.55, and the second quality ($x_2$) can be greater than the first quality, such as, for example, 0-0.1, 0.05-0.15, 0.1-0.2, 0.15-0.25, 0.2-0.3, 0.25-0.35, 0.3-0.4, or 0.4-0.45 greater than the first quality.

The liquid component 50 of the two-phase bubbly flow that is transported between the first heat sink module 100-1 and the second heat sink module 100-2 can have a temperature slightly below its saturation temperature. The pressure of the two-phase bubbly flow can be about 0.5-5.0, 0.5-3, or 1-3 psi less than the predetermined pressure of the flow 51 of single-phase liquid coolant 50 provided to the inlet port 105-1 of the first heat sink module 100-1.

The first heat-providing surface 12-1 can be a surface of a microprocessor 415 within the server 400. The first heat-providing surface 12-1 can be a surface of a thermally conductive base member 430 in thermal communication with a microprocessor 415 within the server 400. The thermally conductive base member 430 can be a metallic base plate mounted on the microprocessor 415 using a thermal interface material.

In another example, a method of cooling two or more heat-providing surfaces (12-1, 12-2) using a cooling apparatus 1 having two or more fluidly connected heat sink modules (e.g. 100-1, 100-2) arranged in a series configuration can include providing a flow 51 of single-phase liquid coolant 50 to a first inlet port 105-1 of a first heat sink module 100-1 mounted on a first surface to be cooled 12-1. The flow 51 of single-phase liquid coolant 50 can have a predetermined pressure and a predetermined temperature at the first inlet port 105-1 of the first heat sink module 100-1. The predetermined temperature can be slightly below a saturation temperature of the coolant at the predetermined pressure. The method can include projecting the flow 51 of single-phase liquid coolant 50 against the first heat-providing surface 12-1 within the first heat sink module 100-1, where a first amount of heat is transferred from the first heat-providing surface 12-1 to the flow 51 of single-phase liquid coolant 50 thereby inducing phase change in a portion of the single-phase liquid coolant 50 and thereby changing the flow 51 of single-phase liquid coolant to two-phase bubbly flow containing a liquid coolant 50 and a plurality of vapor bubbles 275 dispersed within the liquid coolant 50. The plurality of vapor bubbles 275 can have a first number density.

The method can include providing a second heat sink module 100-2 mounted on a second heat-providing surface 12-2. The second heat sink module 100-2 can include a second inlet port 105-2 and a second outlet port 110-2. The method can include providing a first section of tubing 225 having a first end connected to the first outlet port 110-1 of the first heat sink module 100-1 and a second end connected to the second inlet port 105-2 of the second heat sink module 100-2. The first section of tubing 225 can transport the two-phase bubbly flow having the first number density of vapor bubbles from the first outlet port 110-1 of the first heat sink module 100-1 to the second inlet port 105-2 of the second heat sink module 100-2. The method can include projecting the two-phase bubbly flow having the first number density against the second heat-providing surface 12-2 within the second heat sink module 100-2, where a second amount of heat is transferred from the second heat-providing surface 12-2 to the two-phase bubbly flow having a first number density and thereby changing two-phase bubbly flow having a first number density to a two-phase bubbly flow having a second number density greater than the first number density.

A saturation temperature and pressure of the two-phase flow having a second number density can be less than a saturation temperature and pressure of the two-phase flow having a first number density, thereby allowing the second heat-providing surface 12-2 to be maintained at a lower temperature than the first heat-providing surface 12-1 when a first heat flux from the first heat-providing surface is approximately equal to a second heat flux from the second heat-providing surface.

The predetermined temperature of the flow 51 of single-phase liquid coolant 50 at the first inlet port 105-1 of the first heat sink module 100-1 can be about 0.5-20, 0.5-15, 0.5-10, 0.5-7, 0.5-5, 0.5-3, 0.5-1, 1-20, 1-15, 1-10, 1-7, 1-5, 1-3, 3-20, 3-15, 3-10, 3-7, 3-5, 5-20, 5-15, 5-10, 5-7, 7-20, 7-15, 7-10, 10-20, 10-15, or 15-20 degrees C. below the saturation temperature of the flow 51 of single-phase liquid coolant 50 at the predetermined pressure of the flow 51 of single-phase liquid coolant at the first inlet of the first heat sink module.

Providing the flow 51 of single-phase liquid coolant 50 to the inlet port 105-1 of the first heat sink module 100-1 can include providing a flow rate of about 0.1-10, 0.2-5, 0.3-2.5, 0.6-1.2, or 0.8-1.1 liters per minute of single-phase liquid coolant 50 to the first inlet port 100-1 of the first heat sink module 100-1.

The liquid in the two-phase bubbly flow being transported between the first heat sink module 100-1 and the second heat sink module 100-2 can have a temperature at or slightly below its saturation temperature, where a pressure of the two-phase bubbly flow having a first number density is about 0.5-5.0, 0.5-3, or 1-3 psi less than the predetermined pressure of the flow 51 of single-phase liquid coolant 50 provided to the first heat sink module 100-1.

The first heat sink module 100-1 can include an inlet chamber 145 formed within the first heat sink module and an outlet chamber 150 formed within the first heat sink module. The outlet chamber 150 can have an open portion enclosed by the first surface to be cooled 12-1 when the first heat sink module 100-1 is mounted on the first surface to be cooled 12-1. The first heat sink module 100-1 can include a plurality of orifices 155 extending from the inlet chamber 145 to the outlet chamber 150. Projecting the flow 51 of single-phase liquid coolant 50 against the first heat-providing surface 12-1 can include projecting a plurality of jet streams 16 of single-phase liquid coolant 50 through the plurality of orifices 155 into the outlet chamber 150 and against the first surface to be cooled 12-1 when the flow 51 of single-phase liquid coolant 50 is provided to the inlet chamber 145 from the first inlet port 105-1 of the first heat sink module 100-1. The first plurality of orifices 155 can have an average diameter of about 0.001-0.020, 0.001-0.2, 0.001-0.150, 0.001-0.120, 0.001-0.005, or 0.030-0.050 inches. Outlets of the plurality of orifices 155 can be arranged at a jet height 18 from the first surface to be cooled 12-1. The jet height 18 can be about 0.01-0.75, 0.05-0.5, 0.05-0.25, 0.020-0.25, 0.03-0.125, or 0.04-0.08 inches. At least one of the orifices 155 can have a central axis 74 arranged at an angle of about 30-60, 40-50, or 45 degrees with respect to the first surface to be cooled 12-1.

In another example, a method of cooling two microprocessors 415 on a motherboard 405 using a two-phase cooling apparatus 1 having two series-connected heat sink modules (100-1, 100-2) can include providing a flow 51 of single-phase liquid coolant 50 to an inlet port 105 of a first heat sink module 100-1 mounted on a first thermally conductive base member 430. The first thermally conductive base member 430 can be mounted on a first microprocessor 415 mounted on a motherboard 405, where heat is transferred from the first microprocessor 415 through the first thermally conductive base member 430 and to the flow 51 of single-phase liquid coolant 50 resulting in boiling of a first portion of the single-phase liquid coolant 50, thereby changing the flow 51 of single-phase liquid coolant 50 to two-phase bubbly flow having a first quality ($x_1$). The method can include transporting the two-phase bubbly flow from an outlet port 110 of the first heat sink module 100-1 to an inlet port 105 of a second heat sink module 100-2 through flexible tubing 225. The second heat sink module 100-2 can be mounted on a second thermally conductive base member 430 that is mounted on a second microprocessor 415 mounted on the motherboard 405. Heat can be transferred from the second microprocessor 415 through the second thermally conductive base member 430 and to the two-phase bubbly flow resulting in vaporization of a portion of liquid coolant 50 within the two-phase bubbly flow thereby resulting in a change from the first quality ($x_1$) to a second quality ($x_1$), the second quality being higher than the first quality (i.e. $x_2 > x_1$).

Examples of Cooling Apparatuses

In one example, a flexible two-phase cooling apparatus 1 for cooling microprocessors 415 in servers 400 can include a primary cooling loop 300, a first bypass 305, and a second bypass 310. The primary cooling loop 300 can be configured to circulate a dielectric coolant 50. The primary cooling loop 300 can include a reservoir 200, a pump 20 downstream of the reservoir 200, an inlet manifold 210 downstream of the pump 20, an outlet manifold 215 downstream of the inlet manifold 210, and two or more flexible cooling lines 303 extending from the inlet manifold 210 to the outlet manifold 215, as shown in FIG. 79. The two or more flexible cooling lines 303 can each be routable within a server housing 400, as shown in FIG. 84, and can each be fluidly connected to two or more series-connected heat sink modules. The two or more flexible cooling lines can be configured to transport low-pressure, two-phase dielectric coolant 50. Each heat sink module 100 can include a thermally conductive base member 430 sized to cover a top surface of a microprocessor 415, as shown in FIG. 28. A thermal interface material 435 can be provided between the thermally conductive base member 430 and the microprocessor 415. The cooling apparatus 1 can include a first bypass 305 having a first end and a second end. The first end of the first bypass 305 being can be connected to the primary cooling loop 300 downstream of the pump 20 and upstream of the inlet manifold 210, as shown in FIG. 79. The second end of the first bypass 305 can be connected at or upstream of the reservoir 200. The first bypass 305 can include a first valve 60-1 configured to regulate a first bypass flow 51-1 of coolant through the first bypass 305. The cooling apparatus 1 can include a second bypass 310 having a first end and a second end. The first end of the second bypass 310 can be connected to the inlet manifold 210, and the second end of the second bypass 310 can be connected to the outlet manifold 215, as shown in FIG. 79. The second bypass 310 can include a second valve 60-2 configured to regulate a second bypass flow 51-3 of coolant through the second bypass 310.

Each of the two or more flexible cooling lines 303 can have a minimum bend radius R of less than 3, 2.5, or 2 inches to permit routing within a server housing 400, as shown in FIG. 84. Each of the two or more flexible cooling lines 303 can have an inner diameter of about 0.125-0.250 or 0.165-0.185 inches and an outer diameter of about 0.2-0.4 inches. The primary cooling loop 300 can be configured to circulate a dielectric coolant 50 having a boiling point of about 15-35, 20-45, 30-55, or 40-65 degrees C. determined at a pressure of 1 atm. Each of the two or more flexible cooling lines 303 can be low pressure cooling lines with a maximum operating pressure of less than 50, 75, or 100 psi. The first bypass 305 can include a heat exchanger 40-1 downstream of the first valve 60-1, as shown in FIG. 79. The heat exchanger 40-1 can be a liquid-to-liquid heat exchanger configured to fluidly connect to an external heat rejection loop 43.

The first valve 60-1 can be configured to provide a pressure differential of about 5-20 psi between an inlet and an outlet of the first valve 60-1. Likewise, the second valve 60-2 can be configured to provide a pressure differential of about 5-20 psi between an inlet and an outlet of the second valve 60-2. The cooling apparatus 1 can be configured to hold a predetermined amount of coolant 50. The reservoir 200 can have an inner volume configured to hold at least 15% of the predetermined amount of coolant in the cooling apparatus 1.

In another example, a flexible two-phase cooling apparatus 1 for cooling one or more heat-generating devices can include a primary cooling loop 300, a first bypass 305, and a second bypass 310, as shown in FIG. 81. The primary cooling loop 300 can include a pump 20 configured to provide a flow 51 of pressurized liquid coolant though the primary cooling loop 300. The primary cooling loop 300 can include a heat sink module 100 fluidly connected to the primary cooling loop 300. The heat sink module 100 can be configured to mount on and remove heat from a surface 12 of a heat-generating device. The primary cooling loop can include a reservoir 200 fluidly connected to the primary cooling loop 300 upstream of the pump 20. The first bypass 305 can have a first end and a second end. The first end of the first bypass 305 can be fluidly connected to the primary cooling loop 300 downstream of the pump 20. The second end of the first bypass 305 can be fluidly connected to the primary cooling loop 300 upstream of the pump 20. The first bypass can include a first heat exchanger 40-1 and a first valve 60-1. The first valve 60-1 can be configured to adjust a first bypass flow 51-1 through the first heat exchanger 40-1. The first heat exchanger 40-1 can be configured to subcool the first bypass flow 51-1 of pressurized coolant below a saturation temperature ($T_{sat}$) of the pressurized coolant. A second bypass 310 can have a first end and a second end. The first end of the second bypass 310 can be fluidly connected to the primary cooling loop 300 downstream of the pump and upstream of the one or more heat sink modules 100. The second end of the second bypass 310 can be fluidly connected to the primary cooling loop 300 downstream of the one or more heat sink modules 100 and upstream of the reservoir 200. The second bypass 310 can include a second valve 60-2 configured to adjust a second bypass flow 51-3 of pressurized coolant through the second bypass 310.

The pump 20 can be configured to provide the flow of pressurized coolant at a pressure of about 5-20, 15-25, 20-35, or 25-45 psia, where the pressure is measured at the pump outlet 22. At least a portion of the primary cooling loop 300 can include a section of flexible tubing 225 fluidly connected to the heat sink module 100. The section of flexible tubing 225 can have a minimum bend radius of less than about 3, 2.5, or 2 inches. The section of flexible tubing 225 can have a maximum operating pressure of less than 50, 75, or 100 psi.

The heat sink module 100 can include an inlet chamber 145, an outlet chamber 150, and a dividing member 195, as shown in FIG. 26. The inlet chamber 145 can be formed within the heat sink module 100. The outlet chamber 150 can be formed within the heat sink module 100. The outlet chamber 150 can have an open portion along a bottom surface 135 of the heat sink module 100. The open portion 152 (see, e.g. FIG. 25) can be enclosed by and sealed against a thermally conductive base member 430, as shown in FIG. 26. A sealing member 125 can be provided between the heat sink module 100 and the thermally conductive base member 430 to facilitate sealing. The thermally conductive base member 430 can be configured to mount on a heat-generating device (e.g. a microprocessor 415), as shown in FIG. 28, using a thermal interface material 435. The dividing member 195 can be disposed between the inlet chamber 145 and the outlet chamber 150. The dividing member 195 can include a first plurality of orifices 155 formed in the dividing member 195. The first plurality of orifices 155 can extend from a top surface of the dividing member 195 to a bottom surface of the dividing member 195. The first plurality of orifices 155 can be configured to deliver a plurality of jet streams 16 of coolant 50 into the outlet chamber 150 and against a surface of the thermally conductive base member 430 when the heat sink module 100 is installed on the heat-generating device and when pressurized coolant is provided to the inlet chamber 145, as shown in FIG. 26. The first plurality of orifices 155 can have an average diameter of about 0.001-0.020, 0.001-0.2, 0.001-0.150, 0.001-0.120, 0.001-0.005, or 0.030-0.050 in. The first plurality of orifices 155 can have an average diameter of D and an average length of L, and L divided by D can be greater than or equal to one or about 1-10, 1-8, 1-6, 1-4, or 1-3.

In yet another example, a flexible two-phase cooling apparatus 1 for cooling a microprocessor 415 can include a primary cooling loop 300 and a bypass 310, as shown in FIG. 82. The primary cooling loop 300 can include a pump 200 configured to provide a flow 51 of pressurized coolant through the primary cooling loop 300. The primary cooling loop 300 can include a first heat sink module 100 fluidly sealed against a thermally conductive base member 430. The heat sink module 100 can be configured to mount on a surface of a microprocessor 415 such that the thermally conductive base member 430 is in thermal communication with the microprocessor 415. The first heat sink module 100 can include a plurality of internal orifices 155 that are configured to transform at least a portion of the flow 51 of pressurized coolant into a plurality of jet streams 16 of coolant 50 directed at a surface of the thermally conductive base member 430, as shown in FIG. 26. The plurality of jet streams 16 of coolant 50 can be configured to remove heat from the thermally conductive base member 430 by way of latent heat transfer as a fraction of the coolant from the plurality of jet streams 16 changes phase to vapor bubbles 275 as a result of absorbing heat from the thermally conductive base member 430, the heat originating from the microprocessor 415. The bypass 310 can have a first end and a second end. The first end of the bypass 310 can be fluidly connected to the primary cooling loop 300 upstream of the heat sink module 100. The second end of the bypass 310 can be fluidly connected to the primary cooling loop 300 downstream of the heat sink module 100. The bypass 310 can include a valve 60-2 configured to allow a pressure differential to be established between an inlet 105 of the heat sink module 100 and an outlet 110 of the heat sink module 100 to control a flow rate ($\dot{V}_{line}$) of pressurized coolant through the heat sink module. The valve 60-2 can be configured to allow a pressure differential of about 0.5-3, 1-5, 5-25, 5-20, 10-15, or about 12 psi to be established between an inlet 105 of the heat sink module and an outlet 110 of the heat sink module.

The primary cooling loop 300 can include a second heat sink module 100 fluidly connected in series with the first heat sink module, as shown in FIG. 84. The outlet port 110 of the first heat sink module 100 can be fluidly connected to an inlet port 105 of the second heat sink module 100 by a section of flexible tubing 225 having a minimum bend radius of less than about 3, 2.5, or 2 inches. The section of flexible tubing 225 can be low-pressure tubing having a maximum operating pressure of less than 50, 75, or 100 psi. The flow rate ($\dot{V}_{line}$) of pressurized coolant through the first and second series-connected heat sink modules 100 can be about 0.25-5, 0.5-3, 0.5-2, or 0.8-1.2 liters per minute.

The cooling apparatus 1 can include a second bypass 305 having a first end and a second end, as shown in FIG. 82. The first end of the second bypass 305 can be fluidly connected to the primary cooling loop 300 downstream of the pump and upstream of the heat sink module 100. The second end of the second bypass 305 can be fluidly connected to the primary cooling loop 300 downstream of the one or more heat sink modules 100 and upstream of a reservoir 200. The second bypass 305 can include a second valve 60-1 configured to adjust a second bypass flow 51-1 of pressurized coolant through the second bypass. The second bypass can include a heat exchanger configured to provide subcooling of the second bypass flow 51-1 of pressurized coolant.

The coolant 50 can be a dielectric coolant with a boiling point of about 15-35, 20-45, 30-55, or 40-70 degrees C. determined at a pressure of 1 atm. The dielectric coolant 50 can be homogeneous or, in some examples, can be a mixture of R-245fa and HFE 7000, such as about 5-50, 10-35, or 15-25% R-245fa by volume.

The elements and method steps described herein can be used in any combination whether explicitly described or not. All combinations of method steps as described herein can be performed in any order, unless otherwise specified or clearly implied to the contrary by the context in which the referenced combination is made.

As used herein, the singular forms "a," "an," and "the" include plural referents unless the content clearly dictates otherwise.

Numerical ranges as used herein are intended to include every number and subset of numbers contained within that range, whether specifically disclosed or not. Further, these numerical ranges should be construed as providing support for a claim directed to any number or subset of numbers in that range. For example, a disclosure of from 1 to 10 should be construed as supporting a range of from 2 to 8, from 3 to 7, from 5 to 6, from 1 to 9, from 3.6 to 4.6, from 3.5 to 9.9, and so forth.

All patents, patent publications, and peer-reviewed publications (i.e., "references") cited herein are expressly incorporated by reference to the same extent as if each individual reference were specifically and individually indicated as being incorporated by reference. In case of conflict between the present disclosure and the incorporated references, the present disclosure controls.

The methods and compositions of the present invention can comprise, consist of, or consist essentially of the essential elements and limitations described herein, as well as any additional or optional steps, components, or limitations described herein or otherwise useful in the art.

It is understood that the invention is not confined to the particular construction and arrangement of parts herein illustrated and described, but embraces such modified forms thereof as come within the scope of the claims.

Several impingement technologies exist, but few have shown commercial promise and none have gained wide-scale commercial acceptance to date due to instability issues, relatively high flow rate requirements, limitations on scalability, and other shortcomings.

Improved heat sink modules (100, 700) with one or more arrays 96 of impinging jet streams 16 have been developed and are described herein. The heat sink modules can be connected in series and/or parallel configurations to cool a plurality of heat sources 12 simultaneously, thereby providing a scalable jet impingement technology. Importantly, the heat sink modules described herein are compact and easy to package within new and existing server and personal computer housings. The heat sink modules can also be easily packaged in a wide variety of other electrical and mechanical devices that require a highly efficient and scalable cooling apparatus 1.

The foregoing description has been presented for purposes of illustration and description. It is not intended to be exhaustive or to limit the claims to the embodiments disclosed. Other modifications and variations may be possible in view of the above teachings. The embodiments were chosen and described to explain the principles of the invention and its practical application to enable others skilled in the art to best utilize the invention in various embodiments and various modifications as are suited to the particular use contemplated. It is intended that the claims be construed to include other alternative embodiments of the invention except insofar as limited by the prior art.

What is claimed is:

1. A fluid distribution unit for a two-phase cooling system, the fluid distribution unit comprising:
    a reservoir comprising an inner volume configured to receive a two-phase flow of dielectric coolant comprising liquid coolant and vapor coolant;
    a supply line comprising a first end and a second end, the first end of the supply line being fluidly connected to the reservoir;
    a first pump fluidly connected between the first end of the supply line and the second end of the supply line;
    a return line comprising a first end and a second end, the second end of the return line being fluidly connected to the reservoir; and
    a heat rejection loop comprising: a first end and a second end, the first end of the heat rejection loop being fluidly connected to the reservoir, the second end of the heat rejection loop being fluidly connected to the reservoir; a heat exchanger fluidly connected to the heat rejection loop between the first end of the heat rejection loop and the second end of the heat rejection loop; and a second pump fluidly connected to the heat rejection loop between the first end of the heat rejection loop and the second end of the heat rejection loop, the second pump configured to circulate a flow of single-phase liquid coolant from the reservoir, through the heat exchanger, and back to the reservoir,
    wherein the heat exchanger is a liquid-to-liquid heat exchanger comprising: a first isolated fluid pathway configured to transport dielectric coolant received from the heat rejection loop; and a second isolated fluid pathway configured to transport a fluid comprising water.

2. The fluid distribution unit of claim 1, wherein the first end of the supply line is fluidly connected to the reservoir at a first location, and the second end of the return line is fluidly connected to the reservoir at a second location, the first location being lower on the reservoir than the second location, measured vertically between midpoints of the first location and the second location.

3. The fluid distribution unit of claim 1, wherein the first end of the heat rejection loop is fluidly connected to the reservoir at a third location, and the second end of the heat rejection loop is fluidly connected to the reservoir at a fourth location, the third location being lower on the reservoir than the fourth location, measured vertically between midpoints of the third location and the fourth location.

4. The fluid distribution unit of claim 1, wherein the second pump is located upstream of the heat exchanger.

5. The fluid distribution unit of claim 1, further comprising a baffle in the inner volume of the reservoir, the baffle establishing only non-linear flow pathways between reservoir flow inlets and reservoir flow outlets, reservoir flow inlets comprising the second end of the return line and the first end of the heat rejection loop, and reservoir flow outlets comprising the first end of the supply line and the second end of the heat rejection loop.

6. The fluid distribution unit of claim 1, wherein the fluid distribution unit is configured to slidably engage with a server rack to permit rapid installation of the fluid distribution unit, wherein the second end of the supply line comprises a first fitting that is a blind-mate coupler comprising a first non-spill valve, and the first end of the return line comprises a second fitting that is a blind-mate quick-connect coupler comprising a second non-spill valve.

7. A fluid distribution unit for a two-phase cooling system, the fluid distribution unit comprising:
- a reservoir comprising an inner volume configured to receive a two-phase flow of dielectric coolant comprising liquid coolant and vapor coolant;
- a supply line comprising a first end and a second end, the first end of the supply line being fluidly connected to the reservoir;
- a first pump fluidly connected between the first end of the supply line and the second end of the supply line;
- a return line comprising a first end and a second end, the second end of the return line being fluidly connected to the reservoir;
- a heat rejection loop comprising: a first end and a second end, the first end of the heat rejection loop being fluidly connected to the reservoir, the second end of the heat rejection loop being fluidly connected to the reservoir; a heat exchanger fluidly connected to the heat rejection loop between the first end of the heat rejection loop and the second end of the heat rejection loop; and a second pump fluidly connected to the heat rejection loop between the first end of the heat rejection loop and the second end of the heat rejection loop, the second pump configured to circulate a flow of single-phase liquid coolant from the reservoir, through the heat exchanger, and back to the reservoir;
- a flow quality sensor attached to the return line and configured to provide an output signal based on a flow quality of two-phase flow passing through the return line to the reservoir; and
- an electronic control unit, wherein the flow quality sensor is electrically connected to the electronic control unit to permit the output signal from the flow quality sensor to be received by the electronic control unit,
- wherein the first pump comprises a first variable speed drive electrically connected to the electronic control unit, wherein the electronic control unit is configured to increase a speed of the first variable speed drive when the output signal from the flow quality sensor indicates a flow quality greater than about 0.3, 0.4, or 0.5.

8. The fluid distribution unit of claim 7, wherein the electronic control unit is configured to decrease the speed of the first variable speed drive when the output signal from the flow quality sensor indicates a flow quality less than 0.1, 0.2, or 0.3.

9. The fluid distribution unit of claim 7, wherein the first end of the supply line is fluidly connected to the reservoir at a first location, and the second end of the return line is fluidly connected to the reservoir at a second location, the first location being lower on the reservoir than the second location, measured vertically between midpoints of the first location and the second location.

10. The fluid distribution unit of claim 7, wherein the first end of the heat rejection loop is fluidly connected to the reservoir at a third location, and the second end of the heat rejection loop is fluidly connected to the reservoir at a fourth location, the third location being lower on the reservoir than the fourth location, measured vertically between midpoints of the third location and the fourth location.

11. The fluid distribution unit of claim 7, further comprising a baffle in the inner volume of the reservoir, the baffle establishing only non-linear flow pathways between reservoir flow inlets and reservoir flow outlets, reservoir flow inlets comprising the second end of the return line and the first end of the heat rejection loop, and reservoir flow outlets comprising the first end of the supply line and the second end of the heat rejection loop.

12. The fluid distribution unit of claim 7, wherein the heat exchanger is a liquid-to-liquid heat exchanger comprising: a first isolated fluid pathway configured to transport dielectric coolant received from the heat rejection loop; and a second isolated fluid pathway configured to transport a fluid comprising water.

13. The fluid distribution unit of claim 7, wherein the second pump comprises a second variable speed drive electrically connected to the electronic control unit, wherein the electronic control unit is configured to decrease a speed of the second variable speed drive when the output signal from the flow quality sensor indicates a flow quality less than 0.1, 0.2, or 0.3.

14. A fluid distribution unit for a two-phase cooling system, the fluid distribution unit comprising:
- a reservoir comprising an inner volume configured to receive a two-phase flow of dielectric coolant comprising liquid coolant and vapor coolant;
- a supply line comprising a first end and a second end, the first end of the supply line being fluidly connected to the reservoir;
- a first pump fluidly connected between the first end of the supply line and the second end of the supply line;
- a return line comprising a first end and a second end, the second end of the return line being fluidly connected to the reservoir;
- a heat rejection loop comprising: a first end and a second end, the first end of the heat rejection loop being fluidly connected to the reservoir, the second end of the heat rejection loop being fluidly connected to the reservoir; a heat exchanger fluidly connected to the heat rejection loop between the first end of the heat rejection loop and the second end of the heat rejection loop; and a second pump fluidly connected to the heat rejection loop between the first end of the heat rejection loop and the second end of the heat rejection loop, the second pump configured to circulate a flow of single-phase liquid coolant from the reservoir, through the heat exchanger, and back to the reservoir;
- a flow quality sensor attached to the return line and configured to provide an output signal based on a flow quality of two-phase flow passing through the return line to the reservoir; and
- an electronic control unit, wherein the flow quality sensor is electrically connected to the electronic control unit to permit the output signal from the flow quality sensor to be received by the electronic control unit,
- wherein the second pump comprises a second variable speed drive electrically connected to the electronic control unit, wherein the electronic control unit is configured to increase a speed of the second variable speed drive when the output signal from the flow quality sensor indicates a flow quality greater than 0.3, 0.4, or 0.5.

15. The fluid distribution unit of claim 14, wherein the electronic control unit is configured to decrease the speed of the second variable speed drive when the output signal from the flow quality sensor indicates a flow quality less than 0.1, 0.2, or 0.3.

16. The fluid distribution unit of claim 14, wherein the first end of the supply line is fluidly connected to the reservoir at a first location, and the second end of the return line is fluidly connected to the reservoir at a second location, the first location being lower on the reservoir than the second location, measured vertically between midpoints of the first location and the second location.

17. The fluid distribution unit of claim 14, wherein the first end of the heat rejection loop is fluidly connected to the reservoir at a third location, and the second end of the heat rejection loop is fluidly connected to the reservoir at a fourth location, the third location being lower on the reservoir than the fourth location, measured vertically between midpoints of the third location and the fourth location.

18. The fluid distribution unit of claim 14, wherein the heat exchanger is a liquid-to-liquid heat exchanger comprising: a first isolated fluid pathway configured to transport dielectric coolant received from the heat rejection loop; and a second isolated fluid pathway configured to transport a fluid comprising water.

19. The fluid distribution unit of claim 14, wherein the first pump comprises a first variable speed drive electrically connected to the electronic control unit, wherein the electronic control unit is configured to increase a speed of the first variable speed drive when the output signal from the flow quality sensor indicates a flow quality greater than about 0.3, 0.4, or 0.5.

20. The fluid distribution unit of claim 14, wherein the first pump comprises a first variable speed drive electrically connected to the electronic control unit, wherein the electronic control unit is configured to decrease a speed of the first variable speed drive when the output signal from the flow quality sensor indicates a flow quality less than 0.1, 0.2, or 0.3.

* * * * *